US011758803B2

(12) United States Patent
Hwang et al.

(10) Patent No.: US 11,758,803 B2
(45) Date of Patent: Sep. 12, 2023

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Kyuyoung Hwang, Anyang-si (KR); Byungjoon Kang, Seoul (KR); Seungyeon Kwak, Suwon-si (KR); Myungsun Sim, Suwon-si (KR); Kum Hee Lee, Suwon-si (KR); Aram Jeon, Suwon-si (KR); Byoungki Choi, Hwaseong-si (KR); Hyeonho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 688 days.

(21) Appl. No.: 16/808,605

(22) Filed: Mar. 4, 2020

(65) Prior Publication Data

US 2020/0287144 A1 Sep. 10, 2020

(30) Foreign Application Priority Data

Mar. 7, 2019 (KR) ........................ 10-2019-0026320
Mar. 4, 2020 (KR) ........................ 10-2020-0026887

(51) Int. Cl.

| | |
|---|---|
| ***H10K 85/30*** | (2023.01) |
| ***C09K 11/06*** | (2006.01) |
| ***C07F 15/00*** | (2006.01) |
| ***H10K 85/40*** | (2023.01) |
| *H10K 50/11* | (2023.01) |
| *H10K 101/10* | (2023.01) |

(52) U.S. Cl.
CPC ....... *H10K 85/342* (2023.02); *C07F 15/0033* (2013.01); *C09K 11/06* (2013.01); *H10K 85/40* (2023.02); *C09K 2211/1029* (2013.01); *C09K 2211/1033* (2013.01); *C09K 2211/185* (2013.01); *H10K 50/11* (2023.02); *H10K 2101/10* (2023.02)

(58) Field of Classification Search
CPC ............. H01L 51/0085; H01L 51/0094; H01L 51/5016; H01L 51/5024; C07F 15/0033; C09K 11/06; C09K 2211/1029; C09K 2211/1033; C09K 2211/185; H10K 85/342; H10K 85/40; H10K 50/11; H10K 2101/10; H10K 50/12
USPC .......................................................... 428/690
See application file for complete search history.

(56) References Cited

U.S. PATENT DOCUMENTS

| | | | |
|---|---|---|---|
| 7,429,426 B2 | 9/2008 | Brown et al. | |
| 8,431,243 B2 | 4/2013 | Kwong et al. | |
| 9,685,617 B2 | 6/2017 | Beers et al. | |
| 10,135,009 B2 | 11/2018 | Hwang et al. | |
| 10,600,975 B2 | 3/2020 | Kwong et al. | |
| 10,629,829 B2 | 4/2020 | Hwang et al. | |
| 2014/0131676 A1 | 5/2014 | Beers et al. | |
| 2016/0111665 A1 | 4/2016 | Kim et al. | |
| 2016/0155962 A1 | 6/2016 | Hwang et al. | |
| 2016/0155963 A1 | 6/2016 | Hwang et al. | |
| 2016/0268521 A1 | 9/2016 | Lee et al. | |
| 2016/0268522 A1 | 9/2016 | Hwang et al. | |
| 2017/0054095 A1 | 2/2017 | Choi et al. | |
| 2017/0346025 A1 | 11/2017 | Hwang et al. | |
| 2018/0102487 A1 | 4/2018 | Tsai et al. | |
| 2020/0066999 A1 | 2/2020 | Beers et al. | |
| 2021/0083205 A1* | 3/2021 | Hwang | C07F 15/0033 |
| 2021/0104691 A1* | 4/2021 | Lee | C09K 11/06 |
| 2022/0380396 A1* | 12/2022 | Park | C07F 15/0033 |

FOREIGN PATENT DOCUMENTS

| | | | |
|---|---|---|---|
| CN | 108164564 A | 6/2018 | |
| EP | 2465912 A1 | 6/2012 | |
| EP | 2730583 A1 | 5/2014 | |
| EP | 3010068 A1 | 4/2016 | |
| EP | 3026056 A1 | 5/2016 | |
| EP | 3305796 A1 | 4/2018 | |
| EP | 3792270 A1 * | 3/2021 | C07F 15/0033 |
| EP | 3904363 A1 * | 11/2021 | C07F 15/0033 |
| JP | 2016188202 A | 11/2016 | |
| KR | 1020160037007 | 4/2016 | |
| KR | 1020160045508 A | 4/2016 | |
| KR | 1020160064955 A | 6/2016 | |
| KR | 1020160109907 A1 | 9/2016 | |
| KR | 1020160109908 A | 9/2016 | |
| KR | 20180020878 A | 2/2018 | |
| KR | 20180020878 A1 * | 2/2018 | C07F 15/003 |

OTHER PUBLICATIONS

CAS reg. No. 2488728-08-9, Oct. 1, 2020. (Year: 2020).*
English Translation of Office Action dated Feb. 1, 2022 issued in corresponding JP Patent Application No. 2020-037698, 3 pp.
Office Action dated Feb. 1, 2022 issued in corresponding JP Patent Application No. 2020-037698, 3 pp.

* cited by examiner

*Primary Examiner* — Douglas J McGinty
(74) *Attorney, Agent, or Firm* — CANTOR COLBURN LLP

(57) ABSTRACT

Provided are an organometallic compound represented by Formula 1, an organic light-emitting device including the same, and an electronic apparatus comprising the organic light-emitting device:

$$M(L_1)_{n1}(L_2)_{n2} \quad \text{Formula 1}$$

wherein, in Formula 1, M, $L_1$, $L_2$, n1, and n2 are the same as described in the detailed description of the specification.

20 Claims, 1 Drawing Sheet

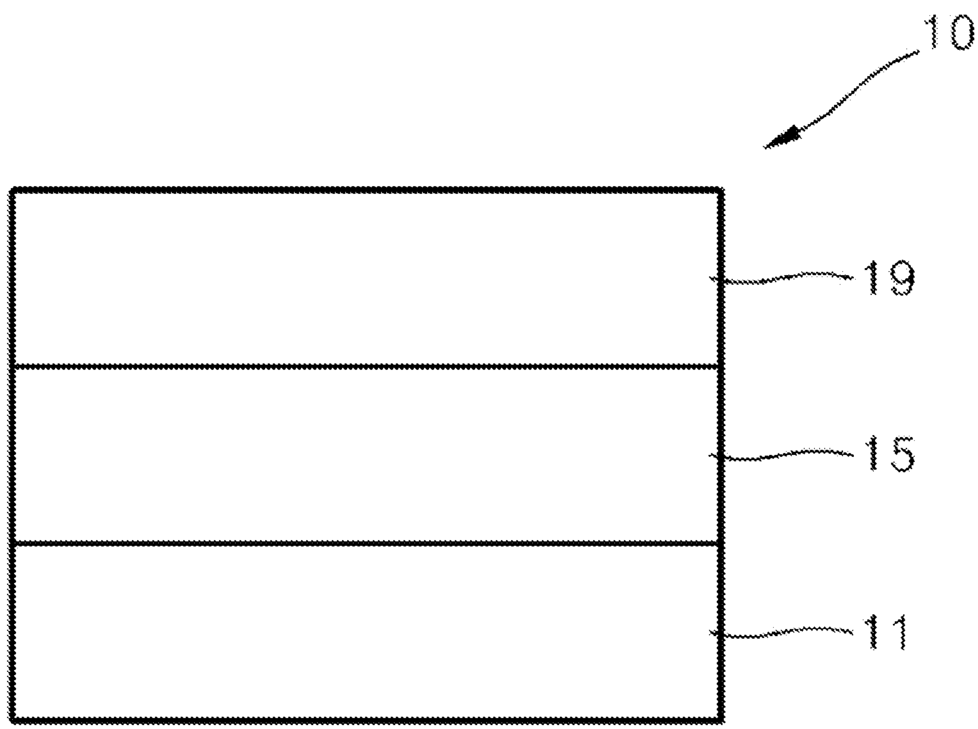
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Applications No. 10-2019-0026320, filed on Mar. 7, 2019, and 10-2020-0026887, filed on Mar. 4, 2020, in the Korean Intellectual Property Office, the contents of which are incorporated herein in their entirety by reference.

BACKGROUND

1. Field

One or more embodiments relate to an organometallic compound, an organic light-emitting device including the organometallic compound, and an electronic apparatus including the organic light-emitting device.

2. Description of the Related Art

Organic light-emitting devices are self-emission devices, which have better characteristics in terms of a viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

Aspects of the present disclosure provide an organometallic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments.

An aspect of the present disclosure provides an organometallic compound represented by Formula 1 below:

$$M(L_1)_{n1}(L_2)_{n2}. \quad \text{Formula 1}$$

In Formula 1,

M may be a transition metal, $L_1$ may be a ligand represented by Formula 2A, $L_2$ may be a ligand represented by Formula 2B, n1 and n2 may each independently be 1 or 2, wherein, when n1 is 2, two $L_1$(s) may be identical to or different from each other and when n2 is 2, two $L_2$(S) may be identical to or different from each other, the sum of n1 and n2 may be 2 or 3, and $L_1$ to $L_2$ may be different from each other:

Formula 2A

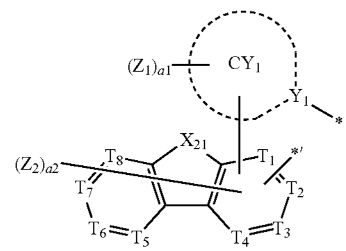

Formula 2B

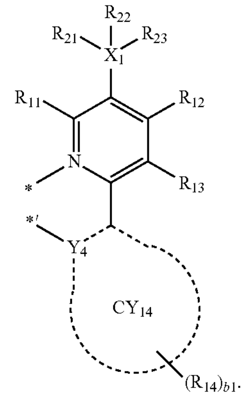

In Formulae 2A and 2B, $Y_1$ and $Y_4$ may each independently be C or N, $X_1$ may be Si or Ge, $X_{21}$ may be O, S, S(=O), N($Z_{29}$), C($Z_{29}$)($Z_{30}$), or Si($Z_{29}$)($Z_{30}$), $T_1$ to $T_4$ may each independently be C, N, carbon linked to ring $CY_1$, or carbon linked to M in Formula 1, wherein one of $T_1$ to $T_4$ may be carbon linked to M in Formula 1, and one of the remaining $T_1$ to $T_4$ that are not linked to M in Formula 1 may be carbon linked to ring $CY_1$, $T_5$ to $T_8$ may each independently be C or N, when $X_1$ is Si, at least one of the remaining $T_1$ to $T_8$ that are not carbon linked to M and ring $CY_1$ may be N, ring $CY_1$ and ring $CY_{14}$ may each independently be a $C_5$-$C_{30}$ carbocyclic group or a $C_1$-$C_{30}$ heterocyclic group, $R_{21}$ to $R_{23}$ may each independently be a $C_1$-$C_{60}$ alkyl group or a $C_6$-$C_{60}$ aryl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_3$-$C_{10}$ cycloalkyl group, a phenyl group, or any combination thereof, $Z_1$, $Z_2$, and $R_{11}$ to $R_{14}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Ge($Q_3$)($Q_4$)($Q_5$), —B($Q_6$)($Q_7$), —P(═O)($Q_8$)($Q_9$) or —P($Q_8$)($Q_9$), wherein $R_{12}$ is neither hydrogen nor a methyl group, a1 and b1 may each independently be an integer from 0 to 20, wherein, when a1 is 2 or more, two or more $Z_1$(s) may be identical or different, and when b1 is 2 or more, two or more $R_{14}$(s) may be identical or different, a2 may be an integer from 0 to 6, wherein, when a2 is 2 or more, two or more $Z_2$(s) may be identical to or different from each other, two or more of $R_{21}$ to $R_{23}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_1$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_2$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_{14}$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $Z_1$, $Z_2$ and $R_{11}$ to $R_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ may be the same as defined in connection with $R_{14}$,

* and *' in Formulae 2A and 2B each indicate a binding site to M in Formula 1, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof; a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Ge($Q_{33}$)($Q_{34}$)($Q_{35}$), —B($Q_{36}$)($Q_{37}$), —P(═O)($Q_{38}$)($Q_{39}$) or —P($Q_{38}$)($Q_{39}$); or any combination thereof, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group, a monovalent non-aromatic condensed polycyclic group; or a monovalent non-aromatic condensed heteropolycyclic group.

Another aspect of the present disclosure provides an organic light-emitting device including: a first electrode, a second electrode, and an organic layer disposed between the first electrode and the second electrode and including an emission layer, wherein the organic layer including at least one organometallic compound.

The organometallic compound may be included in the emission layer of the organic layer and the organometallic compound included in the emission layer may act as a dopant.

Another aspect of the present disclosure provides an electronic apparatus including the organic light-emitting device.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1 below:

$$M(L_1)_{n1}(L_2)_{n2}. \quad \text{Formula 1}$$

M in Formula 1 may be a transition metal.

For example, M may be a first-row transition metal, a second-row transition metal, or a third-row transition metal, of the Periodic Table of Elements.

For example, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

$L_1$ in Formula 1 may be a ligand represented by Formula 2A, and n1 in Formula 1 indicates the number of $L_1$(s) in Formula 1 and may be 1 or 2. When n1 is two, two $L_1$(s) may be identical to or different from each other.

$L_2$ in Formula 1 may be a ligand represented by Formula 2B, and n2 in Formula 1 indicates the number of $L_2$(s) in Formula 1 and may be 1 or 2. When n2 is two, two $L_2$(s) may be identical to or different from each other:

Formula 2A

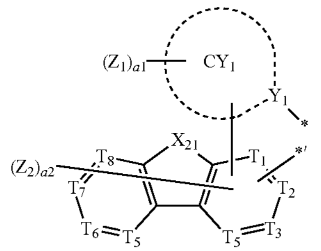

Formula 2B

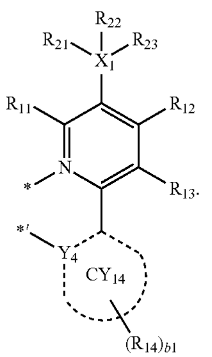

Formulae 2A and 2B will be understood by referring to a detailed description thereof to be provided later.

$L_1$ and $L_2$ in Formula 1 may be different from each other. That is, the organometallic compound represented by Formula 1 may be a heteroleptic complex.

In one or more embodiments, M may be Ir, and the sum of n1 and n2 may be 3; or M may be Pt, and the sum of n1 and n2 may be 2.

$Y_1$ and $Y_4$ in Formulae 2A and 2B may each independently be C or N.

For example, $Y_1$ in Formula 2A may be N and $Y_4$ in Formula 2B may be C.

$X_1$ in Formula 2B may be Si or Ge.

$X_{21}$ in Formula 2A may be O, S, S(═O), $N(Z_{29})$, $C(Z_{29})(Z_{30})$, or $Si(Z_{29})(Z_{30})$. $Z_{29}$ and $Z_{30}$ will be understood by referring to a detailed description thereof to be provided later.

For example, $X_{21}$ in Formula 2A may be O or S.

In Formula 2A, i) $T_1$ to $T_4$ may each independently be C, N, carbon linked to ring $CY_1$, or carbon linked to M in Formula 1, wherein one of $T_1$ to $T_4$ may be carbon linked to M in Formula 1, and one of the remaining $T_1$ to $T_4$ that are not linked to M in Formula 1 may be carbon linked to ring $CY_1$, and ii) $T_5$ to $T_8$ may each independently be C or N.

In Formula 1, when $X_1$ in Formula 2B is Si, at least one of the remaining $T_1$ to $T_8$ that are not carbon linked to M and ring $CY_1$ may be N.

In one or more embodiments, $X_1$ in Formula 2B may be Si, and at least one of the remaining $T_1$ to $T_8$ that are not carbon linked to M and ring $CY_1$ in Formula 2A may be N.

In one or more embodiments, $X_1$ in Formula 2B may be Ge, and $T_1$ to $T_8$ in Formula 2A may be C.

In one or more embodiments, $X_1$ in Formula 2B may be Ge, and at least one of the remaining $T_1$ to $T_8$ that are not carbon linked to M and ring $CY_1$ in Formula 2A may be N.

In one or more embodiments, $T_8$ in Formula 2A may be N.

Ring $CY_1$ and ring $CY_{14}$ in Formulae 2A and 2B may each independently be a $C_5$-$C_{30}$ carbocyclic group or a $C_1$-$C_{30}$ heterocyclic group.

For example, ring $CY_1$ and ring $CY_{14}$ may each independently be i) a first ring, ii) a second ring, iii) a condensed ring in which at least two first rings are condensed with each other, iv) a condensed ring in which at least two second rings are condensed with each other, or v) a condensed ring in which at least one first ring and at least one second ring are condensed with each other.

The first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group.

The second ring may be an admantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, in Formulae 2A and 2B, ring $CY_1$ and ring $CY_{14}$ may each independently be a cyclopentane group, a cyclohexane group, a cycloheptane group, a cyclopentene group, a cyclohexene group, a cycloheptene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an admantane group, a norbornane group, or a norbornene group.

In one or more embodiments, ring $CY_1$ and ring $CY_{14}$ may each independently be a benzene group, a naphthalene group, 1,2,3,4-tetrahydronaphthalene group, a phenanthrene group, a pyridine group, a pyrimidine group, a pyrazine group, a triazine group, a benzofuran group, a benzothiophene group, a fluorene group, a carbazole group, a dibenzofuran group, a dibenzothiophene group, a dibenzosilole group, an azafluorene group, an azacarbazole group, an azadibenzofuran group, an azadibenzothiophene group, or an azadibenzosilole group.

In one or more embodiments, ring $CY_1$ in Formula 2A may be a pyridine group, a 5,6,7,8-tetrahydroisoquinoline group, or a 5,6,7,8-tetrahydroquinoline group.

In one or more embodiments, ring $CY_{14}$ in Formula 2B may be a benzene group, a naphthalene group, 1,2,3,4-tetrahydronaphthalene group, a dibenzothiophene group, a dibenzofuran group, or a pyridine group.

In Formula 2B, $R_{21}$ to $R_{23}$ may each independently be a $C_1$-$C_{60}$ alkyl group or a $C_6$-$C_{60}$ aryl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_3$-$C_{10}$ cycloalkyl group, a phenyl group, or any combination thereof.

For example, $R_{21}$ to $R_{23}$ in Formula 2B may each independently be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a biphenyl group, or a naphthyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or any combination thereof.

In one or more embodiments, $R_{21}$ to $R_{23}$ may each independently be —$CH_3$, —$CH_2CH_3$, —$CD_3$, —$CD_2H$, —$CDH_2$, —$CH_2CD_3$, or —$CD_2CH_3$.

In one or more embodiments, $R_{21}$ to $R_{23}$ in Formula 2B may be identical to each other.

In one or more embodiments, at least two of $R_{21}$ to $R_{23}$ may be different from each other.

$Z_1$, $Z_2$, and $R_{11}$ to $R_{14}$ in Formulae 2A and 2B may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, —$P(=O)(Q_8)(Q_9)$ or —$P(Q_8)(Q_9)$, and $R_{12}$ may be neither hydrogen nor a methyl group. $Q_1$ to $Q_9$ may be the same as described in this disclosure.

In Formulae 2A and 2B, a1 and b1 indicate the number of $Z_1$(s) and the number of $R_{14}$(s), respectively, and may each independently be an integer from 0 to 20. When a1 is two or more, two or more $Z_1$(s) may be identical to or different from each other, and when b1 is two or more, two or more $R_{14}$(s) may be identical to or different from each other. For example, a1 and b1 may each independently be an integer from 0 to 10.

In Formula 2A, a2 indicates the number of $Z_2$(s) and may each independently be an integer from 0 to 6. When a2 is two or more, two or more $Z_2$(s) may be identical to or different from each other. For example, a2 may each independently be 0, 1, 2 or 3.

In one or more embodiments, $Z_1$ in Formula 2A may be hydrogen, deuterium, —F, —Cl, —Br, —I, a cyano group, a substituted or unsubstituted $C_1$-$C_{60}$ alkyl group, or a substituted or unsubstituted $C_3$-$C_{10}$ cycloalkyl group.

In one or more embodiments, in Formula 2A, $Z_1$ may be:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, or any combination thereof; or a $C_3$-$C_{10}$ cycloalkyl group or a $C_1$-$C_{10}$ heterocycloalkyl group, unsubstituted or substituted with deuterium, —F, a cyano group, a $C_1$-$C_{20}$ alkyl group, a deuterated $C_1$-$C_{20}$ alkyl group, or any combination thereof.

In one or more embodiments, in Formula 2A, $Z_1$ may be:

hydrogen, deuterium, —F, or a cyano group;

a $C_1$-$C_{20}$ alkyl group unsubstituted or substituted with deuterium, —F, a cyano group, a cyclopentyl group, a cyclohexyl group, a cycloheptyl group, a cyclooctyl group, an adamantanyl group, a norbornanyl group, a norbornenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)bicyclo[1.1.1]pentyl group, a ($C_1$-$C_{20}$ alkyl)bicyclo

[2.1.1]hexyl group, a ($C_1$-$C_{20}$ alkyl)bicyclo[2.2.2]octyl group, or any combination thereof; or a cyclopentyl group, a cyclohexyl group, a cycloheptyl group, a cyclooctyl group, an adamantanyl group, a norbornanyl group, a norbornenyl group, a bicyclo[1.1.1]pentyl group, a bicyclo[2.1.1]hexyl group, or a bicyclo[2.2.2]octyl group, each unsubstituted or substituted with deuterium, —F, a cyano group, a $C_1$-$C_{20}$ alkyl group, or any combination thereof.

In one or more embodiments, $Z_2$ and $R_{11}$ to $R_{14}$ in Formulae 2A and 2B may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_1$-$C_{20}$ alkoxy group or a $C_1$-$C_{20}$ alkylthio group;

a $C_1$-$C_{20}$ alkyl group, a $C_1$-$C_{20}$ alkoxy group or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl) cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl) cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N($Q_1$)($Q_2$), —Ge($Q_3$)($Q_4$)($Q_5$), —B($Q_6$)($Q_7$), —P(=O)($Q_8$)($Q_9$), or —P($Q_8$)($Q_9$), $R_{12}$ may not be hydrogen nor a methyl group, and $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, a number of carbon included in $R_{12}$ of Formula 2B may be at least two.

In one or more embodiments, $R_{12}$ in Formula 2B may be:

a $C_2$-$C_{20}$ alkyl group or a $C_2$-$C_{20}$ alkoxy group;

a methyl group or a methoxy group, each substituted with a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_1$-$C_{14}$ heteroaryl group, a monovalent non-aromatic condensed polycyclic group, a monovalent non-aromatic condensed heteropolycyclic group, or any combination thereof;

a $C_2$-$C_{20}$ alkyl group or a $C_2$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_1$-$C_{14}$ heteroaryl group, a monovalent non-aromatic condensed polycyclic group, a monovalent non-aromatic condensed heteropolycyclic group, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_1$-$C_{14}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_1$-$C_{14}$ heteroaryl group, a monovalent non-aromatic condensed polycyclic group, a monovalent non-aromatic condensed heteropolycyclic group, or any combination thereof; or —$N(Q_1)(Q_2)$, —$Ge(Q_3)(Q_4)(Q_5)$, —$B(Q_6)(Q_7)$, or —$P(=O)(Q_8)(Q_9)$.

In one or more embodiments, $R_{12}$ in Formula 2B may be:

a methyl group or a methoxy group, each substituted with a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a naphthyl group, a pyridinyl group, a pyrimidinyl group, or any combination thereof;

a methyl group or a methoxy group, each substituted with i) cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a naphthyl group, a pyridinyl group, a pyrimidinyl group, or any combination thereof, and ii) at least one deuterium;

a $C_2$-$C_{20}$ alkyl group or a $C_2$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a naphthyl group, a pyridinyl group, a pyrimidinyl group, or any combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl) cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo [2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof.

In one or more embodiments, the organometallic compound represented by Formula 1 may satisfy at least one of Condition (1) to Condition (3) below:

Condition (1)

In Formula 2A, $Z_1$ is not hydrogen, and a1 is an integer of 1 to 20.

Condition (2)

In Formula 2B, $R_{14}$ is not hydrogen, and b1 is an integer of 1 to 20.

Condition (3)

In Formula 2A, $Z_2$ is not hydrogen, and a2 is an integer of 1 to 6.

In one or more embodiments, the organometallic compound represented by Formula 1 may include at least one deuterium, at least one fluoro group (—F), at least one cyano group (—CN), or any combination thereof.

In one or more embodiments, the organometallic compound represented by Formula 1 may include at least one deuterium.

In one or more embodiments, the organometallic compound represented by Formula 1 may satisfy at least one of Condition A to Condition I below:

Condition A

In Formula 2A, $Z_1$ is not hydrogen, a1 is an integer of 1 to 20, and at least one of $Z_1$(s) in the number of a1 includes deuterium.

Condition B

In Formula 2A, $Z_2$ is not hydrogen, a2 is an integer of 1 to 6, and at least one of $Z_2$(s) in the number of a2 includes deuterium.

Condition C

In Formula 2A, $Z_2$ is not hydrogen, a2 is an integer of 1 to 6, and at least one of $Z_2$(s) in the number of a2 includes —F.

Condition D

In Formula 2A, $Z_2$ is not hydrogen, a2 is an integer of 1 to 6, and at least one of $Z_2$(s) in the number of a2 includes —CN.

Condition E

In Formula 2A, $Z_2$ is not hydrogen, a2 is an integer of 1 to 6, and at least one of $Z_2$(s) in the number of a2 is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

Condition F

In Formula 2B, at least one of $R_{21}$ to $R_{23}$ includes deuterium.

Condition G

In Formula 2B, $R_{12}$ includes deuterium.

Condition H

In Formula 2B, $R_{14}$ is not hydrogen, b1 is an integer of 1 to 20, and at least one of $R_{14}$(S) in the number of b1 includes deuterium.

Condition I

In Formula 2B, $R_{14}$ is not hydrogen, b1 is an integer of 1 to 20, and at least one of $R_{14}$(S) in the number of b1 includes —F.

In one or more embodiments, $Z_2$ in Formula 2A may not be hydrogen, a2 may be an integer from 1 to 3, and at least one of $Z_2$(s) in number of a2 may each independently be a substituted or unsubstituted $C_1$-$C_{60}$ alkyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $Z_2$ in Formula 2A may not be hydrogen, a2 may be an integer from 1 to 3, and at least one of $Z_2$(s) in number of a2 may each independently be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $Z_1$ in Formula 2A may be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—OCH_3$, $—OCDH_2$, $—OCD_2H$, $—OCD_3$, $—SCH_3$, $—SCDH_2$, $—SCD_2H$, $—SCD_3$, one of groups represented by Formulae 9-1 to 9-39, one of groups represented by Formulae 9-1 to 9-39 in which at least one hydrogen is substituted with deuterium, one of groups represented by Formulae 9-1 to 9-39 in which at least one hydrogen is substituted with —F, one of groups represented by Formulae 9-201 to 9-233, one of groups represented by Formulae 9-201 to 9-233 in which at least one hydrogen is substituted with deuterium, one of groups represented by Formulae 9-201 to 9-233 in which at least one hydrogen is substituted with —F, one of groups represented by Formulae 10-1 to 10-11, one of groups represented by Formulae 10-1 to 10-11 in which at least one hydrogen is substituted with deuterium, or one of groups represented by Formulae 10-1 to 10-11 in which at least one hydrogen is substituted with —F.

In one or more embodiments, $Z_2$ and $R_{11}$ to $R_{14}$ in Formulae 2A and 2B may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—OCH_3$, $—OCDH_2$, $—OCD_2H$, $—OCD_3$, $—SCH_3$, $—SCDH_2$, $—SCD_2H$, $—SCD_3$, one of groups represented by Formulae 9-1 to 9-39, one of groups represented by Formulae 9-1 to 9-39 in which at least one hydrogen is substituted with deuterium, one of groups represented by Formulae 9-1 to 9-39 in which at least one hydrogen is substituted with —F, one of groups represented by Formulae 9-201 to 9-233, one of groups represented by Formulae 9-201 to 9-233 in which at least one hydrogen is substituted with deuterium, one of groups represented by Formulae 9-201 to 9-233 in which at least one hydrogen is substituted with —F, one of groups represented by Formulae 10-1 to 10-132, one of groups represented by Formulae 10-1 to 10-132 in which at least one hydrogen is substituted with deuterium, or one of groups represented by Formulae 10-1 to 10-132 in which at least one hydrogen is substituted with —F, one of groups represented by Formulae 10-201 to 10-353, one of groups represented by Formulae 10-201 to 10-353 in which at least one hydrogen is substituted with deuterium, one of groups represented by Formulae 10-201 to 10-353 in which at least one hydrogen is substituted with —F, $—N(Q_1)(Q_2)$, or $—Ge(Q_3)(Q_4)(Q_5)$ (wherein $Q_1$ to $Q_5$ are the same as described above).

In one or more embodiments, $R_{12}$ in Formula 2B may be one of groups represented by Formulae 9-1 to 9-39, one of groups represented by Formulae 9-1 to 9-39 in which at least one hydrogen is substituted with deuterium, one of groups represented by Formulae 9-1 to 9-39 in which at least one hydrogen is substituted with —F, one of groups represented by Formulae 9-201 to 9-233, one of groups represented by Formulae 9-201 to 9-233 in which at least one hydrogen is substituted with deuterium, one of groups represented by Formulae 9-201 to 9-233 in which at least one hydrogen is substituted with —F, one of groups represented by Formulae 10-1 to 10-132, one of groups represented by Formulae 10-1 to 10-132 in which at least one hydrogen is substituted with deuterium, or one of groups represented by Formulae 10-1 to 10-132 in which at least one hydrogen is substituted with —F, one of groups represented by Formulae 10-201 to 10-353, one of groups represented by Formulae 10-201 to 10-353 in which at least one hydrogen is substituted with deuterium, or one of groups represented by Formulae 10-201 to 10-353 in which at least one hydrogen is substituted with —F:

9-1
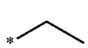

9-2
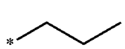

9-3
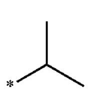

9-4
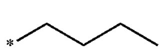

-continued 9-5
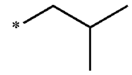

9-6
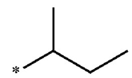

9-7
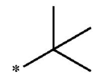

9-8
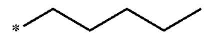

9-9
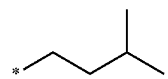

9-10
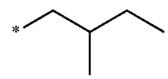

9-11
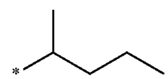

9-12
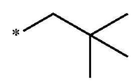

9-13
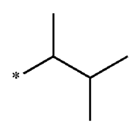

9-14
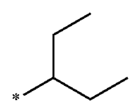

9-15
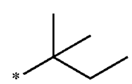

9-16
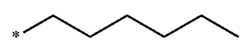

9-17
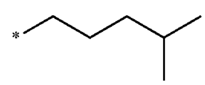

9-18
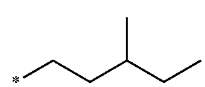

9-19
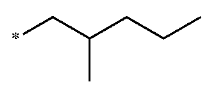

9-20
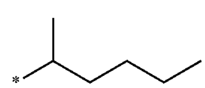

9-21
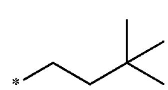

9-22
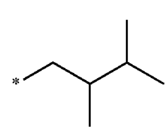

-continued
9-23
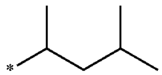
9-24
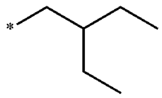
9-25
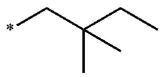
9-26
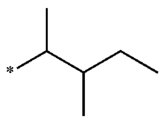
9-27
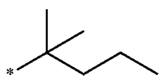
9-28
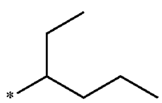
9-29
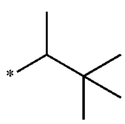
9-30
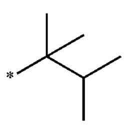
9-31
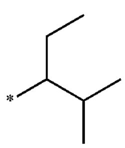
9-32
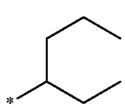
9-33
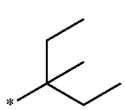
9-34
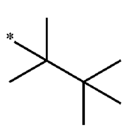
9-35
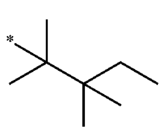
-continued
9-36
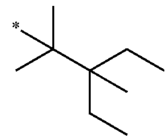
9-37
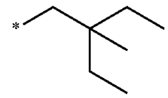
9-38
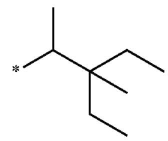
9-39
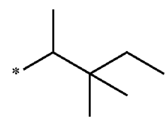
9-201
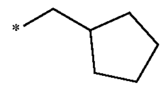
9-202
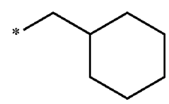
9-203
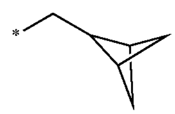
9-204
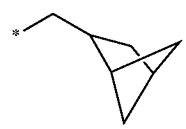
9-205
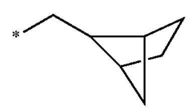
9-206
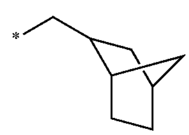
9-207
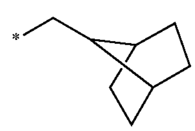
9-208
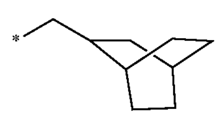
9-209
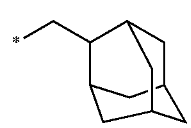

-continued
9-210
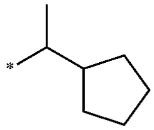
9-211
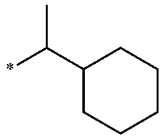
9-212
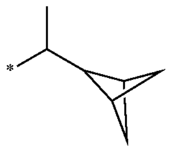
9-213
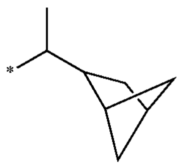
9-214
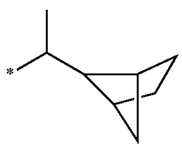
9-215
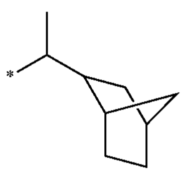
9-216
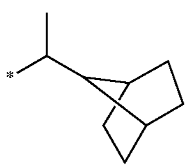
9-217
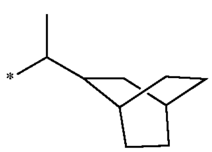
9-218
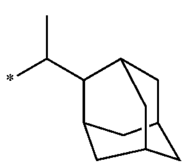
9-219
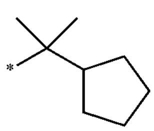
-continued
9-220
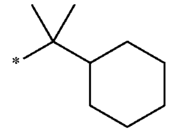
9-221
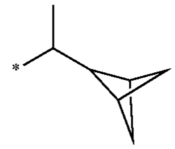
9-222
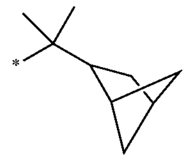
9-223
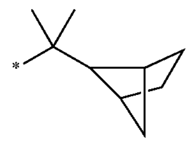
9-224
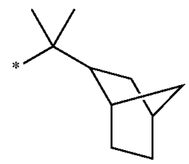
9-225
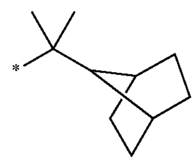
9-226
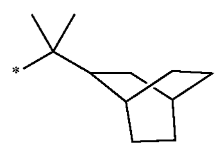
9-227
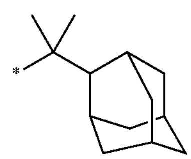
9-228
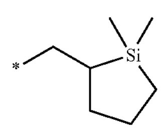
9-229
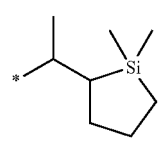

-continued
9-230
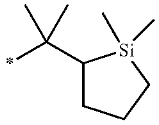
9-231
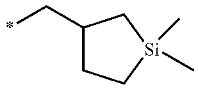
9-232
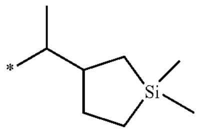
9-233
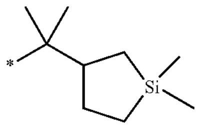
10-1
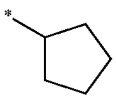
10-2
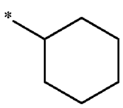
10-3
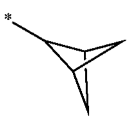
10-4
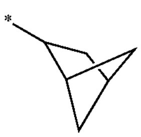
10-5
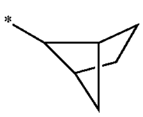
10-6
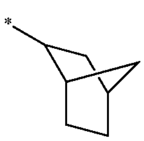
10-7
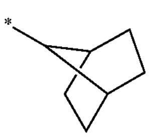
10-8
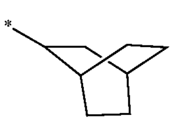
-continued
10-9
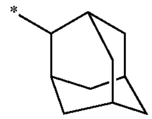
10-10
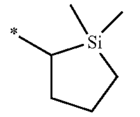
10-11
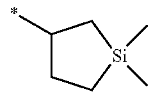
10-12
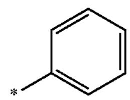
10-13
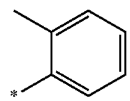
10-14
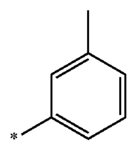
10-15
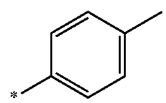
10-16
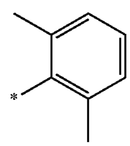
10-17
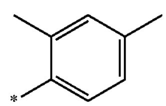
10-18
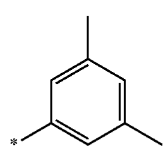
10-19
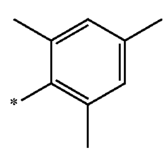
10-20
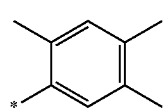

-continued
10-21
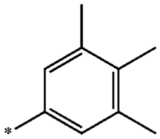
10-22
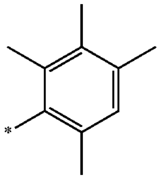
10-23
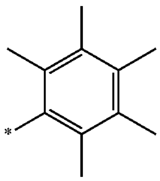
10-24
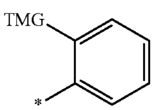
10-25
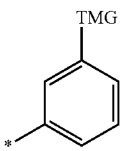
10-26
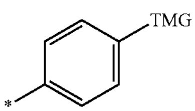
10-27
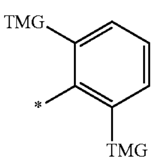
10-28
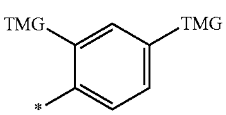
10-29
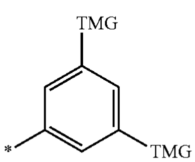
10-30
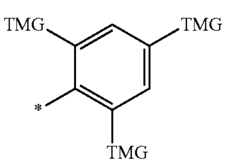
10-31
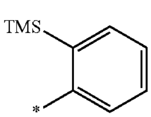
-continued
10-32
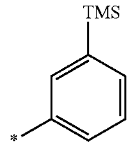
10-33
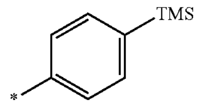
10-34
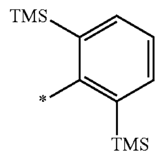
10-35
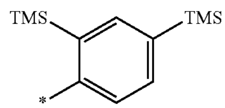
10-36
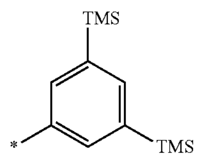
10-37
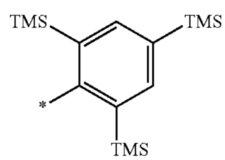
10-38
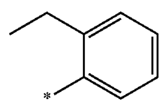
10-39
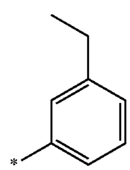
10-40
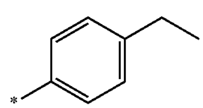
10-41
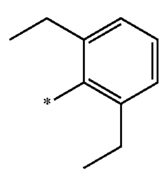
10-42
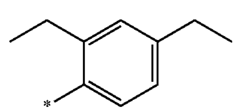

-continued
10-43
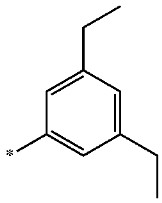
10-44
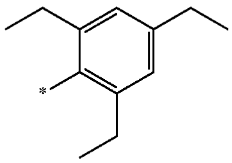
10-45
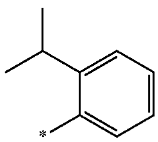
10-46
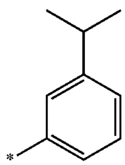
10-47
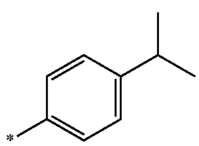
10-48
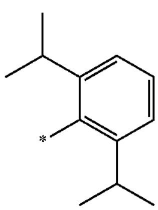
10-49
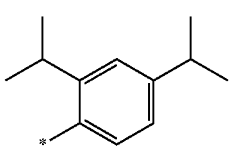
10-50
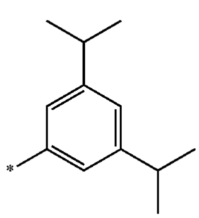
-continued
10-51
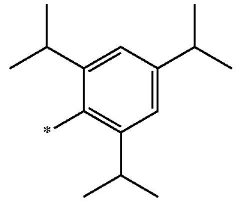
10-52
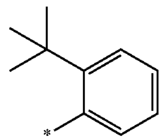
10-53
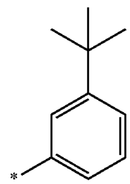
10-54
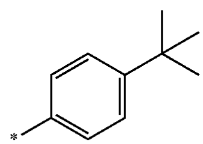
10-55
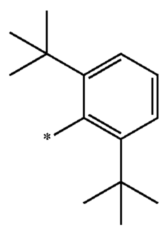
10-56
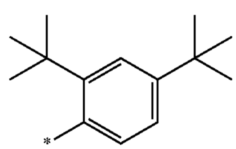
10-57
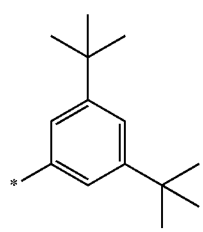
10-58
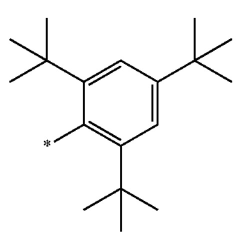

-continued
10-59
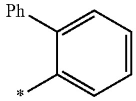
10-60
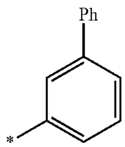
10-61
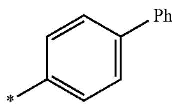
10-62
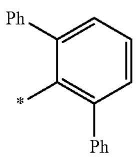
10-63
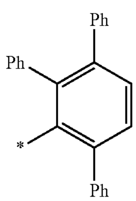
10-64
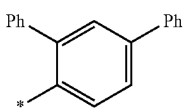
10-65
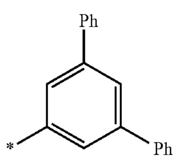
10-66
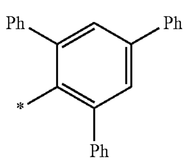
10-67
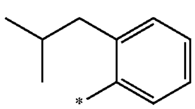
10-68
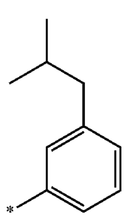
10-69
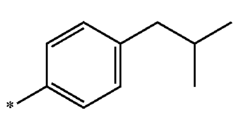
-continued
10-70
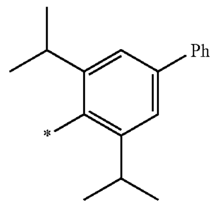
10-71
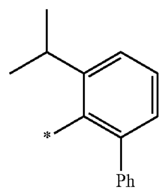
10-72
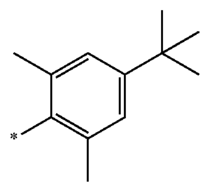
10-73
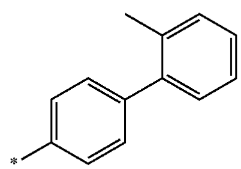
10-74
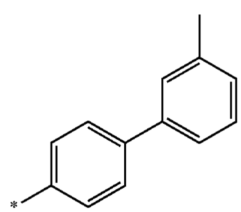
10-75
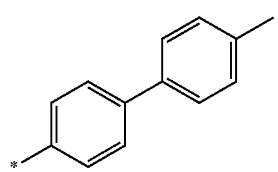
10-76
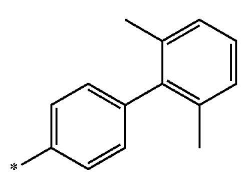
10-77
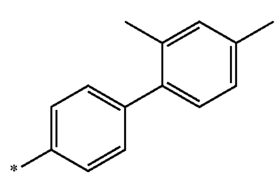

-continued
10-78
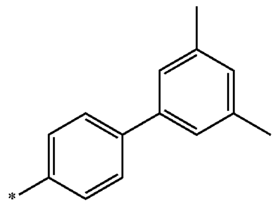
10-79
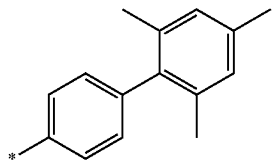
10-80
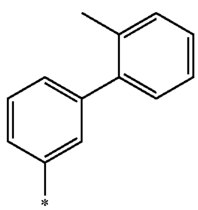
10-81
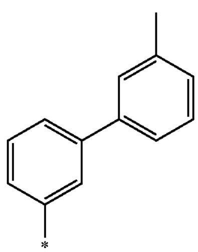
10-82
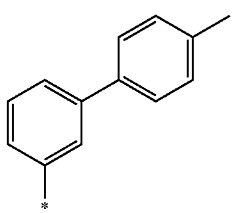
10-83
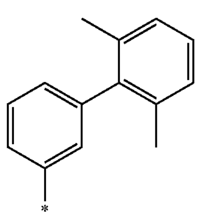
10-84
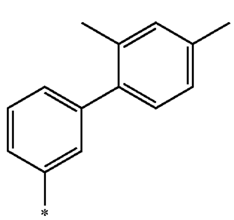
-continued
10-85
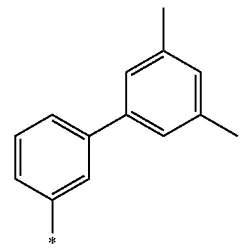
10-86
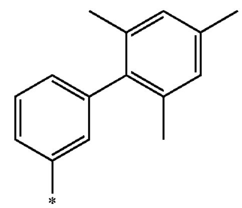
10-87
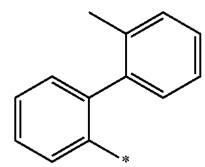
10-88
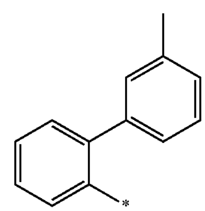
10-89
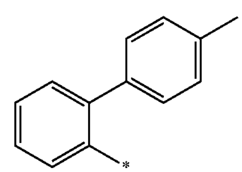
10-90
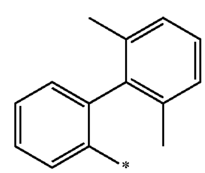
10-91
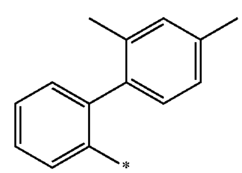
10-92
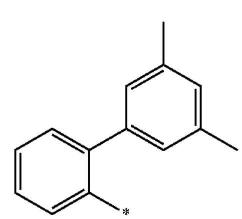

-continued
10-93
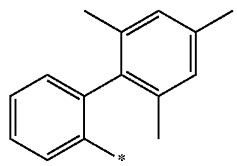
10-94
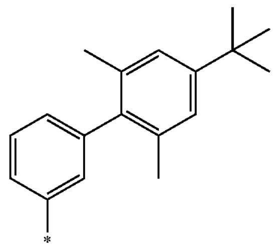
10-95
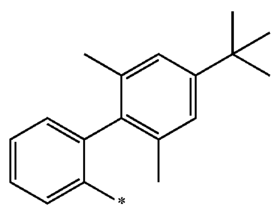
10-96
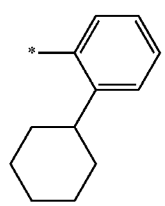
10-97
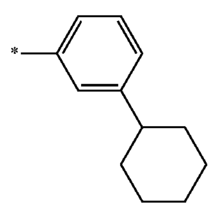
10-98
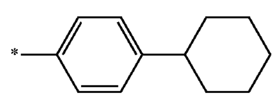
10-99
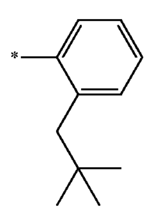
10-100
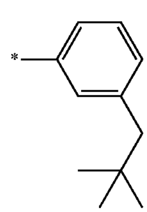
10-101
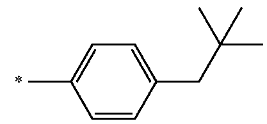
10-102
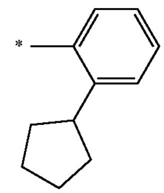
10-103
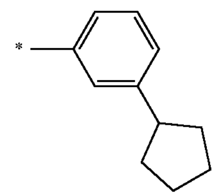
10-104
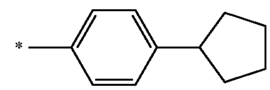
10-105
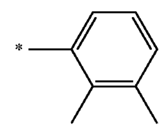
10-106
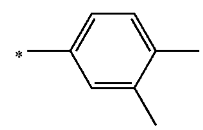
10-107
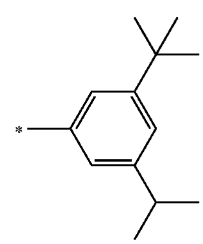
10-108
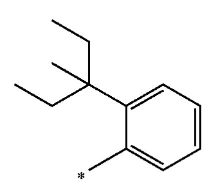
10-109
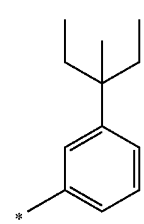

-continued
10-110
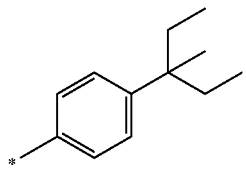
10-111
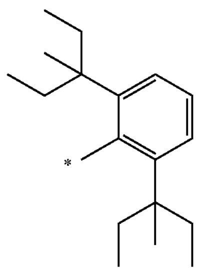
10-112
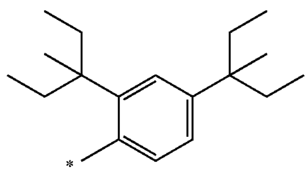
10-113
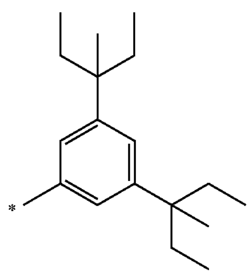
10-114
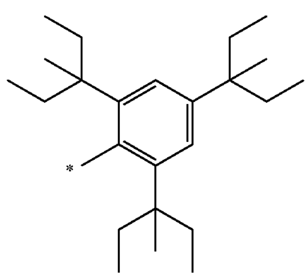
10-115
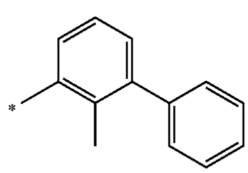
10-116
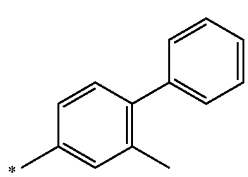
-continued
10-117
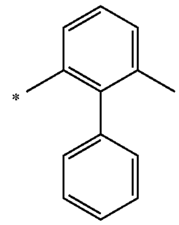
10-118
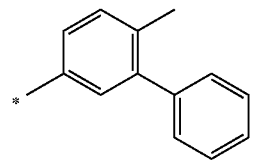
10-119
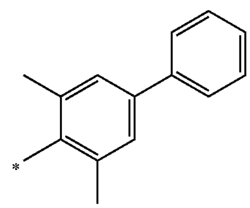
10-120
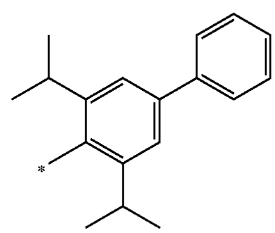
10-121
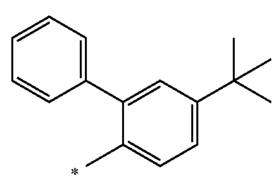
10-122
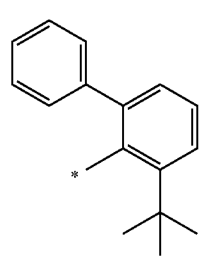

-continued
10-123
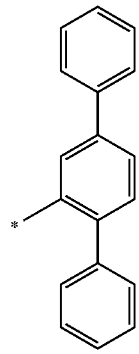
10-124
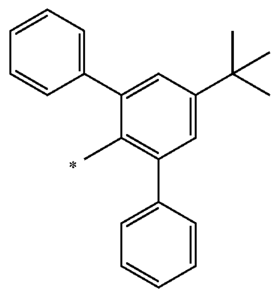
10-125
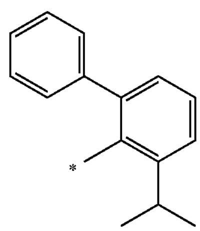
10-126
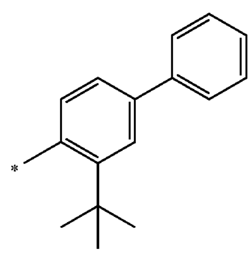
10-127
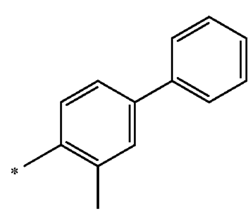
10-128
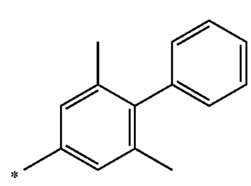
-continued
10-129
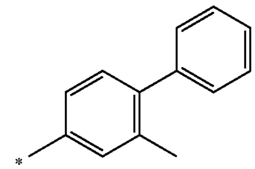
10-130
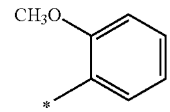
10-131
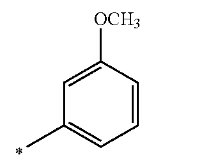
10-132
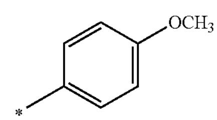
10-201
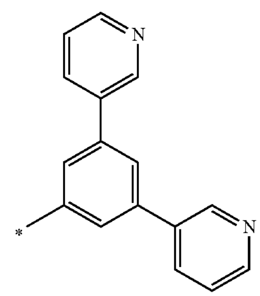
10-202
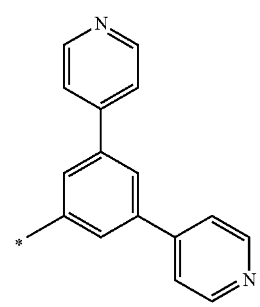
10-203
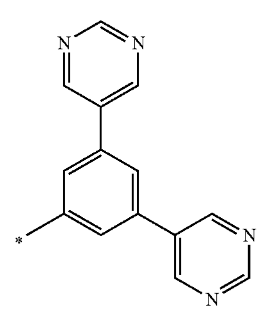

-continued
10-204
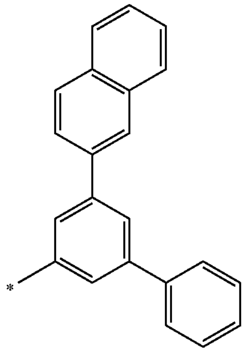
10-205
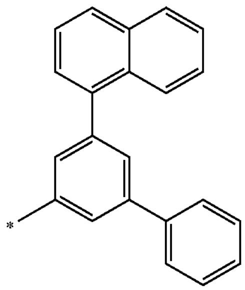
10-206
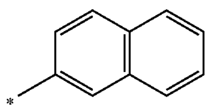
10-207
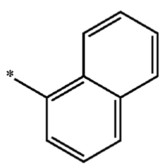
10-208
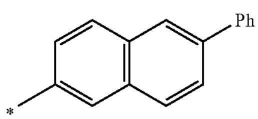
10-209
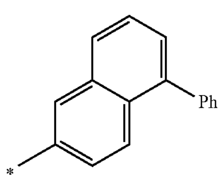
10-210
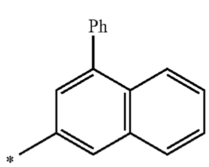
10-211
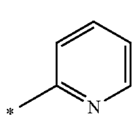
-continued
10-212
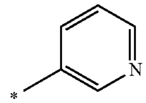
10-213
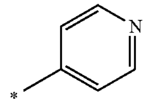
10-214
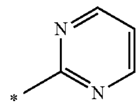
10-215
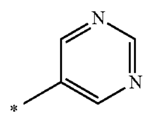
10-216
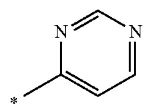
10-217
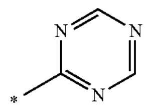
10-218
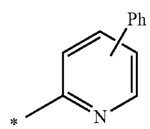
10-219
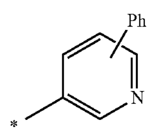
10-220
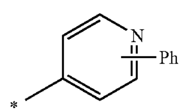
10-221
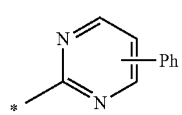
10-222
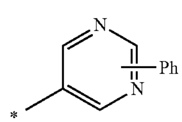
10-223
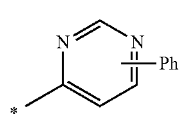

-continued
10-224
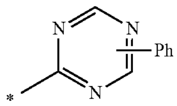
10-225
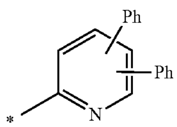
10-226
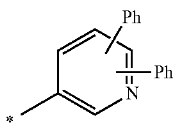
10-227
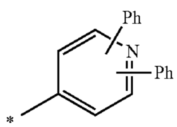
10-228
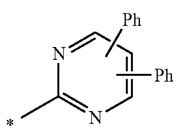
10-229
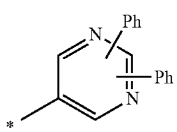
10-230
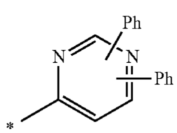
10-231
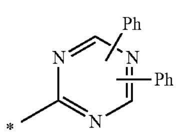
10-232
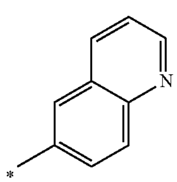
10-233
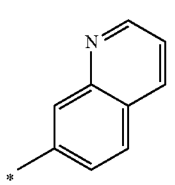
-continued
10-234
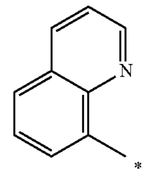
10-235
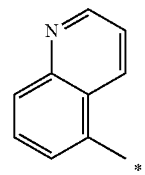
10-236
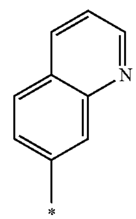
10-237
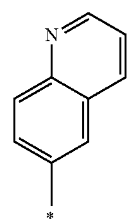
10-238
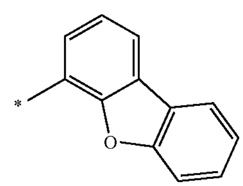
10-239
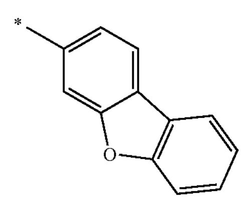
10-240
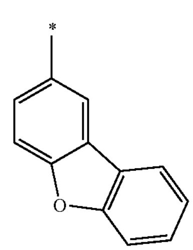

-continued
10-241
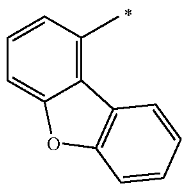
10-242
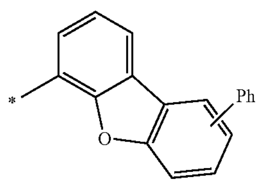
10-243
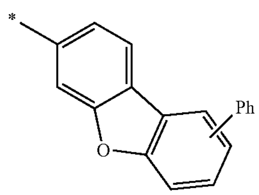
10-244
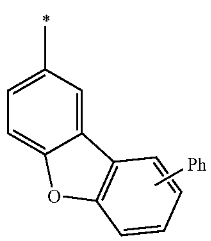
10-245
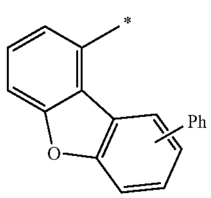
10-246
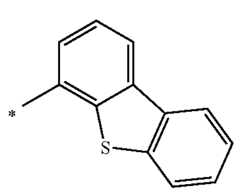
10-247
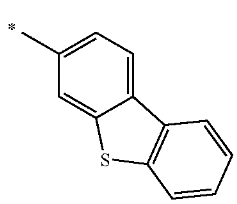
-continued
10-248
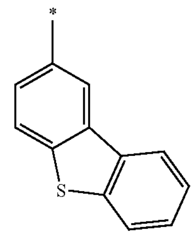
10-249
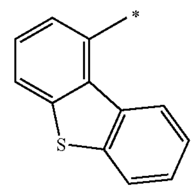
10-250
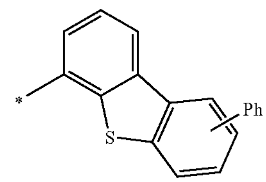
10-251
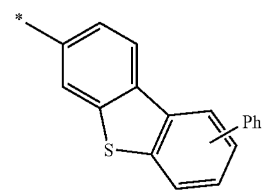
10-252
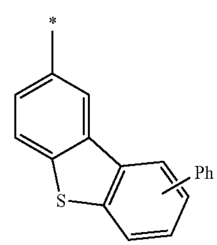
10-253
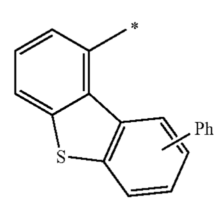
10-254
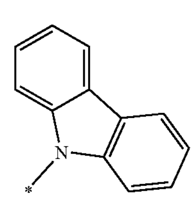

10-255
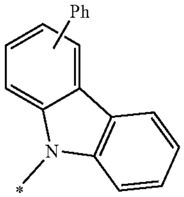
10-256
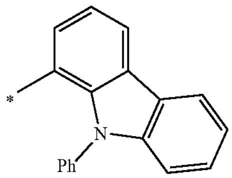
10-257
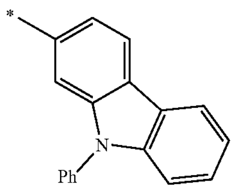
10-258
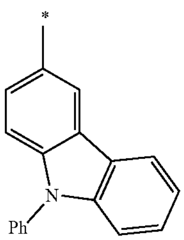
10-259
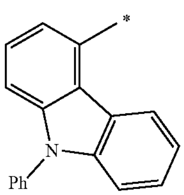
10-260
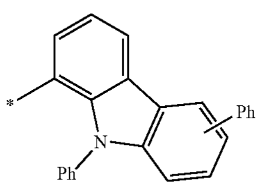
10-261
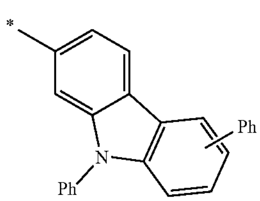
10-262
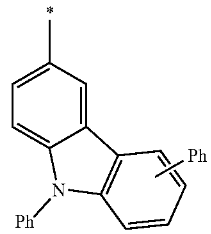
10-263
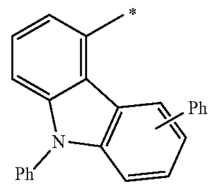
10-264
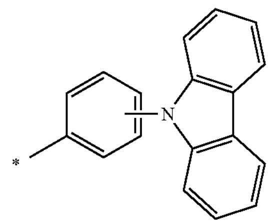
10-265
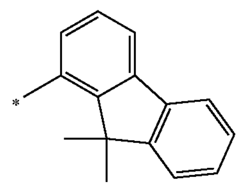
10-266
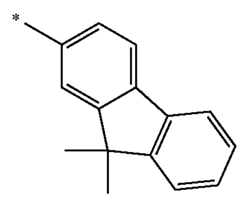
10-267
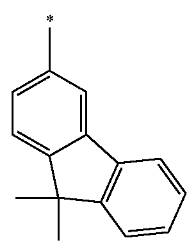
10-268
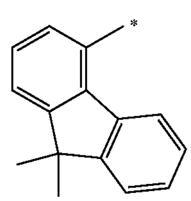

-continued
10-269
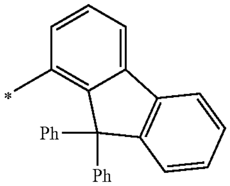
10-270
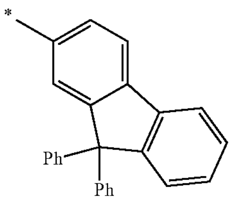
10-271
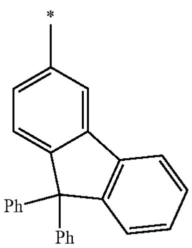
10-272
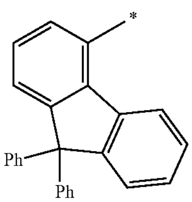
10-273
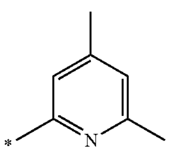
10-274
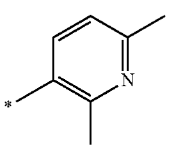
10-275
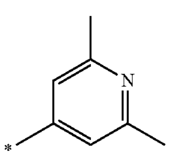
10-276
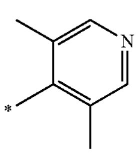
-continued
10-277
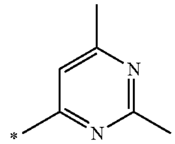
10-278
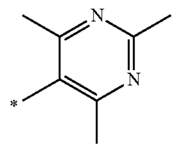
10-279
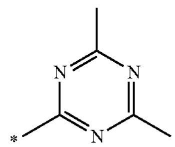
10-280
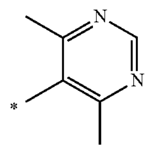
10-281
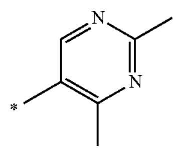
10-282
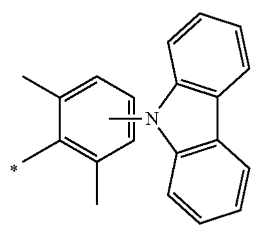
10-283
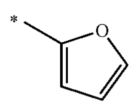
10-284
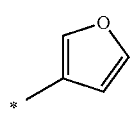
10-285
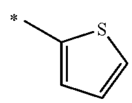
10-286
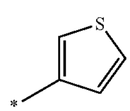
10-287
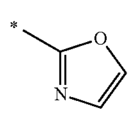

-continued
10-288
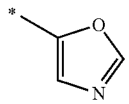
10-289
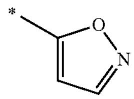
10-290
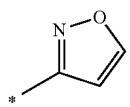
10-291
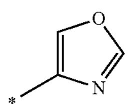
10-292
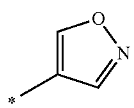
10-293
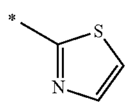
10-294
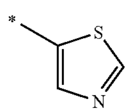
10-295
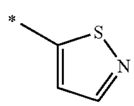
10-296
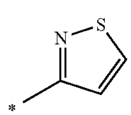
10-297
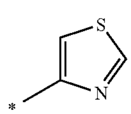
10-298
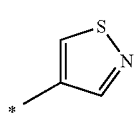
10-299
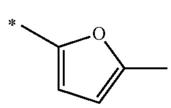
10-300
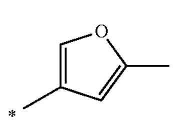
-continued
10-301
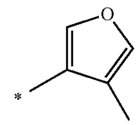
10-302
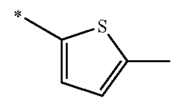
10-303
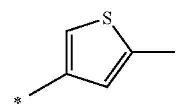
10-304
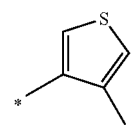
10-305
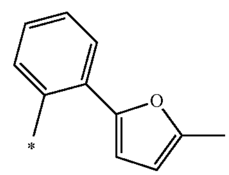
10-306
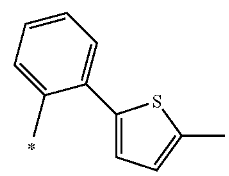
10-307
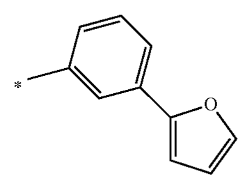
10-308
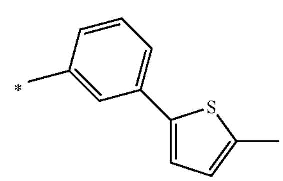
10-309
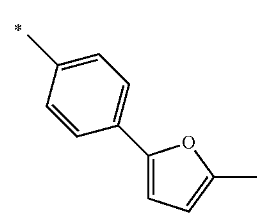

-continued
10-310
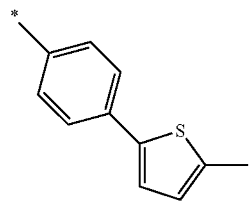
10-311
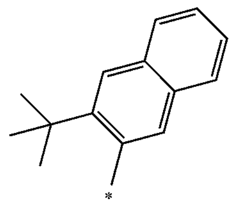
10-312
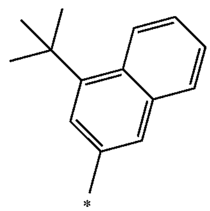
10-313
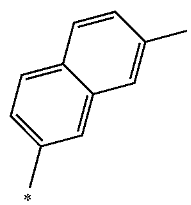
10-314
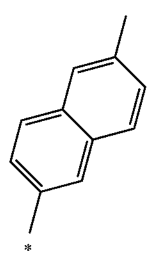
10-315
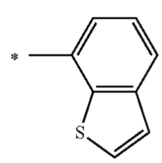
10-316
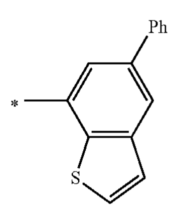
-continued
10-317
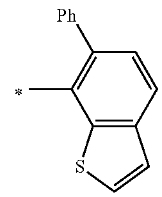
10-318
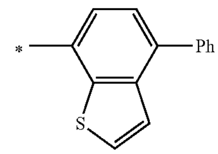
10-319
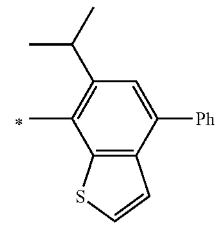
10-320
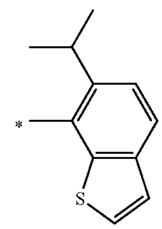
10-321
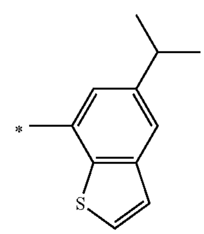
10-322
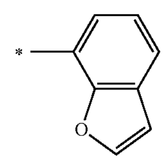
10-323
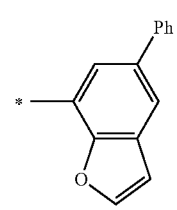
10-324
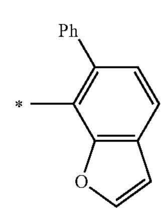

-continued
10-325
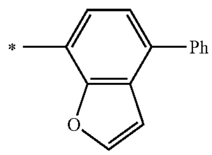
10-326
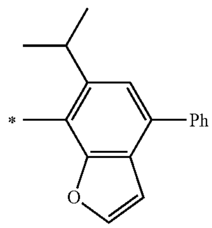
10-327
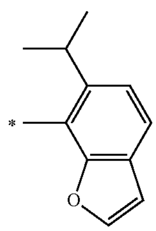
10-328
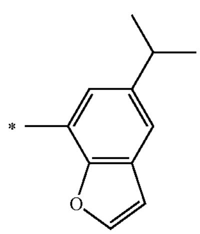
10-329
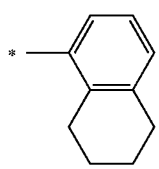
10-330
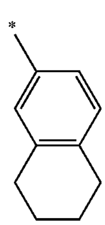
10-331
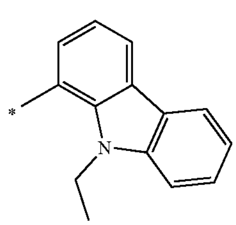
-continued
10-332
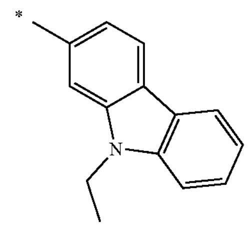
10-333
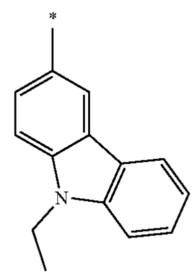
10-334
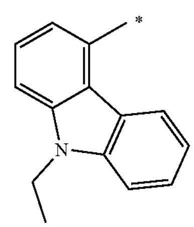
10-335
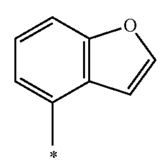
10-336
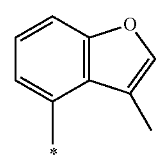
10-337
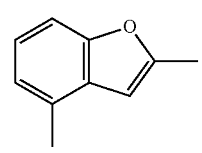
10-338
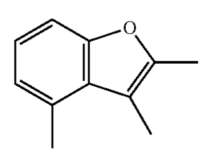
10-339
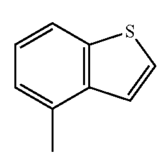

-continued 10-340

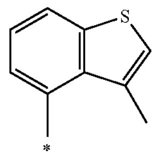

10-341

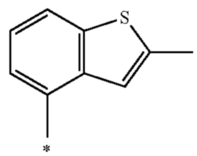

10-342

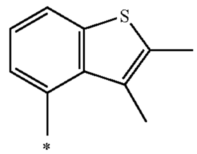

10-343

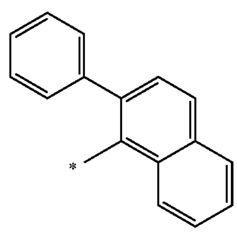

10-344

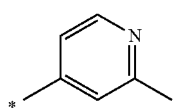

10-345

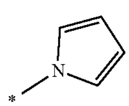

10-346

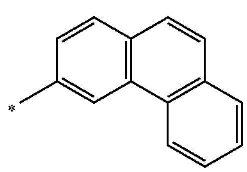

10-347

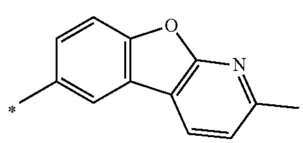

10-348

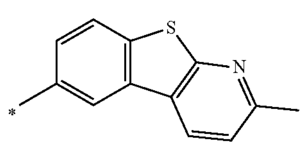

10-349

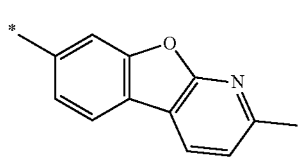

-continued 10-350

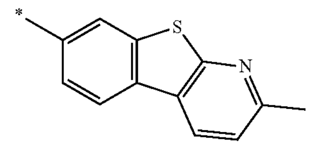

10-351

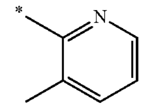

10-352

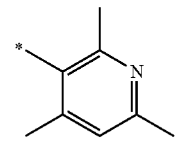

10-353

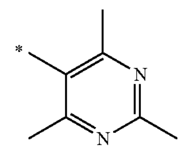

In Formulae 9-1 to 9-39, 9-201 to 9-233, 10-1 to 10-132 and 10-201 to 10-353, indicates a binding site to a neighboring atom, Ph indicates a phenyl group, TMS indicates a trimethylsilyl group, TMG indicates a trimethylgermyl group, and OMe indicates a methoxy group.

The term "groups represented by Formulae 9-1 to 9-39 in which at least one hydrogen is substituted with deuterium" and "groups represented by Formulae 9-201 to 9-233 in which at least one hydrogen is substituted with deuterium" as used herein may be, for example, groups represented by Formulae 9-501 to 9-514 and 9-601 to 9-635:

9-501

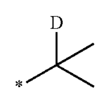

9-502

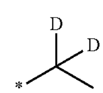

9-503

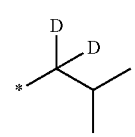

9-504

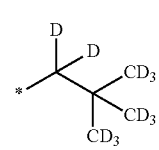

9-505

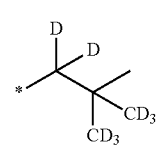

9-506
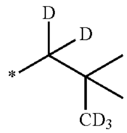
9-507
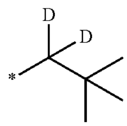
9-508
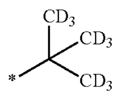
9-509
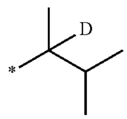
9-510
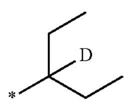
9-511
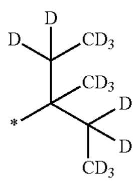
9-512
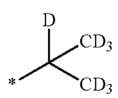
9-513
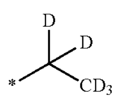
9-514
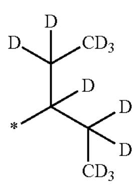
9-601
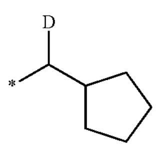
9-602
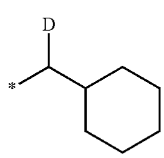
9-603
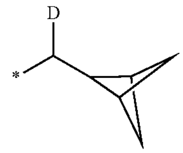
9-604
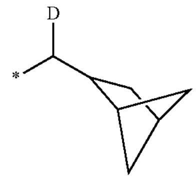
9-605
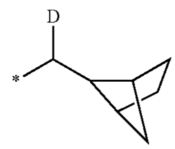
9-606
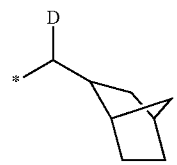
9-607
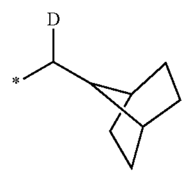
9-608
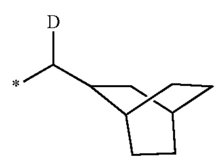
9-609
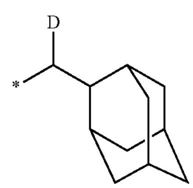
9-610
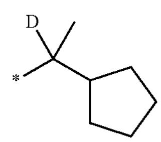
9-611
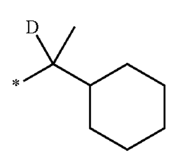

-continued
9-612
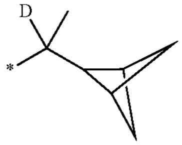
9-613
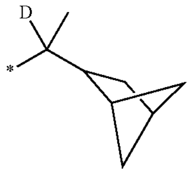
9-614
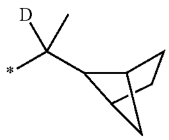
9-615
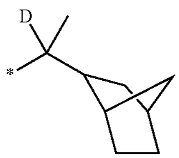
9-616
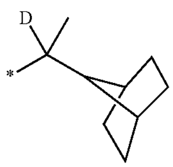
9-617
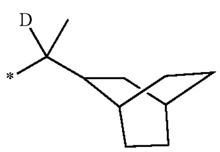
9-618
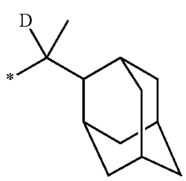
9-619
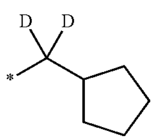
9-620
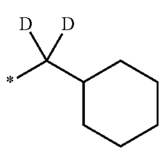
9-621
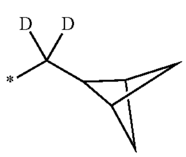
-continued
9-622
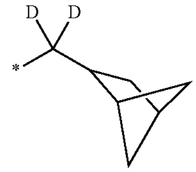
9-623
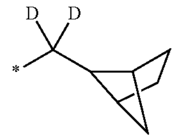
9-624
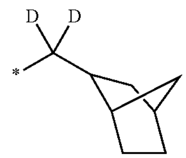
9-625
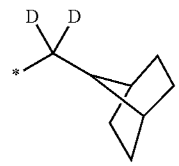
9-626
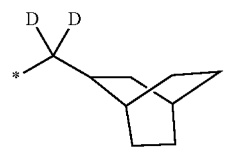
9-627
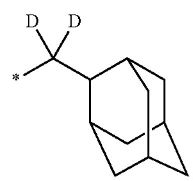
9-628
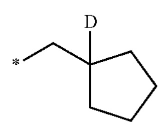
9-629
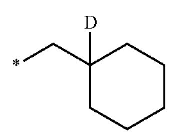
9-630
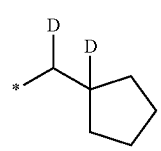
9-631
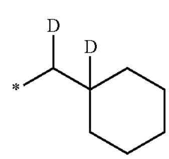

-continued 9-632

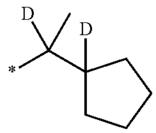

9-633

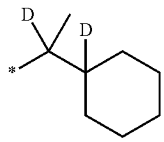

9-634

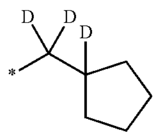

9-635

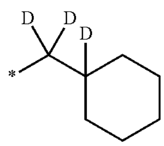

The term "groups represented by Formulae 9-1 to 9-39 in which at least one hydrogen is substituted with —F" and "groups represented by Formulae 9-201 to 9-233 in which at least one hydrogen is substituted with —F" as used herein may be, for example, groups represented by Formulae 9-701 to 9-710:

9-701

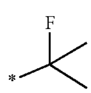

9-702

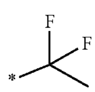

9-703

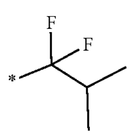

9-704

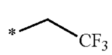

9-705

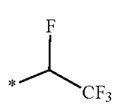

9-706

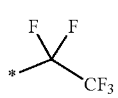

9-707

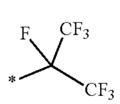

9-708

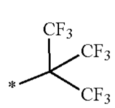

-continued 9-709

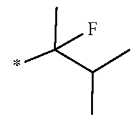

9-710

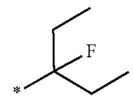

The term "groups represented by Formulae 10-1 to 10-132 in which at least one hydrogen is substituted with deuterium" and "groups represented by Formulae 10-201 to 10-353 in which at least one hydrogen is substituted with deuterium" as used herein may be, for example, groups represented by Formulae 10-501 to 10-553:

10-501

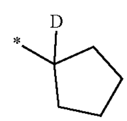

10-502

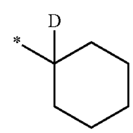

10-503

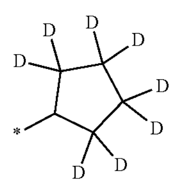

10-504

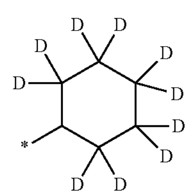

10-505

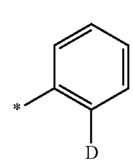

10-506

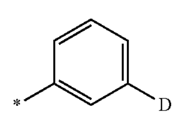

10-507

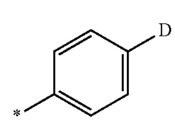

-continued
10-508
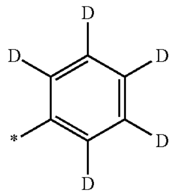
10-509
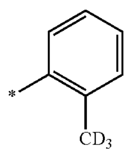
10-510
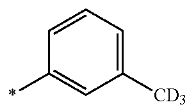
10-511
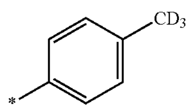
10-512
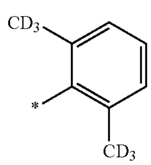
10-513
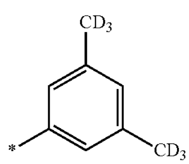
10-514
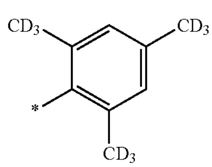
10-515
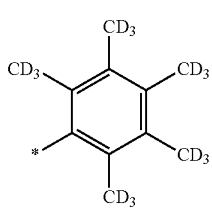
10-516
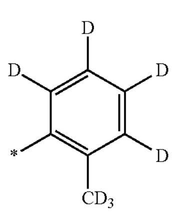
-continued
10-517
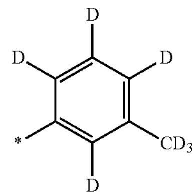
10-518
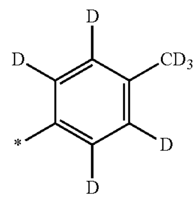
10-519
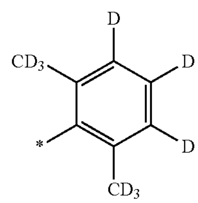
10-520
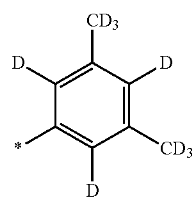
10-521
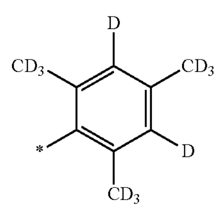
10-522
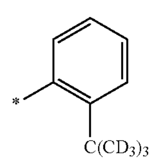
10-523
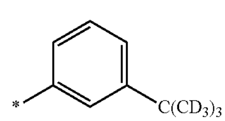
10-524
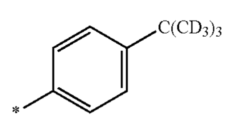
10-525
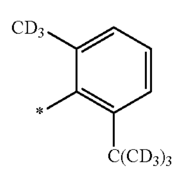

-continued
10-526
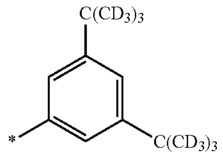
10-527
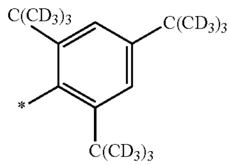
10-528
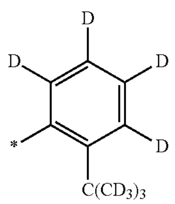
10-529
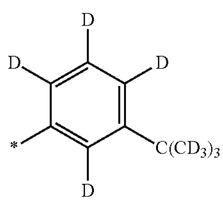
10-530
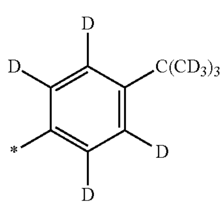
10-531
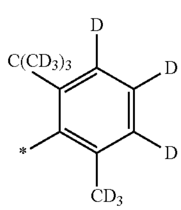
10-532
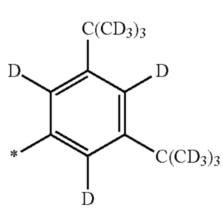
10-533
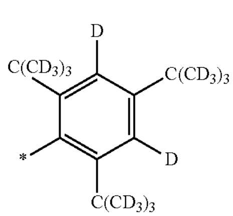
-continued
10-534
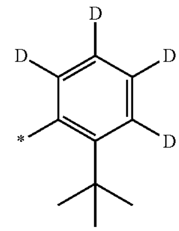
10-535
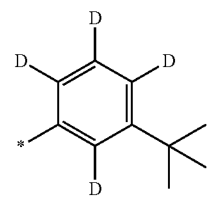
10-536
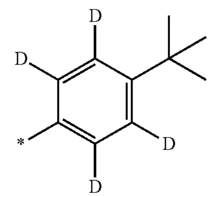
10-537
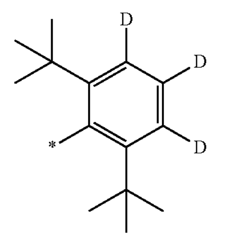
10-538
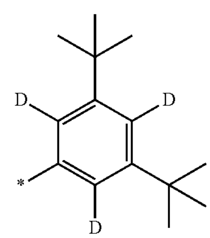
10-540
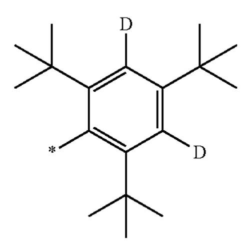
10-541
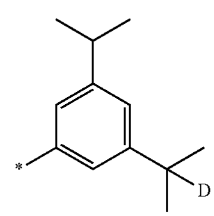

-continued
10-542
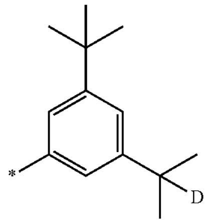
10-543
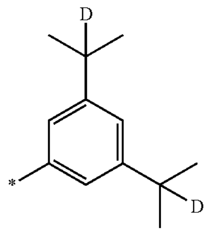
10-544
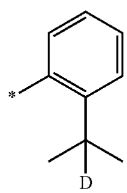
10-545
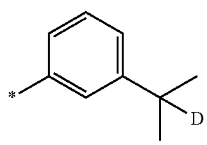
10-546
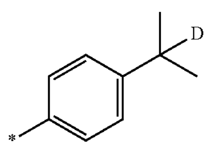
10-547
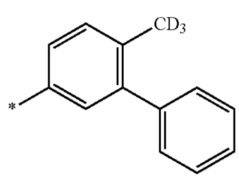
10-548
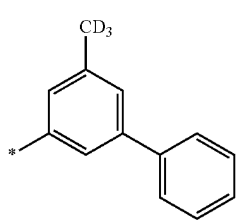
10-549
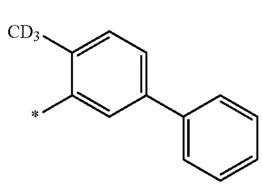
-continued
10-550
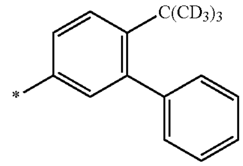
10-551
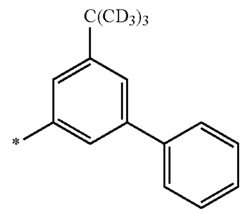
10-552
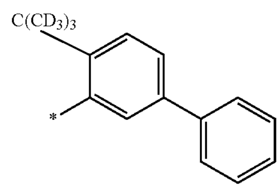
10-553
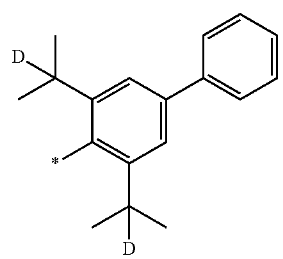
The term "groups represented by Formulae 10-1 to 10-132 in which at least one hydrogen is substituted with —F" and "groups represented by Formulae 10-201 to 10-353 in which at least one hydrogen is substituted with —F" as used herein may be, for example, groups represented by Formulae 10-601 to 10-620:
10-601
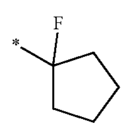
10-602
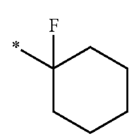
10-603
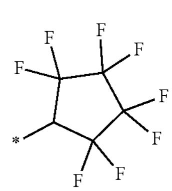

-continued 10-604

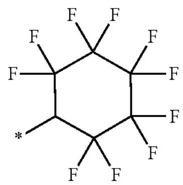

10-605

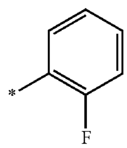

10-606

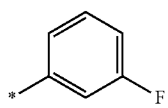

10-607

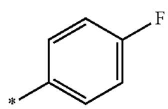

10-608

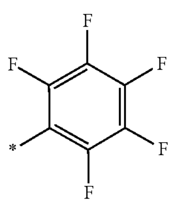

10-609

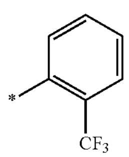

10-610

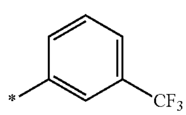

10-611

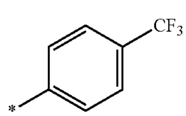

10-612

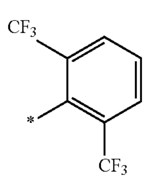

10-613

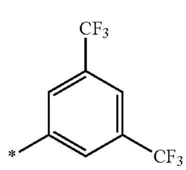

-continued 10-614

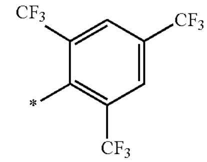

10-615

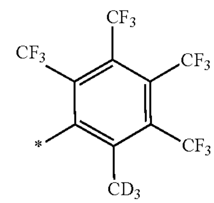

10-616

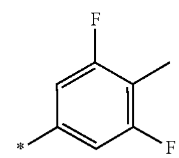

10-617

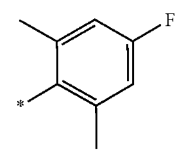

10-618

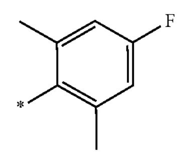

10-619

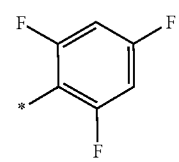

10-620

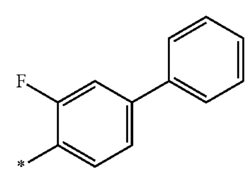

In Formulae 2A and 2B, i) two or more of $R_{21}$ to $R_{23}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $Z_1$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $Z_2$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) $R_{12}$ and $R_{13}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, v) two or more of a plurality of $R_{14}$(s) may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and vi) two or more of $Z_1$, $Z_2$ and $R_{11}$ to $R_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ may be the same as defined in connection with $R_{14}$ in the present specification.

In Formulae 2A and 2B, * and *' each indicate a binding site to M in Formula 1.

In one or more embodiments, the group represented by

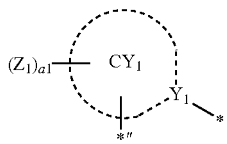

in Formula 2A may be a group represented by one of Formulae CY1-1 to CY1-28:

CY1-1

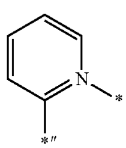

CY1-2

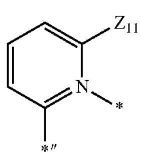

CY1-3

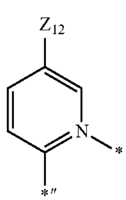

CY1-4

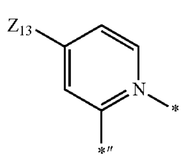

CY1-5

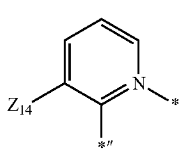

CY1-6

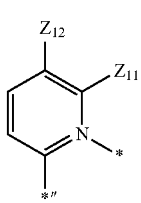

-continued

CY1-7

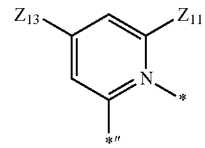

CY1-8

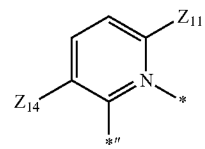

CY1-9

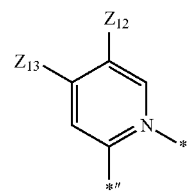

CY1-10

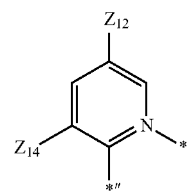

CY1-11

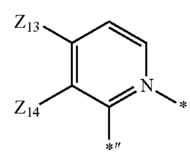

CY1-12

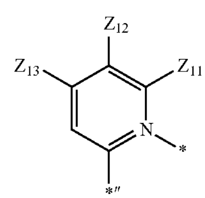

CY1-13

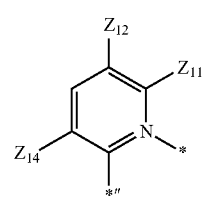

CY1-14

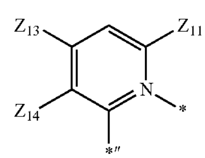

CY1-15

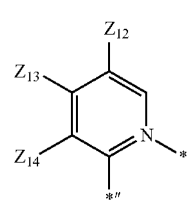

-continued
CY1-16
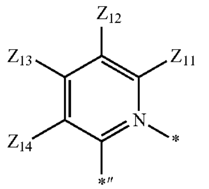
CY1-17
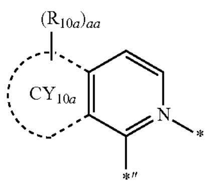
CY1-18
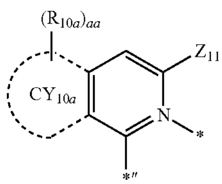
CY1-19
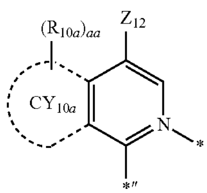
CY1-20
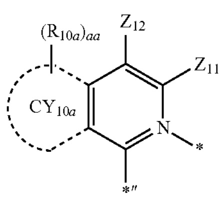
CY1-21
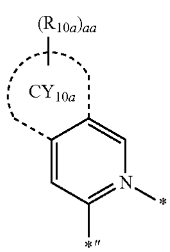
CY1-22
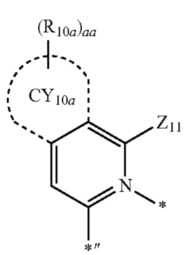
-continued
CY1-23
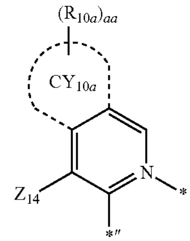
CY1-24
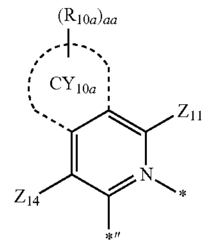
CY1-25
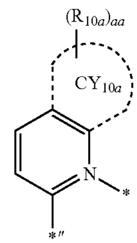
CY1-26
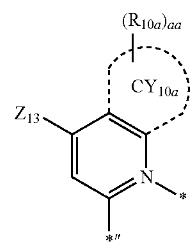
CY1-27
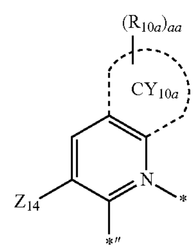
CY1-28
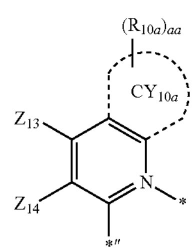
In Formulae CY1-1 to CY1-28,
$Z_{11}$ to $Z_{14}$ may each be the same as defined in connection with $Z_1$, provided that each of $Z_{11}$ to $Z_{14}$ are not hydrogen,
ring $CY_{10a}$ may be a $C_5$-$C_{30}$ carbocyclic group or a $C_1$-$C_{30}$ heterocyclic group,
$R_{10a}$ may be the same as described above, aa may be an integer from 0 to 10,

* indicates a binding site to M in Formula 1, and

*" indicates a binding site to one of $T_1$ to $T_4$ in Formula 2A.

In one or more embodiments, the group represented by

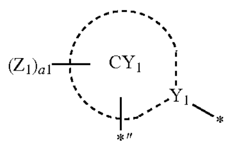

in Formula 2A may be a group represented by one of Formulae CY1-4, CY1-7, CY1-9, CY1-11, CY1-12, and CY1-14 to CY1-24.

In one or more embodiments, the group represented by

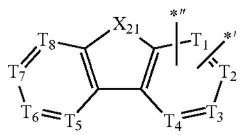

in Formula 2A may be a group represented by one of Formulae CY2-1 to CY2-6:

CY2-1

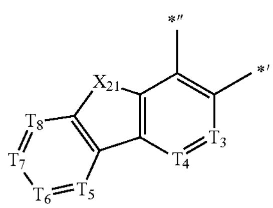

CY2-2

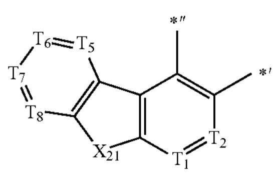

CY2-3

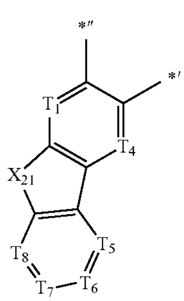

-continued

CY2-4

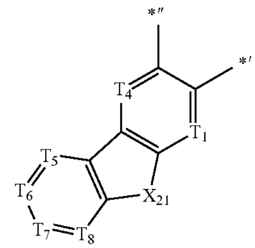

CY2-5

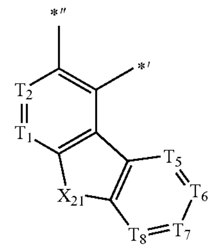

CY2-6

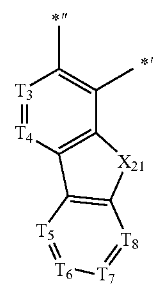

In Formulae CY2-1 to CY2-6, $T_1$ to $T_8$ may each independently be C or N, $X_{21}$ may be the same as described above,

*" indicates a binding site to ring $CY_1$ in Formula 2A, and

*' indicates a binding site to M in Formula 1.

For example, a) $X_1$ in Formula 2B may be Ge, and each of $T_1$ to $T_8$ in Formulae CY2-1 to CY2-6 may be C, (and/or)

b) $X_1$ in Formula 2B may be Si or Ge, and at least one of $T_3$ to $T_8$ (for example, one or two of $T_3$ to $T_8$) in Formulae CY2-1 and CY2-6 may be N, (and/or)

c) $X_1$ in Formula 2B may be Si or Ge, and at least one of $T_1$, $T_2$, and $T_5$ to $T_8$ (for example, one or two of $T_1$, $T_2$, and $T_5$ to $T_8$) in Formulae CY2-2 and CY2-5 may be N, (and/or)

d) $X_1$ in Formula 2B may be Si or Ge, and at least one of $T_1$ and $T_4$ to $T_8$ (for example, one or two $T_1$ and $T_4$ to $T_8$) in Formulae CY2-3 and CY2-4 may be N.

In one or more embodiments,

1) $T_1$ to $T_8$ in Formulae CY2-1 to CY2-6 may be C;

2) one of $T_3$ to $T_8$ in Formula CY2-1 may be N, and the remaining $T_3$ to $T_8$ that are not N in Formula CY2-1 may be C;

3) $T_3$ and $T_8$ in Formula CY2-1 may be N, and $T_4$ to $T_7$ in Formula CY2-1 may be C; 4) $T_6$ and $T_8$ in Formula CY2-1 may be N, and $T_3$ to $T_5$ and $T_7$ in Formula CY2-1 may be C;

5) one of $T_1$, $T_2$ and $T_8$ in Formula CY2-2 may be N, and the remaining $T_1$, $T_2$ and $T_5$ to $T_8$ that are not N in Formula CY2-2 may be C;

6) $T_1$ and $T_8$ in Formula CY2-2 may be N, and $T_2$ and $T_5$ to $T_7$ in Formula CY2-2 may be C;

7) $T_2$ and $T_8$ in Formula CY2-2 may be N, and $T_1$ and $T_5$ to $T_7$ in Formula CY2-2 may be C;

8) one of $T_1$, $T_4$ and $T_8$ in Formulae CY2-3 and CY2-4 may be N, and the remaining $T_1$, $T_4$ and $T_5$ to $T_8$ that are not N in Formulae CY2-3 and CY2-4 may be C;

9) $T_1$ and $T_8$ in Formulae CY2-3 and CY2-4 may be N, and $T_4$ and $T_5$ to $T_7$ in Formulae CY2-3 and CY2-4 may be C;

10) $T_4$ and $T_8$ in Formulae CY2-3 and CY2-4 may be N, and $T_1$ and $T_5$ to $T_7$ in Formulae CY2-3 and CY2-4 may be C;

11) one of $T_1$ and $T_8$ in Formula CY2-5 may be N, and the remaining $T_1$, $T_2$ and $T_5$ to $T_8$ that are not N in Formula CY2-5 may be C;

12) $T_1$ and $T_8$ in Formula CY2-5 may be N, and $T_2$ and $T_5$ to $T_7$ in Formula CY2-5 may be C;

13) one of $T_4$ and $T_8$ in Formula CY2-6 may be N, and the remaining $T_3$ to $T_8$ that are not N in Formula CY2-6 may be C; or 14) $T_4$ and $T_8$ in Formula CY2-6 may be N, and $T_3$ and $T_5$ to $T_7$ in Formula CY2-6 may be C.

In one or more embodiments, a group represented by

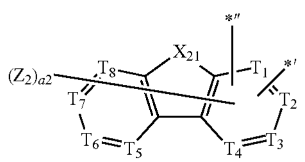

in Formula 2A may be a group represented by one of Formulae CY2-1001 to CY2-1141, CY2-2001 to CY2-2092, CY2-3001 to CY2-3092, CY2-4001 to CY2-4092, CY2-5001 to CY2-5065 and CY2-6001 to CY2-6065:

CY2-1001

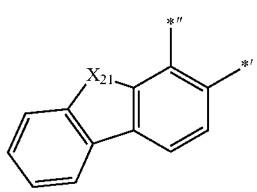

CY2-1002

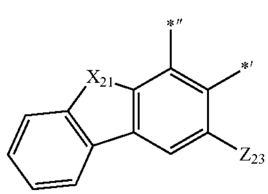

CY2-1003

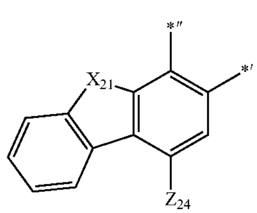

-continued

CY2-1004

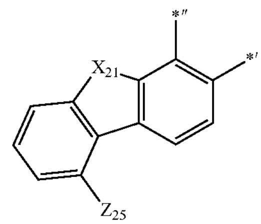

CY2-1005

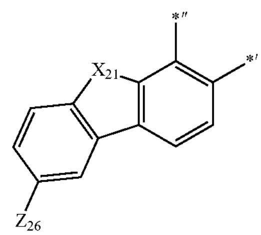

CY2-1006

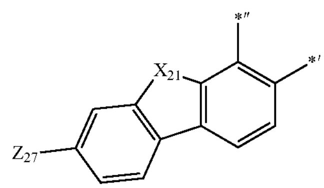

CY2-1007

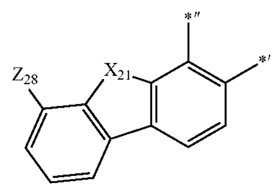

CY2-1008

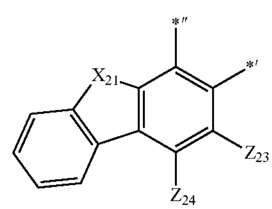

CY2-1009

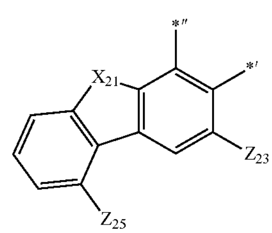

CY2-1010

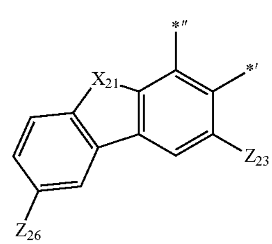

-continued
CY2-1011
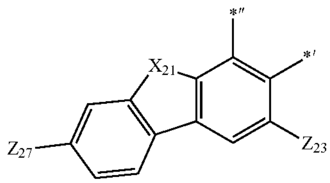
CY2-1012
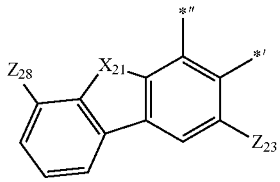
CY2-1013
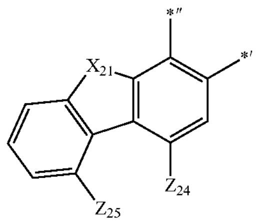
CY2-1014
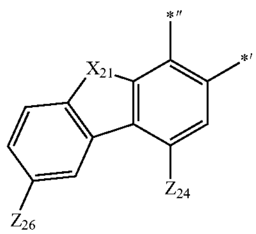
CY2-1015
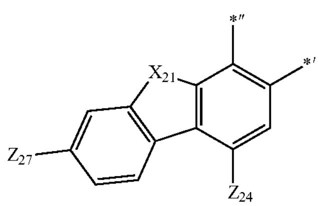
CY2-1016
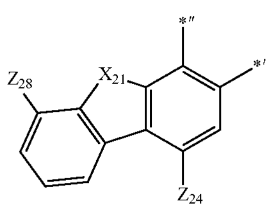
CY2-1017
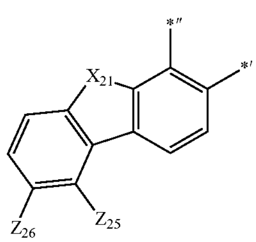
-continued
CY2-1018
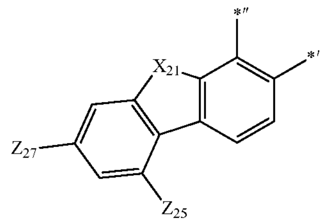
CY2-1019
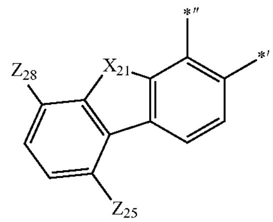
CY2-1020
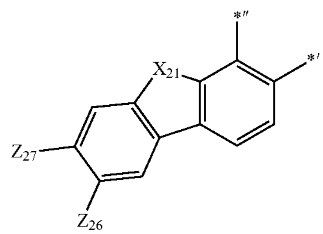
CY2-1021
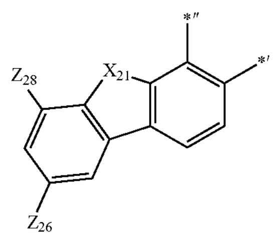
CY2-1022
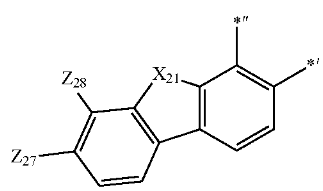
CY2-1023
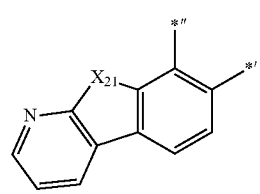
CY2-1024
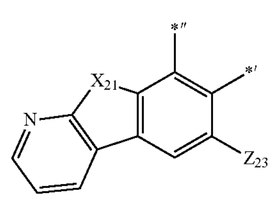

-continued
CY2-1025
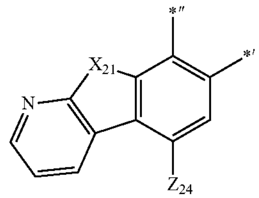
CY2-1026
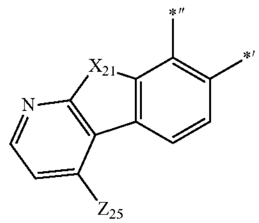
CY2-1027
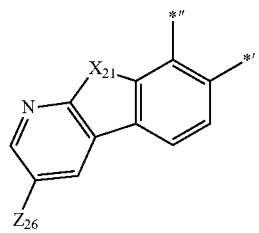
CY2-1028
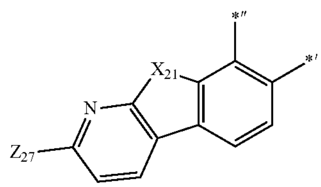
CY2-1029
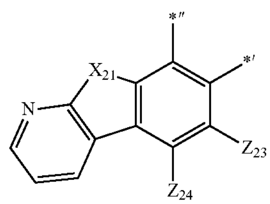
CY2-1030
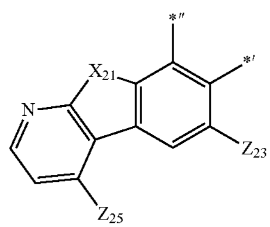
CY2-1031
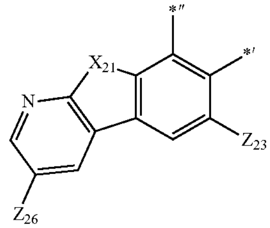
-continued
CY2-1032
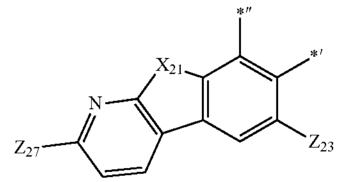
CY2-1033
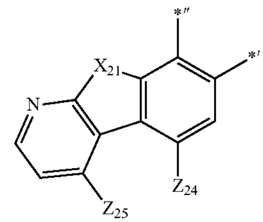
CY2-1034
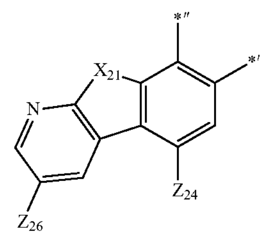
CY2-1035
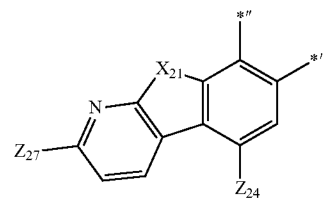
CY2-1036
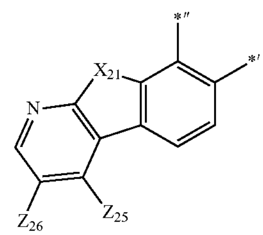
CY2-1037
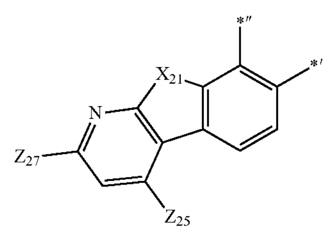
CY2-1038
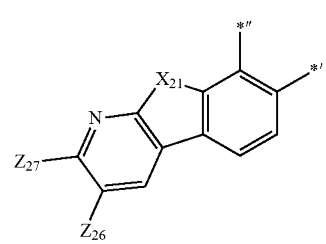

-continued
CY2-1039
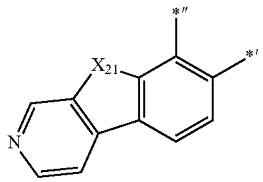
CY2-1040
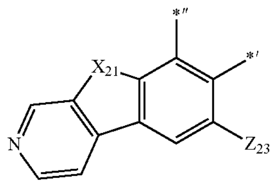
CY2-1041
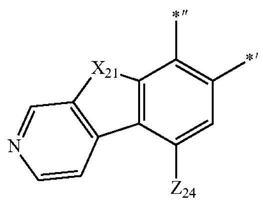
CY2-1042
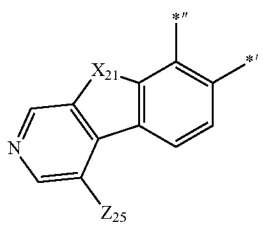
CY2-1043
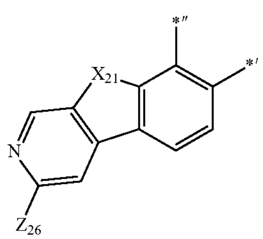
CY2-1044
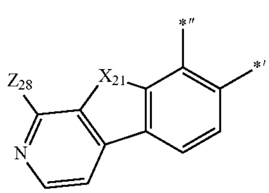
CY2-1045
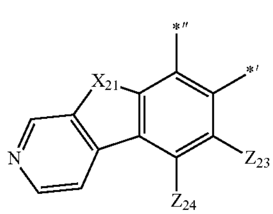
-continued
CY2-1046
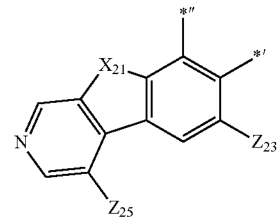
CY2-1047
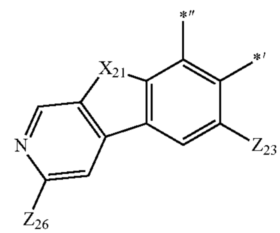
CY2-1048
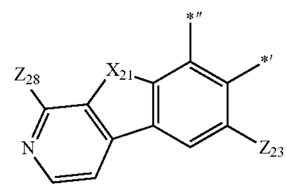
CY2-1049
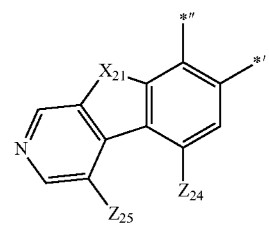
CY2-1050
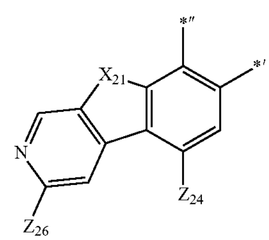
CY2-1051
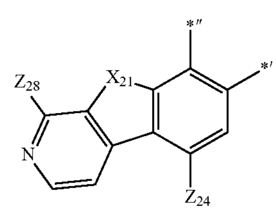
CY2-1052
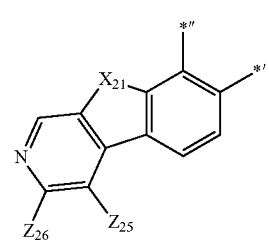

CY2-1053
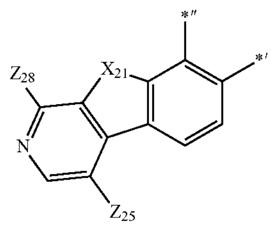
CY2-1054
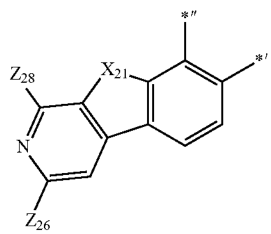
CY2-1055
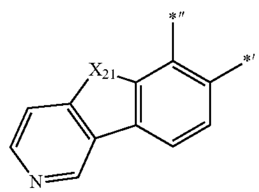
CY2-1056
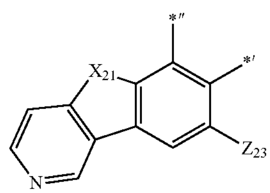
CY2-1057
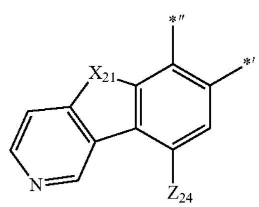
CY2-1058
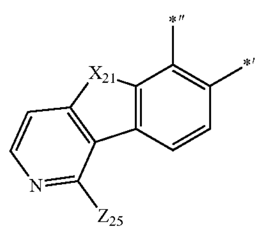
CY2-1059
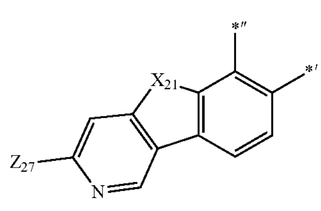
CY2-1060
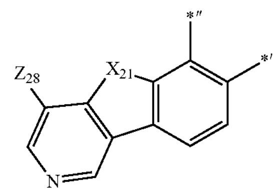
CY2-1061
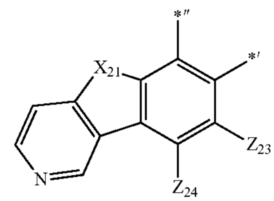
CY2-1062
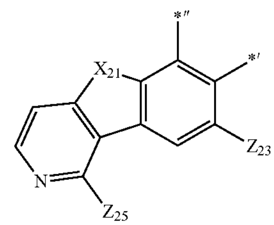
CY2-1063
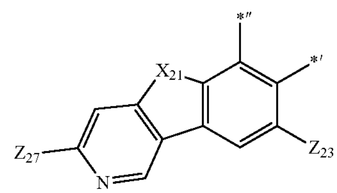
CY2-1064
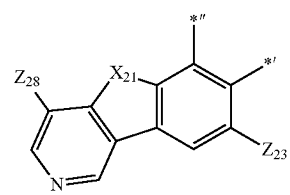
CY2-1065
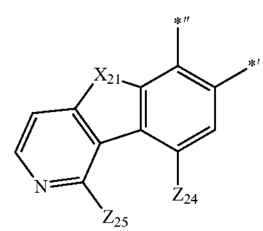
CY2-1066
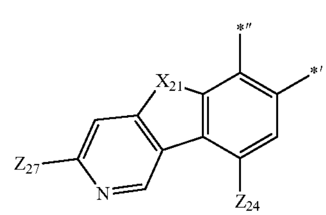

-continued
CY2-1067
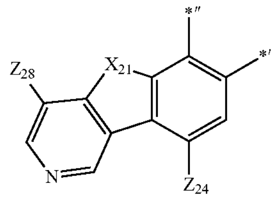
CY2-1068
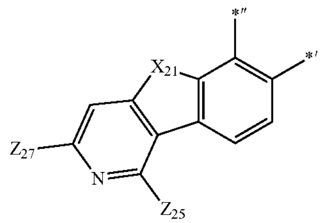
CY2-1069
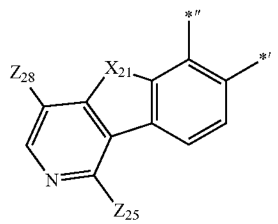
CY2-1070
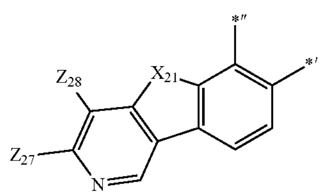
CY2-1071
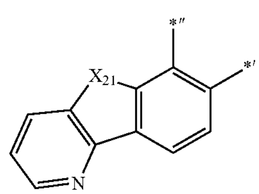
CY2-1072
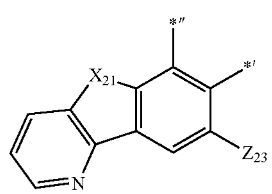
CY2-1073
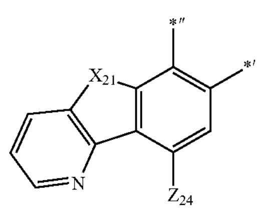
-continued
CY2-1074
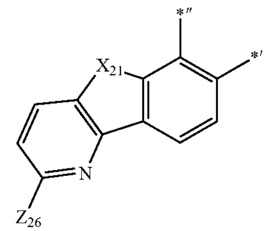
CY2-1075
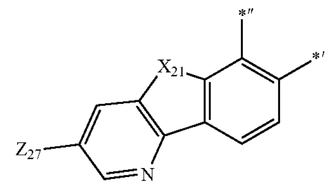
CY2-1076
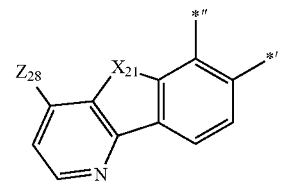
CY2-1077
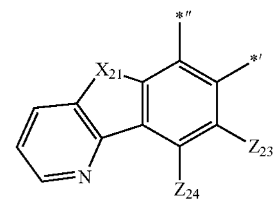
CY2-1078
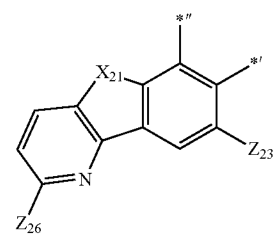
CY2-1079
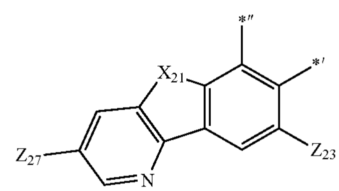
CY2-1080
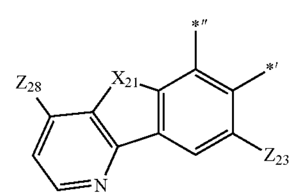

CY2-1081
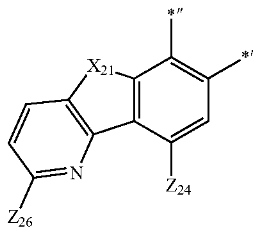
CY2-1082
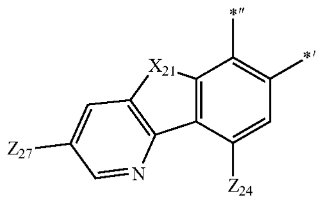
CY2-1083
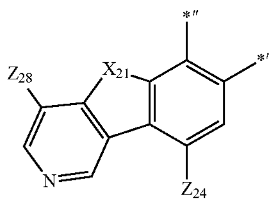
CY2-1084
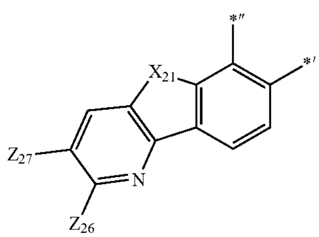
CY2-1085
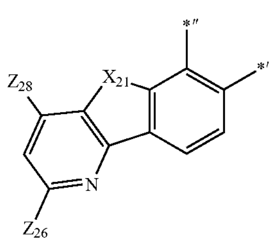
CY2-1086
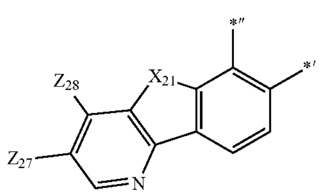
CY2-1087
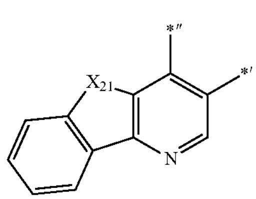
CY2-1088
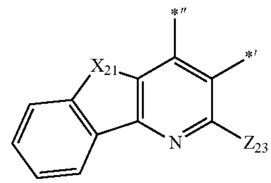
CY2-1089
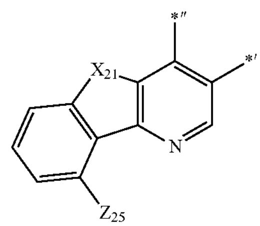
CY2-1090
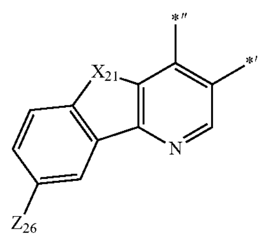
CY2-1091
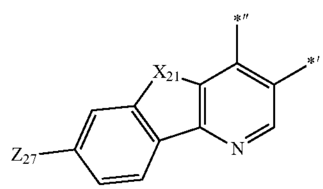
CY2-1092
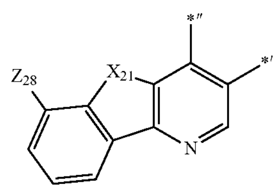
CY2-1093
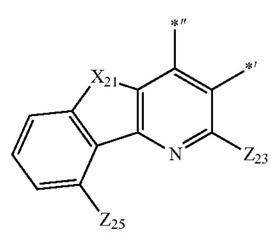
CY2-1094
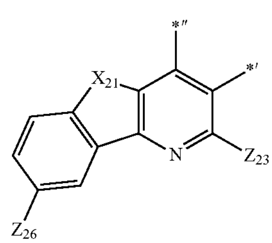

-continued
CY2-1095
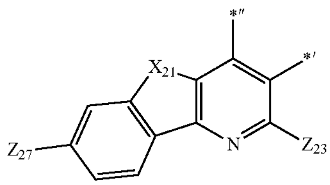
CY2-1096
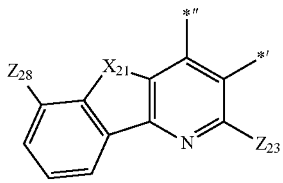
CY2-1097
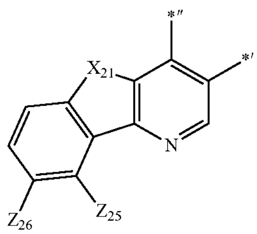
CY2-1098
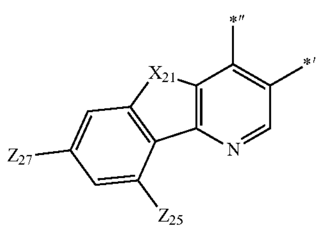
CY2-1099
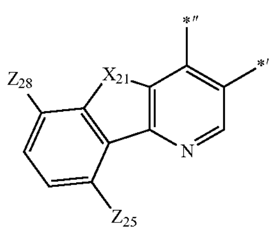
CY2-1100
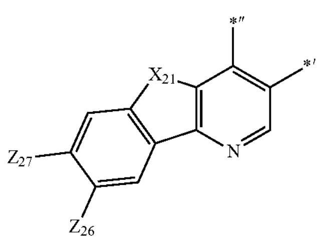
CY2-1101
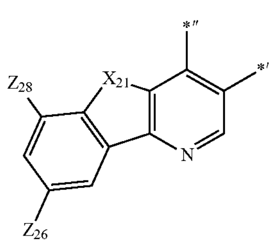
-continued
CY2-1102
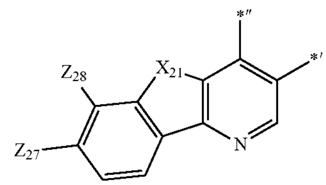
CY2-1103
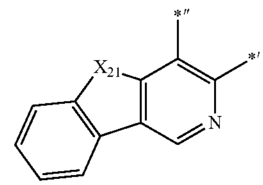
CY2-1104
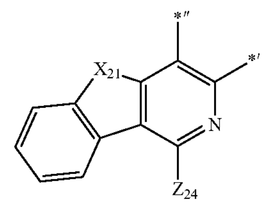
CY2-1105
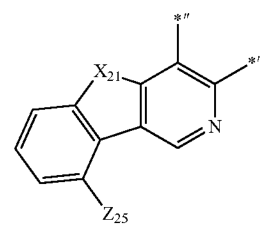
CY2-1106
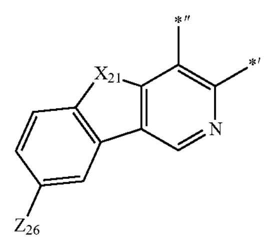
CY2-1107
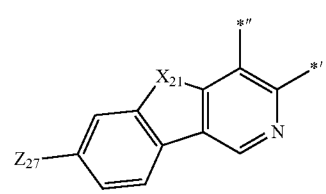
CY2-1108
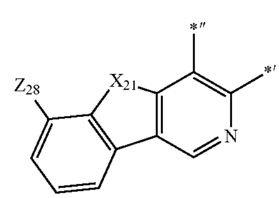

-continued
CY2-1109
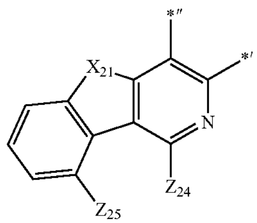
CY2-1110
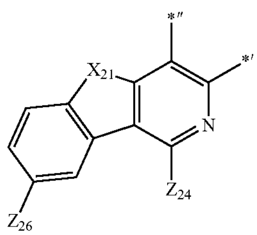
CY2-1111
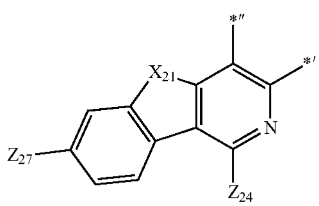
CY2-1112
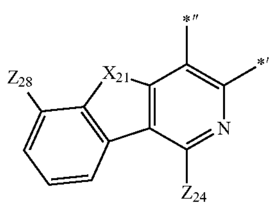
CY2-1113
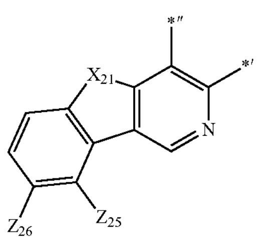
CY2-1114
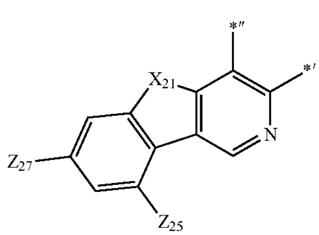
CY2-1115
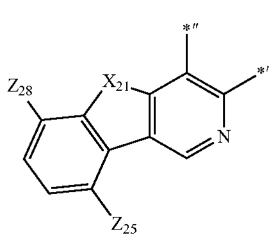
-continued
CY2-1116
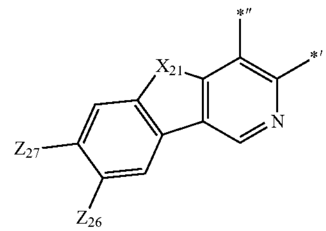
CY2-1117
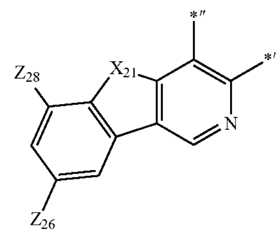
CY2-1118
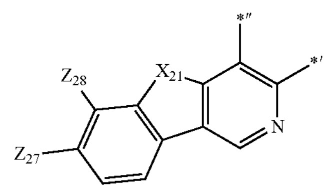
CY2-1119
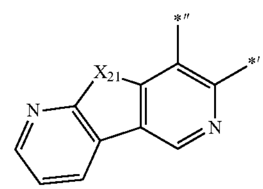
CY2-1120
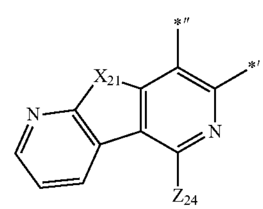
CY2-1121
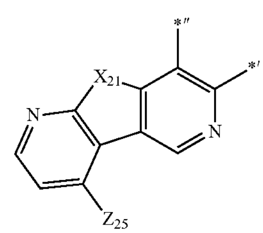
CY2-1122
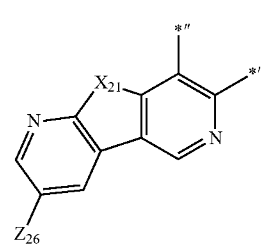

-continued
CY2-1123
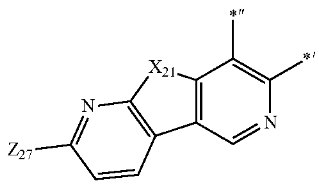
CY2-1124
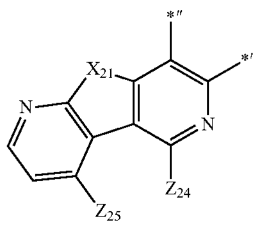
CY2-1125
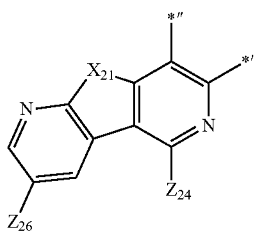
CY2-1126
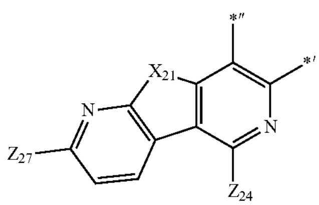
CY2-1127
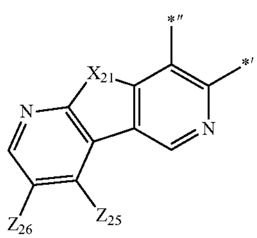
CY2-1128
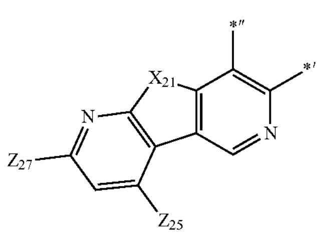
CY2-1129
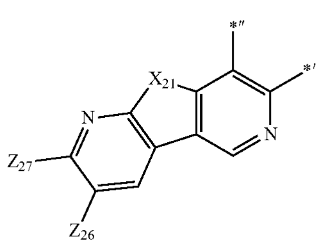
-continued
CY2-1130
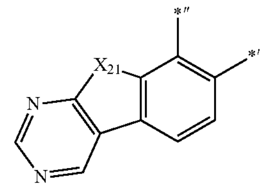
CY2-1131
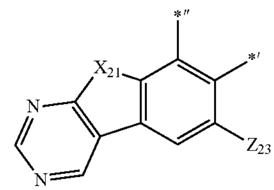
CY2-1132
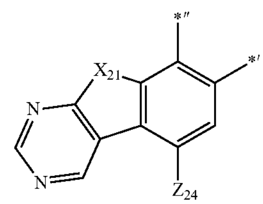
CY2-1133
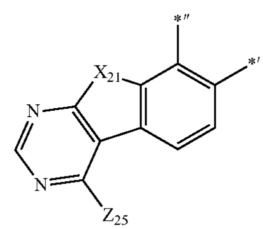
CY2-1134
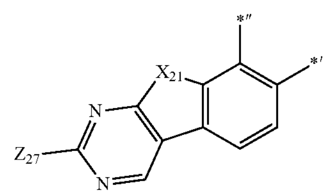
CY2-1135
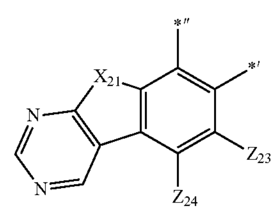
CY2-1136
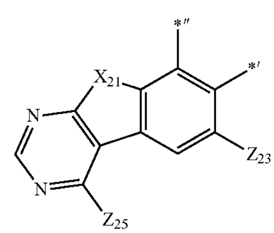

-continued
CY2-1137
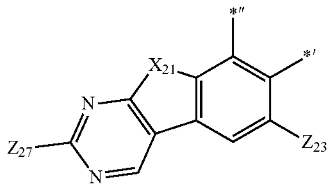
CY2-1138
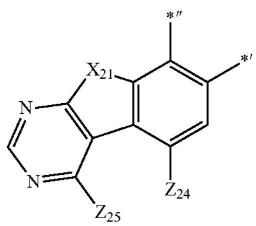
CY2-1139
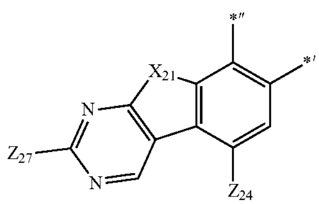
CY2-1140
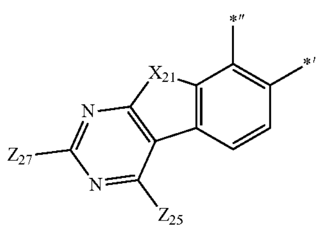
CY2-1141
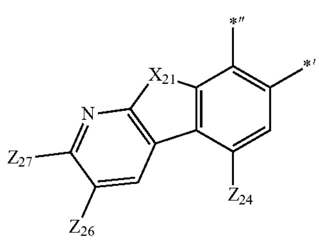
CY2-2001
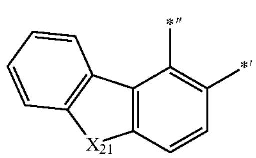
CY2-2002
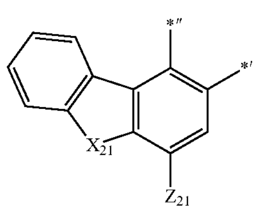
CY2-2003
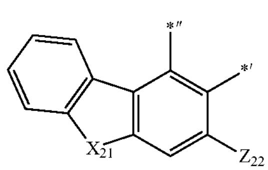
-continued
CY2-2004
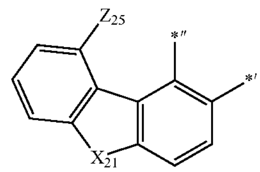
CY2-2005
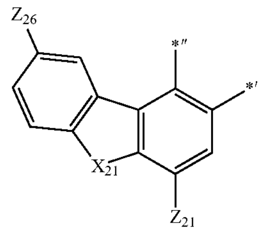
CY2-2006
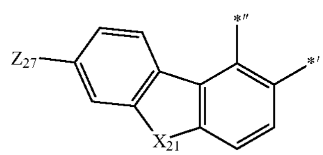
CY2-2007
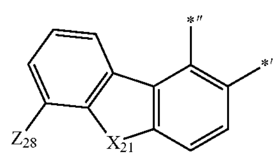
CY2-2008
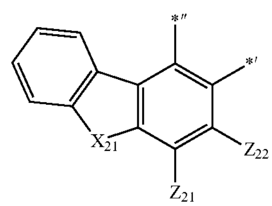
CY2-2009
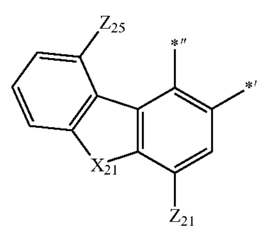
CY2-2010
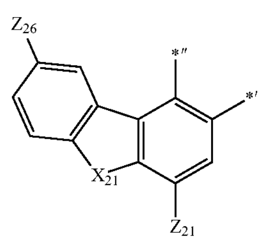
CY2-2011
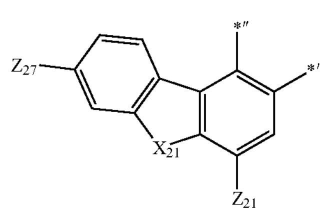

CY2-2012
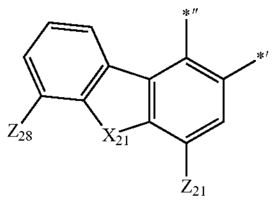
CY2-2013
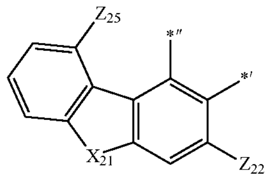
CY2-2014
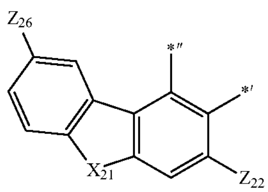
CY2-2015
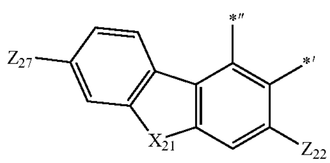
CY2-2016
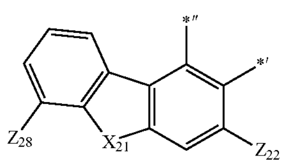
CY2-2017
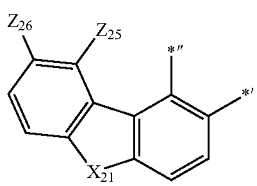
CY2-2018
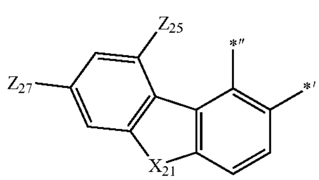
CY2-2019
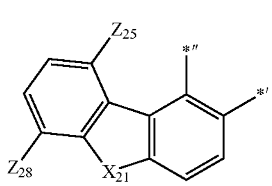
CY2-2020
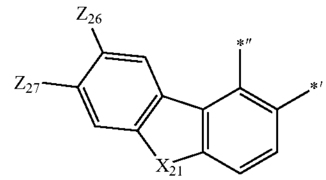
CY2-2021
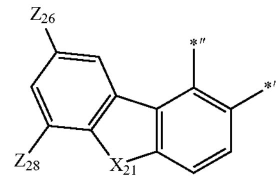
CY2-2022
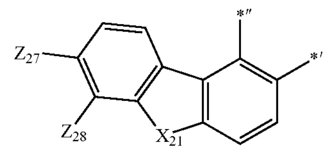
CY2-2023
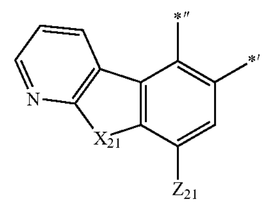
CY2-2024
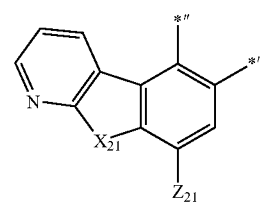
CY2-2025
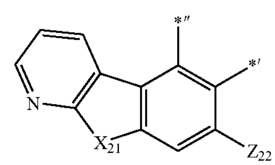
CY2-2026
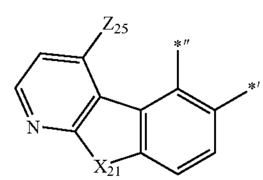
CY2-2027
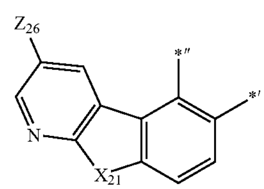
CY2-2028
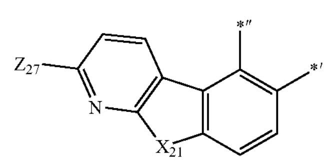

-continued
CY2-2029
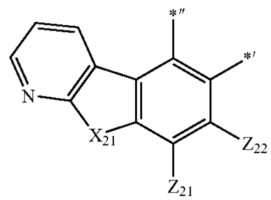
CY2-2030
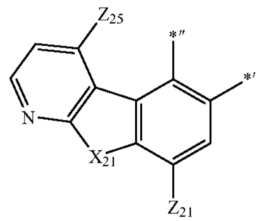
CY2-2031
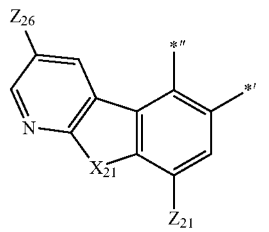
CY2-2032
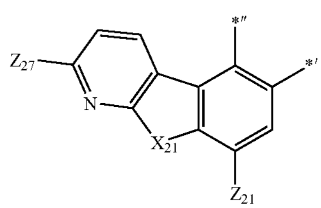
CY2-2033
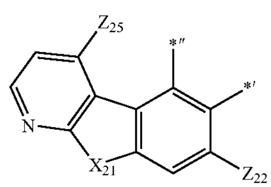
CY2-2034
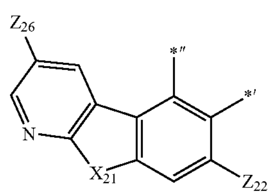
CY2-2035
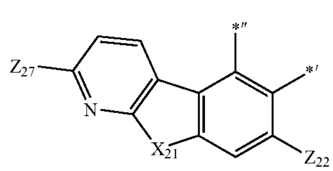
CY2-2036
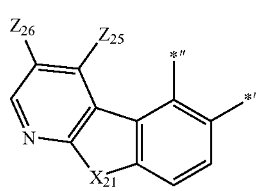
-continued
CY2-2037
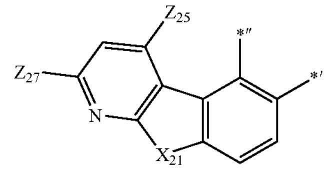
CY2-2038
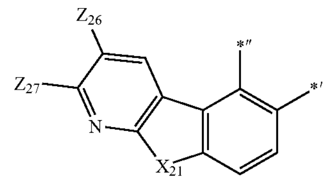
CY2-2039
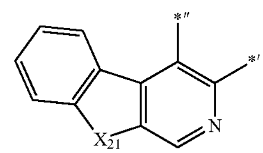
CY2-2040
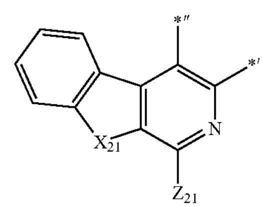
CY2-2041
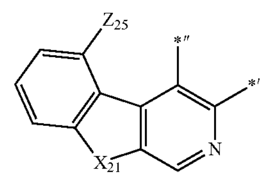
CY2-2042
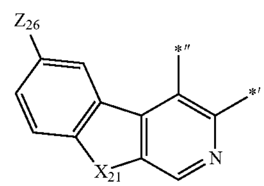
CY2-2043
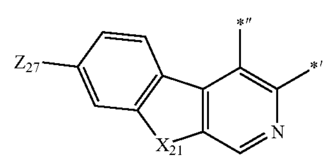
CY2-2044
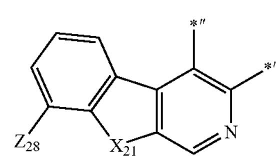

-continued
CY2-2045
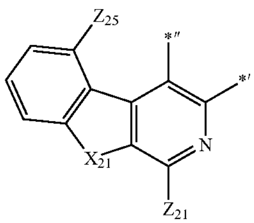
CY2-2046
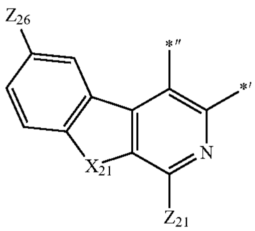
CY2-2047
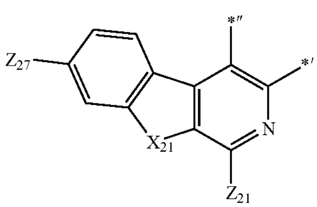
CY2-2048
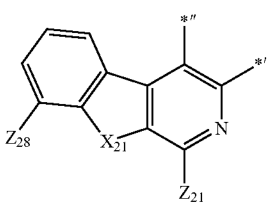
CY2-2049
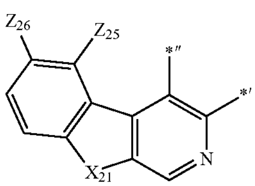
CY2-2050
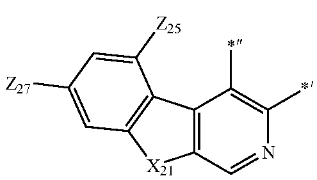
CY2-2051
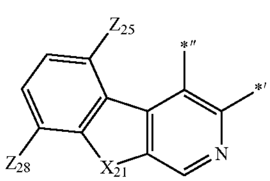
CY2-2052
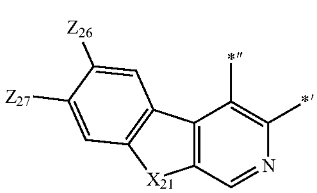
-continued
CY2-2053
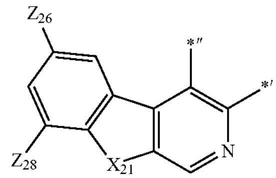
CY2-2054
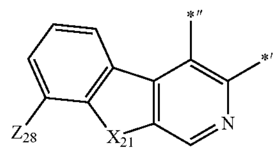
CY2-2055
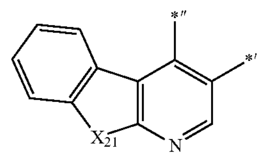
CY2-2056
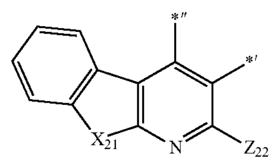
CY2-2057
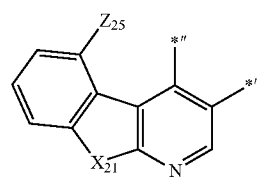
CY2-2058
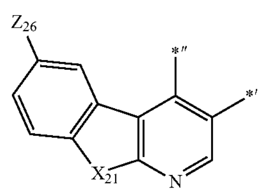
CY2-2059
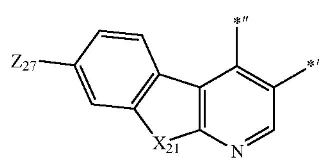
CY2-2060
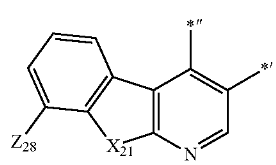
CY2-2061
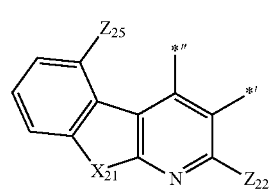

-continued
CY2-2062
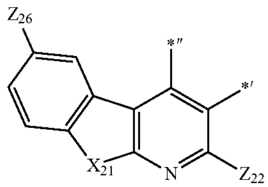
CY2-2063
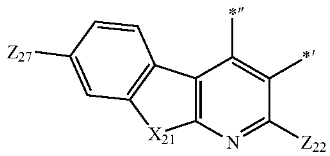
CY2-2064
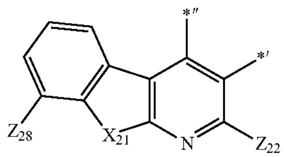
CY2-2065
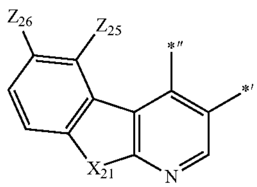
CY2-2066
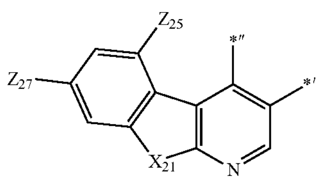
CY2-2067
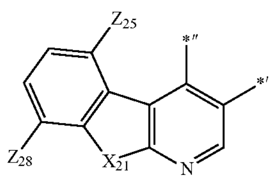
CY2-2068
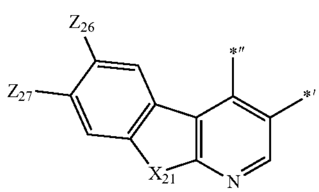
CY2-2069
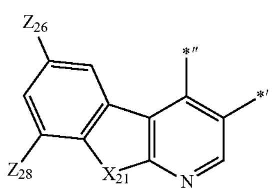
CY2-2070
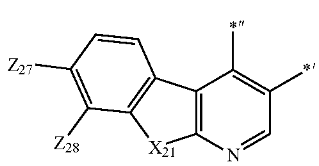
-continued
CY2-2071
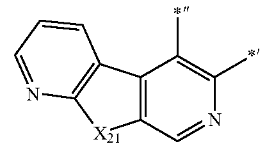
CY2-2072
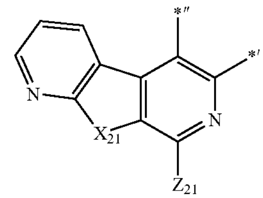
CY2-2073
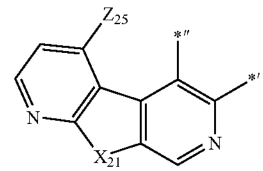
CY2-2074
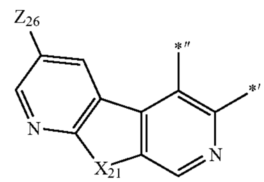
CY2-2075
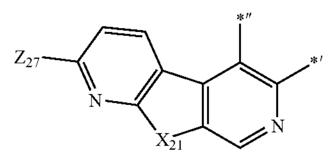
CY2-2076
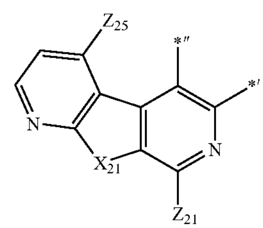
CY2-2077
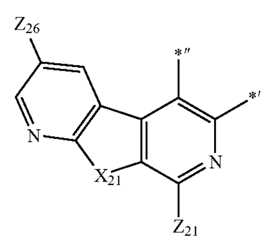
CY2-2078
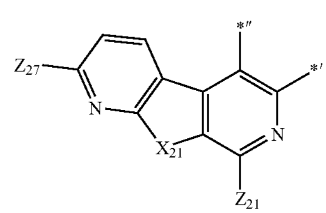

CY2-2079
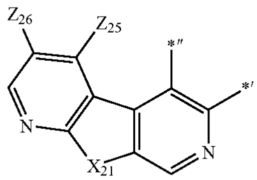
CY2-2080
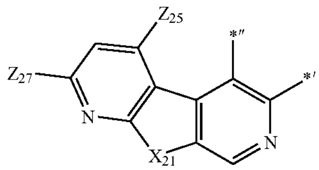
CY2-2081
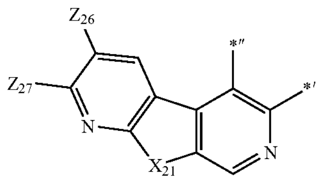
CY2-2082
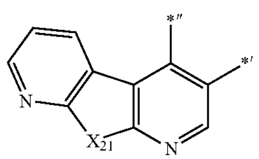
CY2-2083
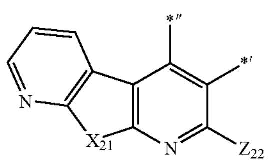
CY2-2084
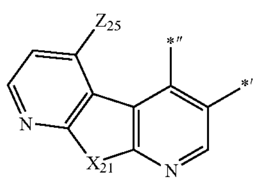
CY2-2085
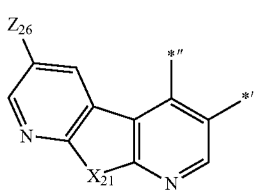
CY2-2086
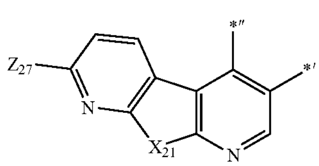
CY2-2087
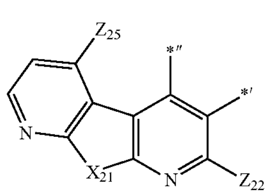
CY2-2088
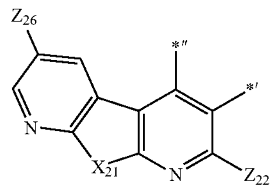
CY2-2089
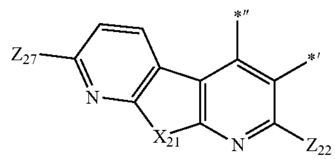
CY2-2090
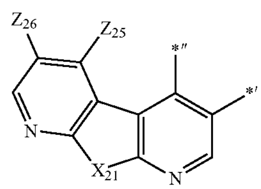
CY2-2091
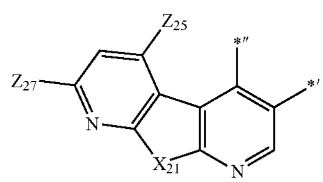
CY2-2092
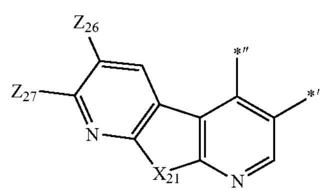
CY2-3001
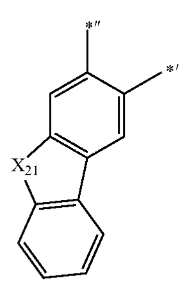
CY2-3002
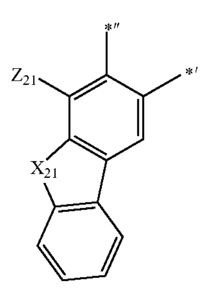

-continued
CY2-3003
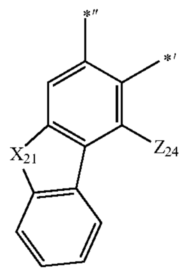
CY2-3004
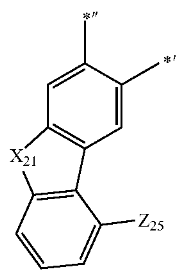
CY2-3005
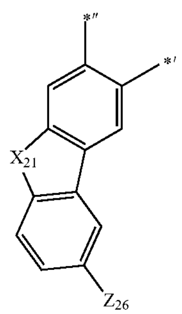
CY2-3006
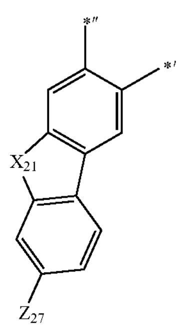
CY2-3007
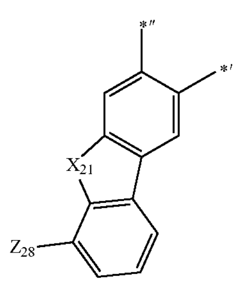
-continued
CY2-3008
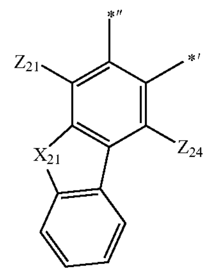
CY2-3009
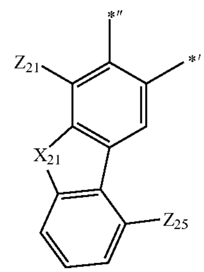
CY2-3010
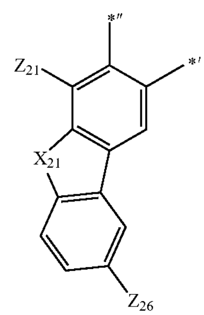
CY2-3011
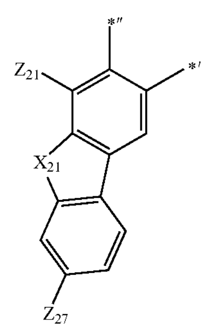
CY2-3012
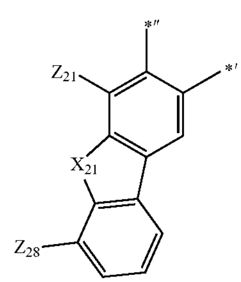

-continued
CY2-3013
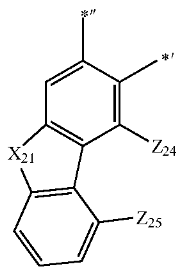
CY2-3014
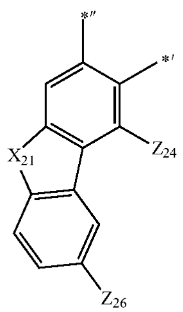
CY2-3015
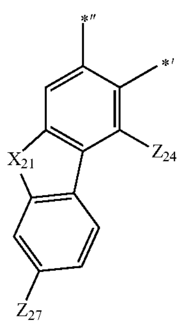
CY2-3016
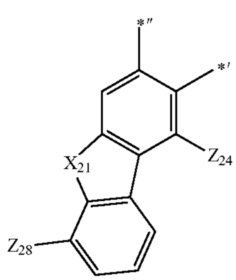
CY2-3017
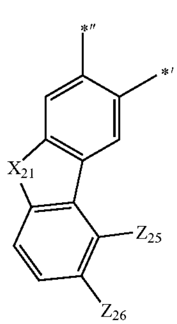
-continued
CY2-3018
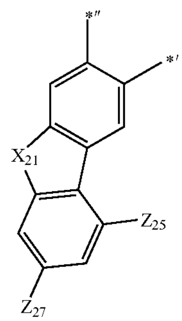
CY2-3019
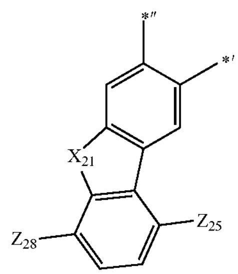
CY2-3020
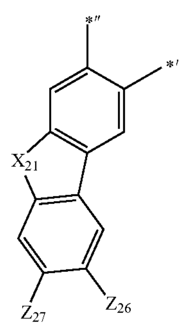
CY2-3021
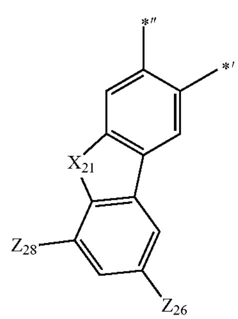
CY2-3022
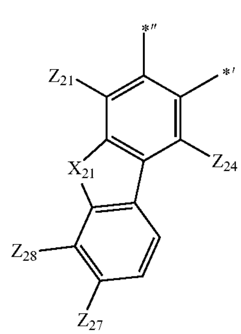

-continued
CY2-3023
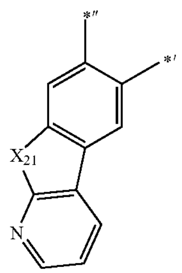
CY2-3024
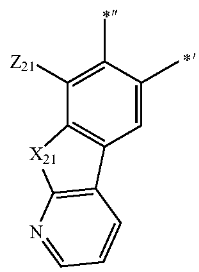
CY2-3025
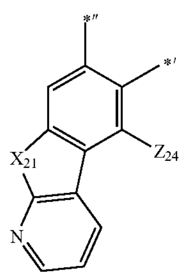
CY2-3026
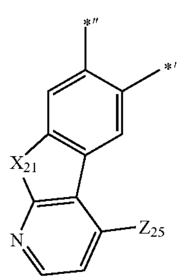
CY2-3027
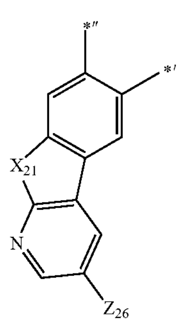
-continued
CY2-3028
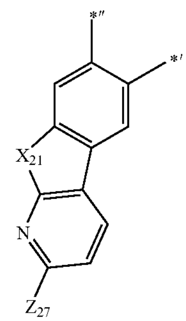
CY2-3029
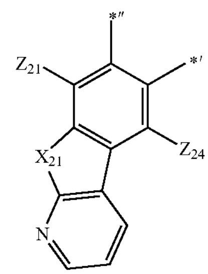
CY2-3030
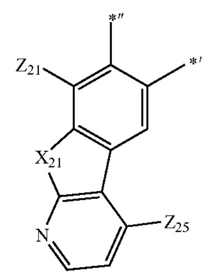
CY2-3031
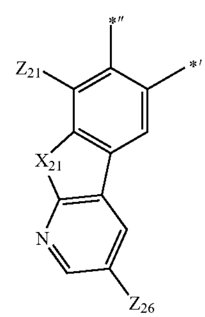
CY2-3032
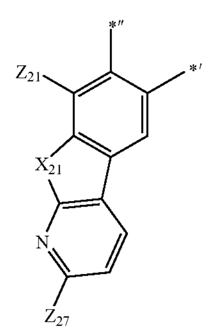

-continued
CY2-3033
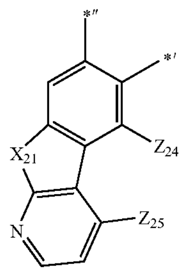
CY2-3034
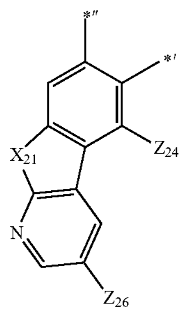
CY2-3035
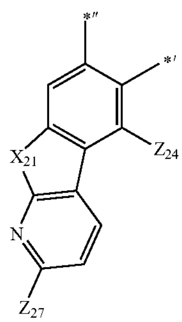
CY2-3036
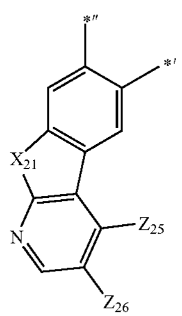
CY2-3037
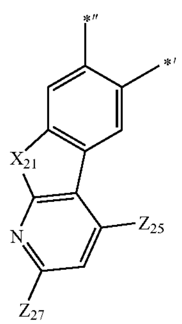
-continued
CY2-3038
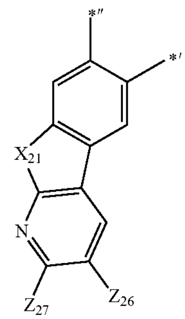
CY2-3039
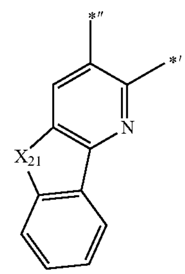
CY2-3040
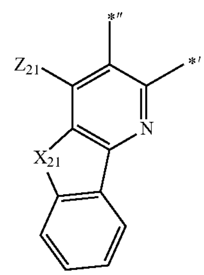
CY2-3041
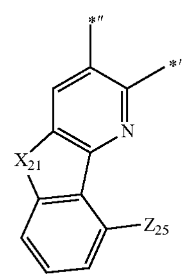
CY2-3042
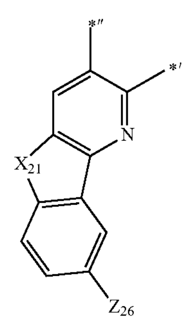

-continued
CY2-3043
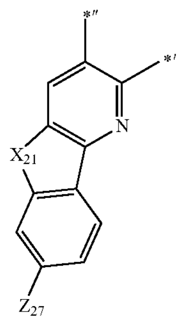
CY2-3044
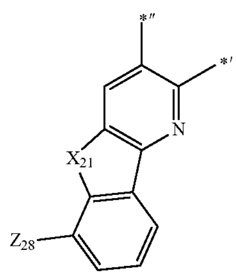
CY2-3045
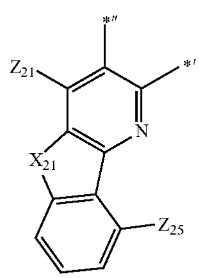
CY2-3046
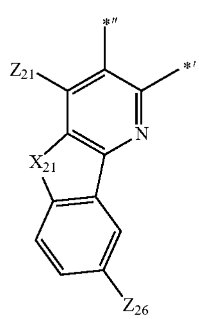
CY2-3047
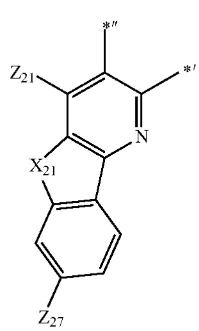
-continued
CY2-3048
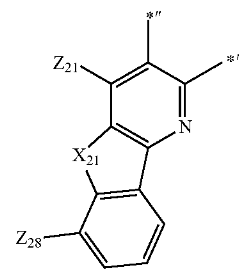
CY2-3049
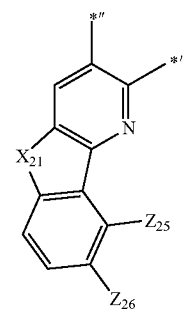
CY2-3050
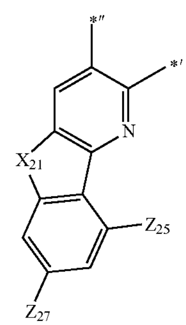
CY2-3051
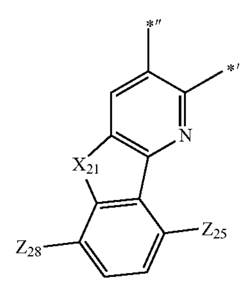
CY2-3052
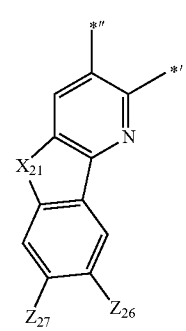

-continued
CY2-3053
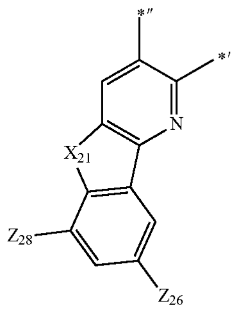
CY2-3054
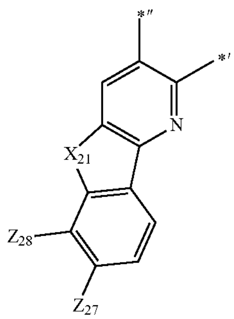
CY2-3055
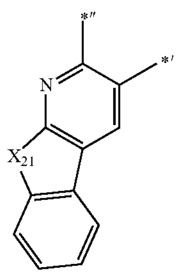
CY2-3056
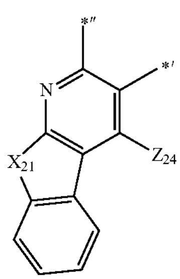
CY2-3057
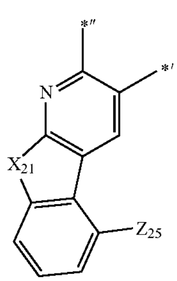
-continued
CY2-3058
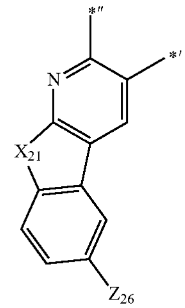
CY2-3059
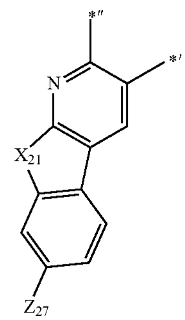
CY2-3060
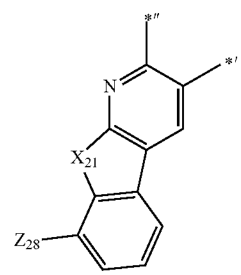
CY2-3061
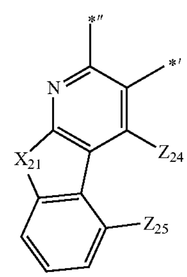
CY2-3062
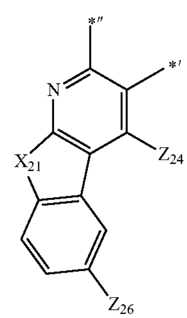

CY2-3063
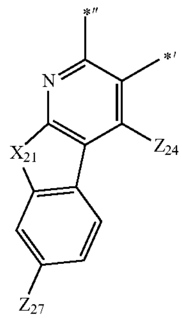
CY2-3064
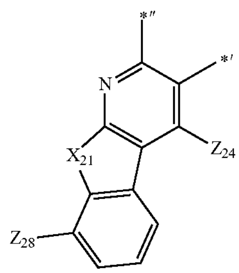
CY2-3065
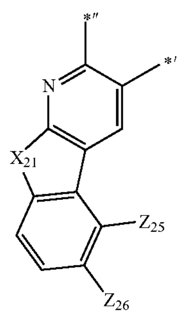
CY2-3066
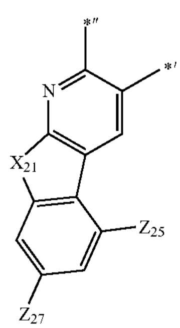
CY2-3067
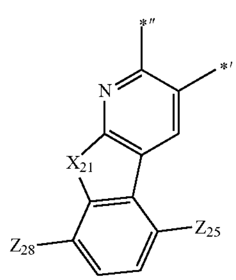
CY2-3068
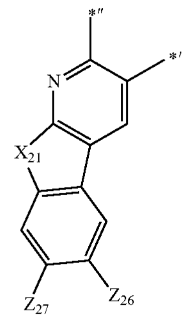
CY2-3069
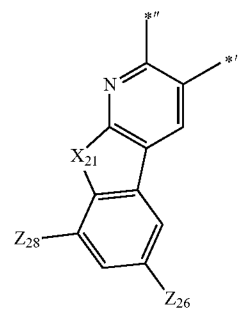
CY2-3070
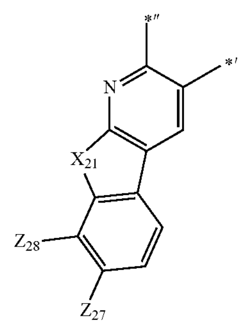
CY2-3071
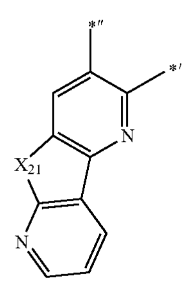
CY2-3072
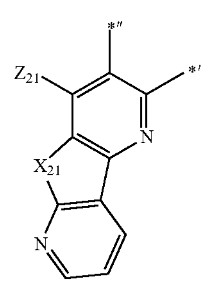

-continued
CY2-3073
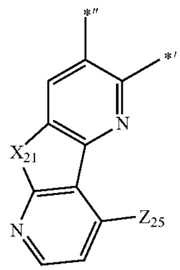
CY2-3074
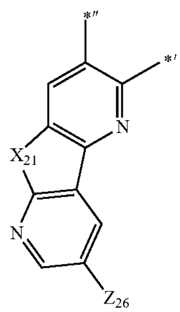
CY2-3075
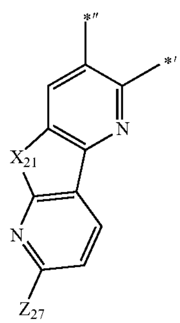
CY2-3076
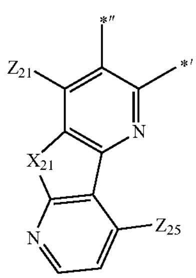
CY2-3077
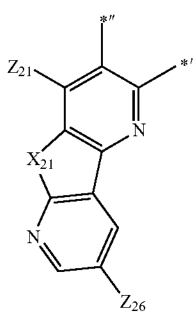
-continued
CY2-3078
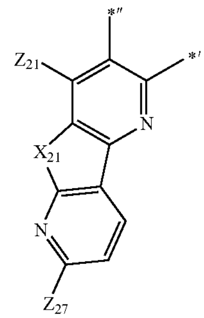
CY2-3079
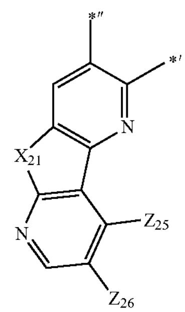
CY2-3080
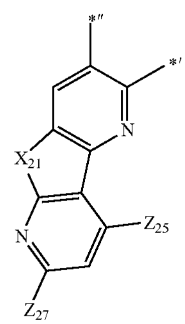
CY2-3081
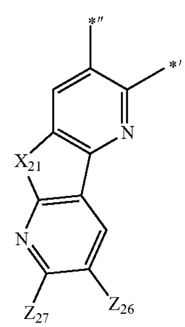
CY2-3082
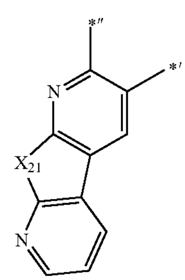

-continued
CY2-3083
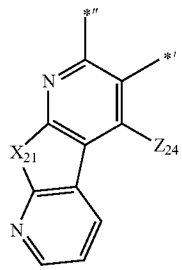
CY2-3084
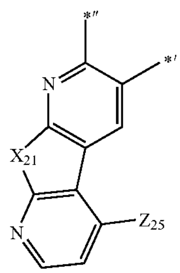
CY2-3085
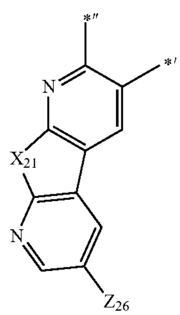
CY2-3086
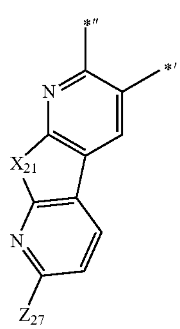
CY2-3087
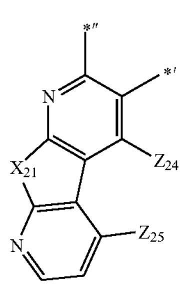
-continued
CY2-3088
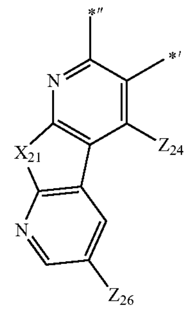
CY2-3089
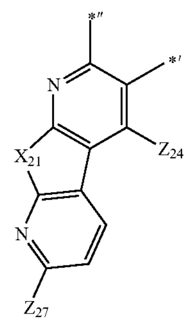
CY2-3090
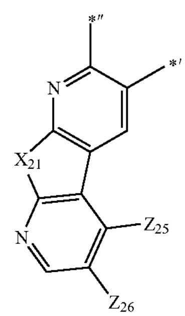
CY2-3091
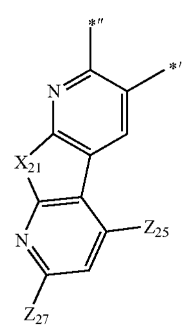
CY2-3092
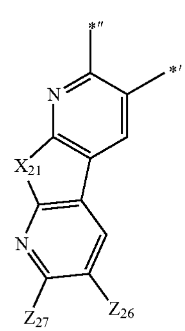

-continued
CY2-4001
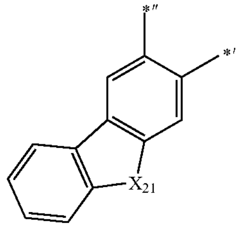
CY2-4002
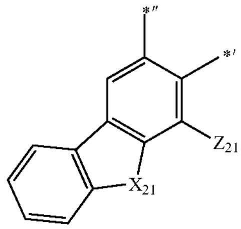
CY2-4003
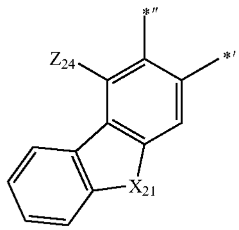
CY2-4004
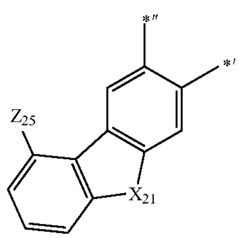
CY2-4005
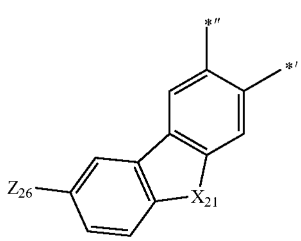
CY2-4006
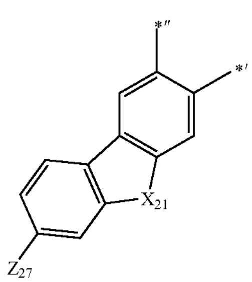
-continued
CY2-4007
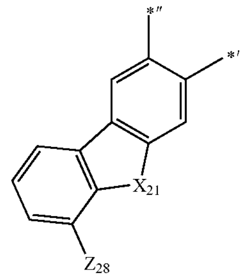
CY2-4008
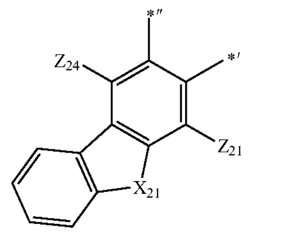
CY2-4009
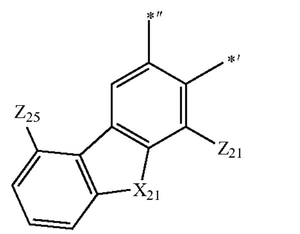
CY2-4010
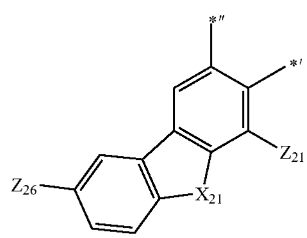
CY2-4011
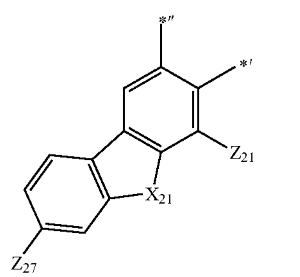
CY2-4012
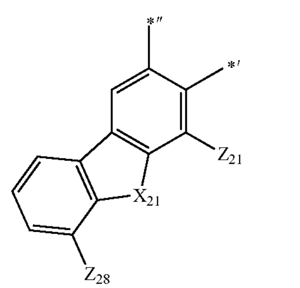

-continued
CY2-4013
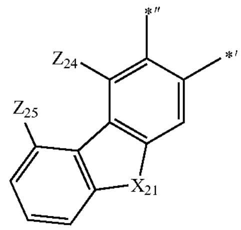
CY2-4014
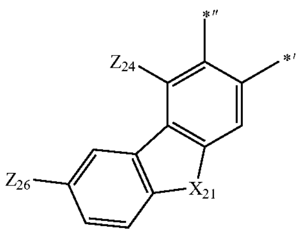
CY2-4015
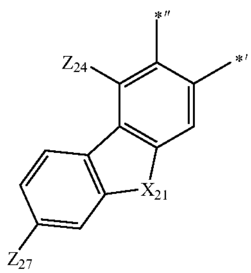
CY2-4016
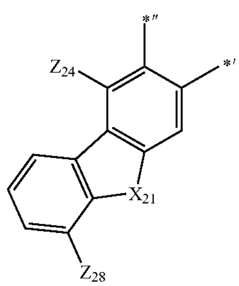
CY2-4017
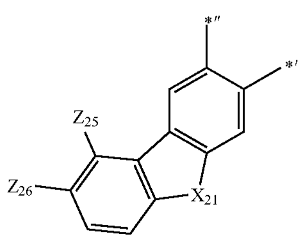
CY2-4018
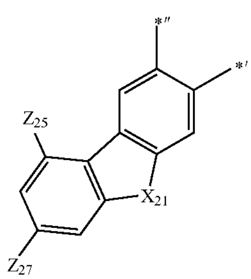
-continued
CY2-4019
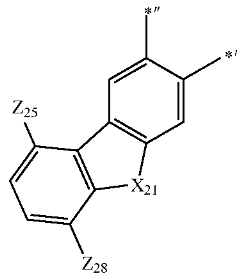
CY2-4020
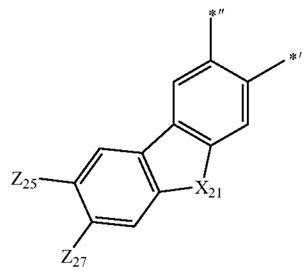
CY2-4021
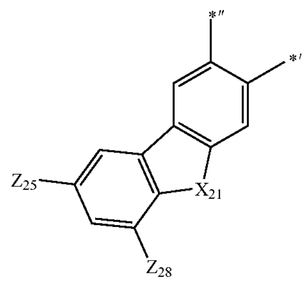
CY2-4022
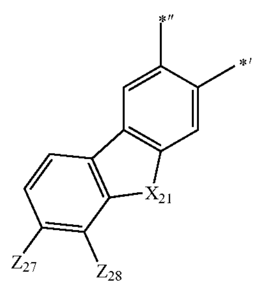
CY2-4023
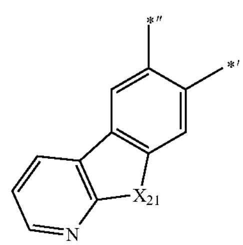
CY2-4024
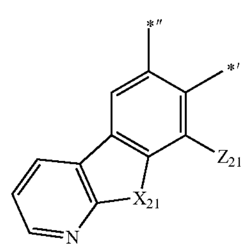

-continued
CY2-4025
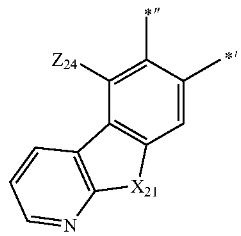
CY2-4026
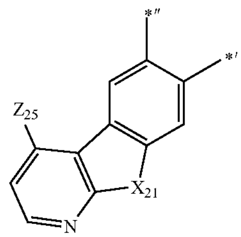
CY2-4027
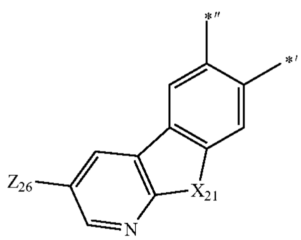
CY2-4028
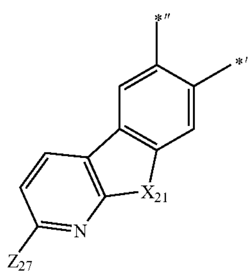
CY2-4029
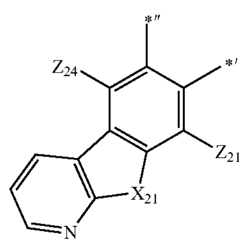
CY2-4030
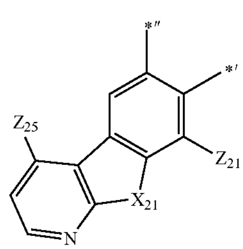
-continued
CY2-4031
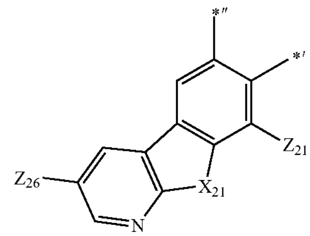
CY2-4032
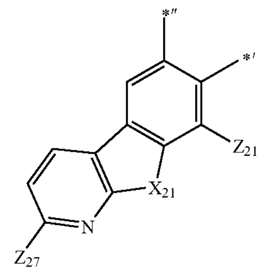
CY2-4033
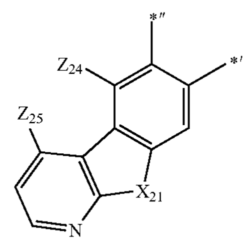
CY2-4034
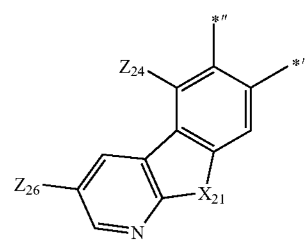
CY2-4035
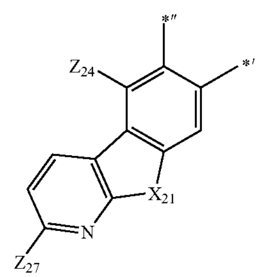
CY2-4036
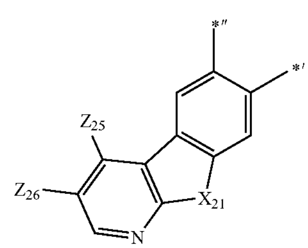

CY2-4037
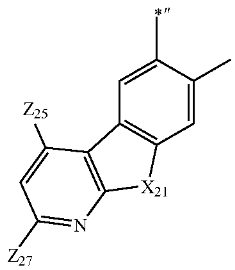
CY2-4038
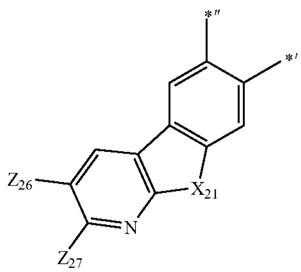
CY2-4039
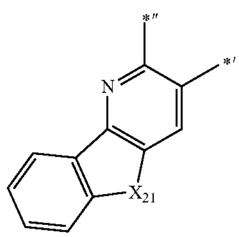
CY2-4040
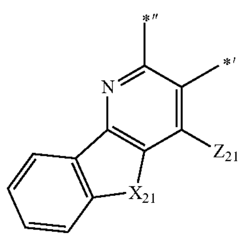
CY2-4041
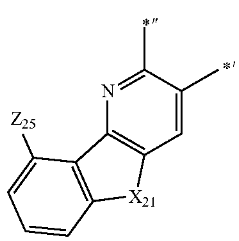
CY2-4042
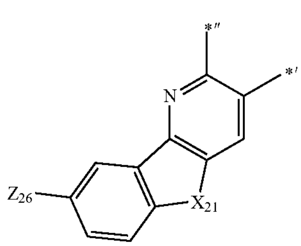
CY2-4043
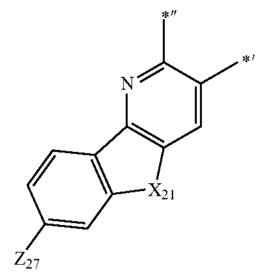
CY2-4044
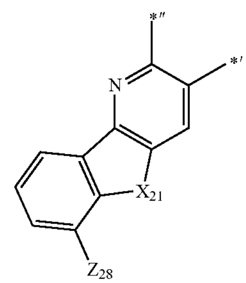
CY2-4045
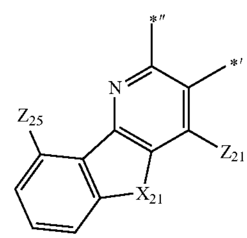
CY2-4046
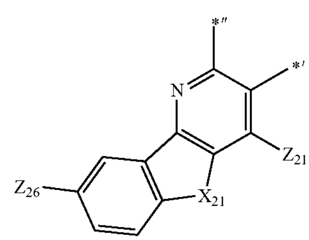
CY2-4047
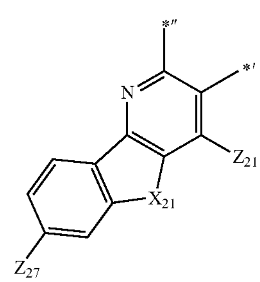
CY2-4048
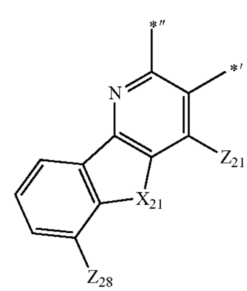

-continued
CY2-4049
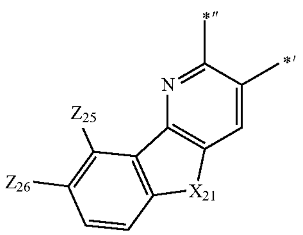
CY2-4050
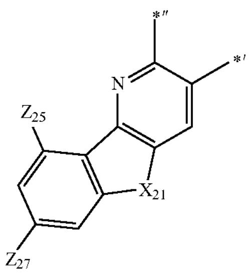
CY2-4051
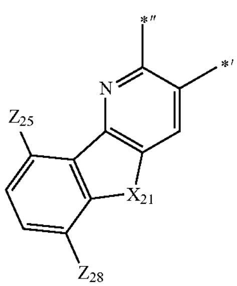
CY2-4052
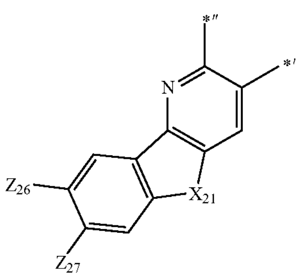
CY2-4053
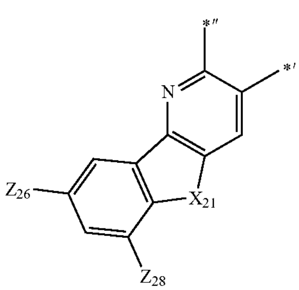
-continued
CY2-4054
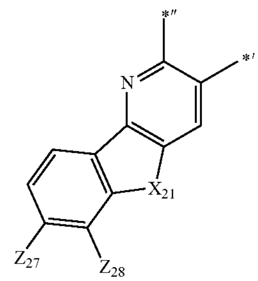
CY2-4055
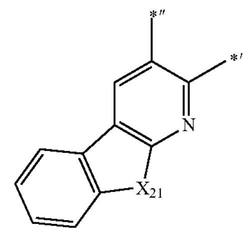
CY2-4056
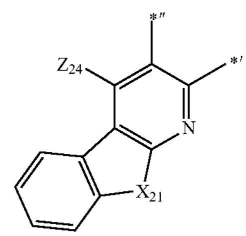
CY2-4057
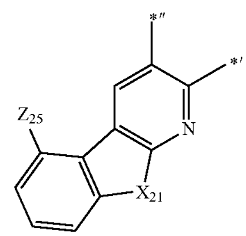
CY2-4058
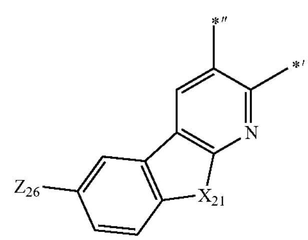
CY2-4059
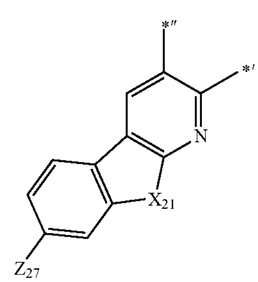

-continued
CY2-4060
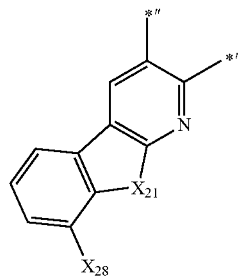
CY2-4061
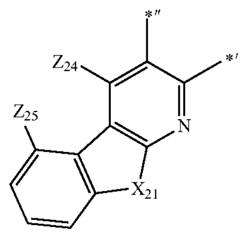
CY2-4062
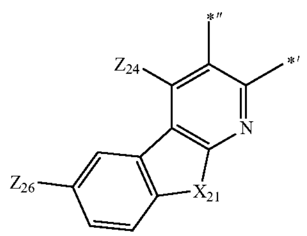
CY2-4063
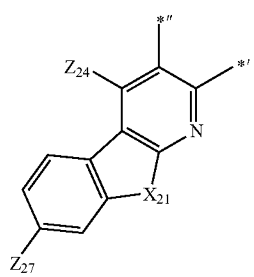
CY2-4064
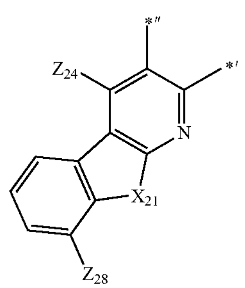
CY2-4065
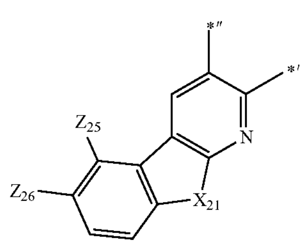
-continued
CY2-4066
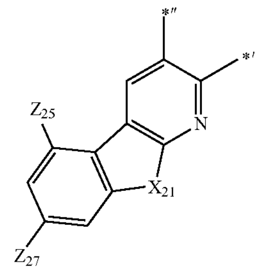
CY2-4067
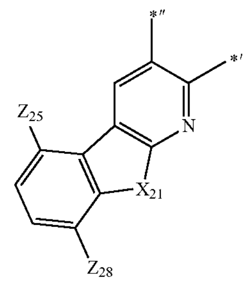
CY2-4068
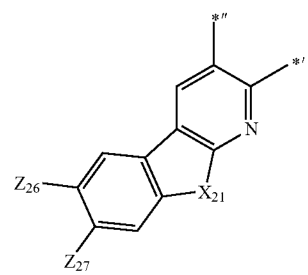
CY2-4069
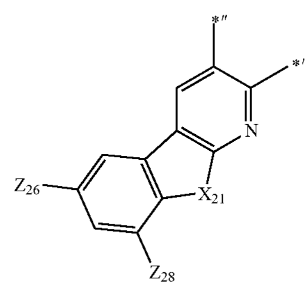
CY2-4070
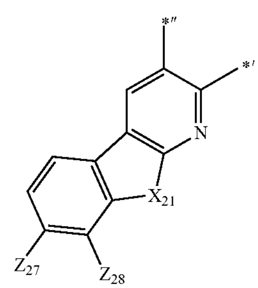

CY2-4071
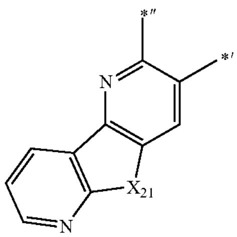
CY2-4072
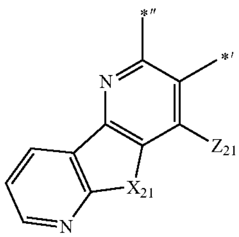
CY2-4073
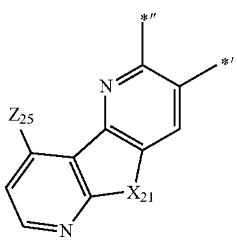
CY2-4074
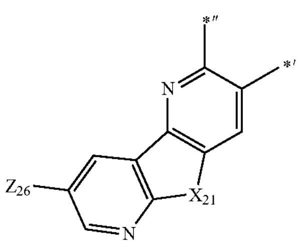
CY2-4075
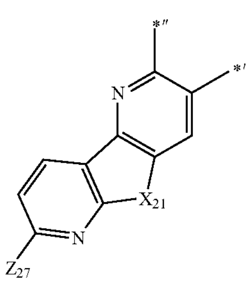
CY2-4076
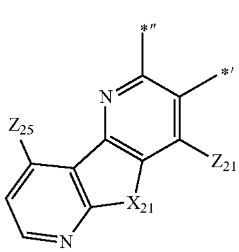
CY2-4077
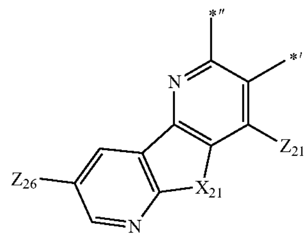
CY2-4078
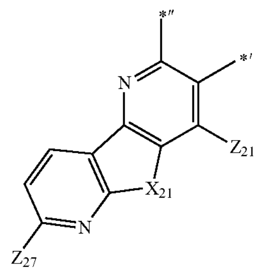
CY2-4079
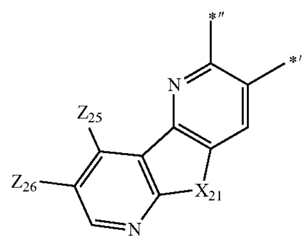
CY2-4080
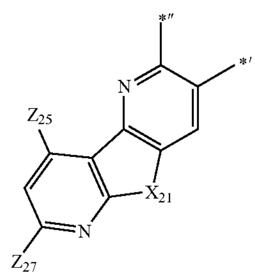
CY2-4081
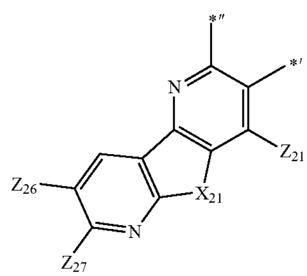
CY2-4082
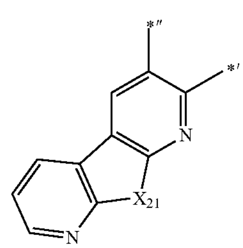

CY2-4083
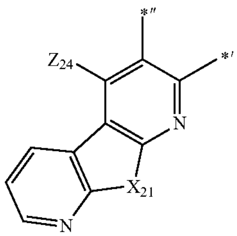
CY2-4084
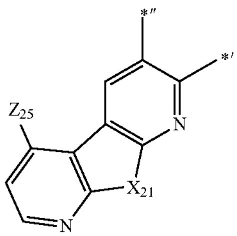
CY2-4085
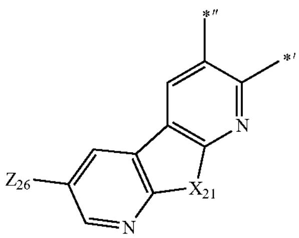
CY2-4086
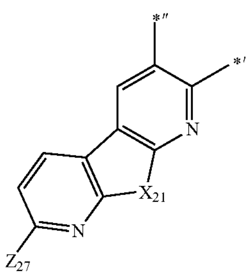
CY2-4087
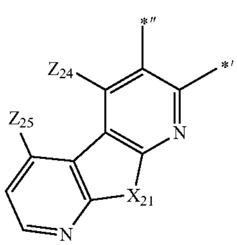
CY2-4088
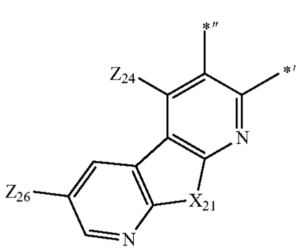
CY2-4089
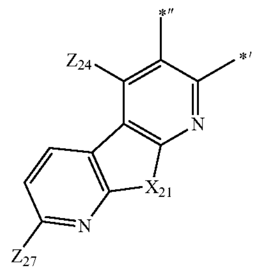
CY2-4090
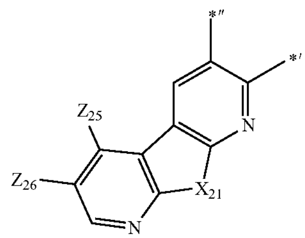
CY2-4091
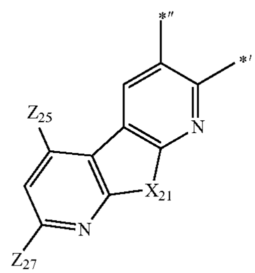
CY2-4092
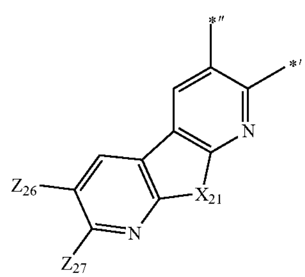
CY2-5001
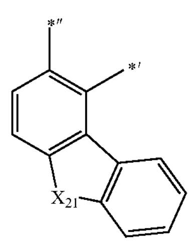
CY2-5002
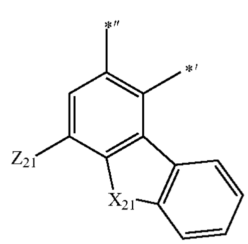

-continued
CY2-5003
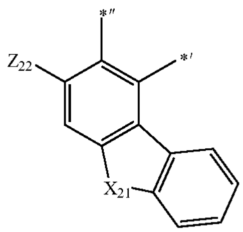
CY2-5004
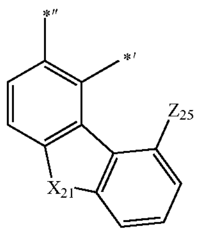
CY2-5005
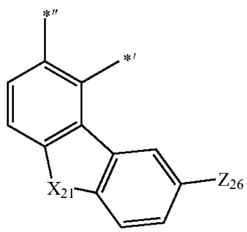
CY2-5006
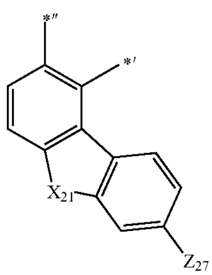
CY2-5007
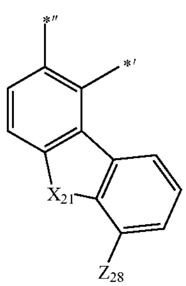
CY2-5008
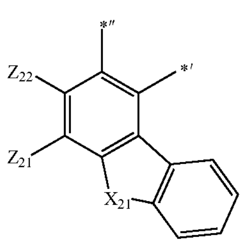
-continued
CY2-5009
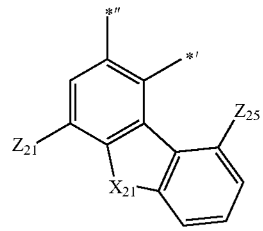
CY2-5010
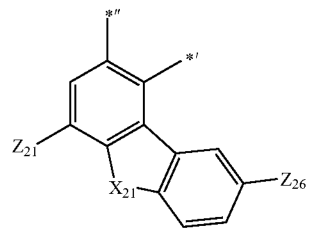
CY2-5011
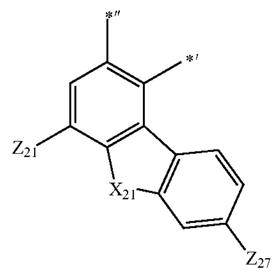
CY2-5012
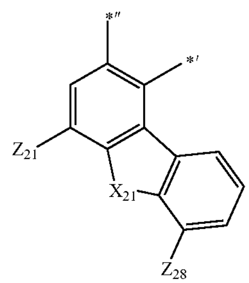
CY2-5013
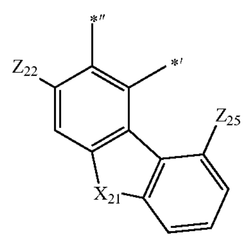
CY2-5014
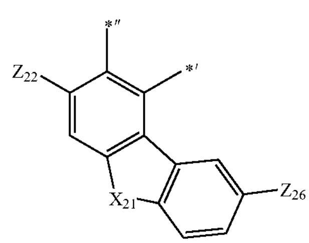

-continued
CY2-5015
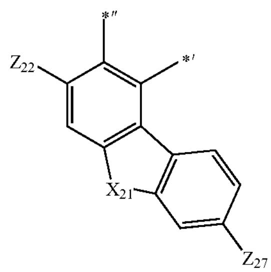
CY2-5016
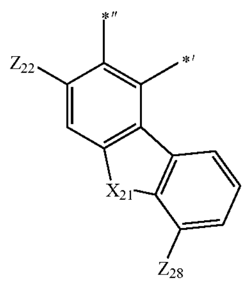
CY2-5017
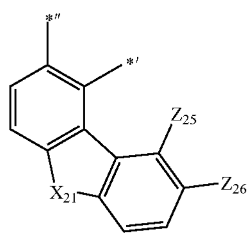
CY2-5018
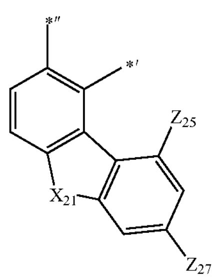
CY2-5019
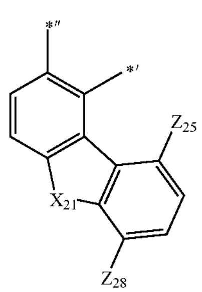
-continued
CY2-5020
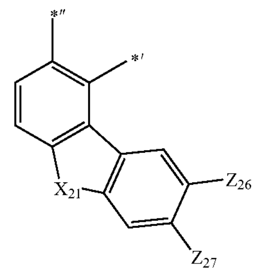
CY2-5021
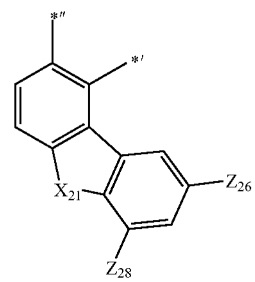
CY2-5022
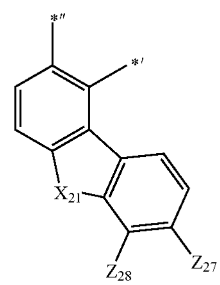
CY2-5023
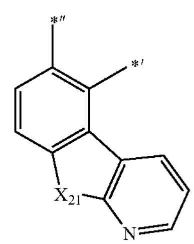
CY2-5024
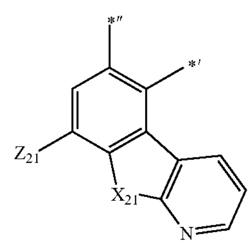
CY2-5025
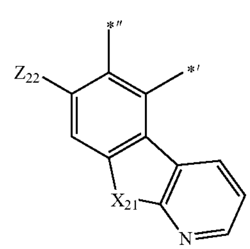

-continued
CY2-5026
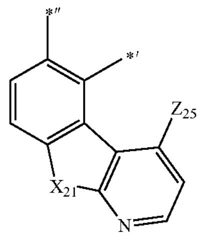
CY2-5027
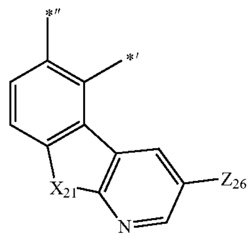
CY2-5028
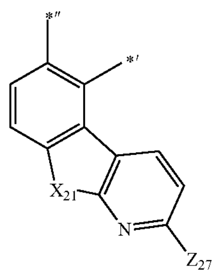
CY2-5029
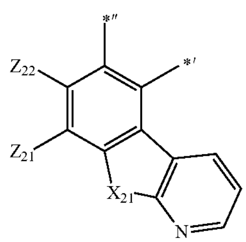
CY2-5030
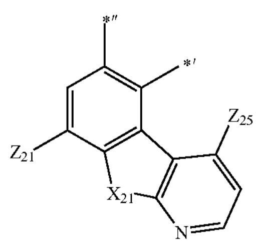
CY2-5031
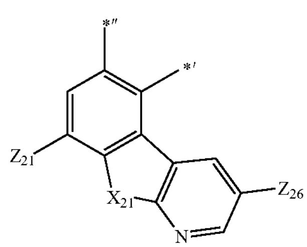
-continued
CY2-5032
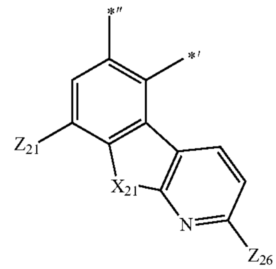
CY2-5033
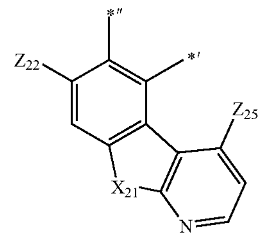
CY2-5034
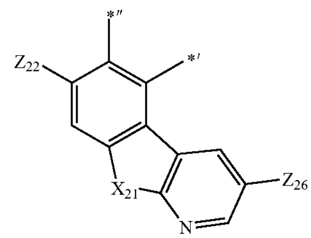
CY2-5035
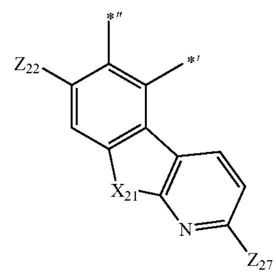
CY2-5036
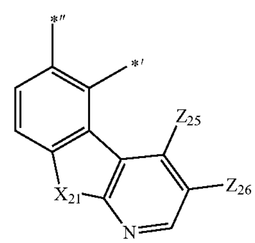
CY2-5037
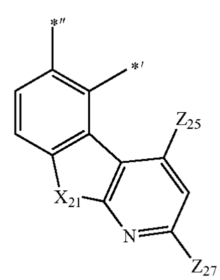

CY2-5038
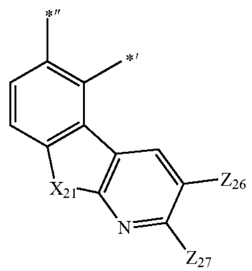
CY2-5039
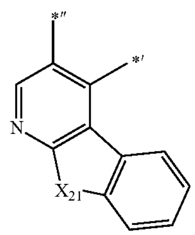
CY2-5040
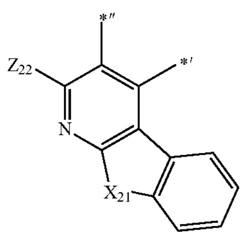
CY2-5041
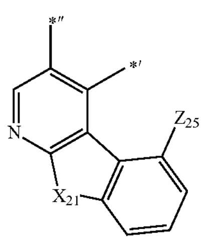
CY2-5042
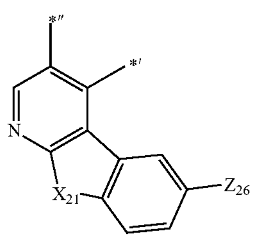
CY2-5043
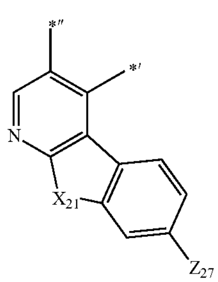
CY2-5044
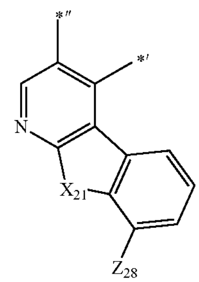
CY2-5045
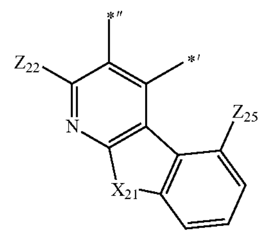
CY2-5046
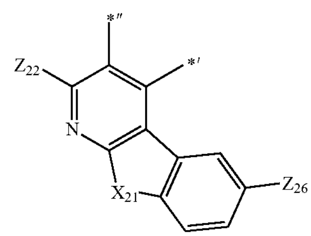
CY2-5047
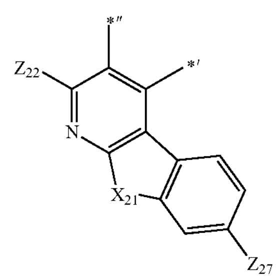
CY2-5048
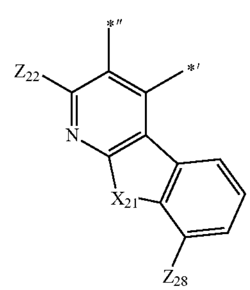
CY2-5049
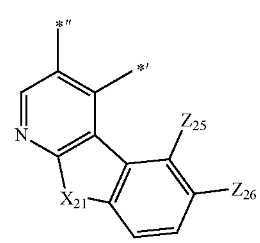

-continued
CY2-5050
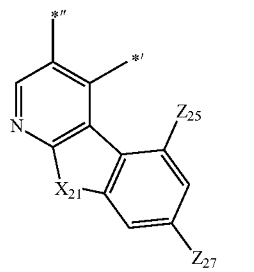
CY2-5051
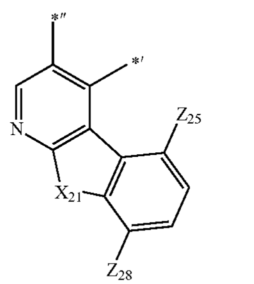
CY2-5052
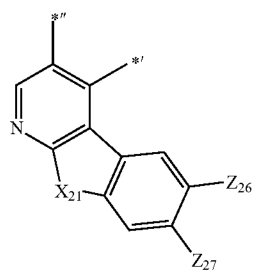
CY2-5053
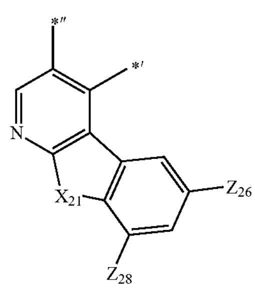
CY2-5054
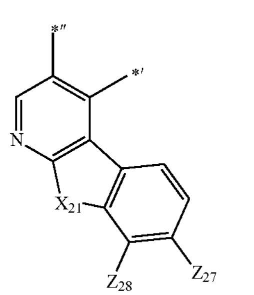
-continued
CY2-5055
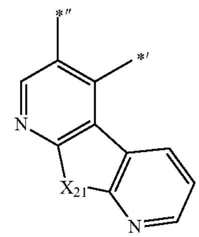
CY2-5056
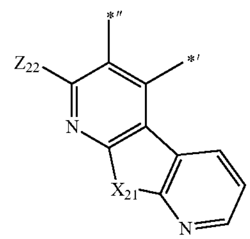
CY2-5057
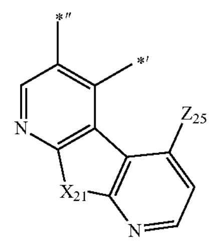
CY2-5058
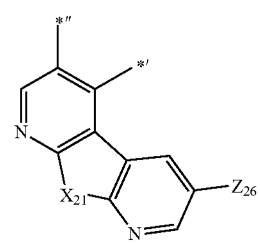
CY2-5059
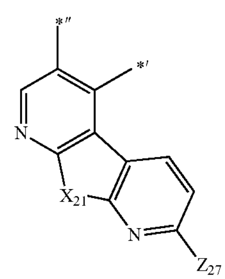
CY2-5060
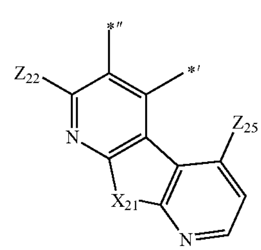

-continued
CY2-5061
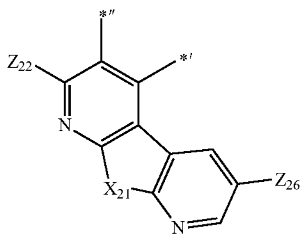
CY2-5062
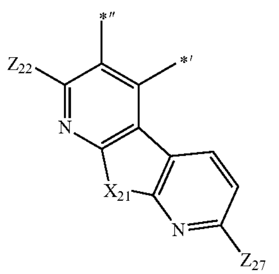
CY2-5063
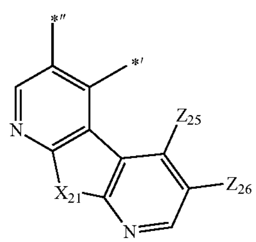
CY2-5064
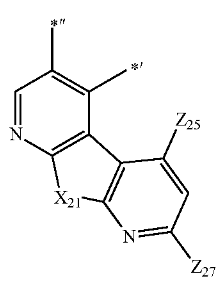
CY2-5065
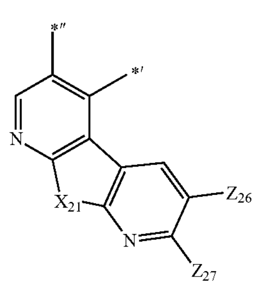
CY2-6001
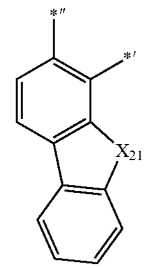
CY2-6002
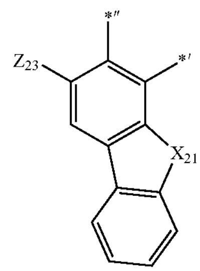
CY2-6003
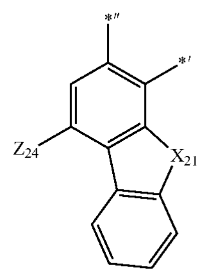
CY2-6004
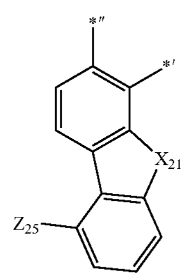
CY2-6005
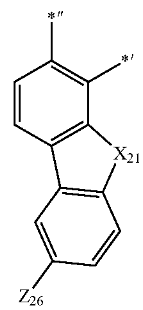

-continued
CY2-6006
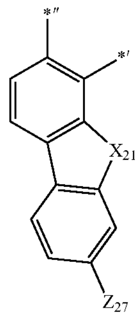
CY2-6007
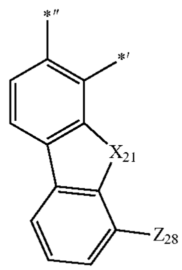
CY2-6008
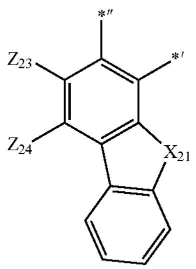
CY2-6009
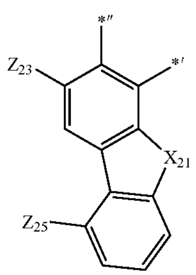
CY2-6010
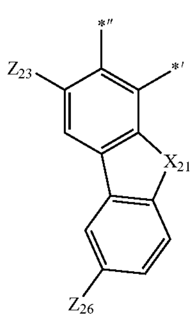
-continued
CY2-6011
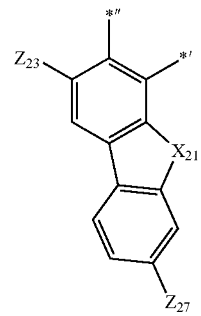
CY2-6012
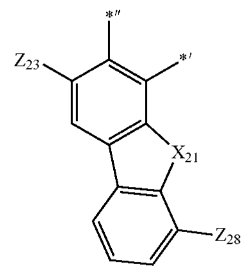
CY2-6013
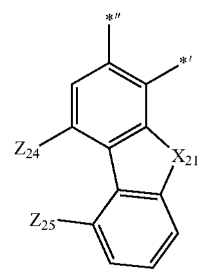
CY2-6014
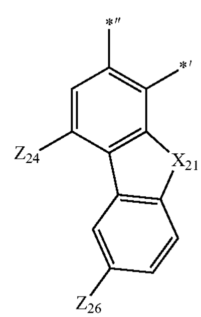
CY2-6015
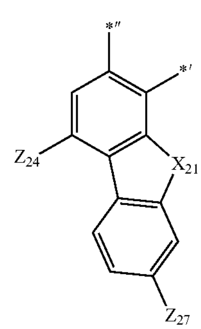

CY2-6016
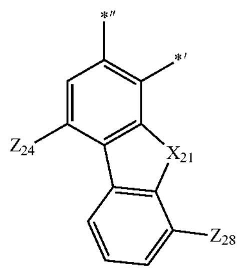
CY2-6017
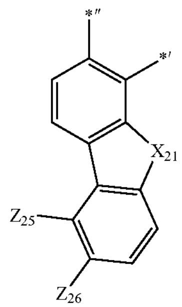
CY2-6018
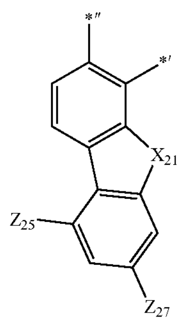
CY2-6019
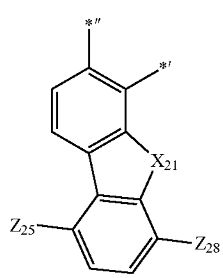
CY2-6020
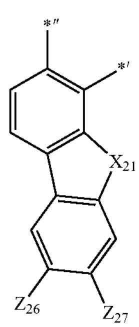
CY2-6021
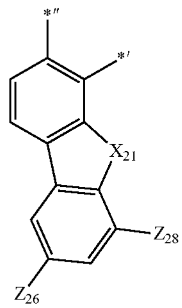
CY2-6022
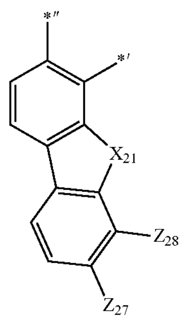
CY2-6023
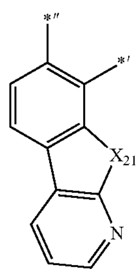
CY2-6024
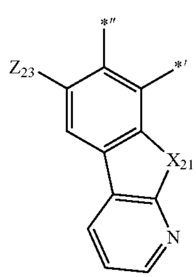
CY2-6025
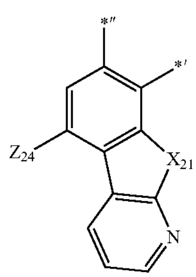

CY2-6026
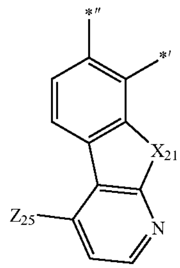
CY2-6027
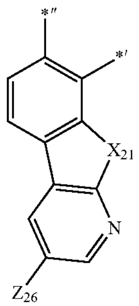
CY2-6028
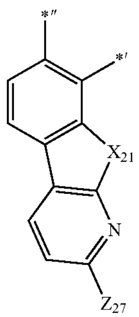
CY2-6029
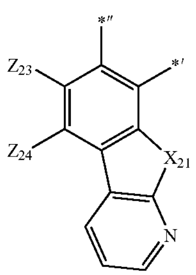
CY2-6030
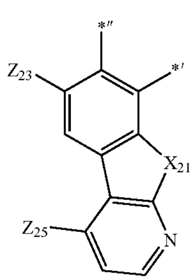
CY2-6031
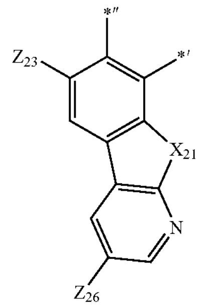
CY2-6032
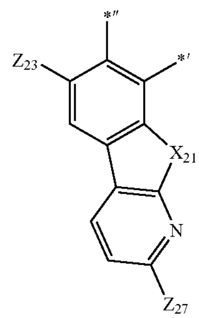
CY2-6033
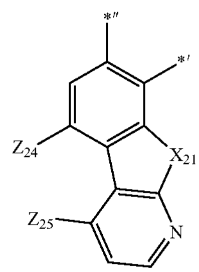
CY2-6034
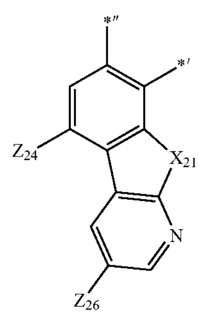
CY2-6035
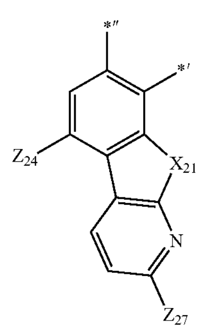

-continued
CY2-6036
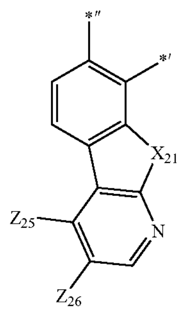
CY2-6037
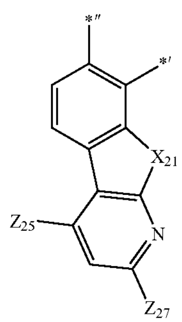
CY2-6038
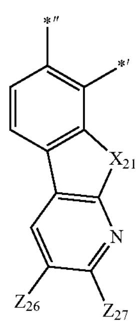
CY2-6039
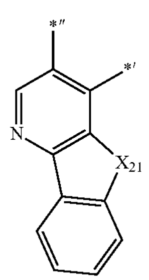
CY2-6040
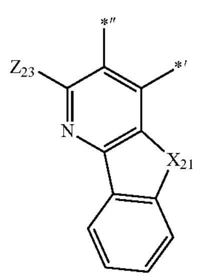
-continued
CY2-6041
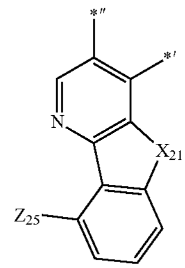
CY2-6042
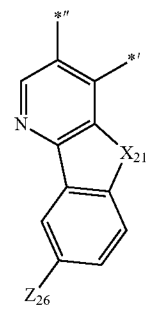
CY2-6043
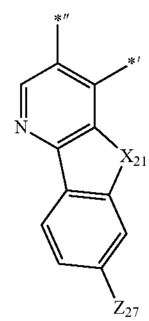
CY2-6044
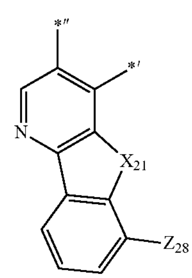
CY2-6045
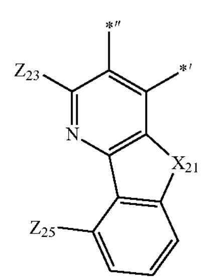

CY2-6046
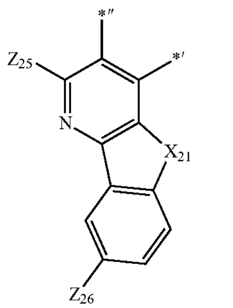
CY2-6047
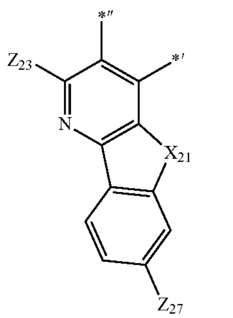
CY2-6048
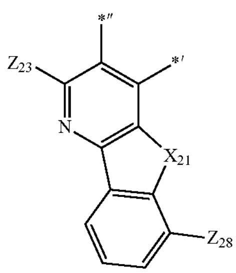
CY2-6049
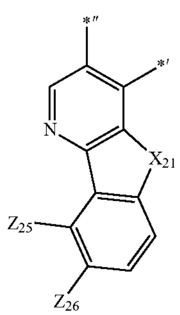
CY2-6050
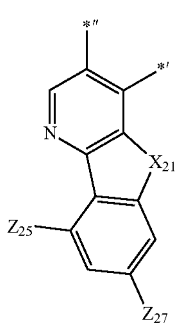
CY2-6051
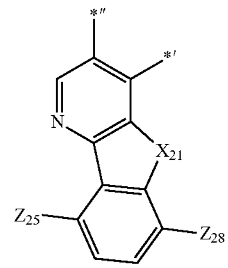
CY2-6052
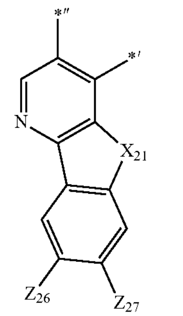
CY2-6053
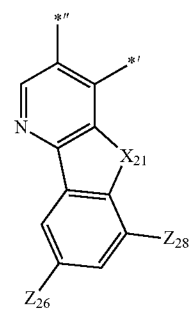
CY2-6054
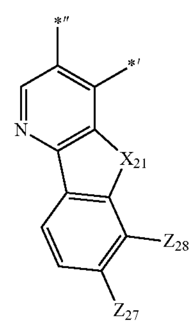
CY2-6055
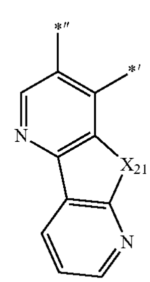

-continued
CY2-6056
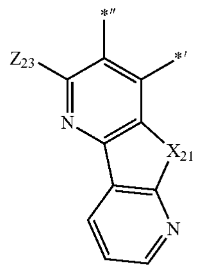
CY2-6057
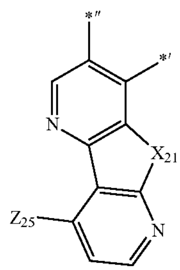
CY2-6058
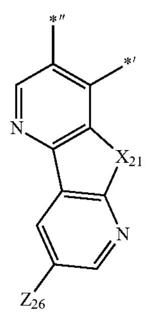
CY2-6059
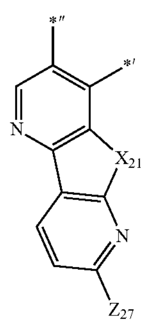
CY2-6060
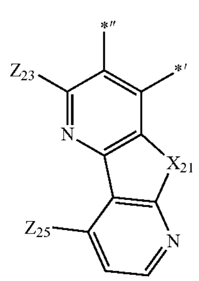
-continued
CY2-6061
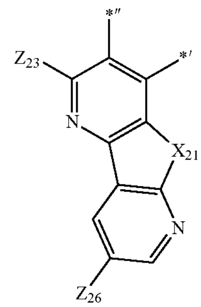
CY2-6062
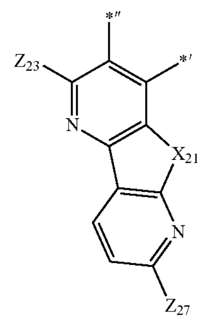
CY2-6063
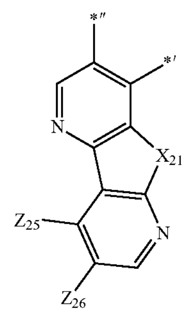
CY2-6064
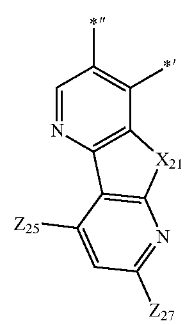
CY2-6065
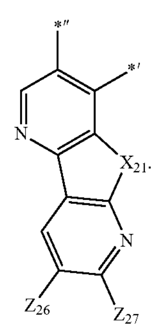

In Formulae CY2-1001 to CY2-1141, CY2-2001 to CY2-2092, CY2-3001 to CY2-3092, CY2-4001 to CY2-4092, CY2-5001 to CY2-5065 and CY2-6001 to CY2-6065, $X_{21}$ may each be the same as described above, $Z_{21}$ to $Z_{28}$ may each be the same as defined in connection with $Z_2$, provided that each of $Z_{21}$ to $Z_{28}$ are not hydrogen,

*" indicates a binding site to ring $CY_1$ in Formula 2A, and

*' indicates a binding site to M in Formula 1.

In one or more embodiments, a group represented by

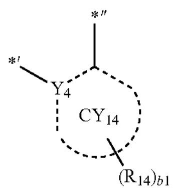

in Formula 2B may be a group represented by one of Formulae CY14-1 to CY14-64:

CY14-1

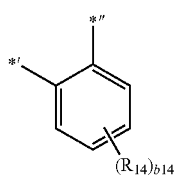

CY14-2

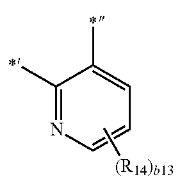

CY14-3

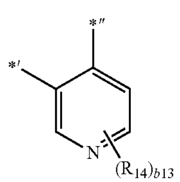

CY14-4

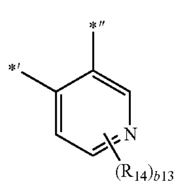

CY14-5

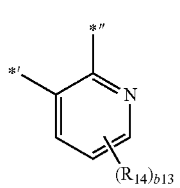

-continued

CY14-6

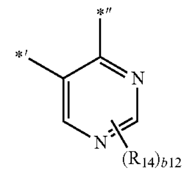

CY14-7

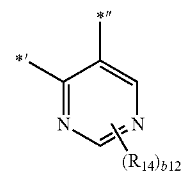

CY14-8

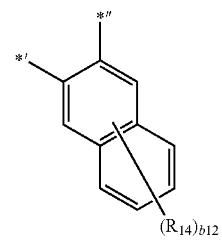

CY14-9

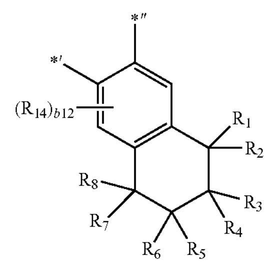

CY14-10

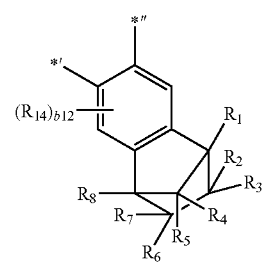

CY14-11

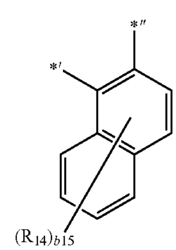

CY14-12

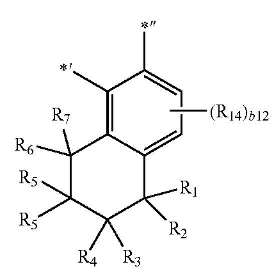

CY14-13
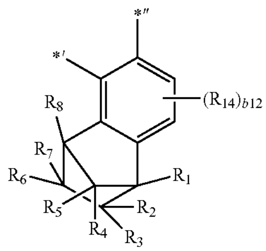
CY14-14
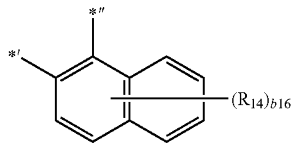
CY14-15
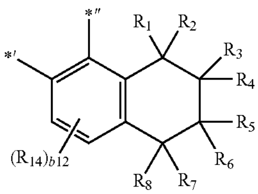
CY14-16
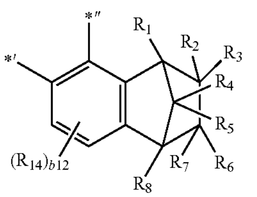
CY14-17
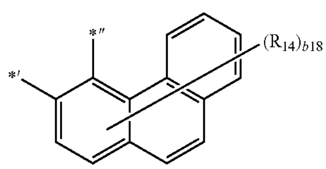
CY14-18
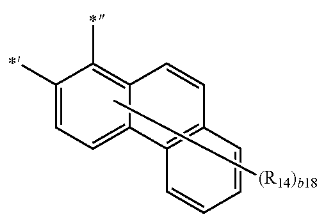
CY14-19
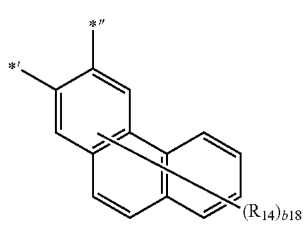
CY14-20
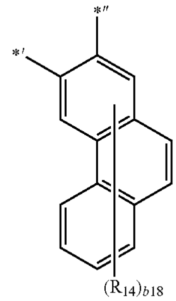
CY14-21
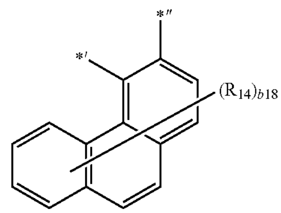
CY14-22
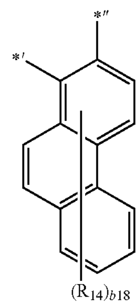
CY14-23
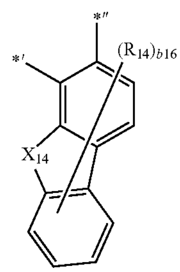
CY14-24
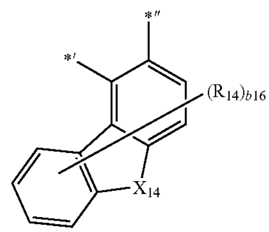
CY14-25
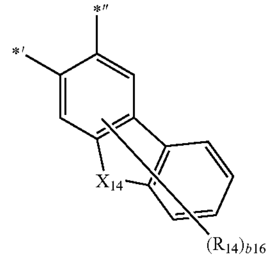

-continued
CY14-26
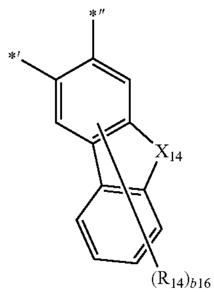
CY14-27
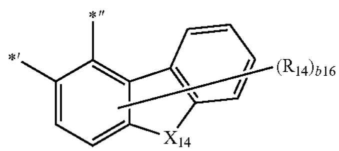
CY14-28
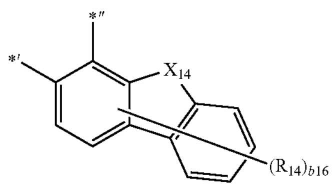
CY14-29
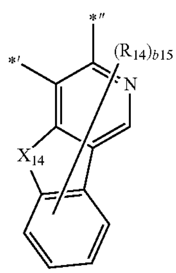
CY14-30
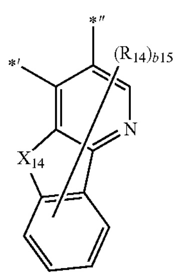
CY14-31
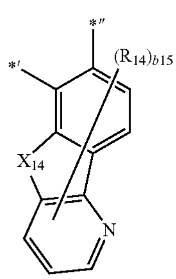
-continued
CY14-32
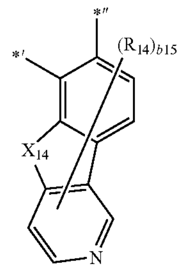
CY14-33
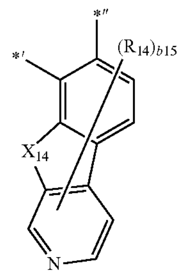
CY14-34
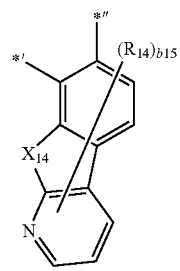
CY14-35
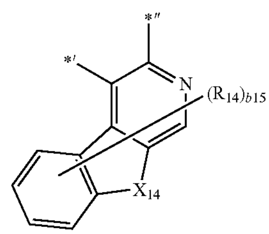
CY14-36
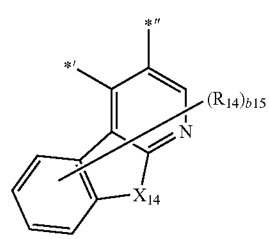
CY14-37
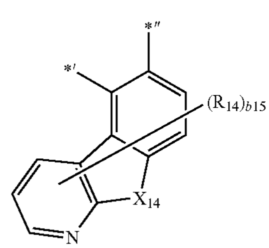

CY14-38
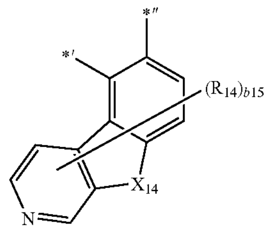
CY14-39
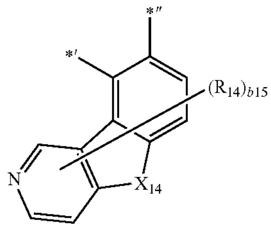
CY14-40
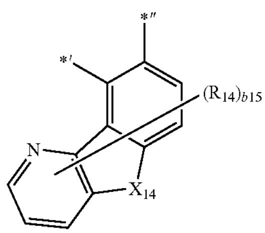
CY14-41
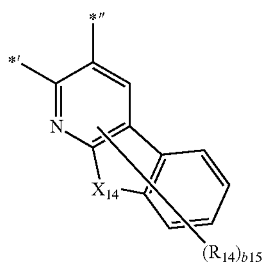
CY14-42
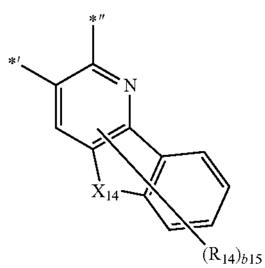
CY14-43
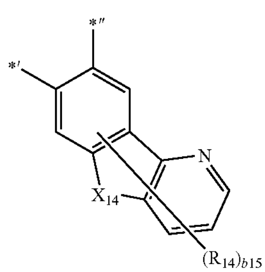
CY14-44
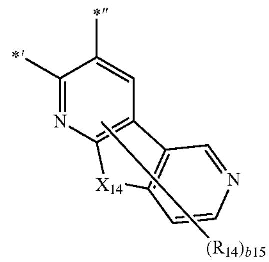
CY14-45
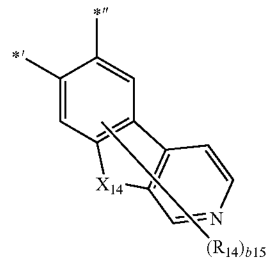
CY14-46
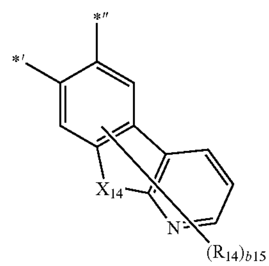
CY14-47
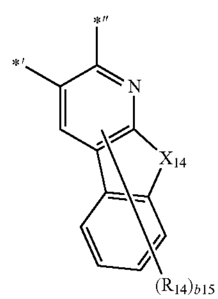
CY14-48
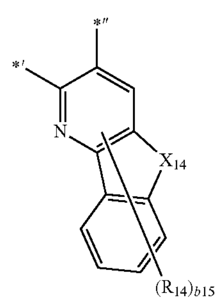

-continued
CY14-49
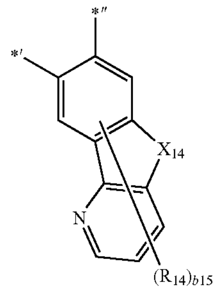
CY14-50
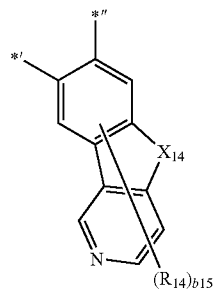
CY14-51
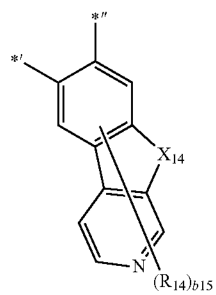
CY14-52
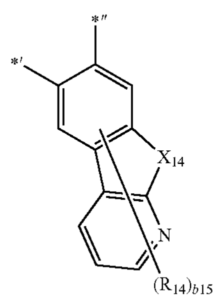
CY14-53
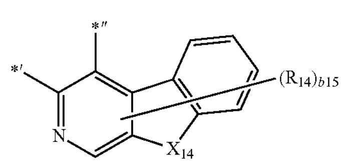
CY14-54
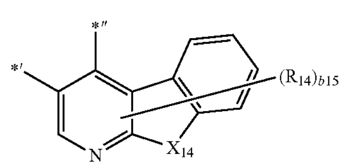
-continued
CY14-55
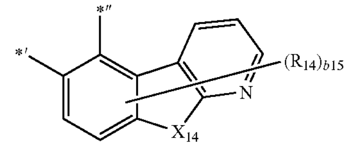
CY14-56
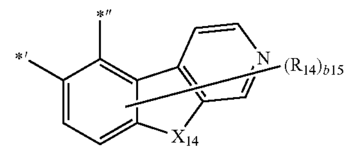
CY14-57
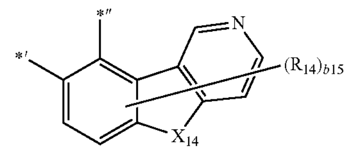
CY14-58
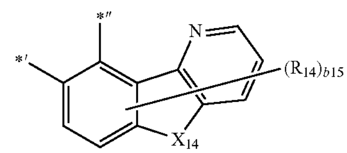
CY14-59
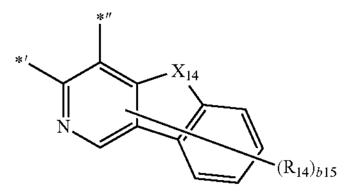
CY14-60
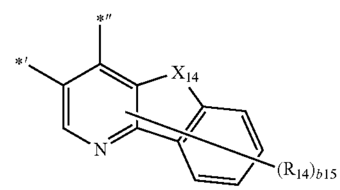
CY14-61
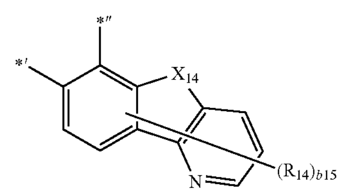
CY14-62
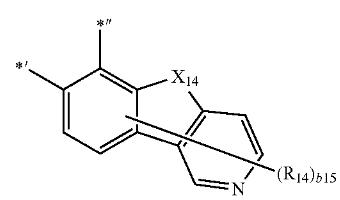
CY14-63
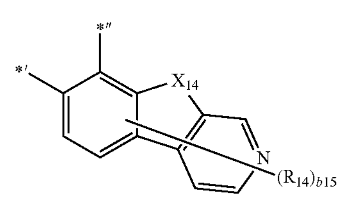

-continued

CY14-64

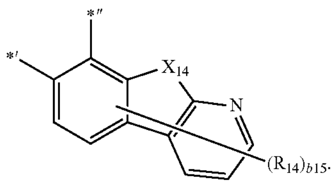

In Formulae CY14-1 to CY14-64, $R_{14}$ may be the same as described above, $X_{14}$ may be $C(R_1)(R_2)$, $N(R_1)$, O, S, or $Si(R_1)(R_2)$, $R_1$ to $R_8$ may each be the same as defined in connection with $R_{14}$ in the present specification, b18 may be an integer from 0 to 8, b16 may be an integer from 0 to 6, b15 may be an integer from 0 to 5, b14 may be an integer from 0 to 4, b13 may be an integer from 0 to 3, b12 may be an integer from 0 to 2,

*" indicates a binding site to a carbon atom of a neighboring pyridine ring in Formula 2B, and

*' indicates a binding site to M in Formula 1.

In one or more embodiments, a group represented by

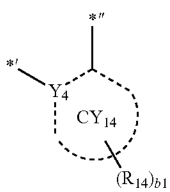

in Formula 2B may be a group represented by one of Formulae CY14(1) to CY14(63):

CY14(1)

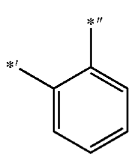

CY14(2)

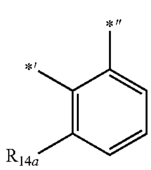

CY14(3)

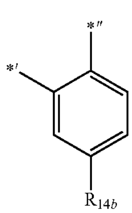

-continued

CY14(4)

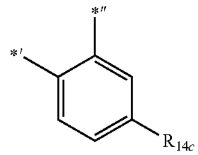

CY14(5)

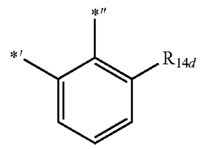

CY14(6)

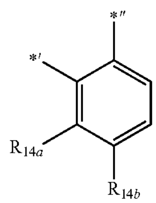

CY14(7)

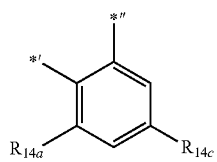

CY14(8)

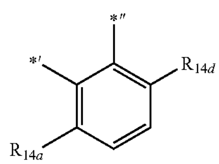

CY14(9)

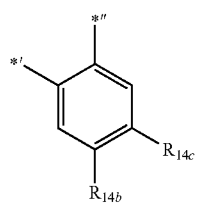

CY14(10)

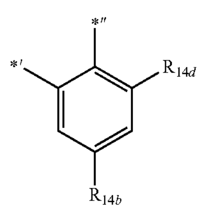

CY14(11)

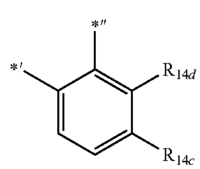

-continued
CY14(12)
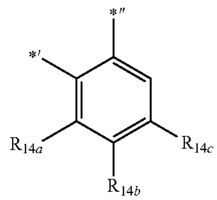
CY14(13)
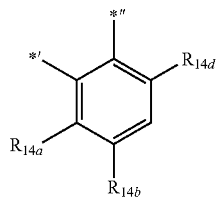
CY14(14)
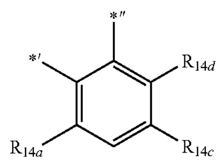
CY14(15)
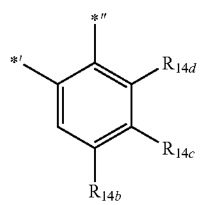
CY14(16)
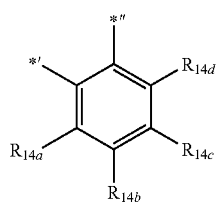
CY14(17)
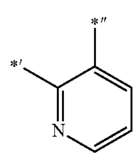
CY14(18)
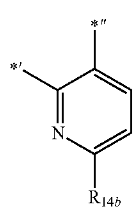
CY14(19)
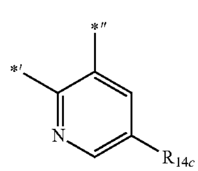
-continued
CY14(20)
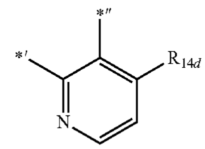
CY14(21)
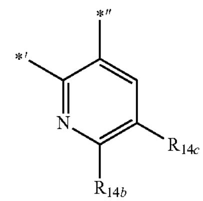
CY14(22)
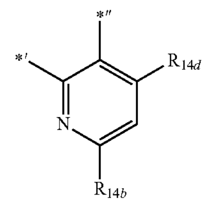
CY14(23)
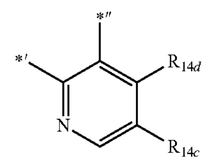
CY14(24)
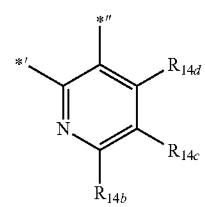
CY14(25)
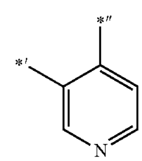
CY14(26)
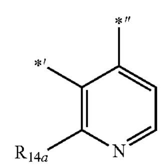
CY14(27)
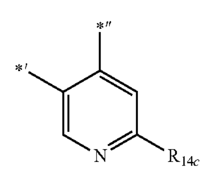
CY14(28)
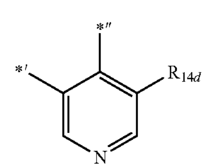

-continued
CY14(29)
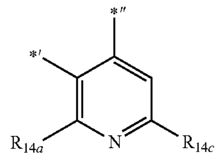
CY14(30)
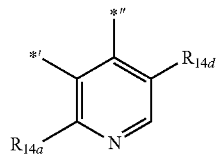
CY14(31)
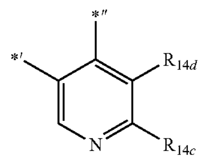
CY14(32)
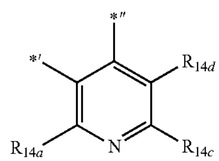
CY14(33)
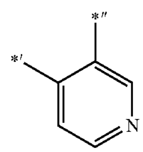
CY14(34)
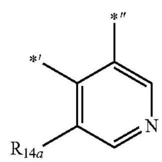
CY14(35)
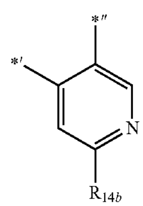
CY14(36)
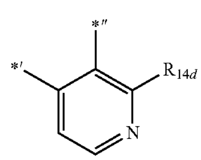
CY14(37)
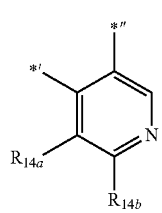
-continued
CY14(38)
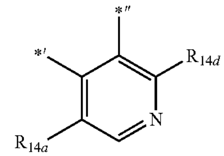
CY14(39)
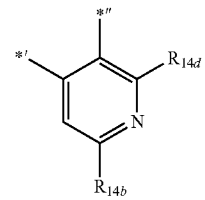
CY14(40)
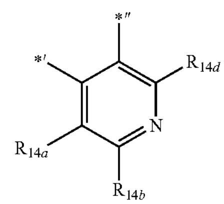
CY14(41)
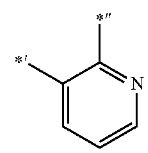
CY14(42)
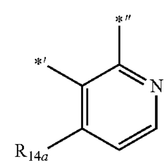
CY14(43)
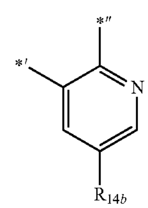
CY14(44)
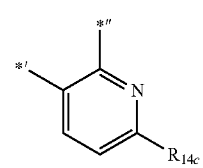
CY14(45)
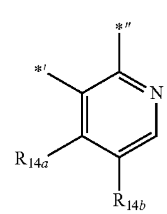

-continued
CY14(46)
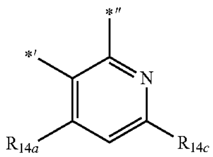
CY14(47)
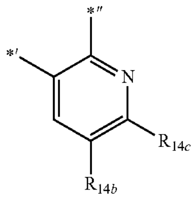
CY14(48)
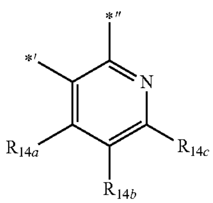
CY14(49)
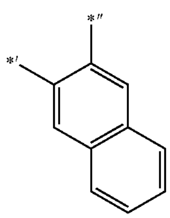
CY14(50)
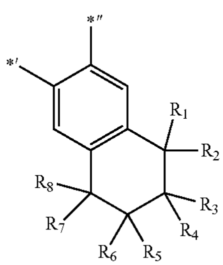
CY14(51)
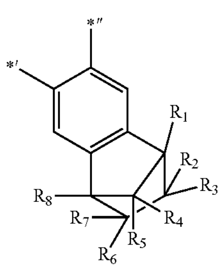
CY14(52)
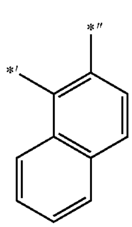
-continued
CY14(53)
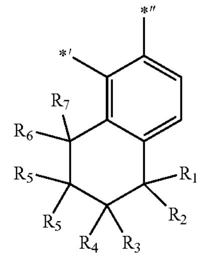
CY14(54)
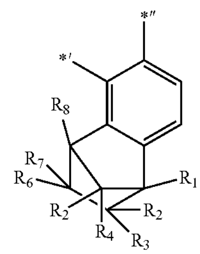
CY14(55)
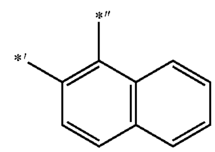
CY14(56)
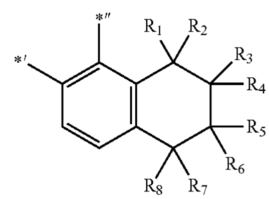
CY14(57)
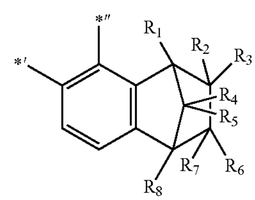
CY14(58)
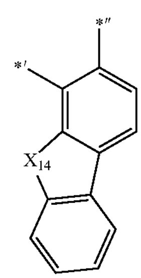
CY14(59)
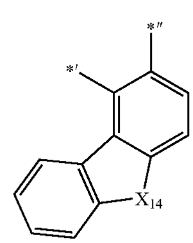

-continued

CY14(60)

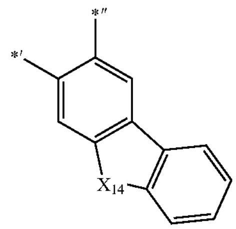

CY14(61)

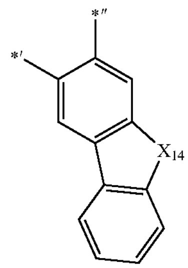

CY14(62)

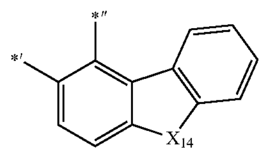

CY14(63)

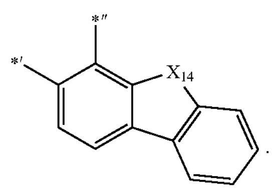

In Formulae CY14(1) to CY14(63), $R_{14a}$ to $R_{14d}$ may each the same as defined in connection with $R_{14}$, wherein each of $R_{14a}$ to $R_{14d}$ may not be hydrogen, $X_{14}$ may be $C(R_1)(R_2)$, $N(R_1)$, O, S or $Si(R_1)(R_2)$, $R_1$ to $R_8$ may each the same as defined in connection with $R_{14}$, wherein

*" indicates a binding site to a carbon atom of a neighboring pyridine ring in Formula 2B, and

*' indicates a binding site to M in Formula 1.

In one or more embodiments, the organometallic compound may be represented by Formula 1A:

Formula 1A

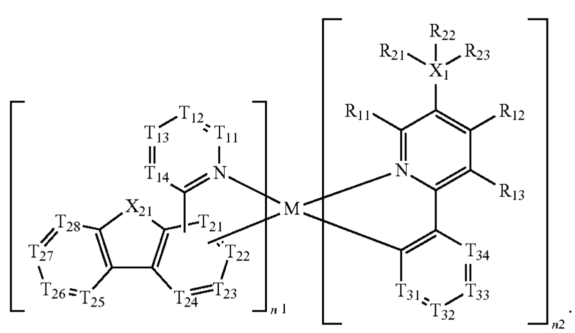

In Formula 1A,

M, n1, n2, $X_1$, $X_{21}$, $R_{21}$ to $R_{23}$, and $R_{11}$ to $R_{13}$ may each be the same as described above, $T_{11}$ may be N or $C(Z_{11})$, $T_{12}$ may be N or $C(Z_{12})$, $T_{13}$ may be N or $C(Z_{13})$, and $T_{14}$ may be N or $C(Z_{14})$, wherein $Z_{11}$ to $Z_{14}$ may each be the same as defined in connection with $Z_1$, $T_{21}$ may be N, $C(Z_{21})$, carbon linked to a neighboring 6-membered ring, or carbon linked to M in Formula 1, $T_{22}$ may be N, $C(Z_{22})$, carbon linked to a neighboring 6-membered ring, or carbon linked to M in Formula 1, $T_{23}$ may be N, $C(Z_{23})$, carbon linked to a neighboring 6-membered ring, or carbon linked to M in Formula 1, $T_{24}$ may be N, $C(Z_{24})$, carbon linked to a neighboring 6-membered ring, or carbon linked to M in Formula 1, $T_{25}$ may be N or $C(Z_{25})$, $T_{26}$ may be N or $C(Z_{26})$, $T_{27}$ may be N or $C(Z_{27})$, and $T_{28}$ may be N or $C(Z_{28})$, wherein one of $T_{21}$ to $T_{24}$ may be carbon linked to M in Formula 1, one of the remaining $T_{21}$ to $T_{24}$ that are not linked to M in Formula 1 may be carbon linked to a neighboring 6-membered ring, and $Z_{21}$ to $Z_{24}$ may each be the same as defined in connection with $Z_2$, $T_{31}$ may be N or $C(R_{14a})$, $T_{32}$ may be N or $C(R_{14b})$, $T_{33}$ may be N or $C(R_{14c})$, and $T_{24}$ may be N or $C(R_{14d})$, wherein $R_{14a}$ to $R_{14d}$ may each be the same as defined in connection with $R_{14}$, two or more of $Z_{11}$ to $Z_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $Z_{21}$ to $Z_{28}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_{14a}$ to $R_{14d}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and $R_{10a}$ may be the same as defined in connection with $R_{14}$.

Descriptions for Formula 1A may refer to descriptions for Formula 1 in this disclosure.

For example, $T_{13}$ in Formula 1A may be $C(Z_{13})$ and $Z_{13}$ may not be a hydrogen.

In one or more embodiments, the number of silicon (Si) atoms in the organometallic compound represented by Formula 1 may be 1 or 2.

In one or more embodiments, the organometallic compound may be one of Compounds 1 to 1620:

1

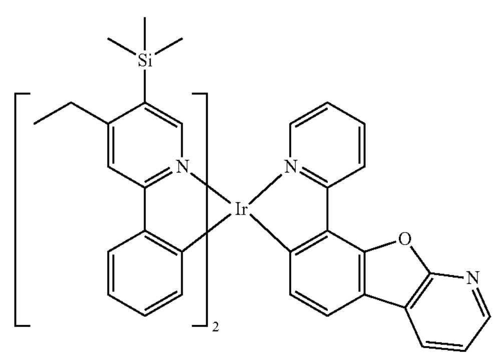

-continued
2
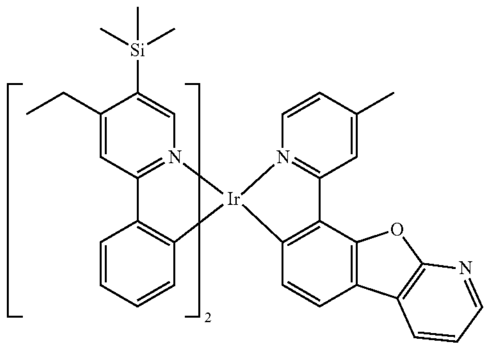
3
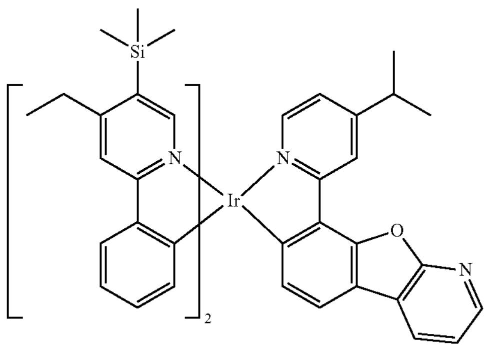
4
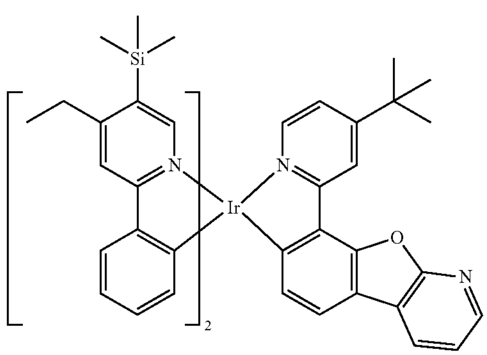
5
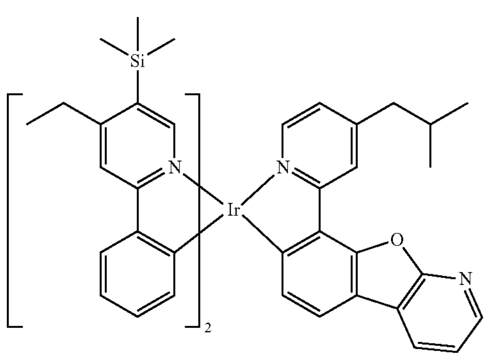
-continued
6
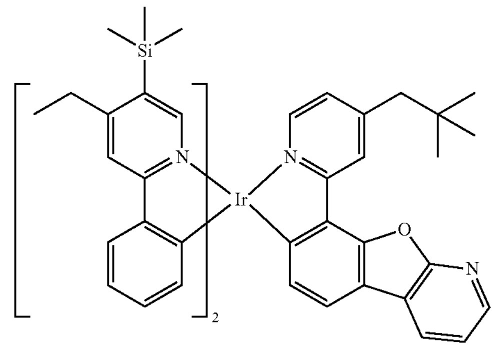
7
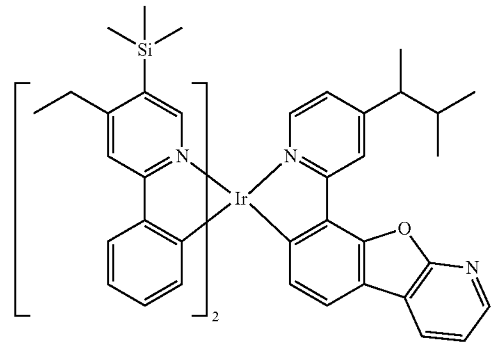
8
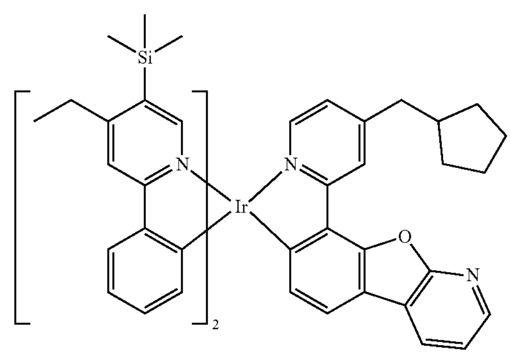
9
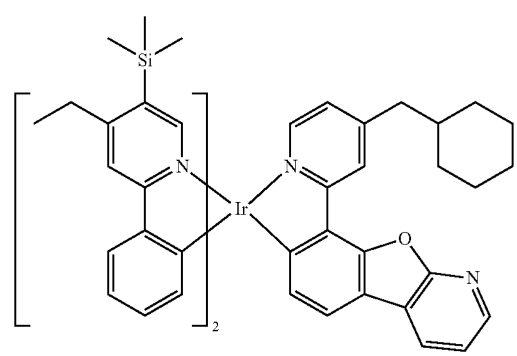

-continued
10
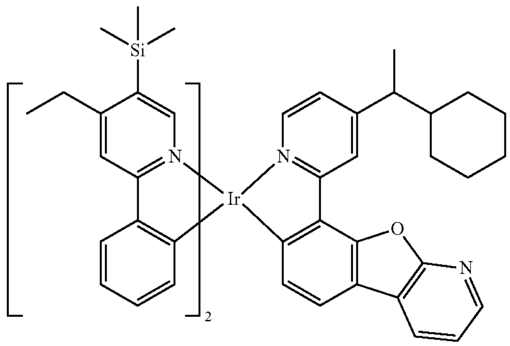
11
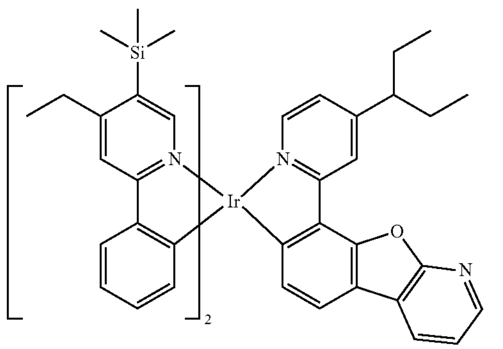
12
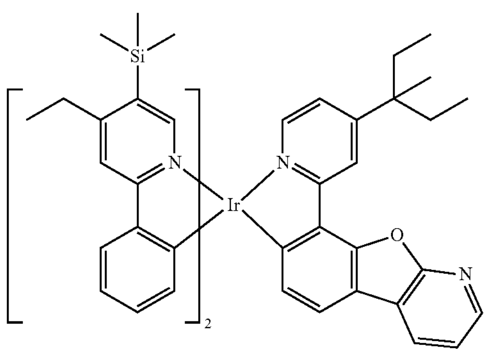
13
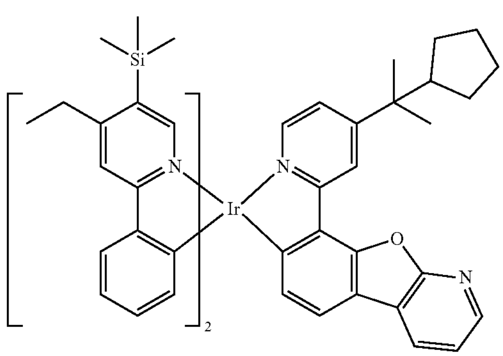
-continued
14
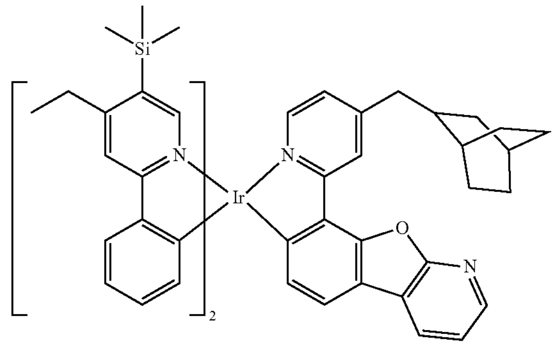
15
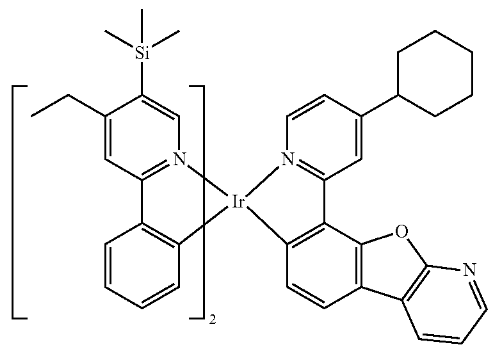
16
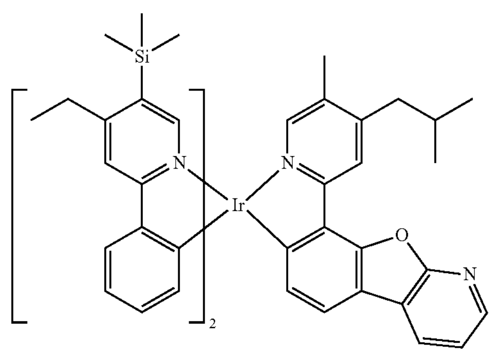
17
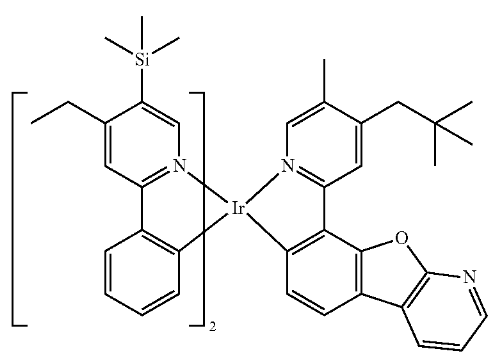

18
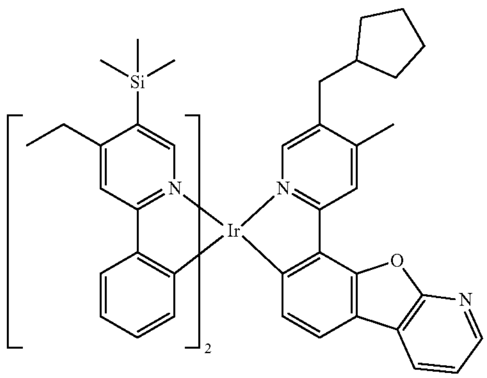
19
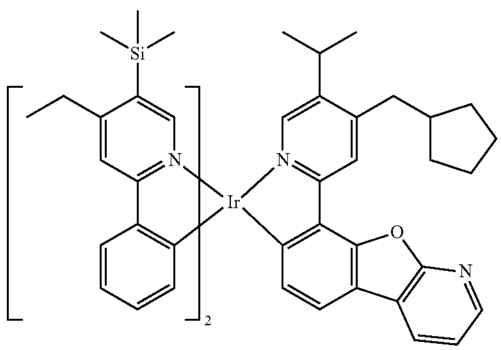
20
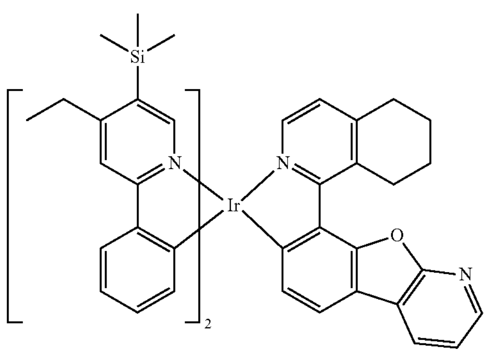
21
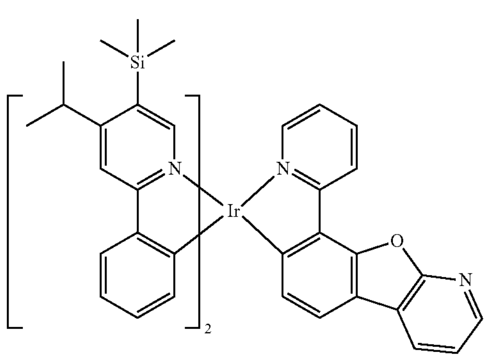
22
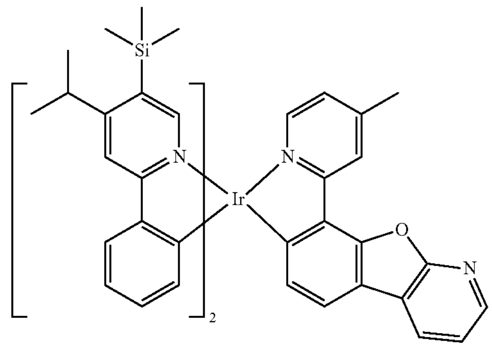
23
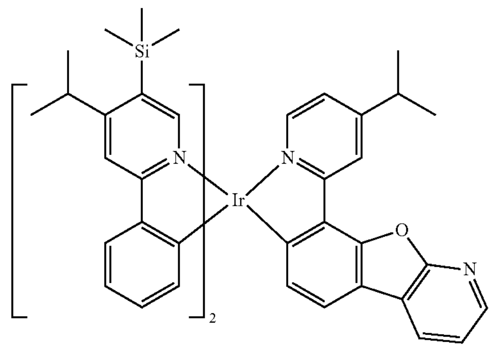
24
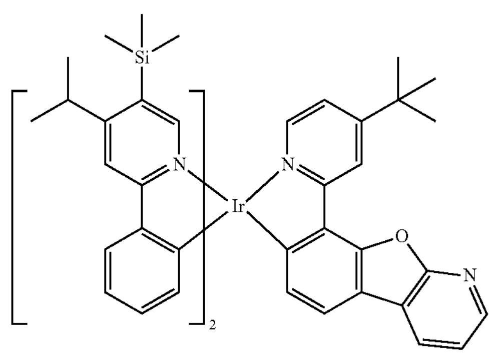
25
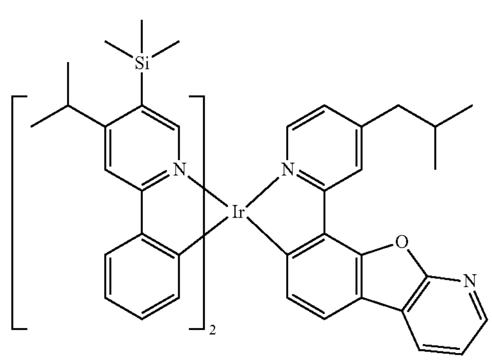

26
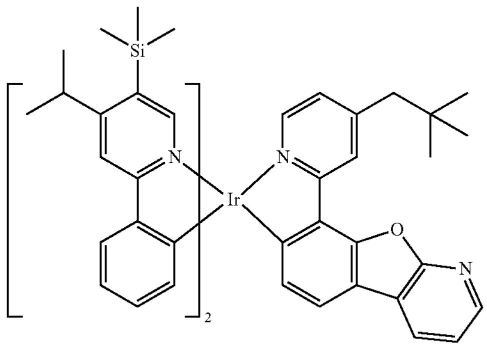
27
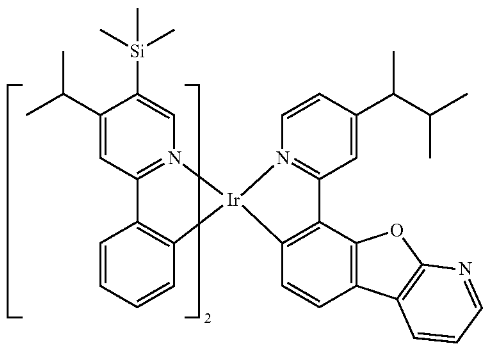
28
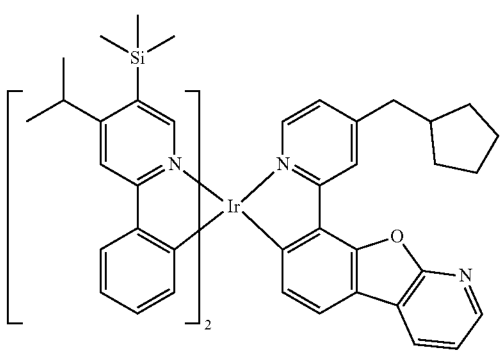
29
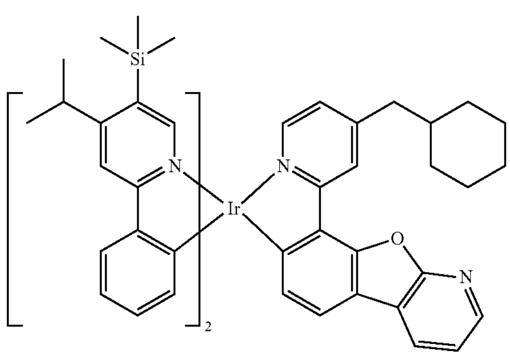
30
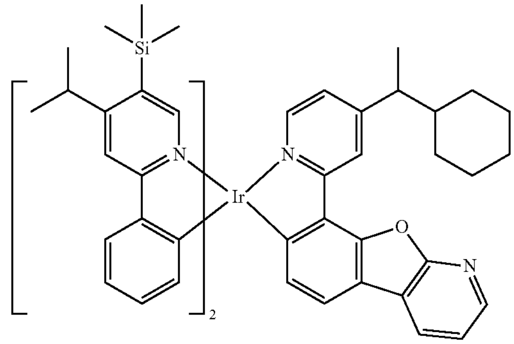
31
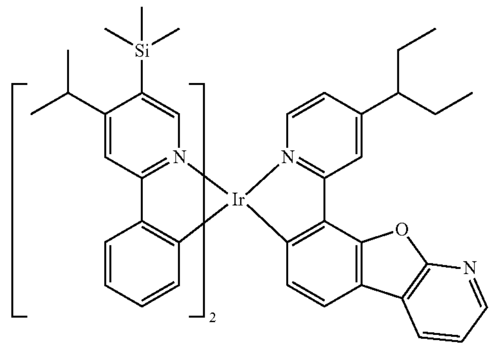
32
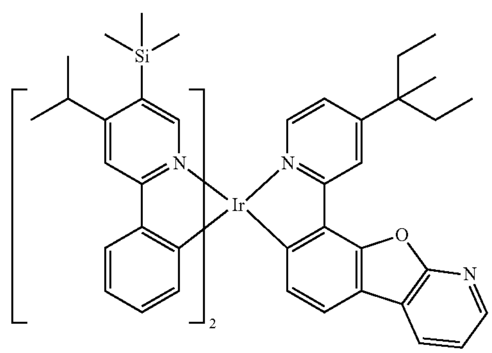
33
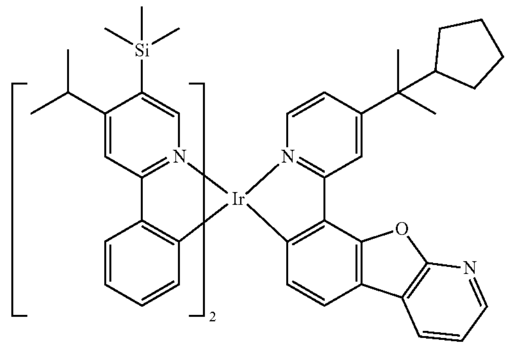

-continued
34
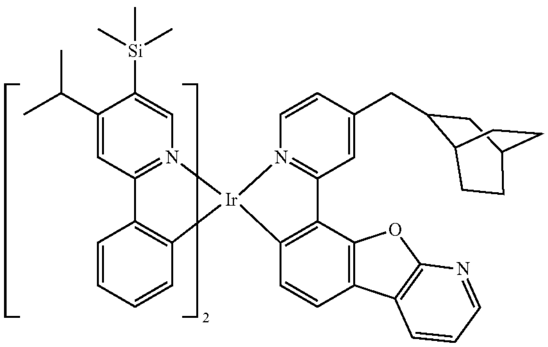
35
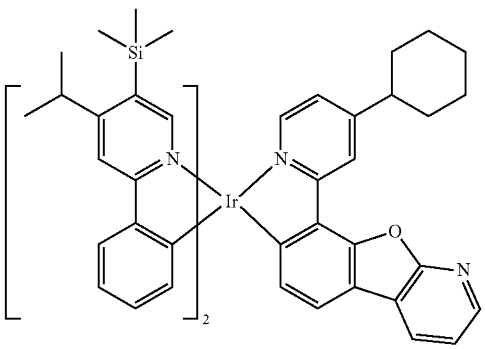
36
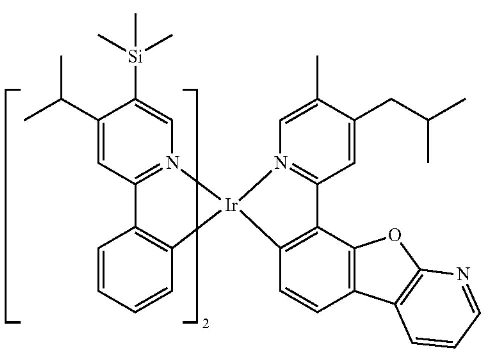
37
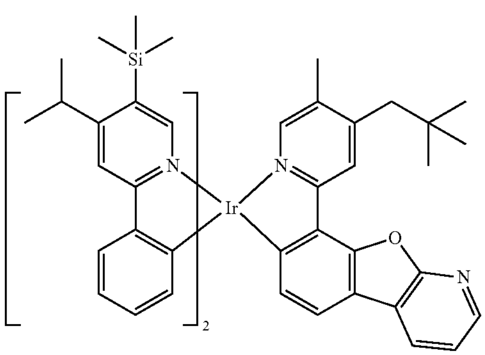
-continued
38
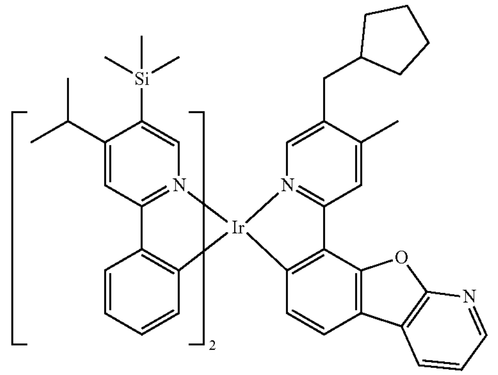
39
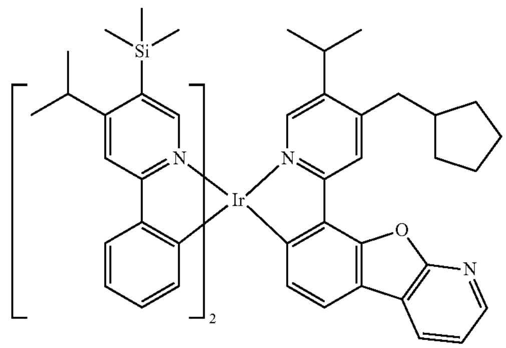
40
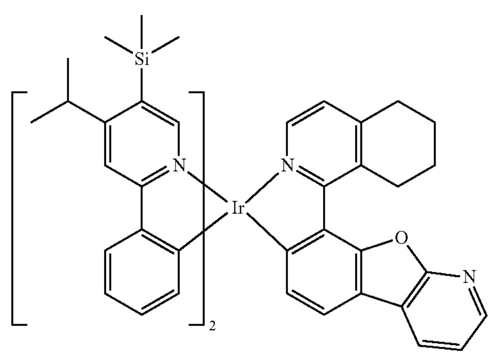
41
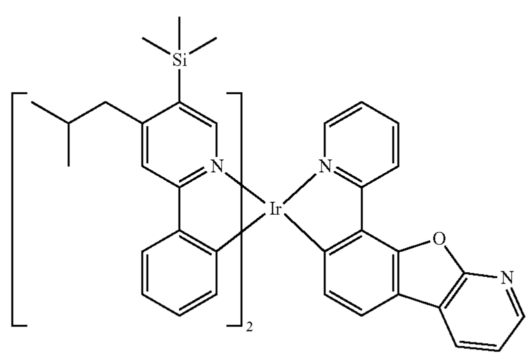

-continued
42
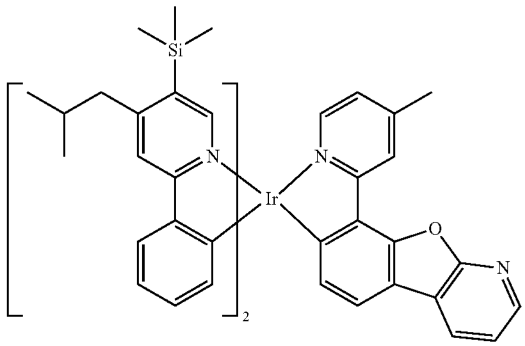
43
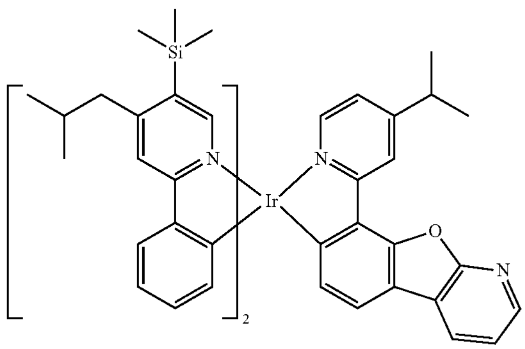
44
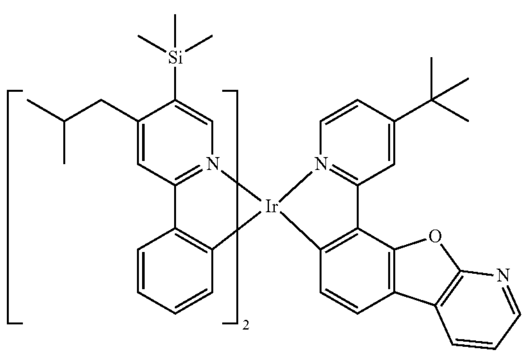
45
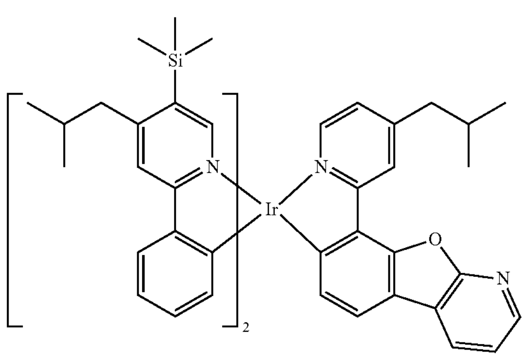
-continued
46
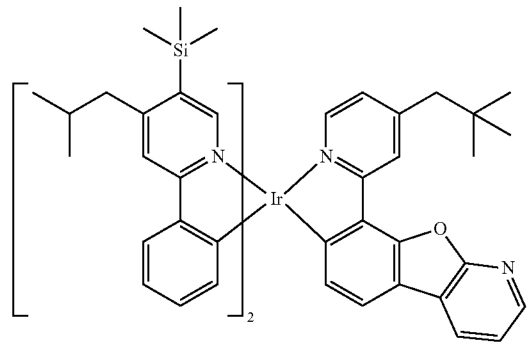
47
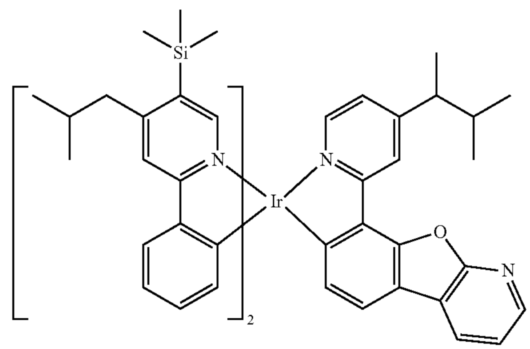
48
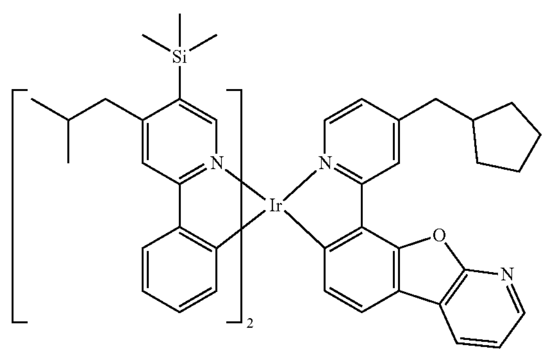
49
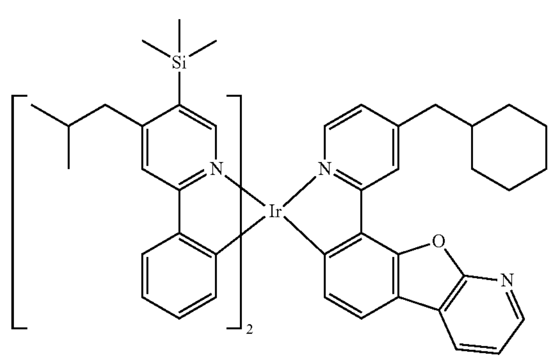

50
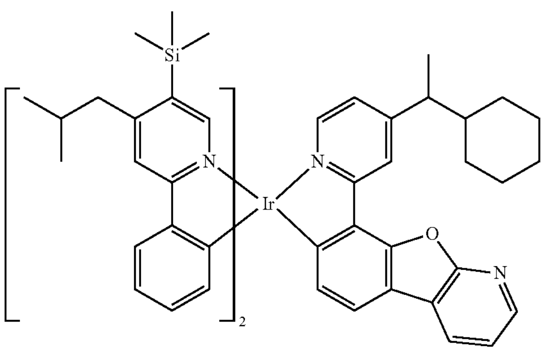
51
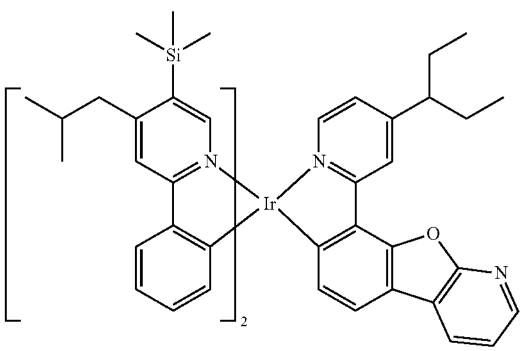
52
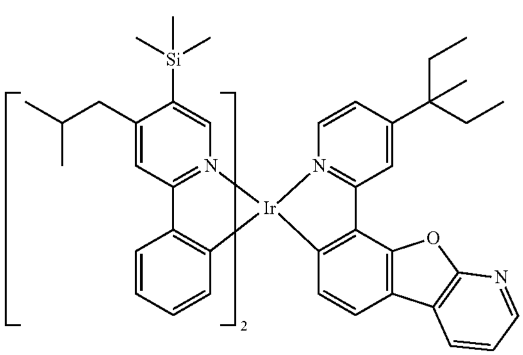
53
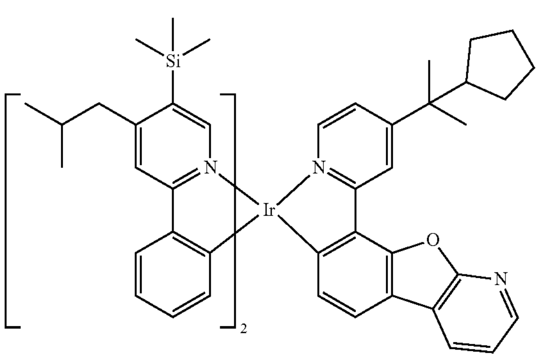
54
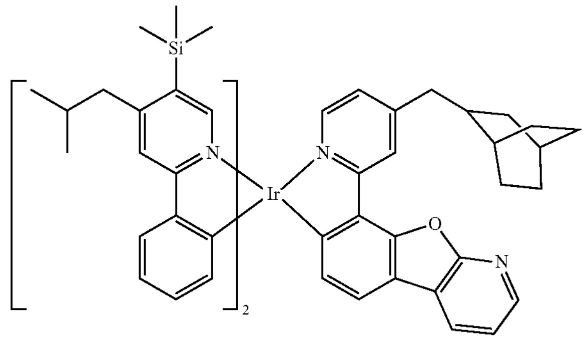
55
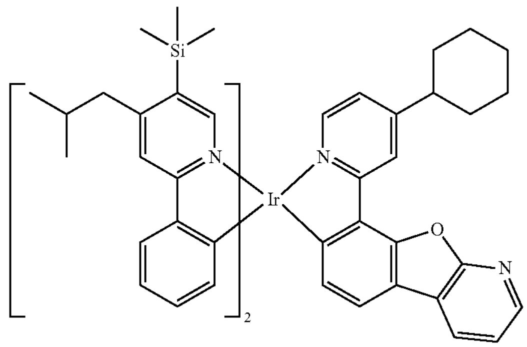
56
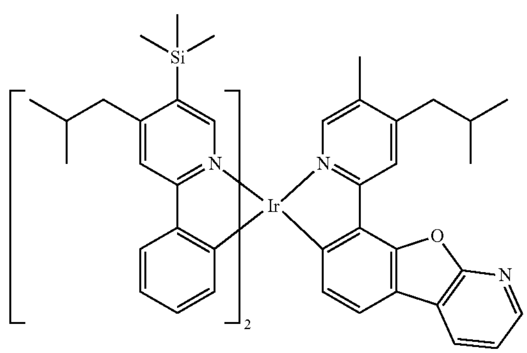
57
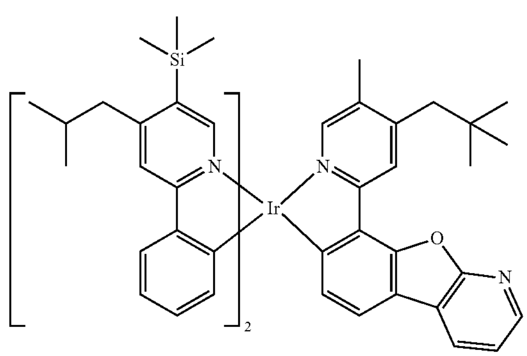

-continued
58
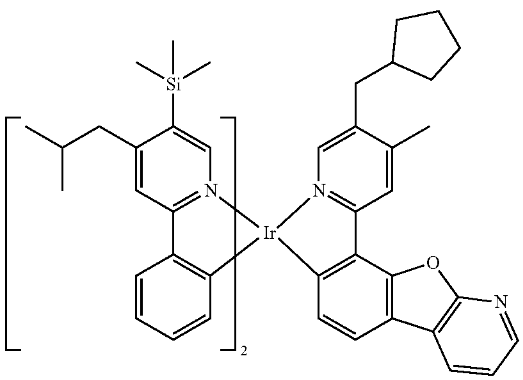
59
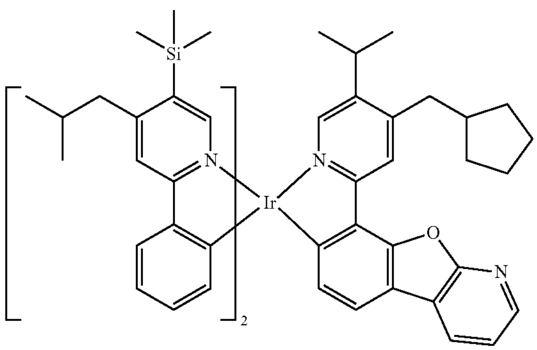
60
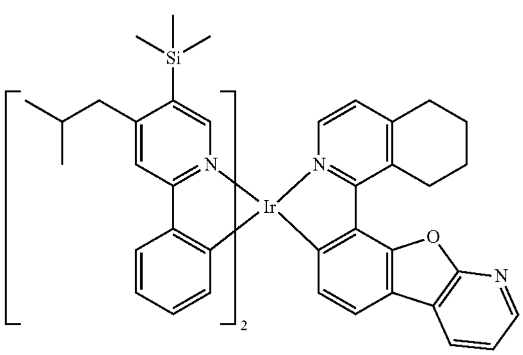
61
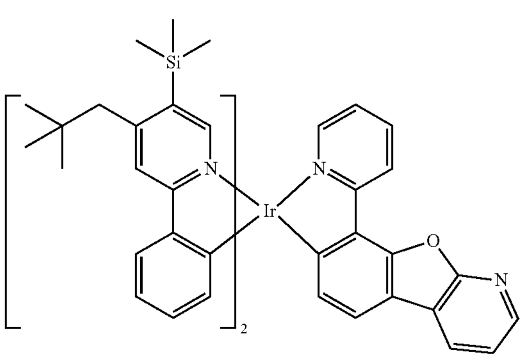
-continued
62
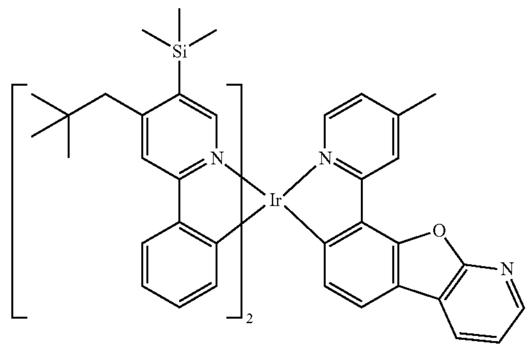
63
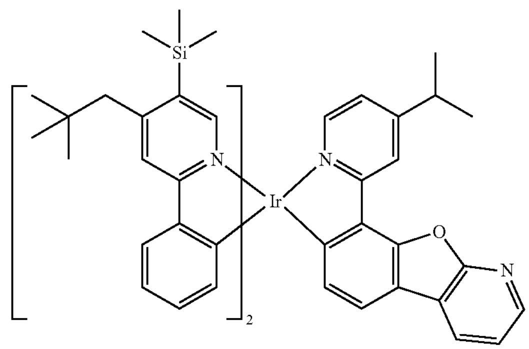
64
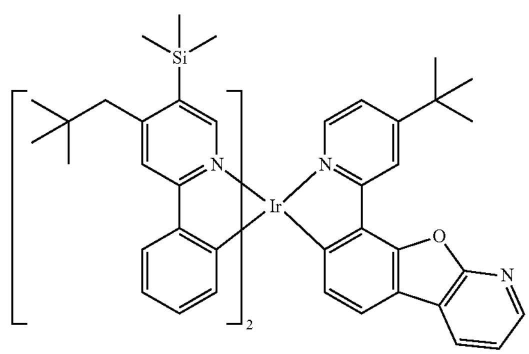
65
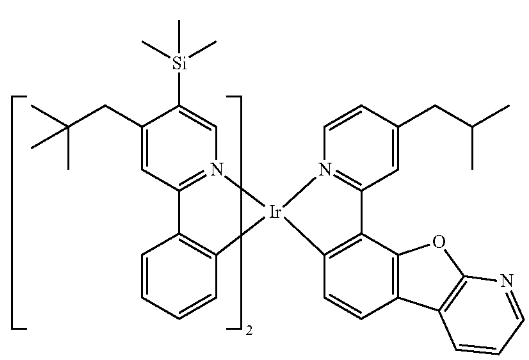

-continued
66
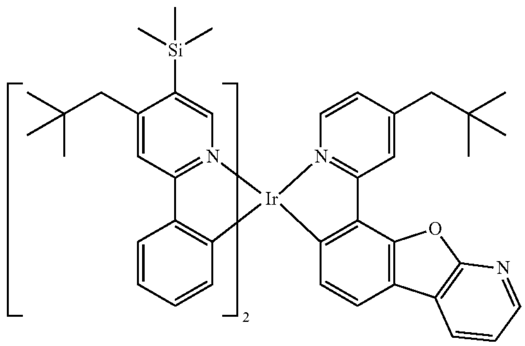
67
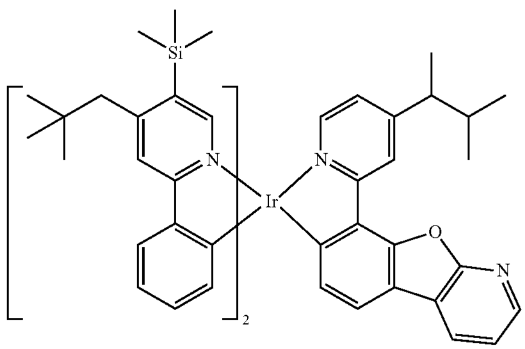
68
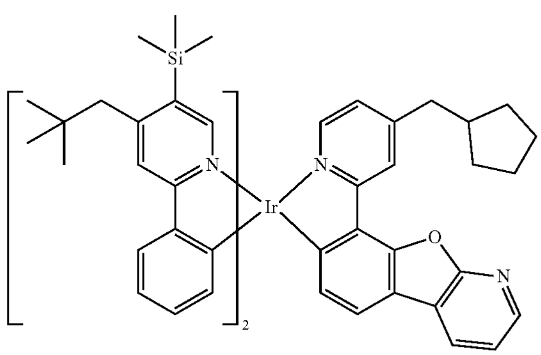
69
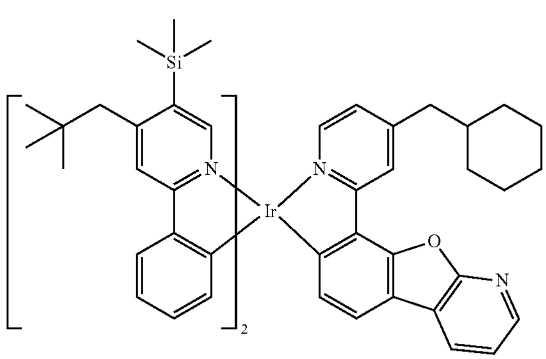
-continued
70
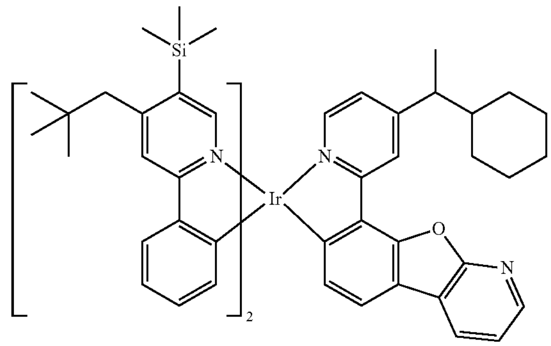
71
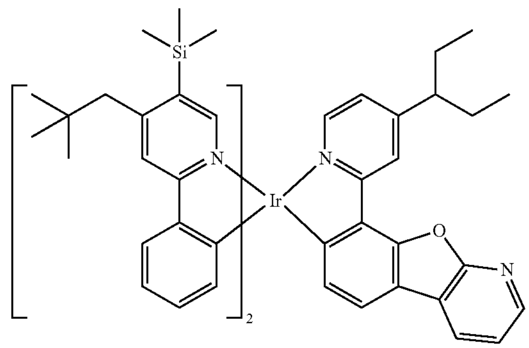
72
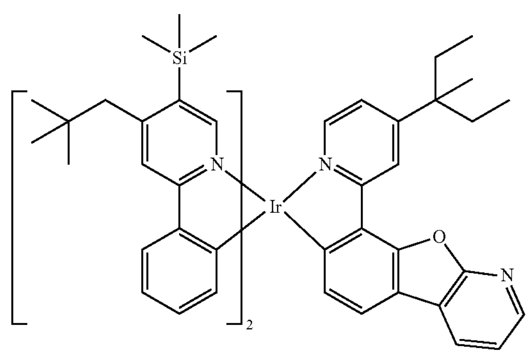
73
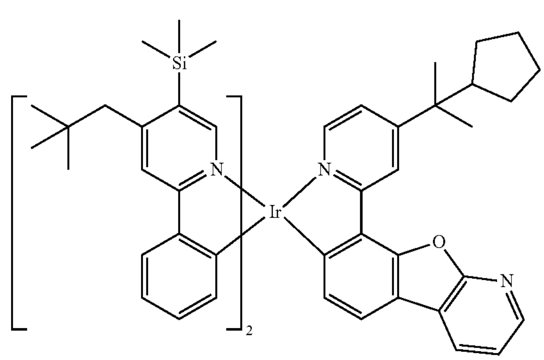

-continued
74
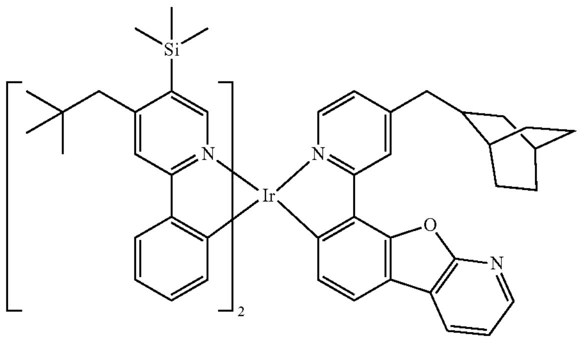
75
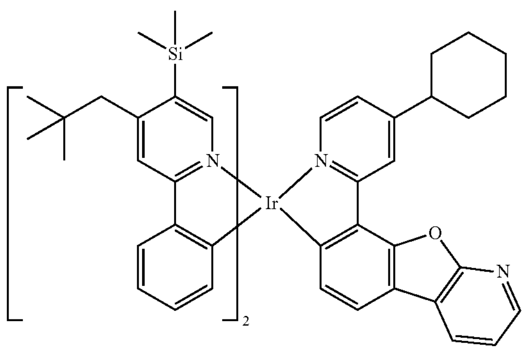
76
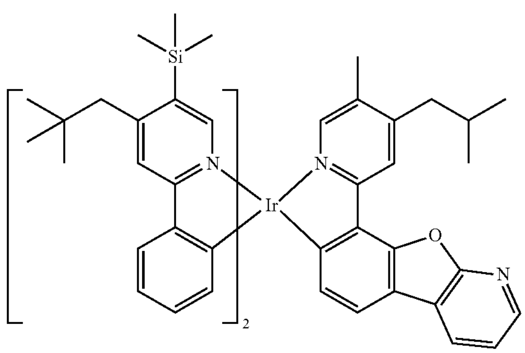
77
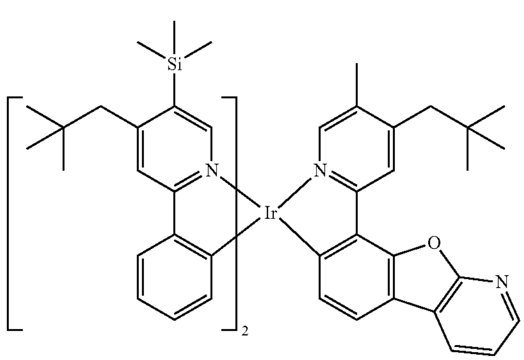
-continued
78
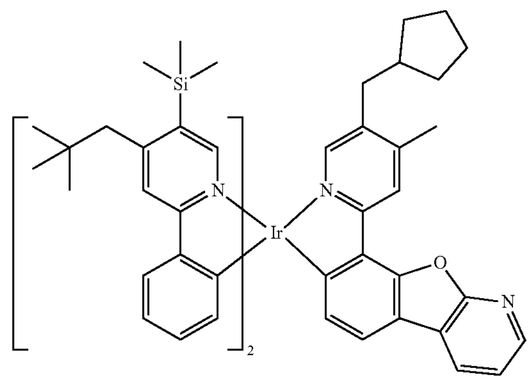
79
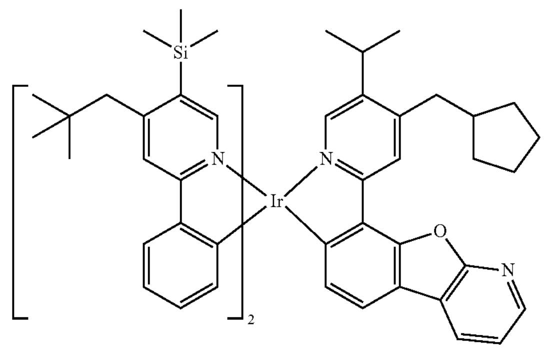
80
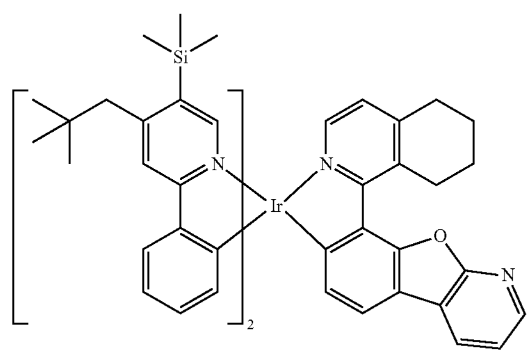
81
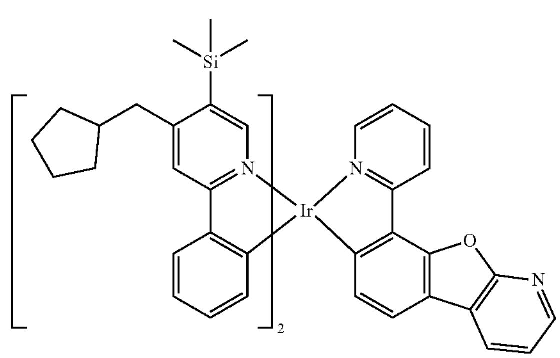

-continued
82
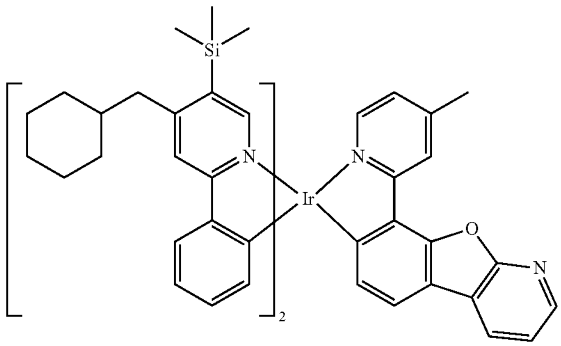
83
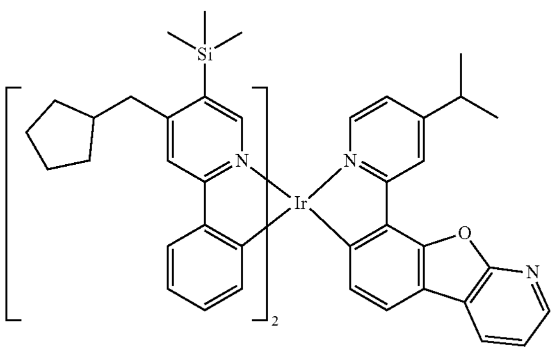
84
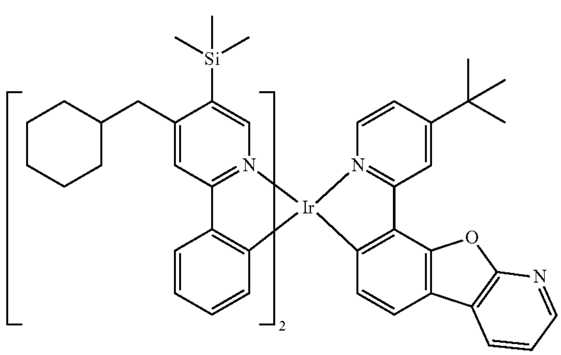
85
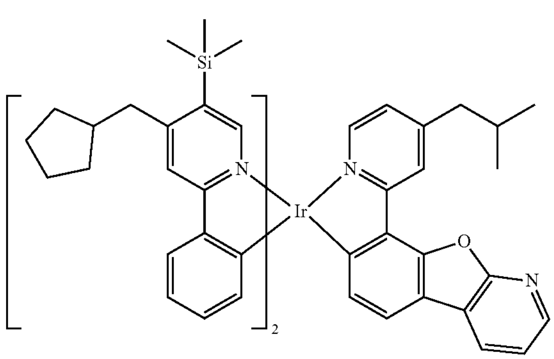
-continued
86
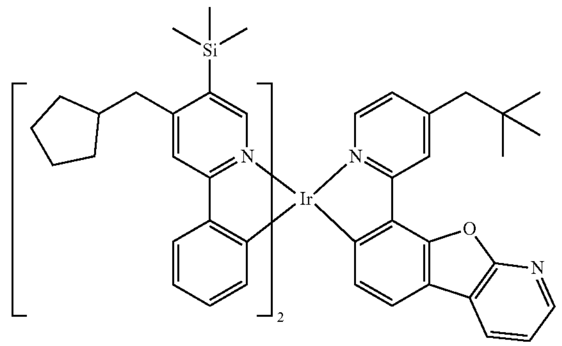
87
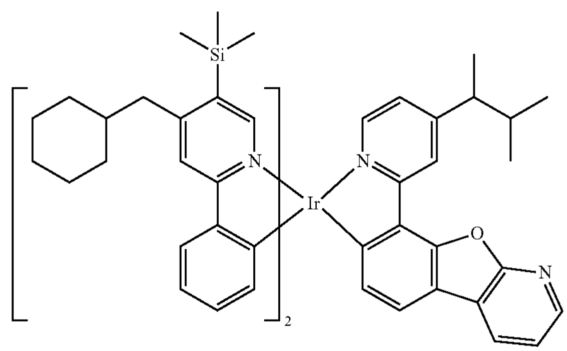
88
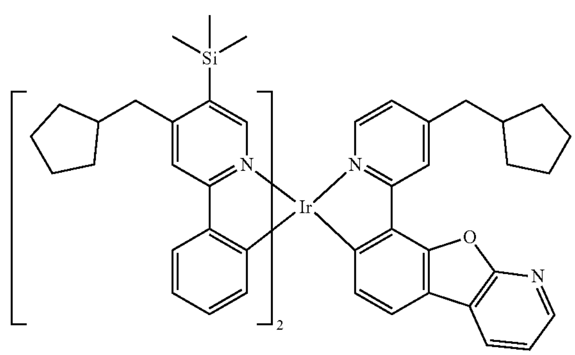
89
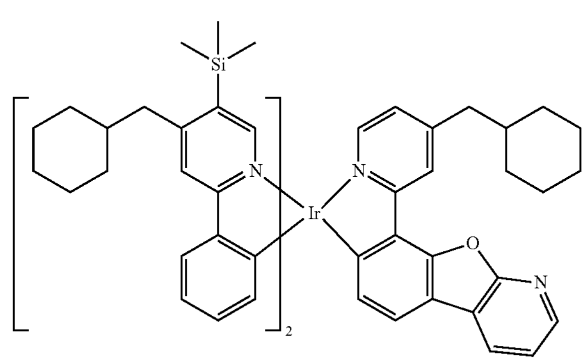

90
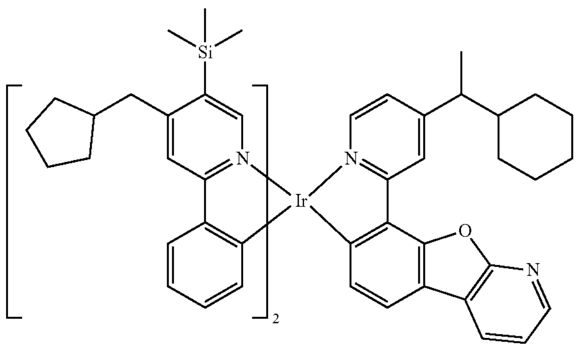
91
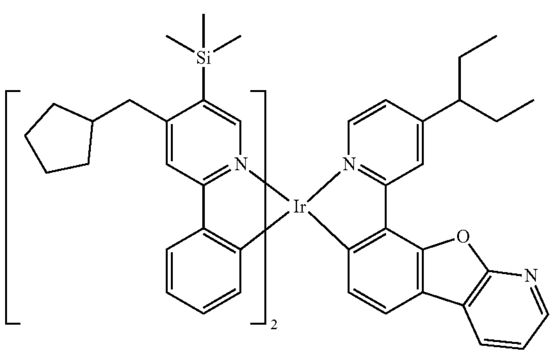
92
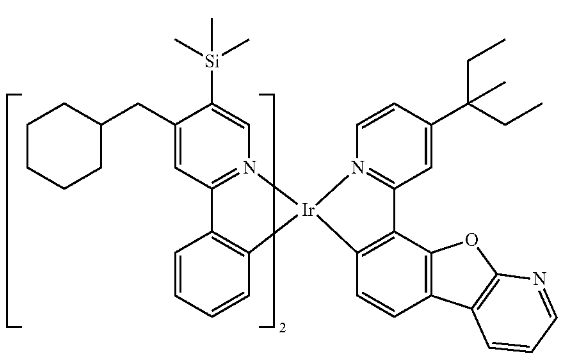
93
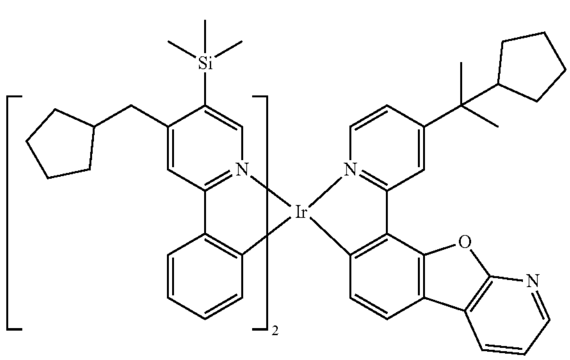
94
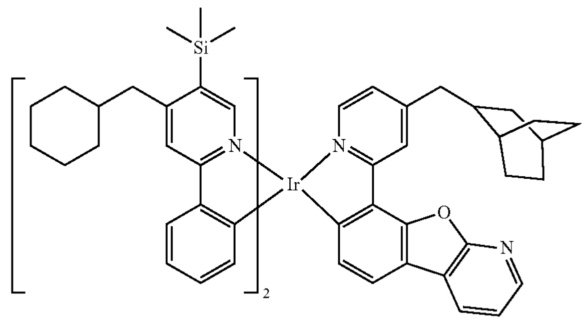
95
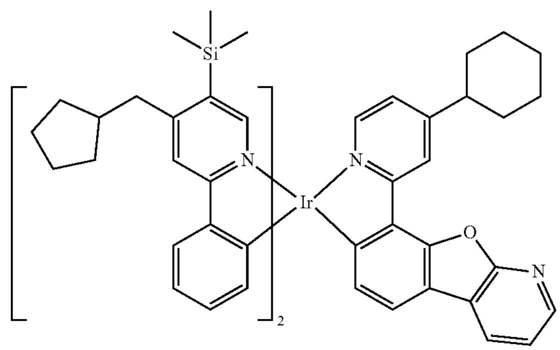
96
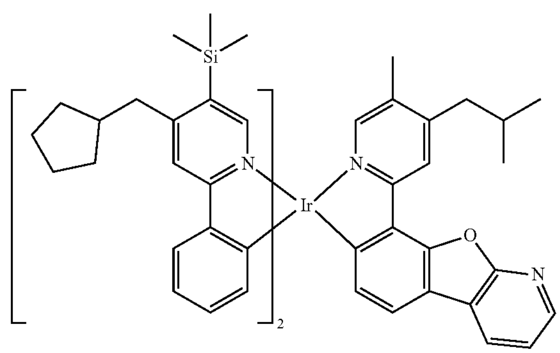
97
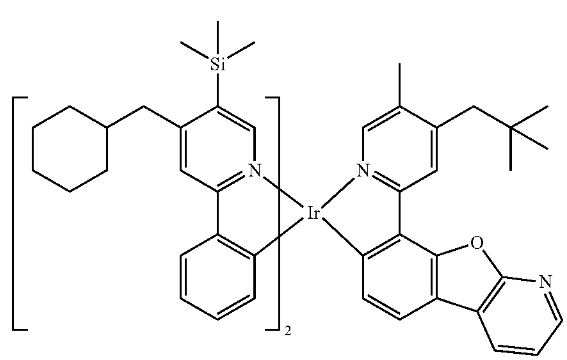

-continued
98
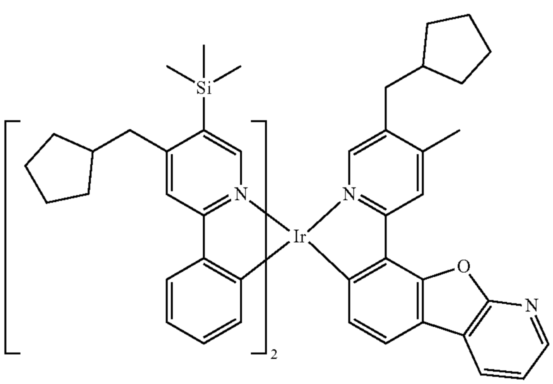
99
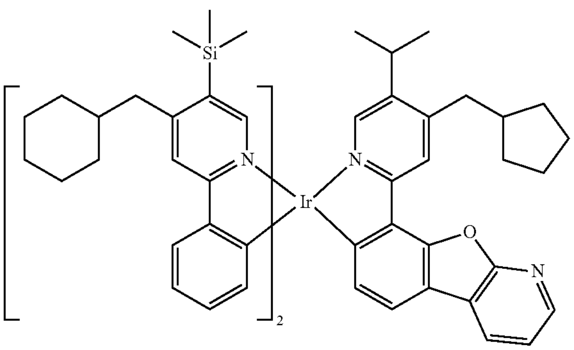
100
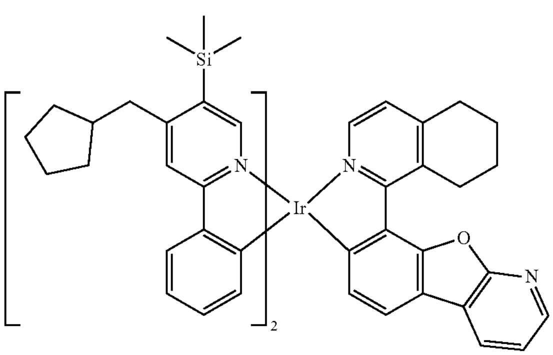
101
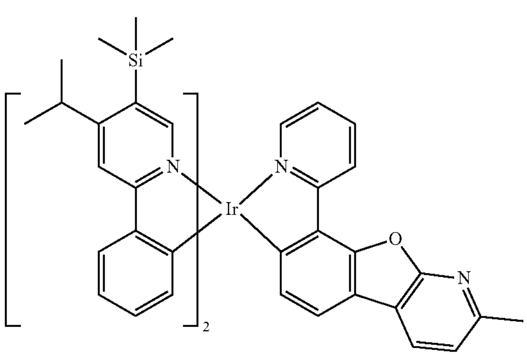
-continued
102
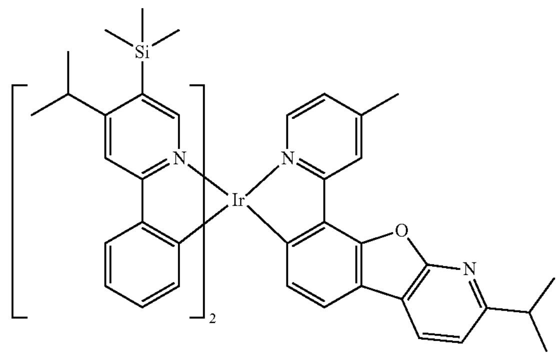
103
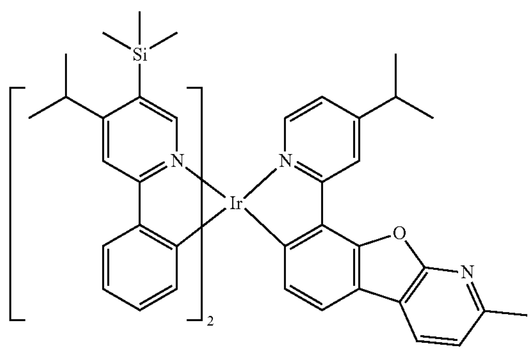
104
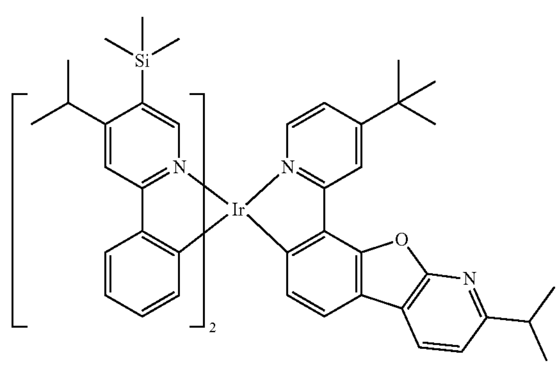
105
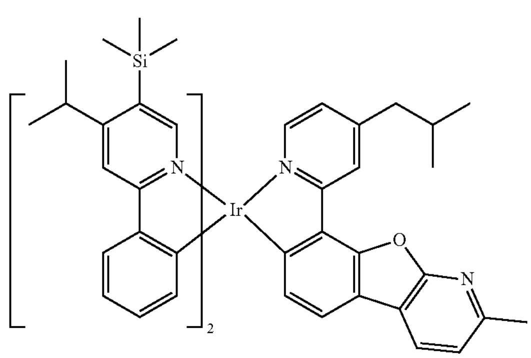

-continued
106
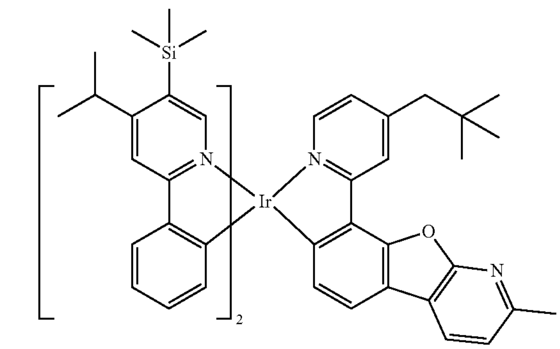
107
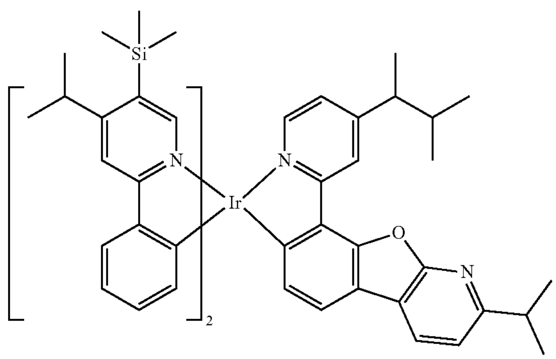
108
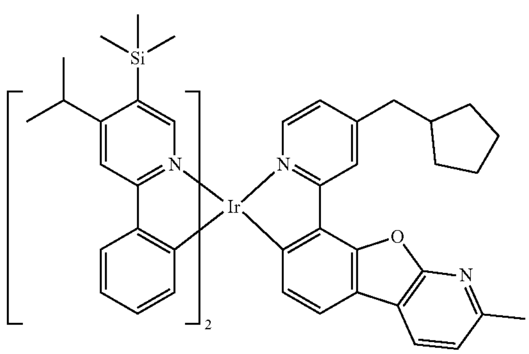
109
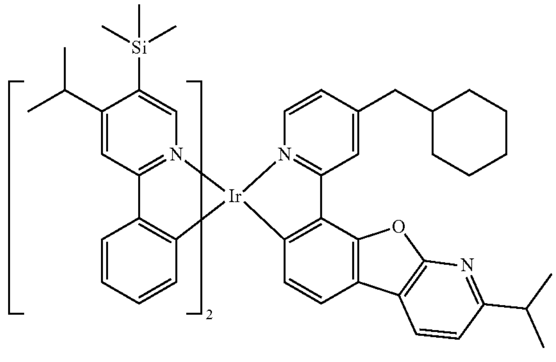
-continued
110
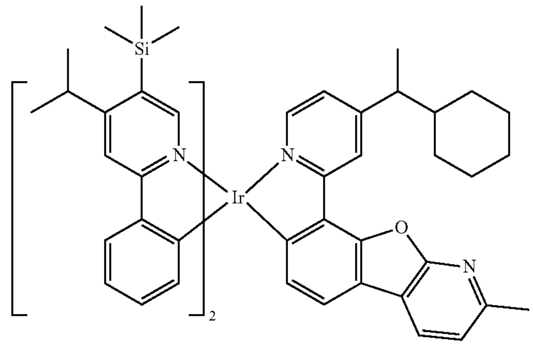
111
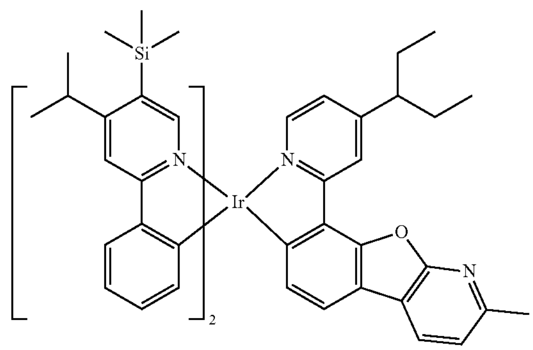
112
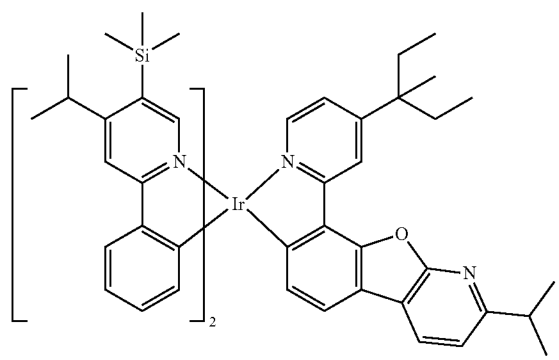
113
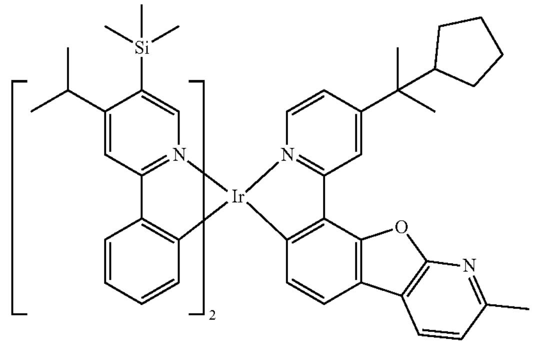

114
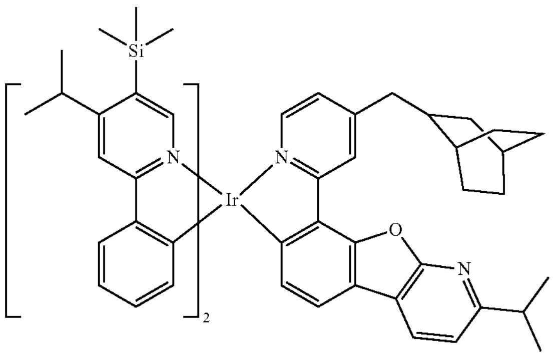
115
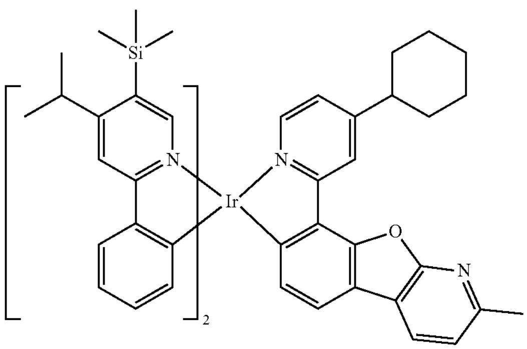
116
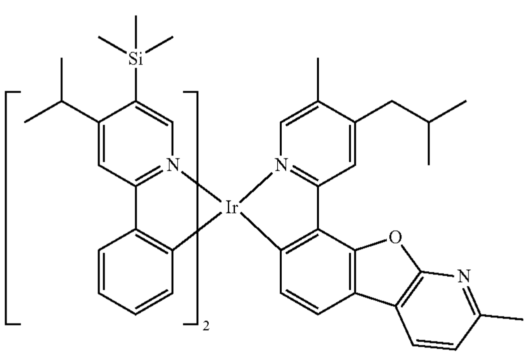
117
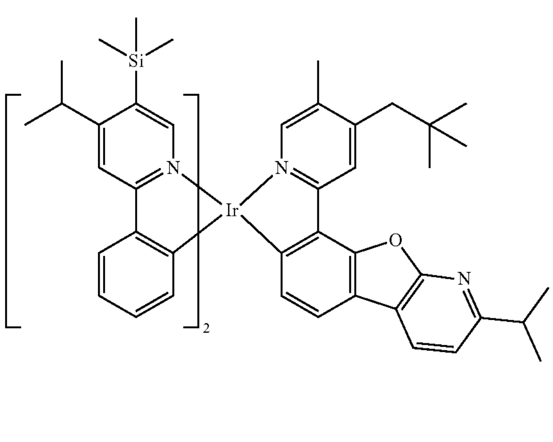
118
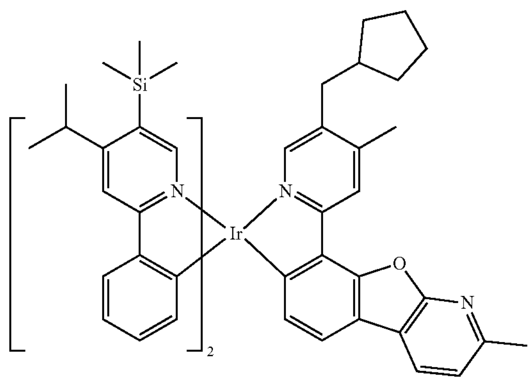
119
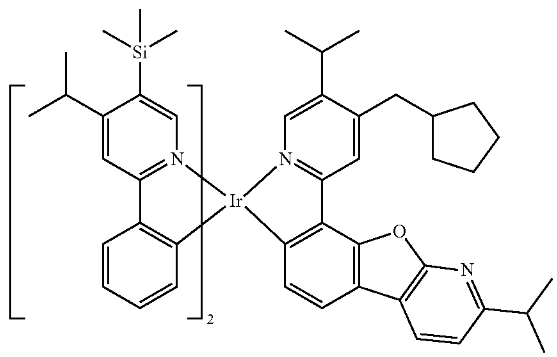
120
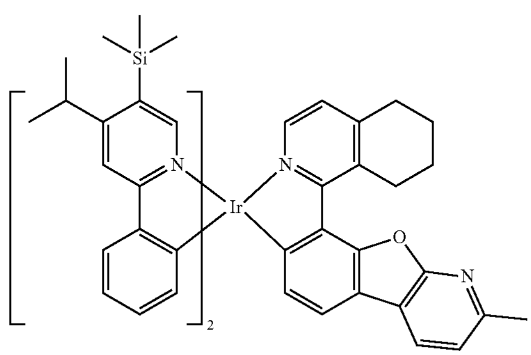
121
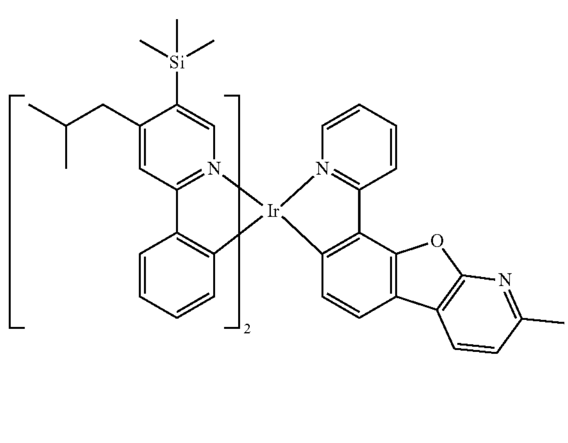

-continued
122
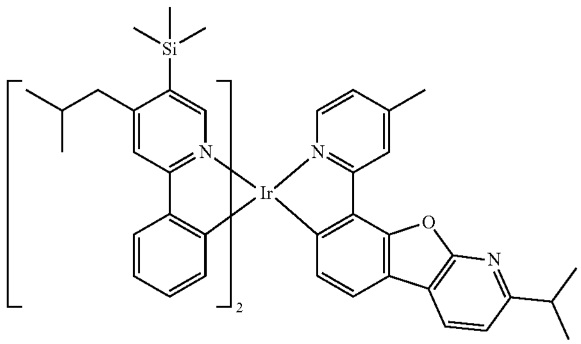
123
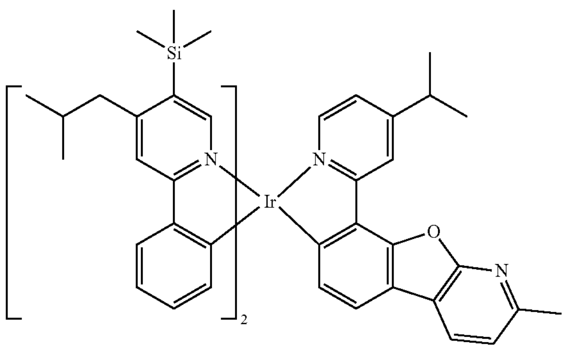
124
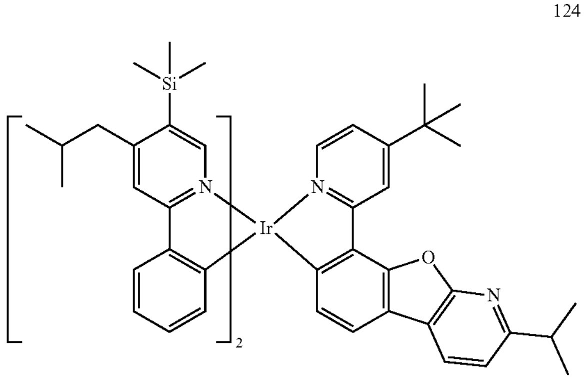
125
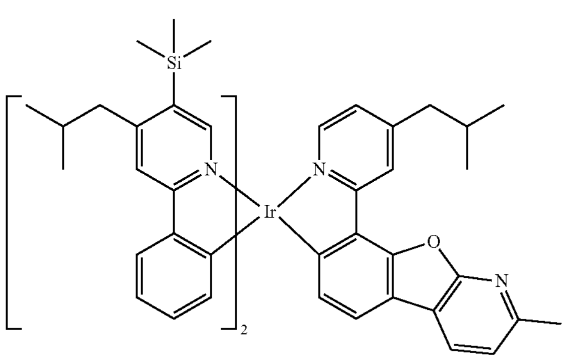
-continued
126
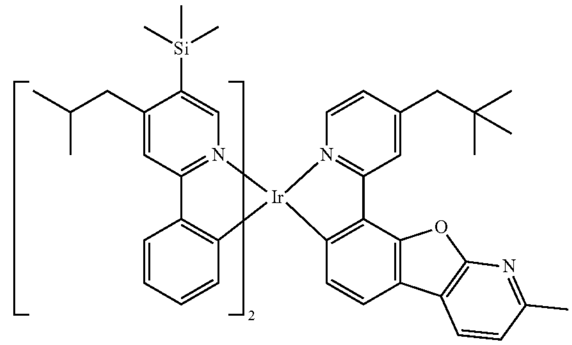
127
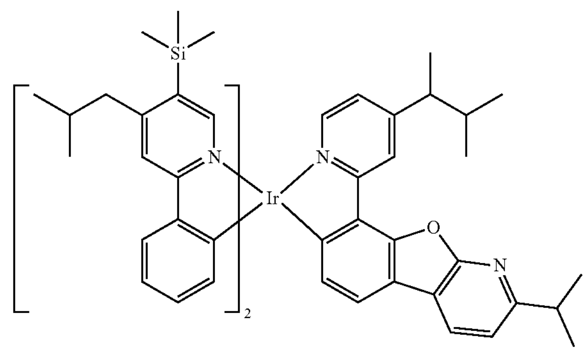
128
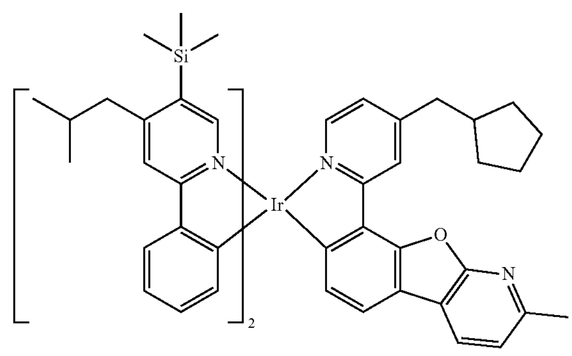
129
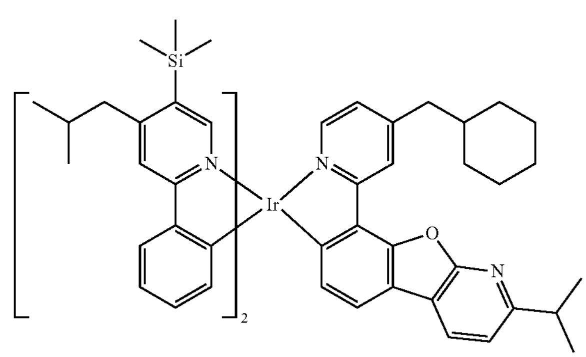

-continued
130
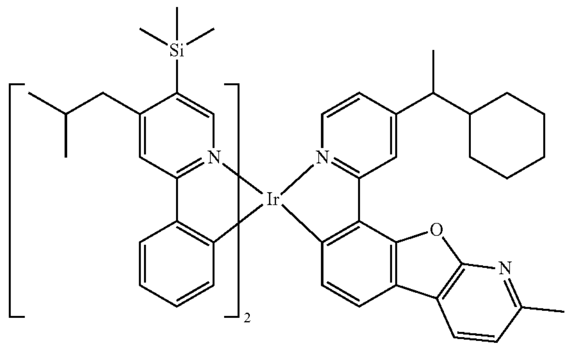
131
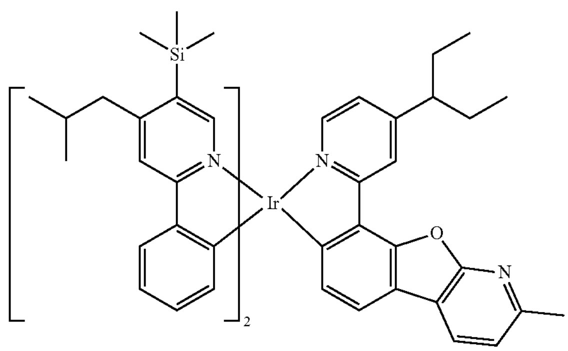
132
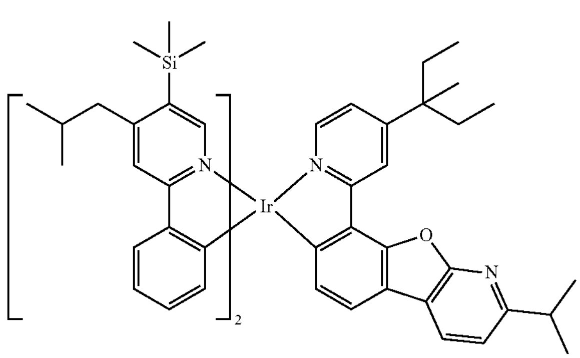
133
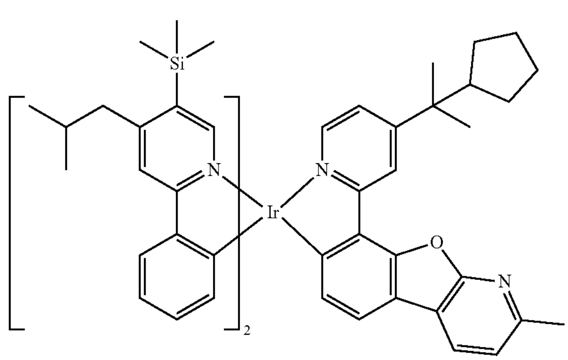
-continued
134
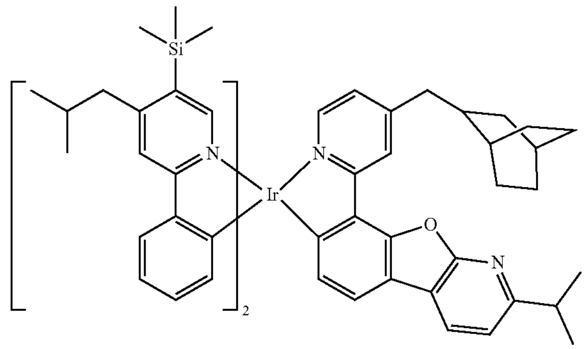
135
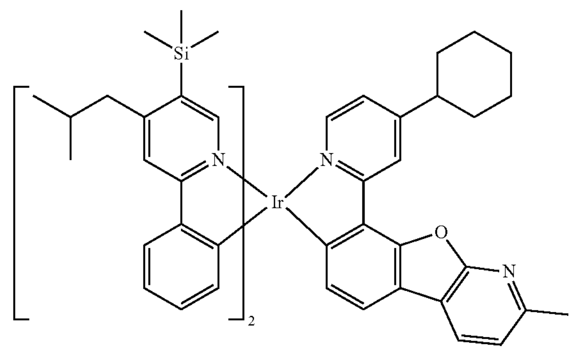
136
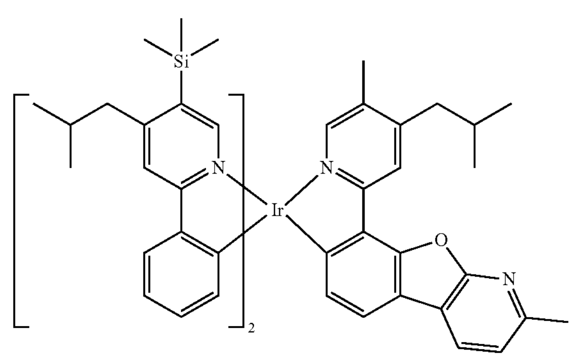
137
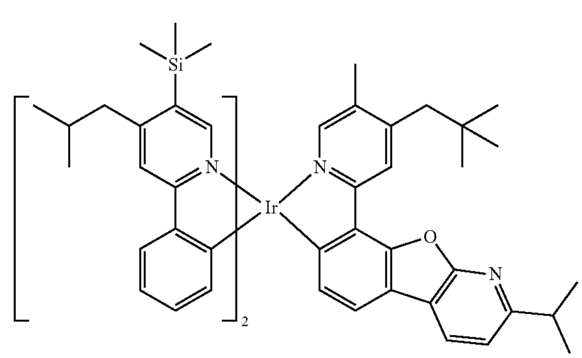

-continued
138
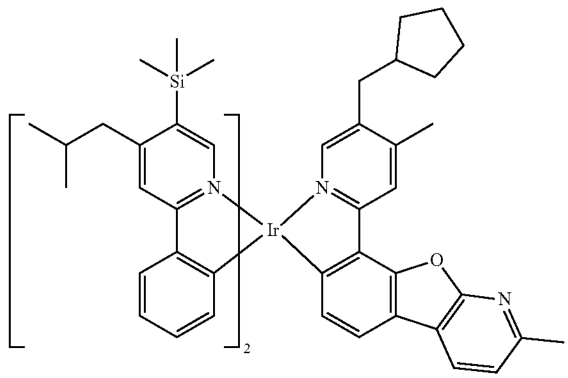
139
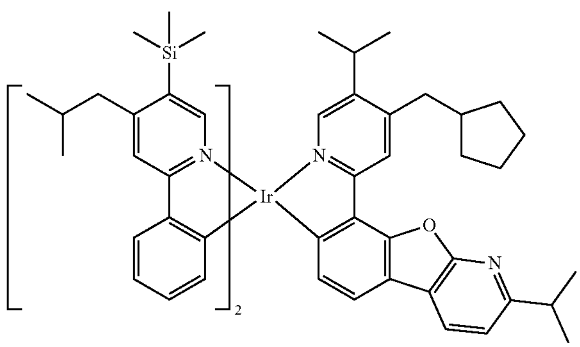
140
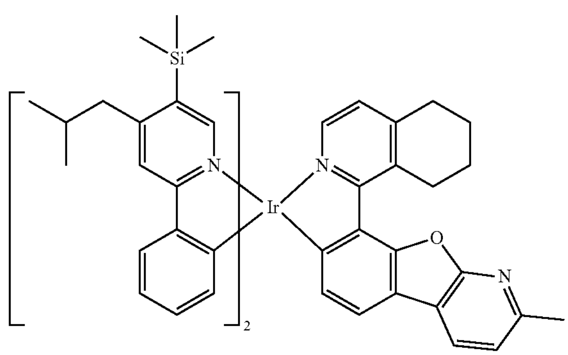
141
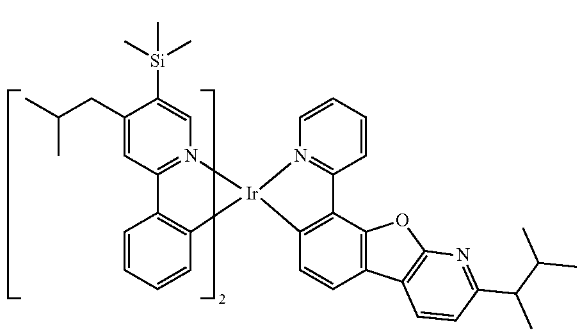
-continued
142
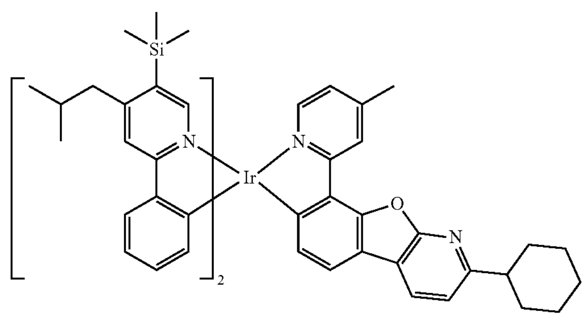
143
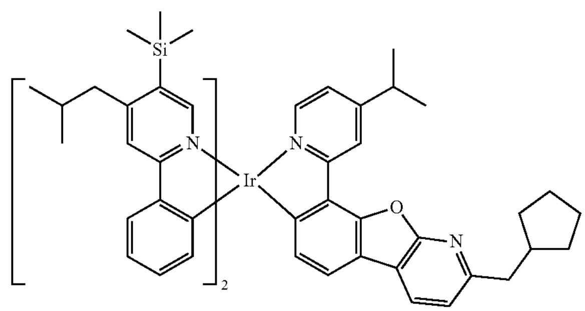
144
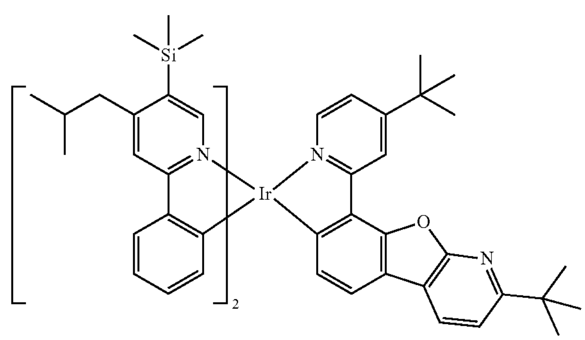
145
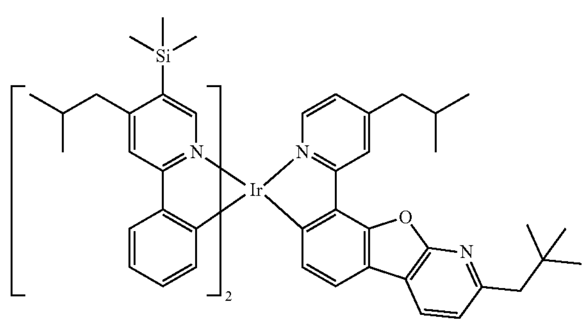

-continued
146
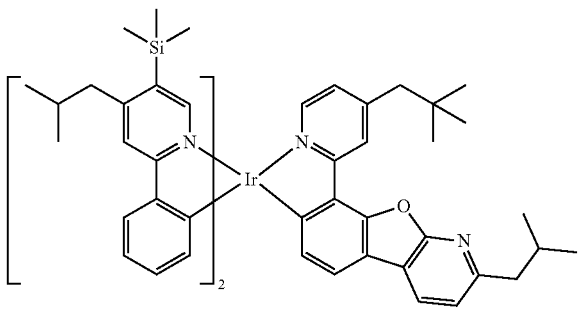
147
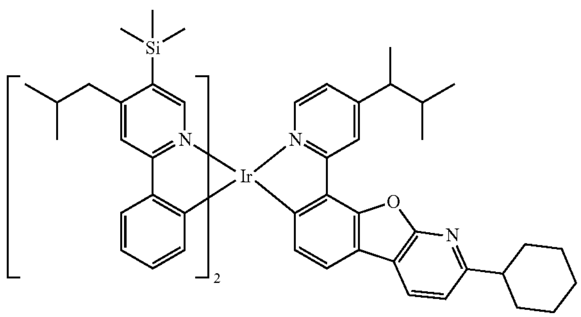
148
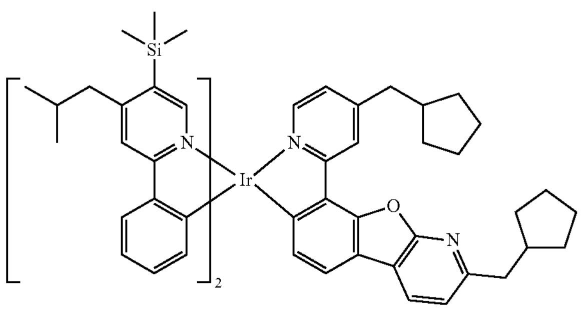
149
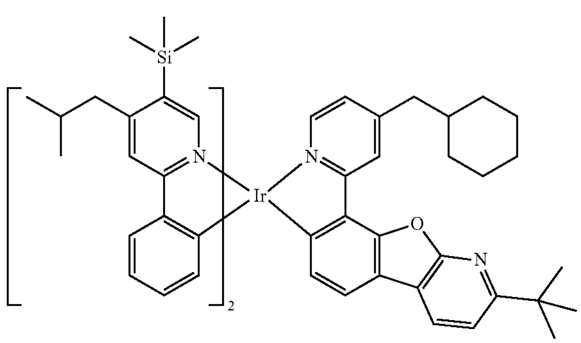
-continued
150
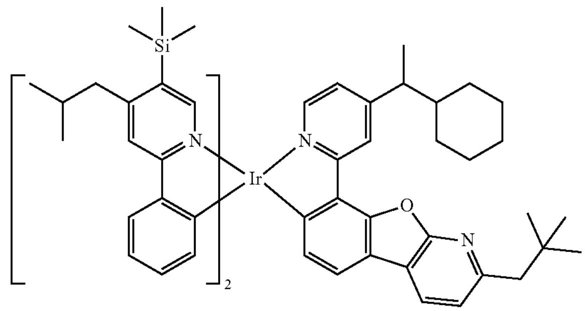
151
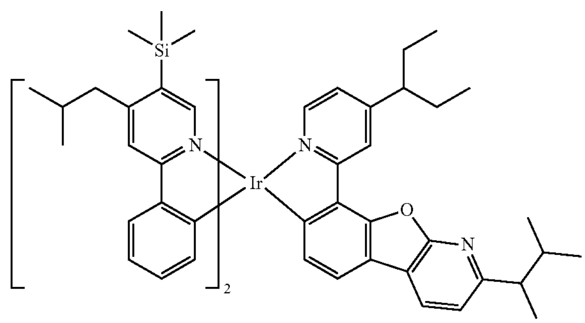
152
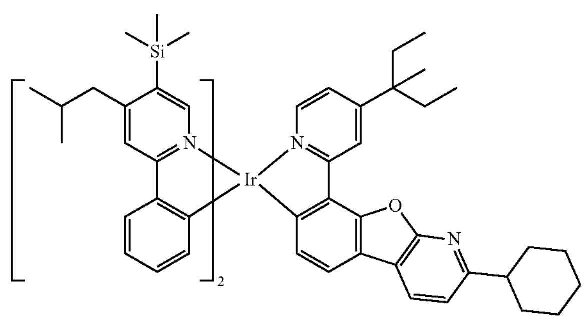
153
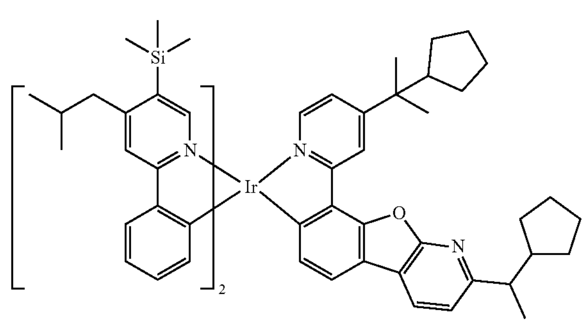

-continued
154
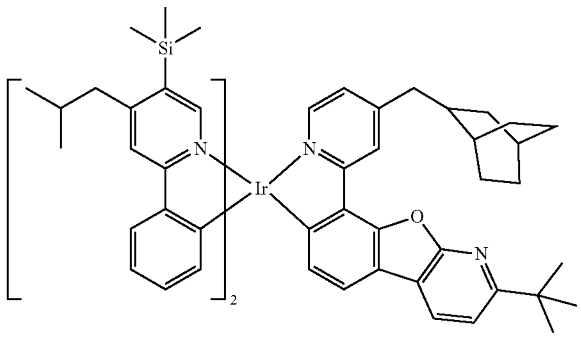
155
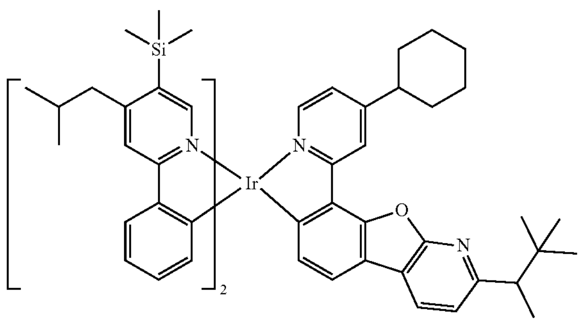
156
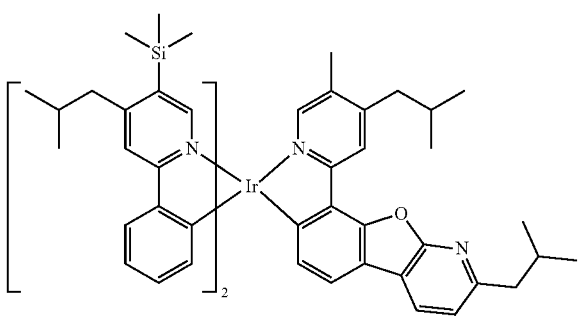
157
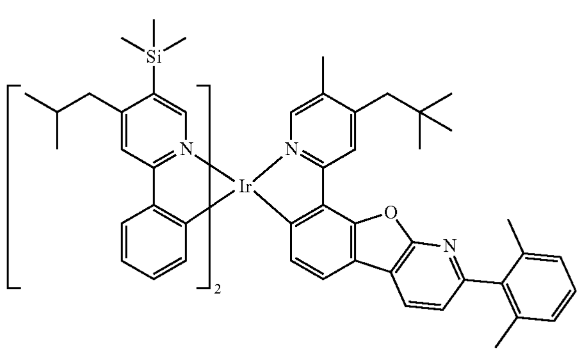
-continued
158
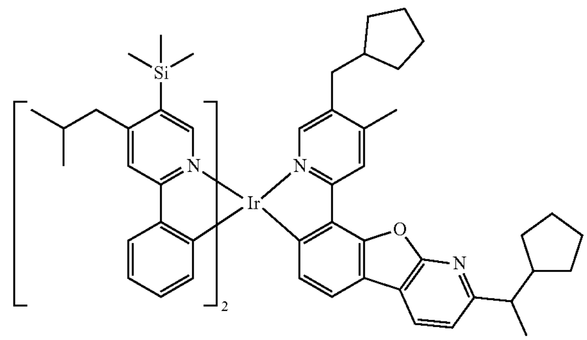
159
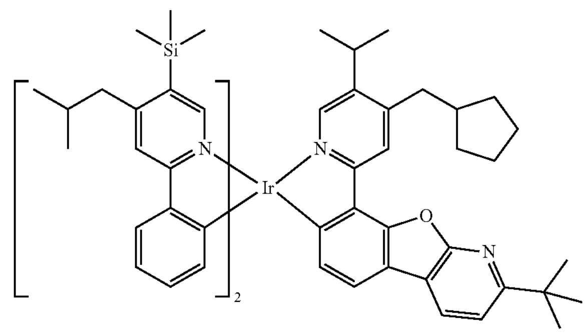
160
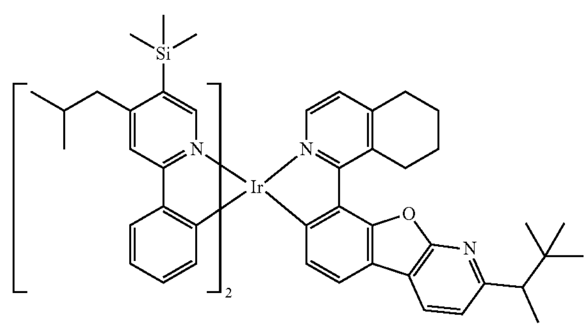
161
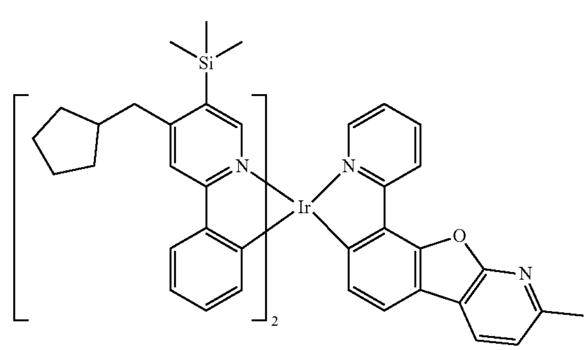

162
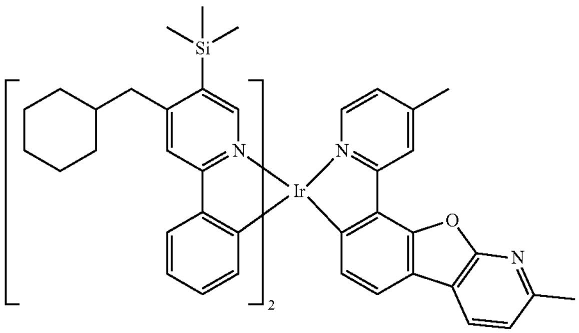
163
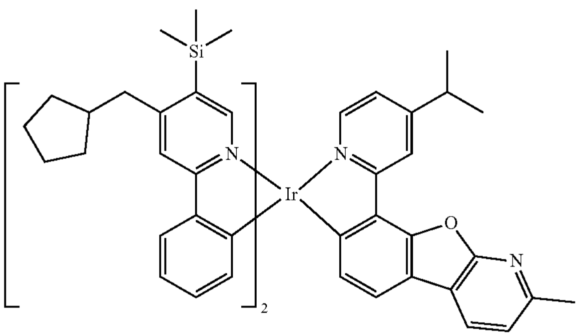
164
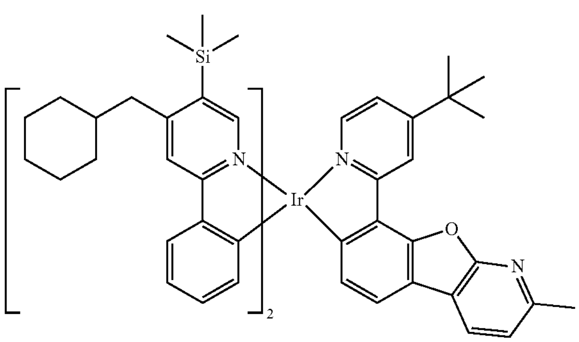
165
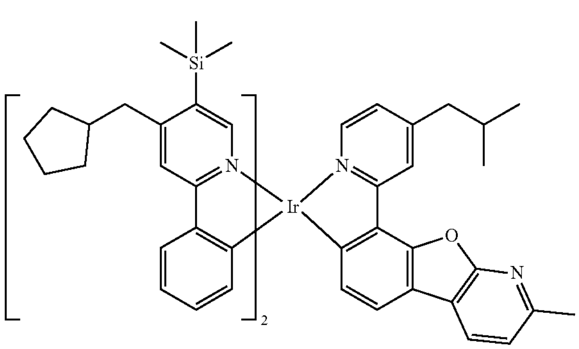
166
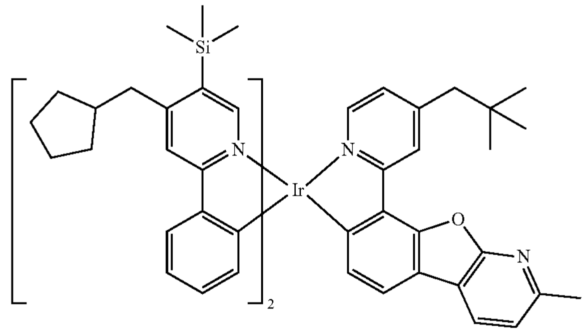
167
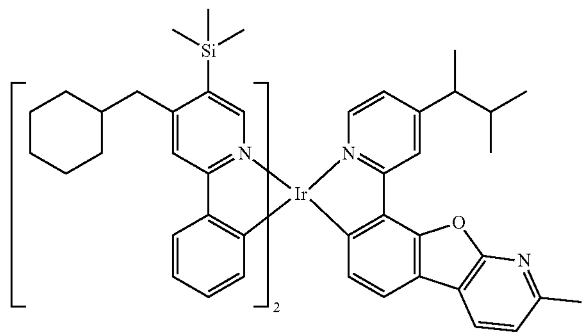
168
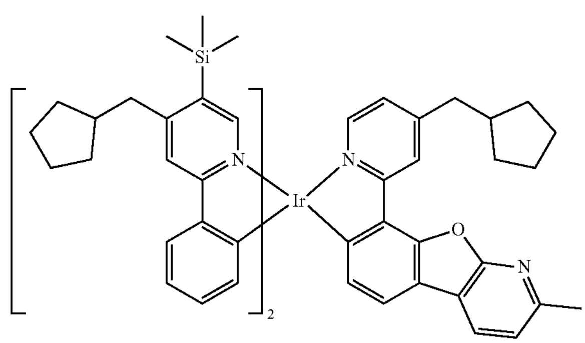
169
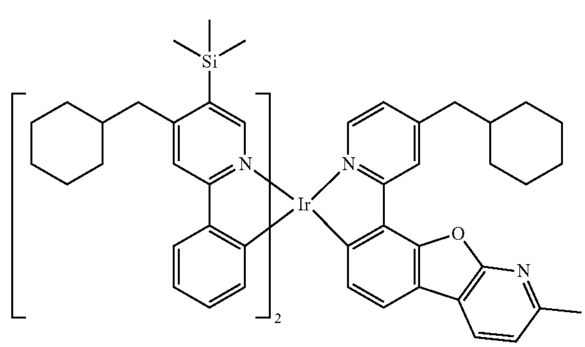

-continued
170
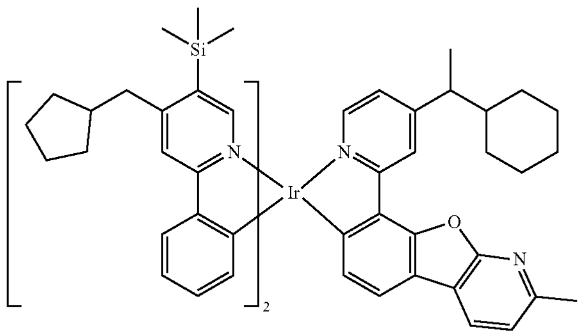
171
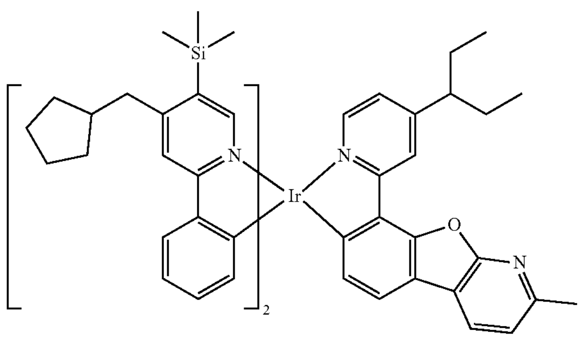
172
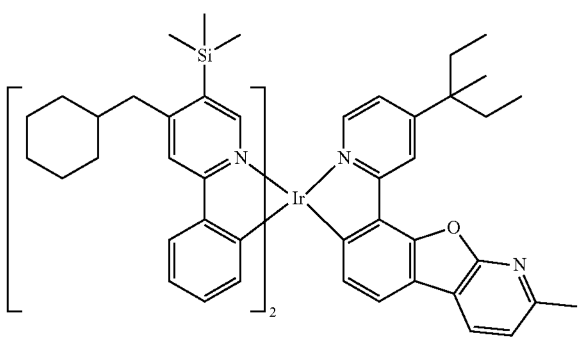
173
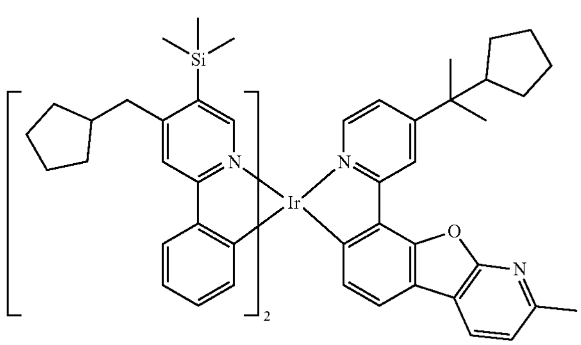
-continued
174
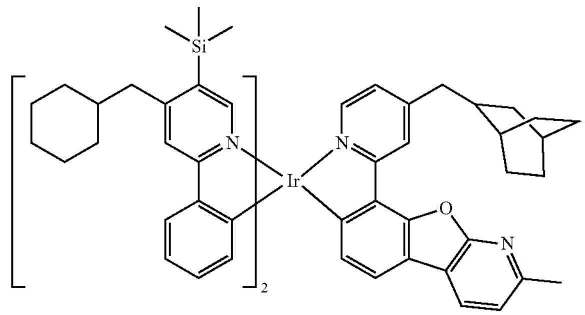
175
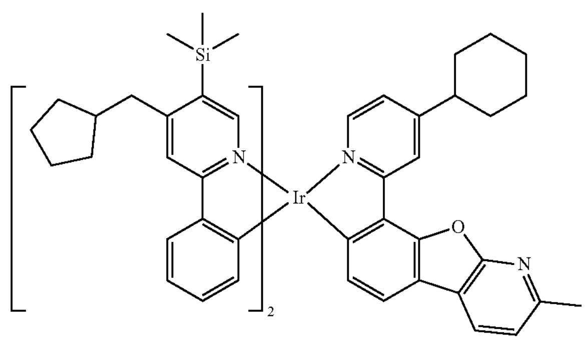
176
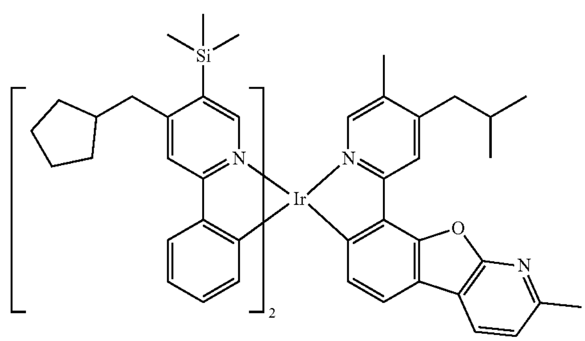
177
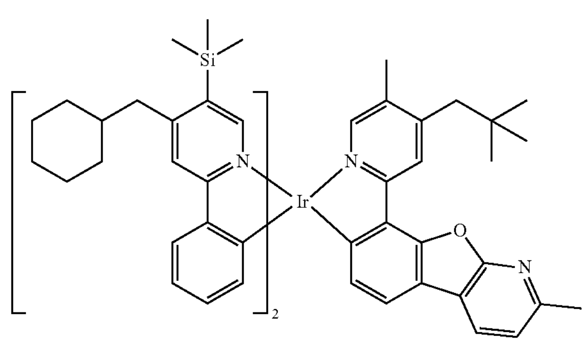

-continued
178
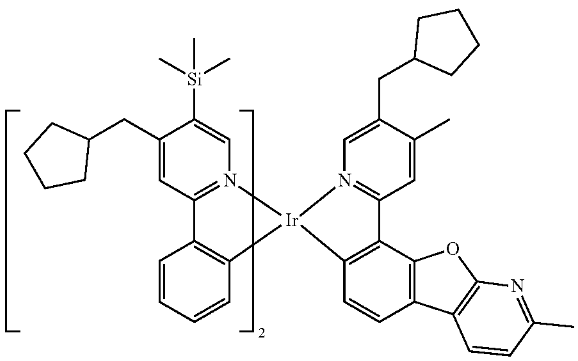
179
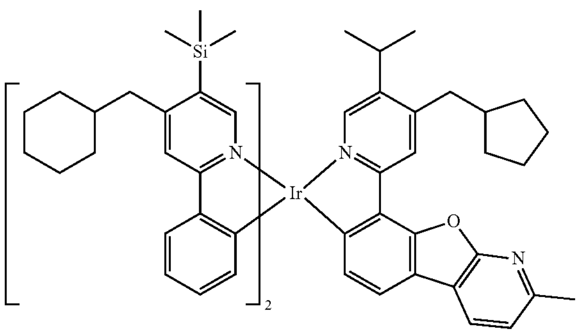
180
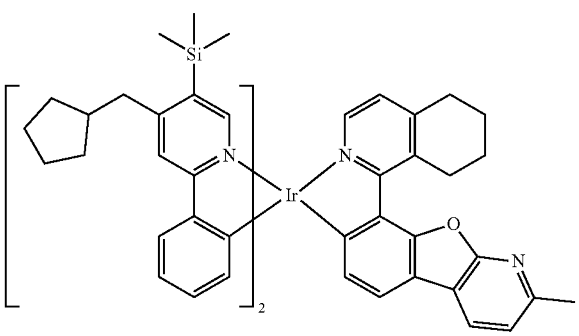
181
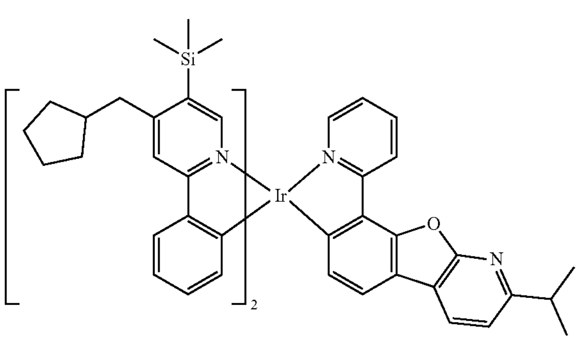
-continued
182
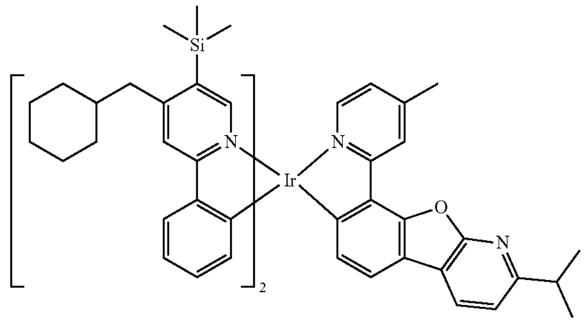
183
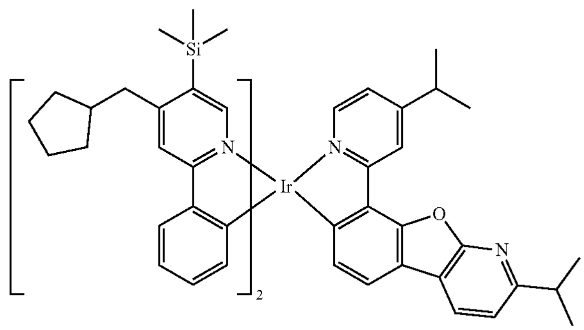
184
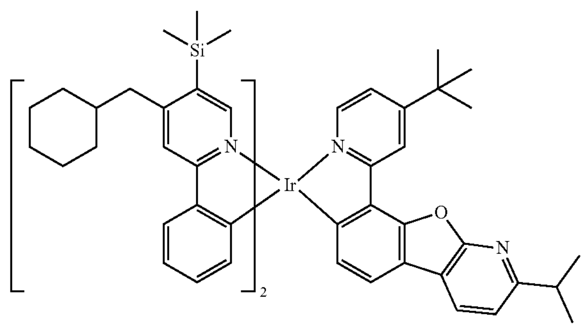
185
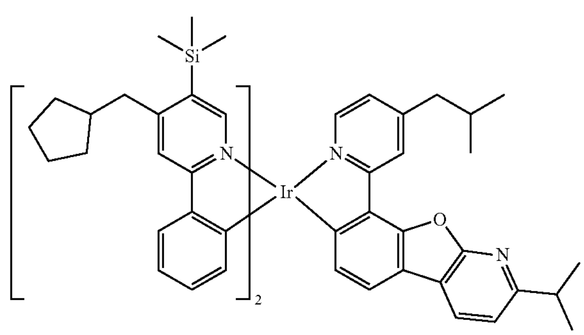

186
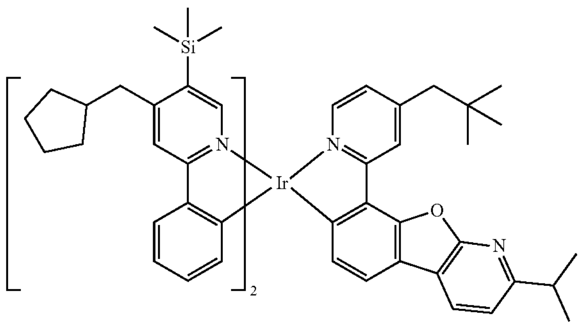
187
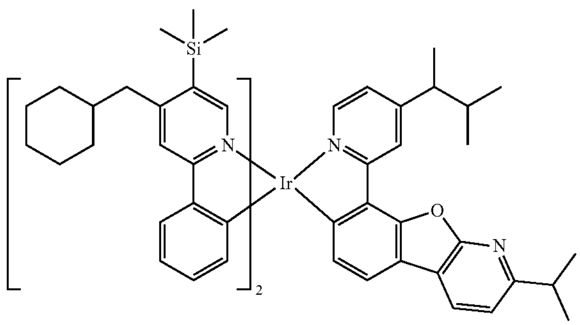
188
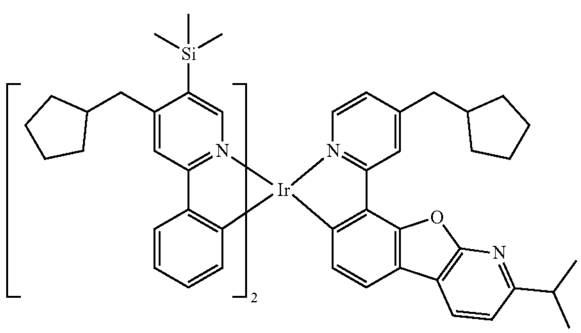
189
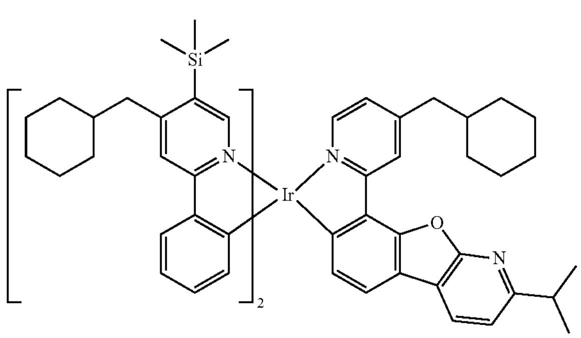
190
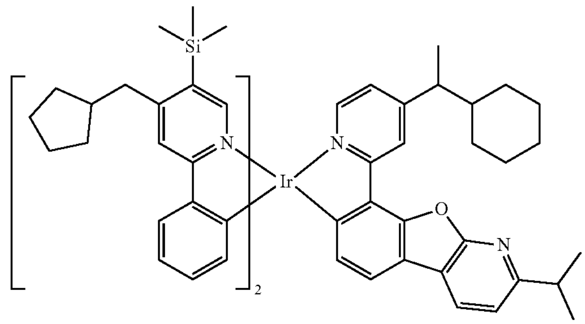
191
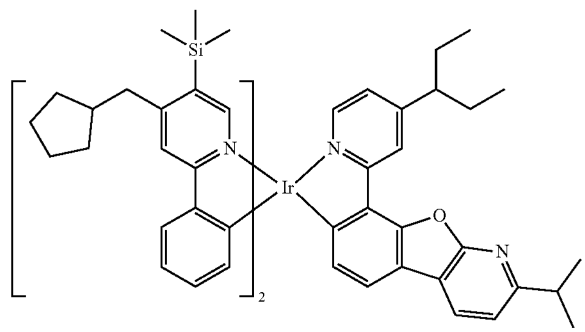
192
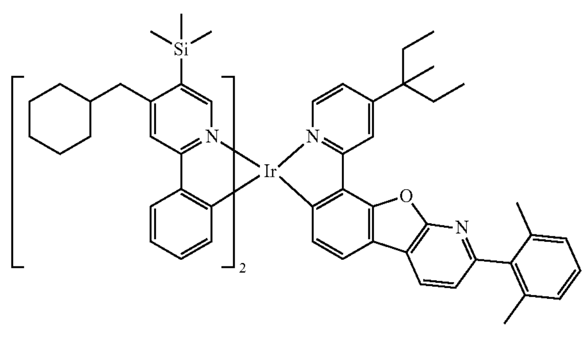
193
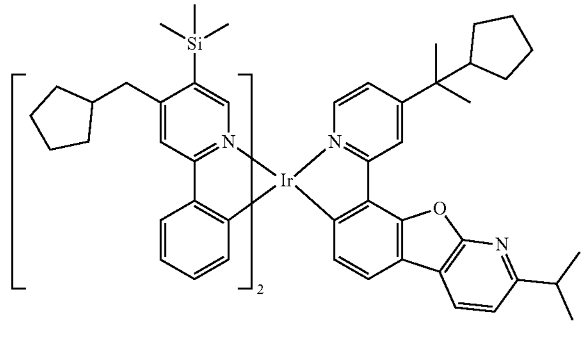

-continued
194
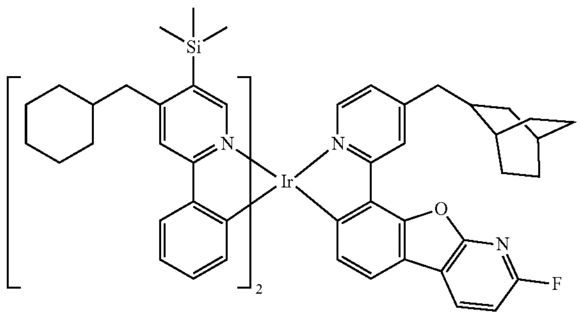
195
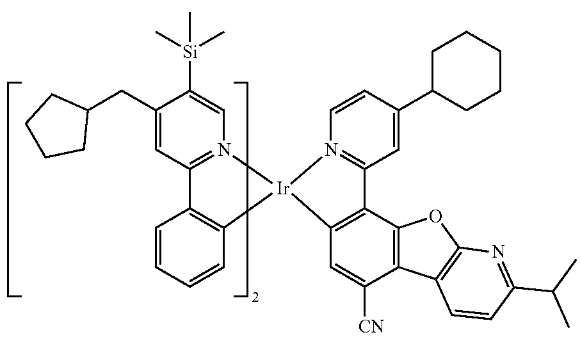
196
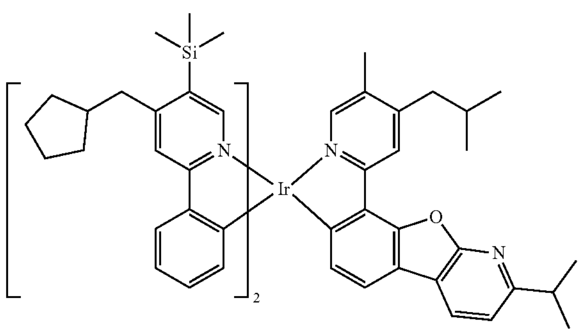
197
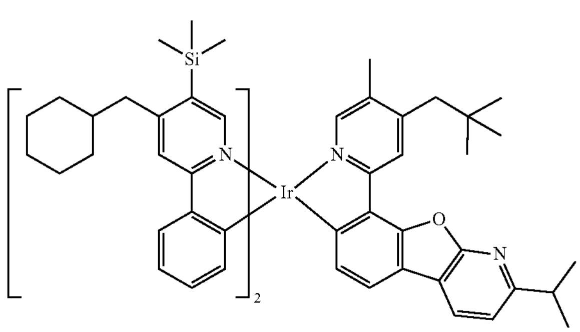
-continued
198
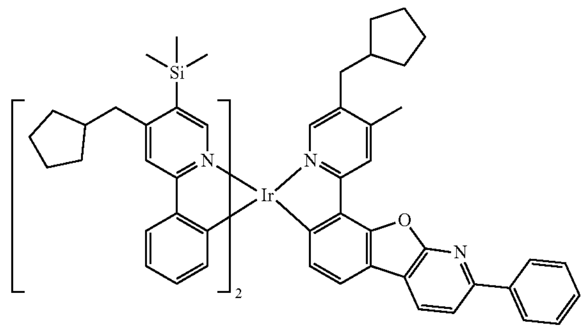
199
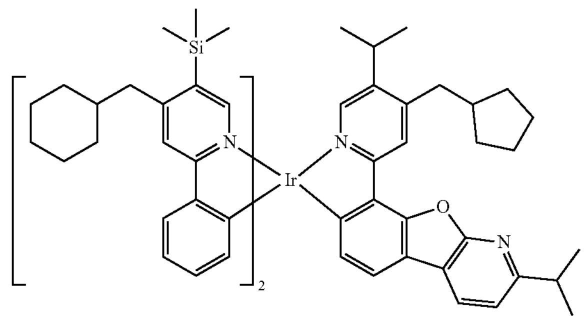
200
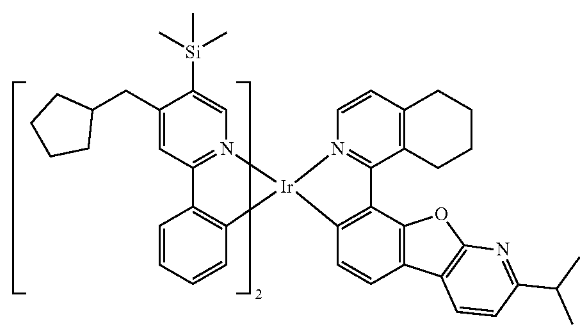
201
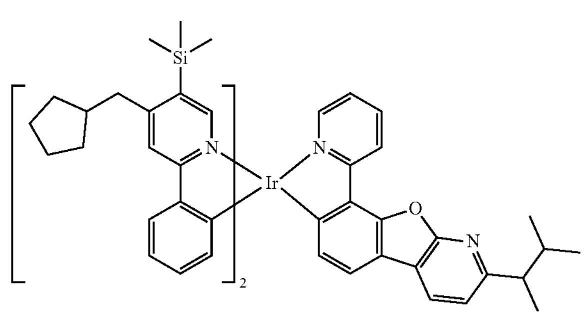

-continued
202
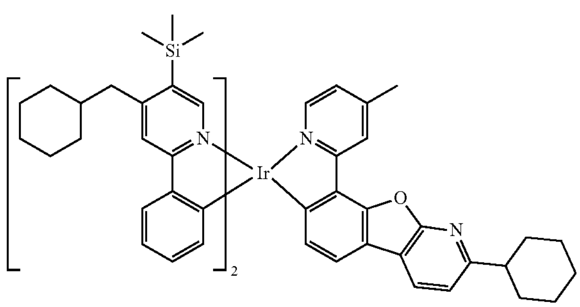
203
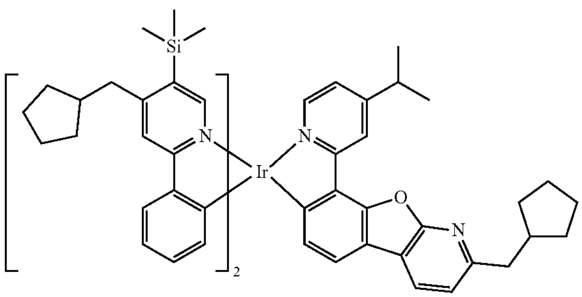
204
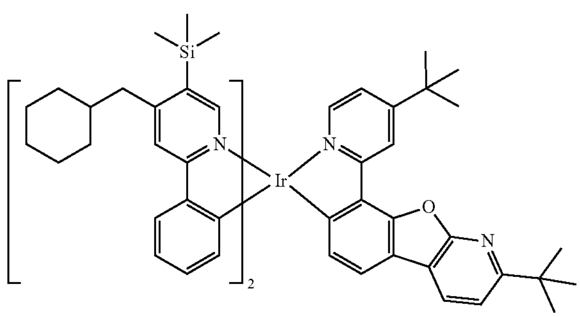
205
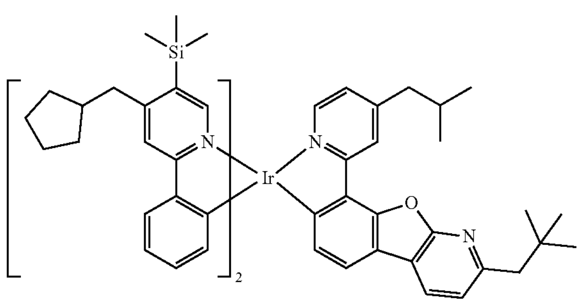
206
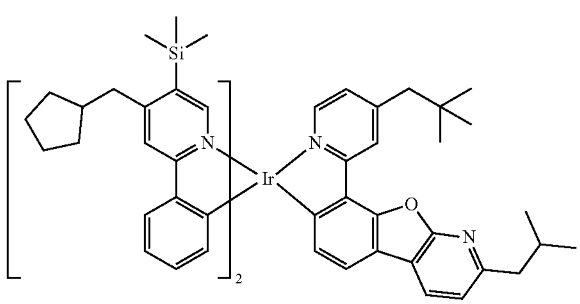
-continued
207
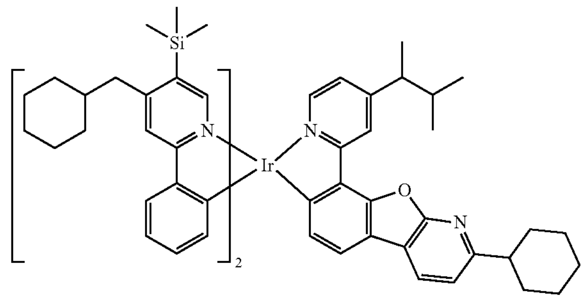
208
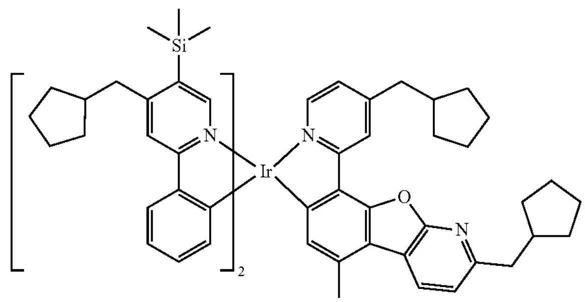
209
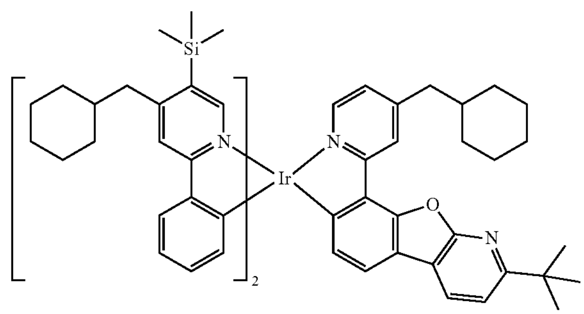
210
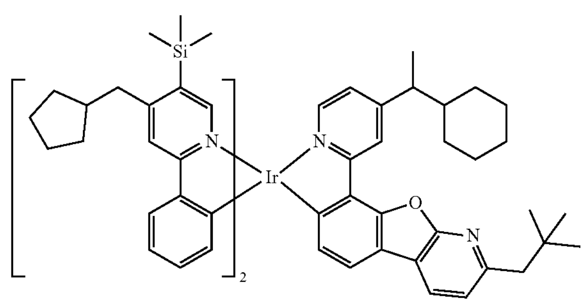
211
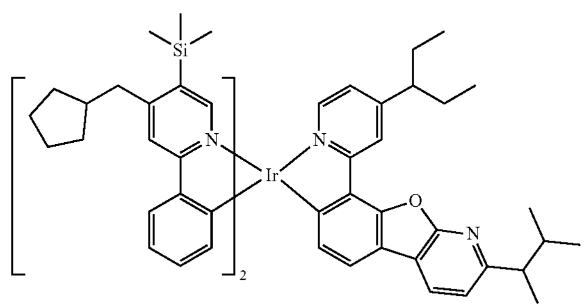

212
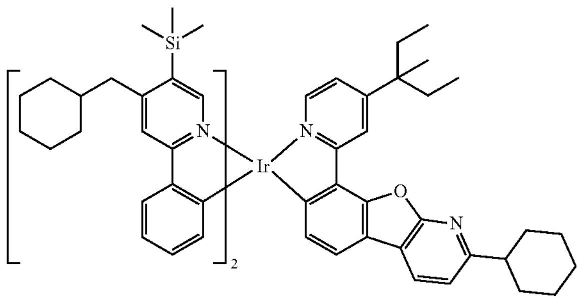
213
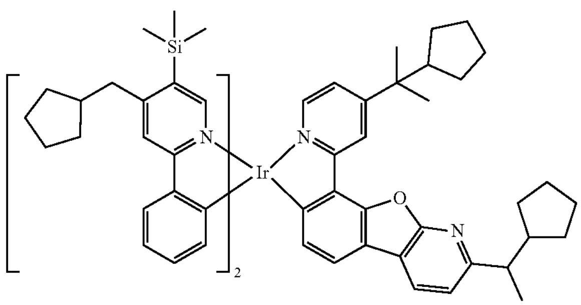
214
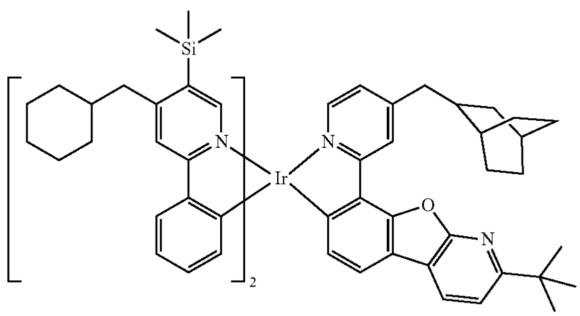
215
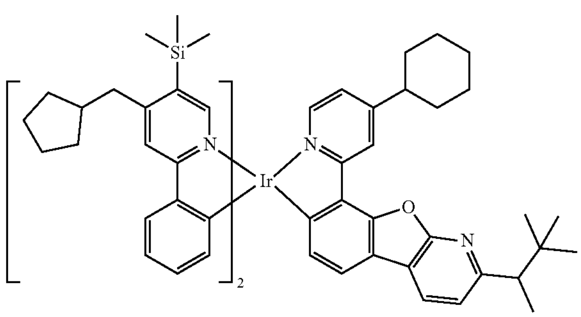
216
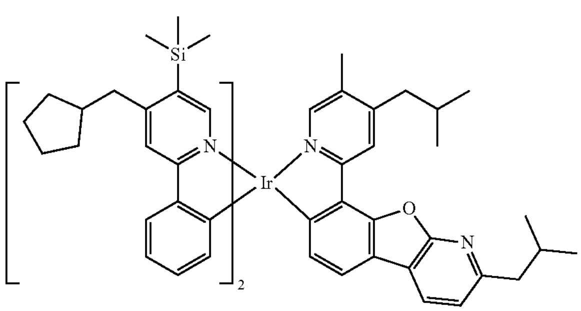
217
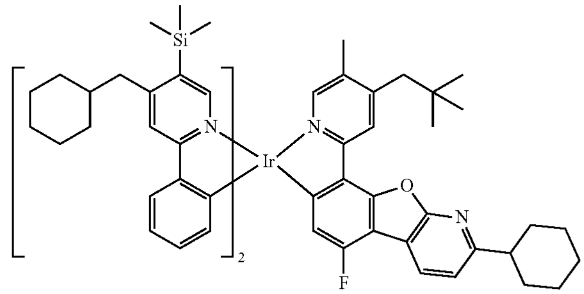
218
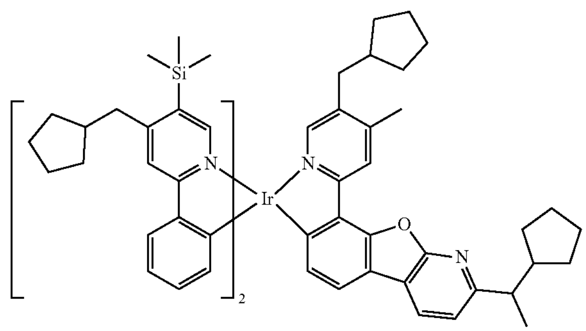
219
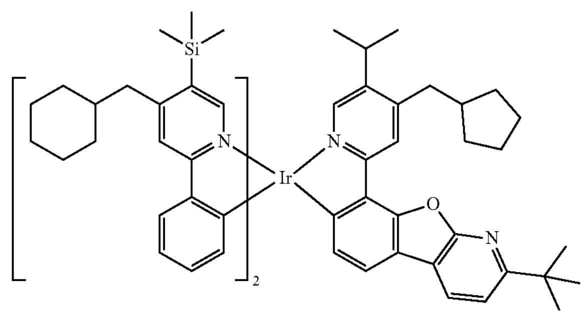
220
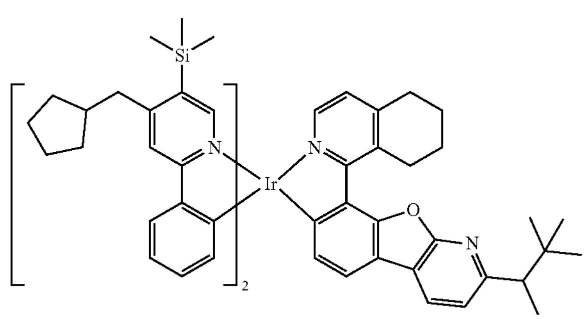

-continued
221
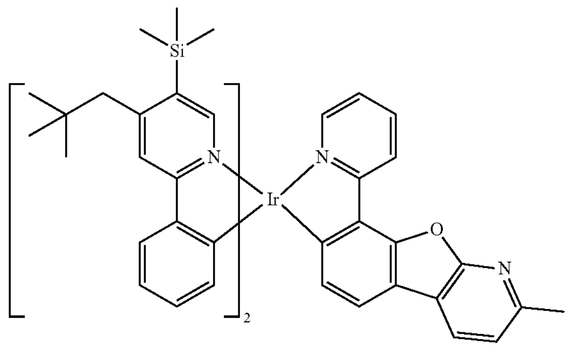
222
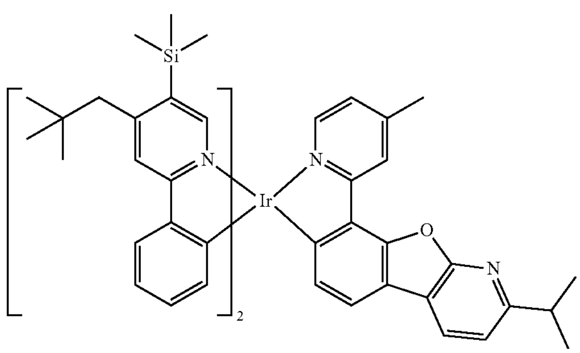
223
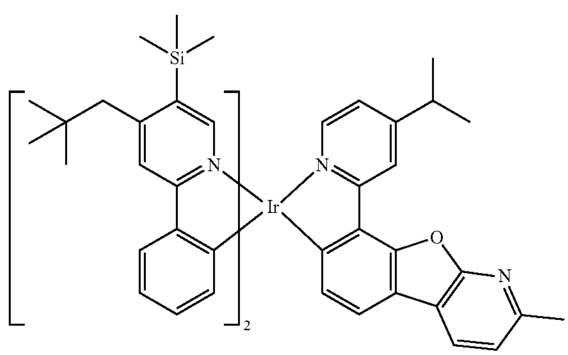
224
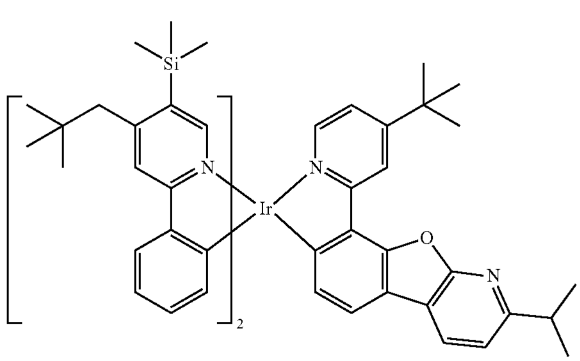
-continued
225
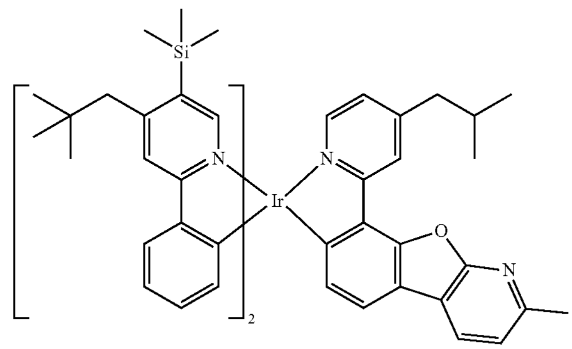
226
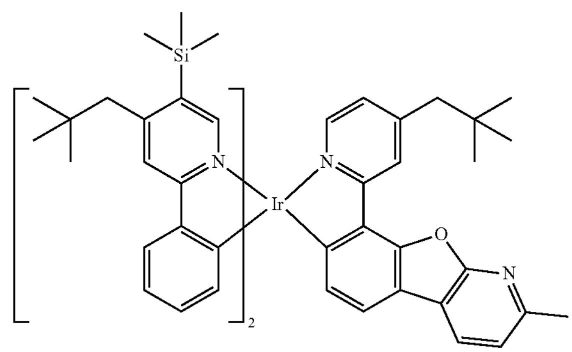
227
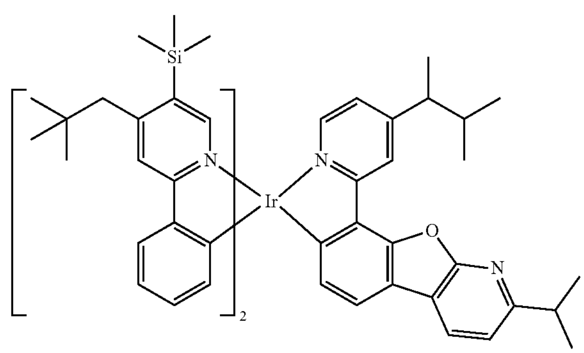
228
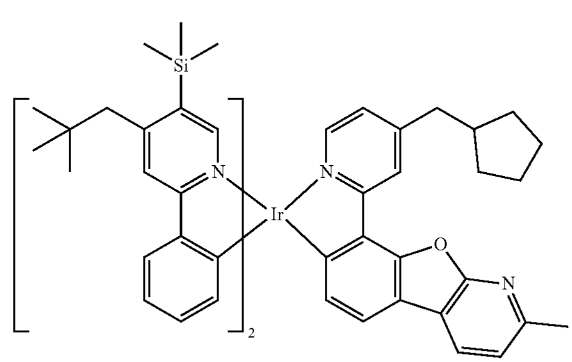

-continued
229
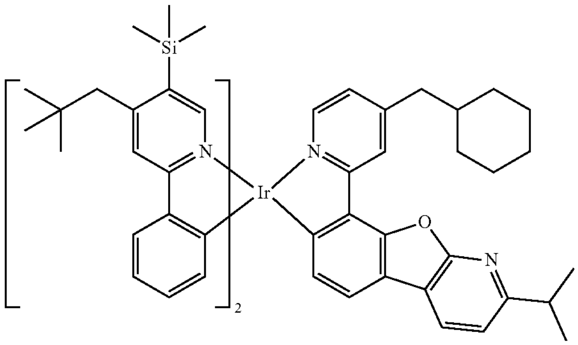
230
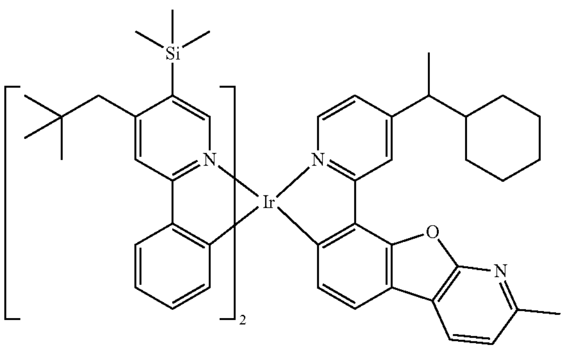
231
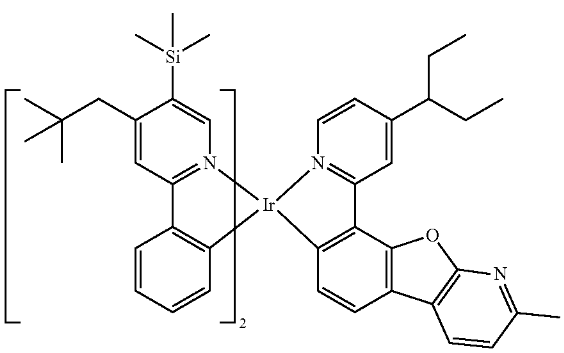
232
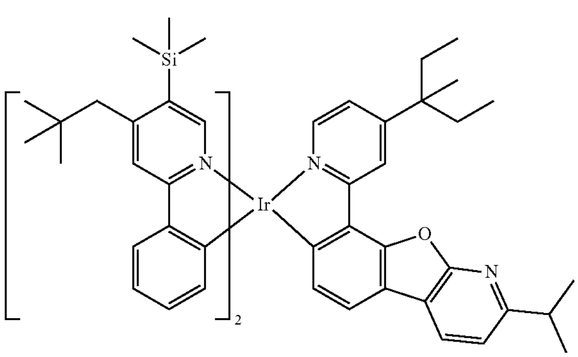
-continued
233
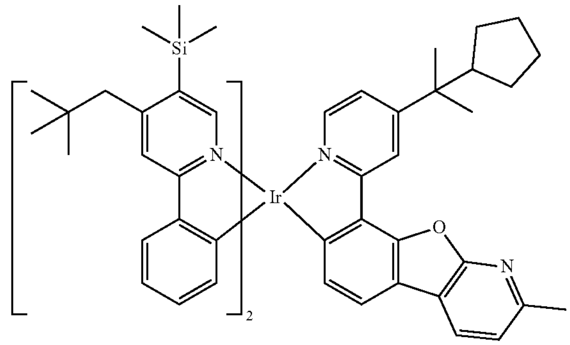
234
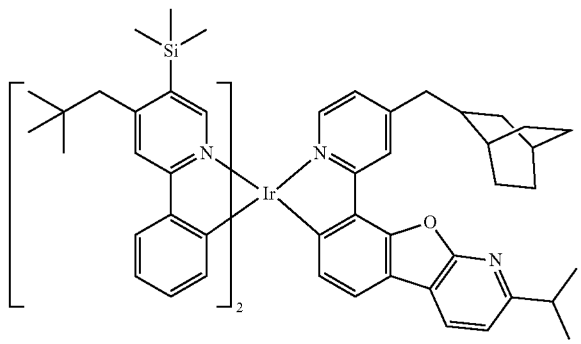
235
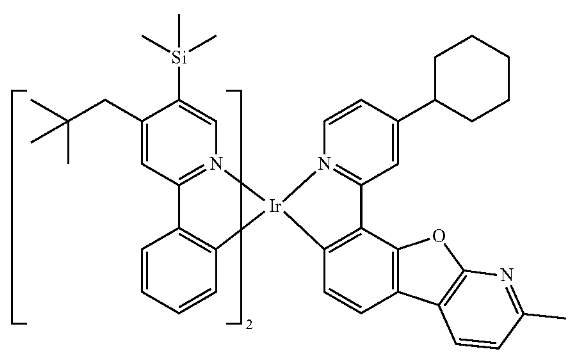
236
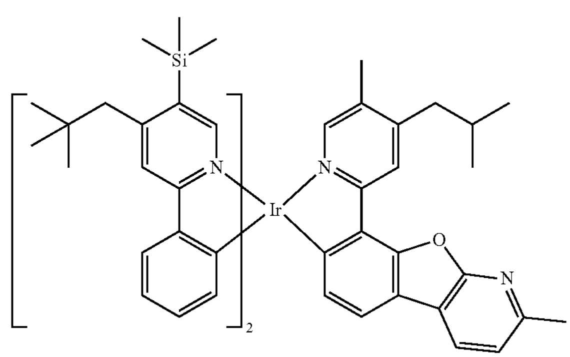

237
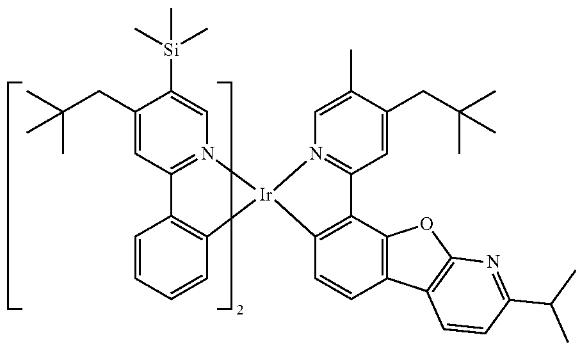
238
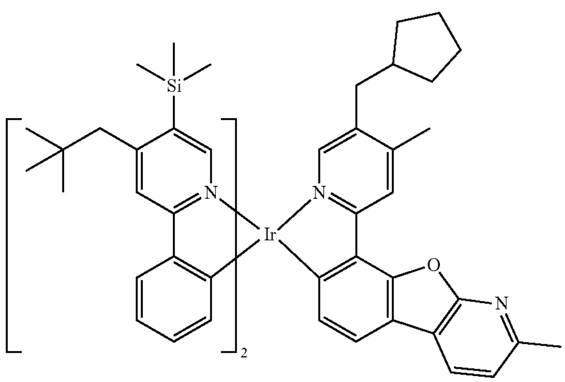
239
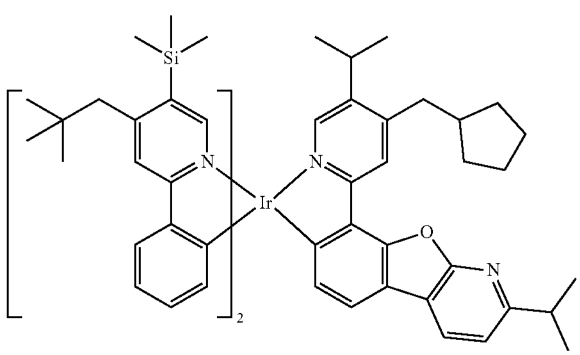
240
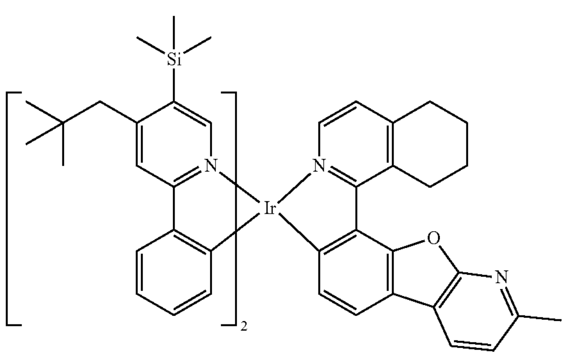
241
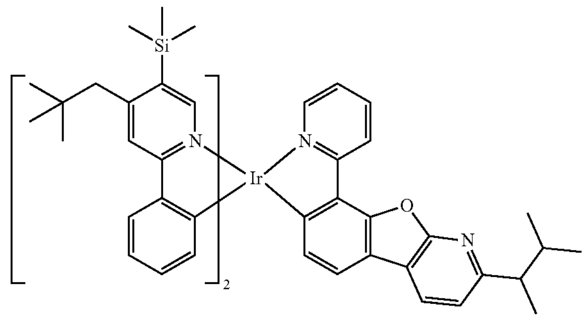
242
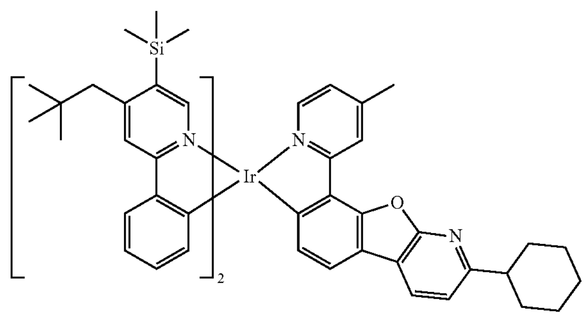
243
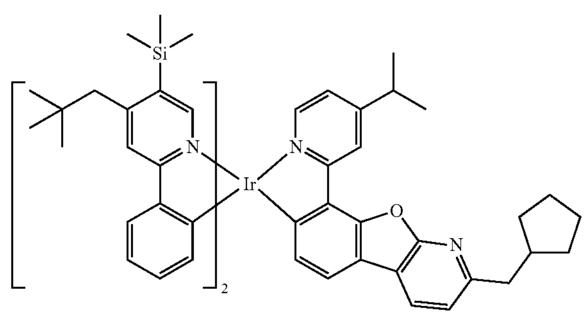
244
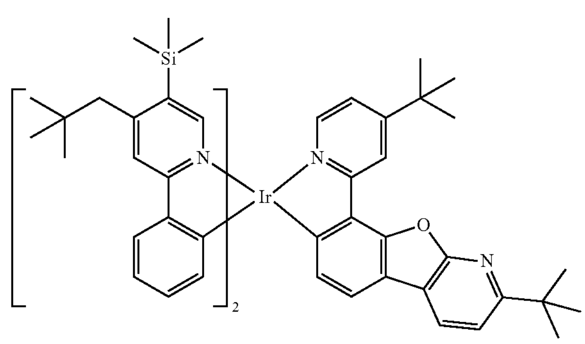

-continued
245
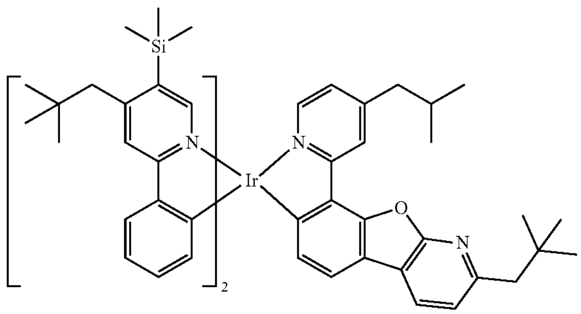
246
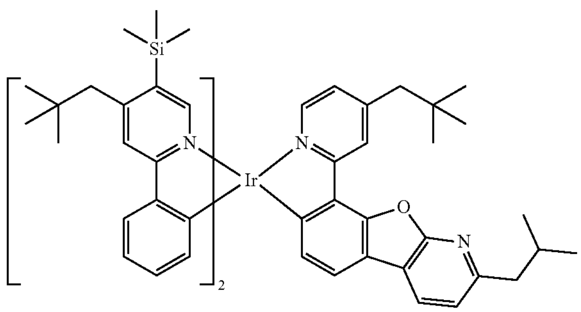
247
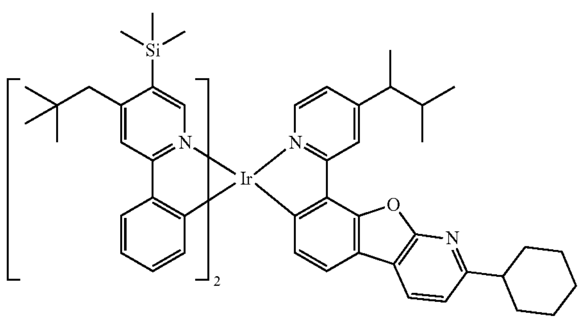
248
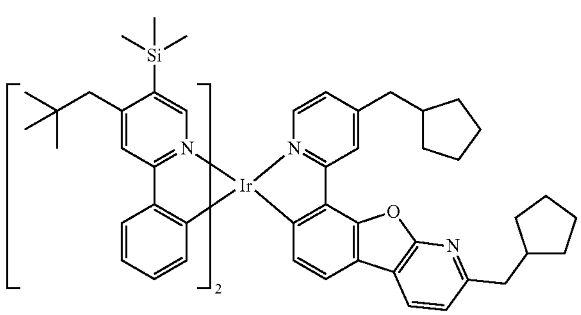
-continued
249
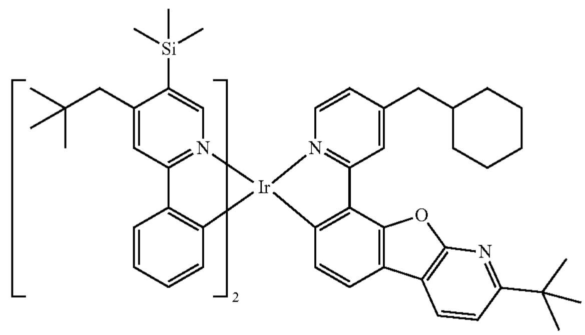
250
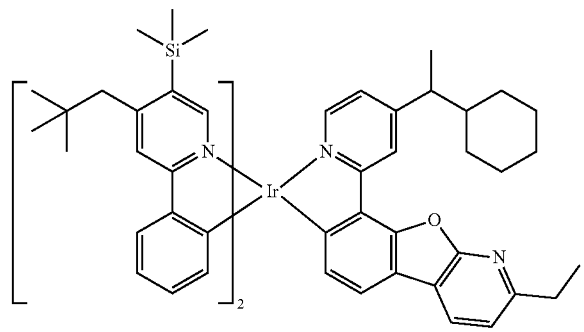
251
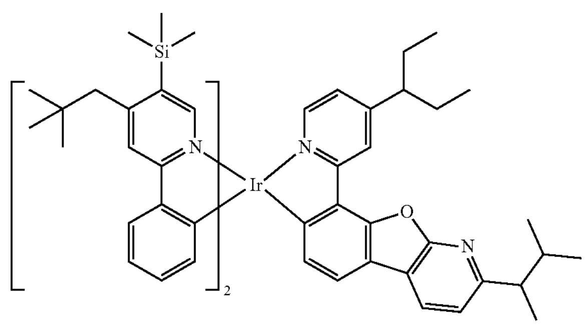
252
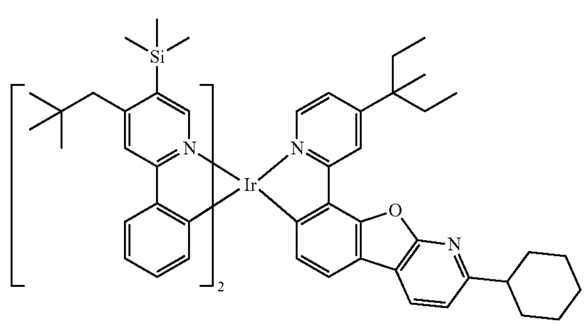

-continued
253
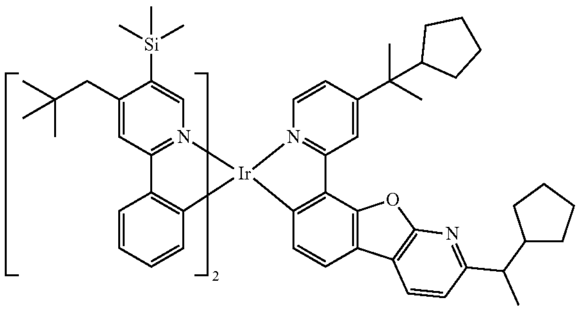
254
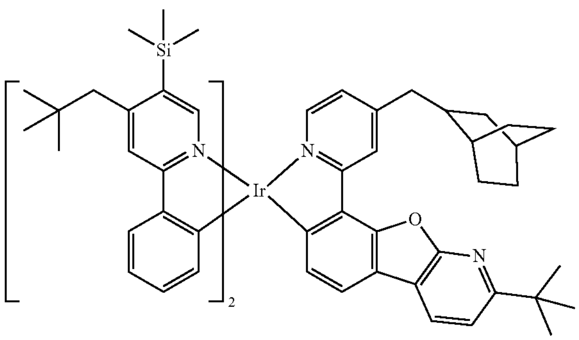
255
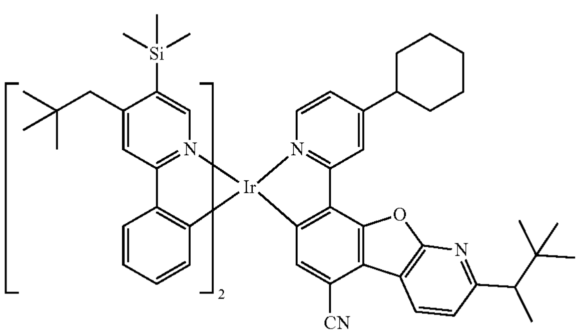
256
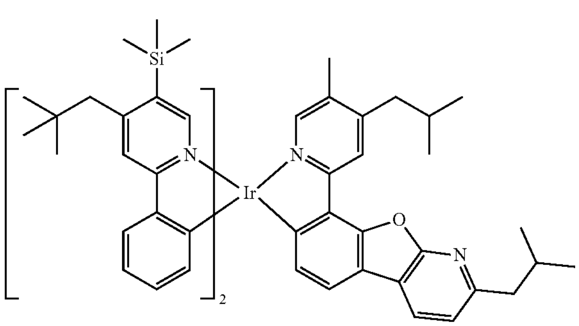
-continued
257
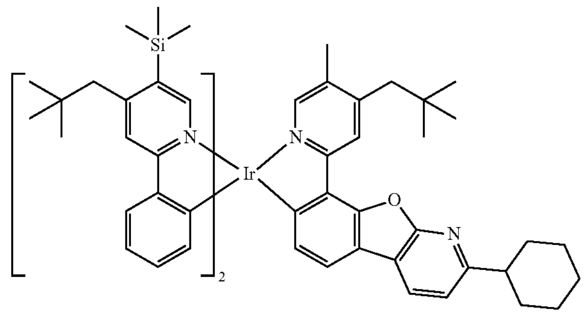
258
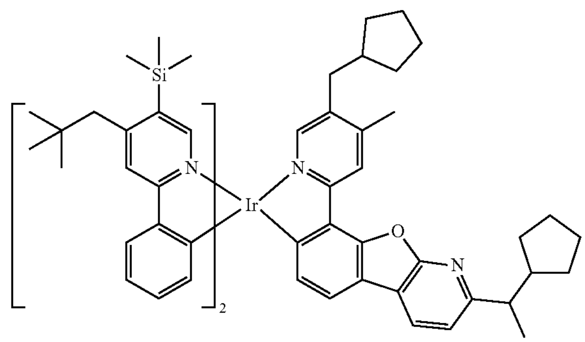
259
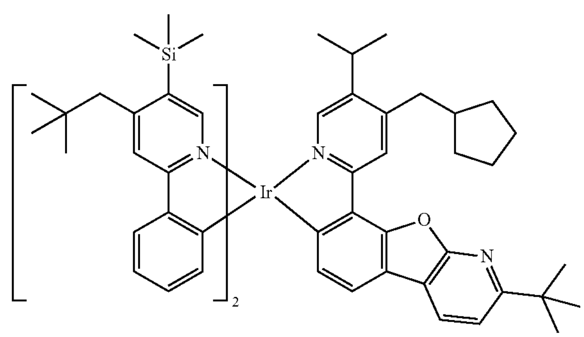
260
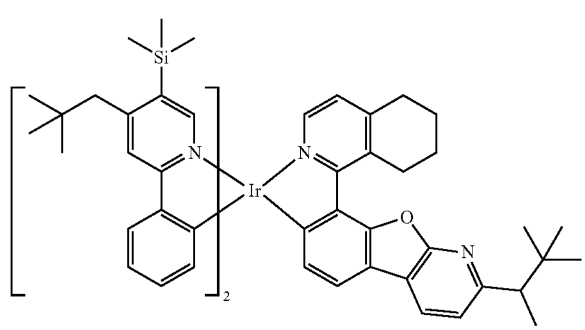

-continued
261
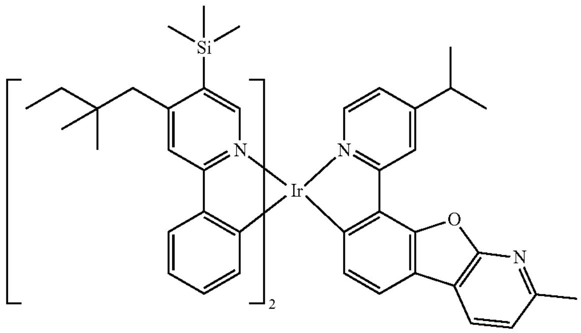
262
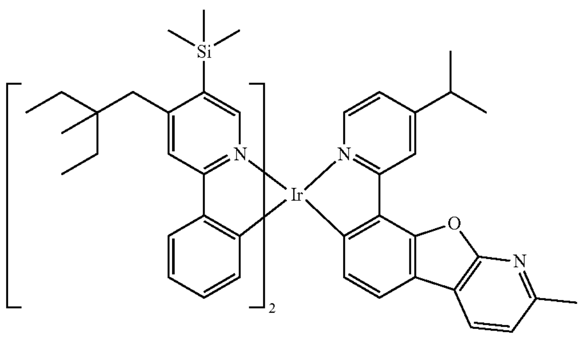
263
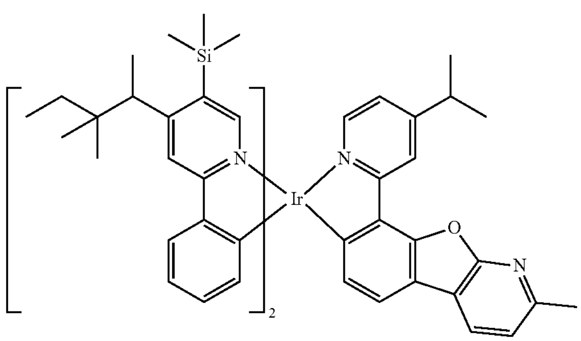
264
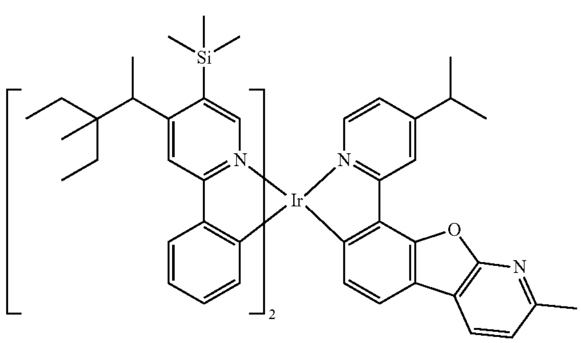
-continued
265
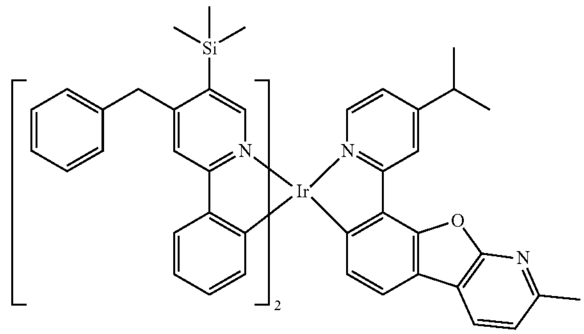
266
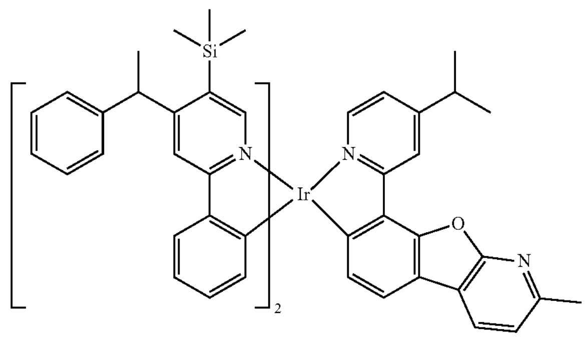
267
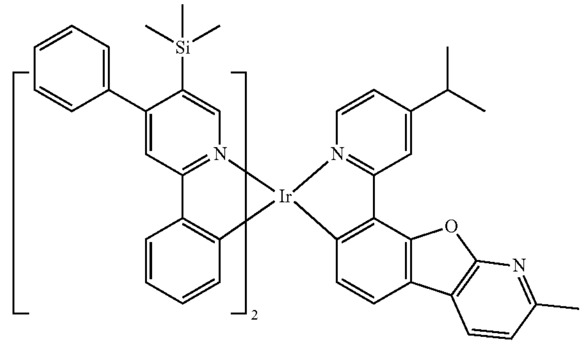
268
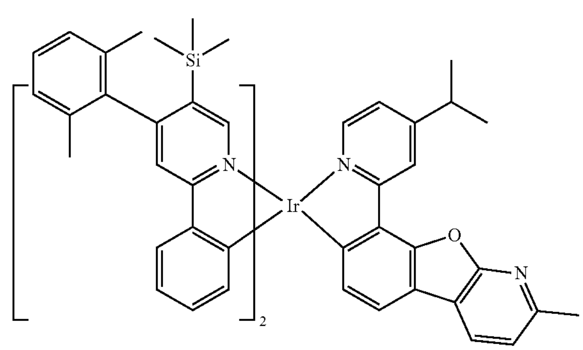

-continued
269
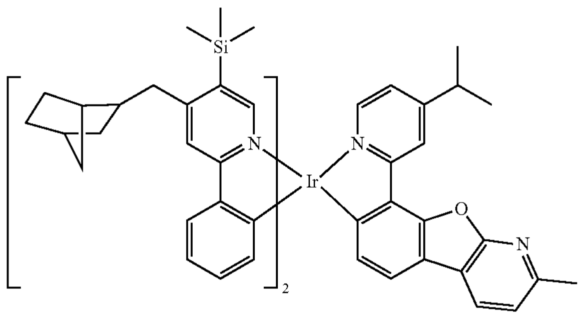
270
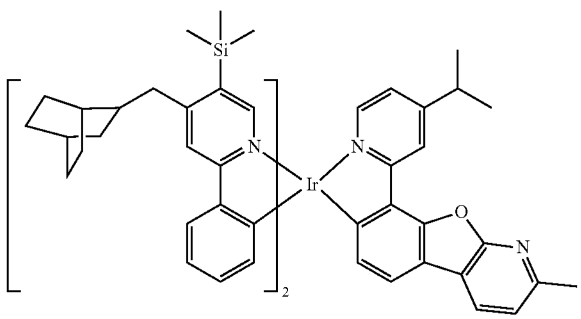
271
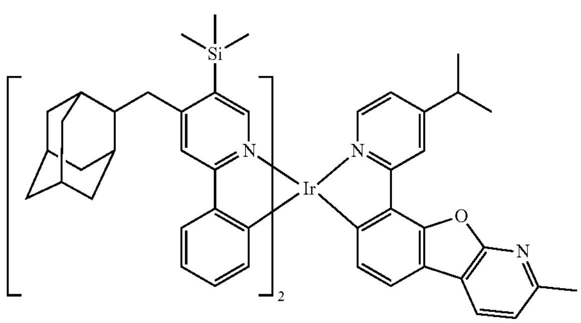
272
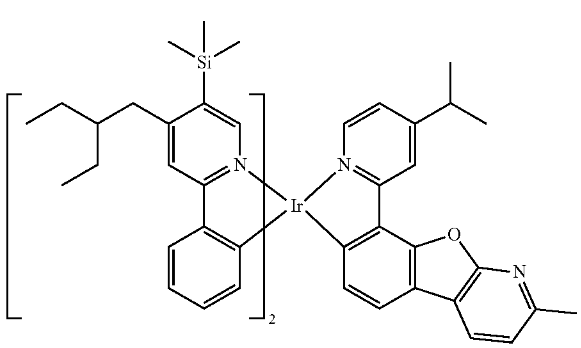
-continued
273
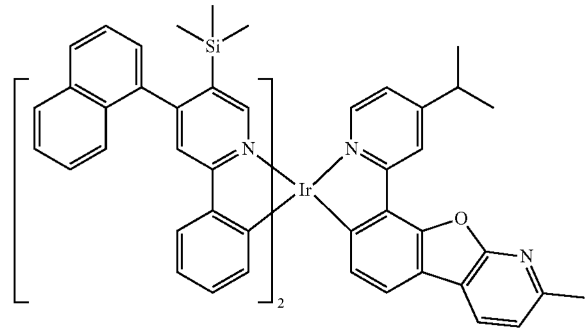
274
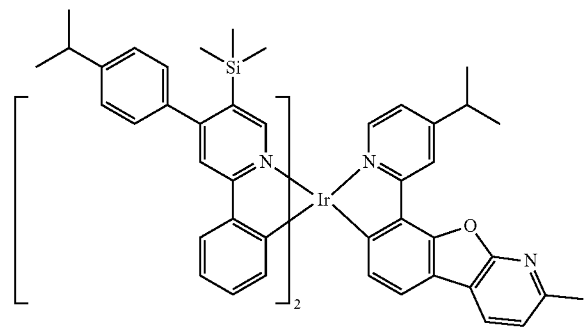
275
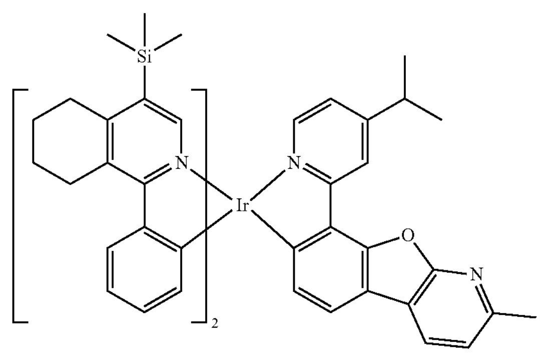
276
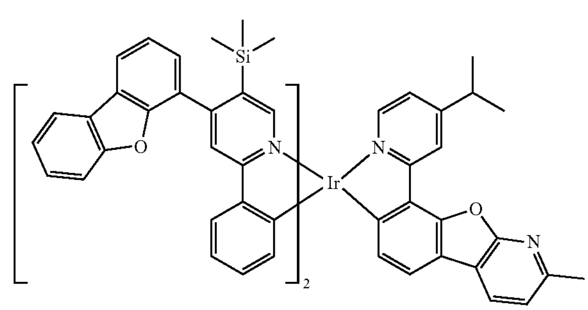

-continued
277
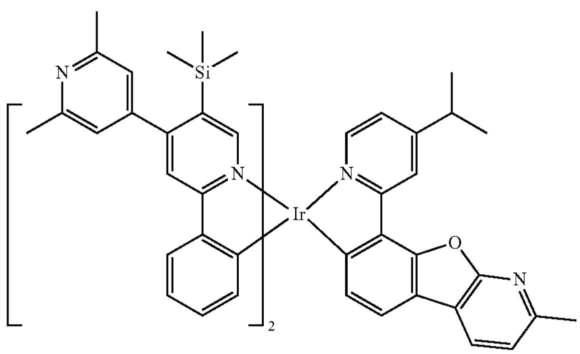
278
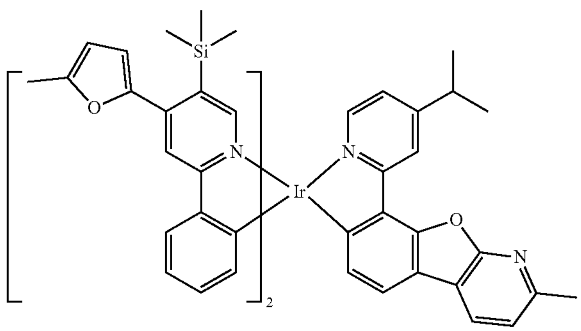
279
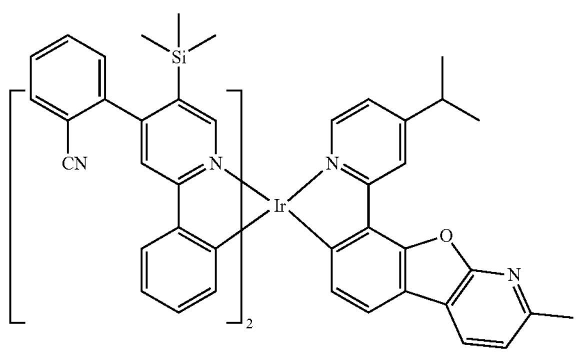
280
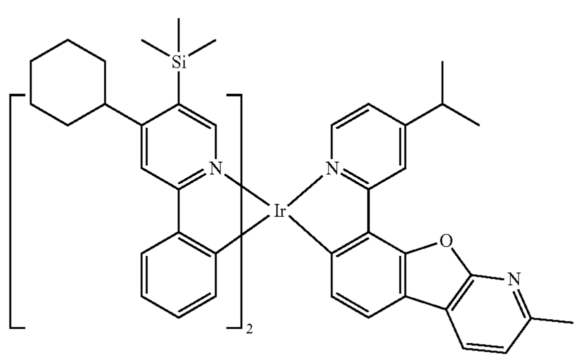
281
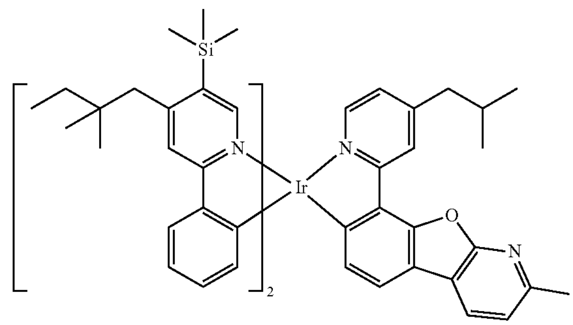
282
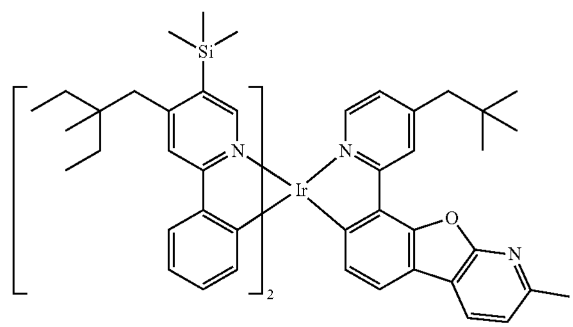
283
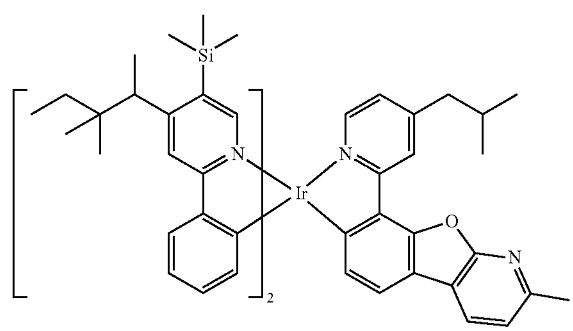
284
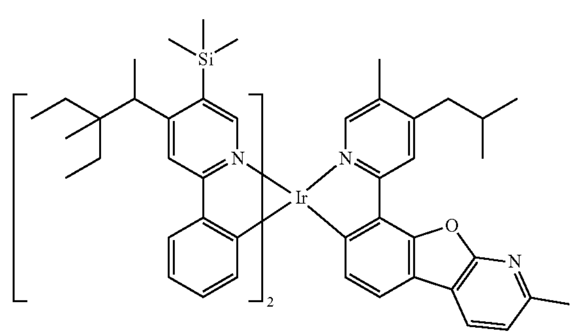

-continued
285
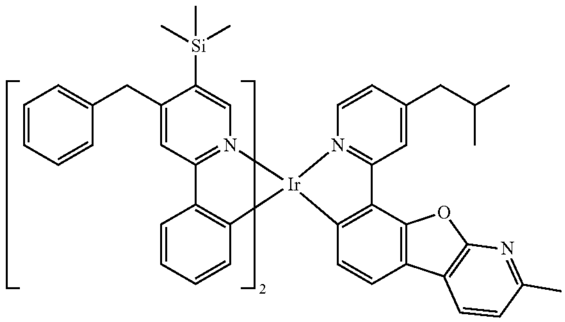
286
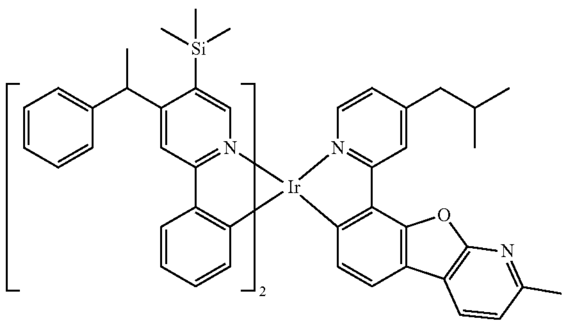
287
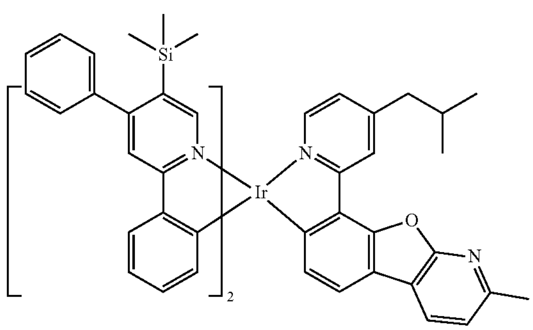
288
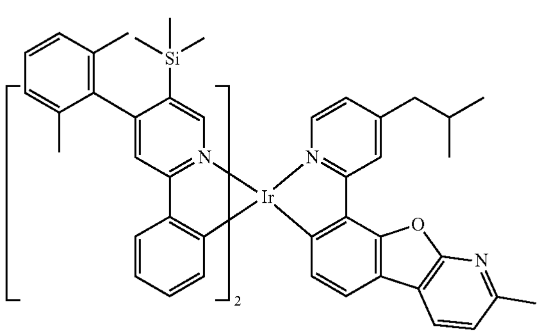
-continued
289
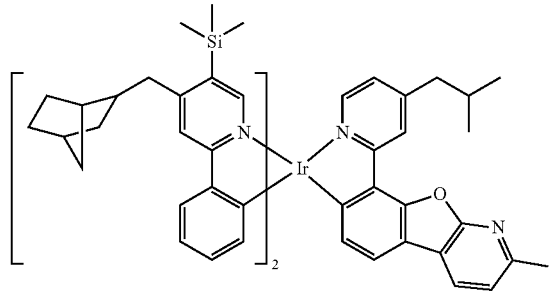
290
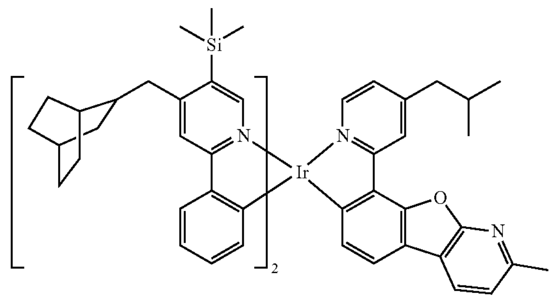
291
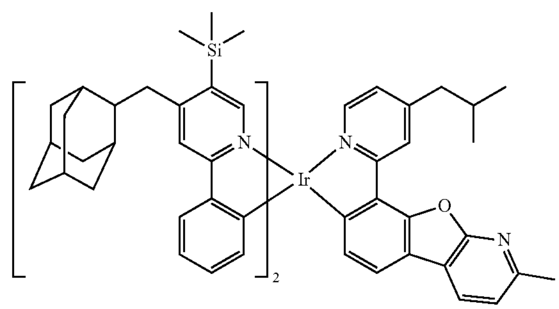
292
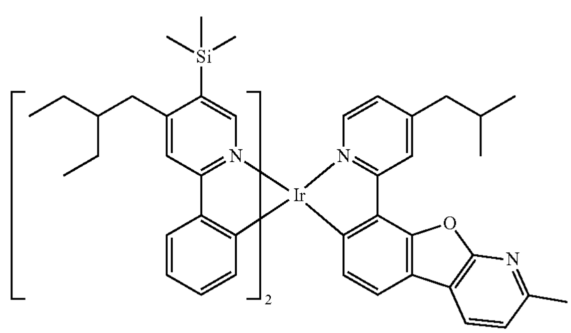

-continued
293
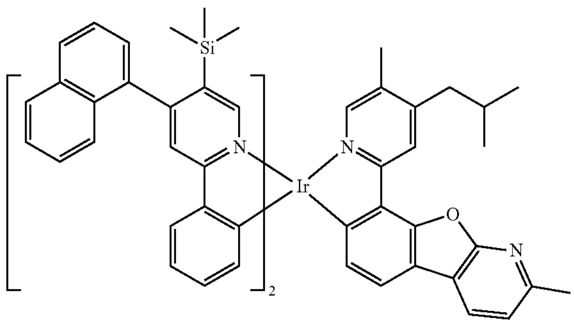
294
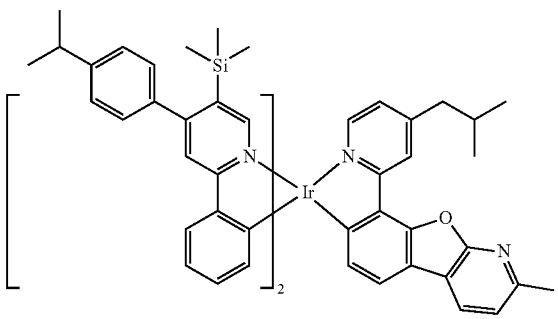
295
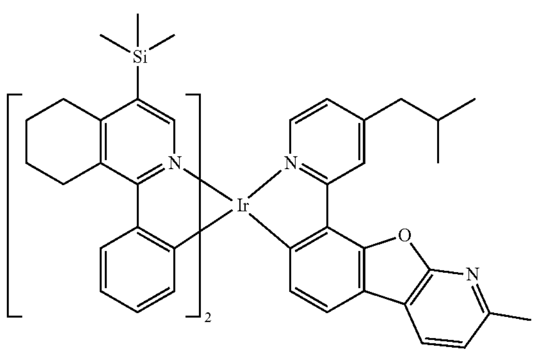
296
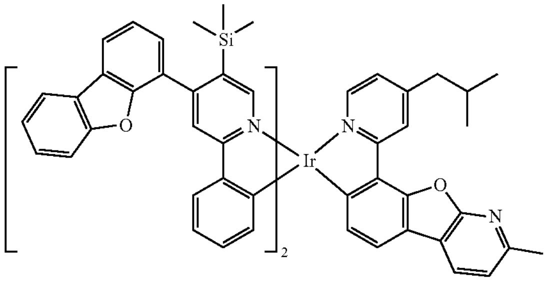
-continued
297
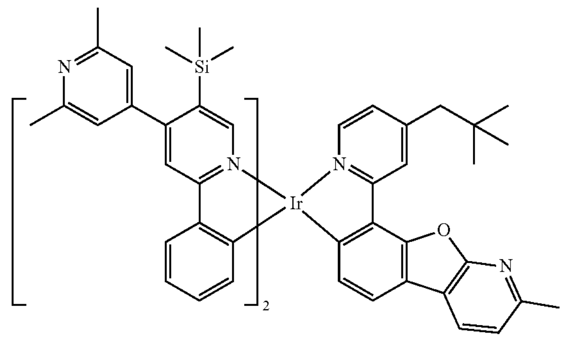
298
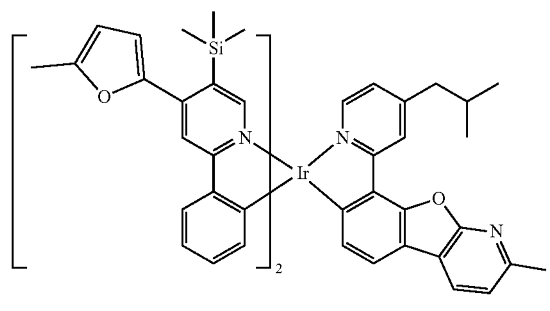
299
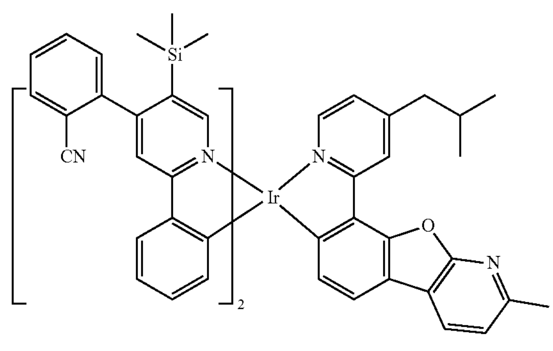
300
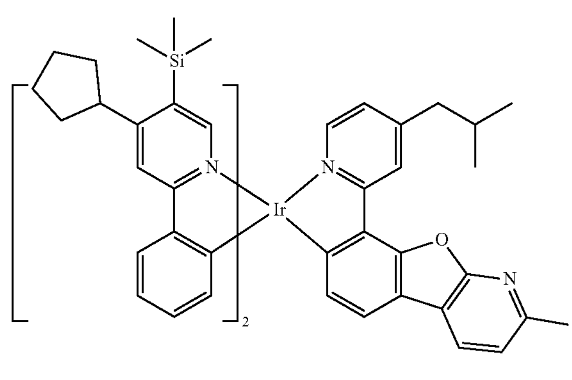

-continued
301
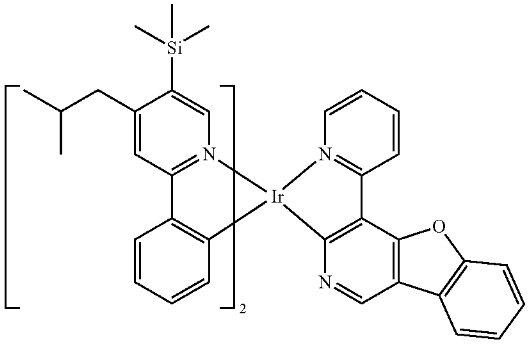
302
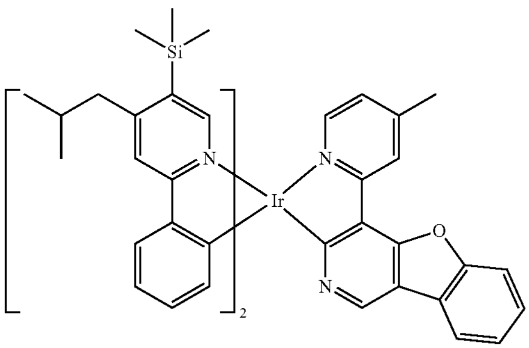
303
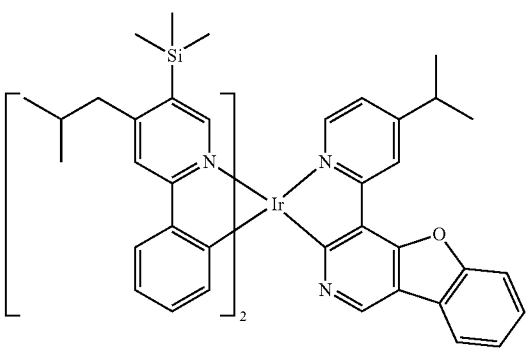
304
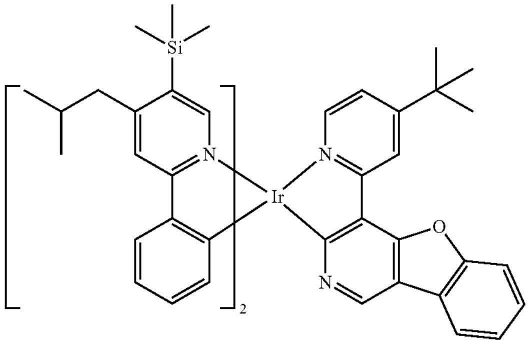
-continued
305
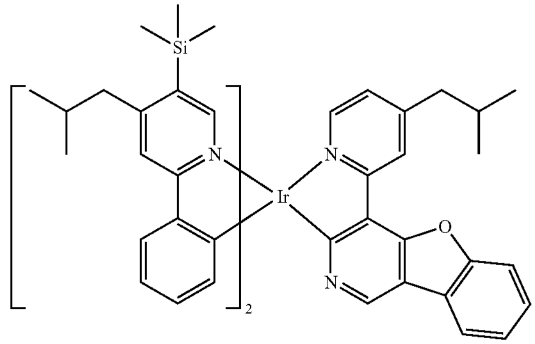
306
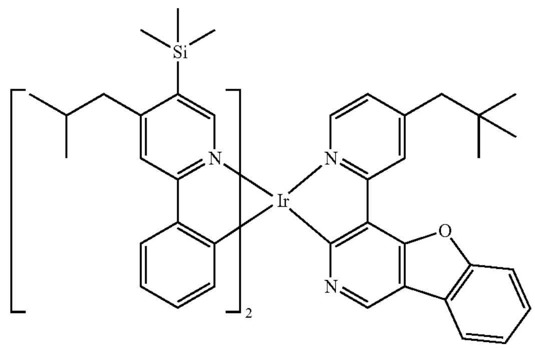
307
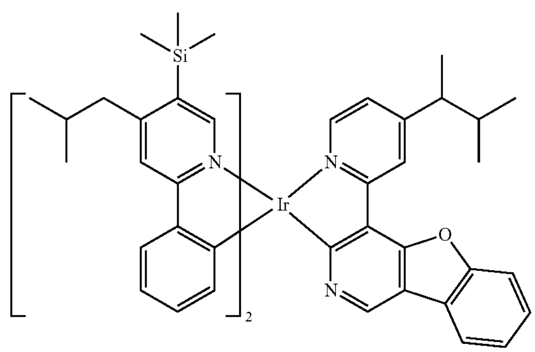
308
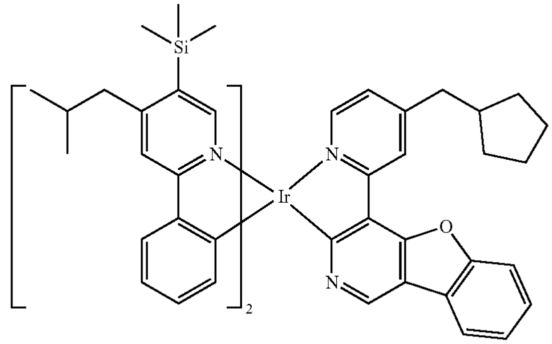

-continued
309
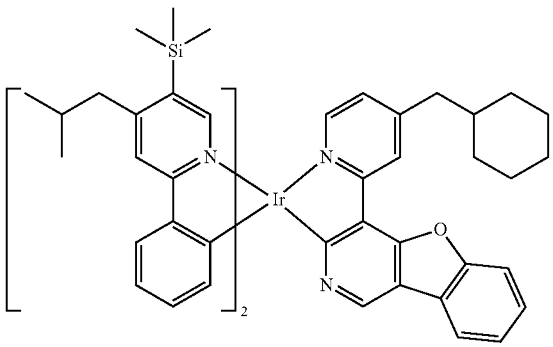
310
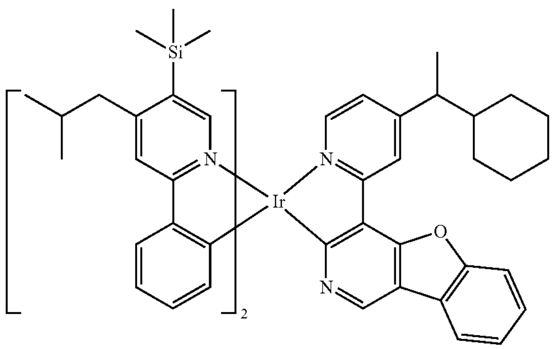
311
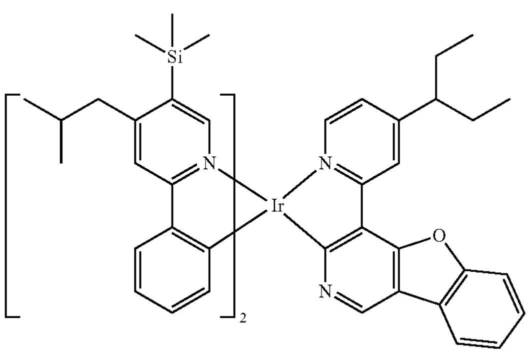
312
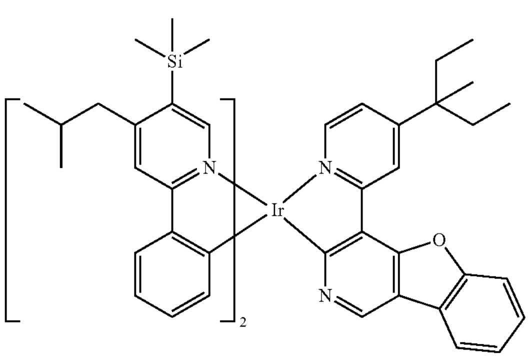
-continued
313
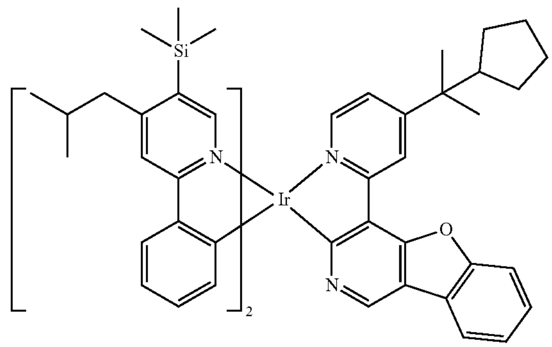
314
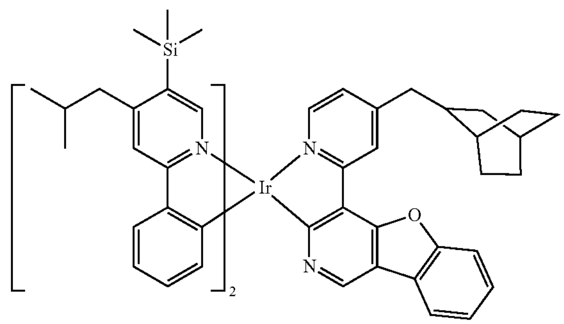
315
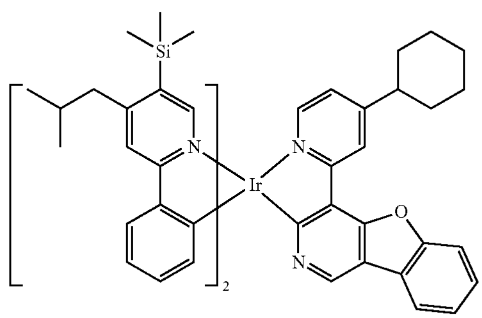
316
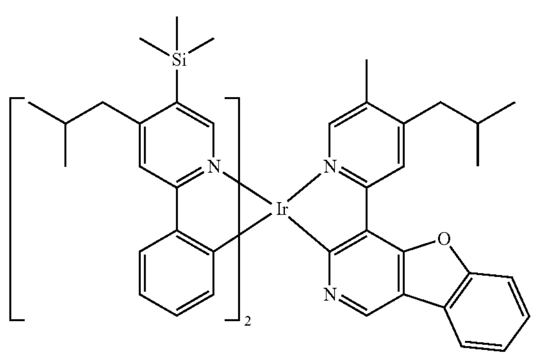

-continued
317
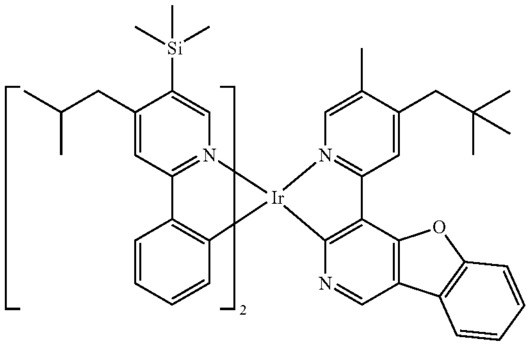
318
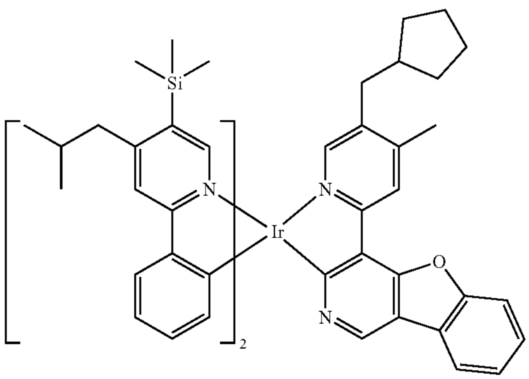
319
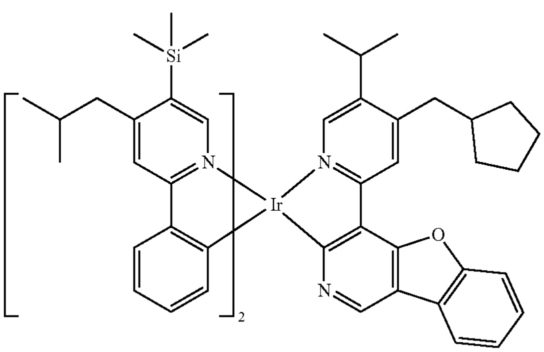
320
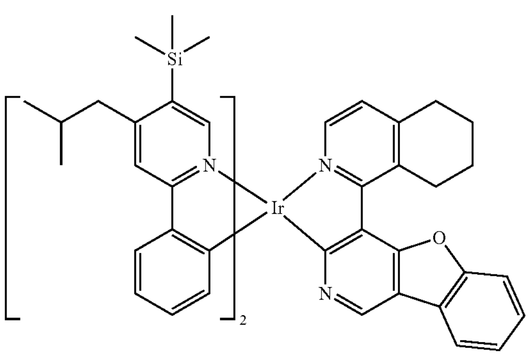
-continued
321
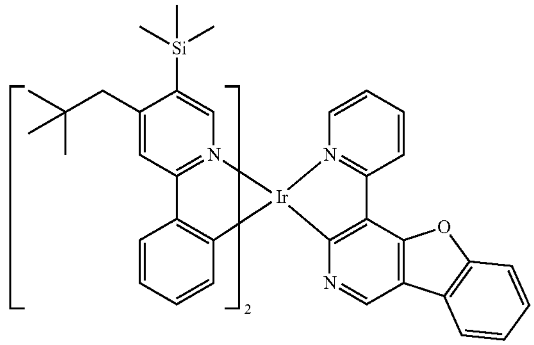
322
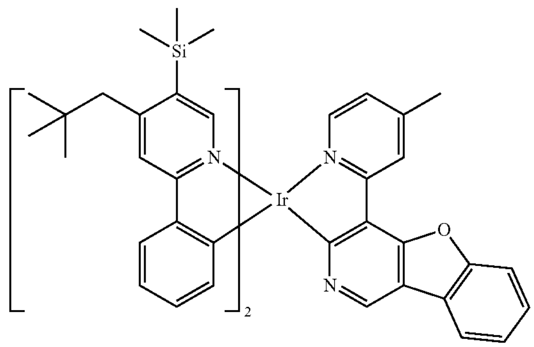
323
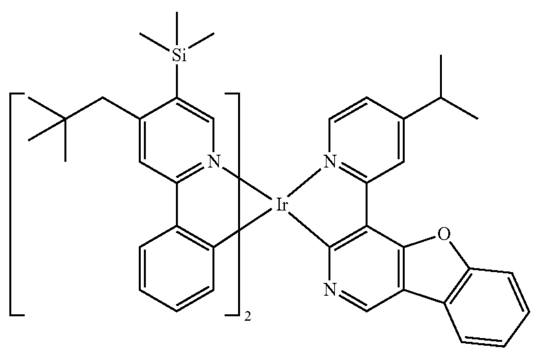
324
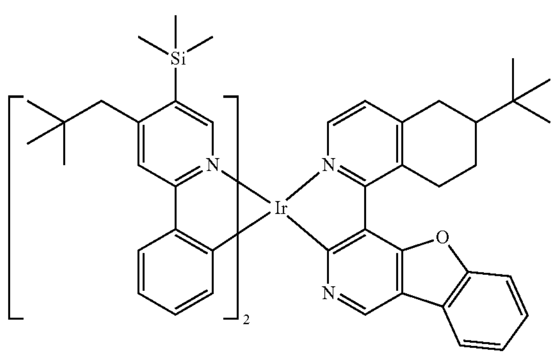

-continued
325
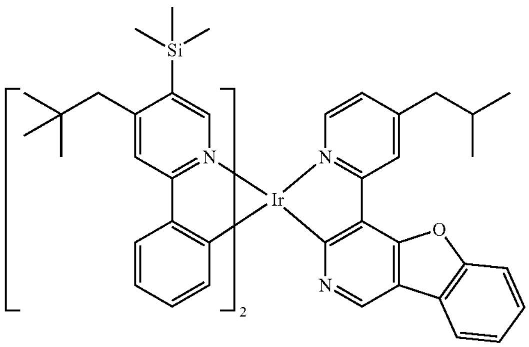
326
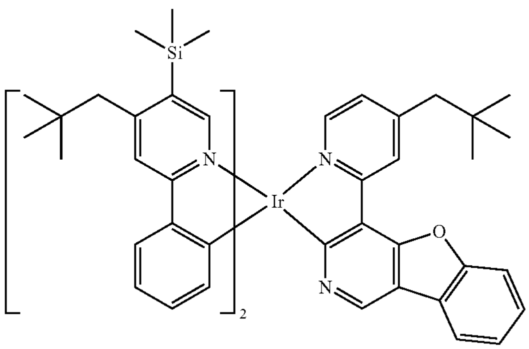
327
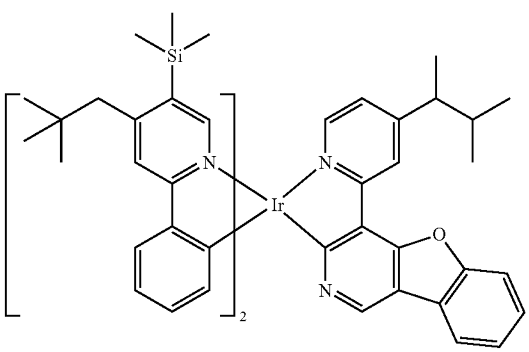
328
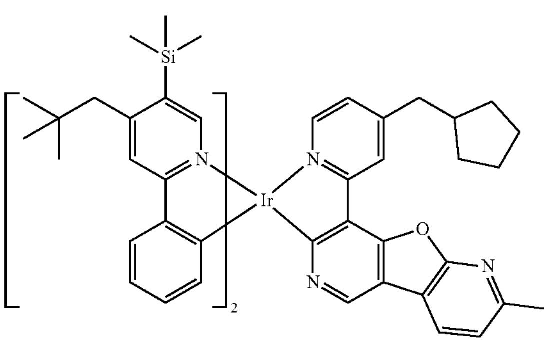
-continued
329
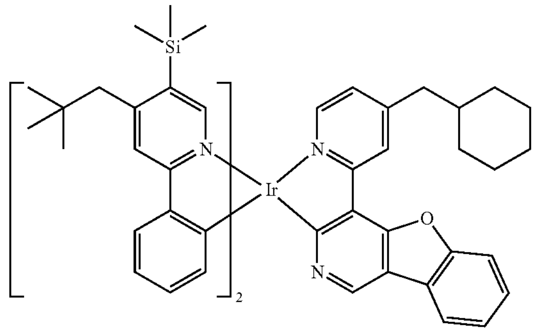
330
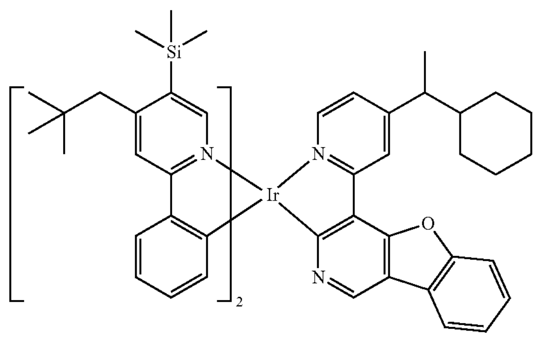
331
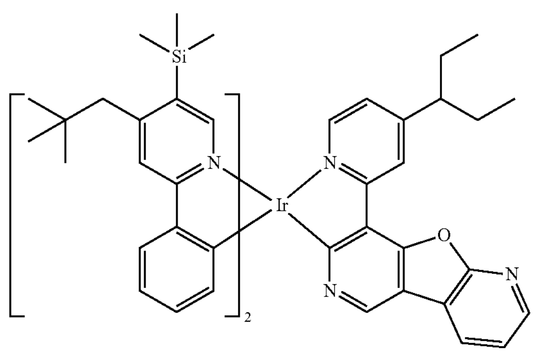
332
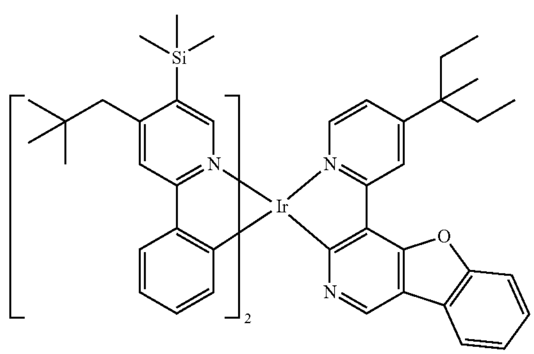

-continued
333
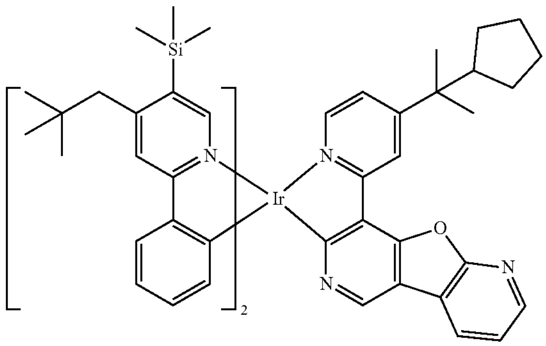
334
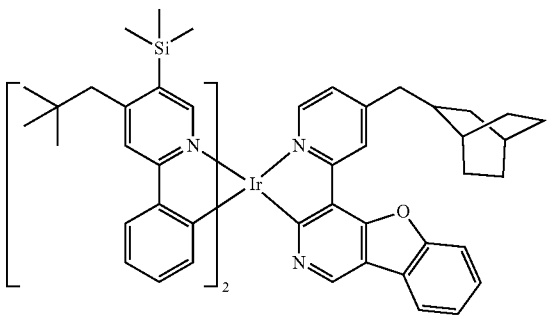
335
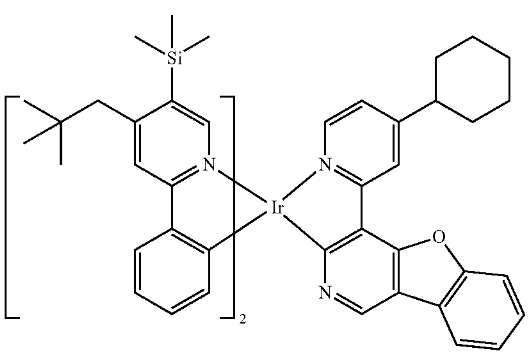
336
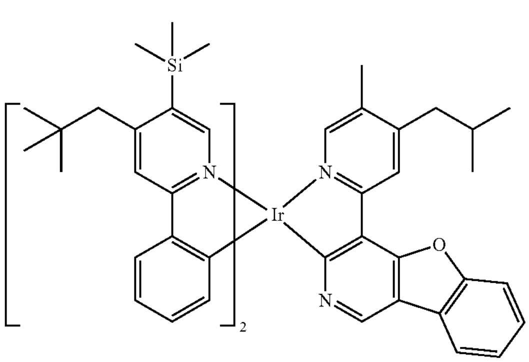
-continued
337
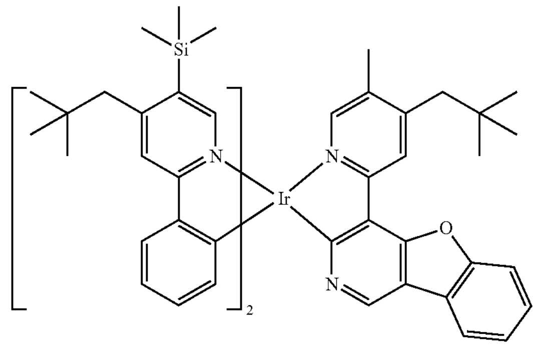
338
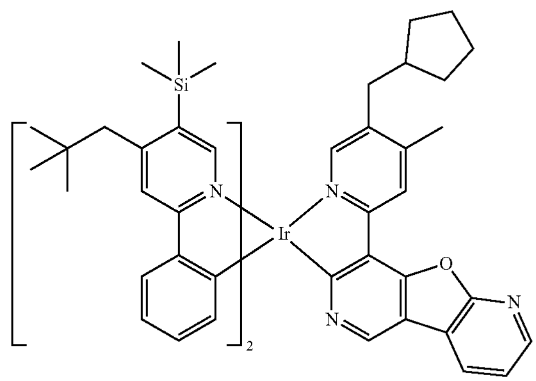
339
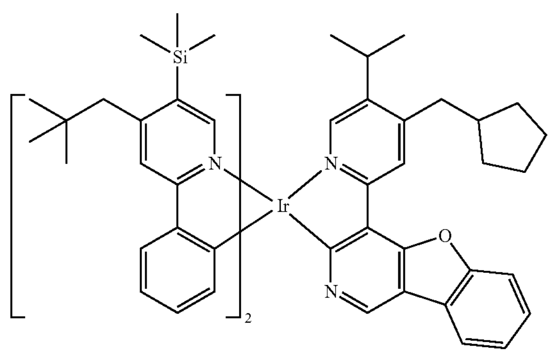
340
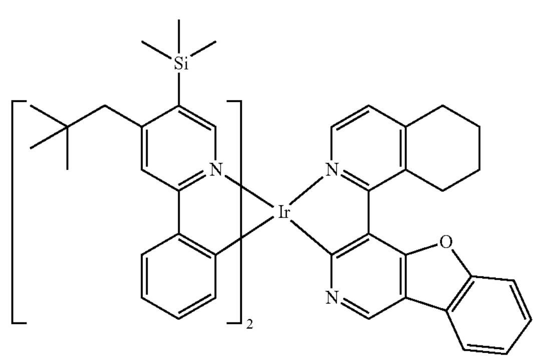

-continued
341
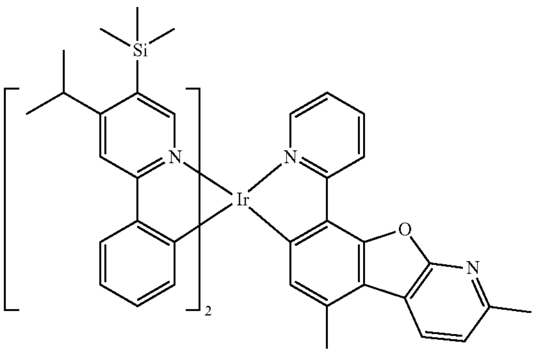
342
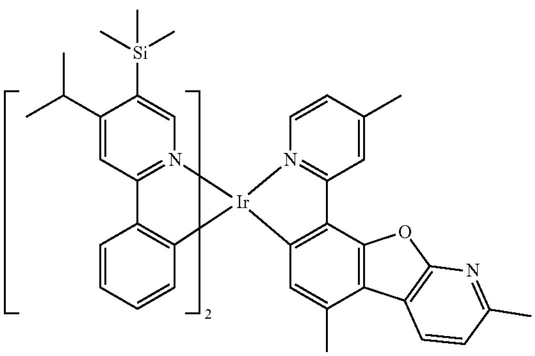
343
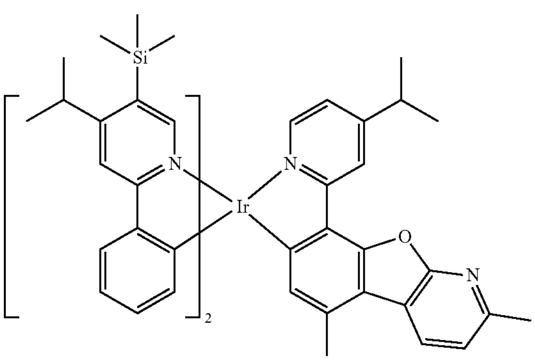
344
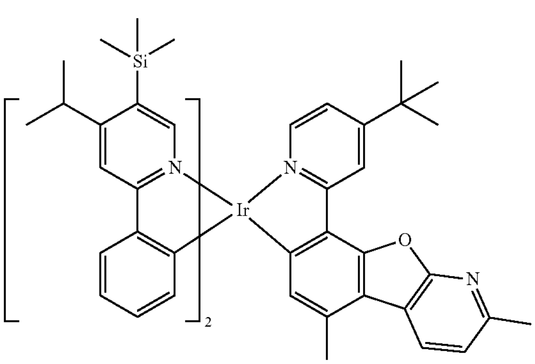
-continued
345
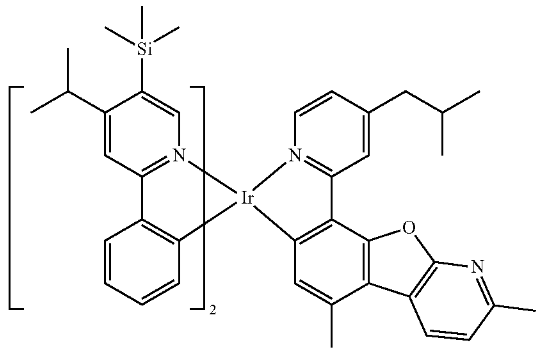
346
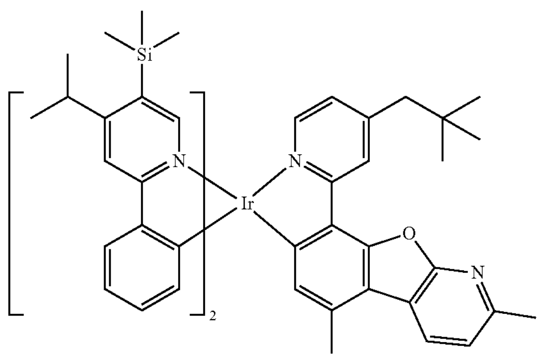
347
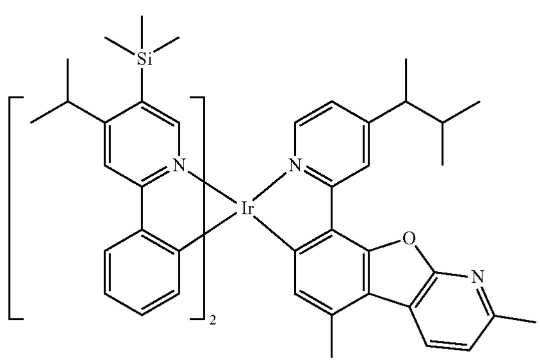
348
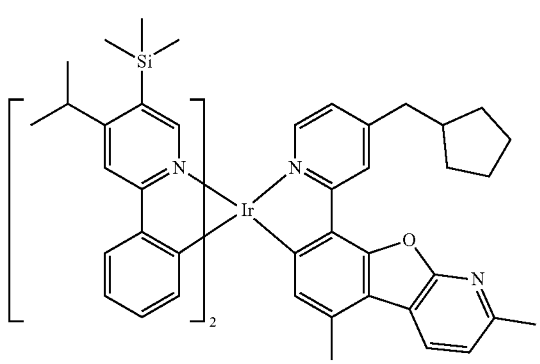

-continued
349
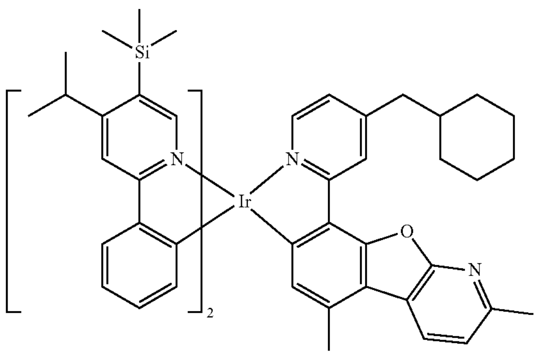
350
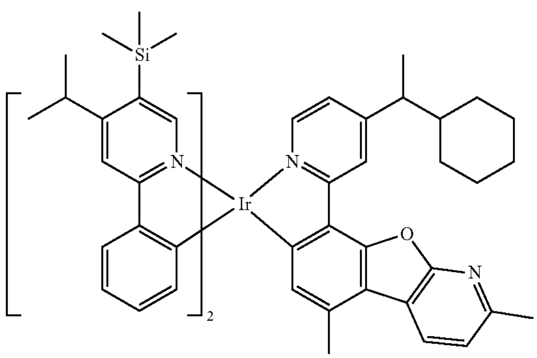
351
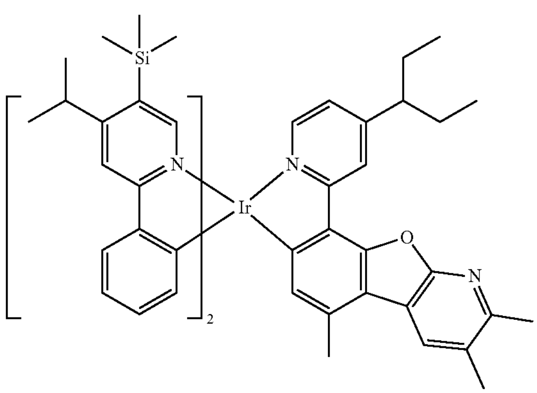
352
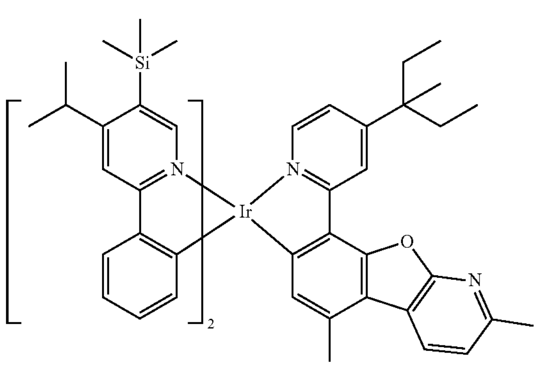
-continued
353
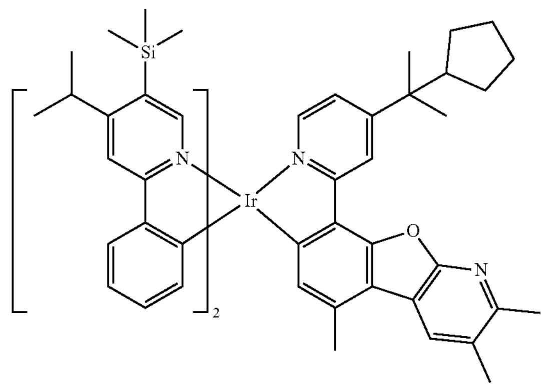
354
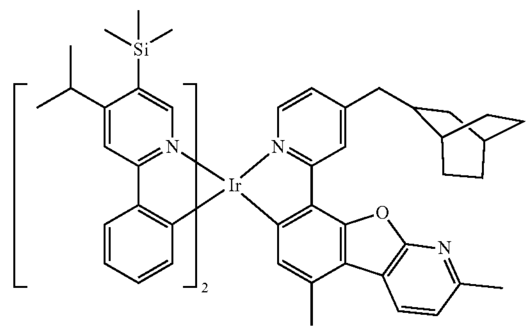
355
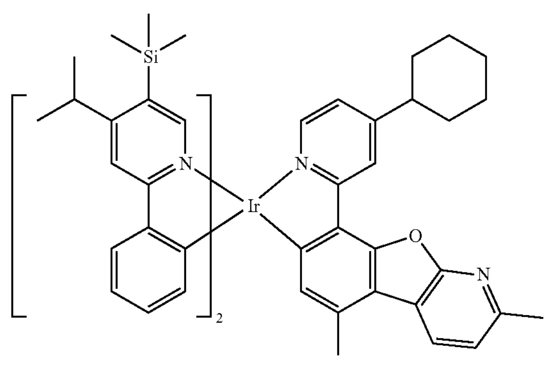
356
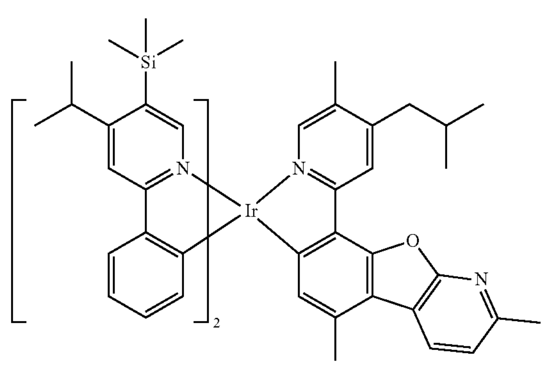

-continued
357
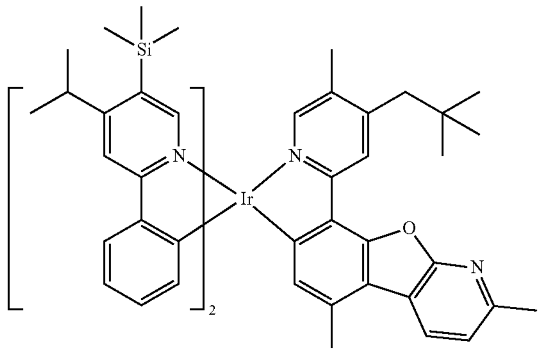
358
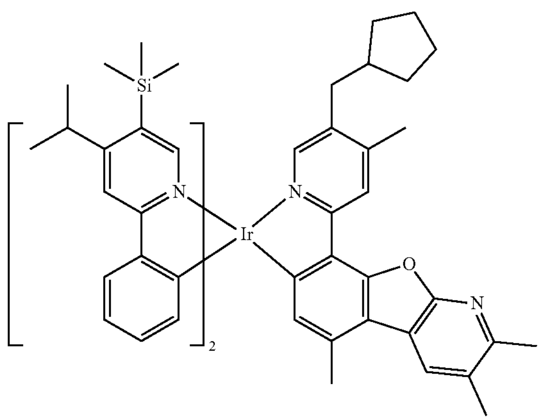
359
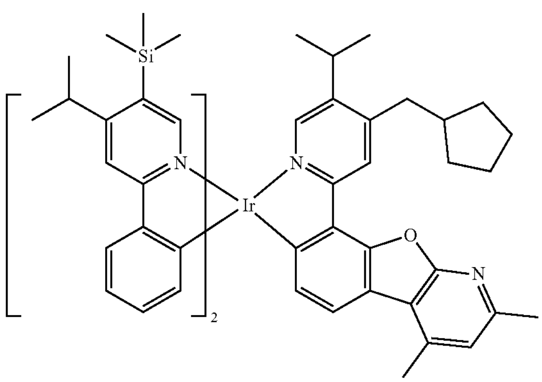
360
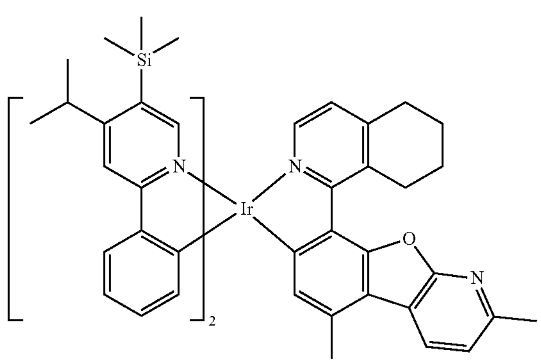
-continued
361
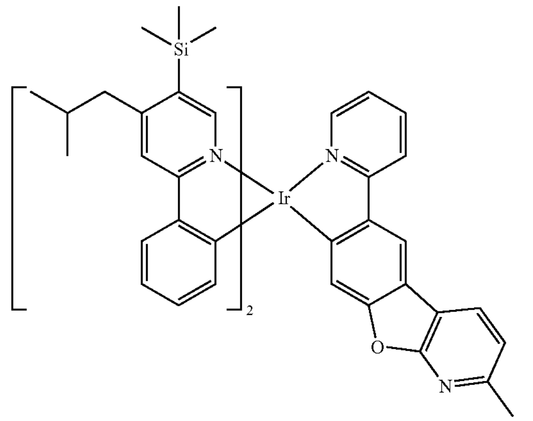
362
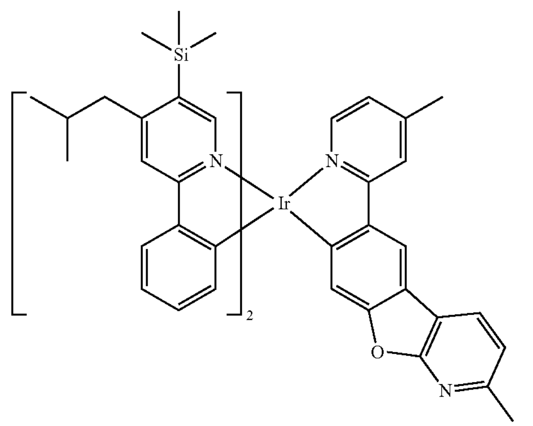
363
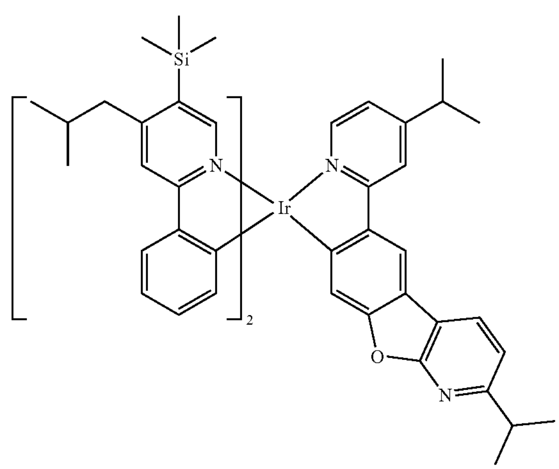

-continued
364
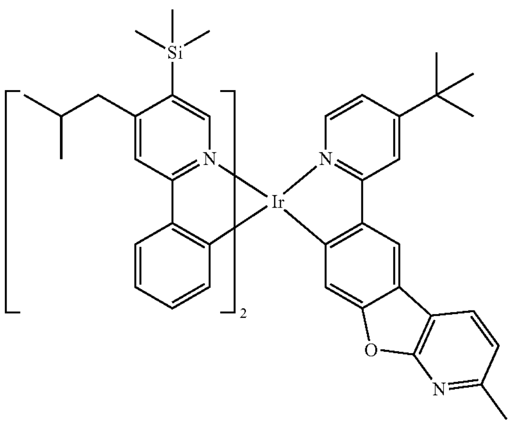
365
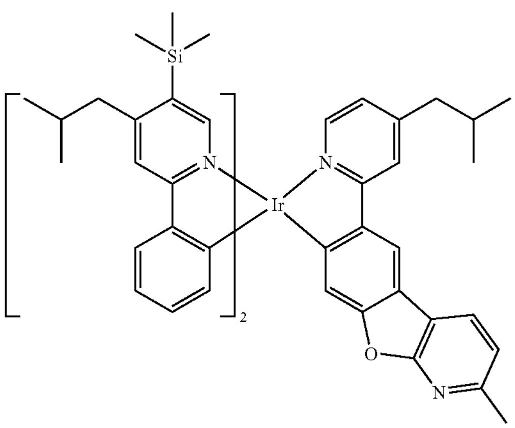
366
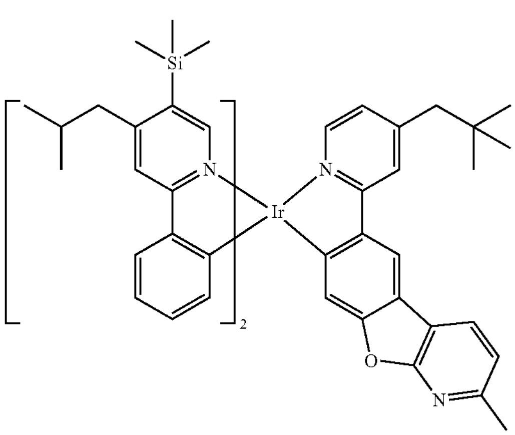
-continued
367
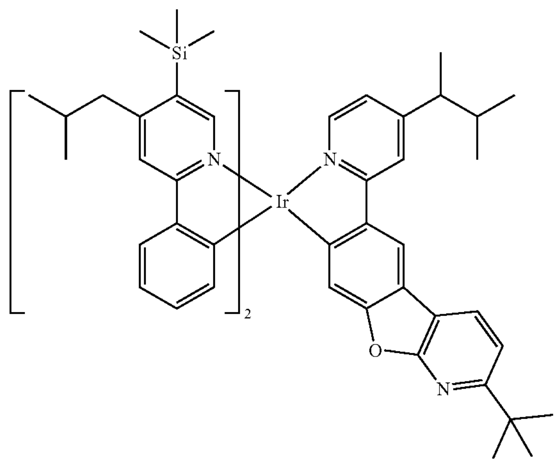
368
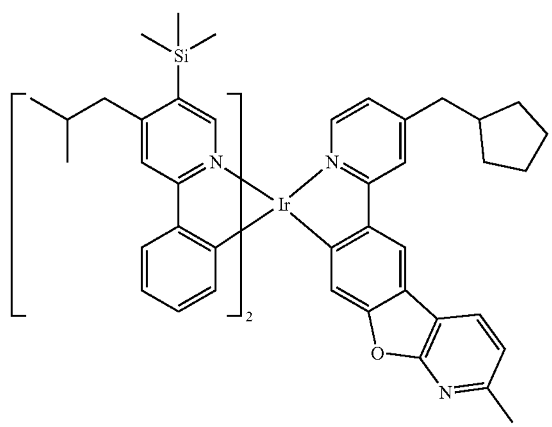
369
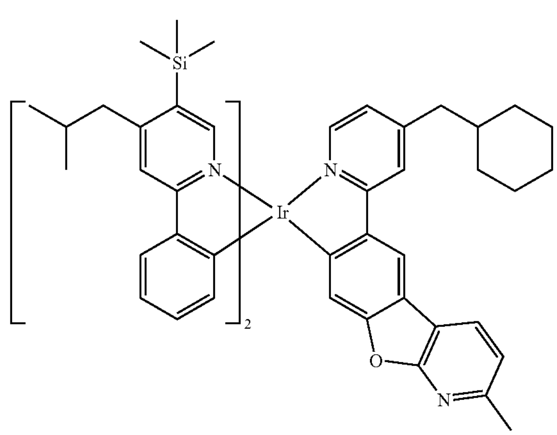

370
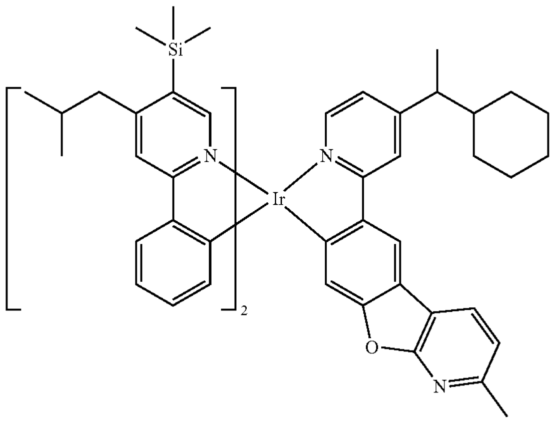
371
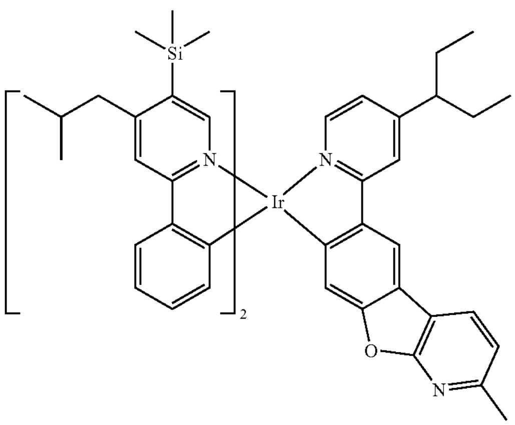
372
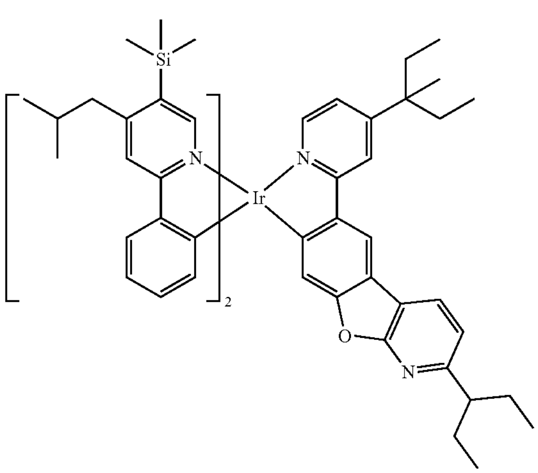
373
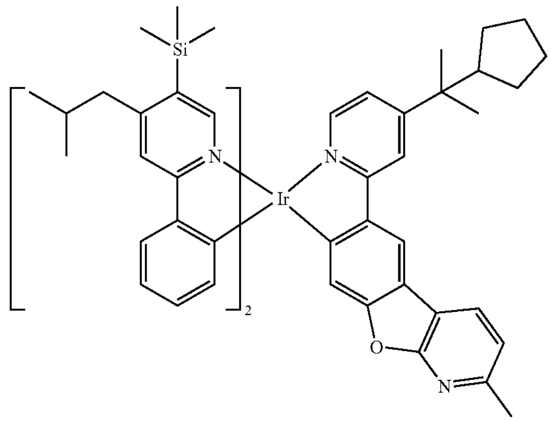
374
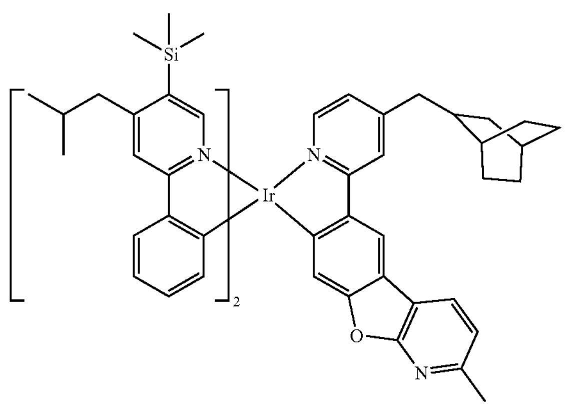
375
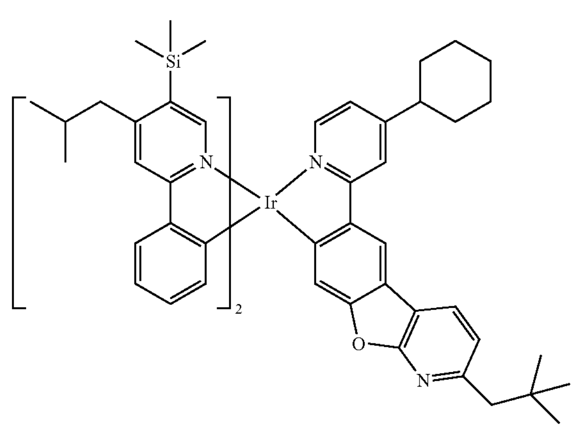

-continued
376
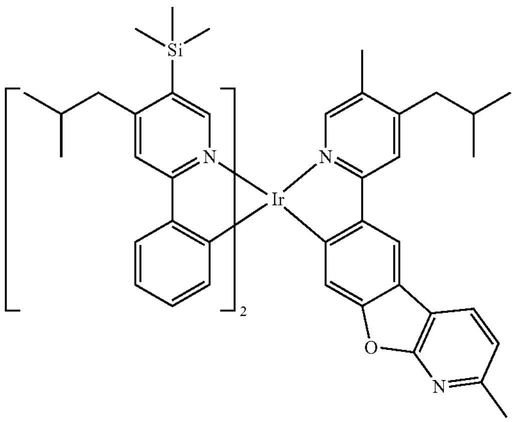
377
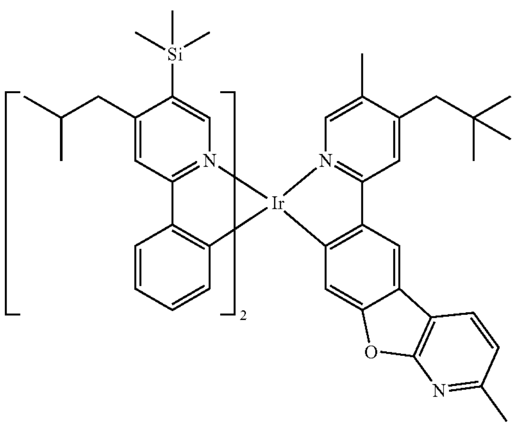
378
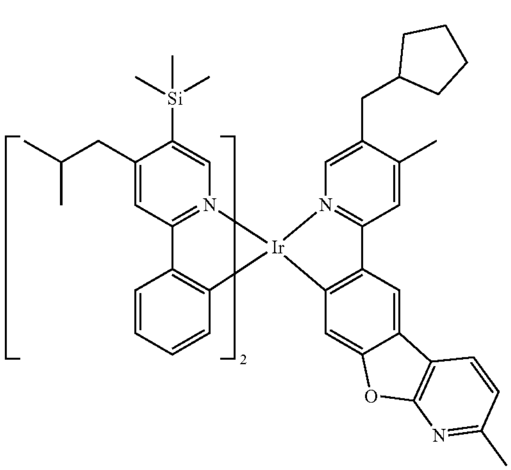
-continued
379
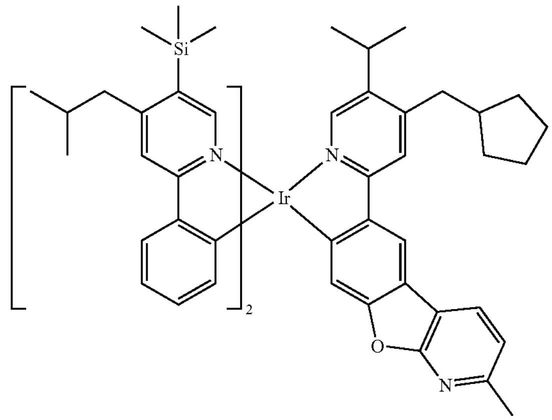
380
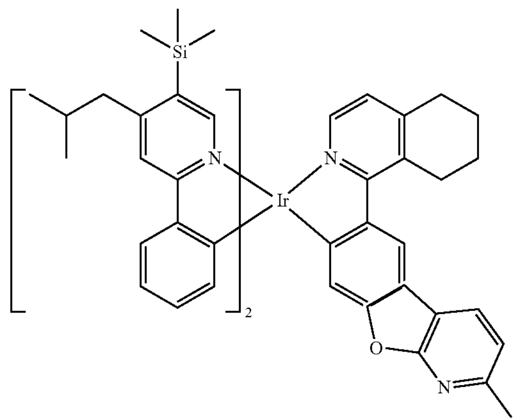
381
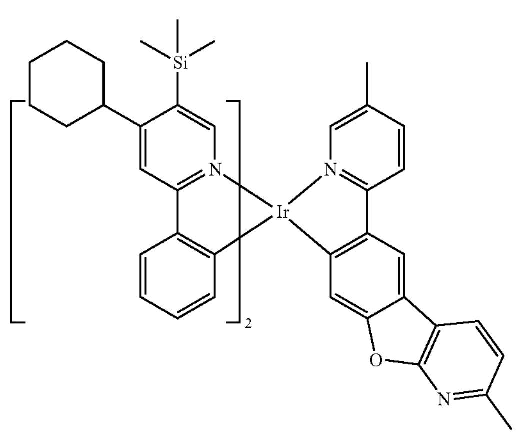

-continued
382
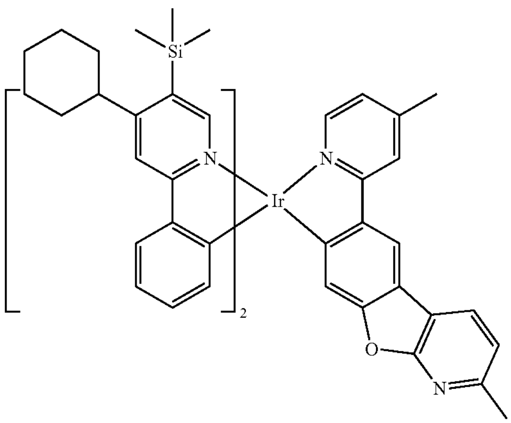
383
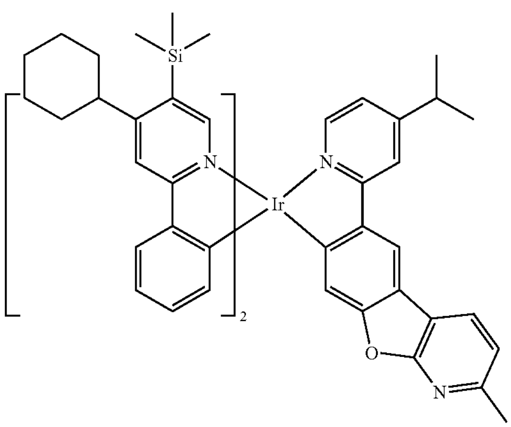
384
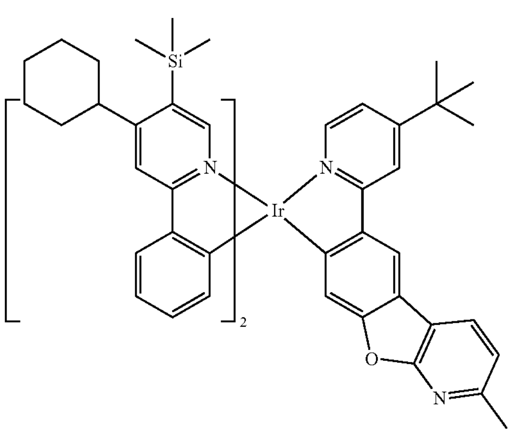
-continued
385
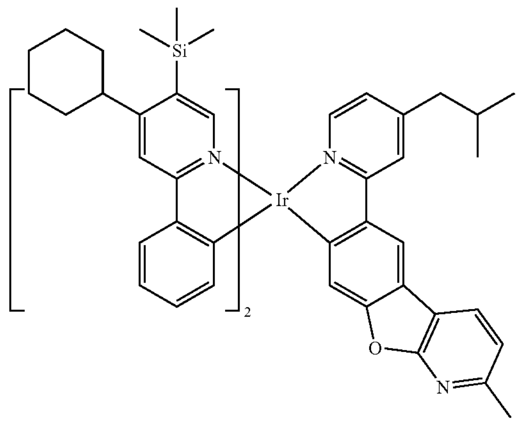
386
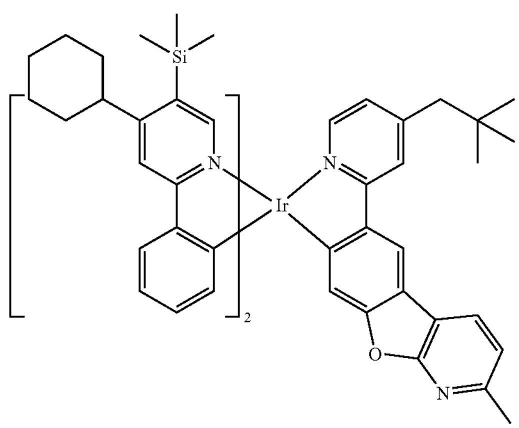
387
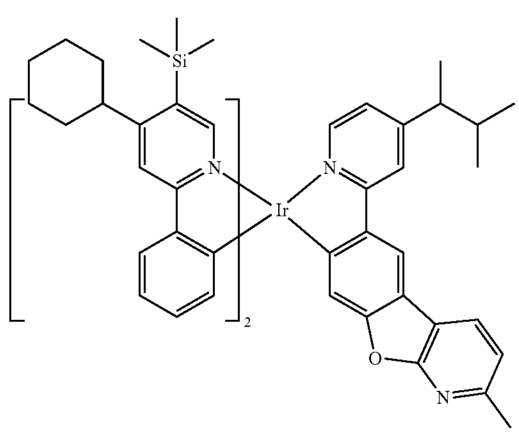

-continued
388
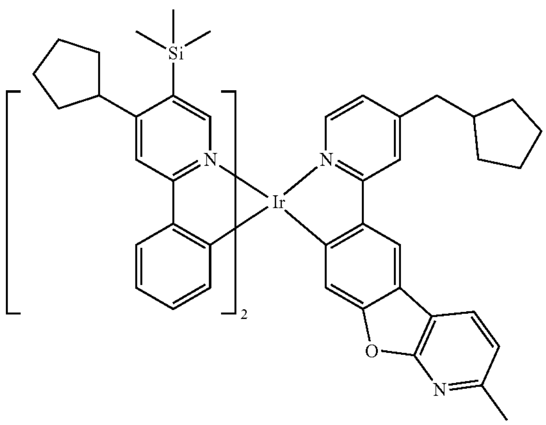
389
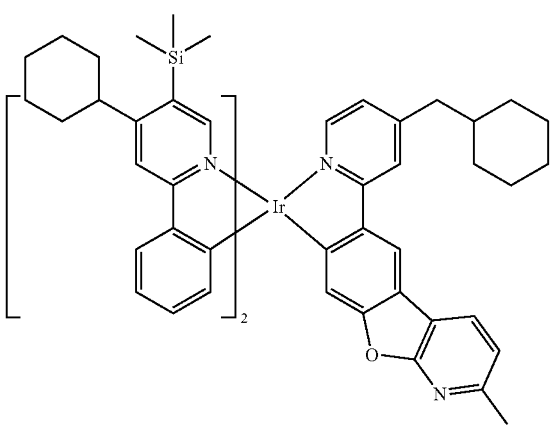
390
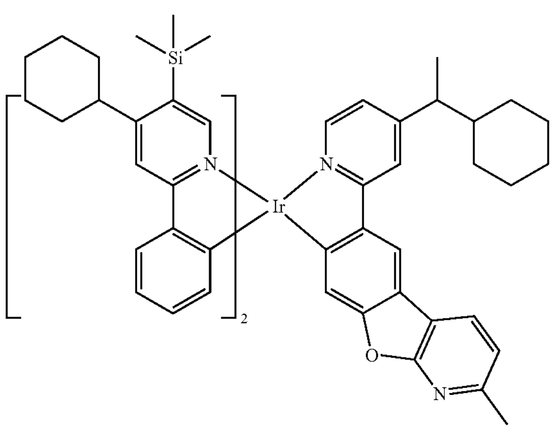
-continued
391
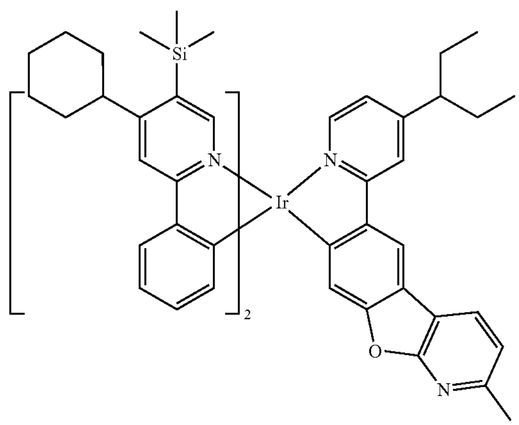
392
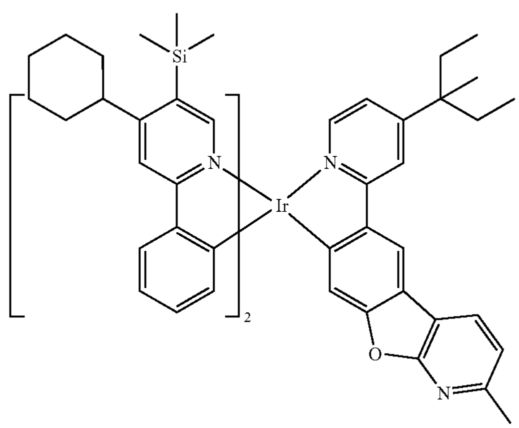
393
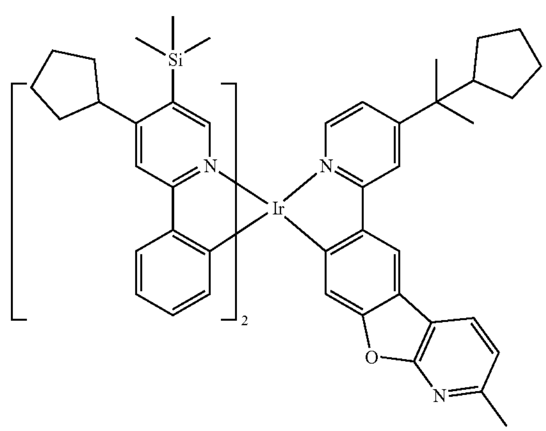

-continued
394
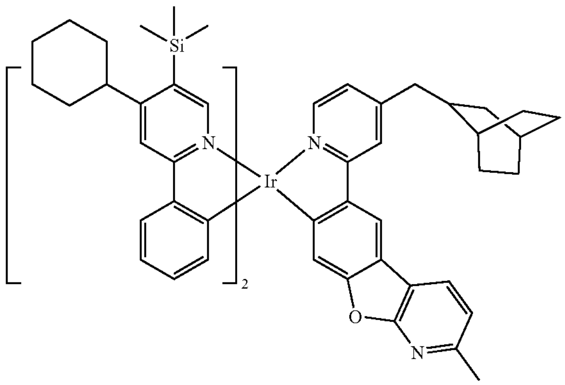
395
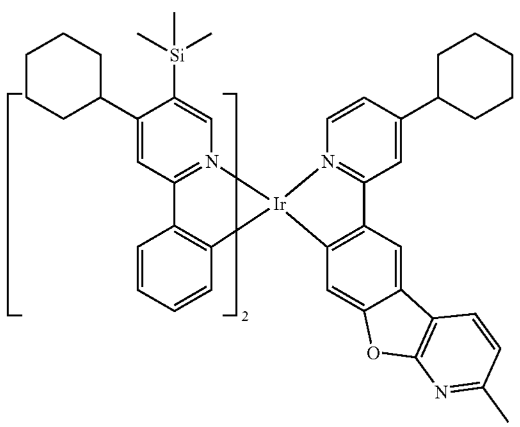
396
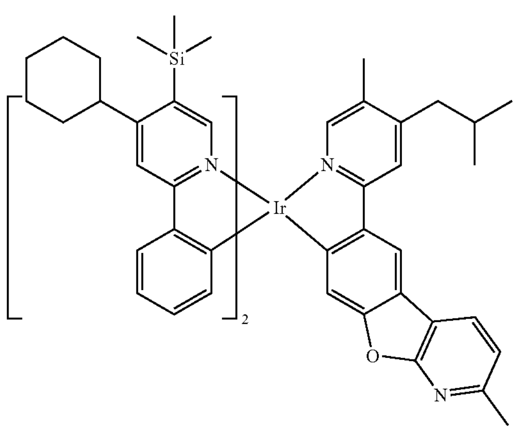
-continued
397
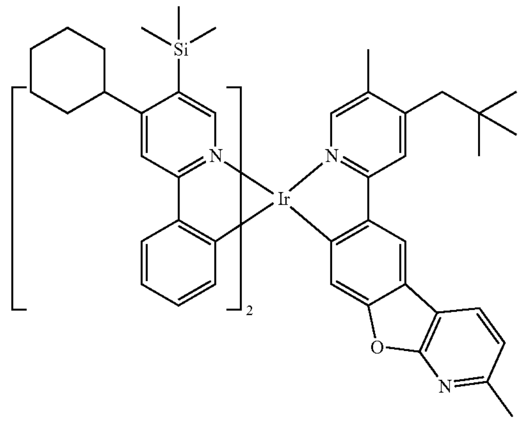
398
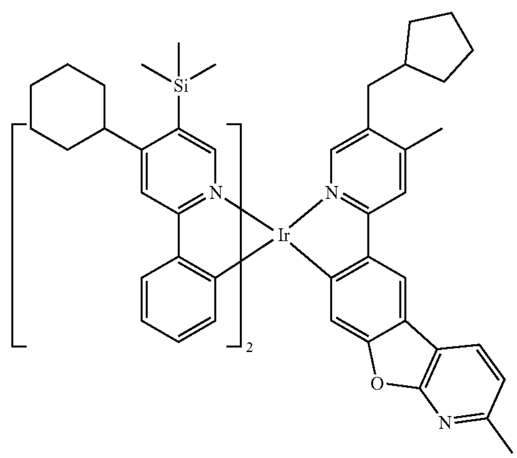
399
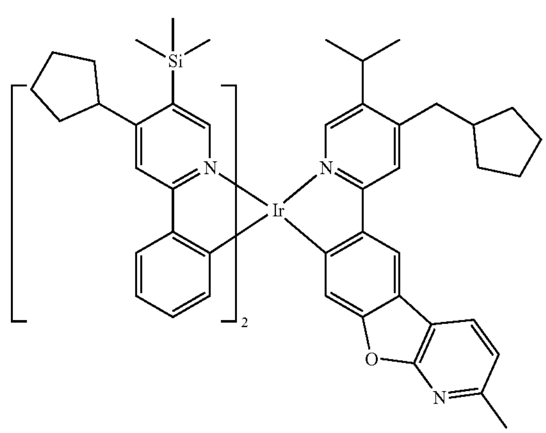

-continued
400
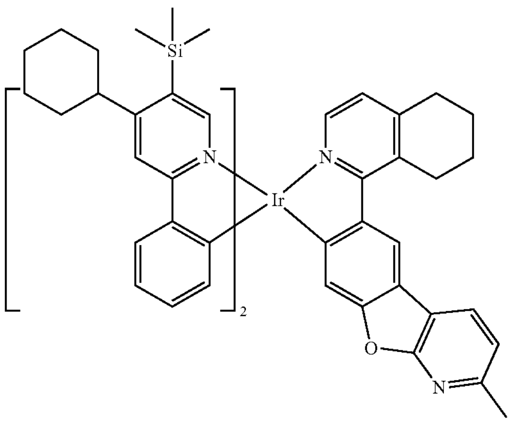
401
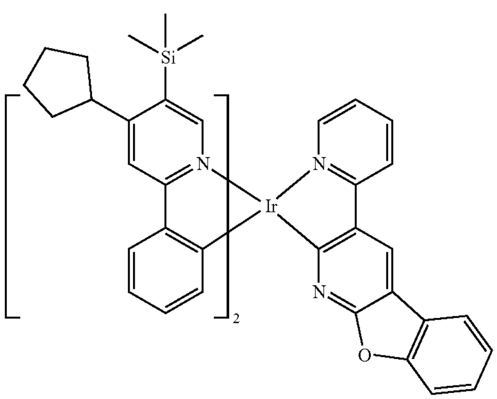
402
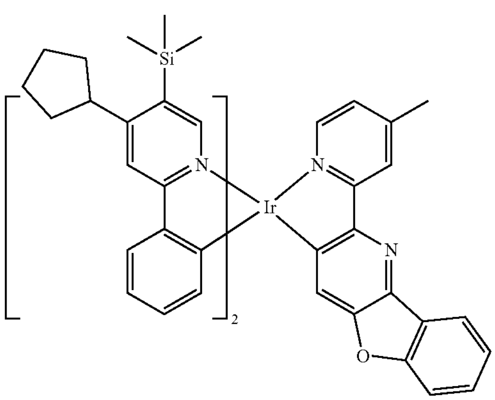
-continued
403
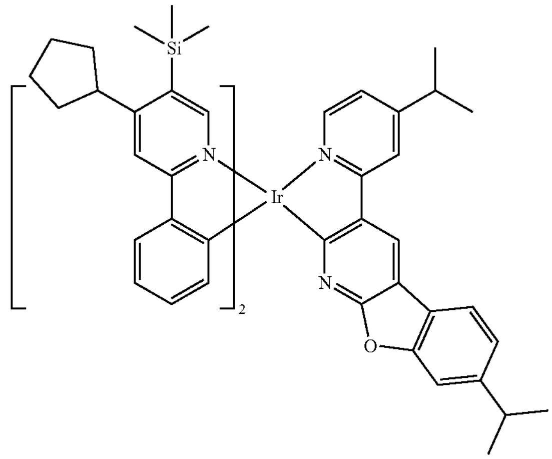
404
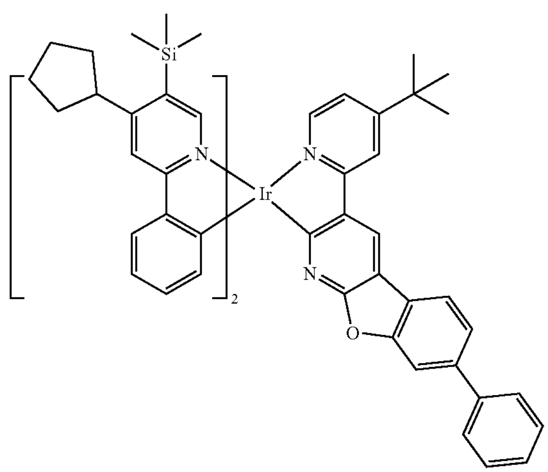
405
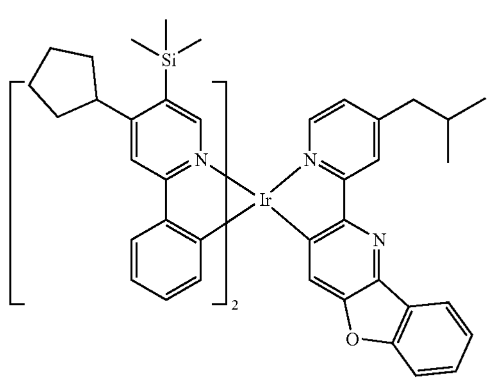

-continued
406
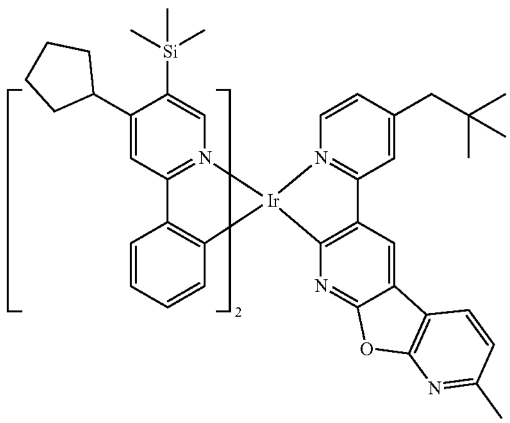
407
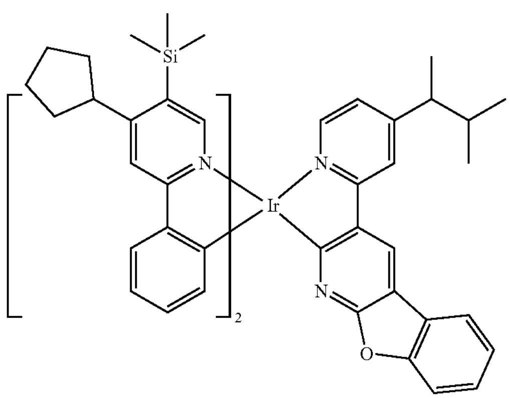
408
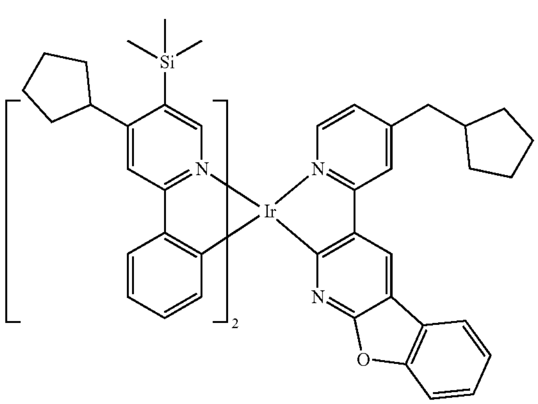
-continued
409
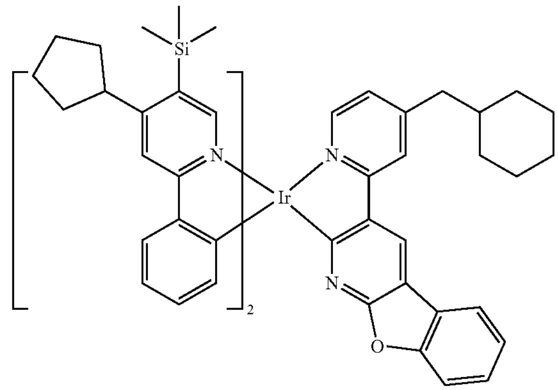
410
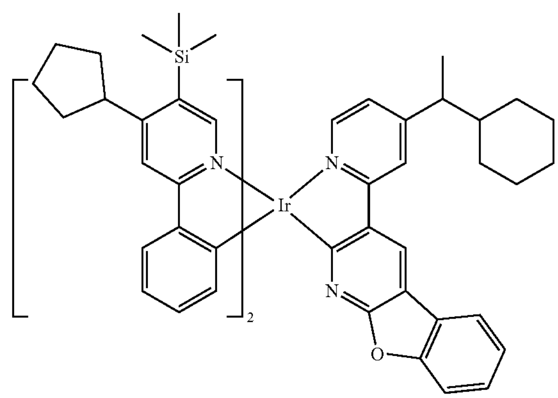
411
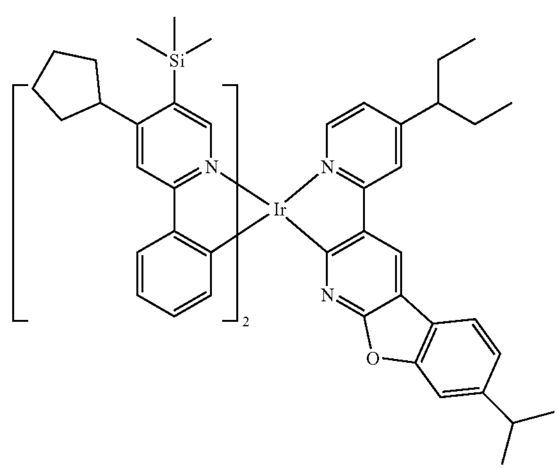

-continued
412
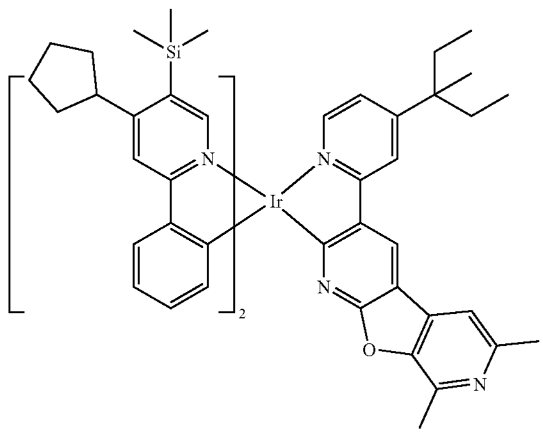
415
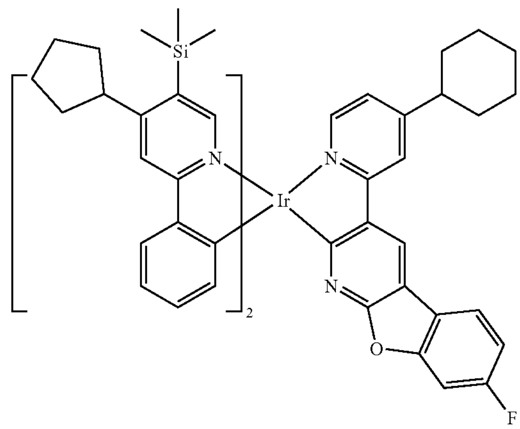
413
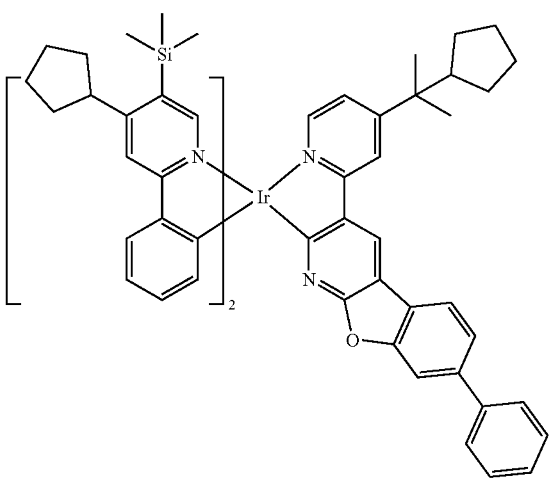
416
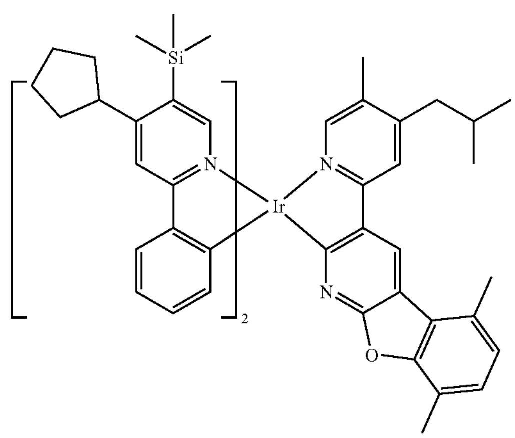
414
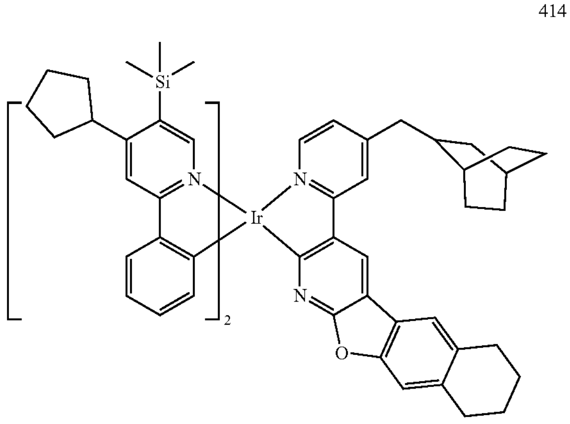
417
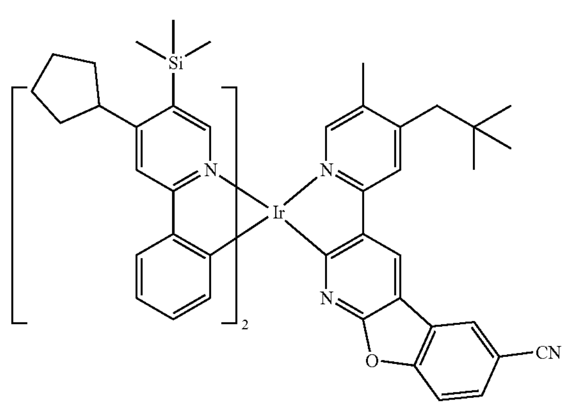

-continued
418
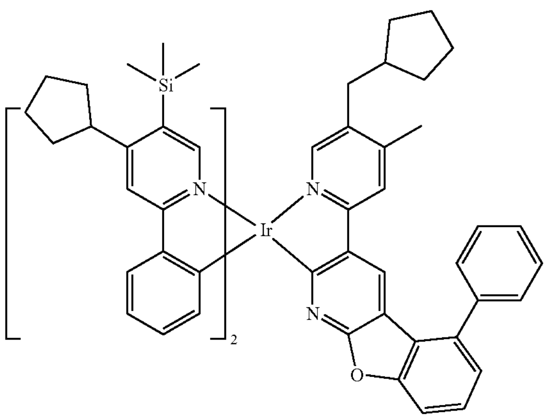
419
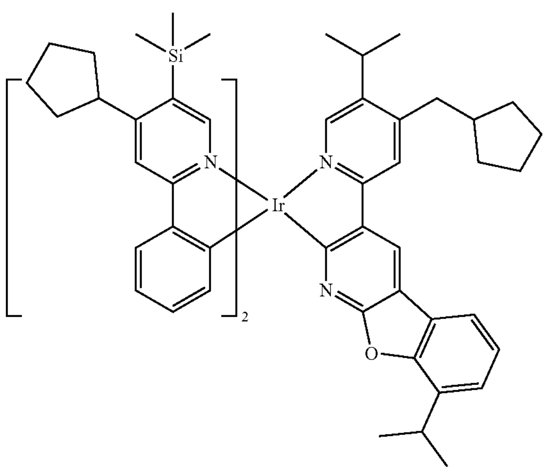
420
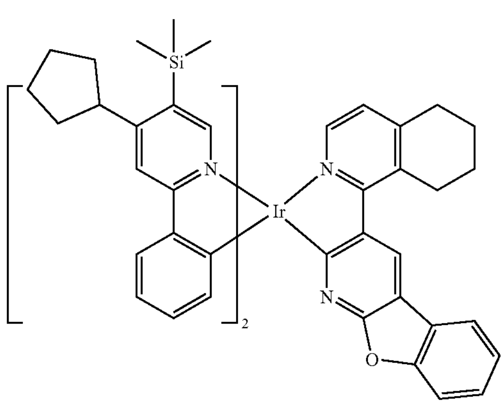
-continued
421
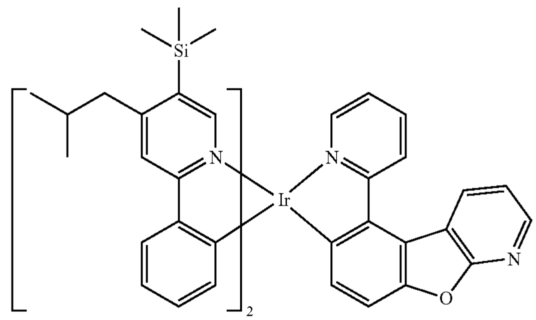
422
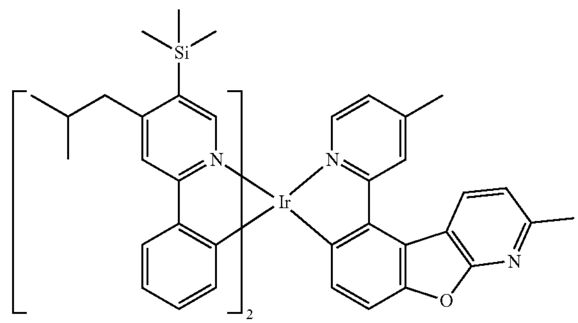
423
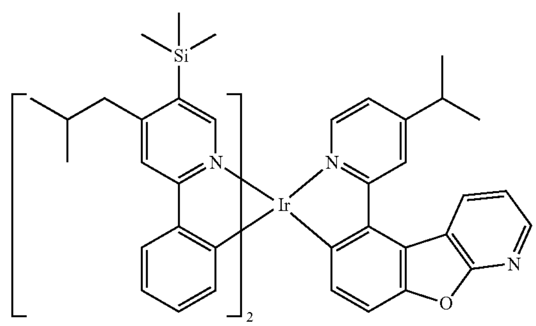
424
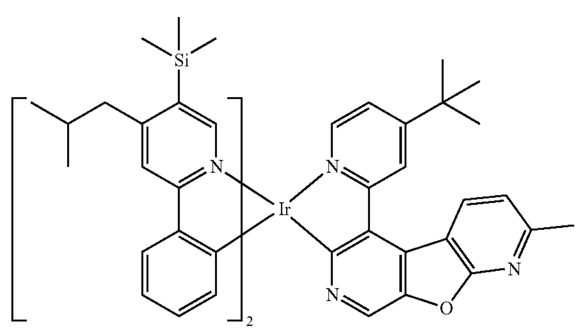

-continued
425
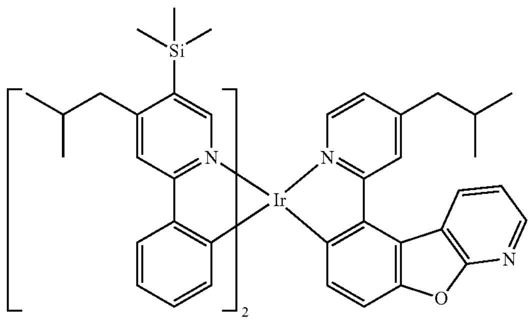
426
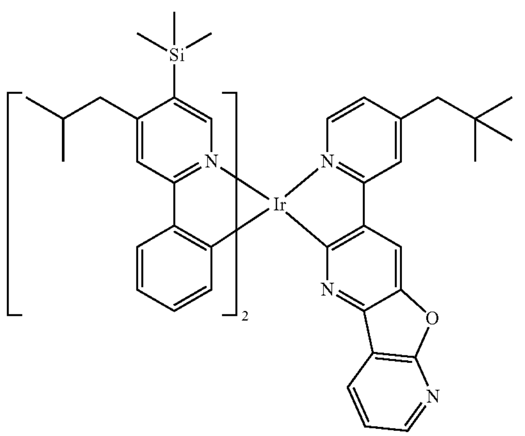
427
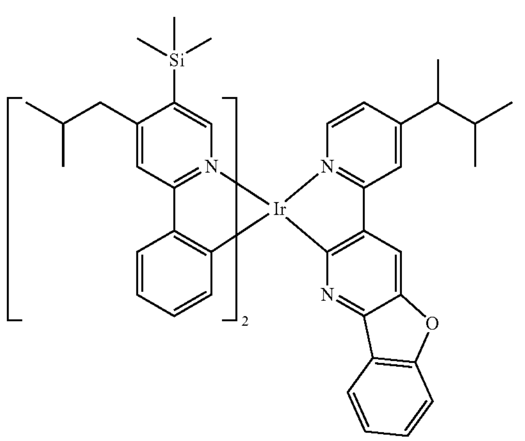
-continued
428
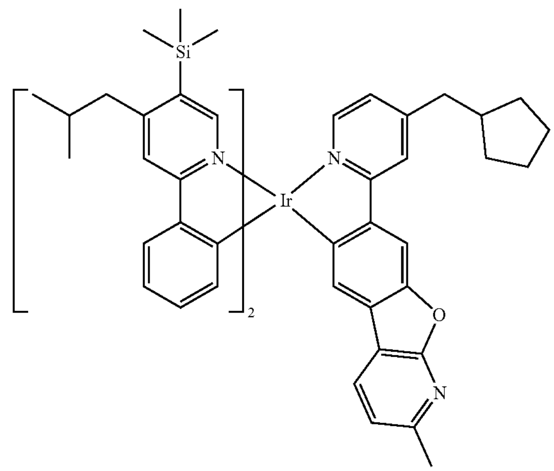
429
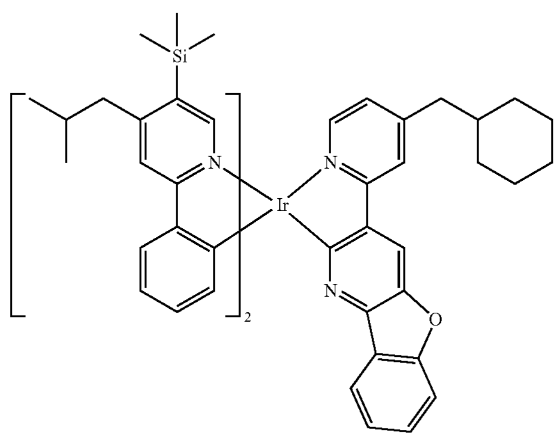
430
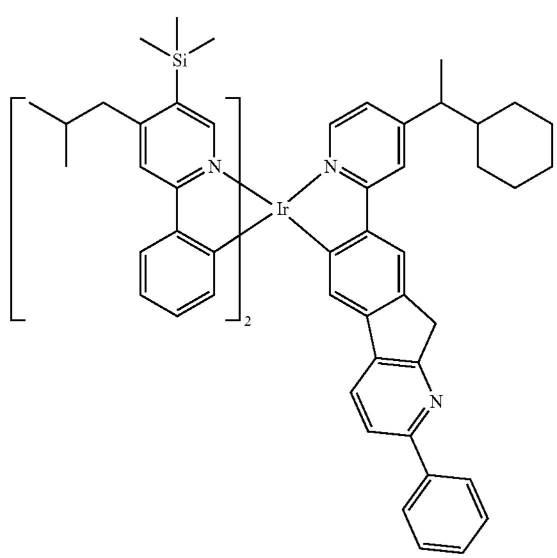

-continued
431
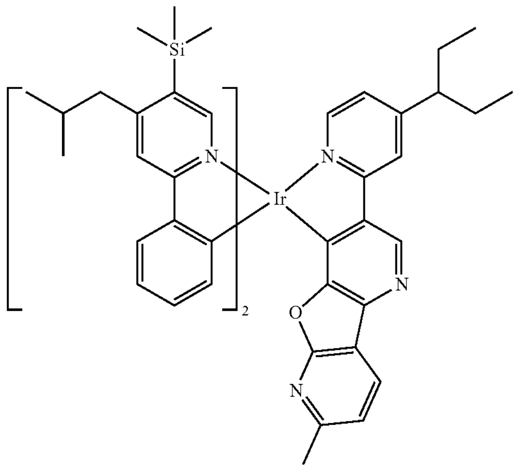
432
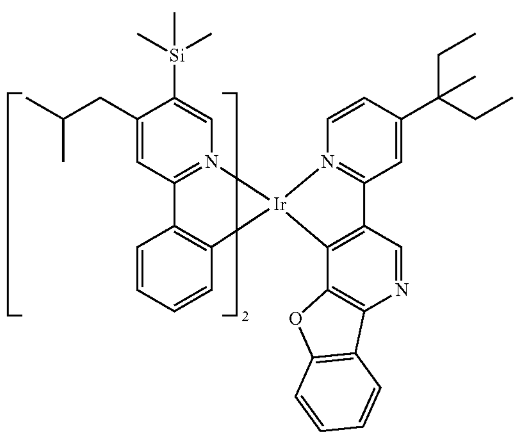
433
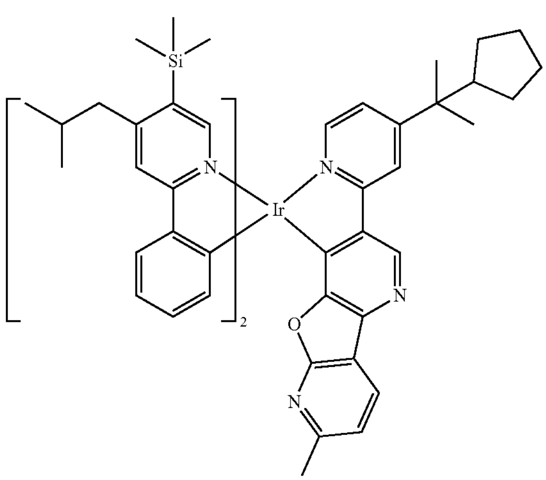
-continued
434
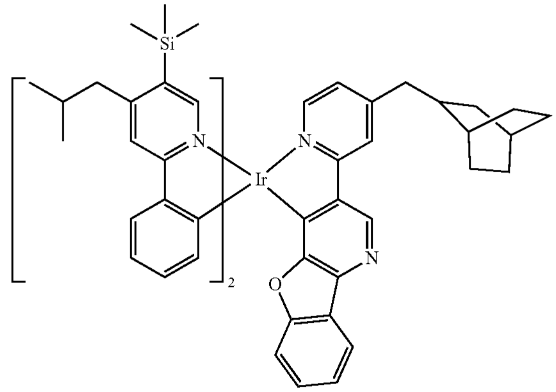
435
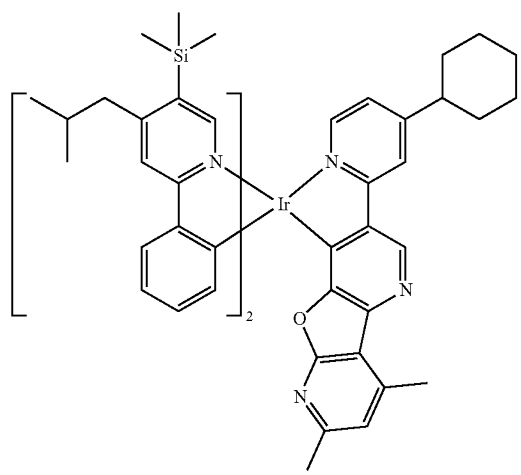
436
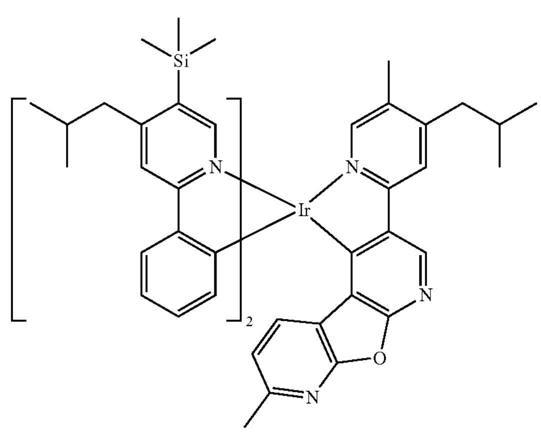

437
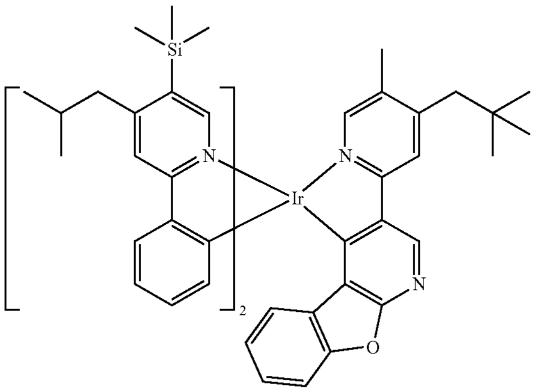
438
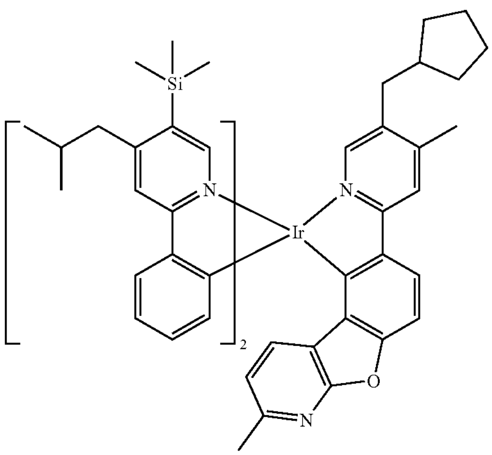
439
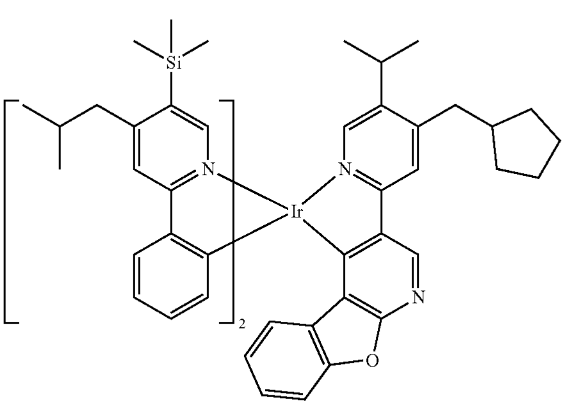
440
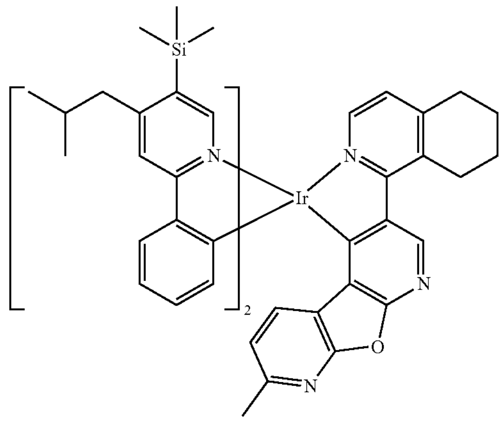
441
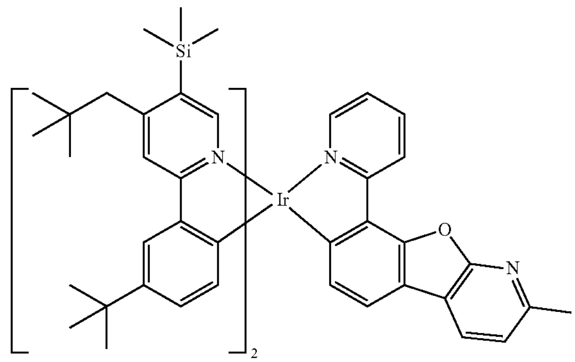
442
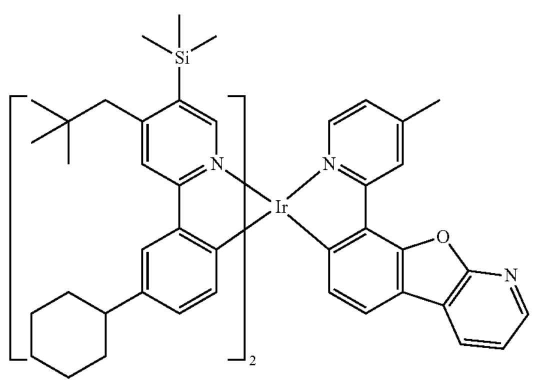
443
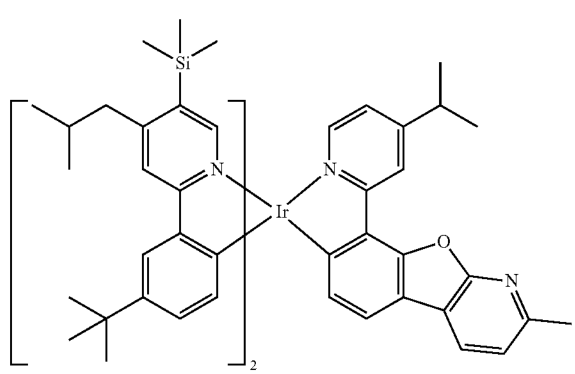

444
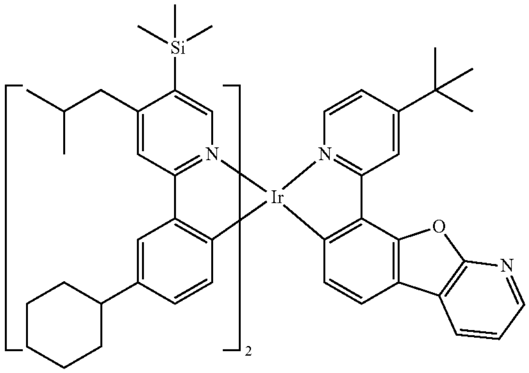
445
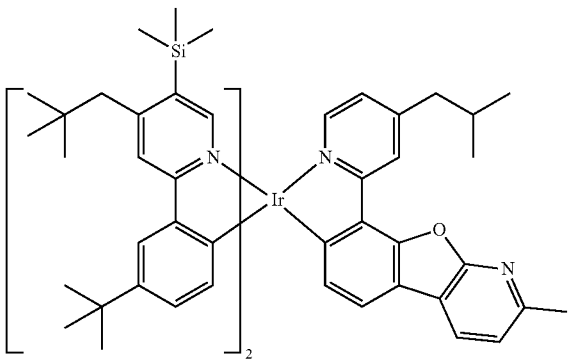
446
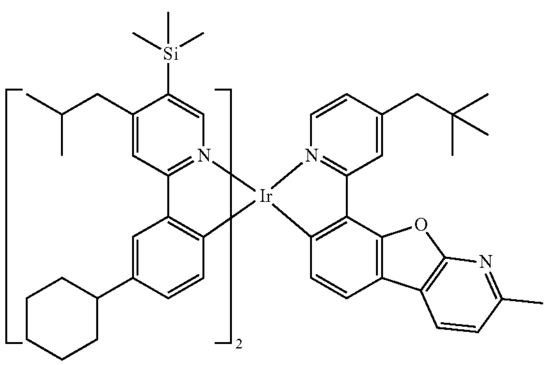
447
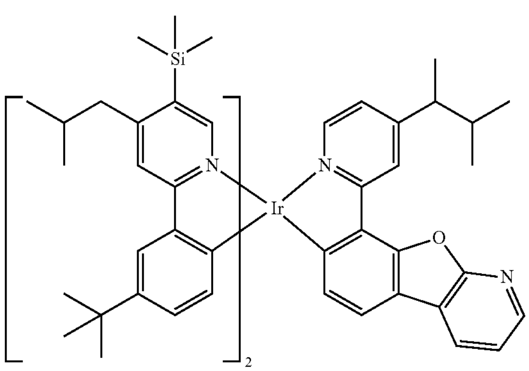
448
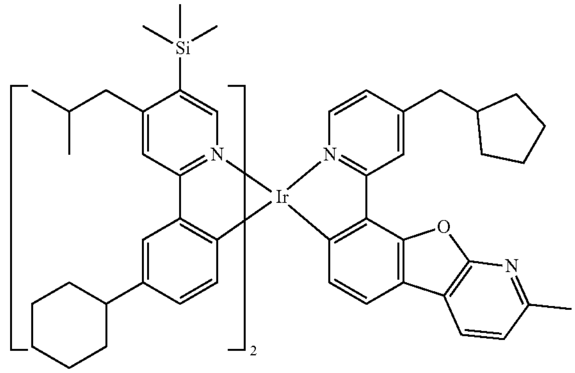
449
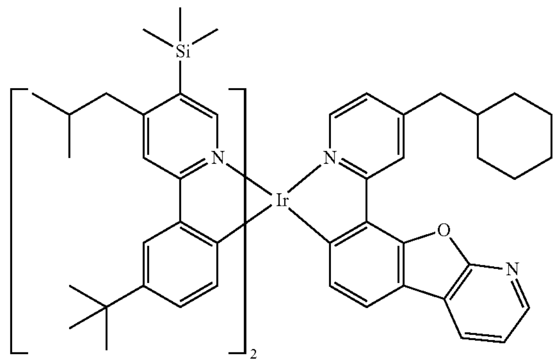
450
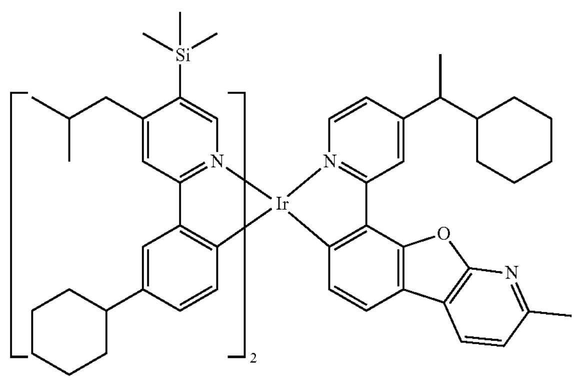
451
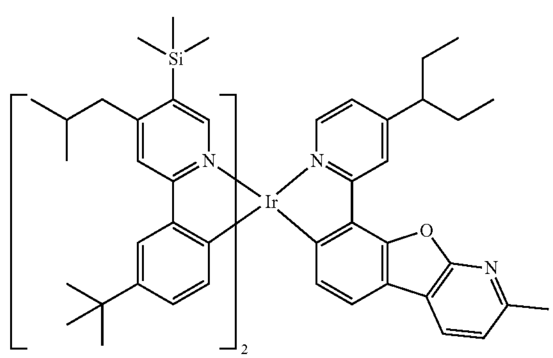

-continued
452
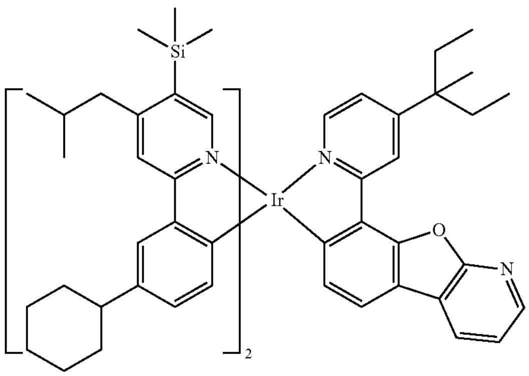
453
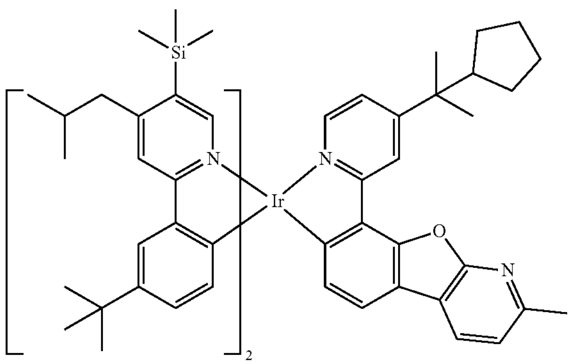
454
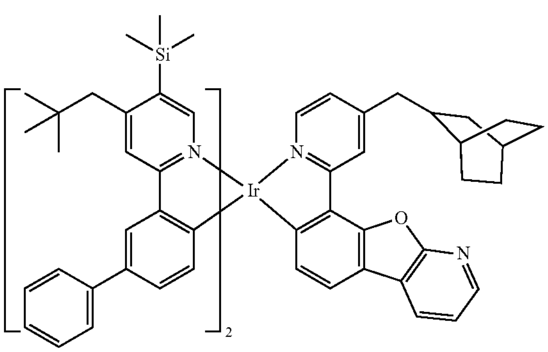
455
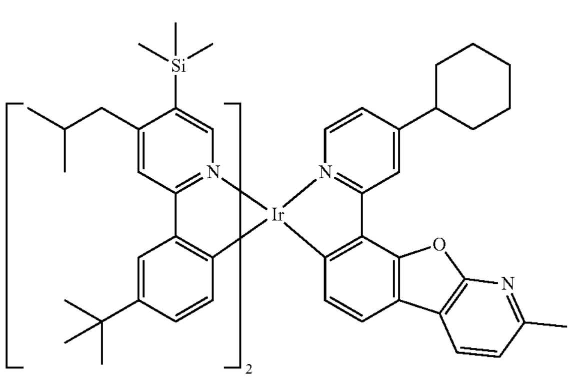
-continued
456
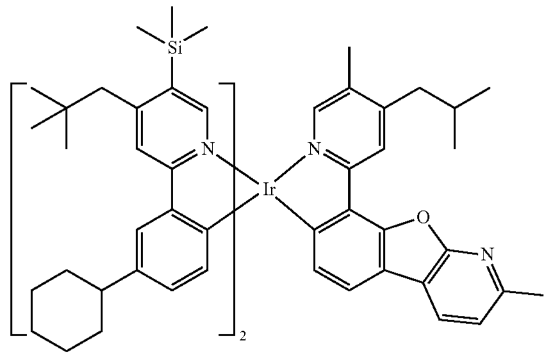
457
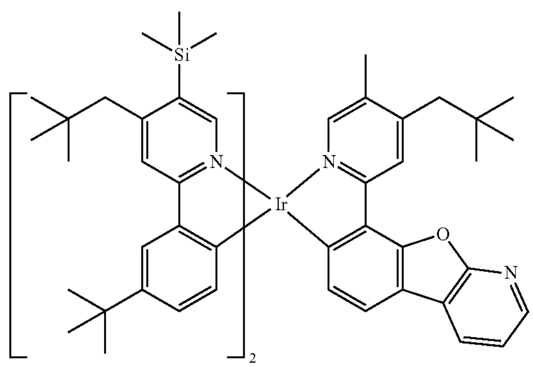
458
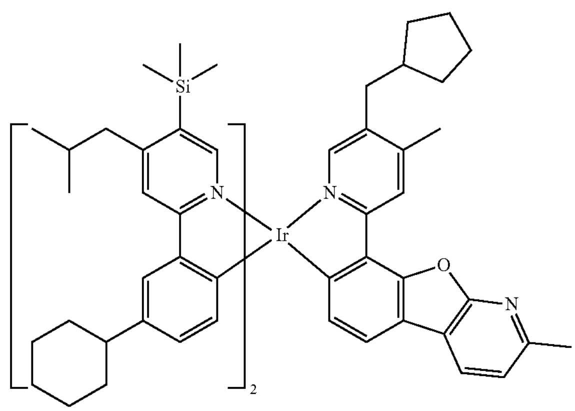
459
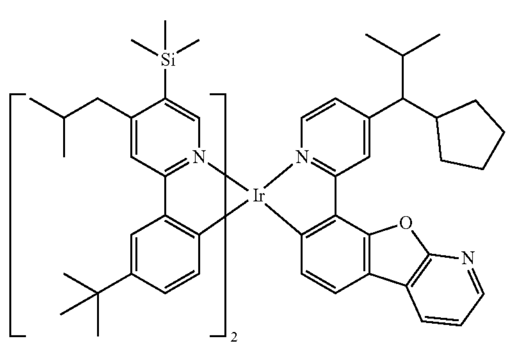

-continued
460
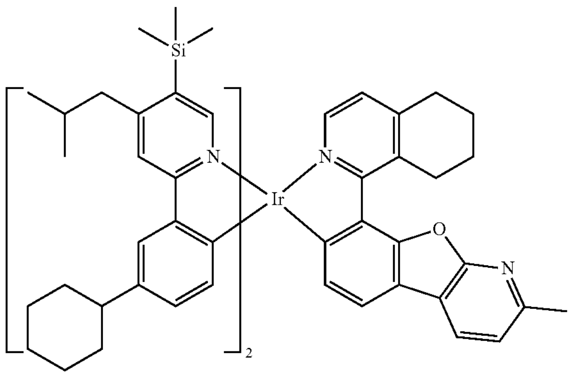
461
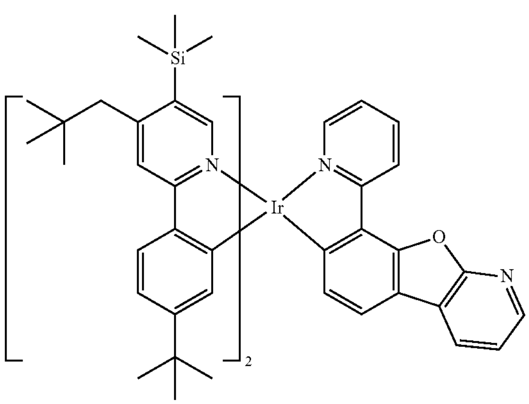
462
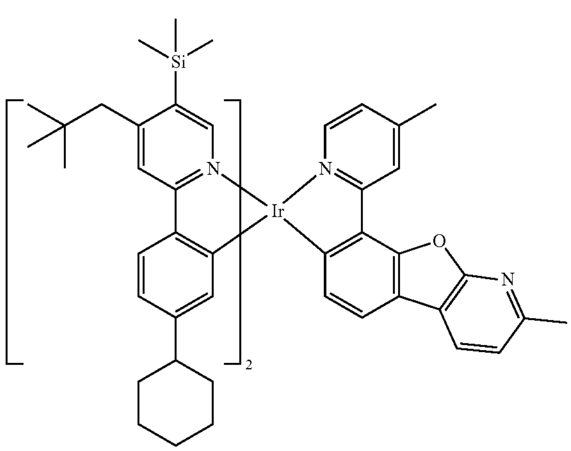
-continued
463
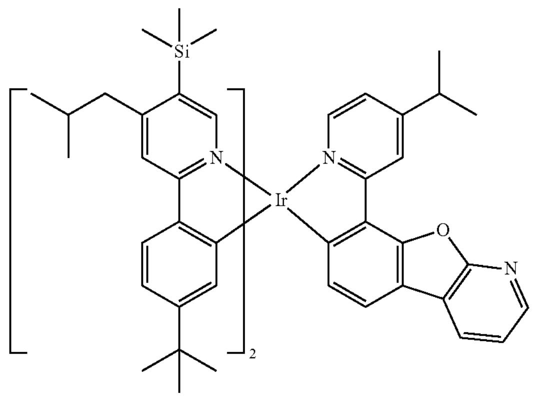
464
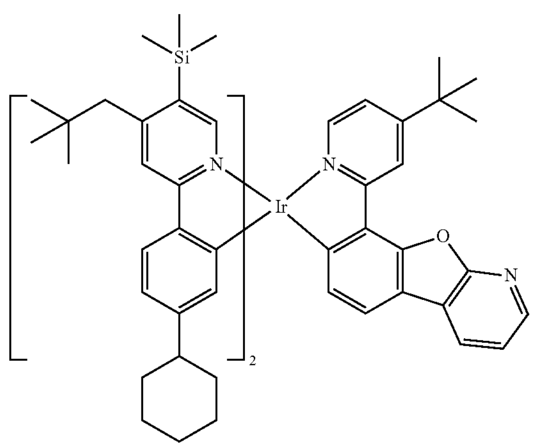
465
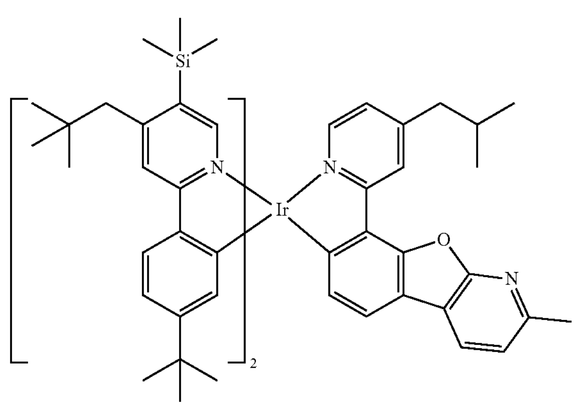

-continued
466
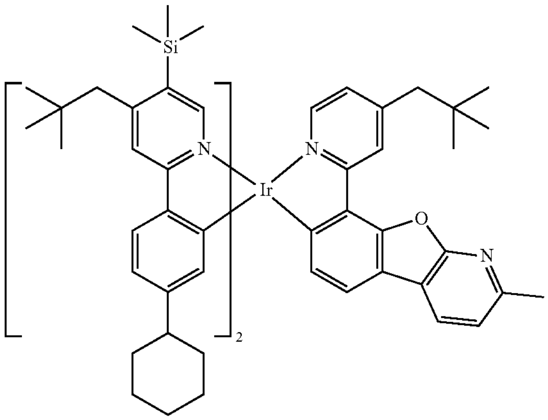
467
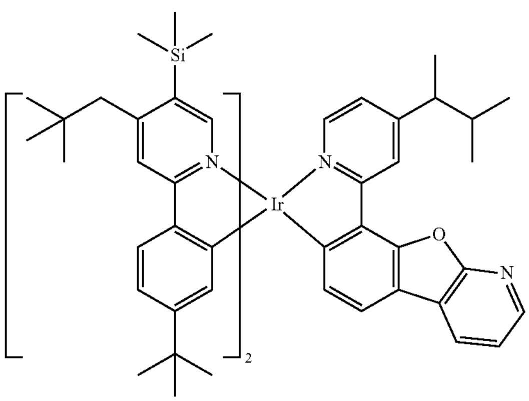
468
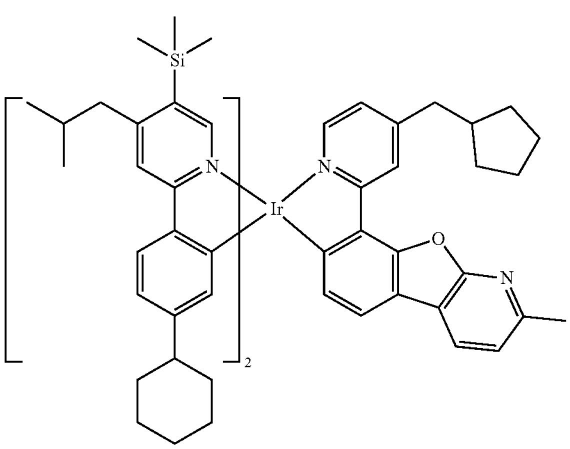
-continued
469
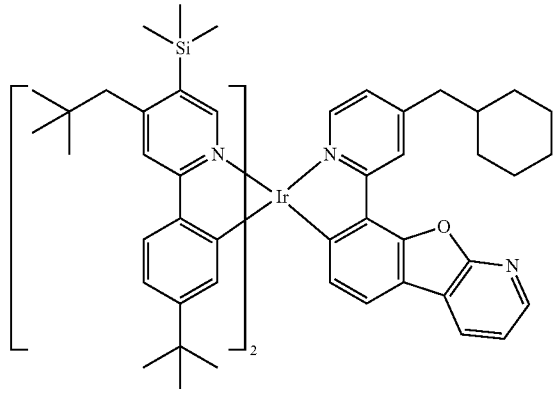
470
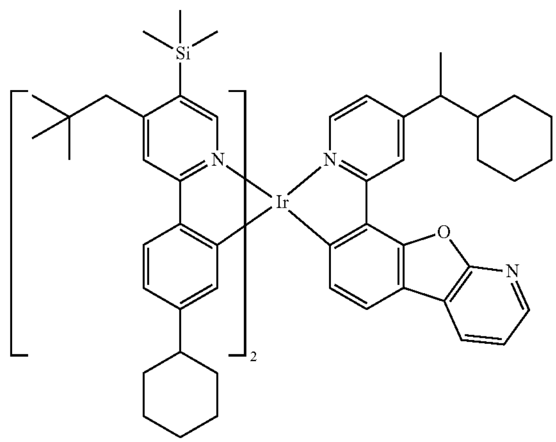
471
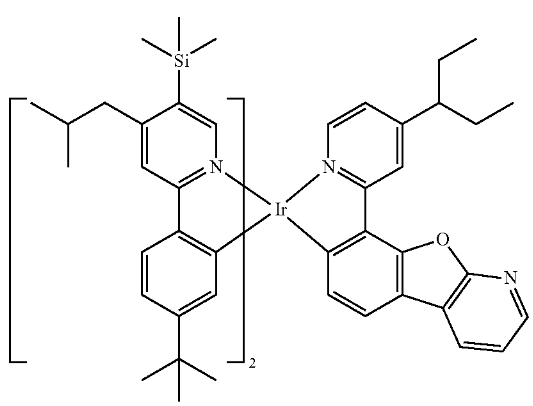

-continued
472
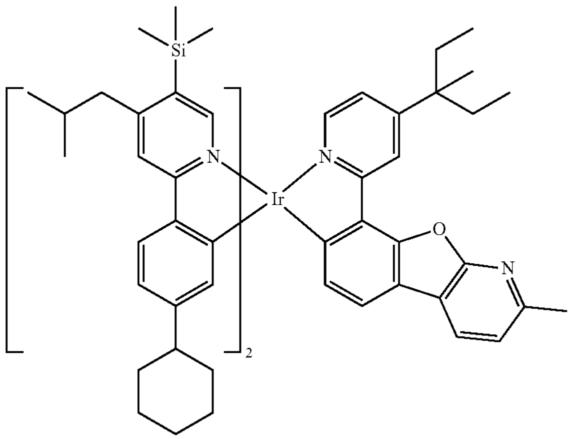
473
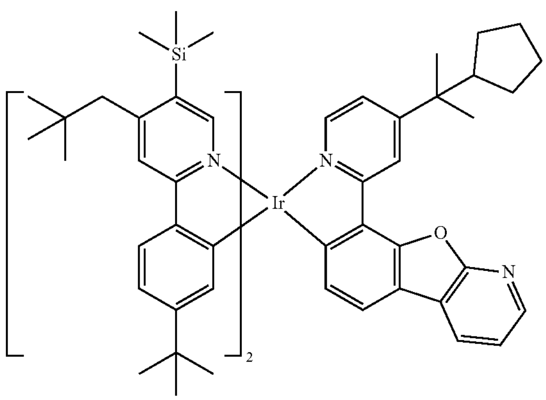
474
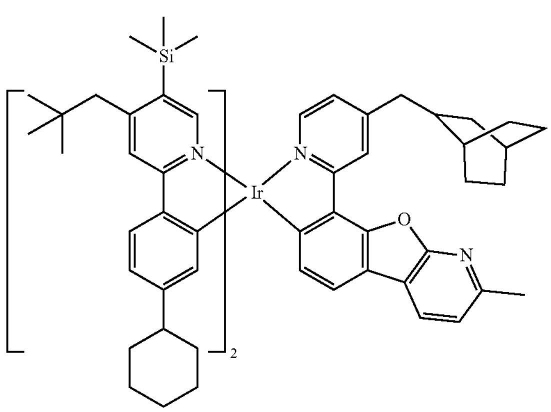
-continued
475
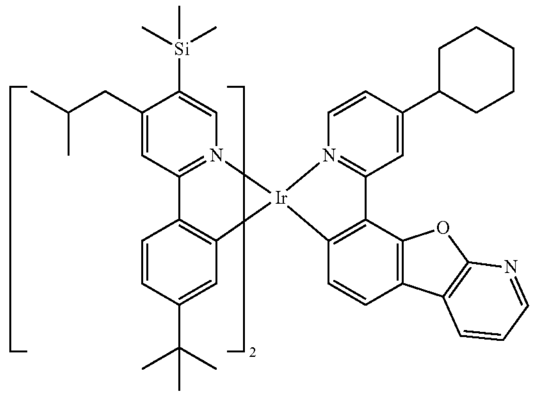
476
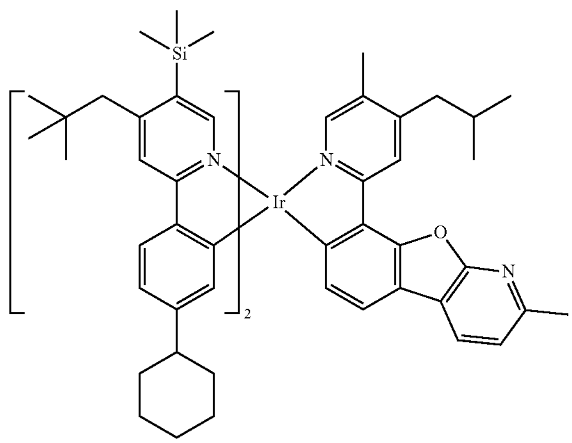
477
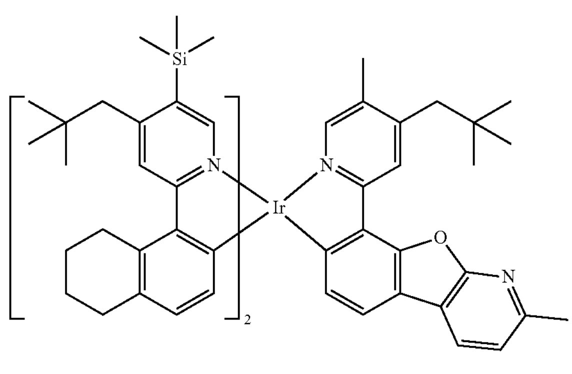

-continued
478
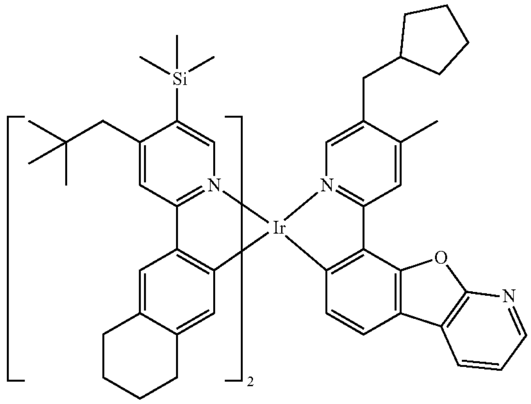
479
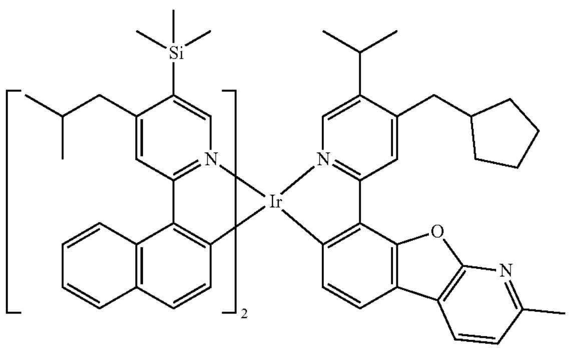
480
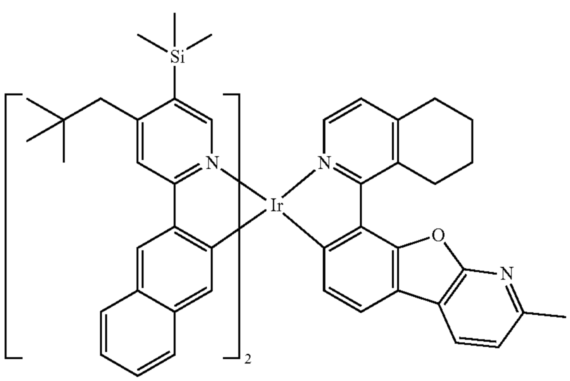
481
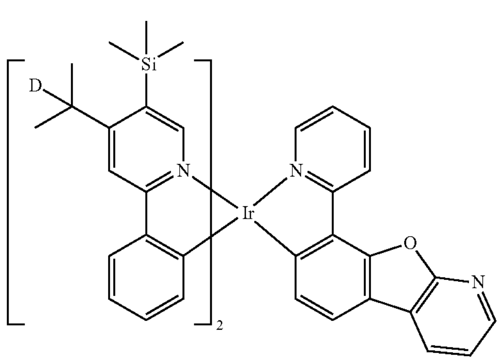
-continued
482
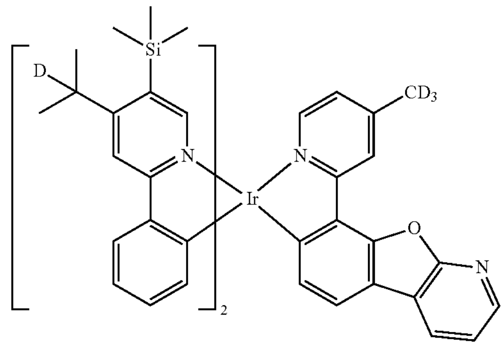
483
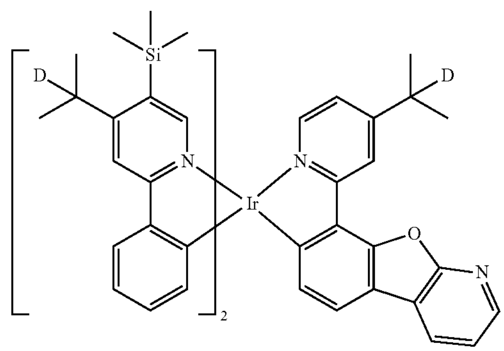
484
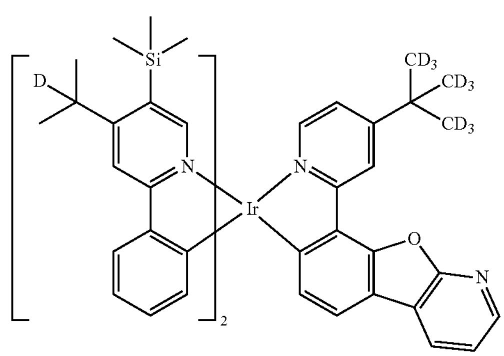
485
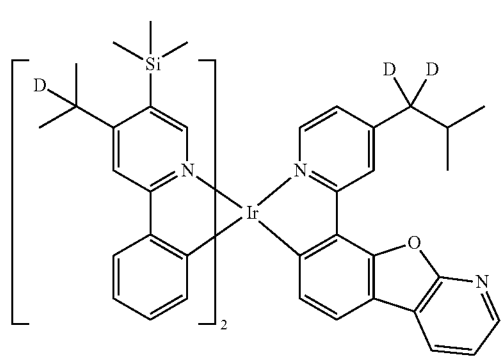

-continued
486
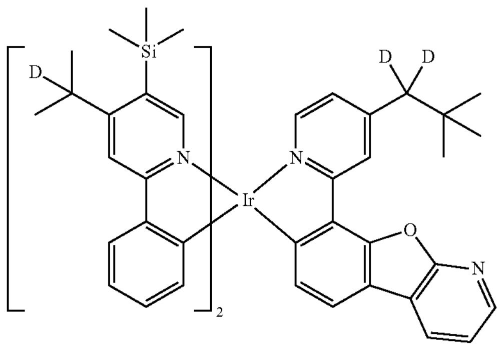
487
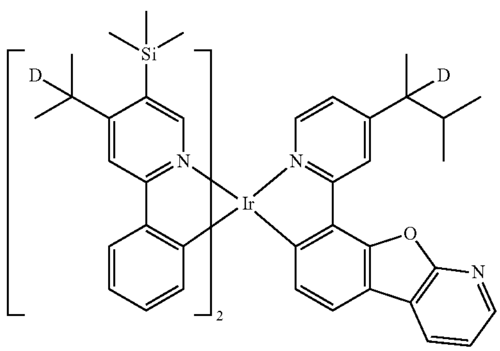
488
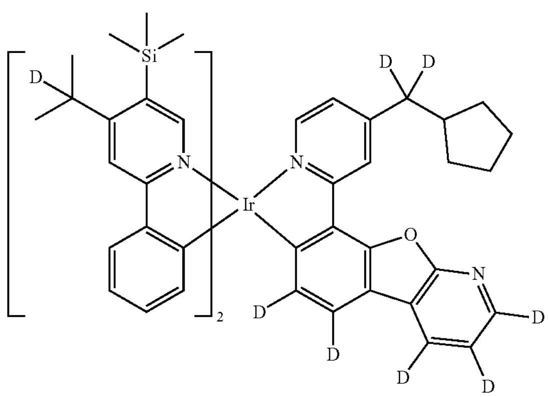
489
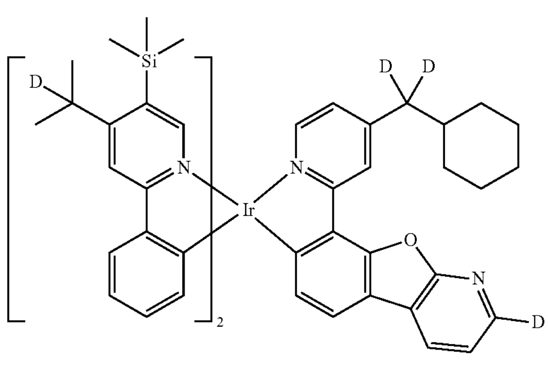
-continued
490
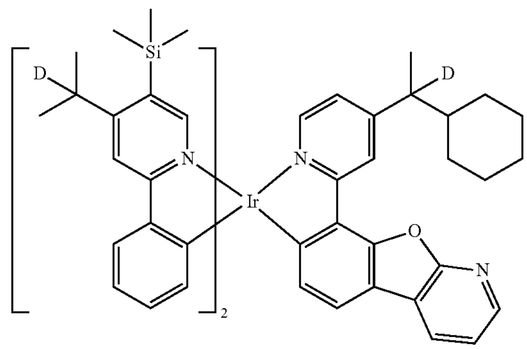
491
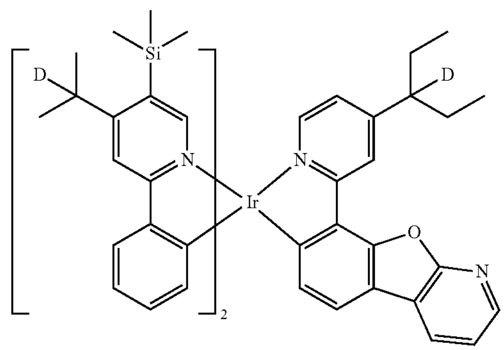
492
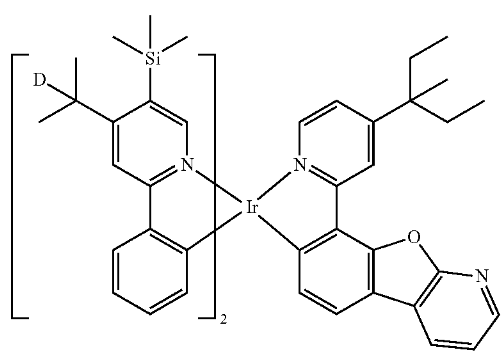
493
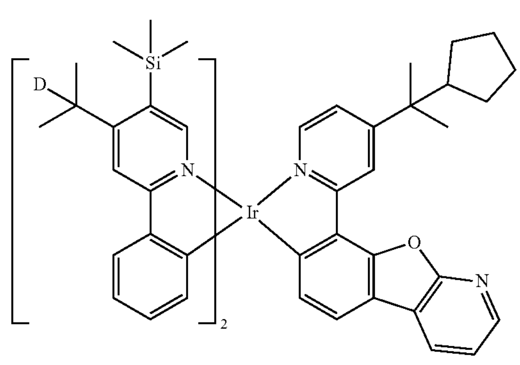

-continued
494
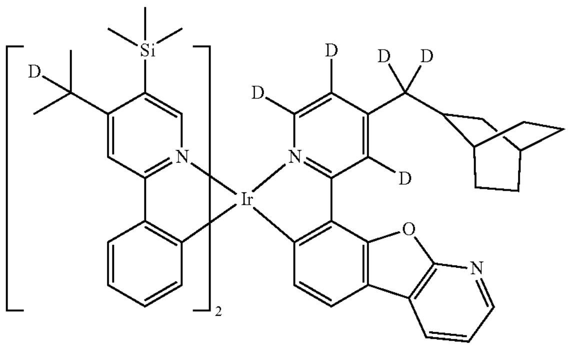
495
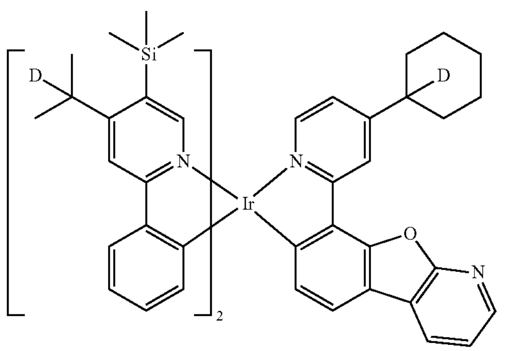
496
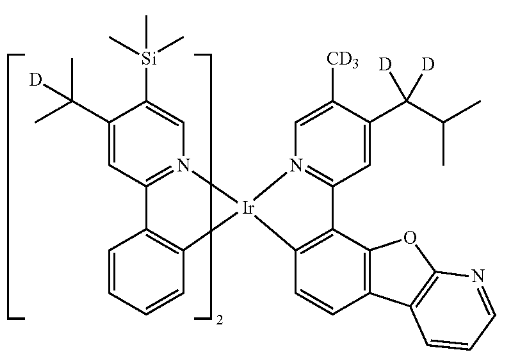
497
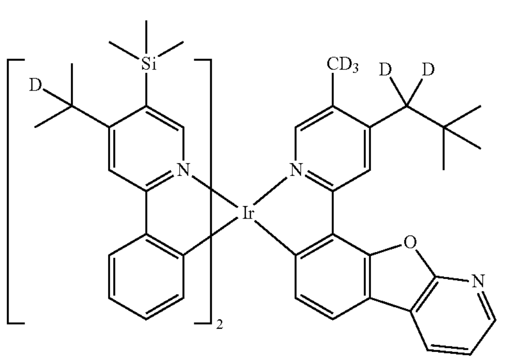
-continued
498
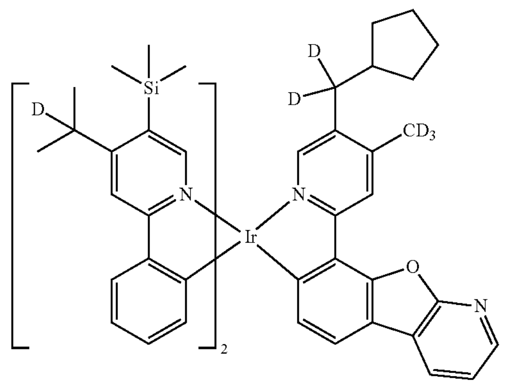
499
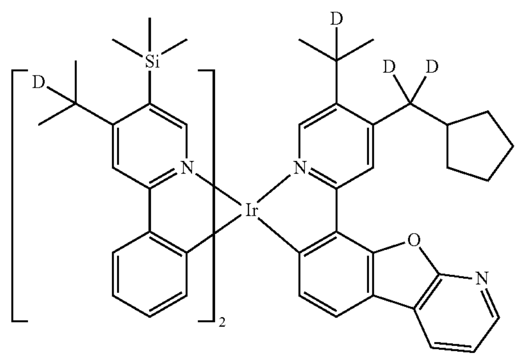
500
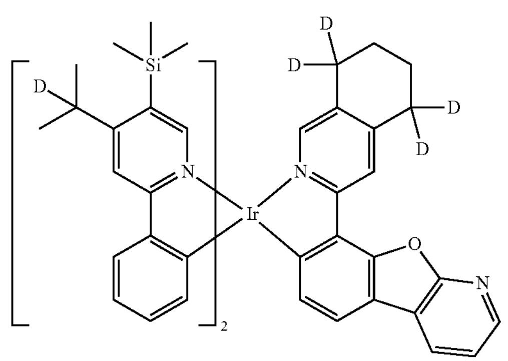
501
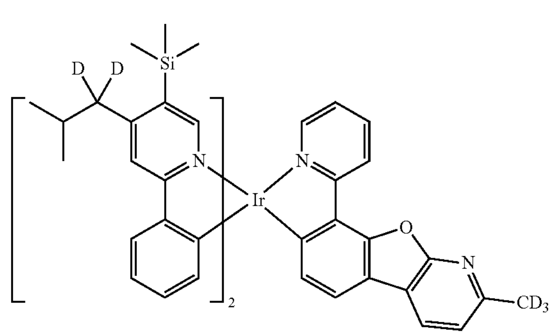

502
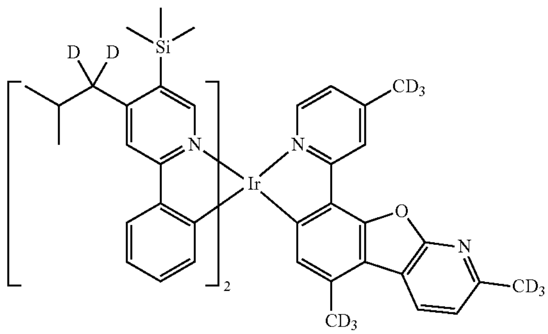
503
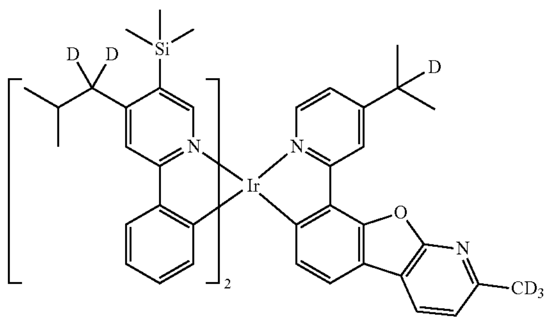
504
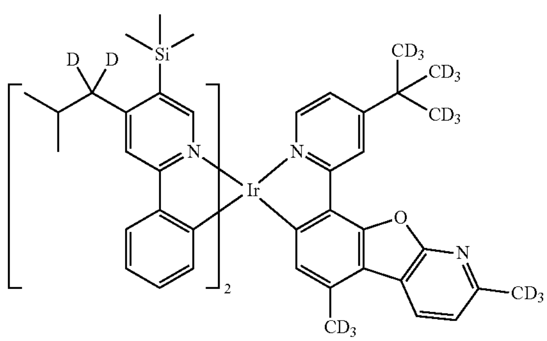
505
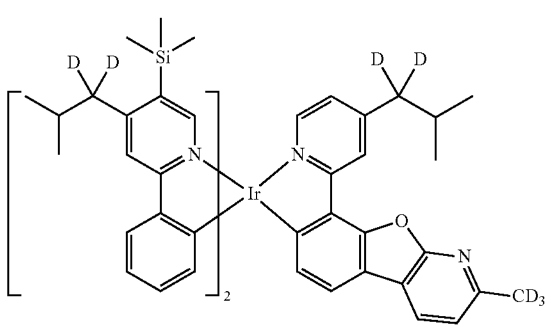
506
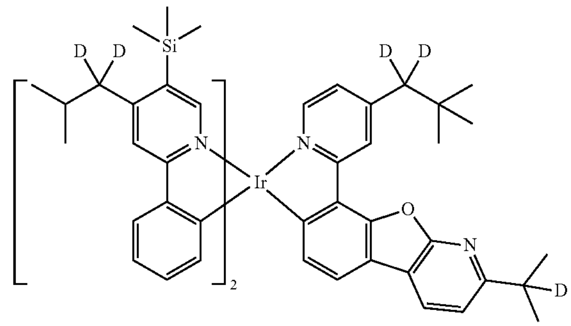
507
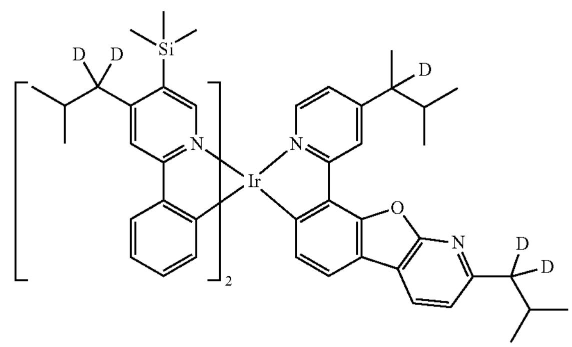
508
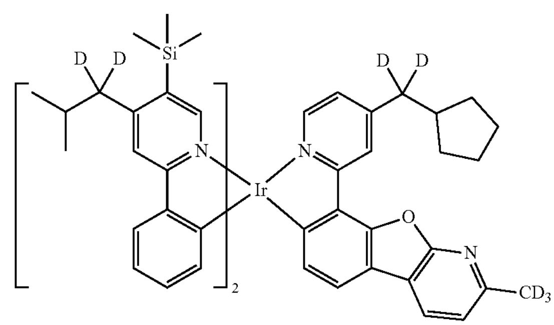
509
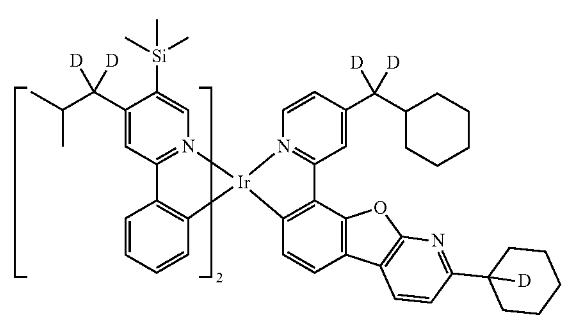

-continued
510
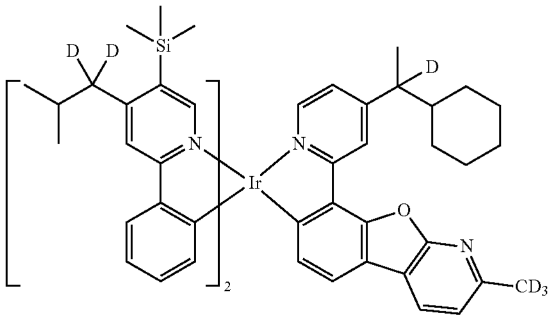
511
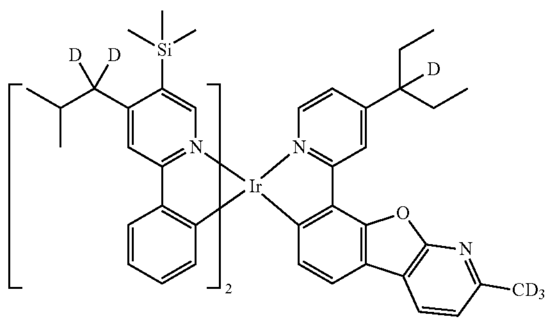
512
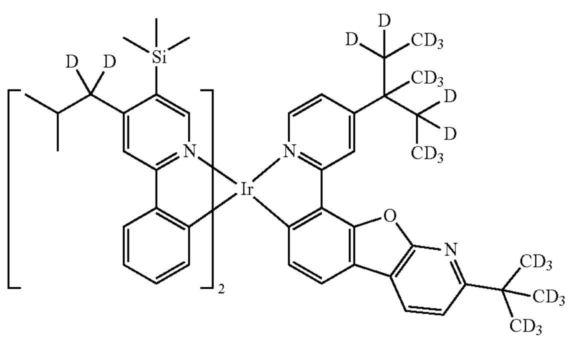
513
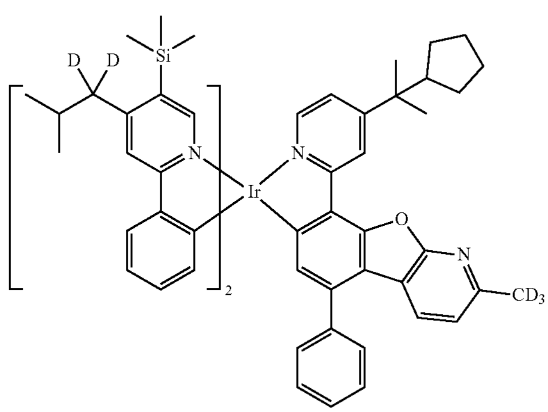
-continued
514
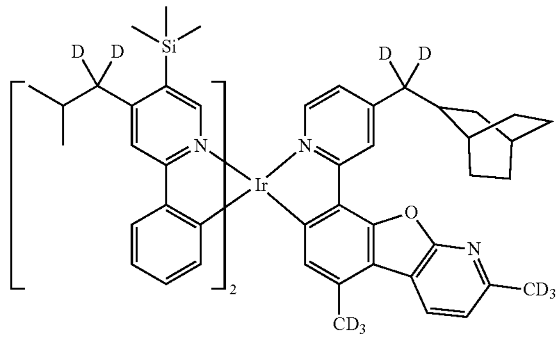
515
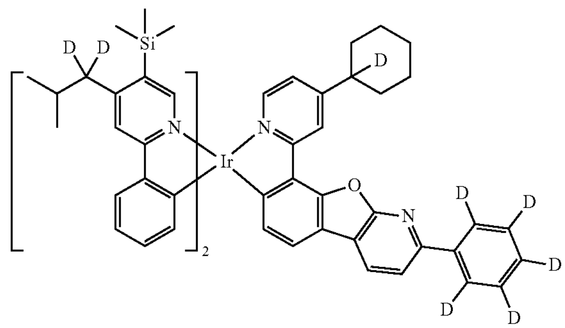
516
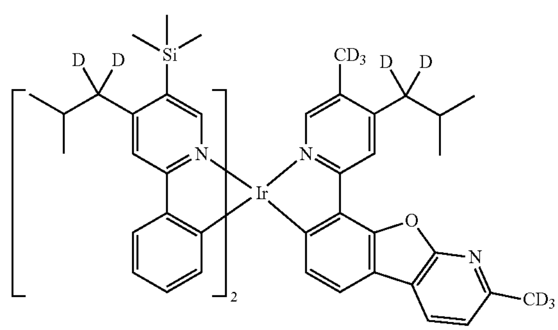
517
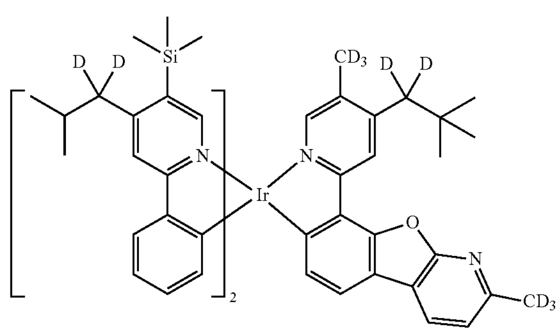

-continued
518
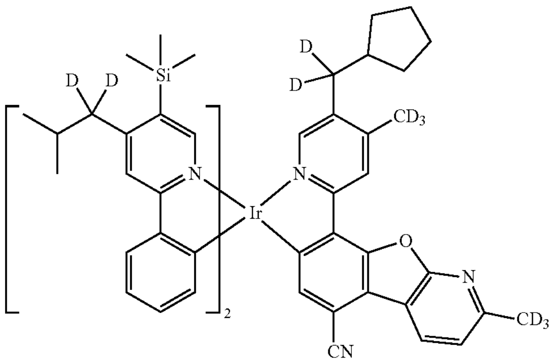
519
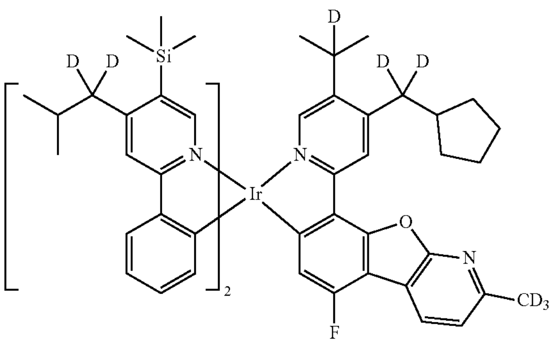
520
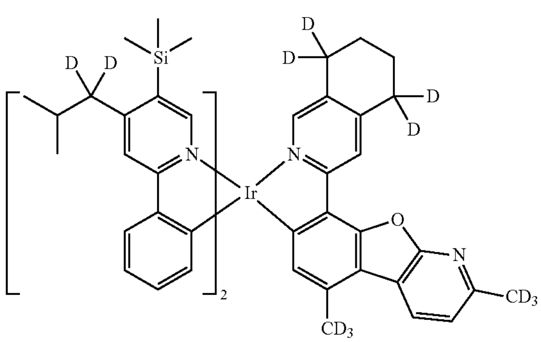
521
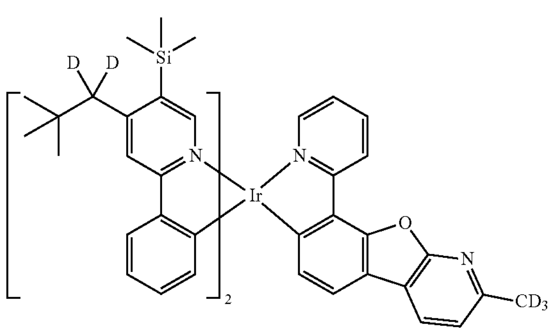
-continued
522
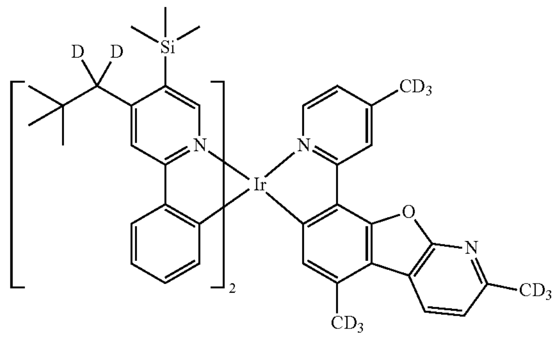
523
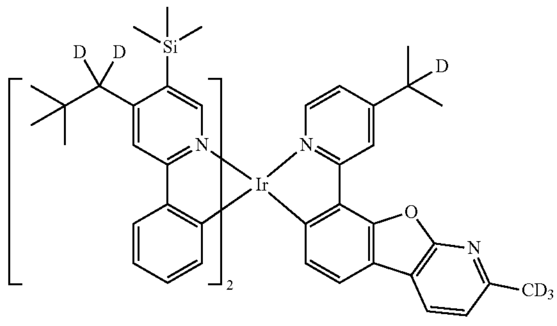
524
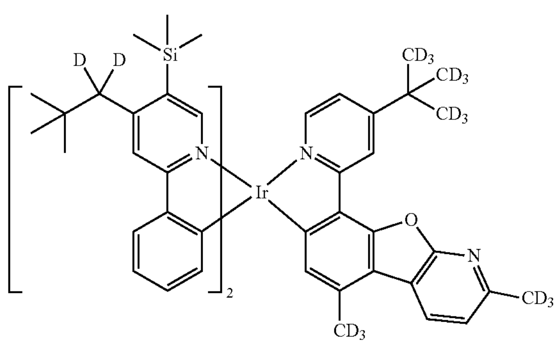
525
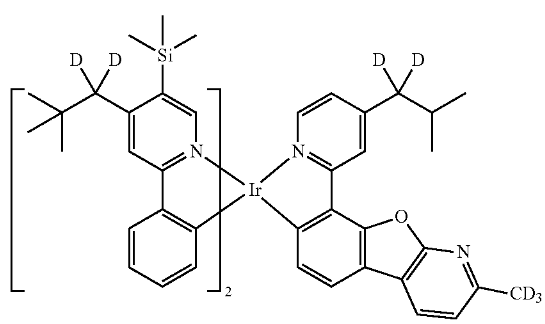

-continued
526
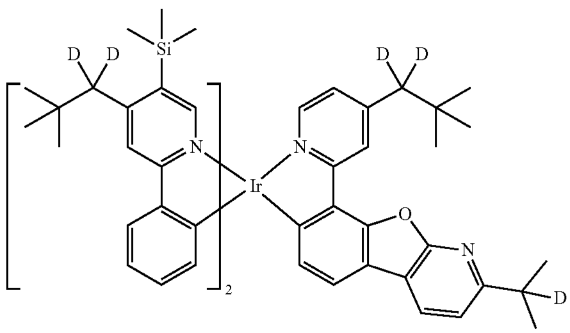
527
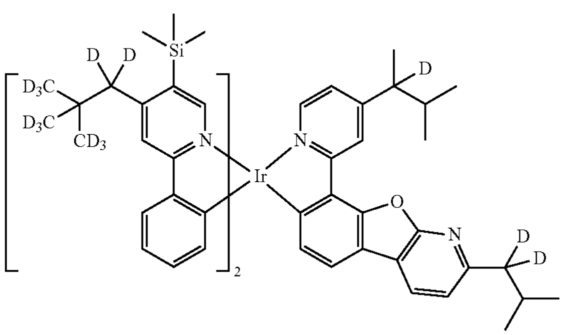
528
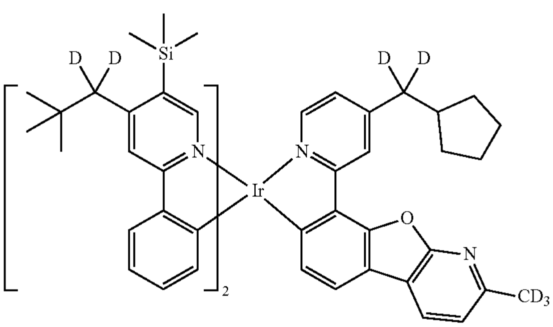
529
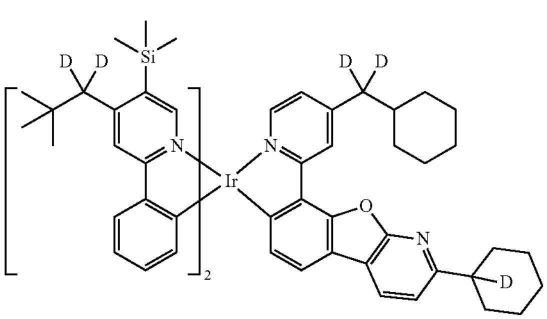
-continued
530
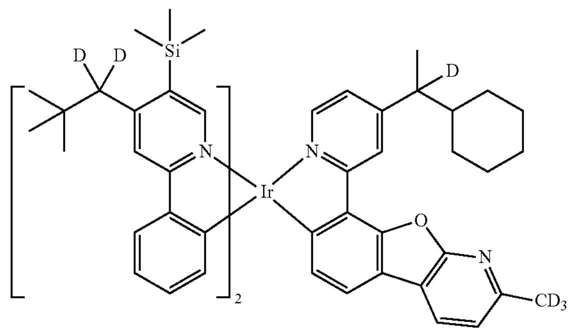
531
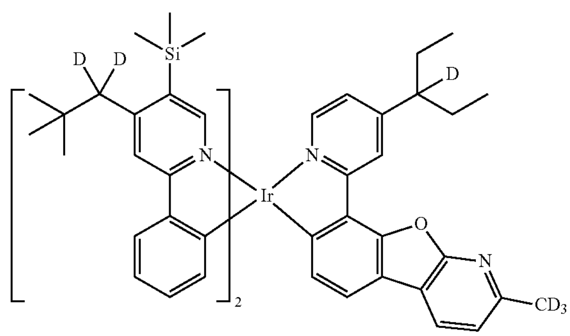
532
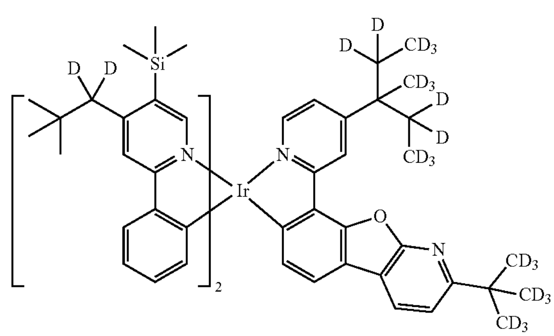
533
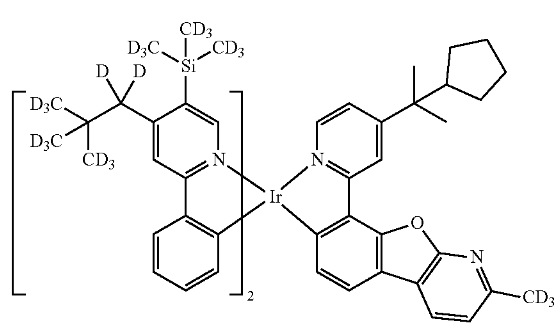

-continued
534
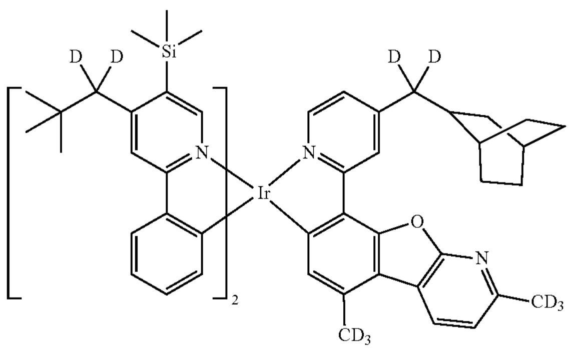
535
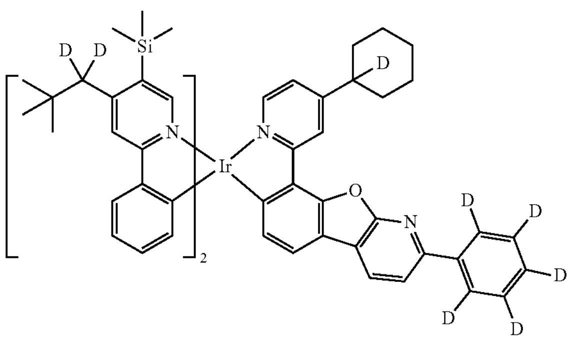
536
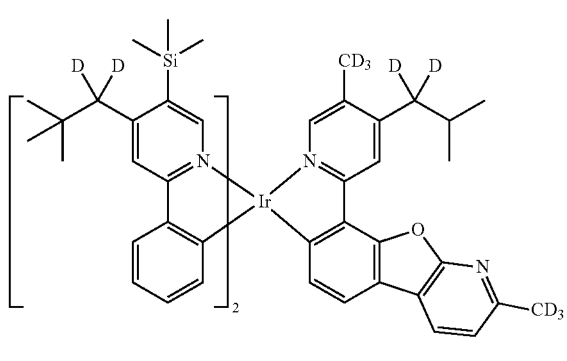
537
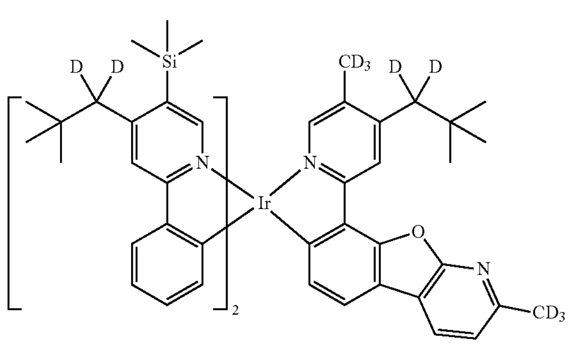
-continued
538
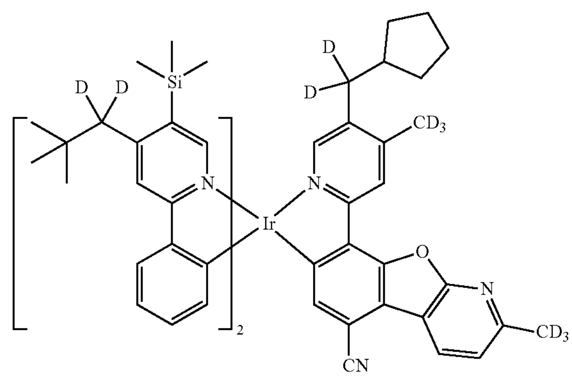
539
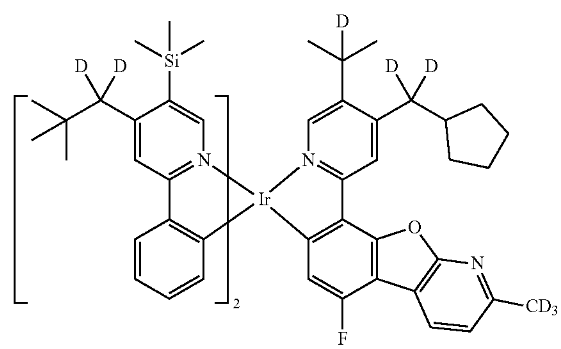
540
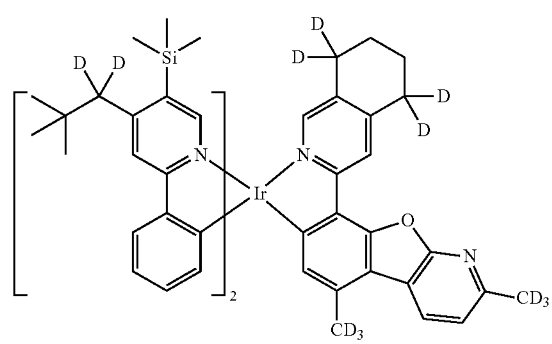
541
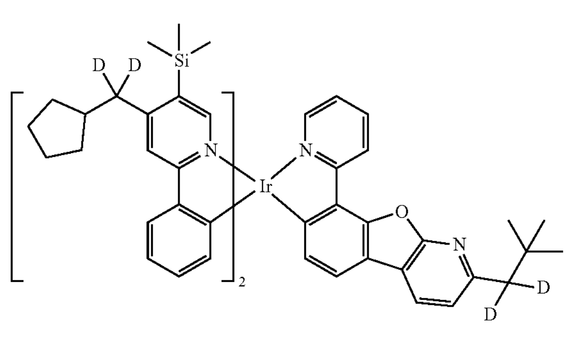

-continued
542
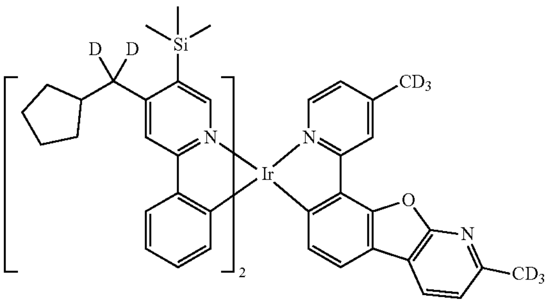
543
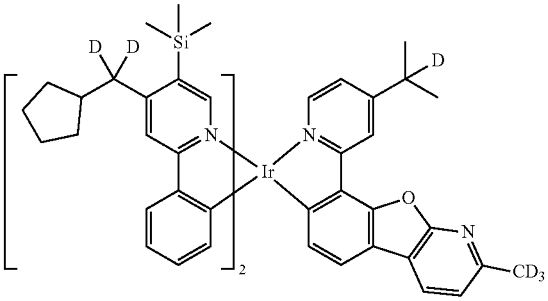
544
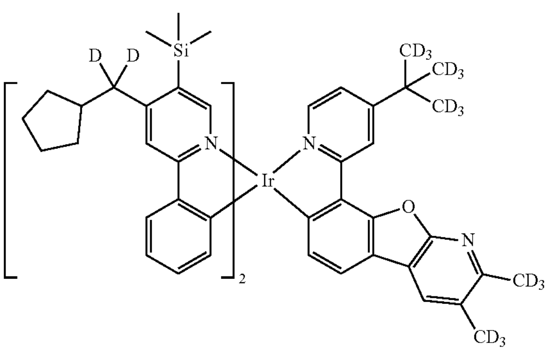
545
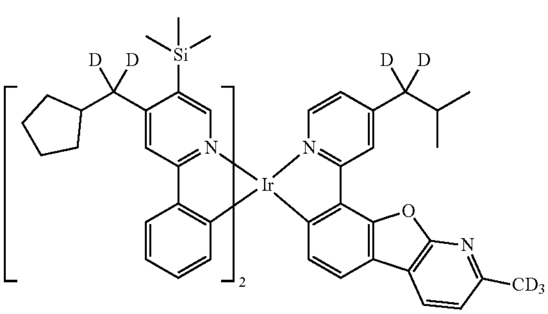
-continued
546
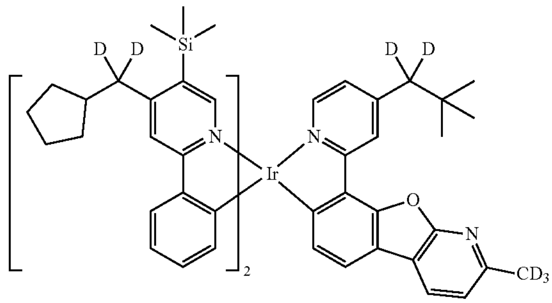
547
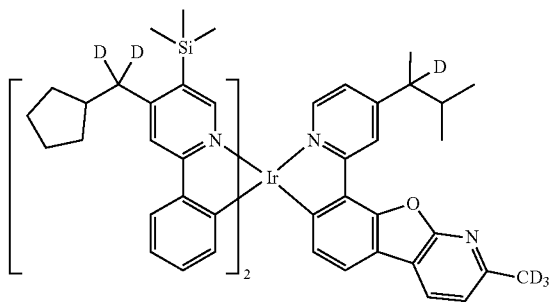
548
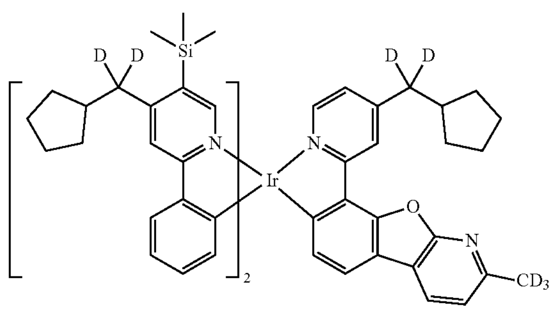
549
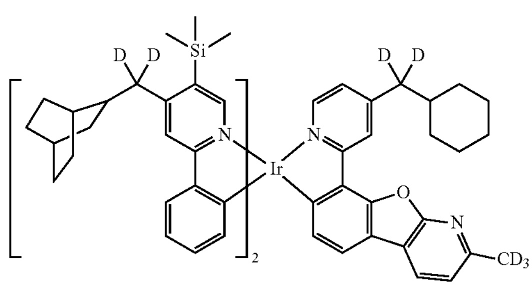
550
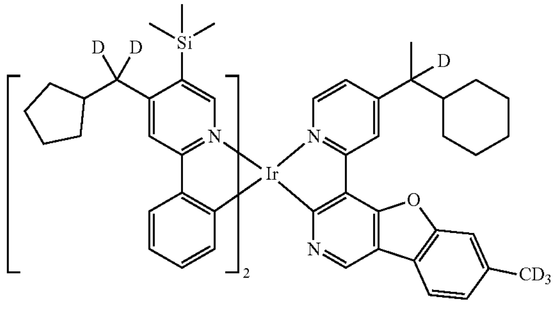

-continued
551
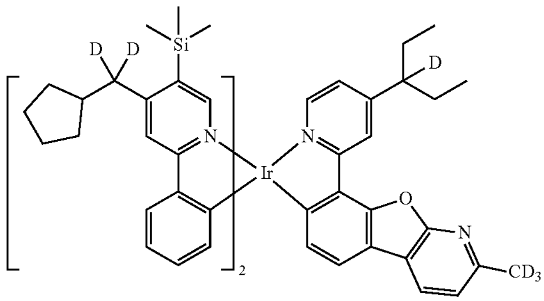
552
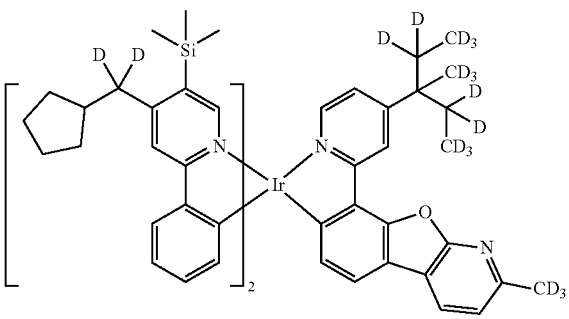
553
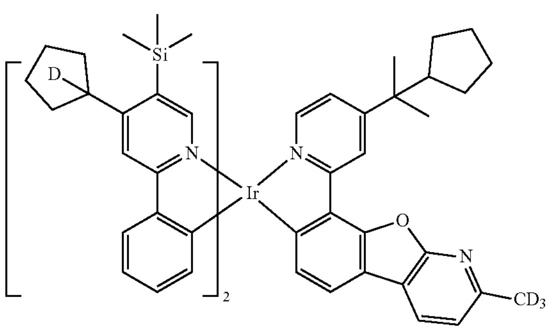
554
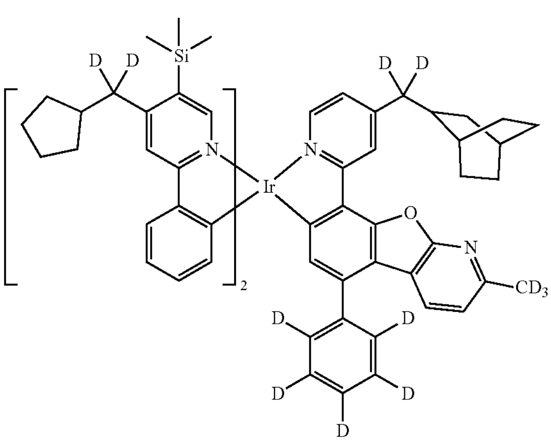
-continued
555
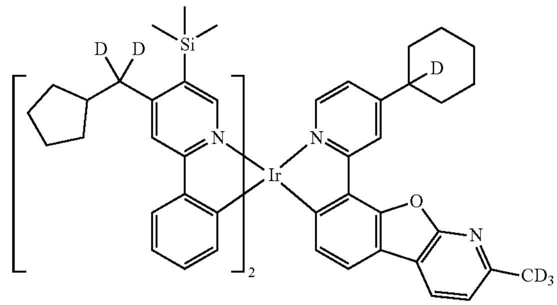
556
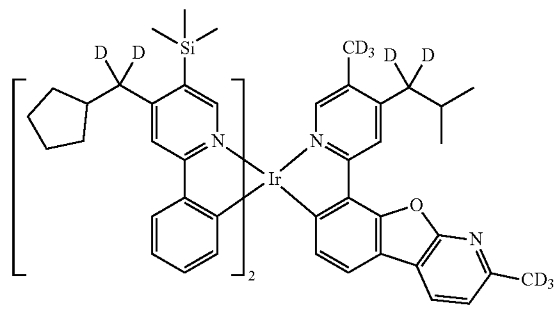
557
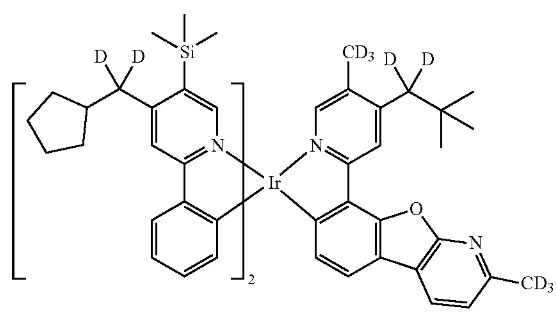
558
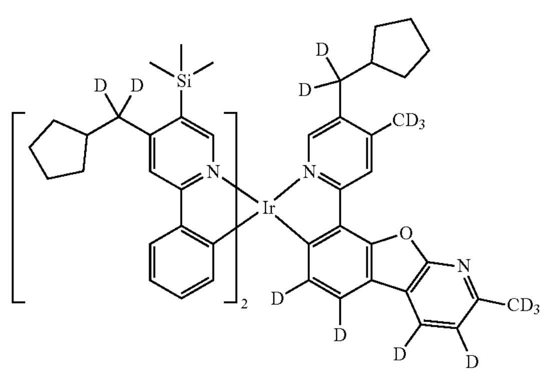

-continued
559
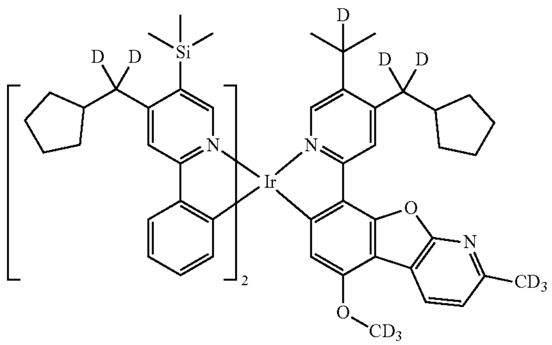
560
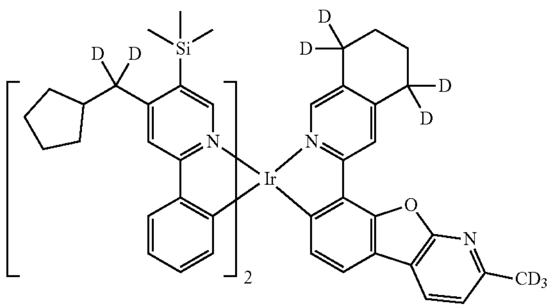
561
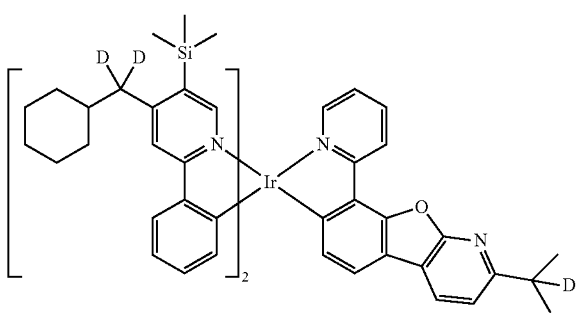
562
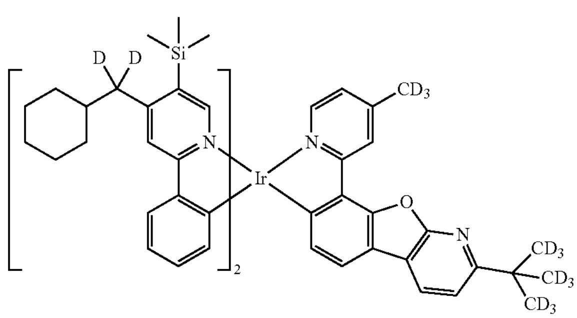
-continued
563
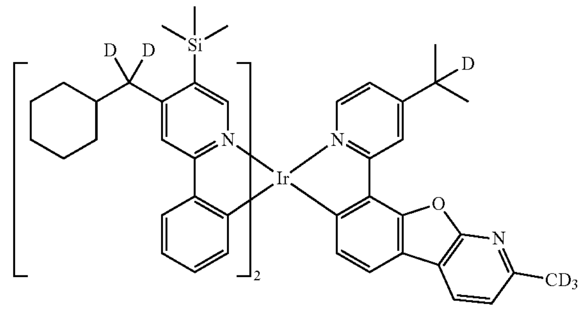
564
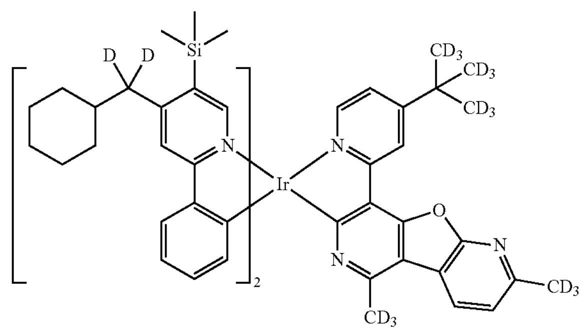
565
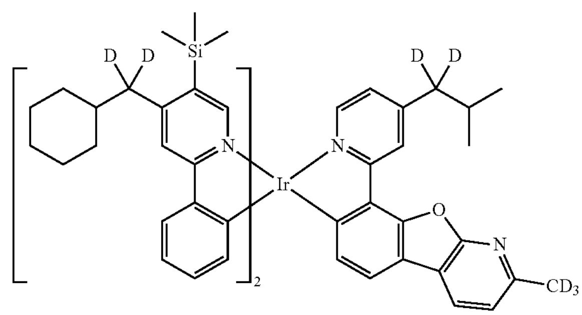
566
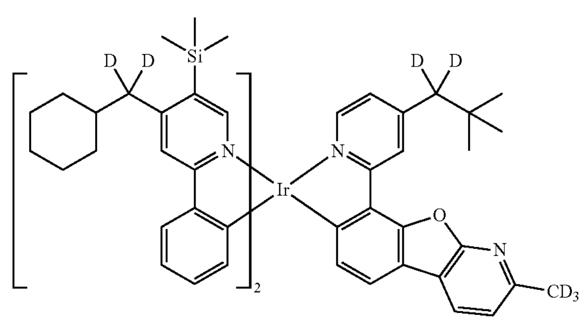

567
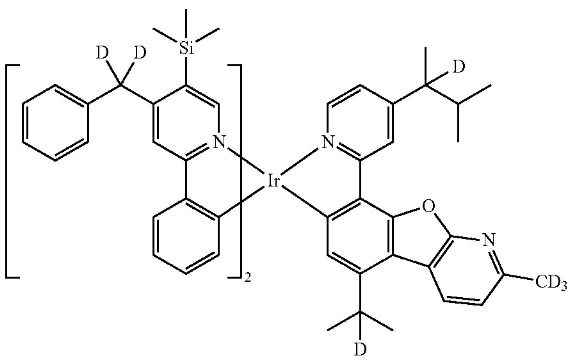
568
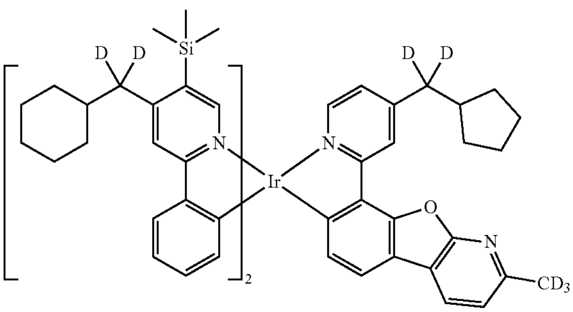
569
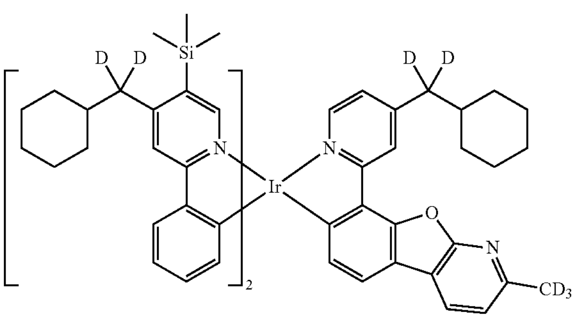
570
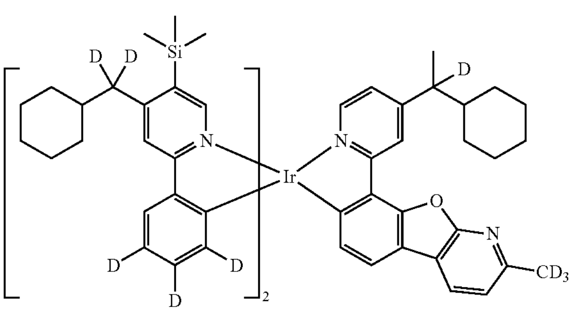
571
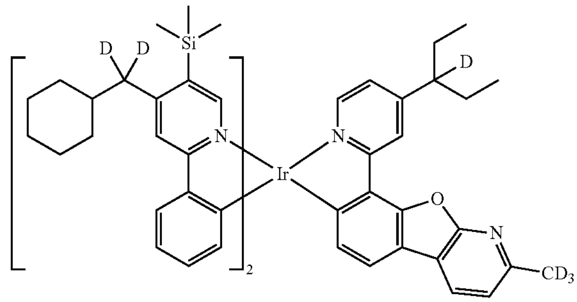
572
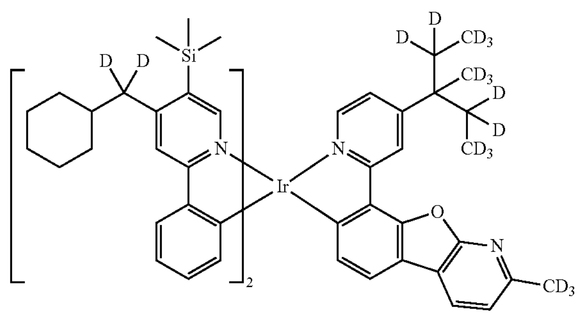
573
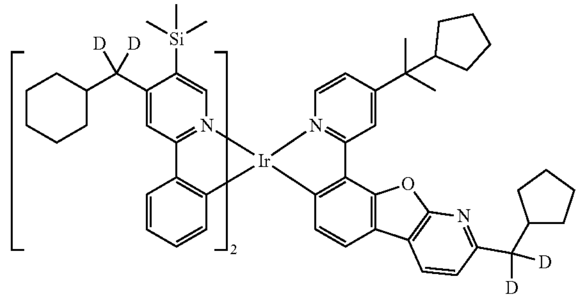
574
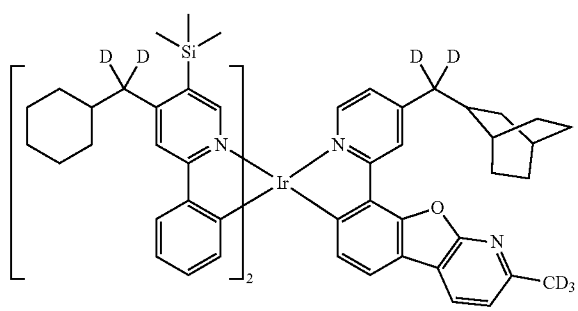
575
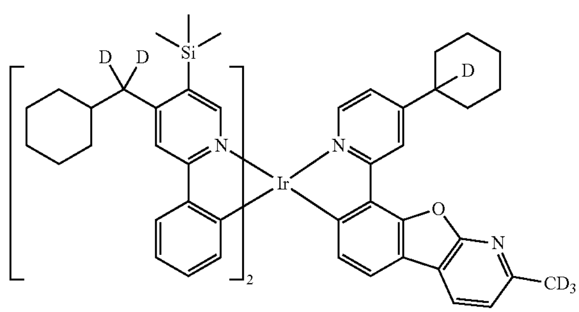

576
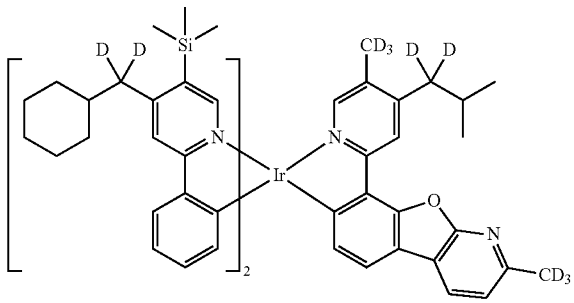
577
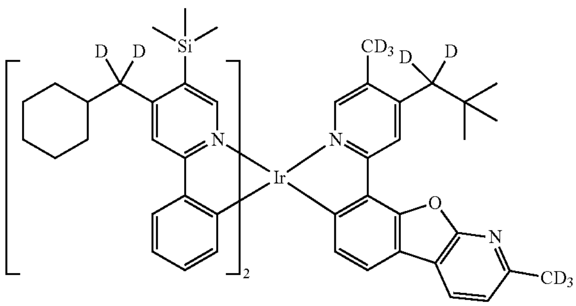
578
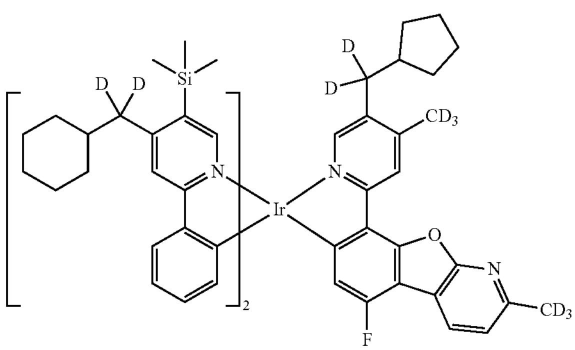
579
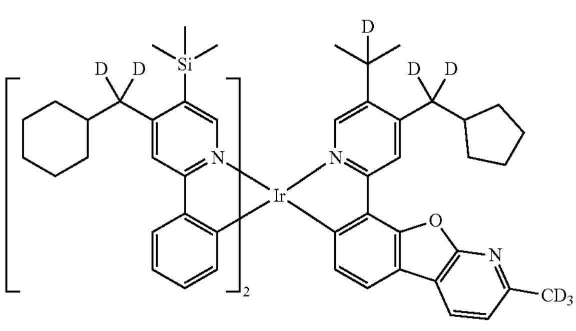
580
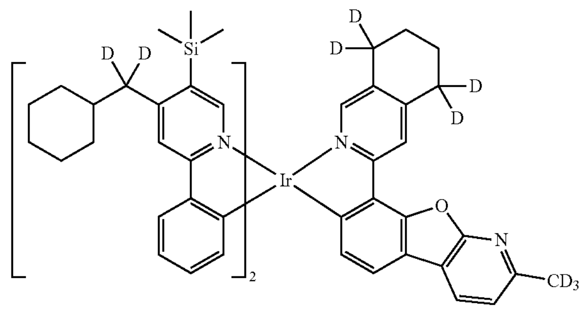
581
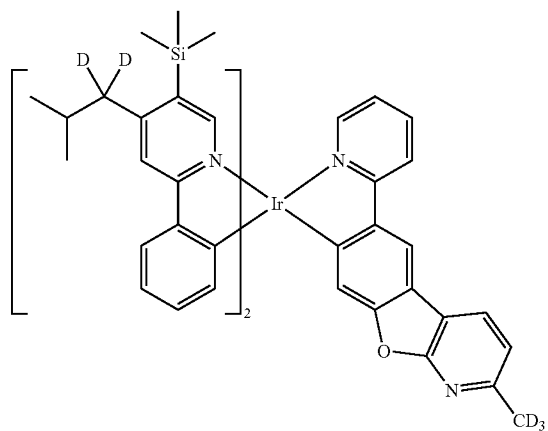
582
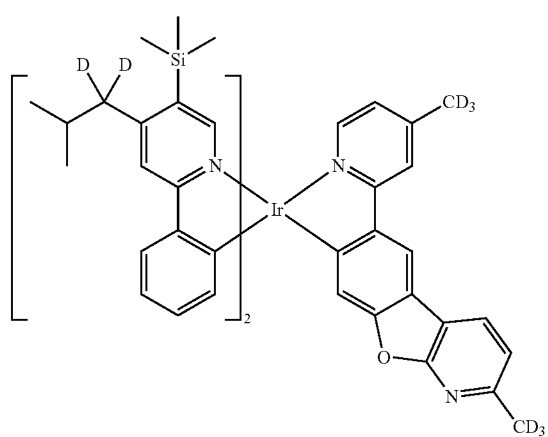

-continued
583
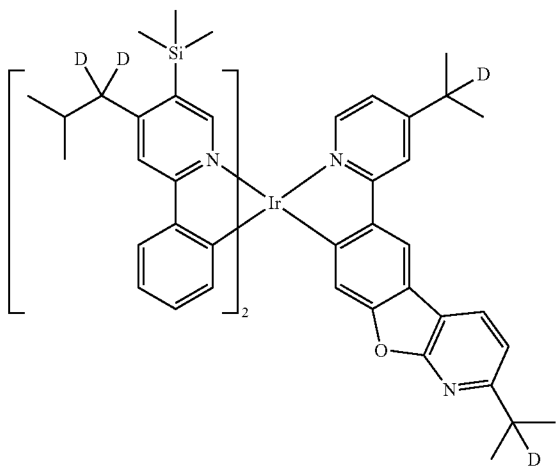
584
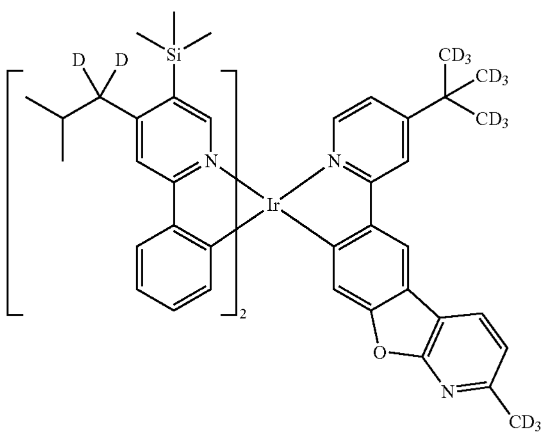
585
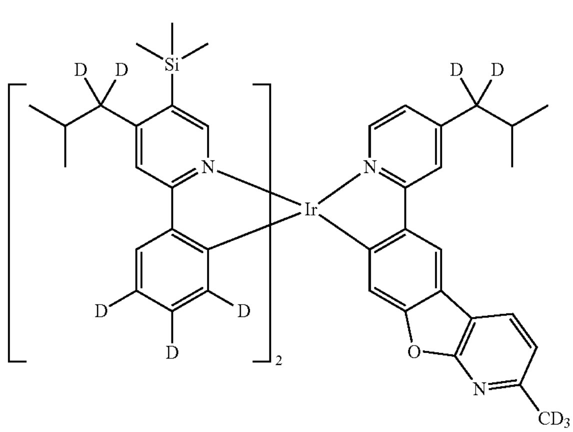
-continued
586
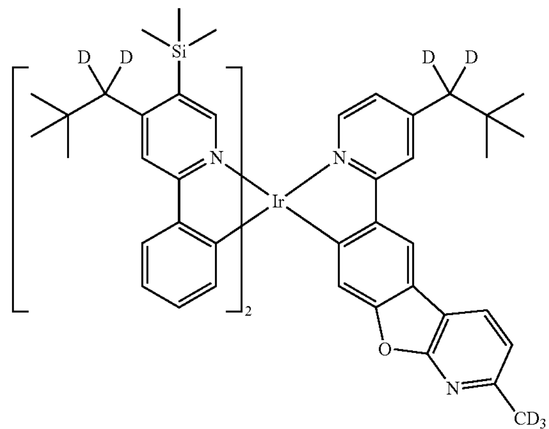
587
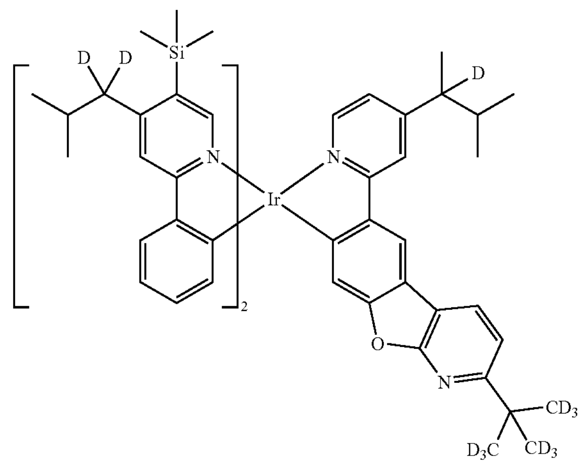
588
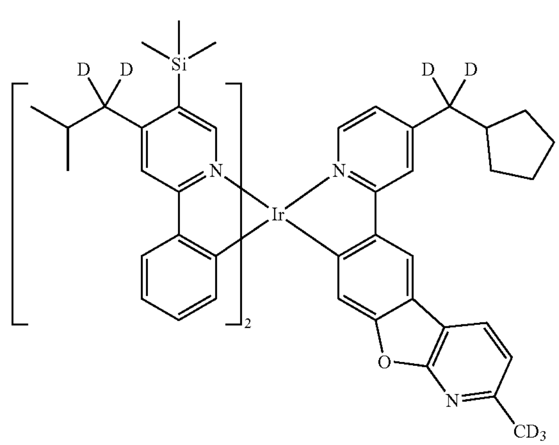

-continued
589
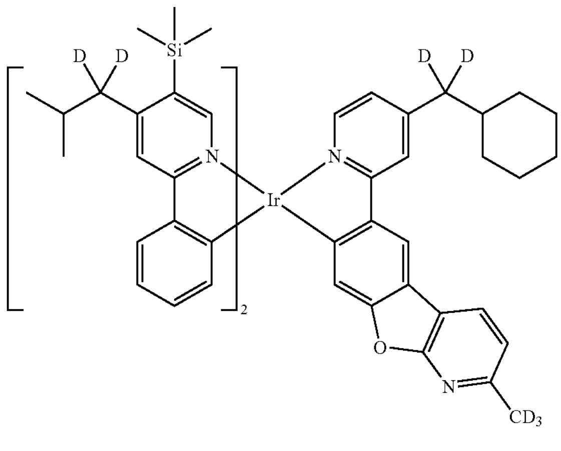
590
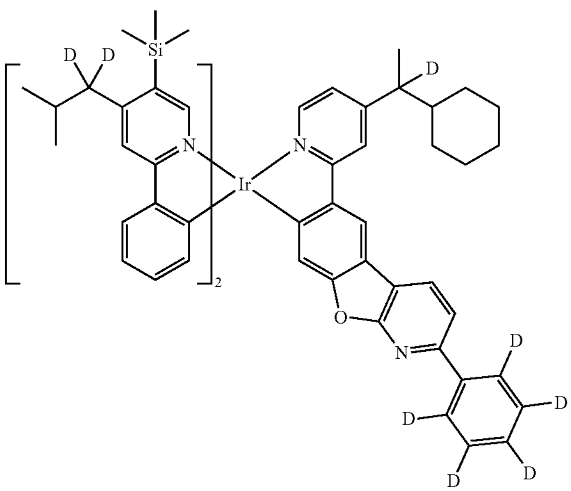
591
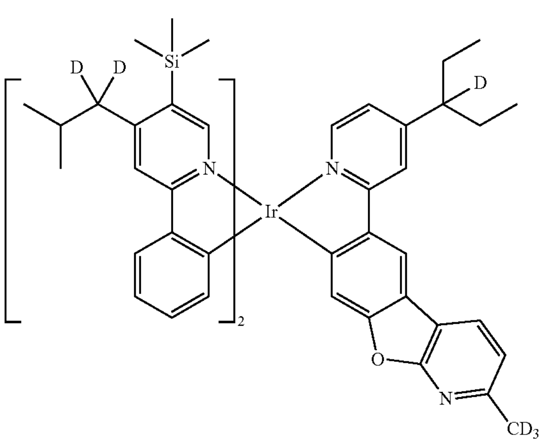
-continued
592
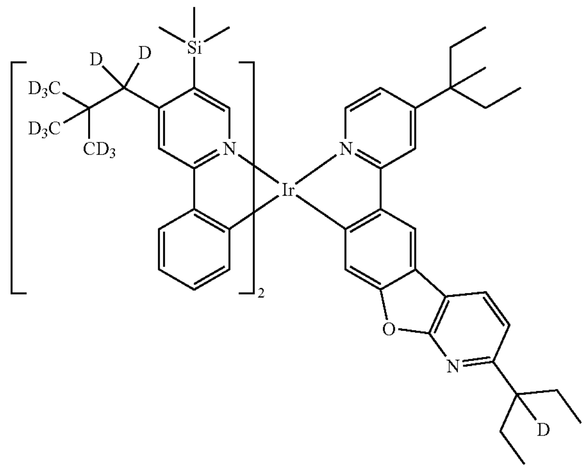
593
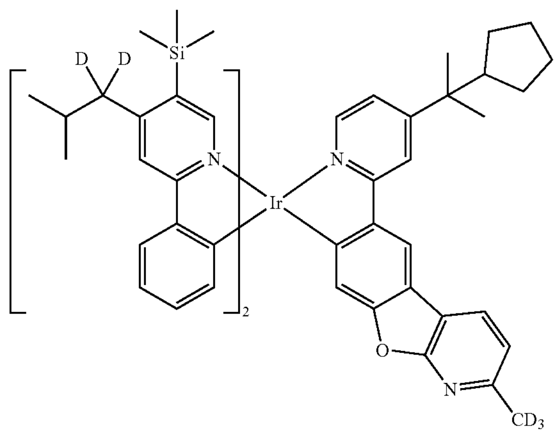
594
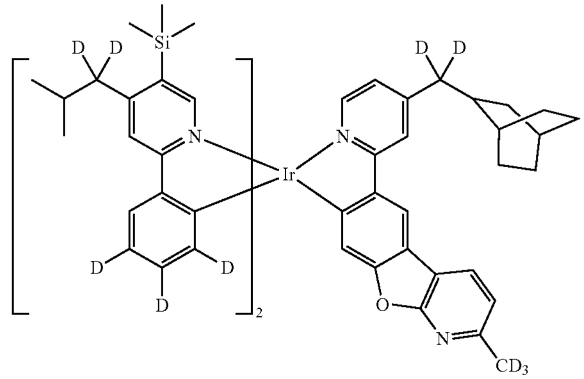

-continued
595
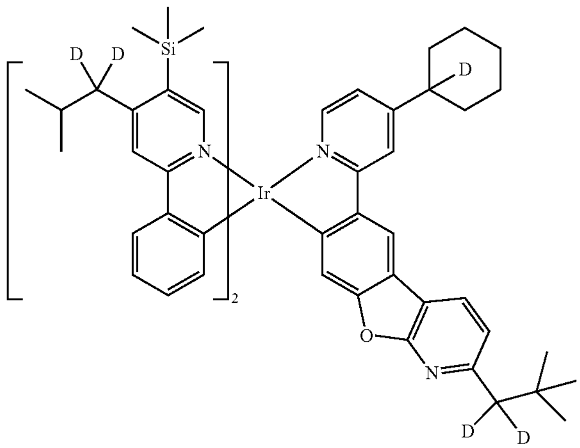
596
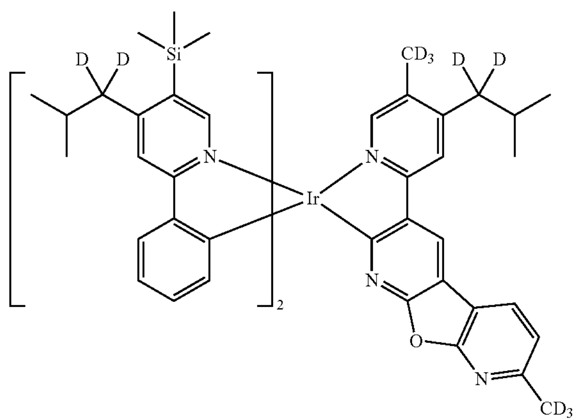
597
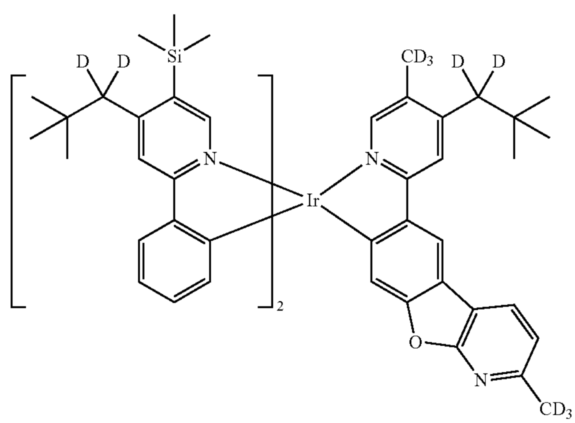
-continued
598
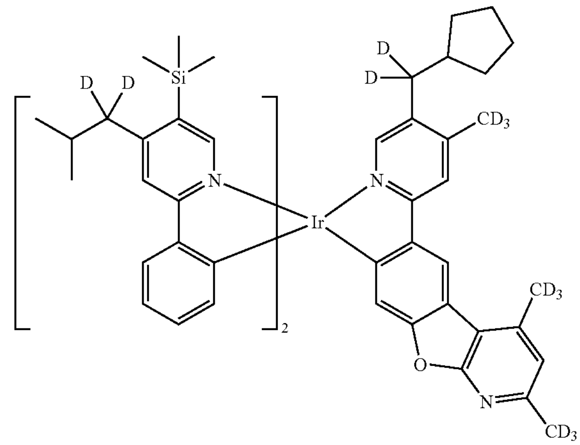
599
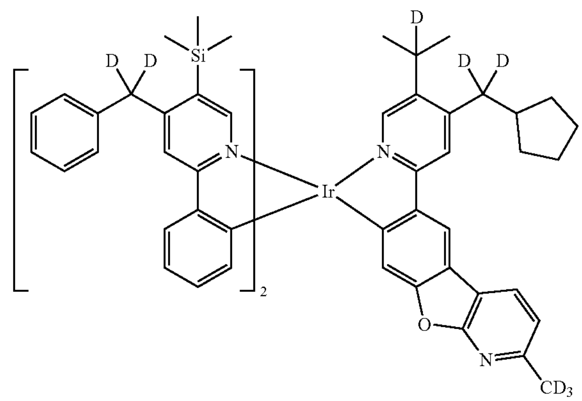
600
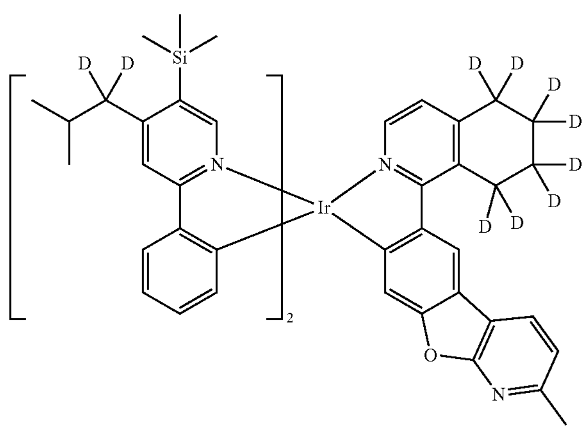

-continued
601
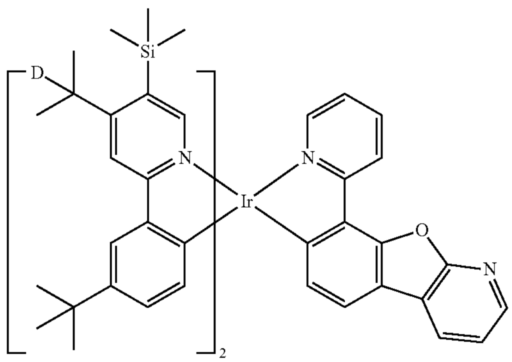
602
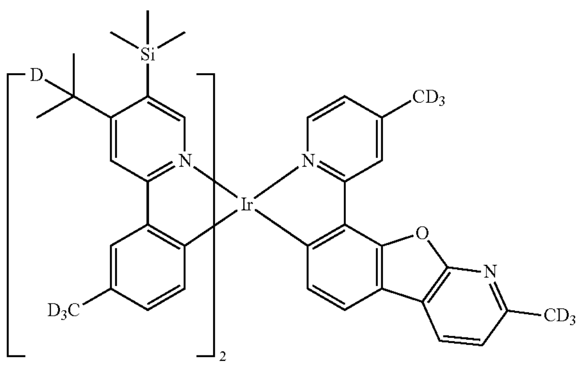
603
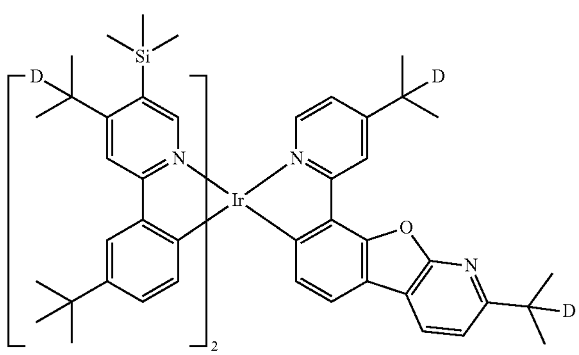
604
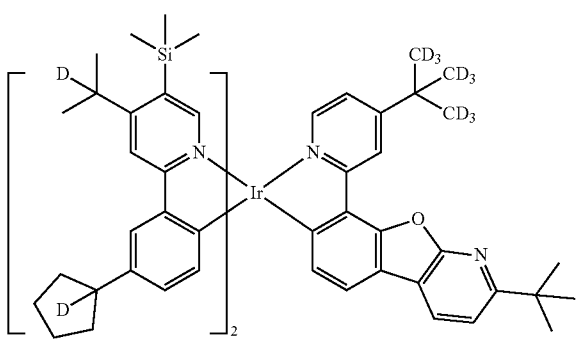
-continued
605
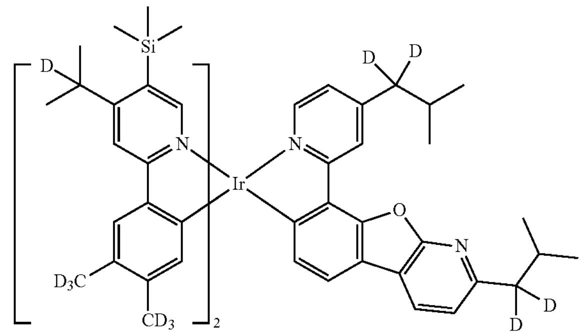
606
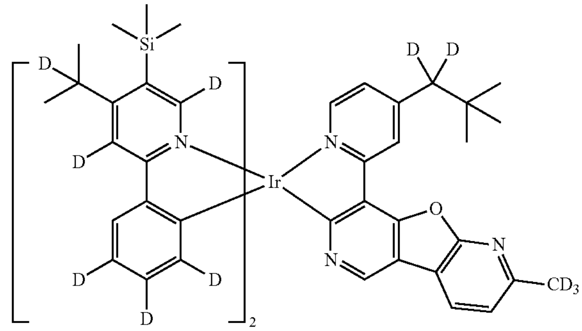
607
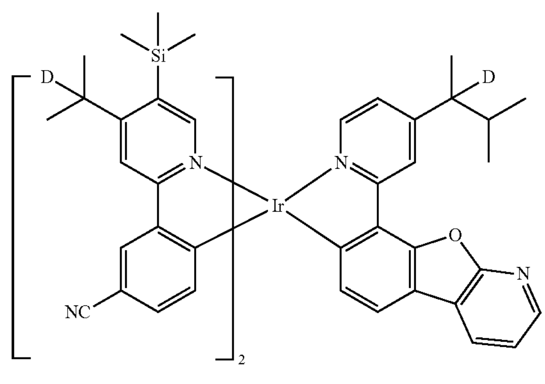
608
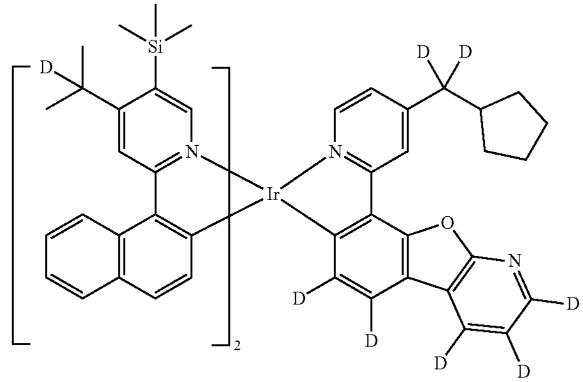

-continued
609
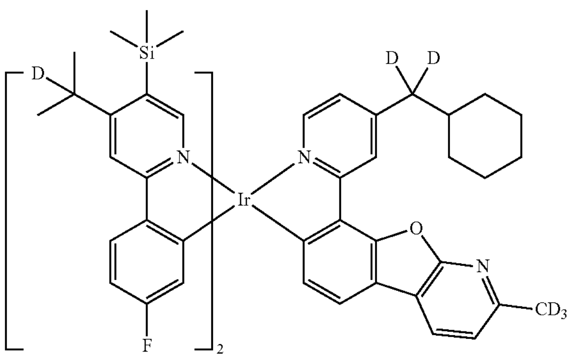
610
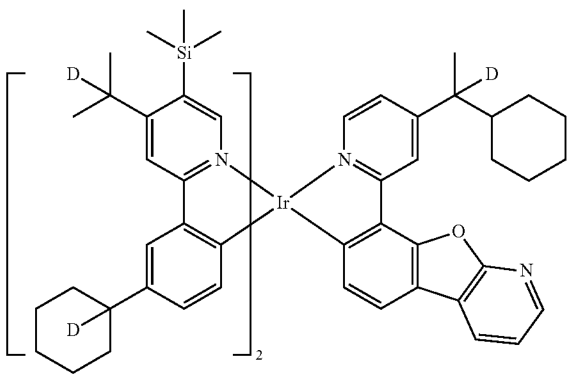
611
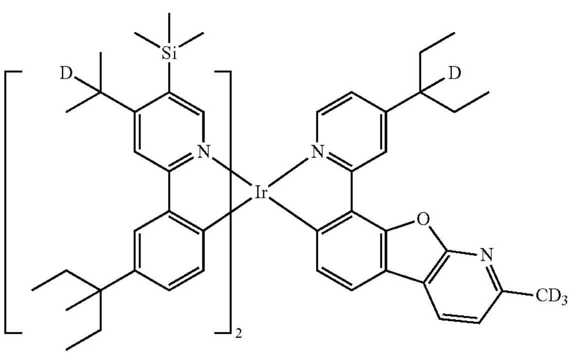
612
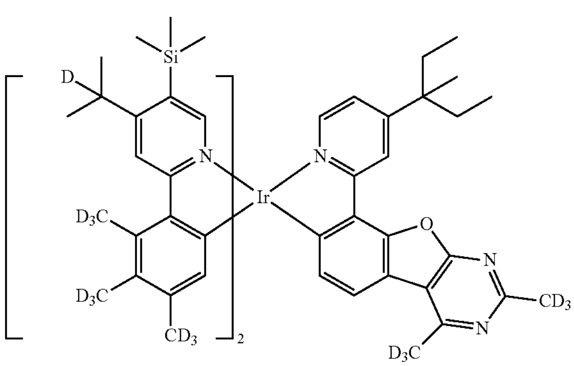
-continued
613
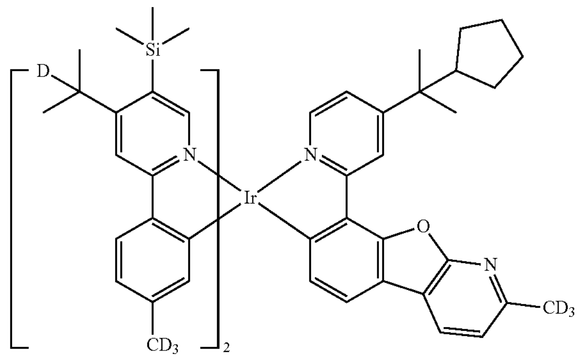
614
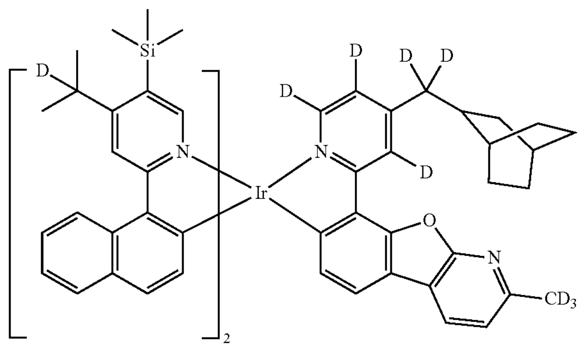
615
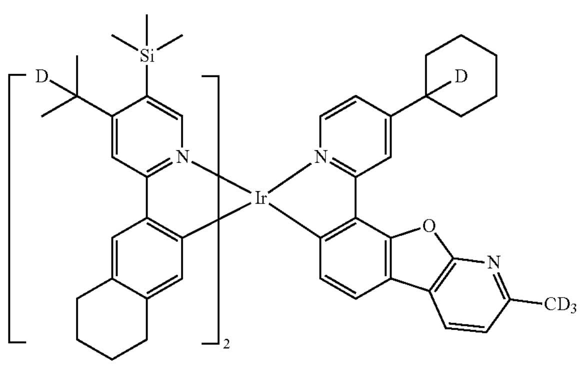
616
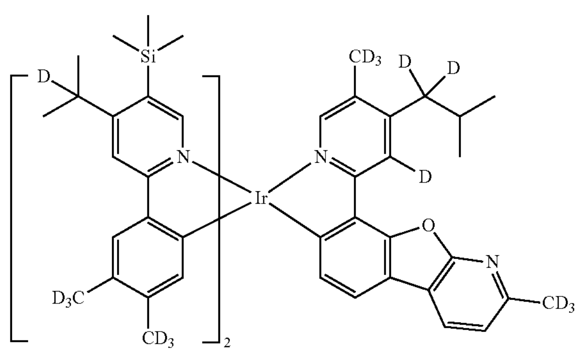

-continued
617
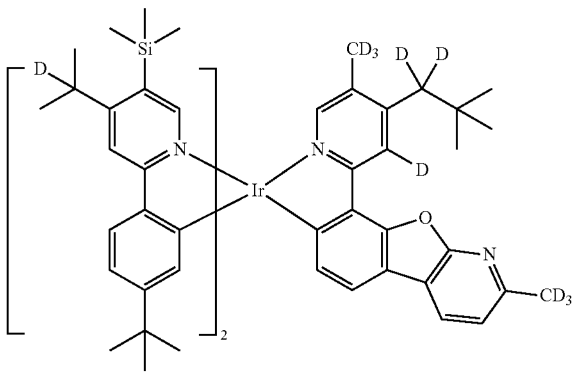
618
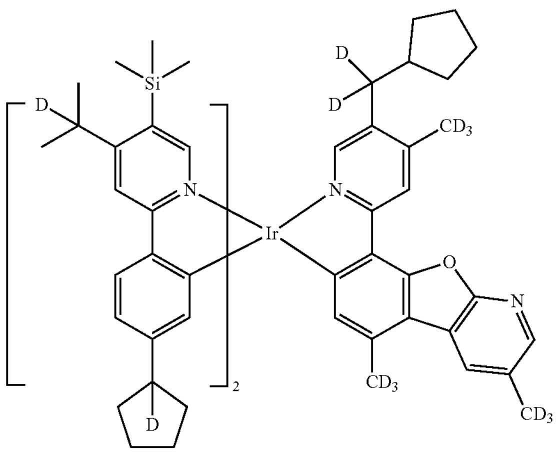
619
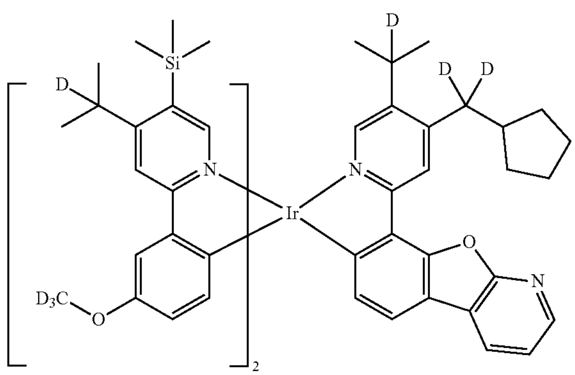
620
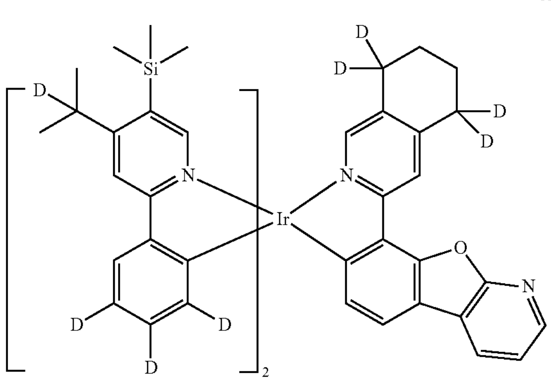
-continued
621
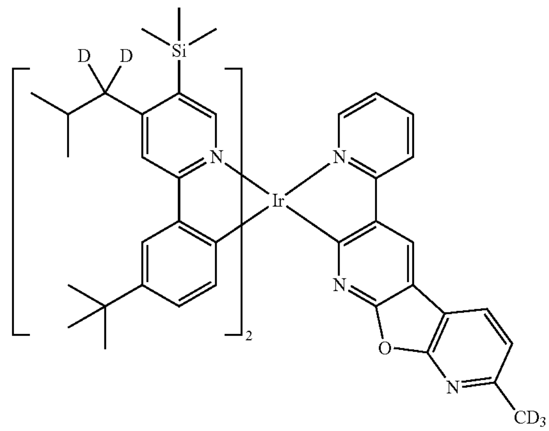
622
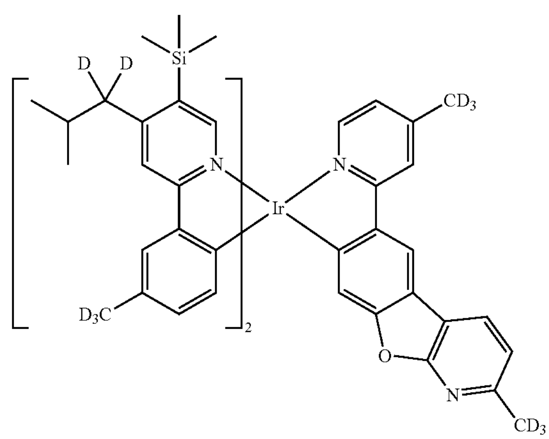
623
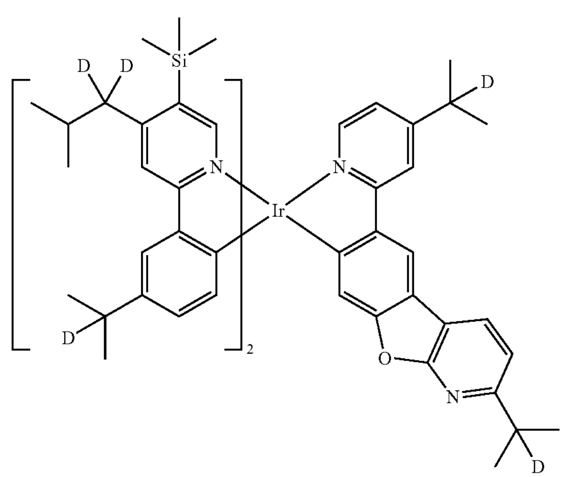

-continued
624
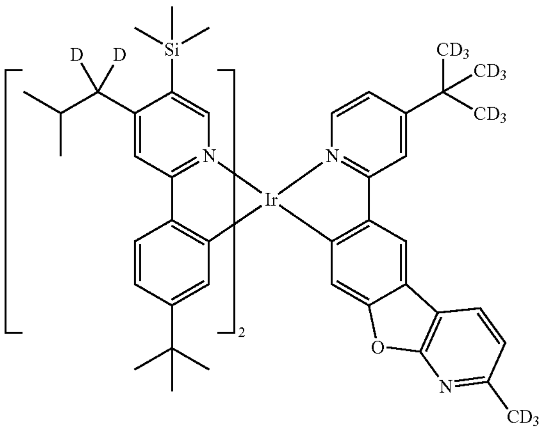
625
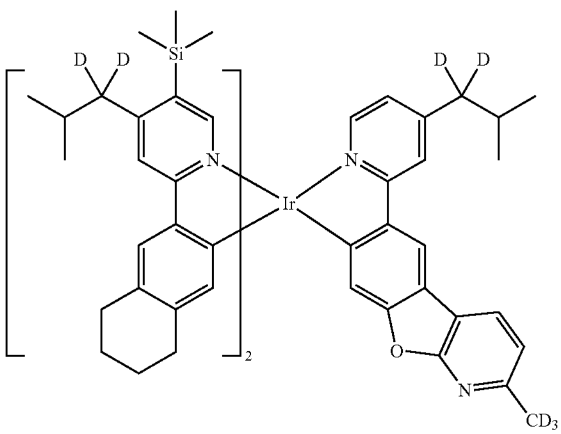
626
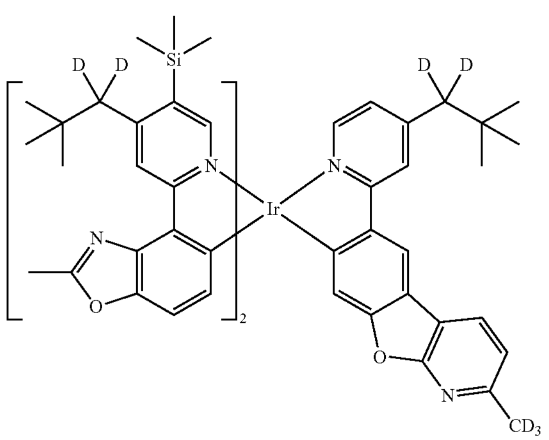
-continued
627
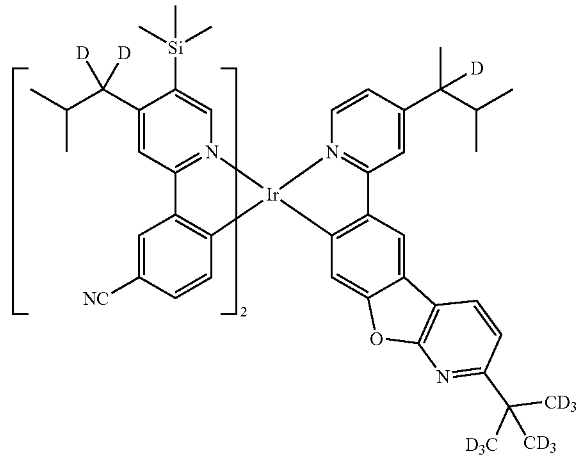
628
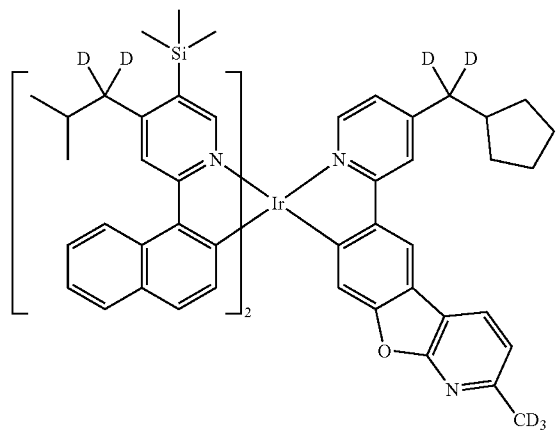
629
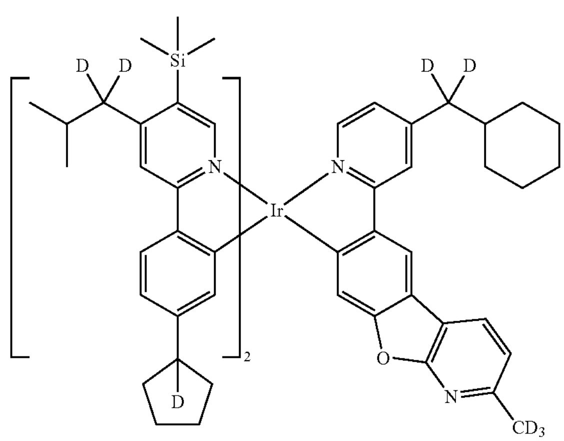

-continued
630
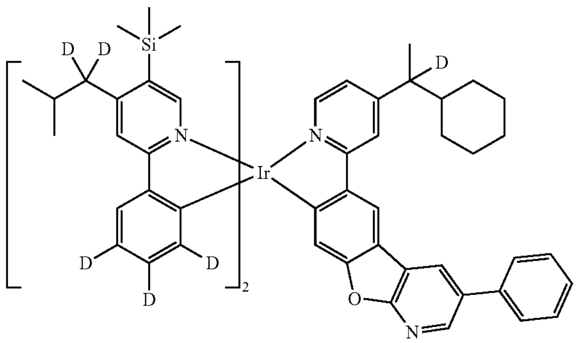
631
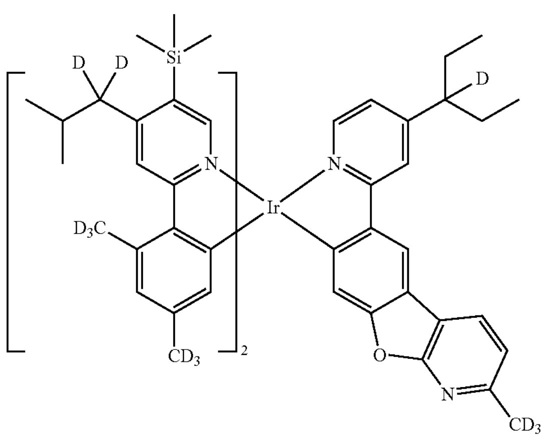
632
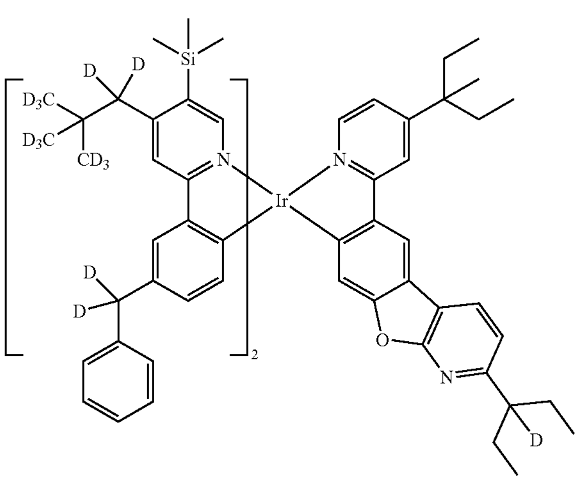
-continued
633
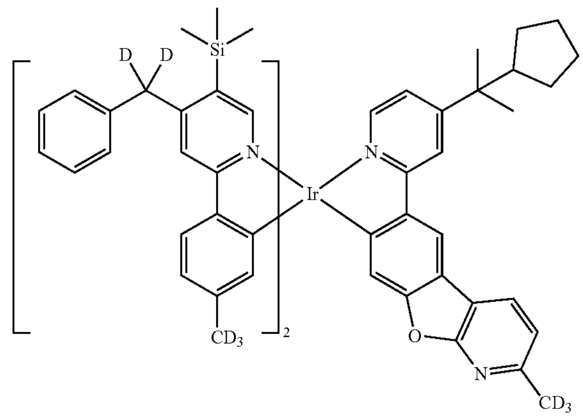
634
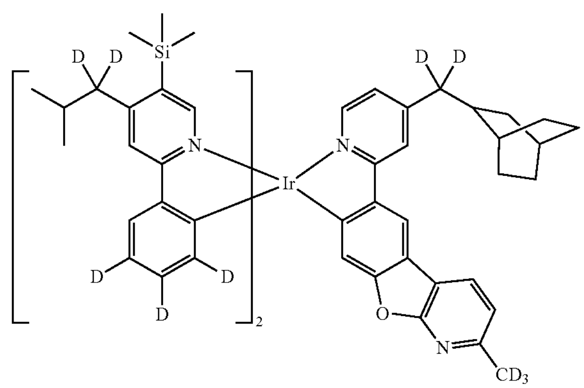
635
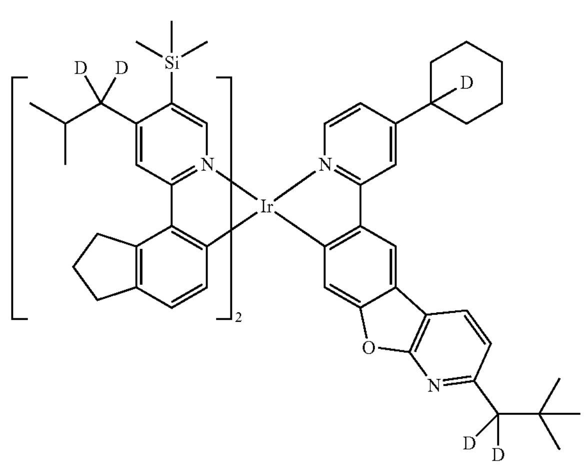

-continued
636
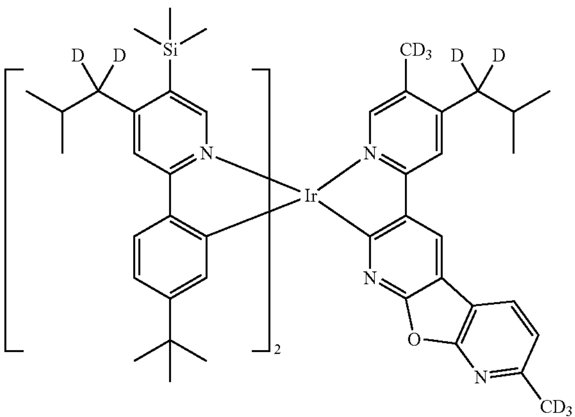
637
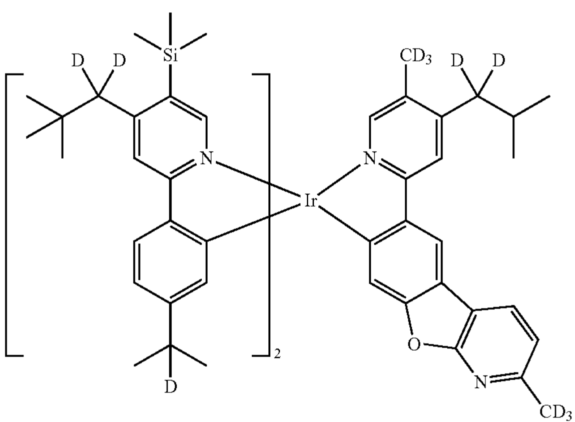
638
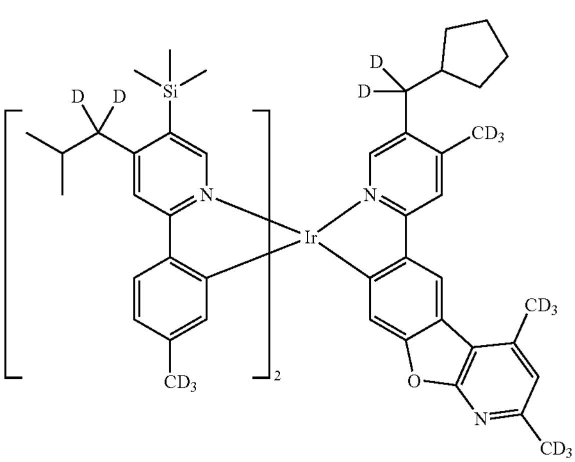
-continued
639
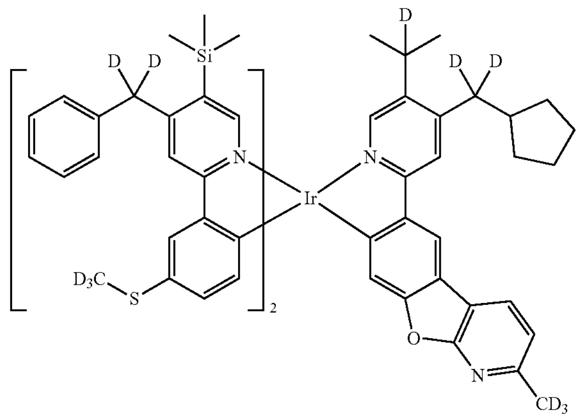
640
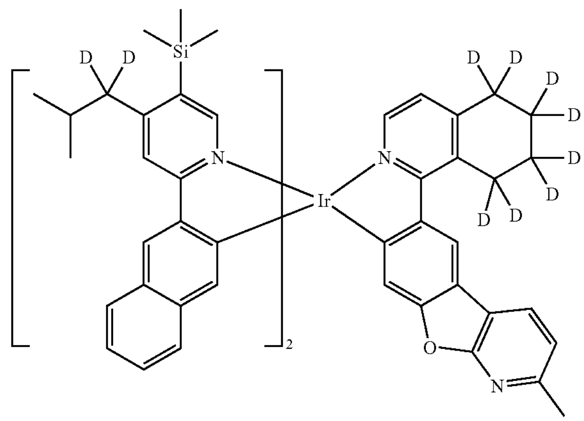
641
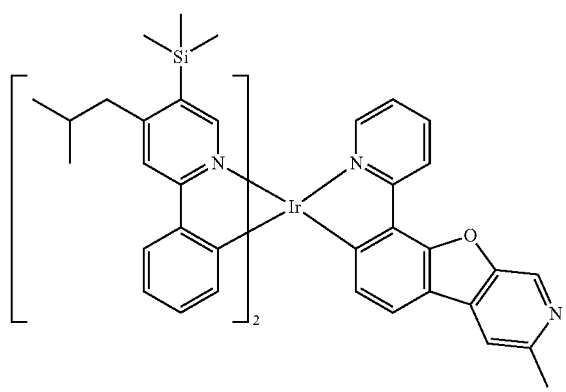
642
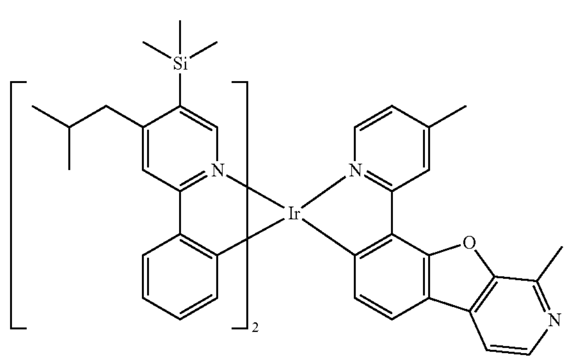

-continued
643
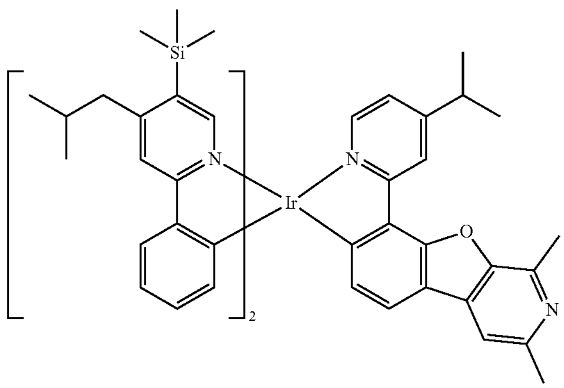
644
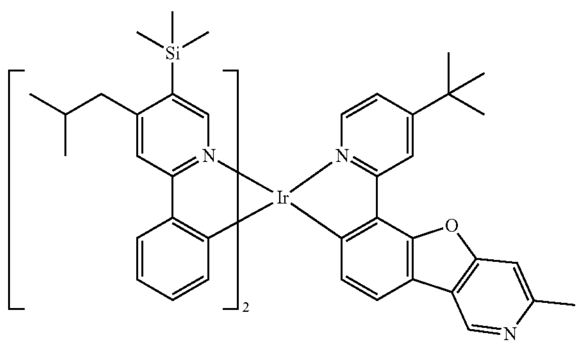
645
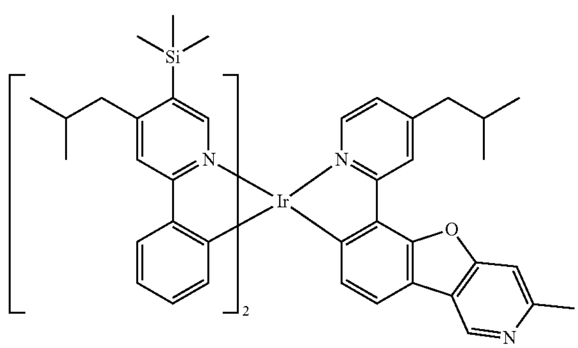
646
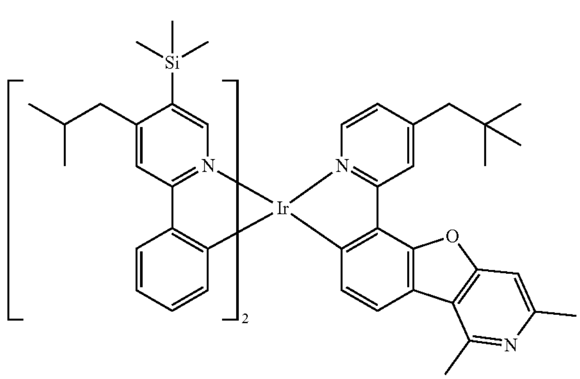
-continued
647
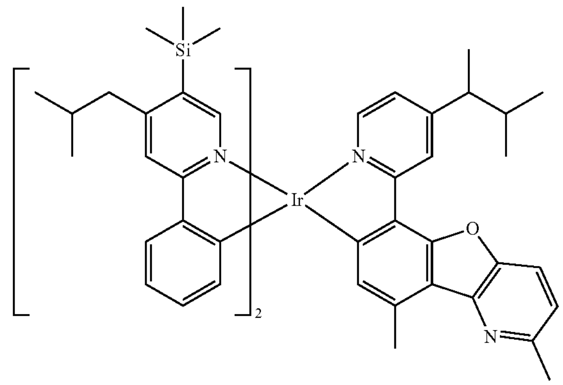
648
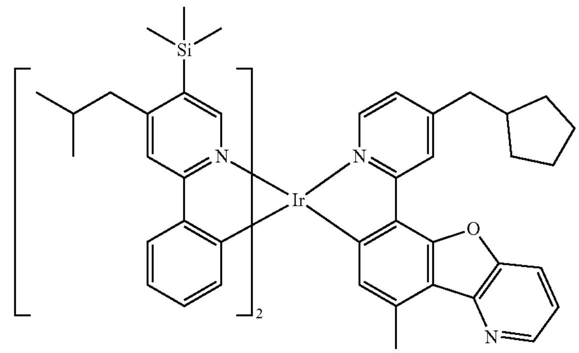
649
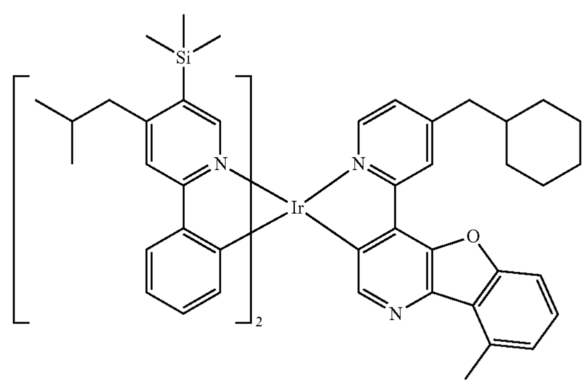
650
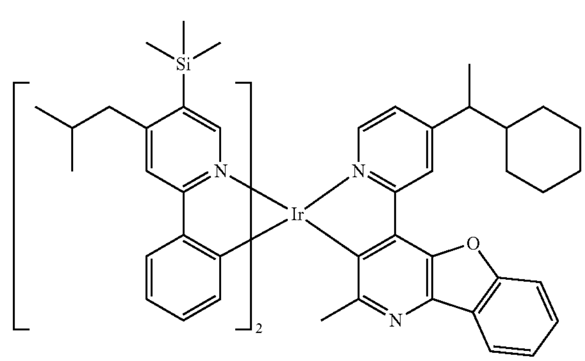

-continued
651
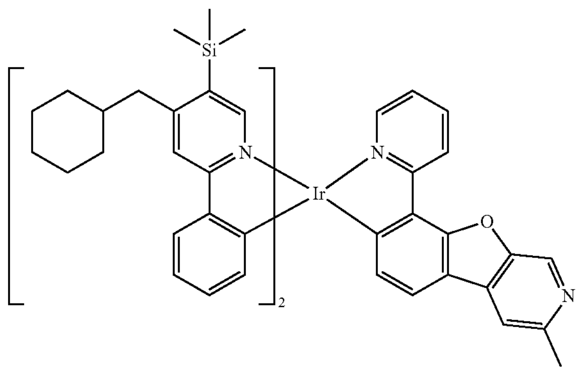
652
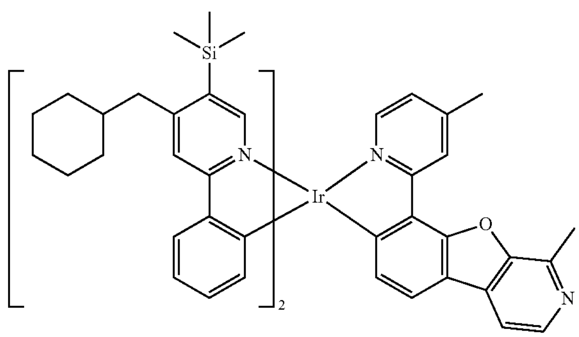
653
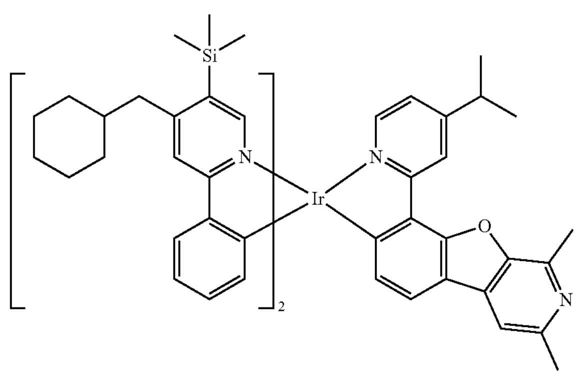
654
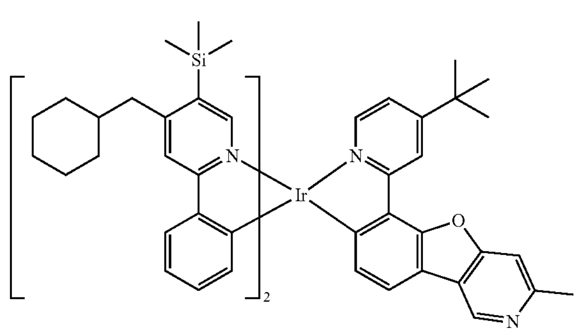
-continued
655
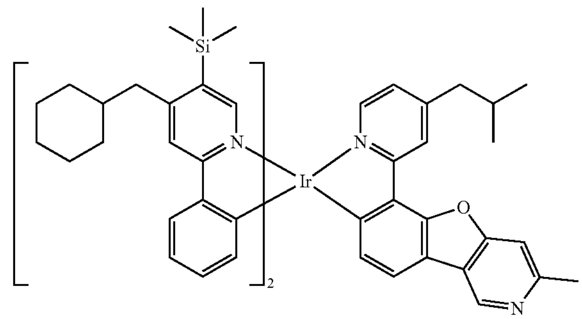
656
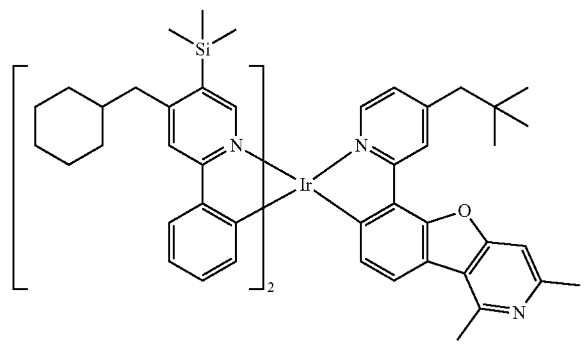
657
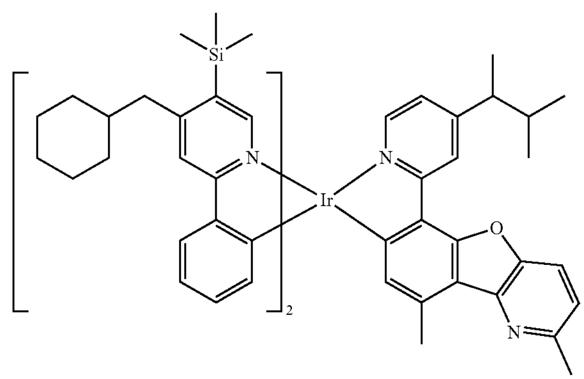
658
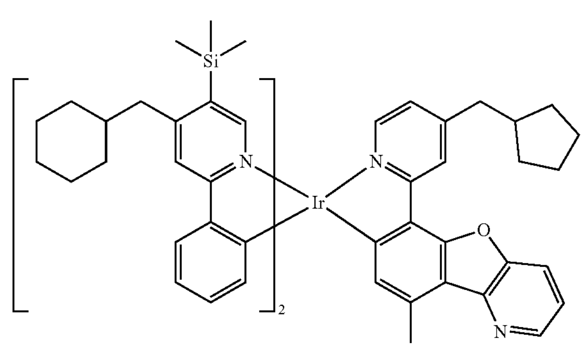

-continued
659
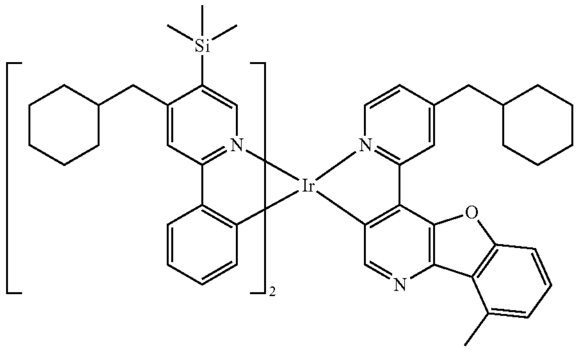
660
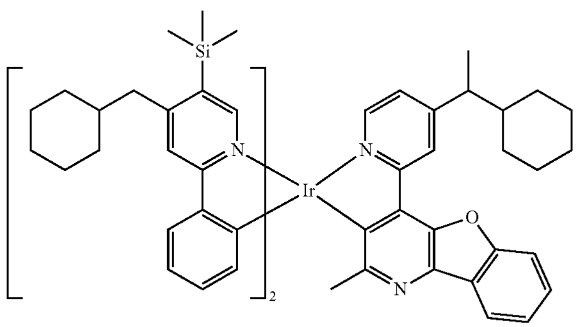
661
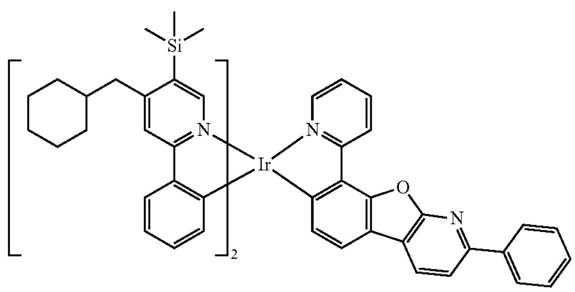
662
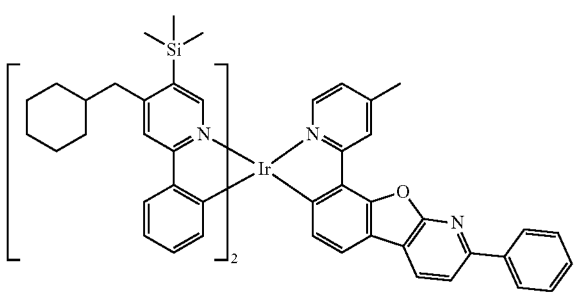
663
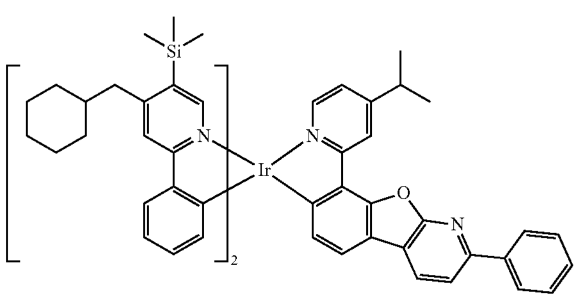
-continued
664
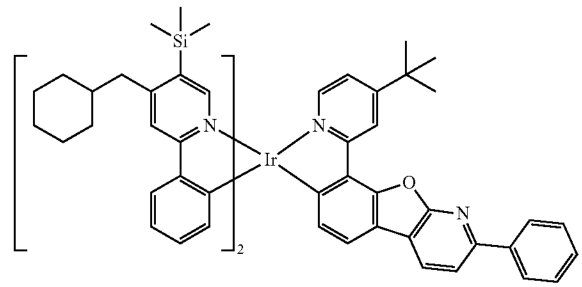
665
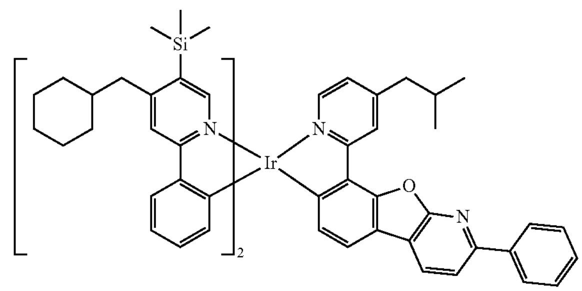
666
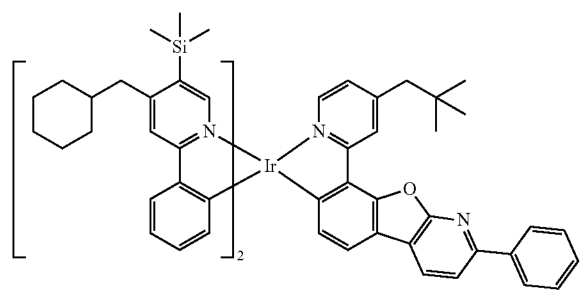
667
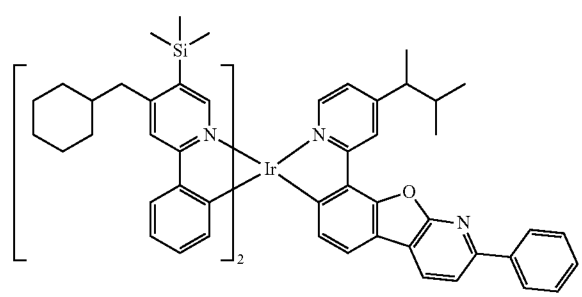
668
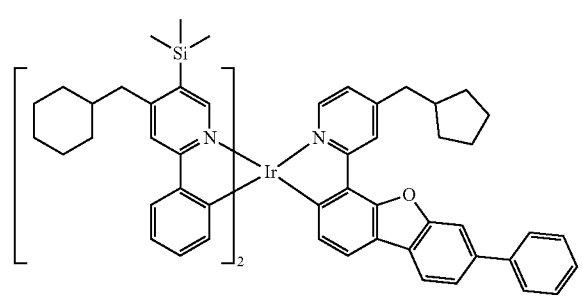

-continued
669
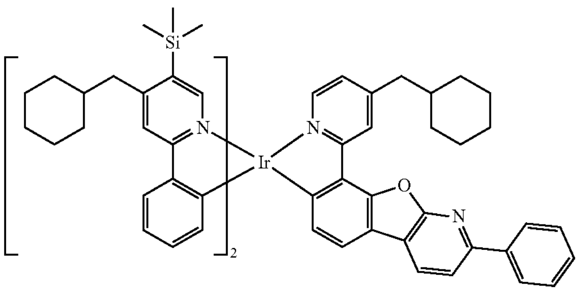
670
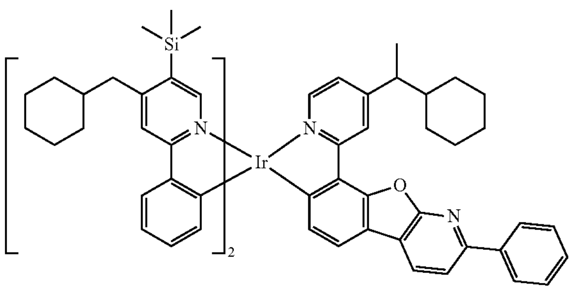
671
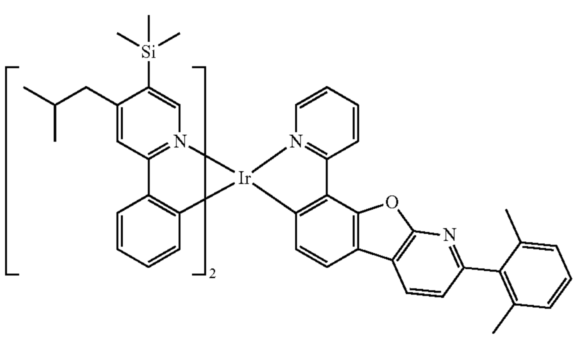
672
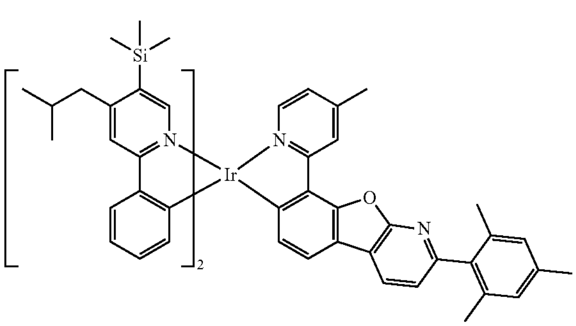
-continued
673
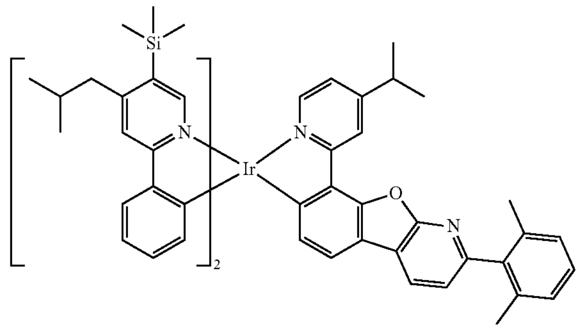
674
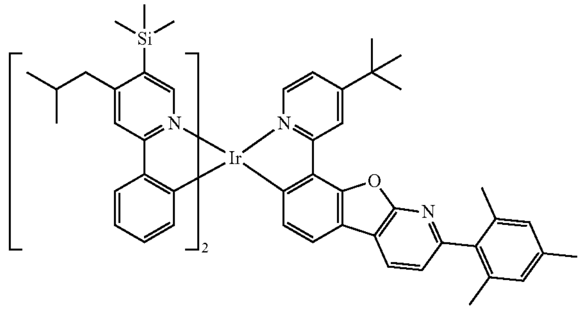
675
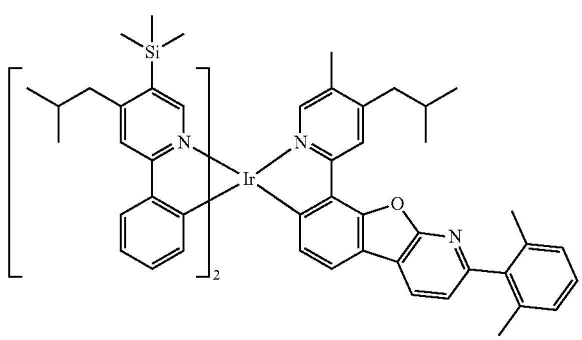
676
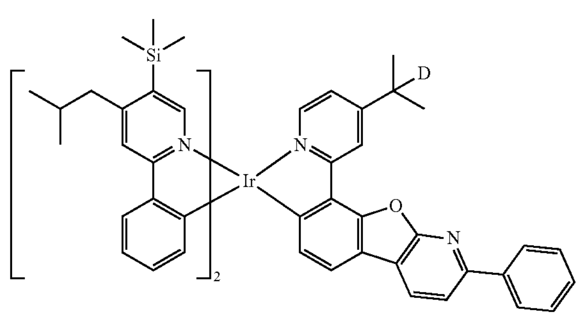

-continued
677
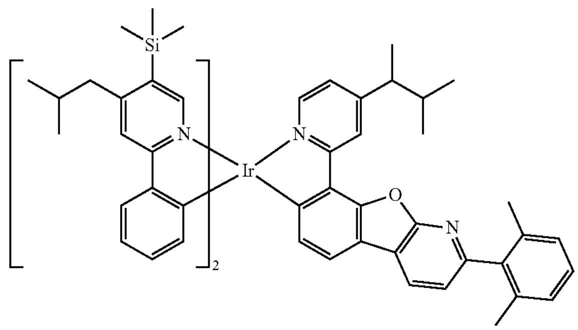
678
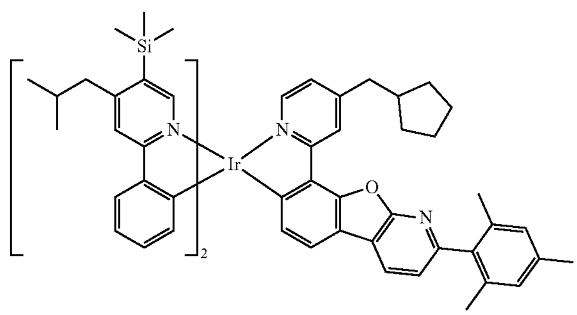
679
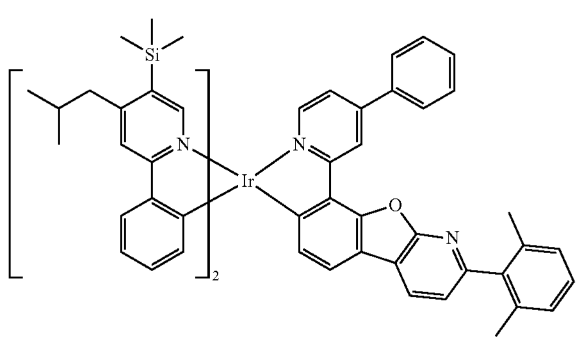
680
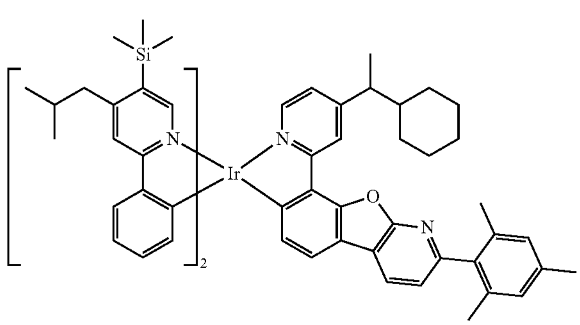
-continued
681
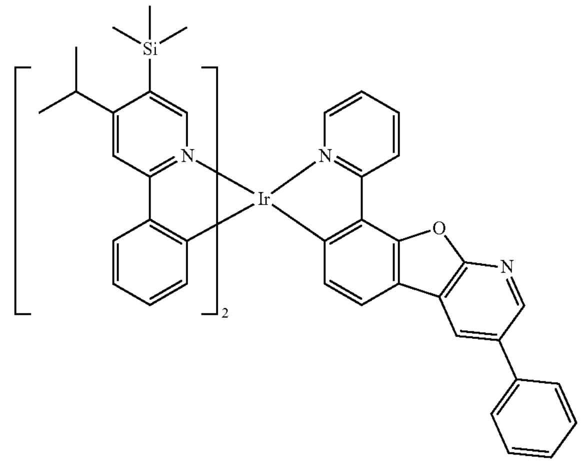
682
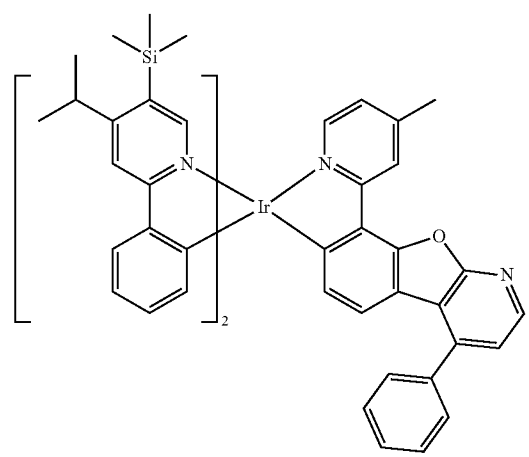
683
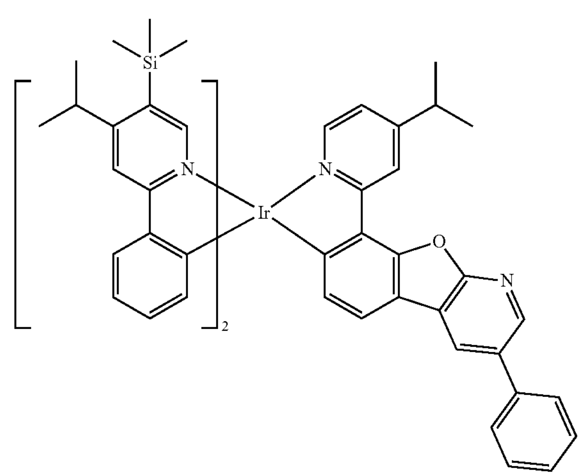

-continued
684
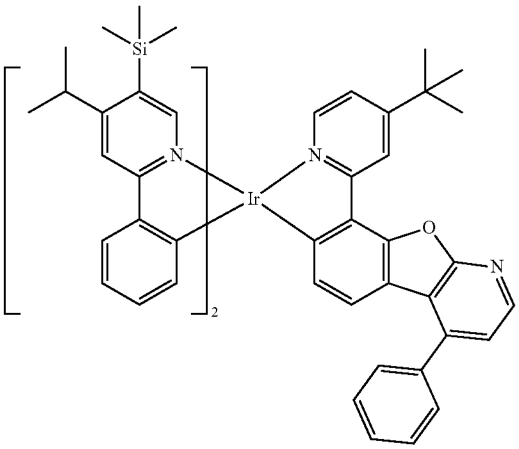
685
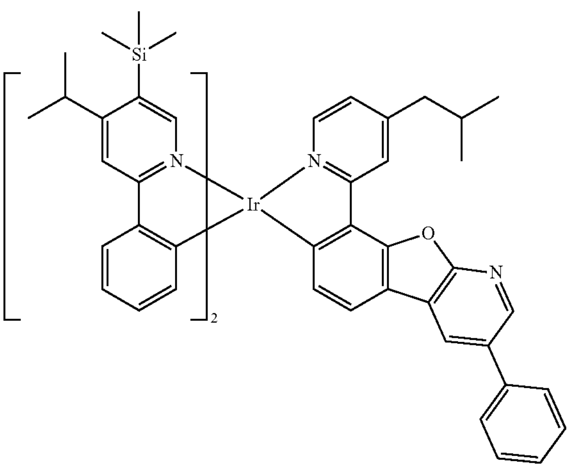
686
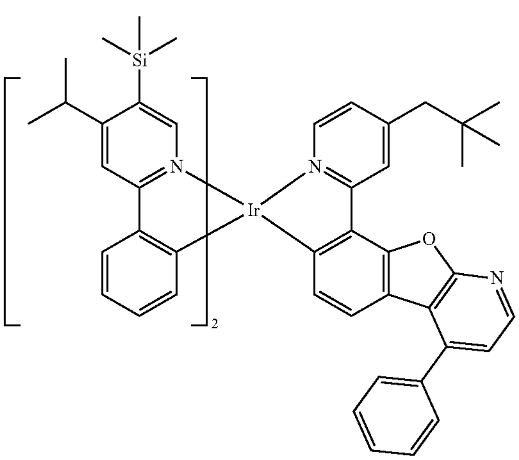
-continued
687
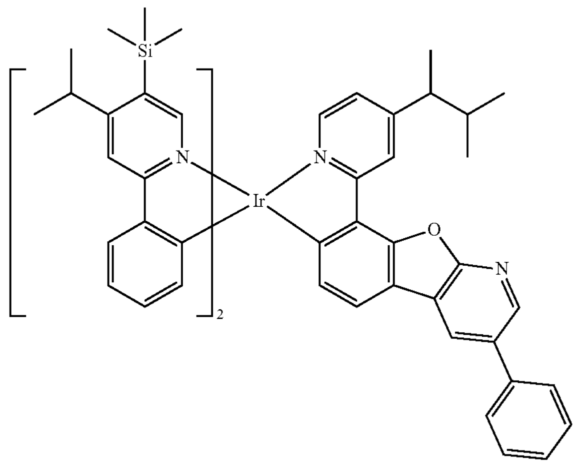
688
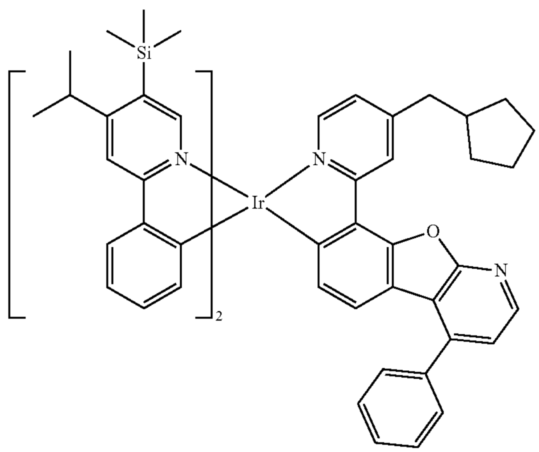
689
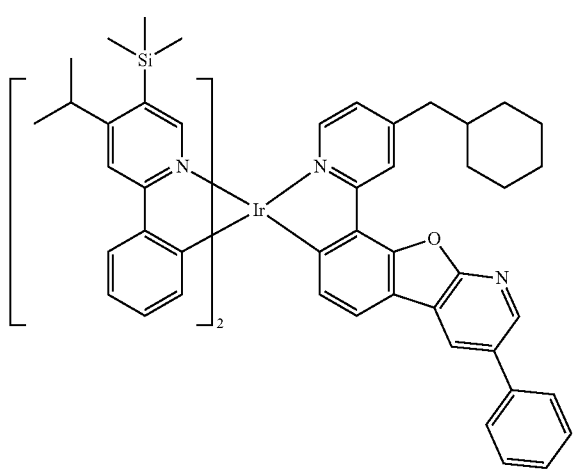

-continued
690
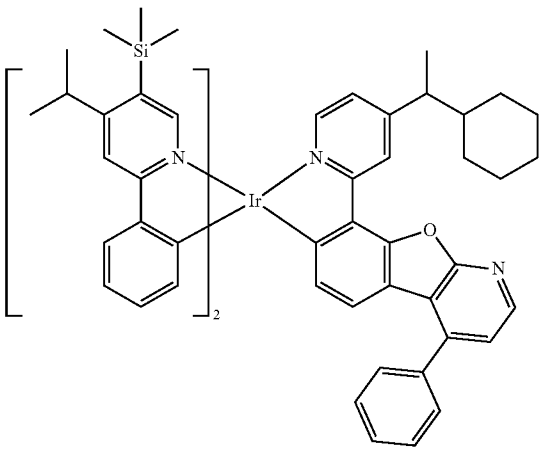
691
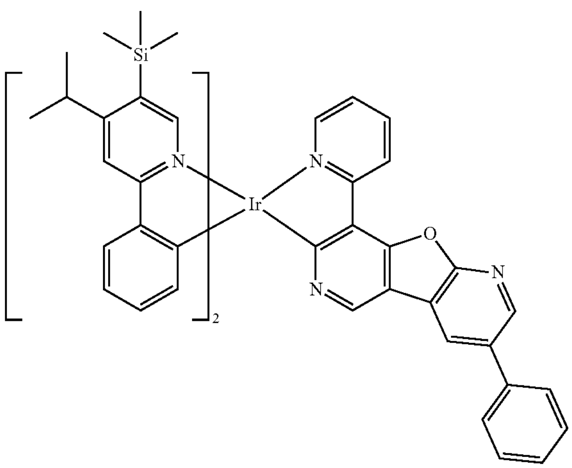
692
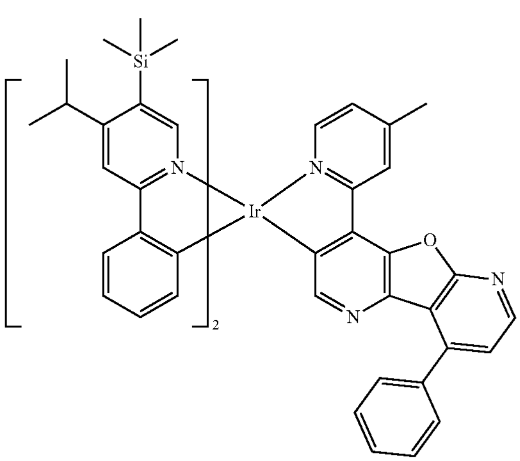
-continued
693
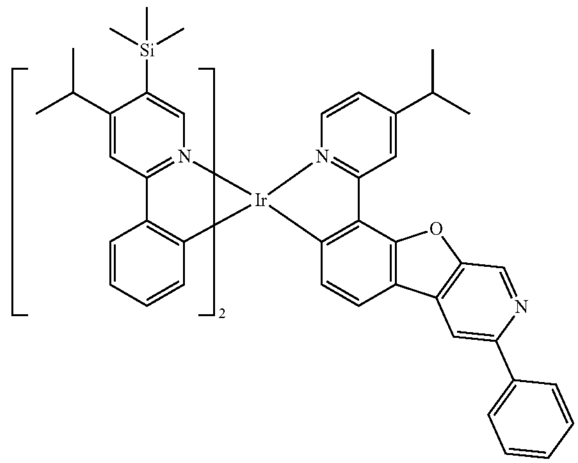
694
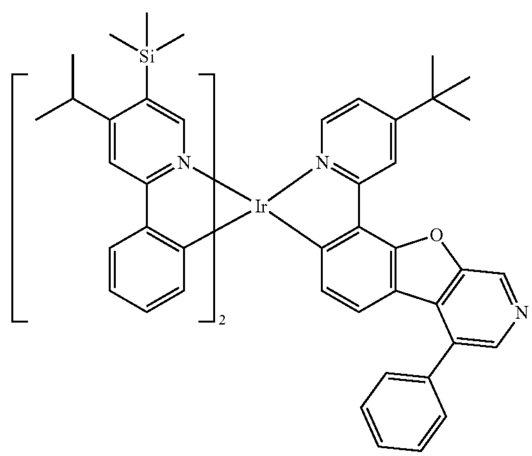
695
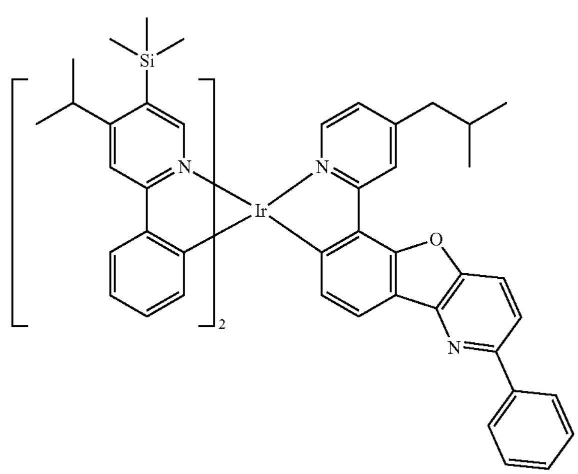

-continued
696
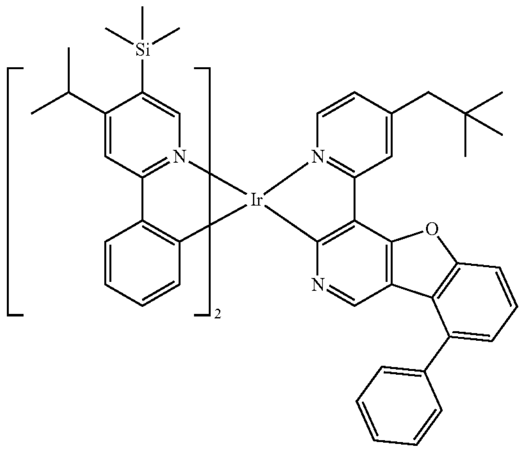
697
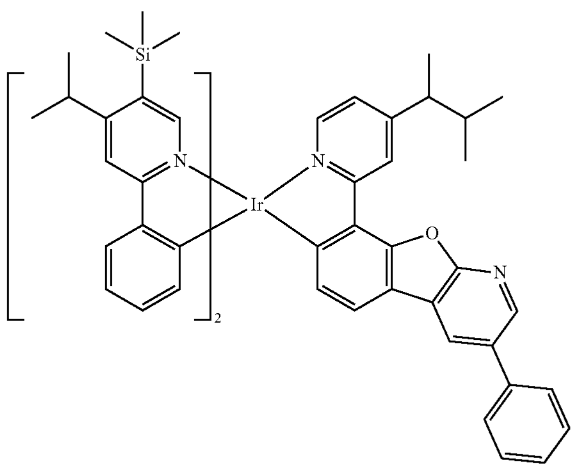
698
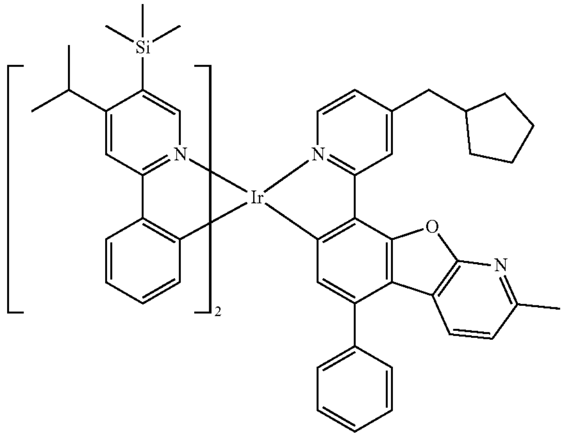
-continued
699
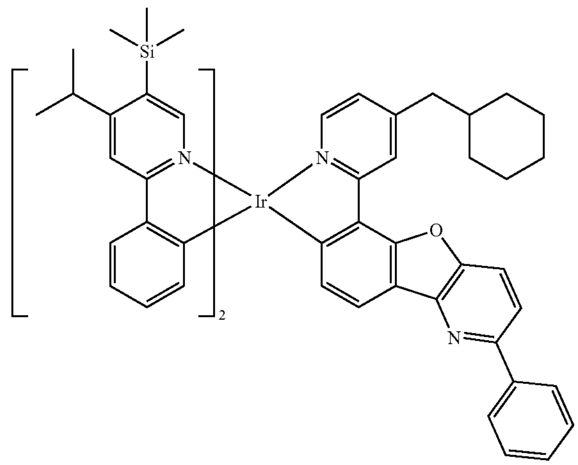
700
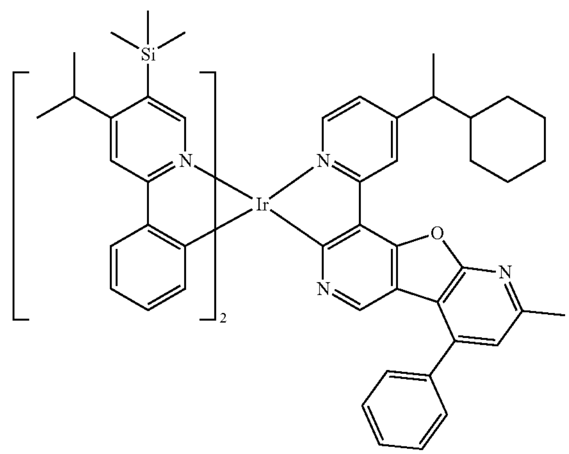
701
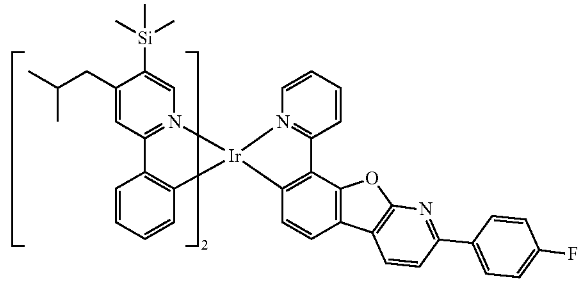
702
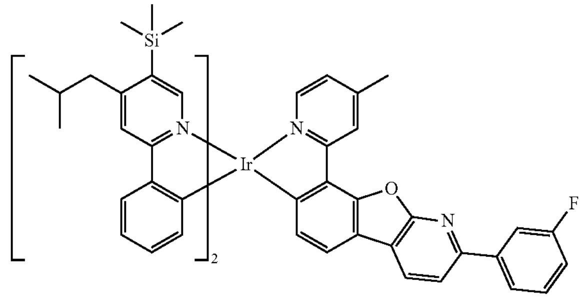

-continued
703
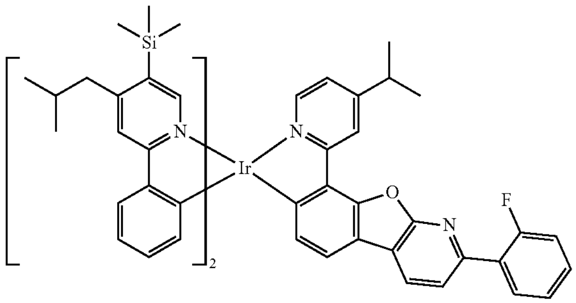
704
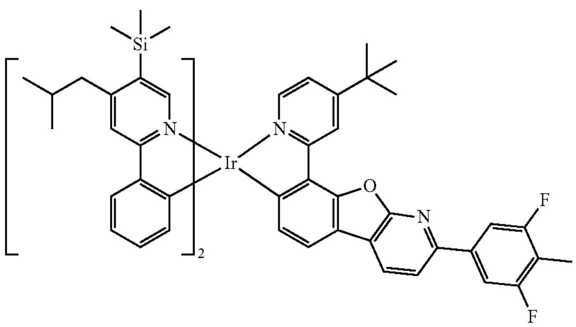
705
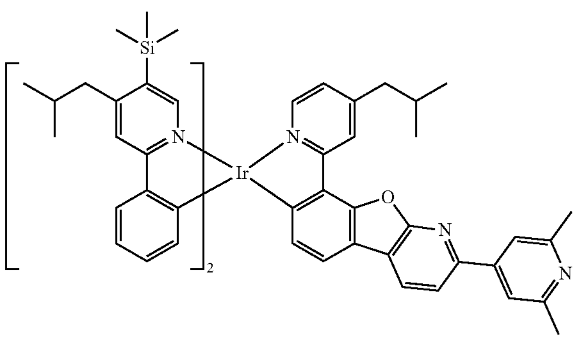
706
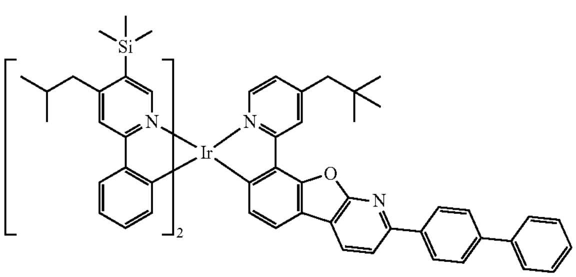
707
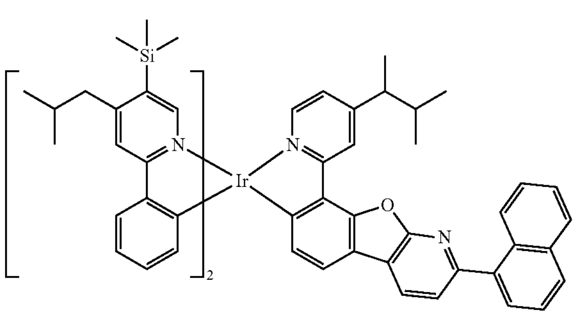
-continued
708
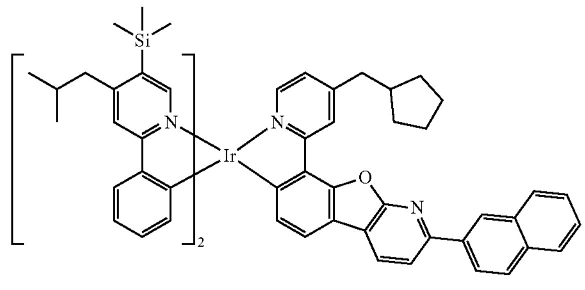
709
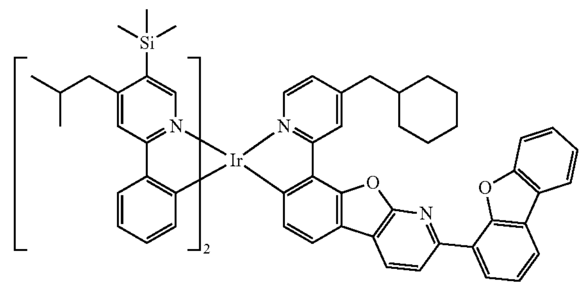
710
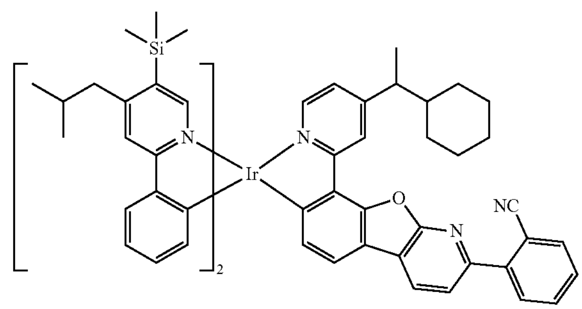
711
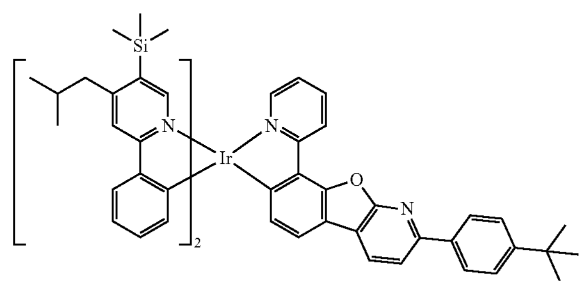
712
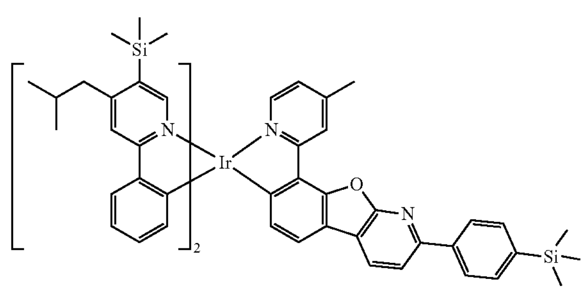

-continued
713
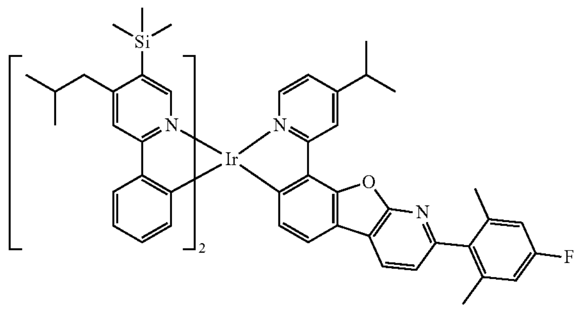
714
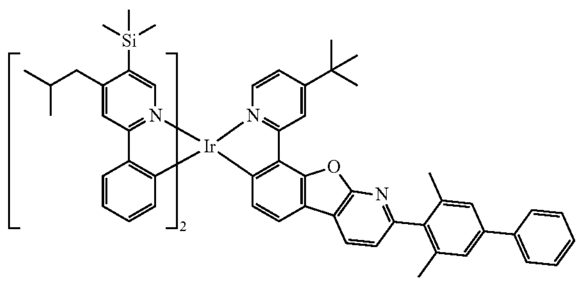
715
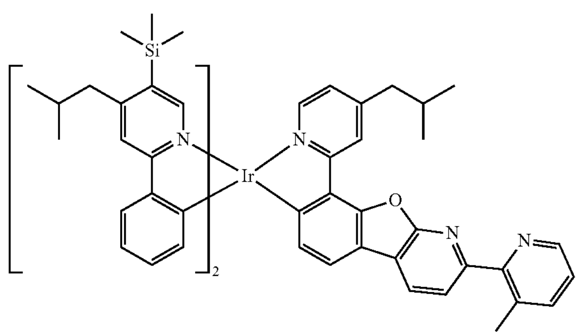
716
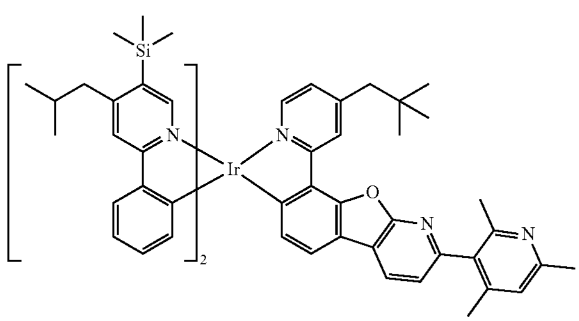
-continued
717
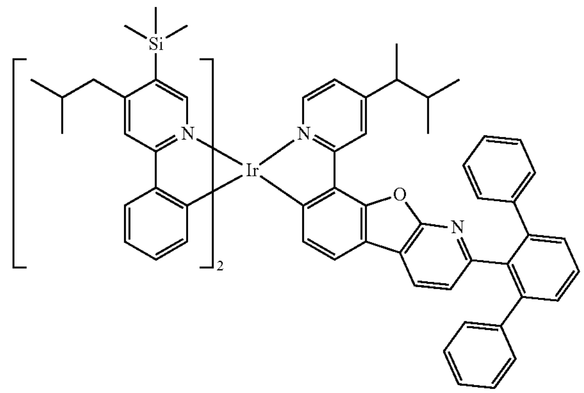
718
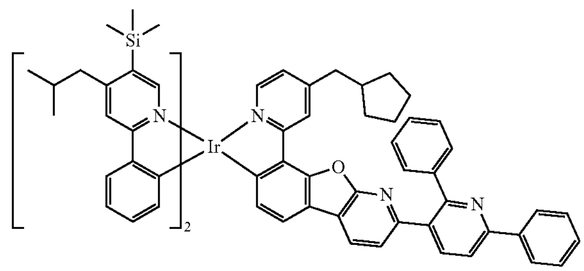
719
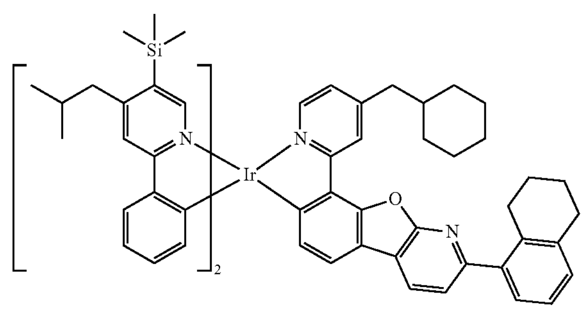
720
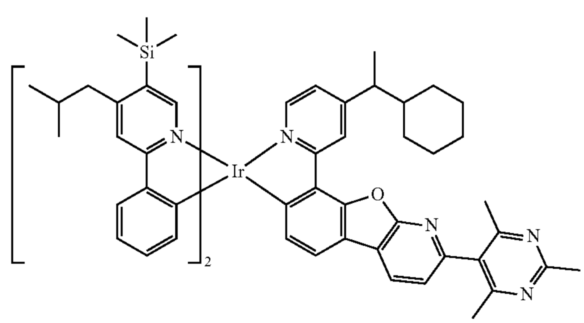

-continued
721
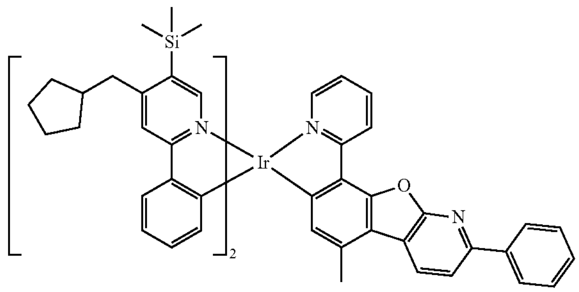
722
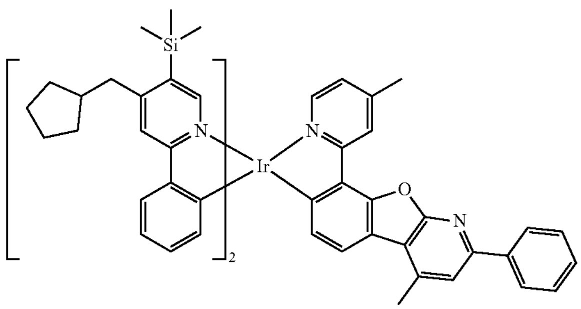
723
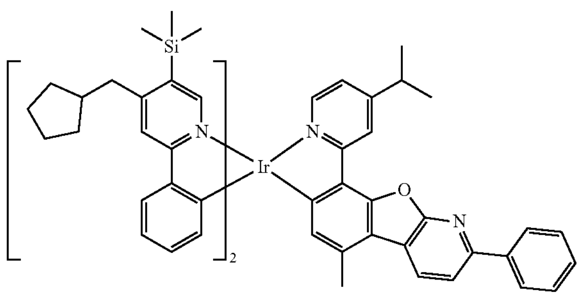
724
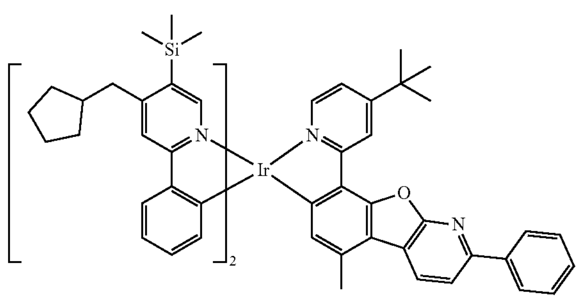
725
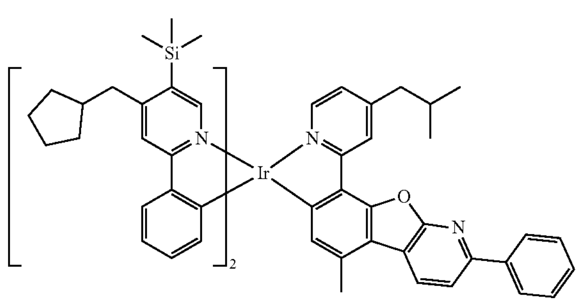
-continued
726
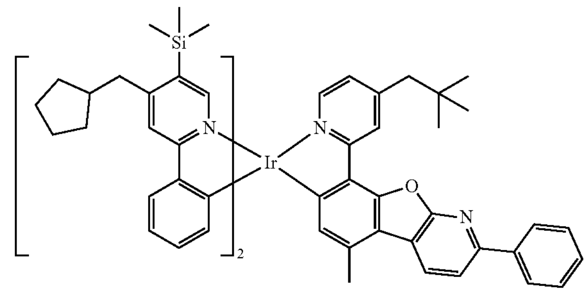
727
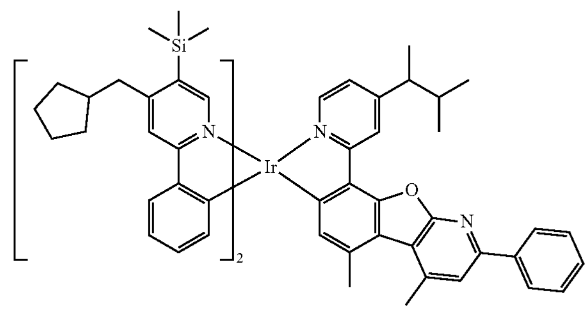
728
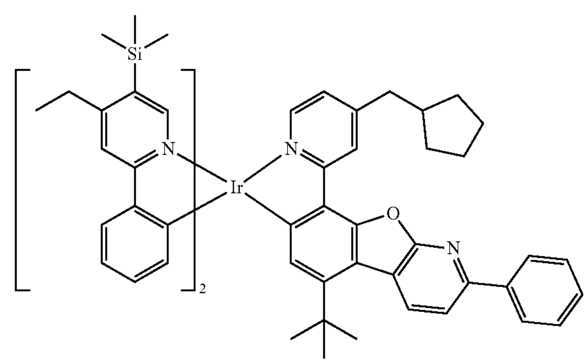
729
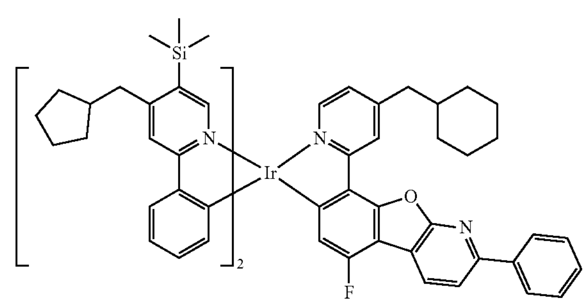

-continued
730
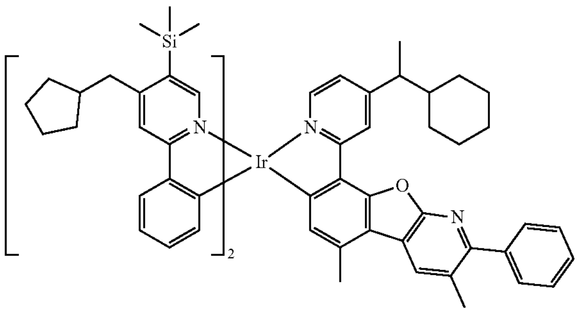
731
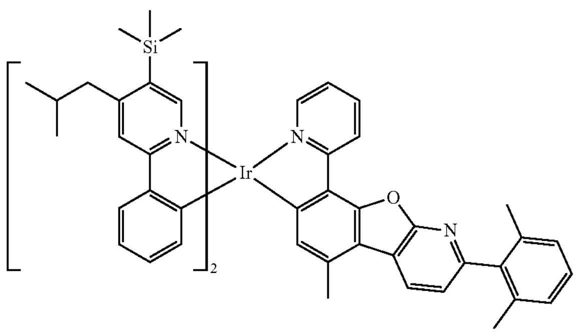
732
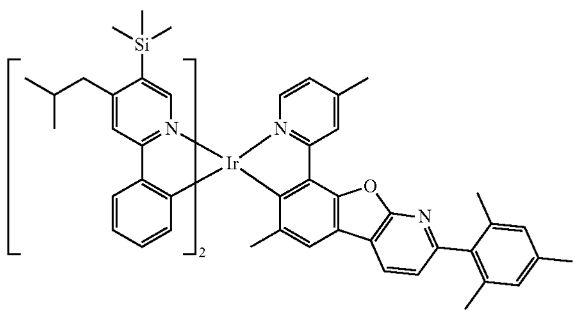
733
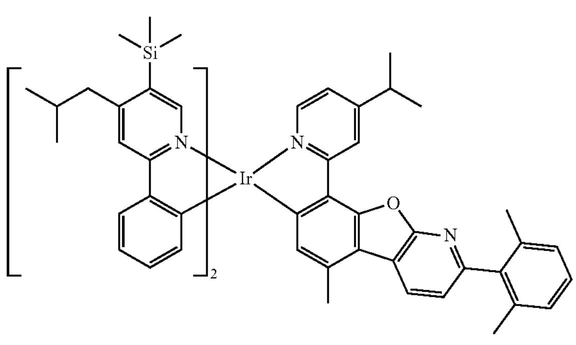
-continued
734
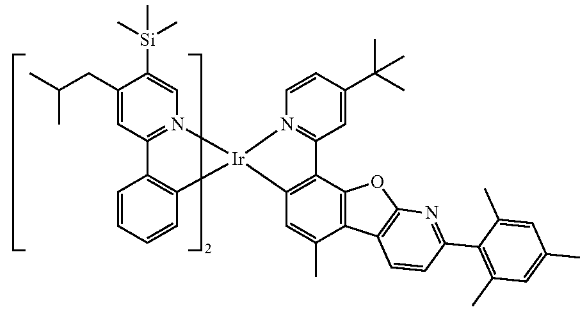
735
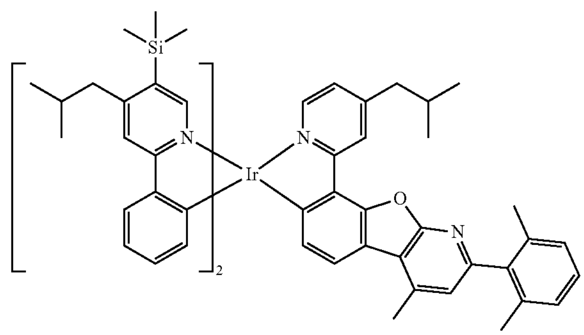
736
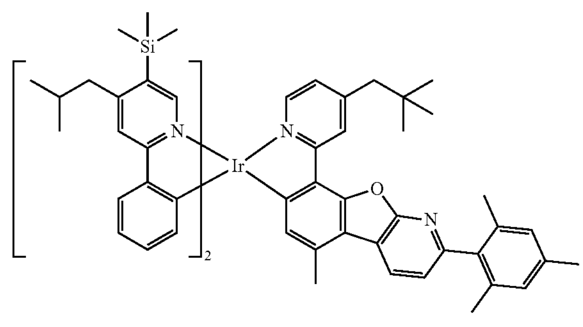
737
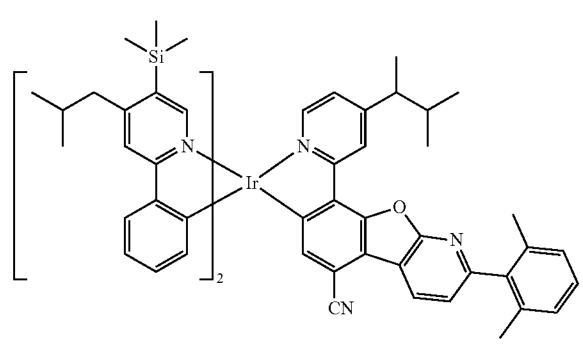

-continued
738
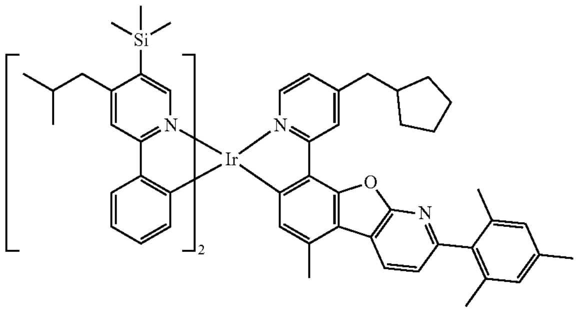
739
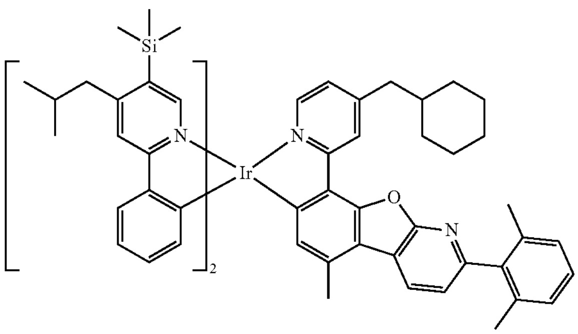
740
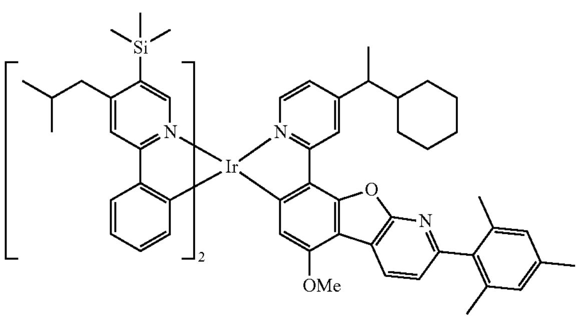
741
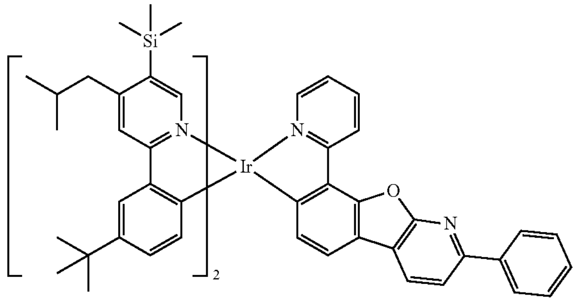
-continued
742
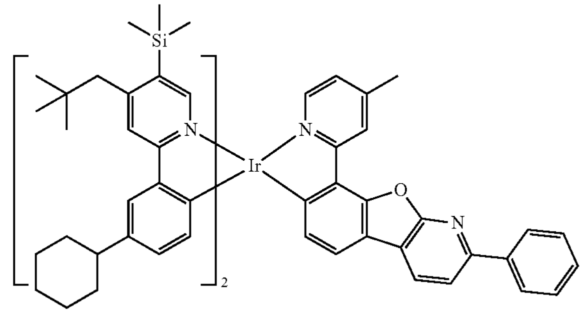
743
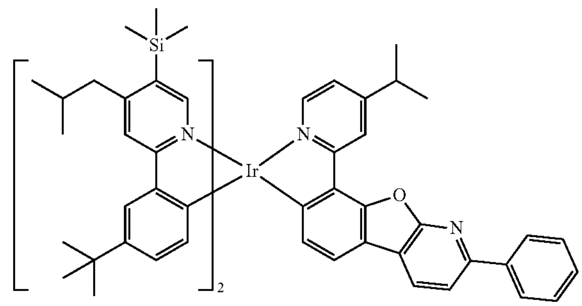
744
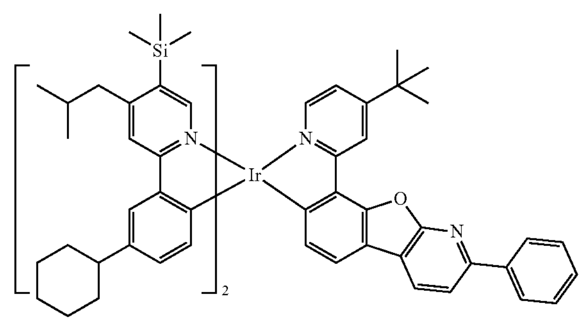
745
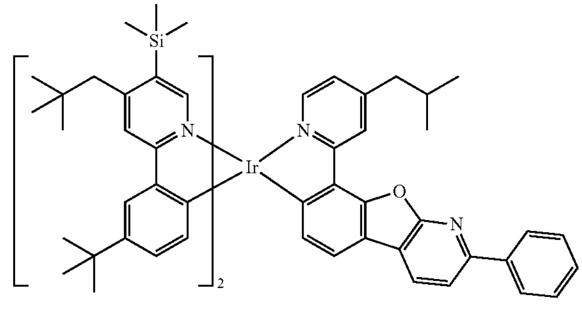

-continued
746
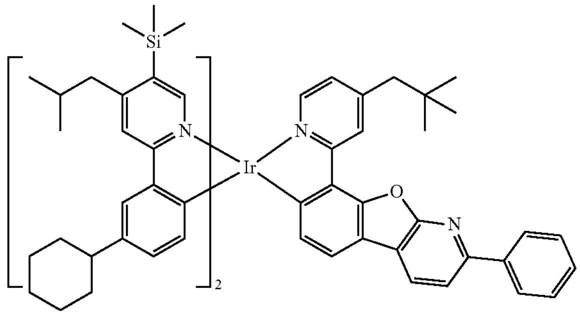
747
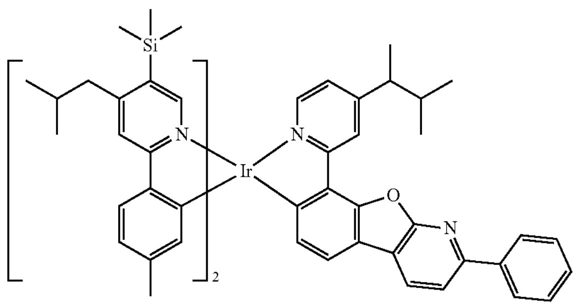
748
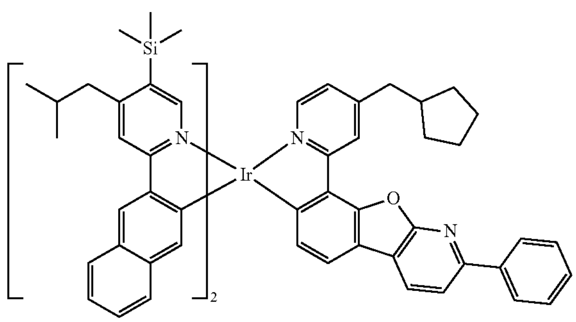
749
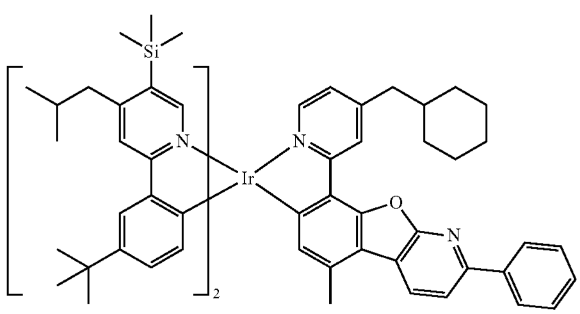
-continued
750
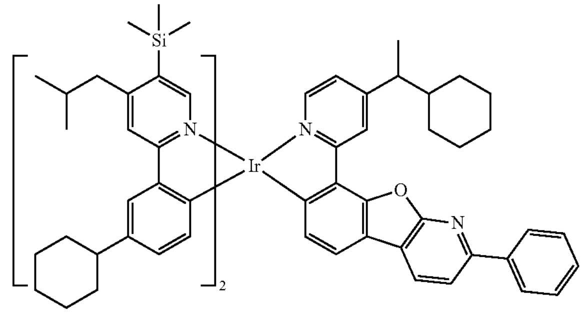
751
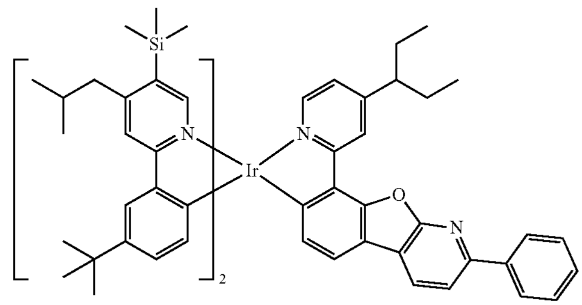
752
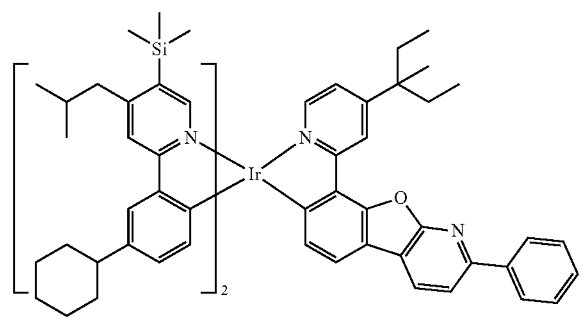
753
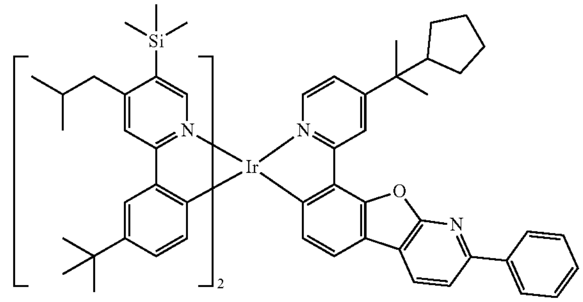

-continued
754
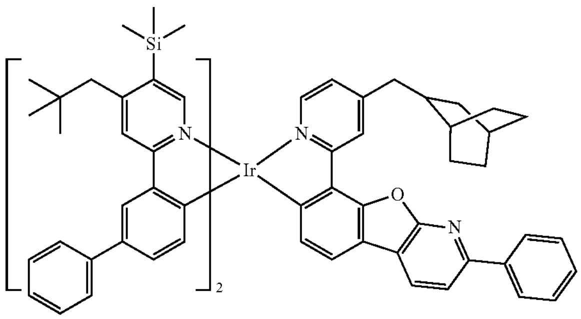
755
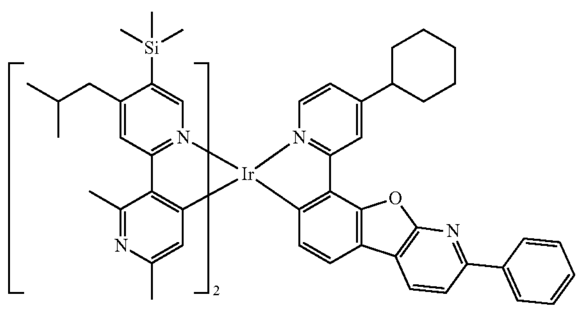
756
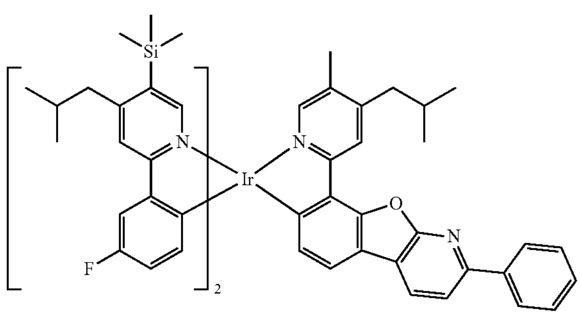
757
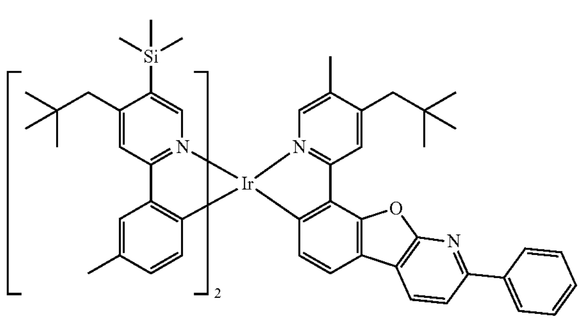
-continued
758
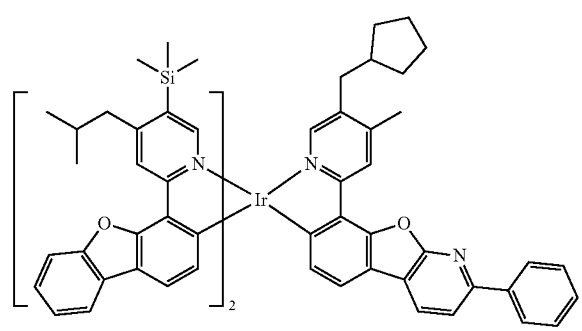
759
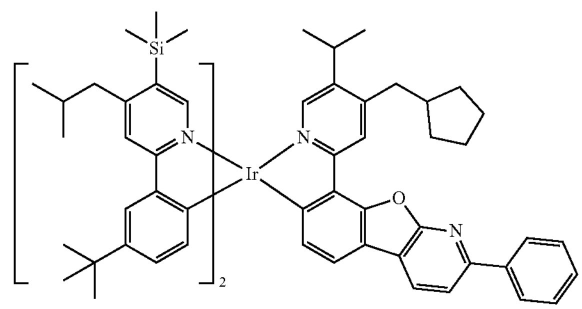
760
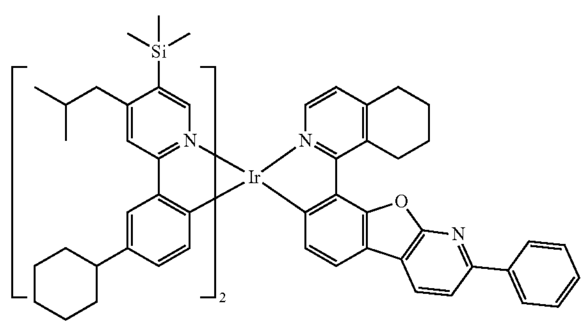
761
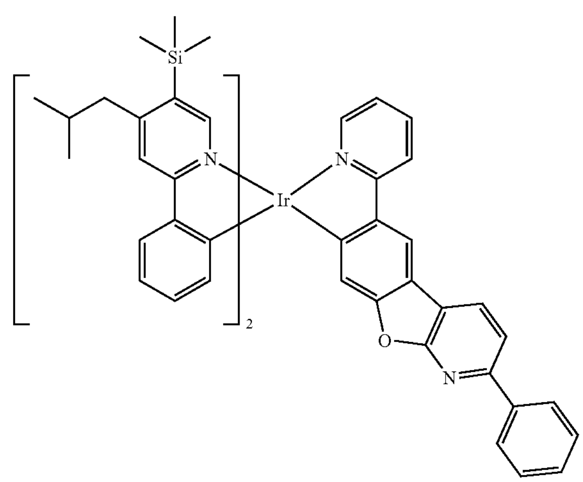

762
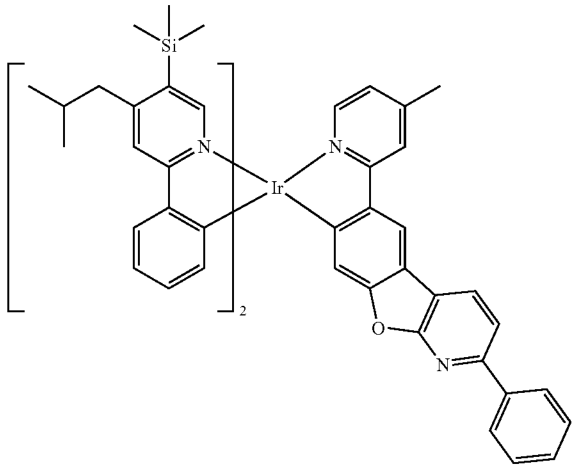
763
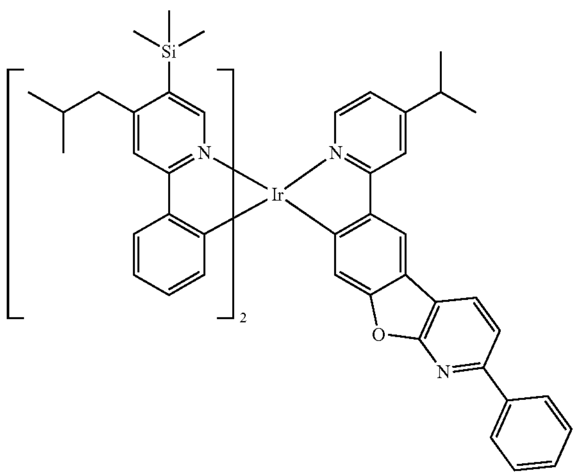
764
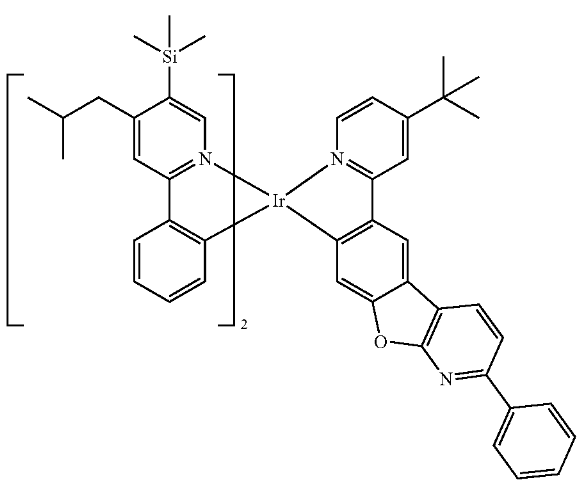
765
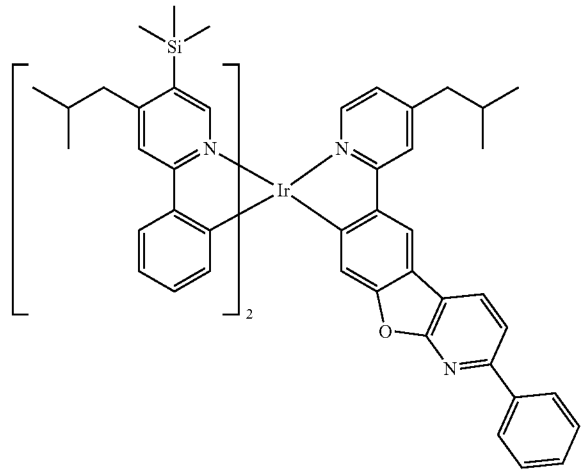
766
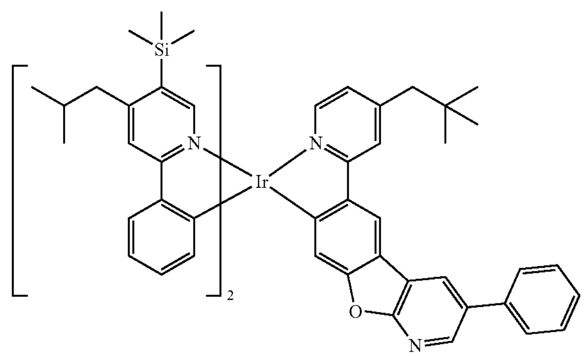
767
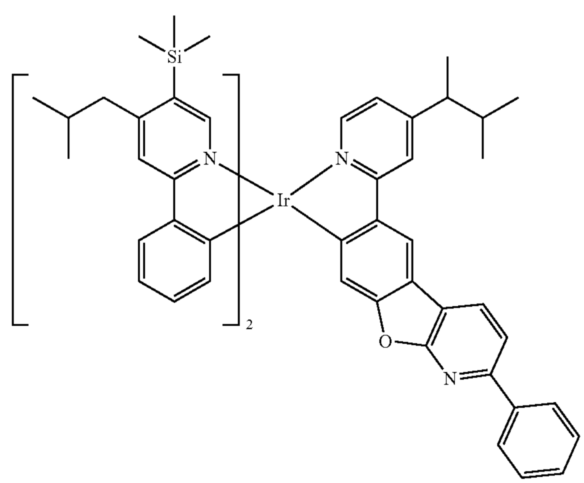

768
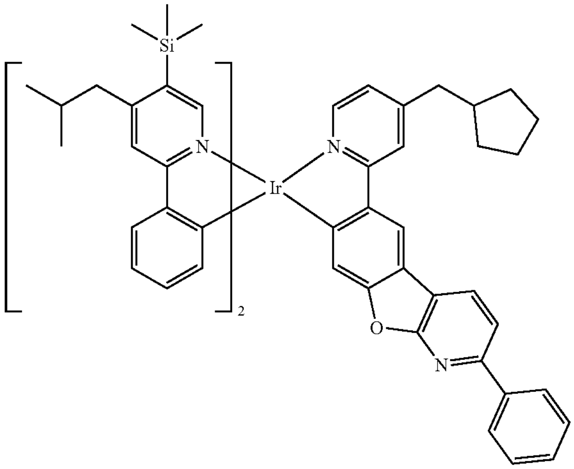
769
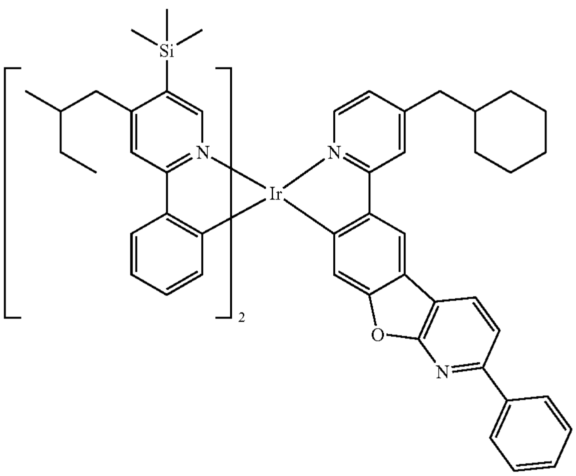
770
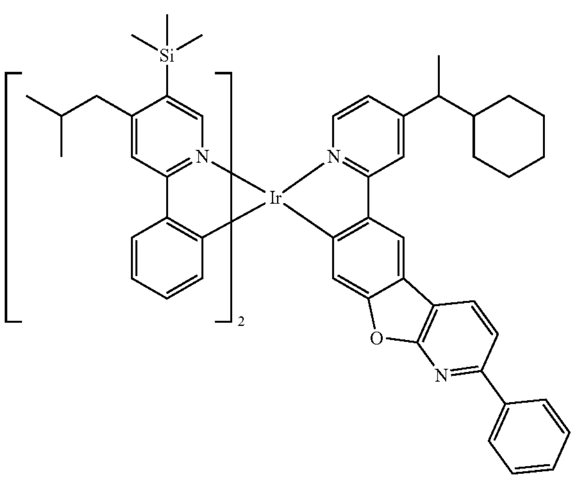
771
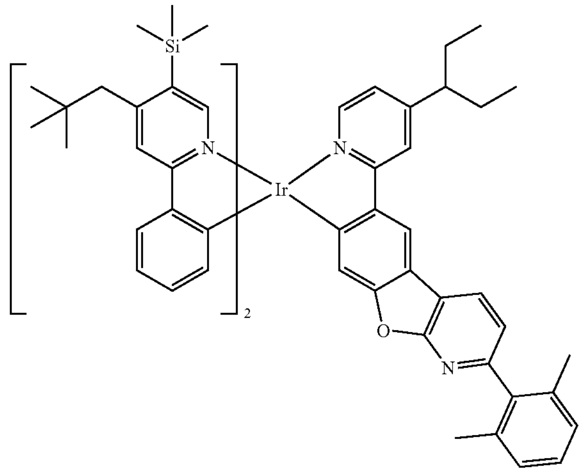
772
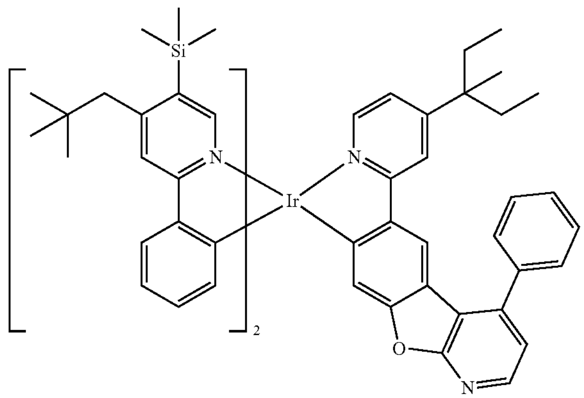
773
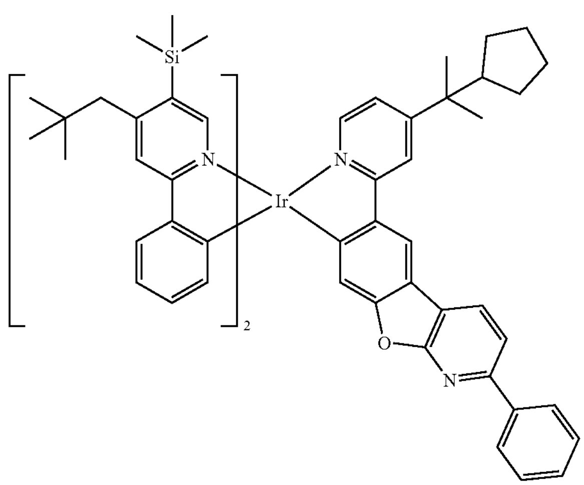

-continued
774
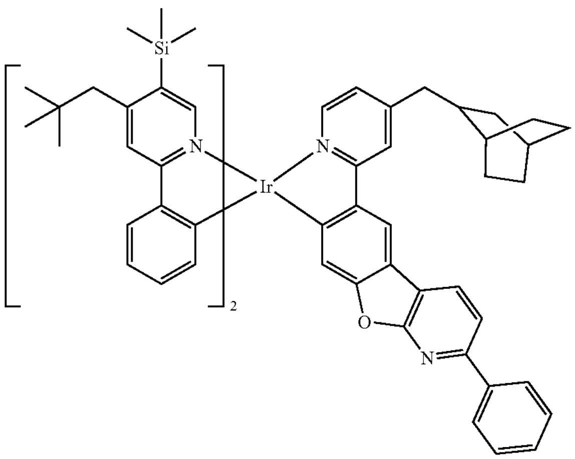
775
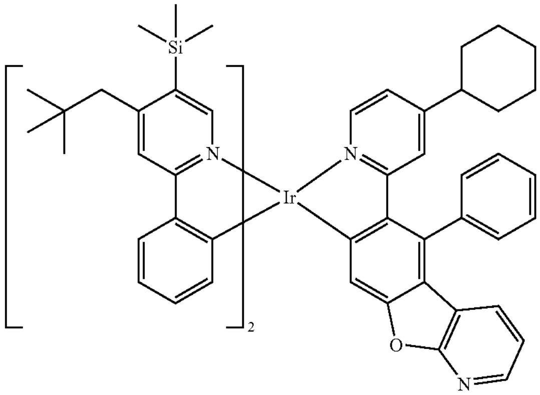
776
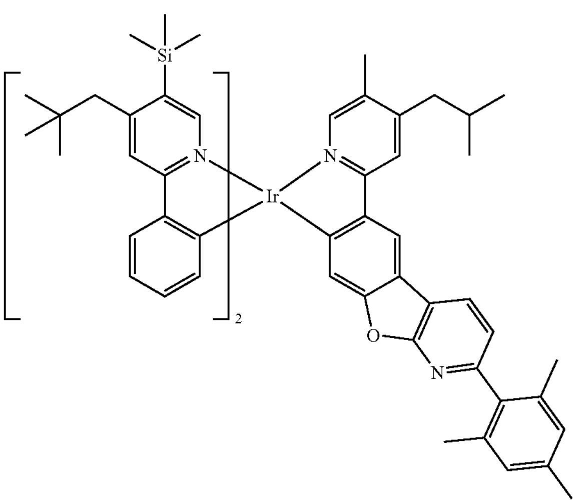
-continued
777
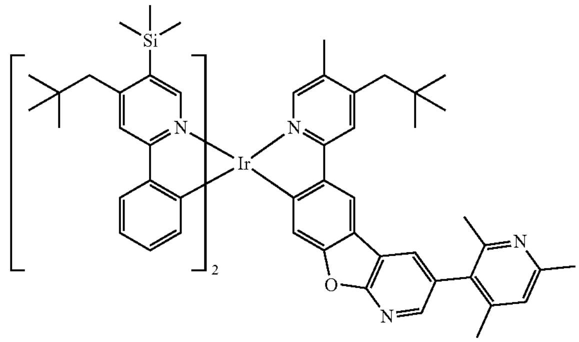
778
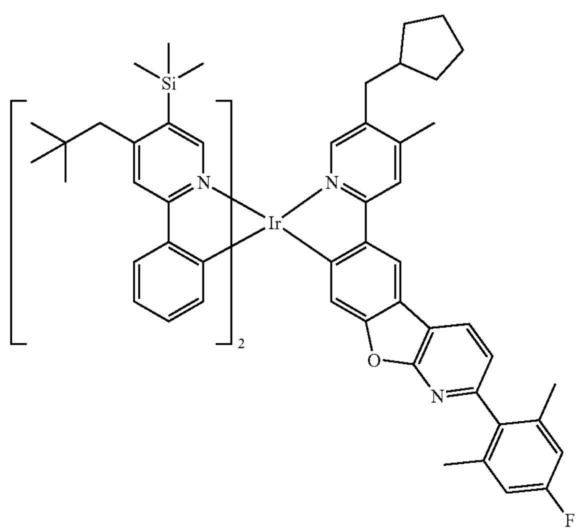
779
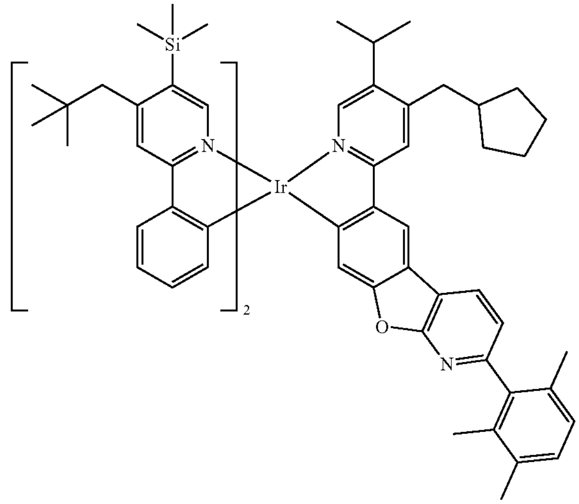

-continued
780
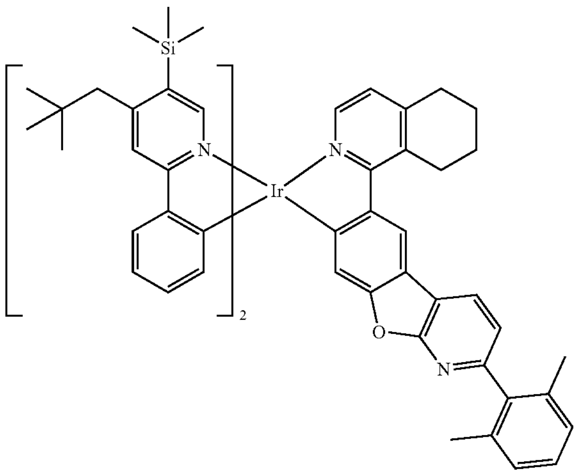
781
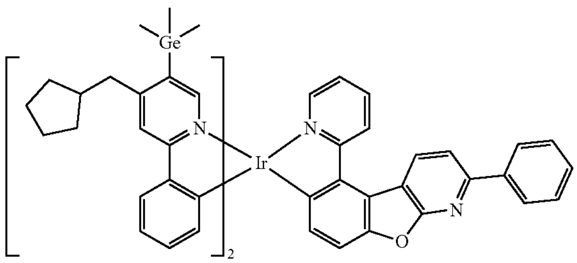
782
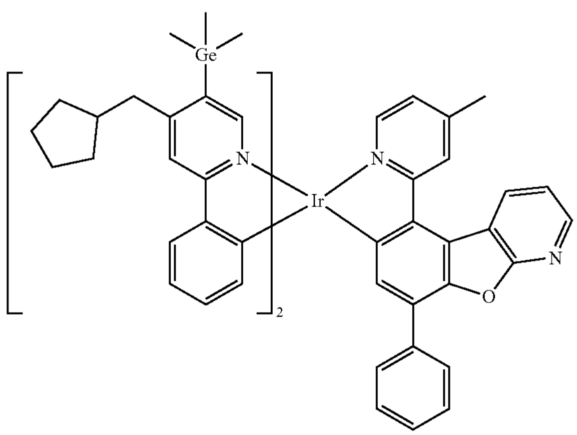
783
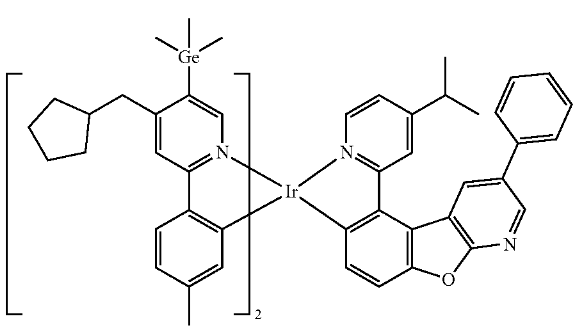
-continued
784
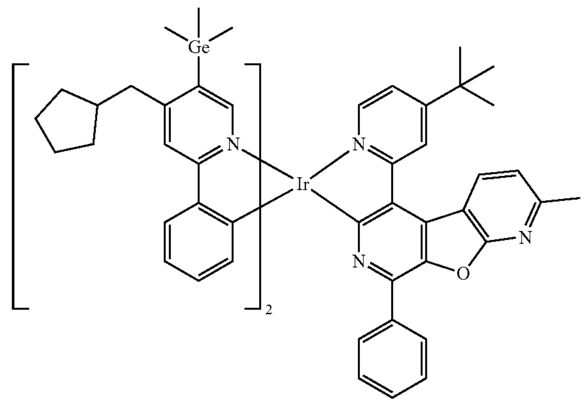
785
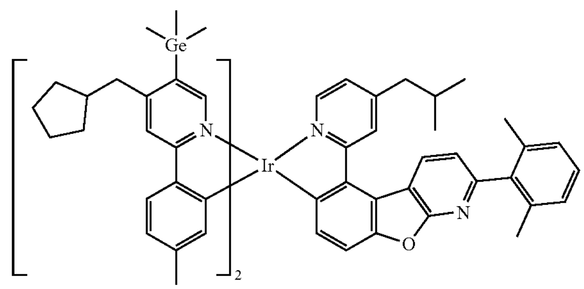
786
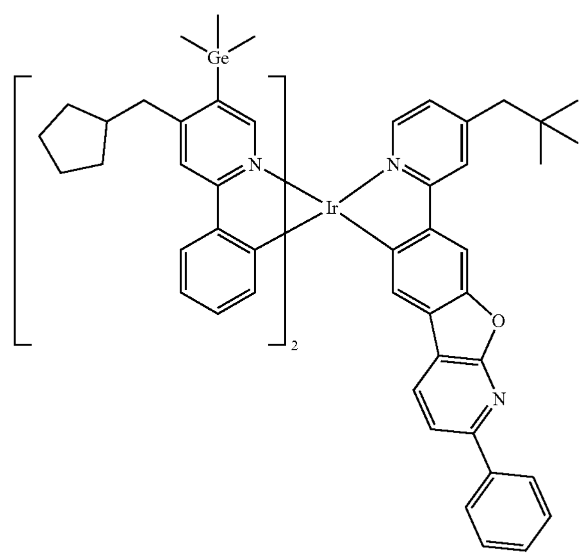

787
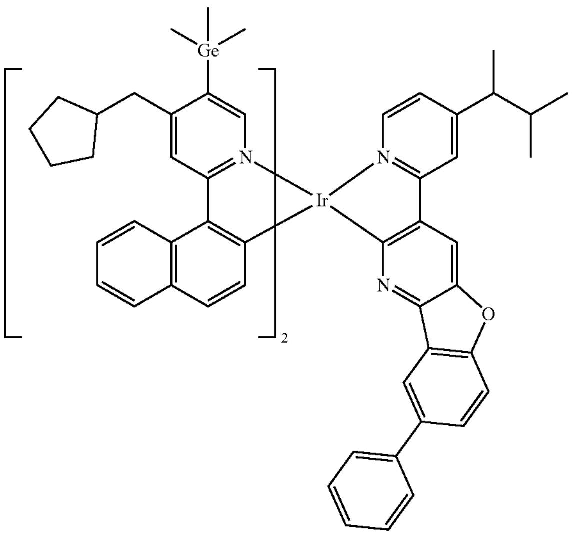
788
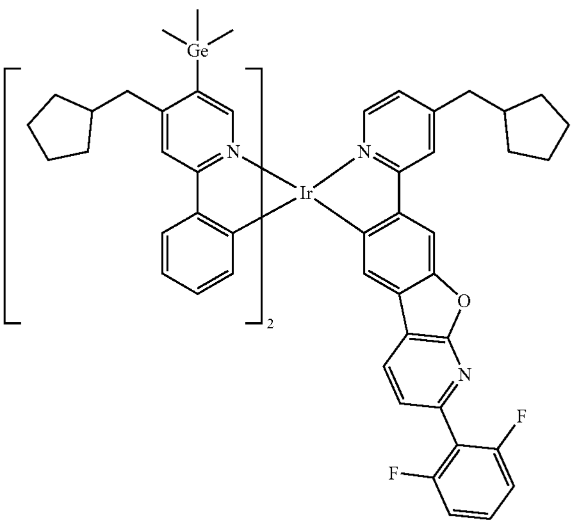
789
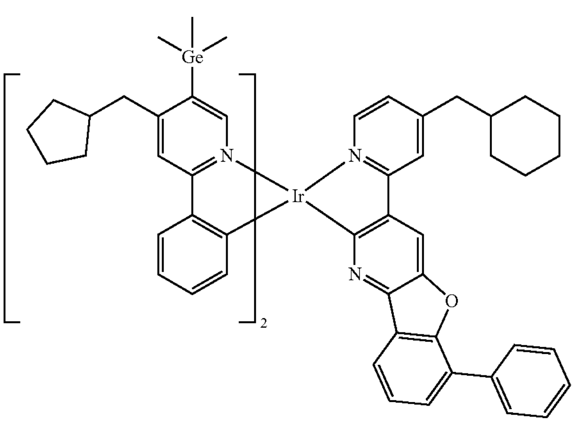
790
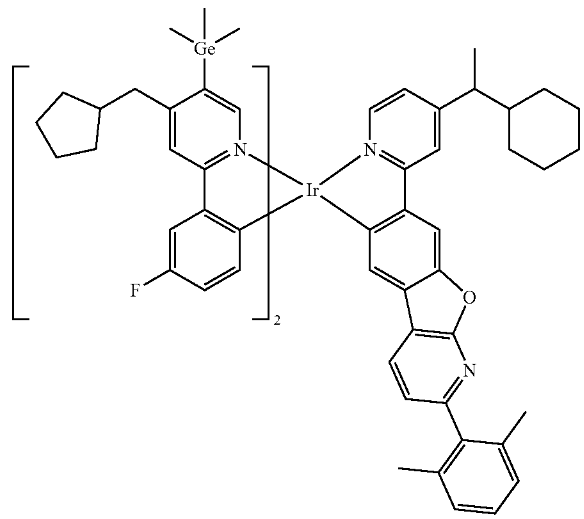
791
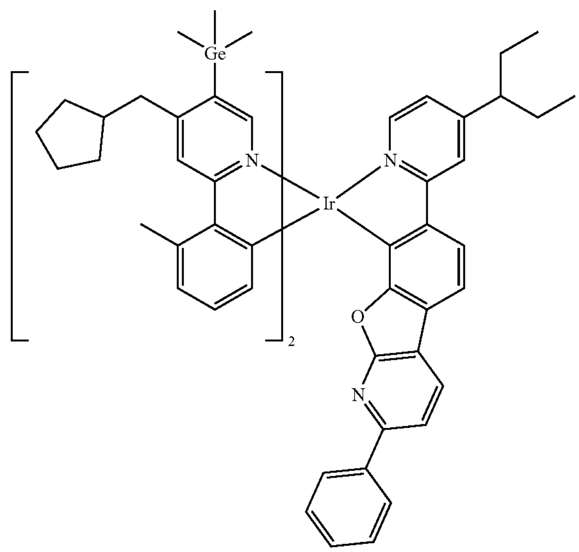
792
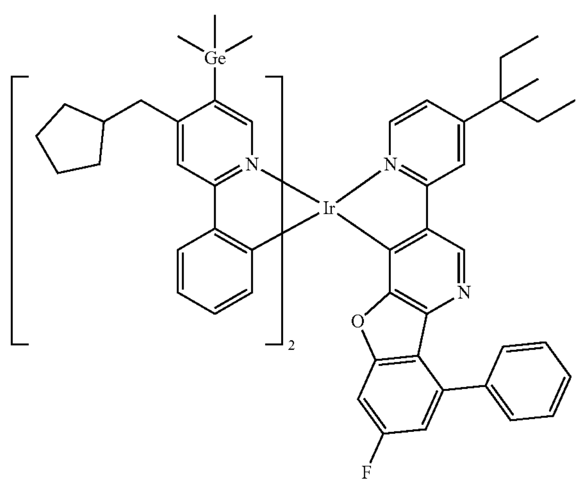

793
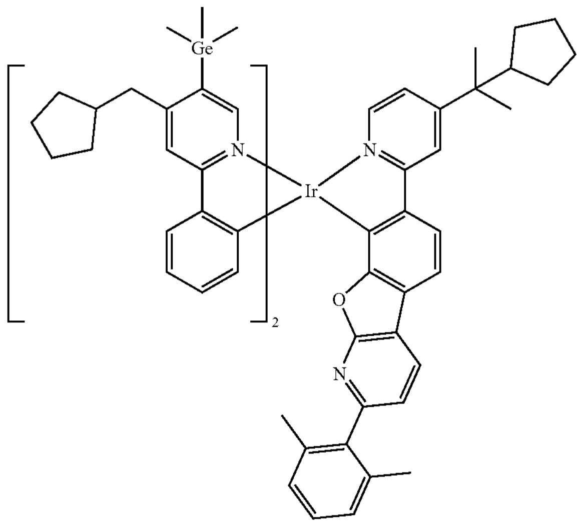
794
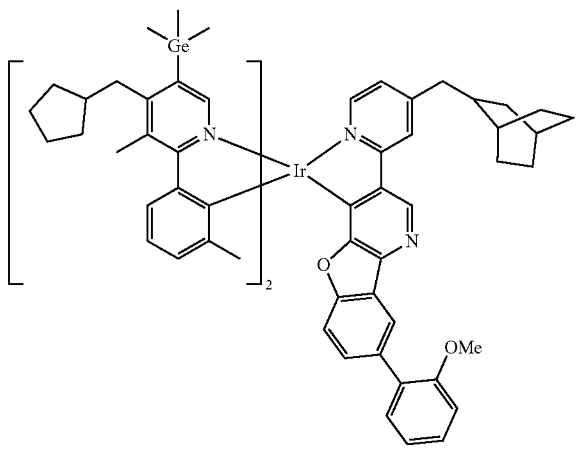
795
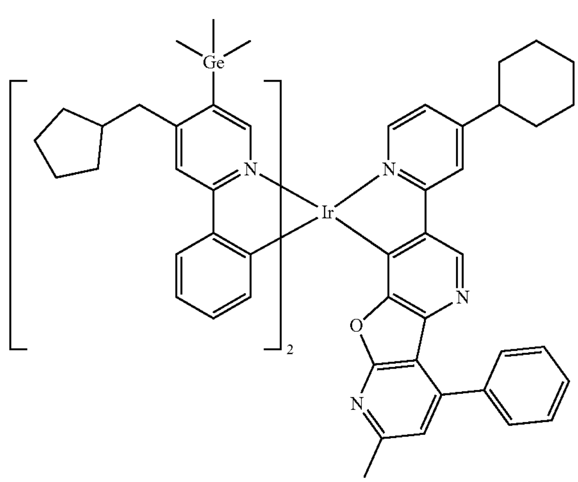
796
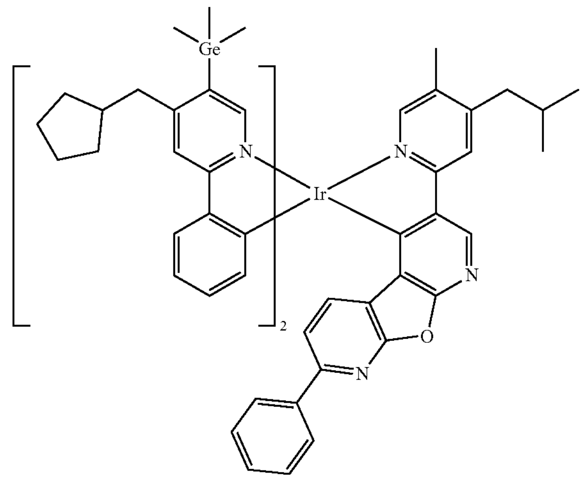
797
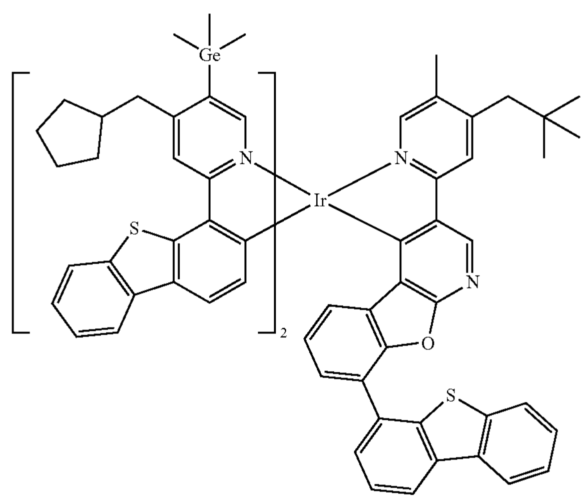
798
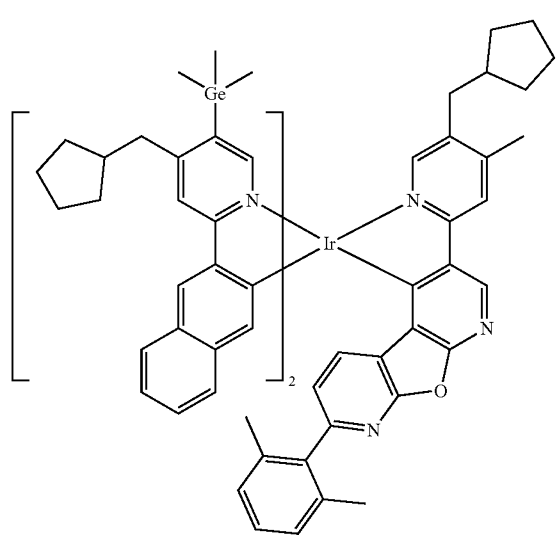

-continued
799
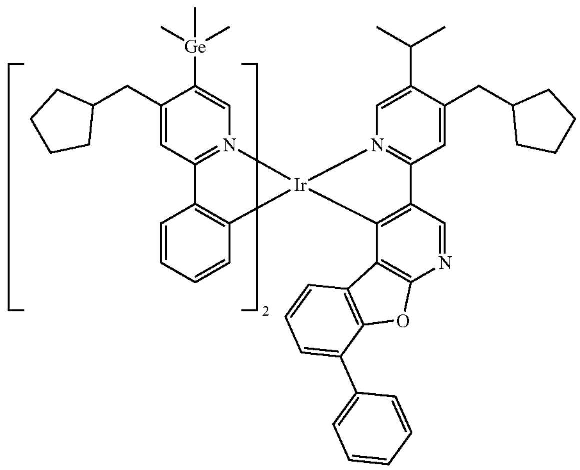
800
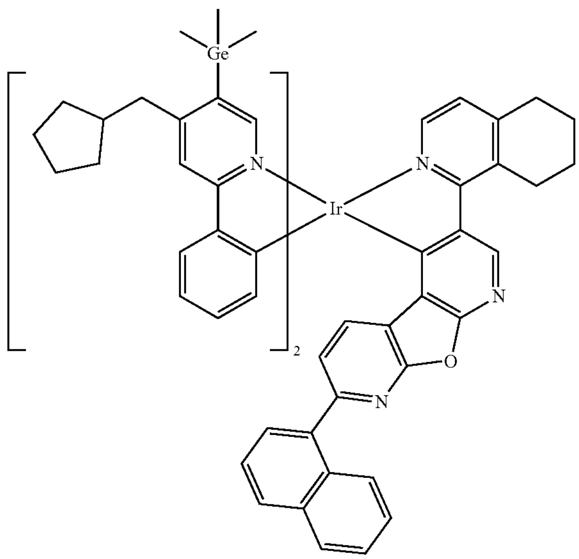
801
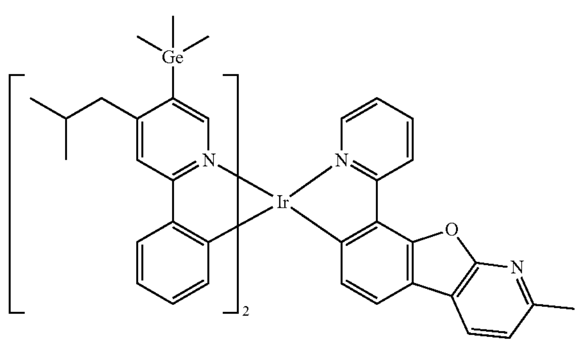
-continued
802
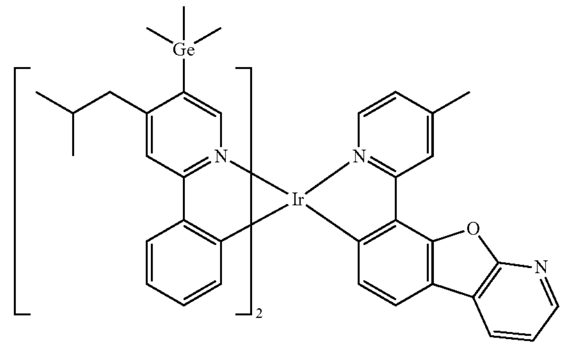
803
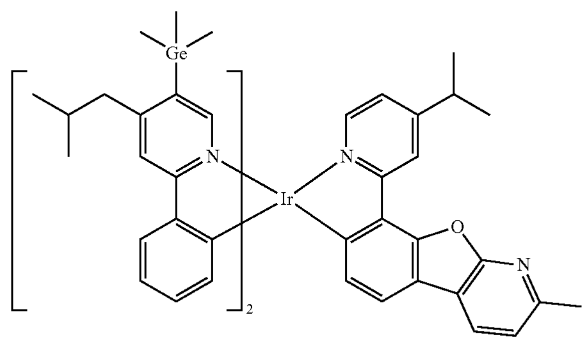
804
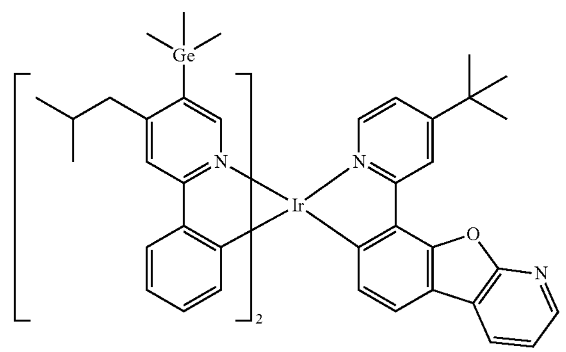
805
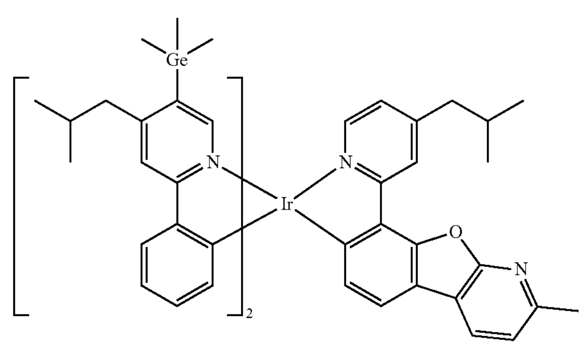

806
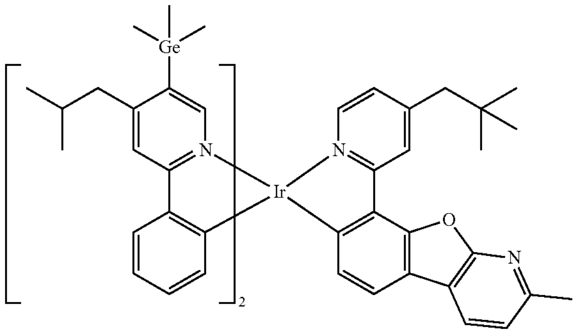
807
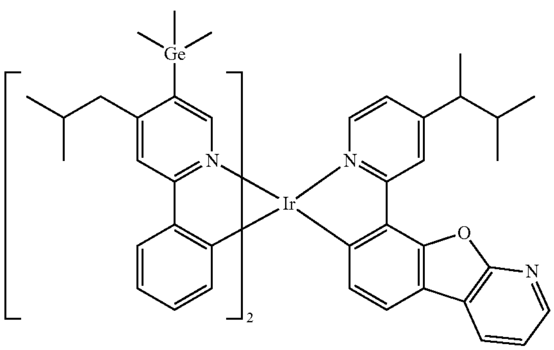
808
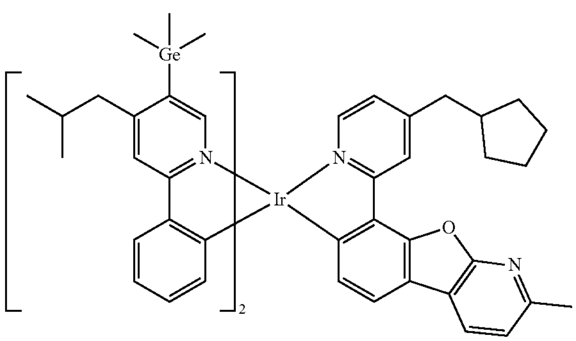
809
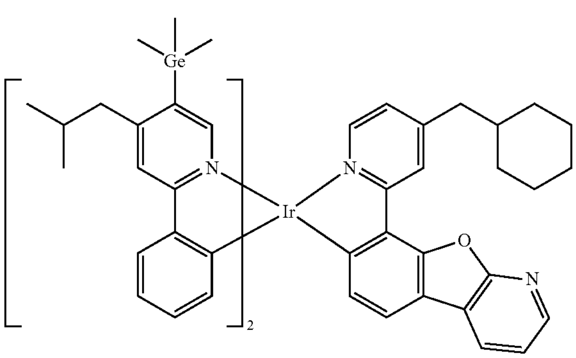
810
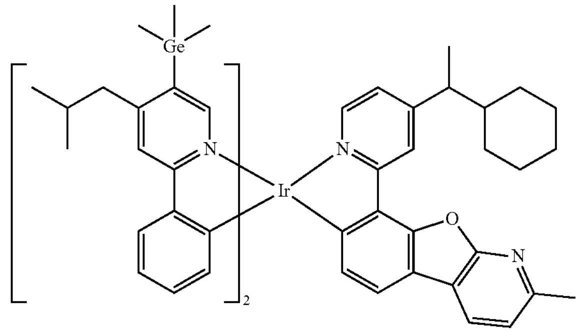
811
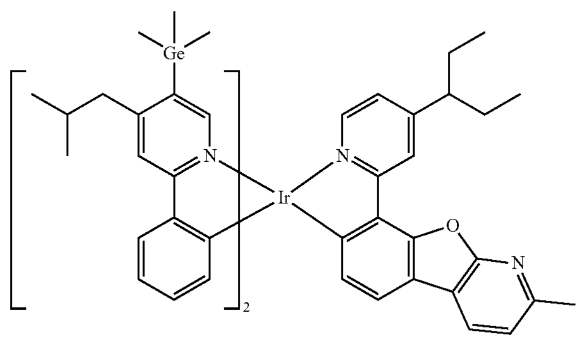
812
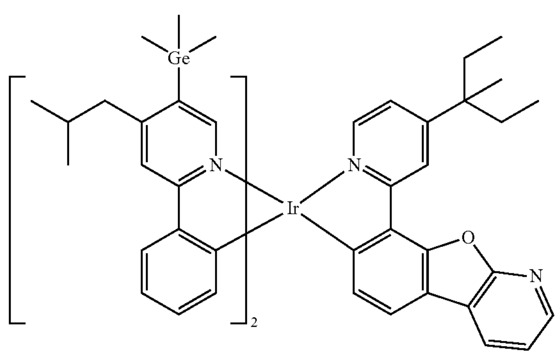
813
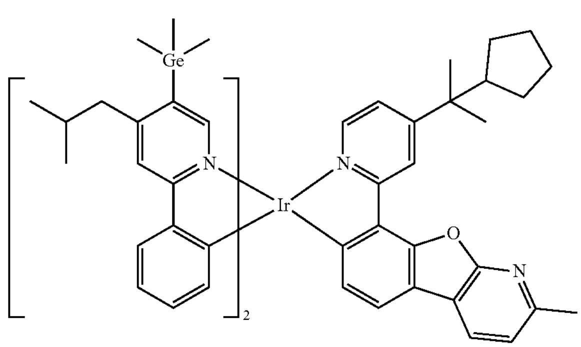

-continued
814
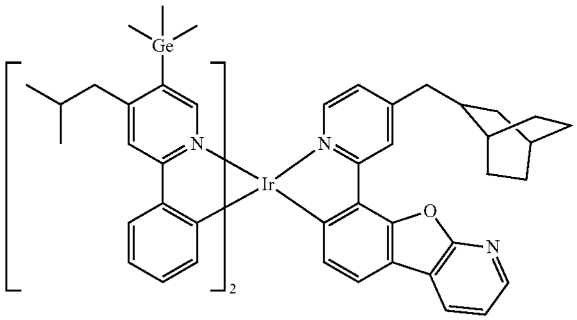
815
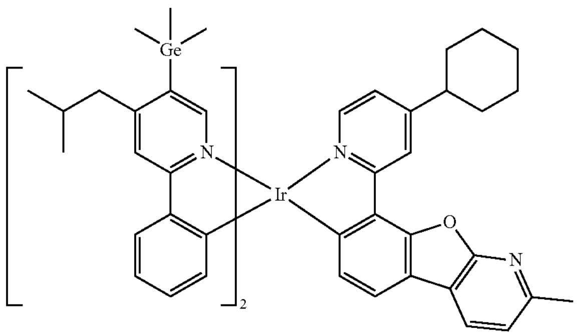
816
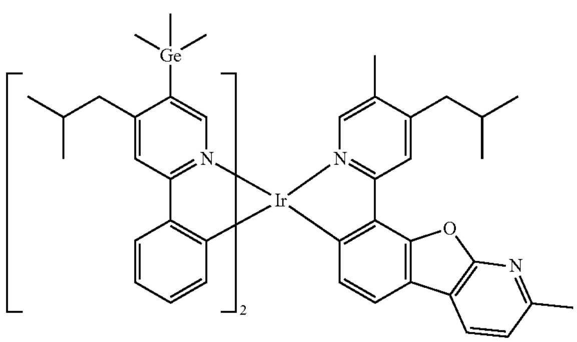
817
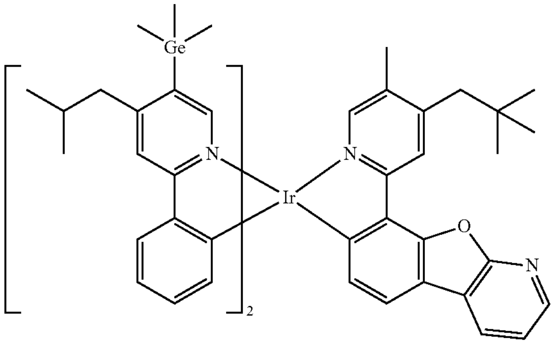
-continued
818
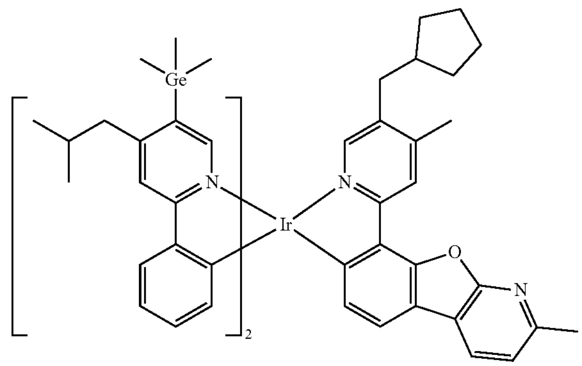
819
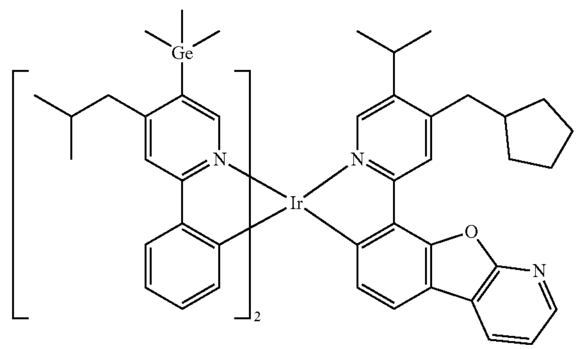
820
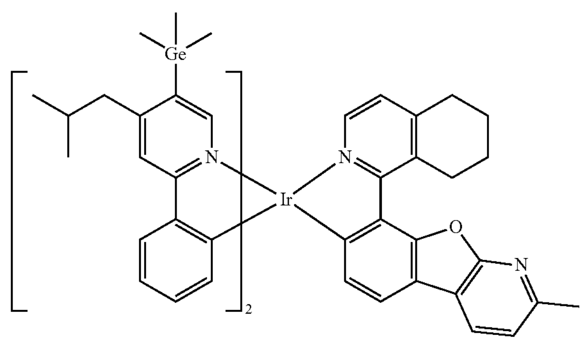
821
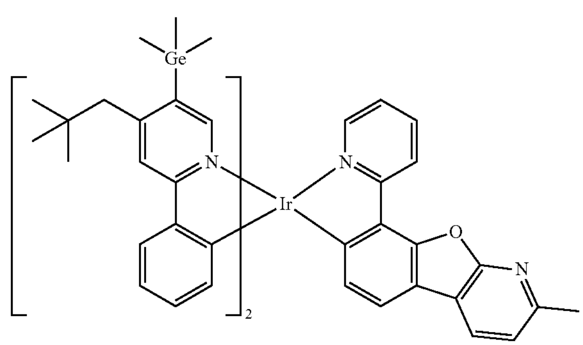

822
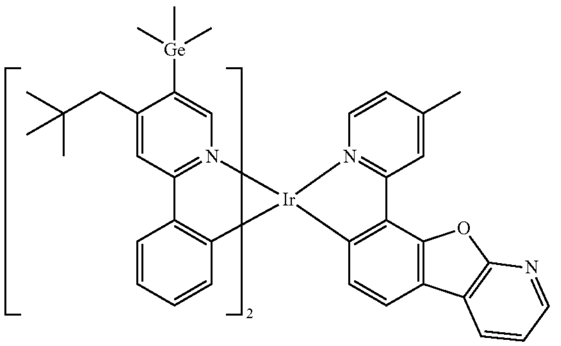
823
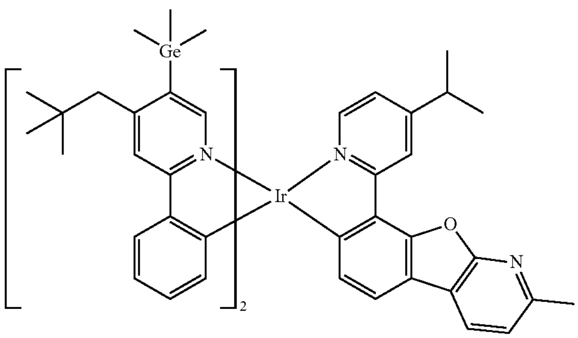
824
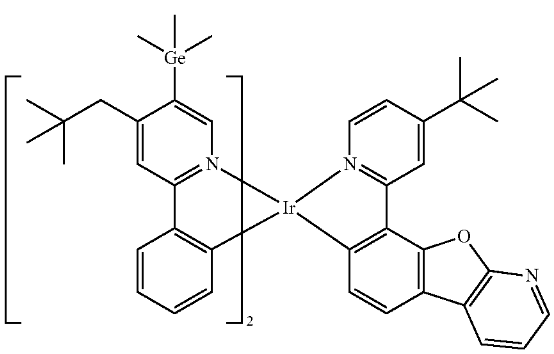
825
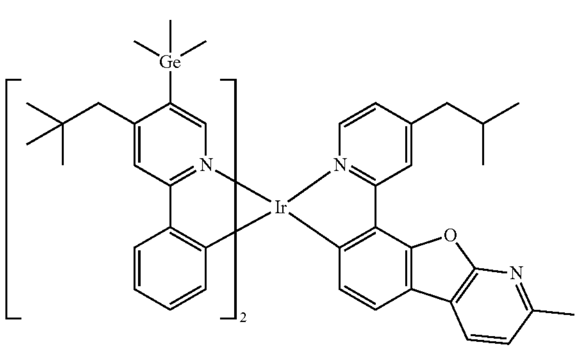
826
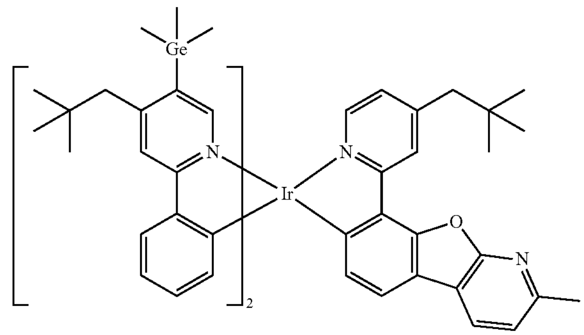
827
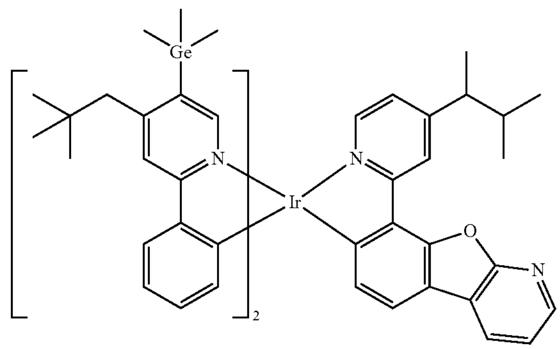
828
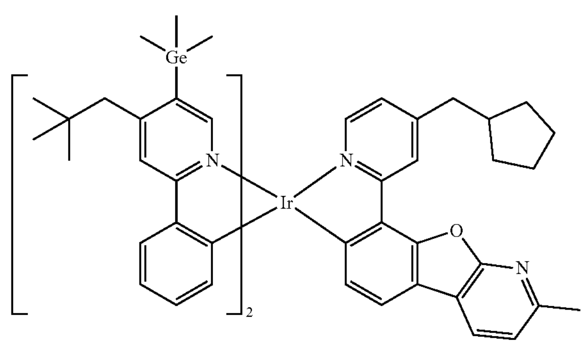
829
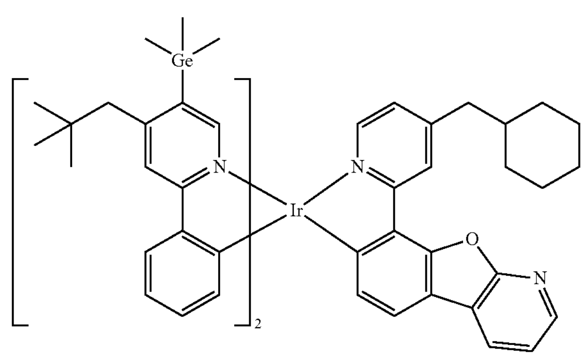

830
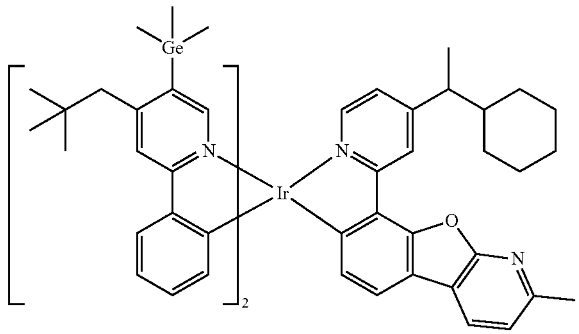
831
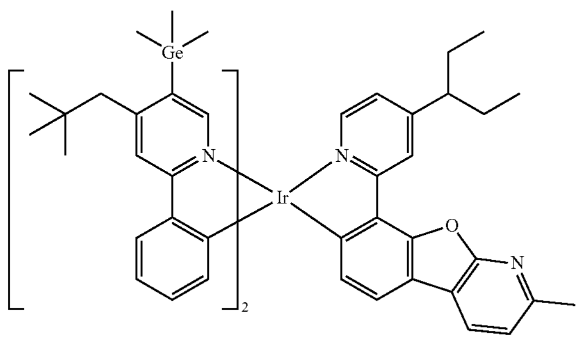
832
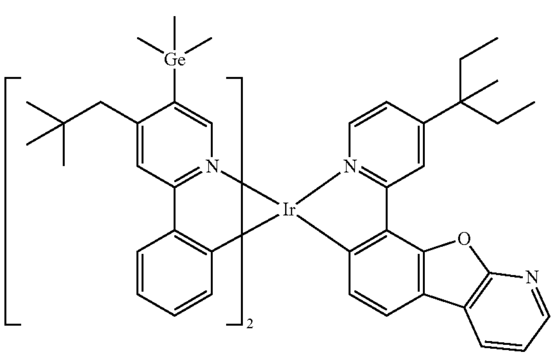
833
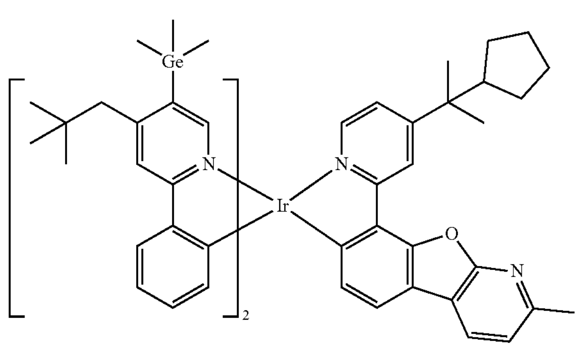
834
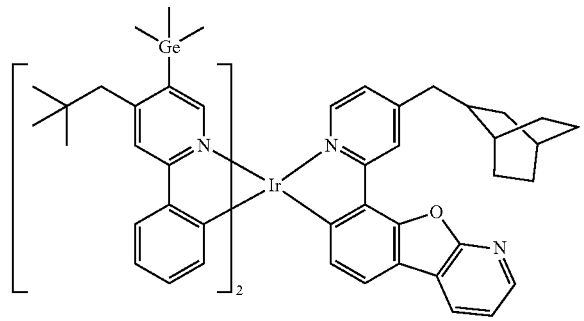
835
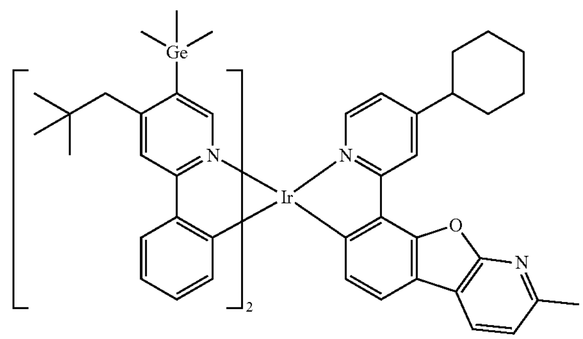
836
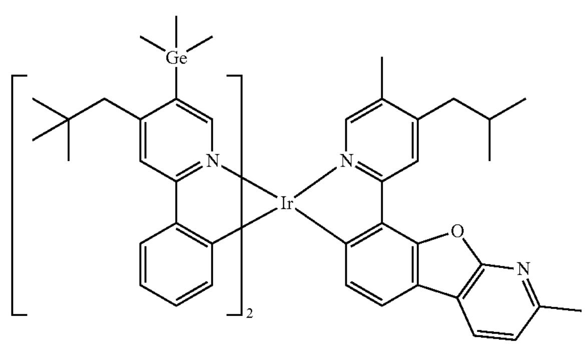
837
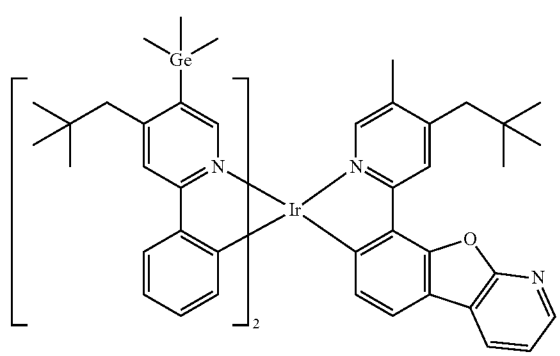

-continued
838
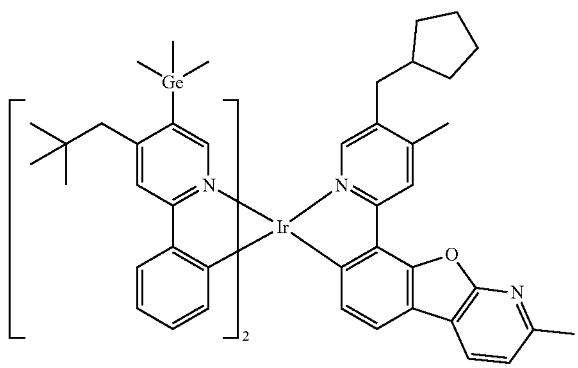
839
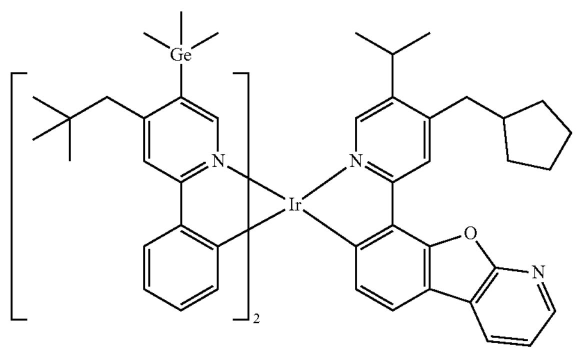
840
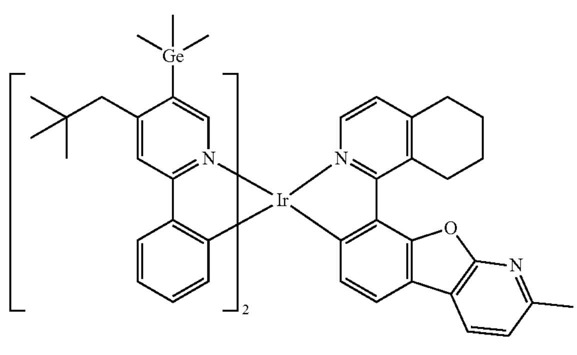
841
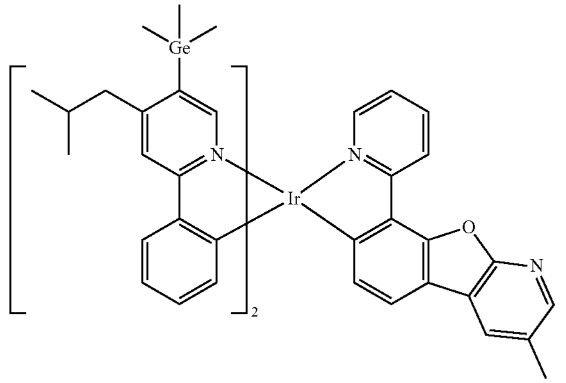
-continued
842
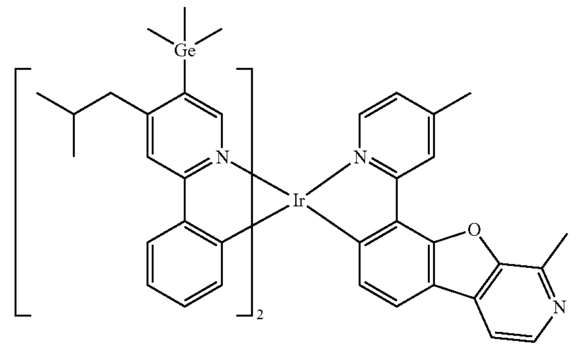
843
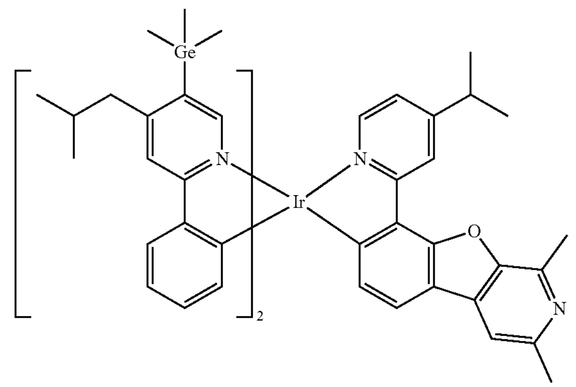
844
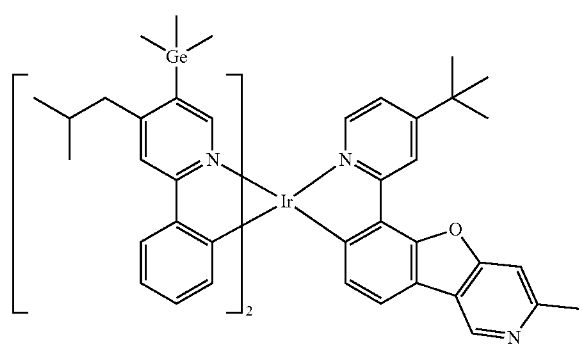
845
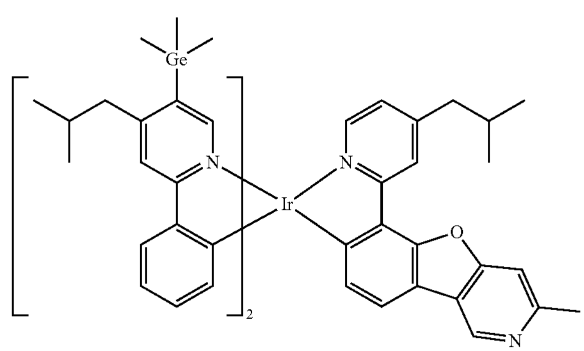

846
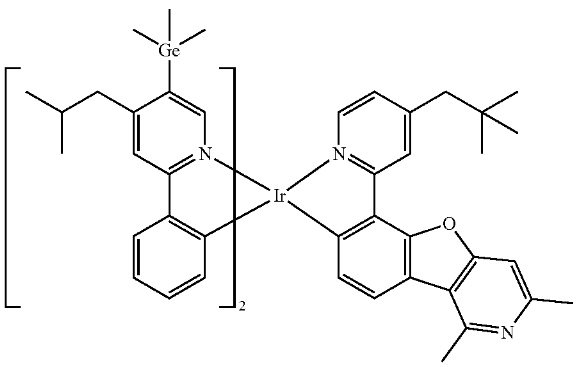
847
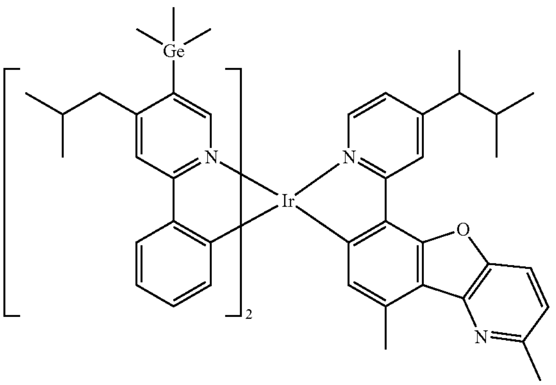
848
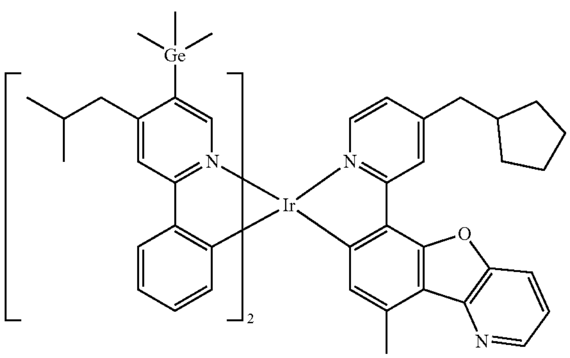
849
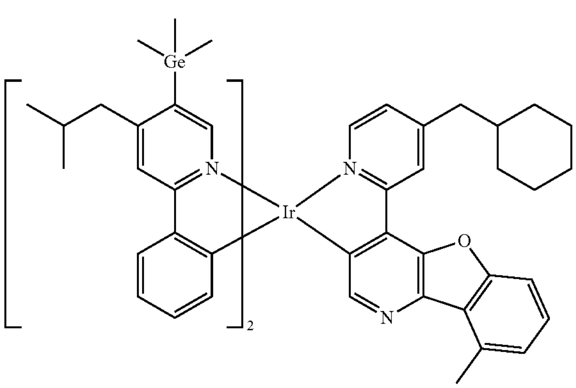
850
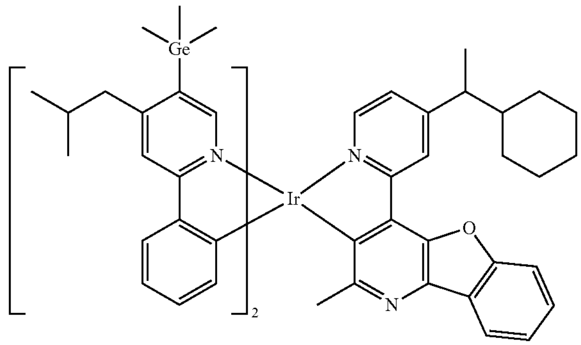
851
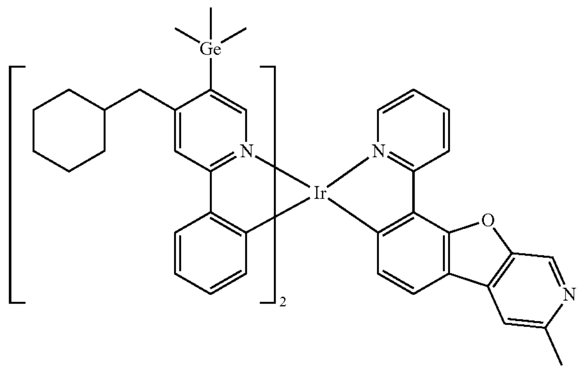
852
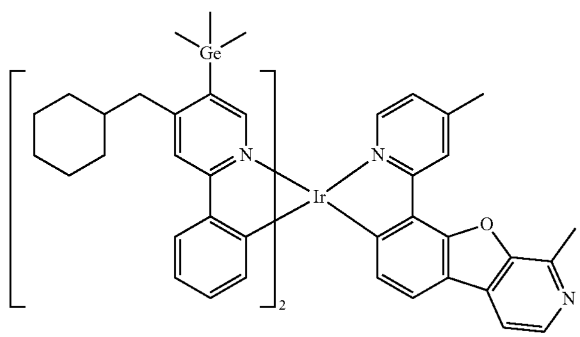
853
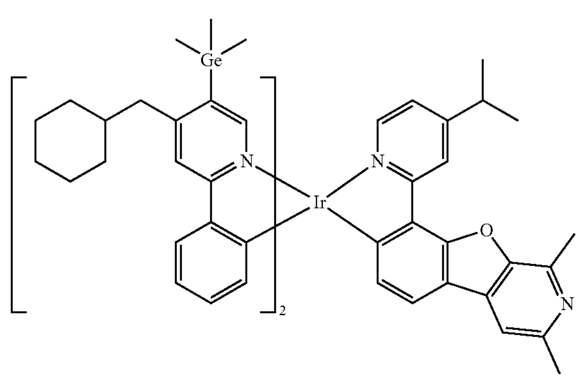

-continued
854
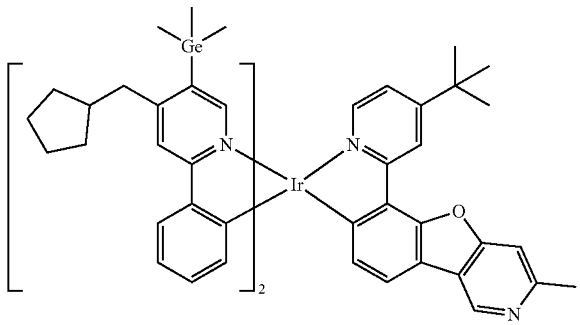
855
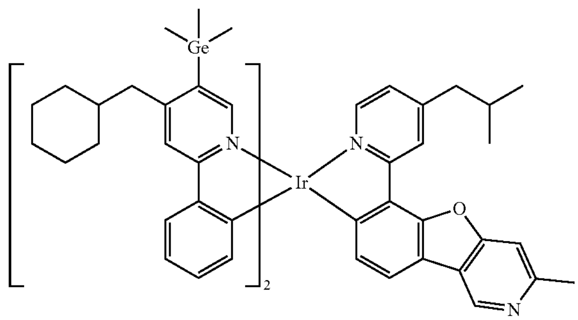
856
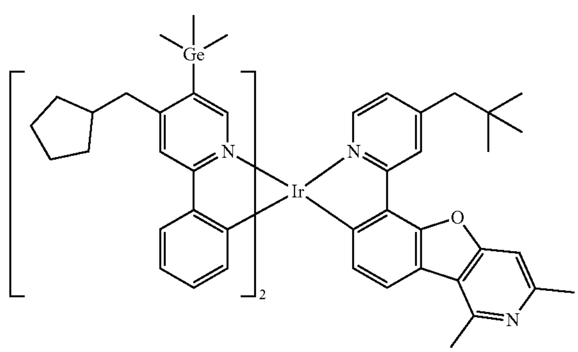
857
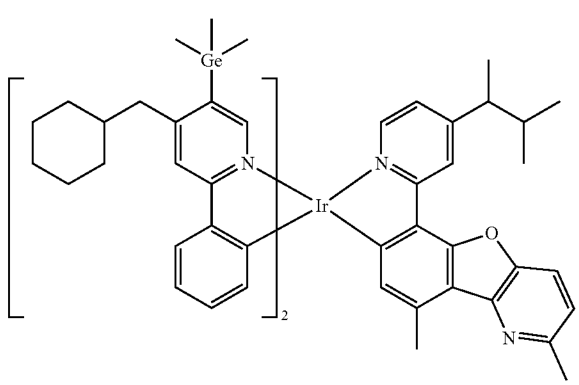
-continued
858
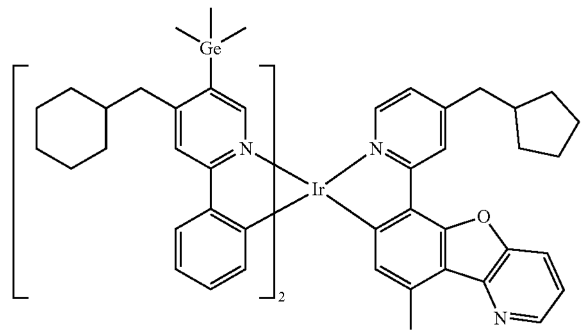
859
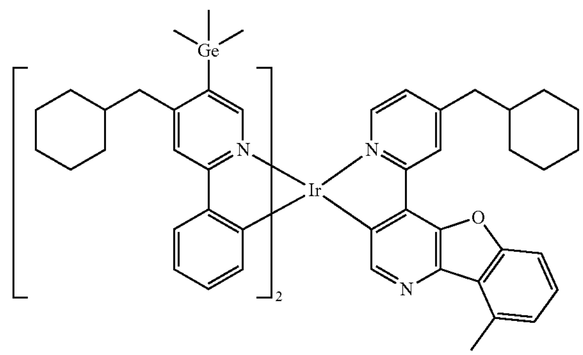
860
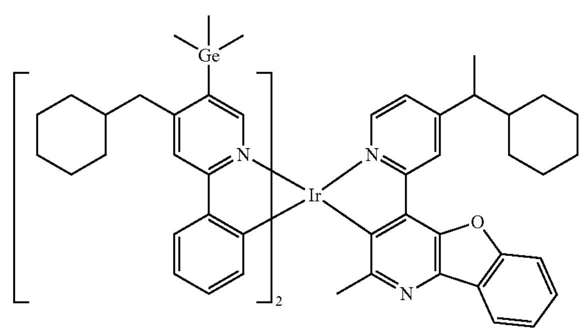
861
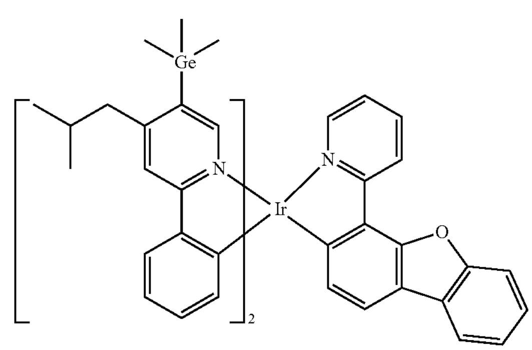

862
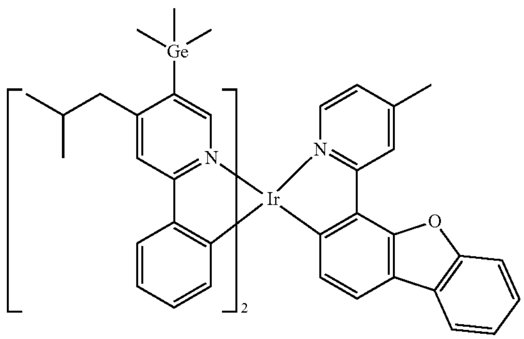
863
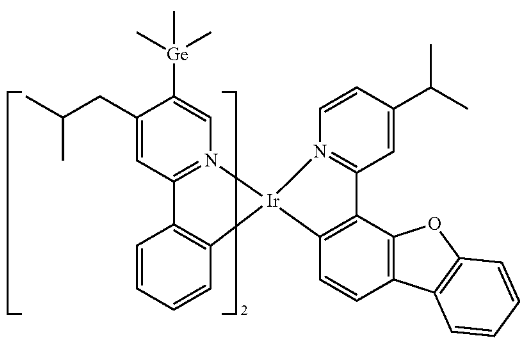
864
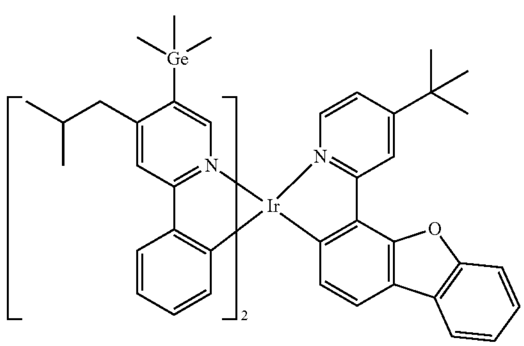
865
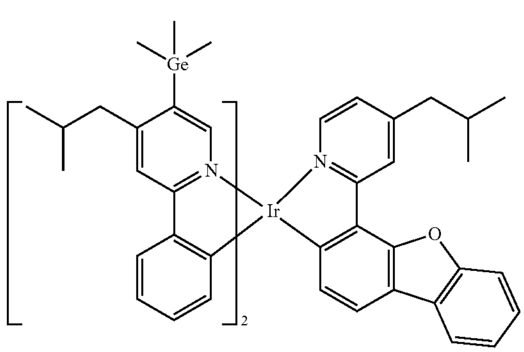
866
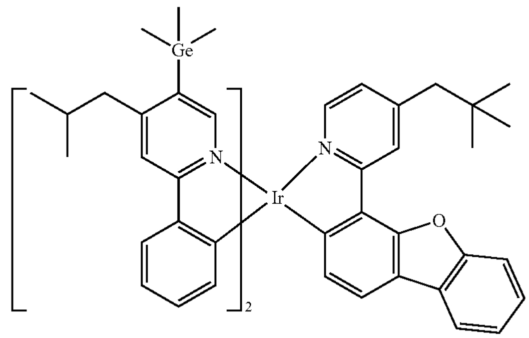
867
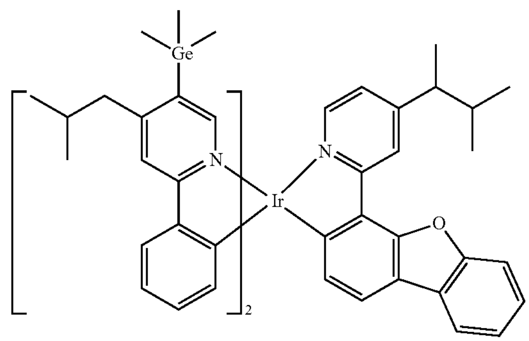
868
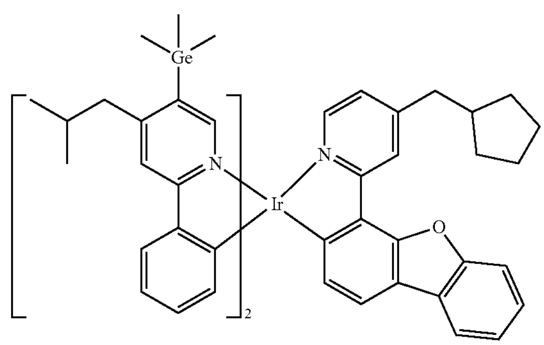
869
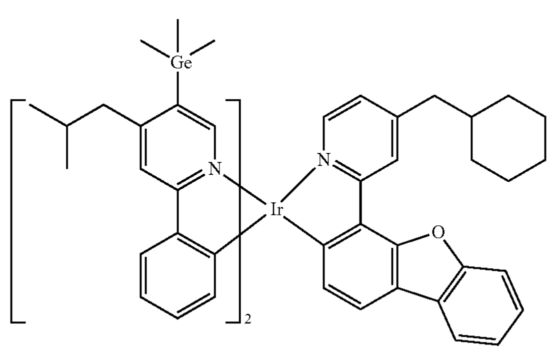

-continued
870
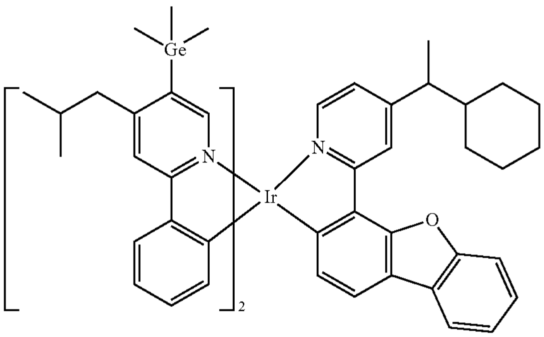
871
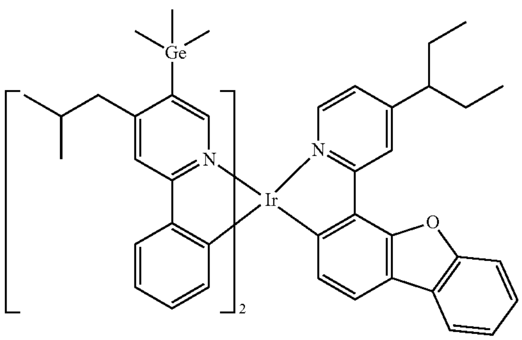
872
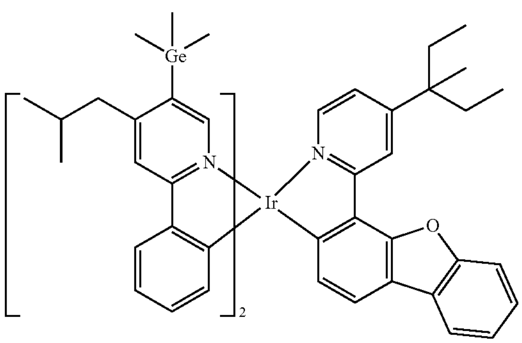
873
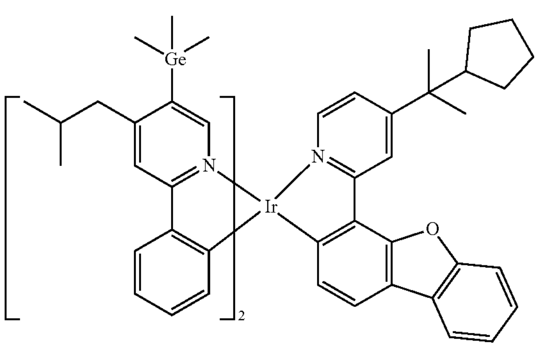
-continued
874
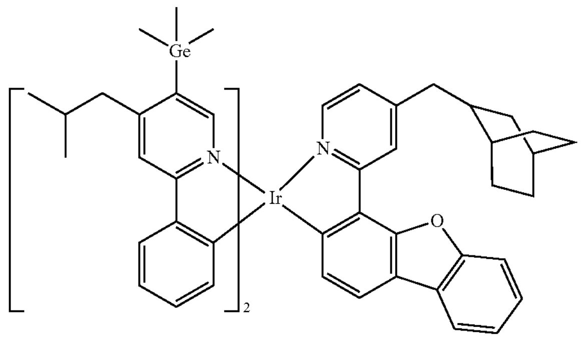
875
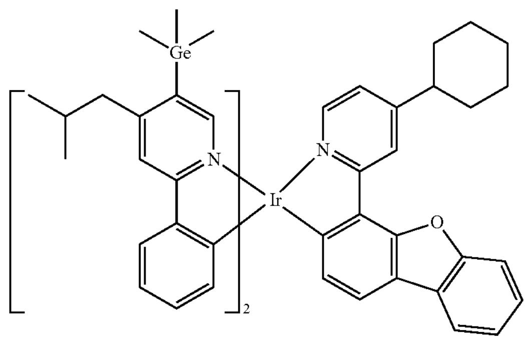
876
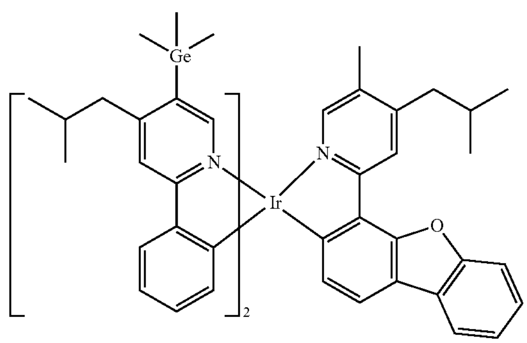
877
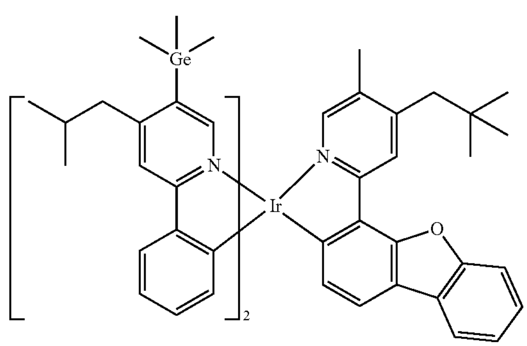

-continued
878
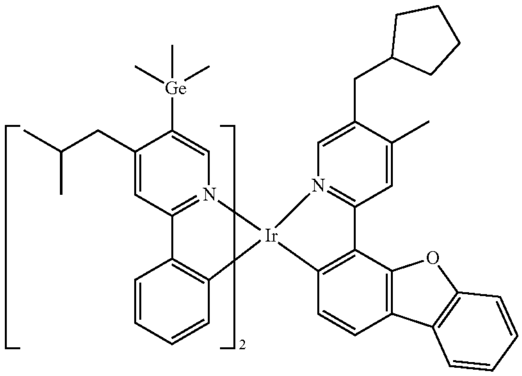
879
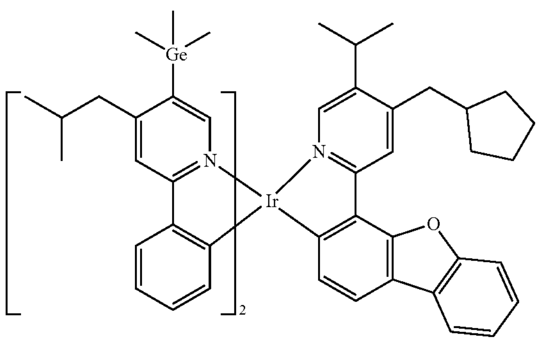
880
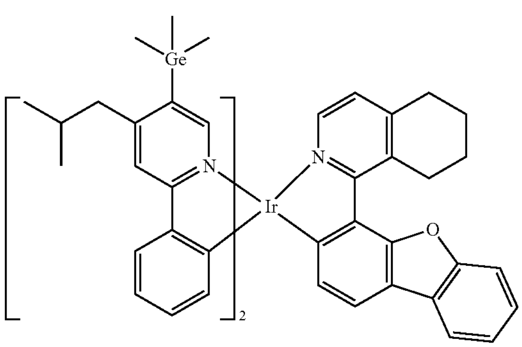
881
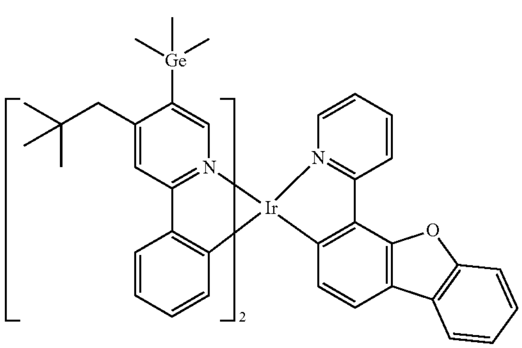
-continued
882
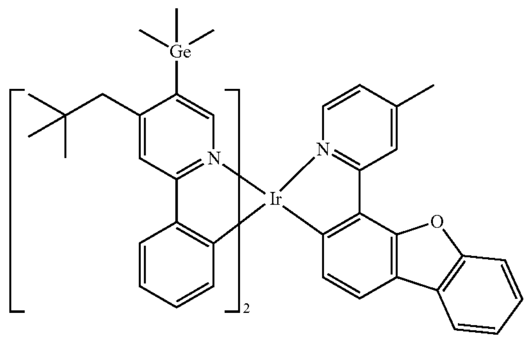
883
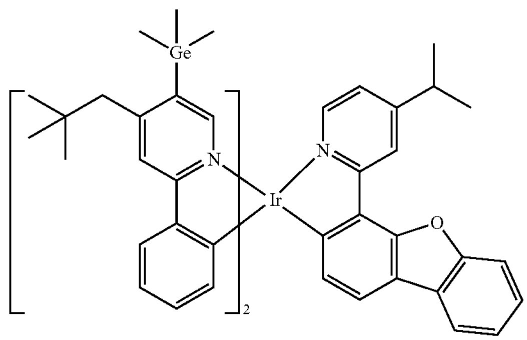
884
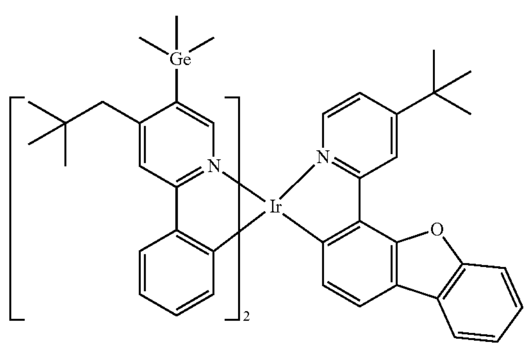
885
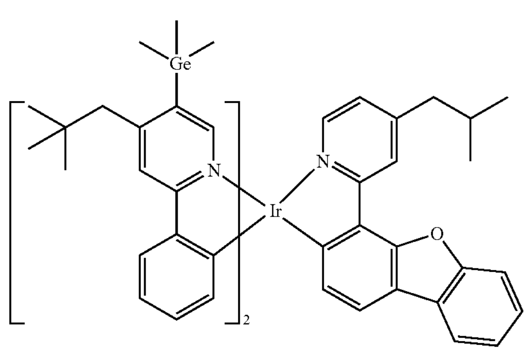

886
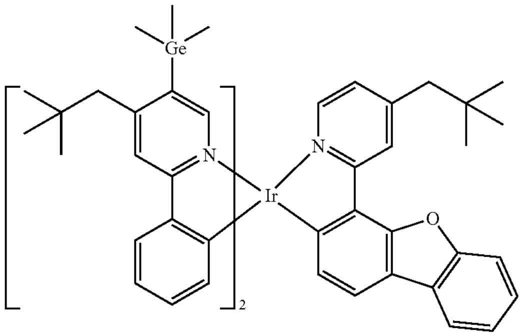
887
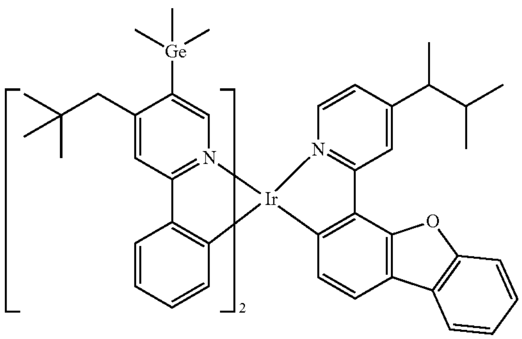
888
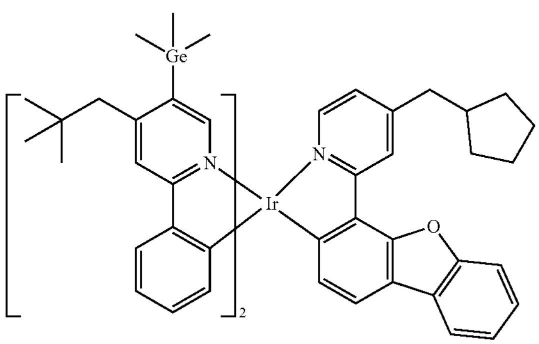
889
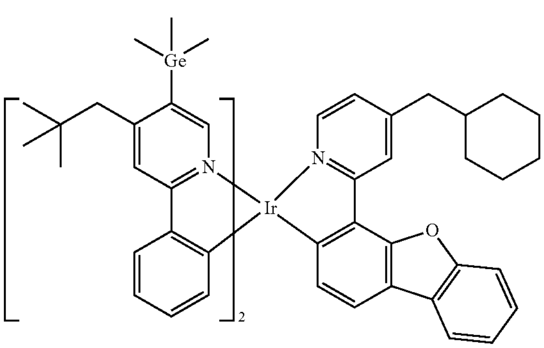
890
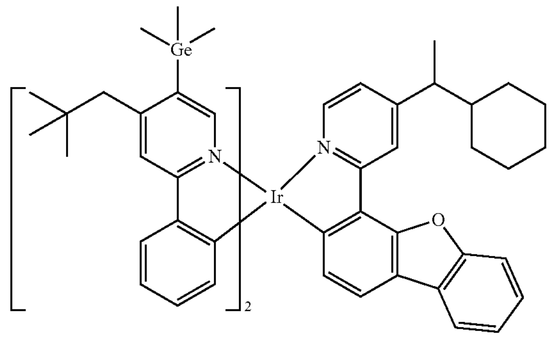
891
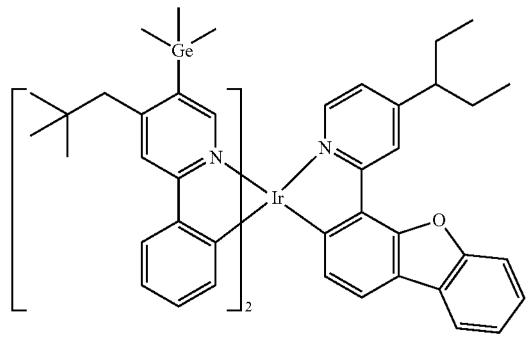
892
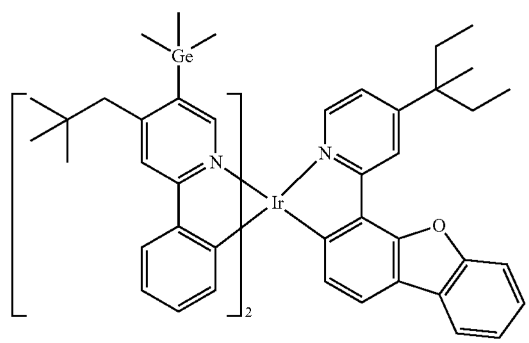
893
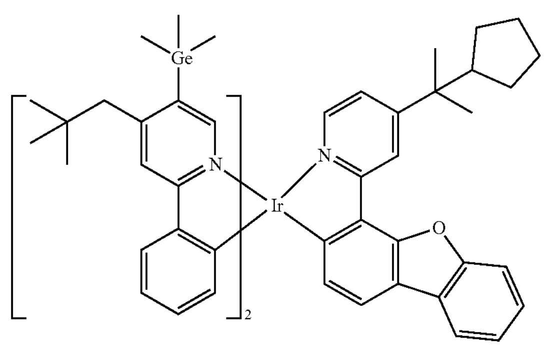

-continued
894
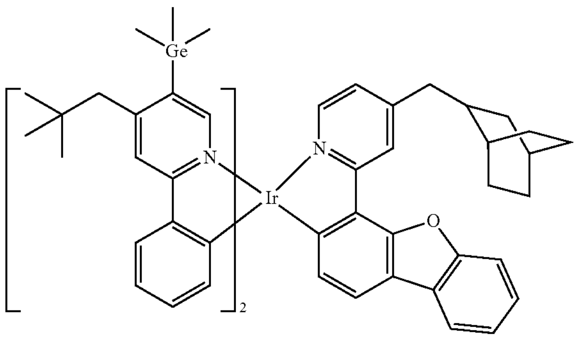
895
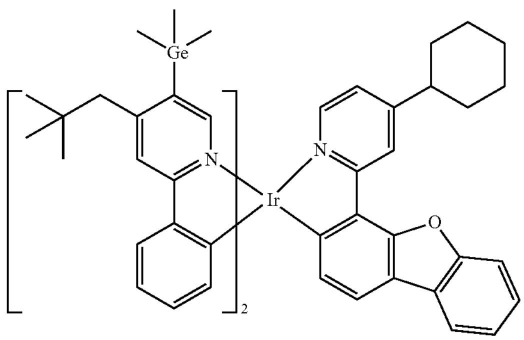
896
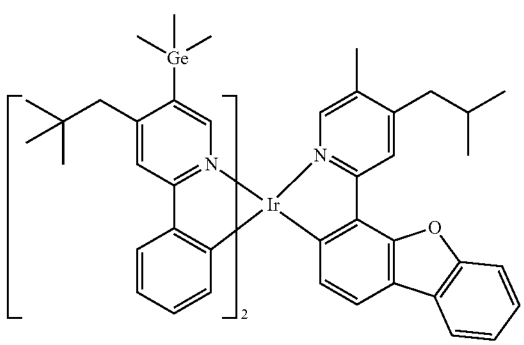
897
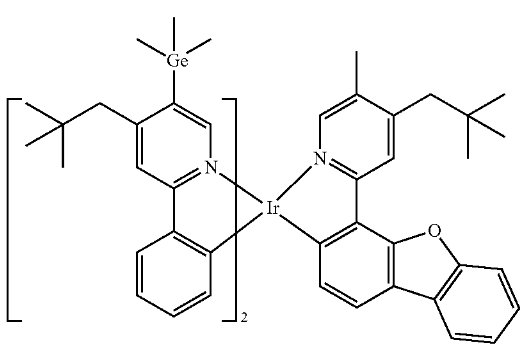
-continued
898
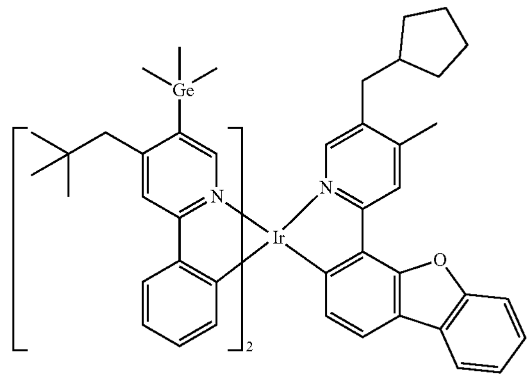
899
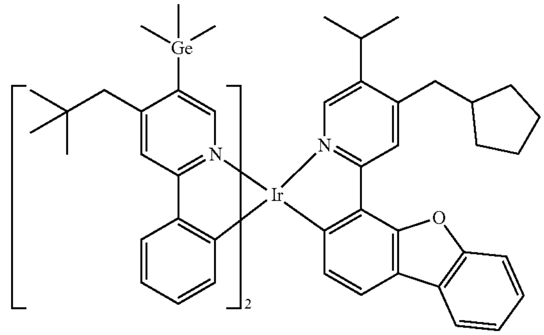
900
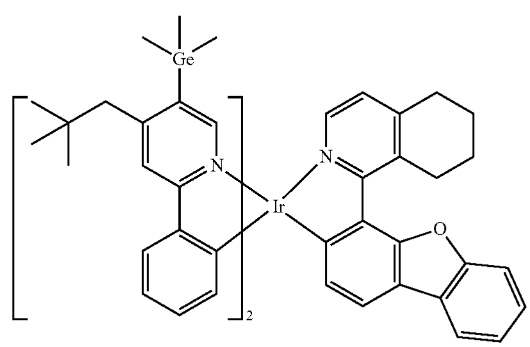
901
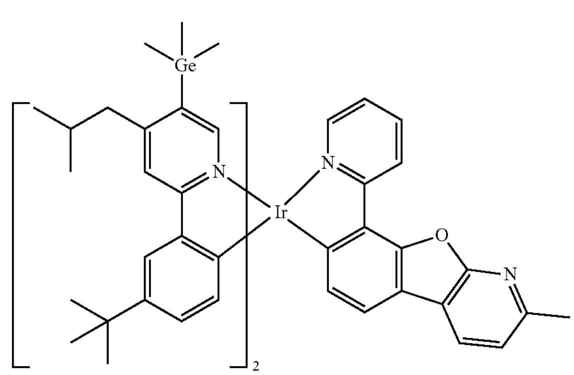

-continued
902
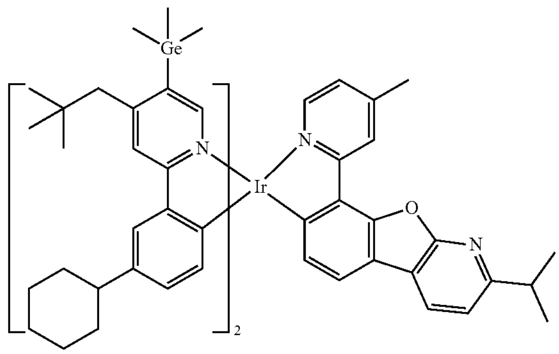
903
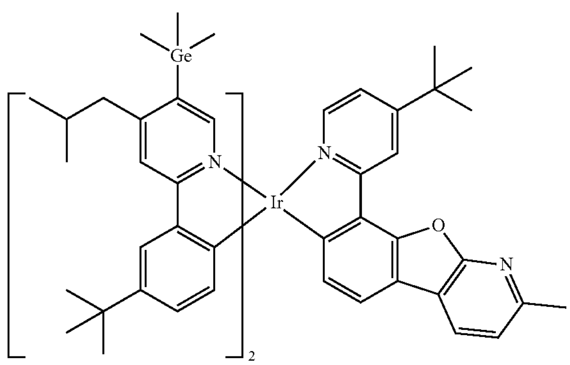
904
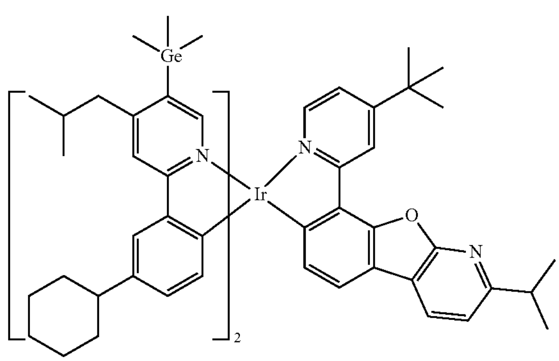
905
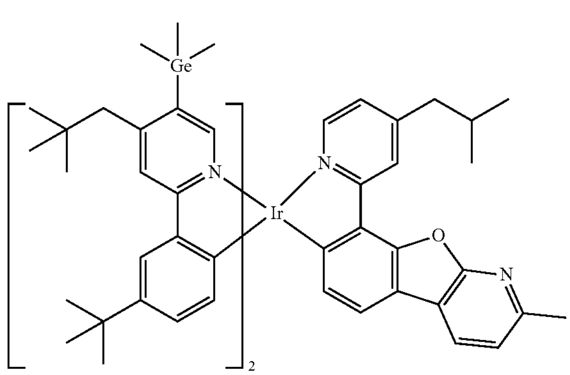
-continued
906
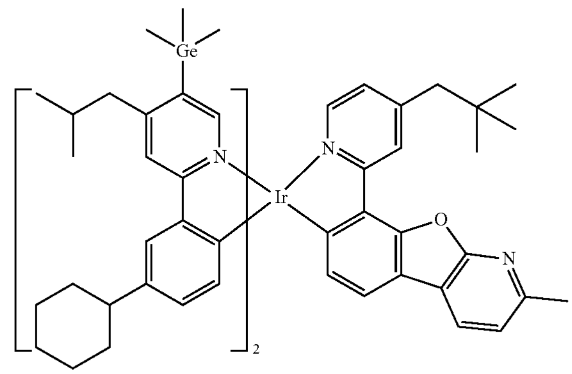
907
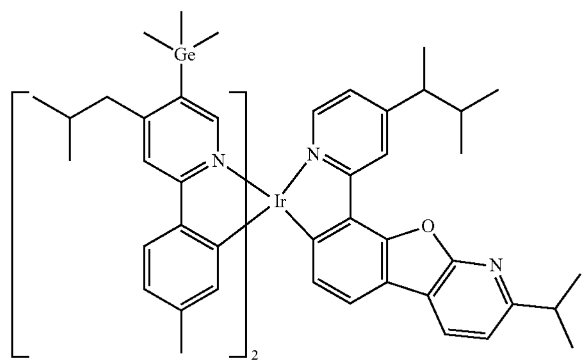
908
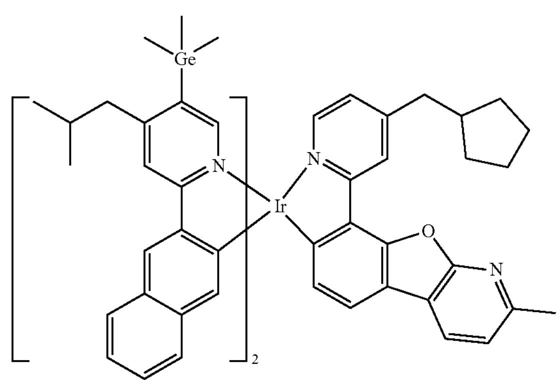
909
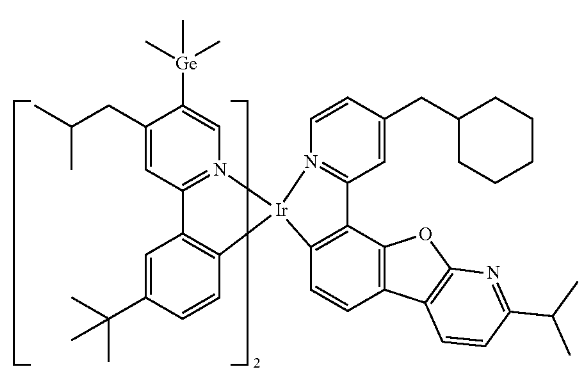

-continued
910
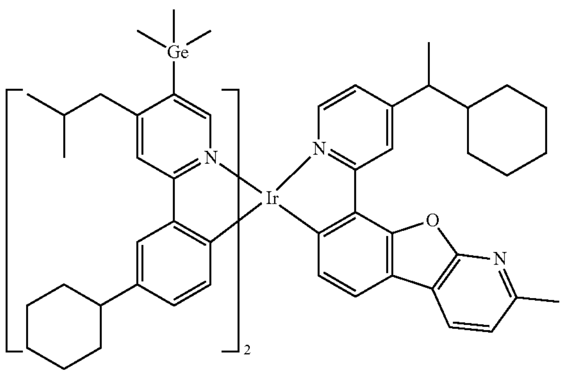
911
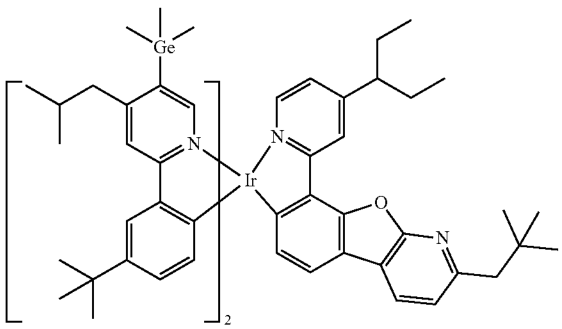
912
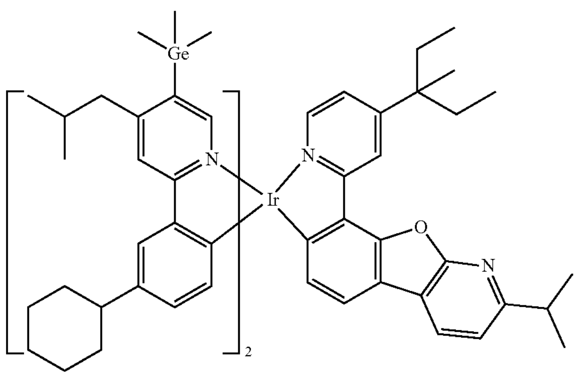
913
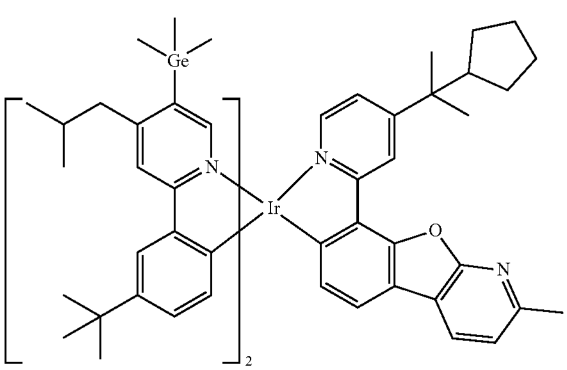
-continued
914
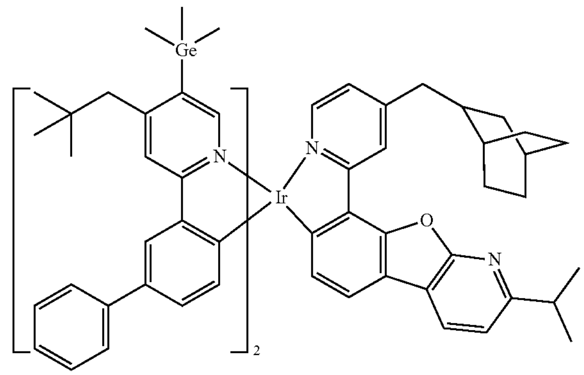
915
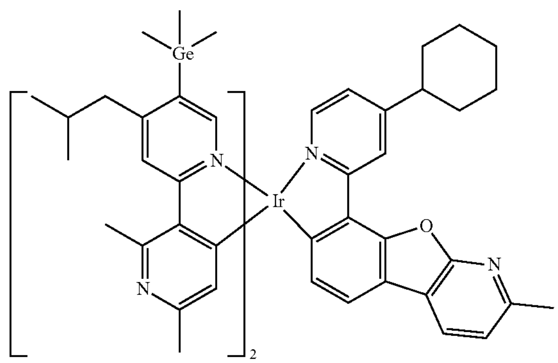
916
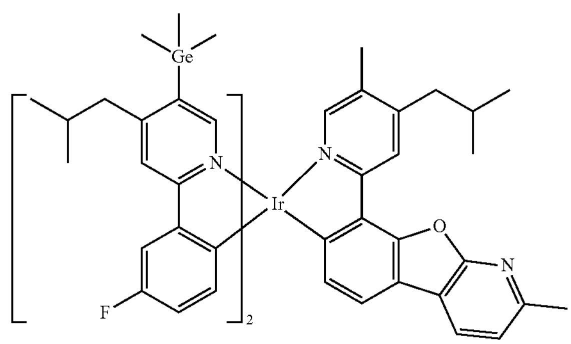
917
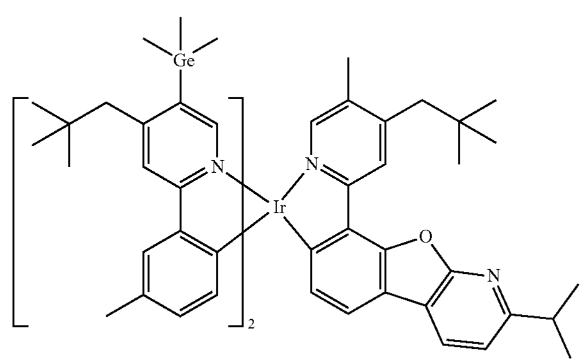

-continued
918
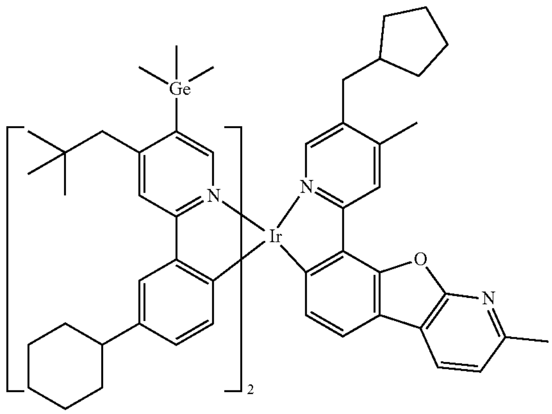
919
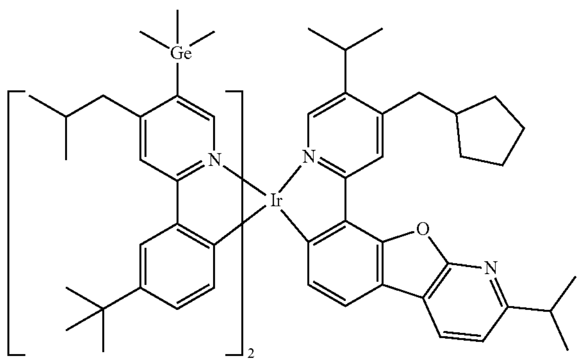
920
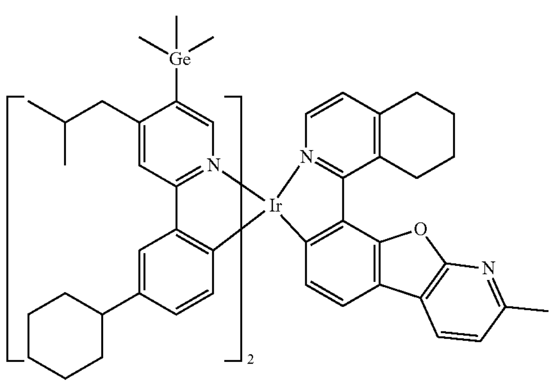
921
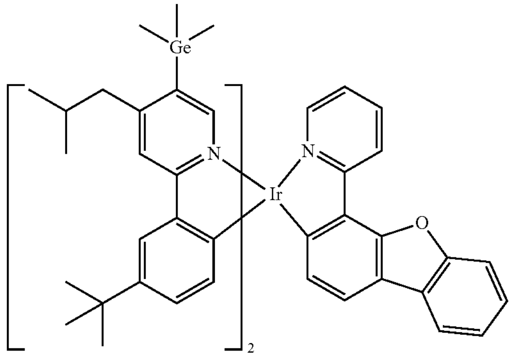
-continued
922
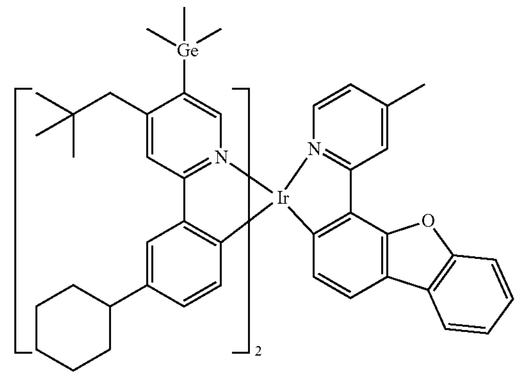
923
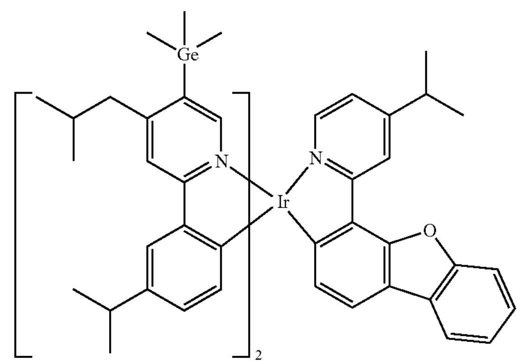
924
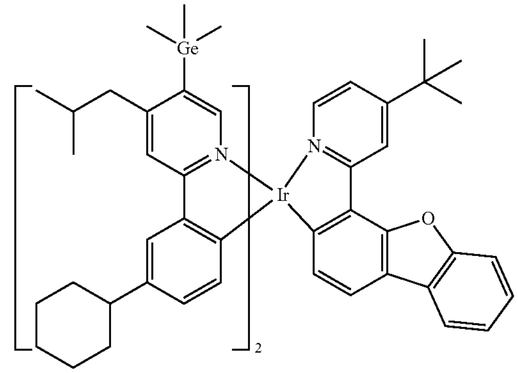
925
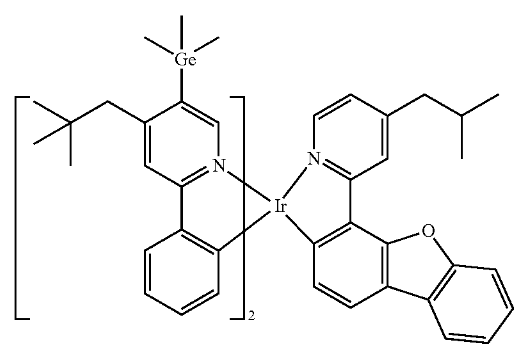

-continued
926
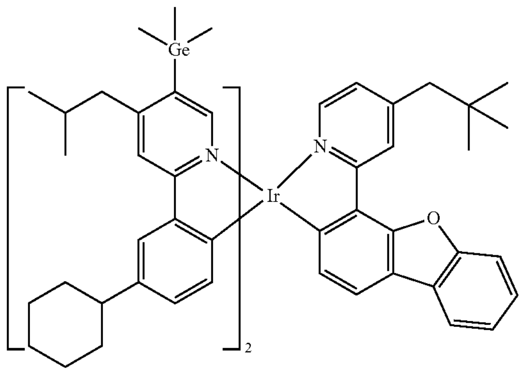
927
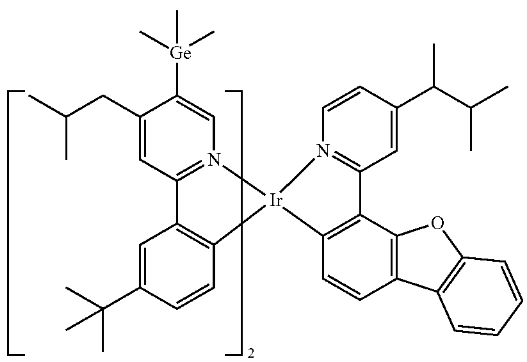
928
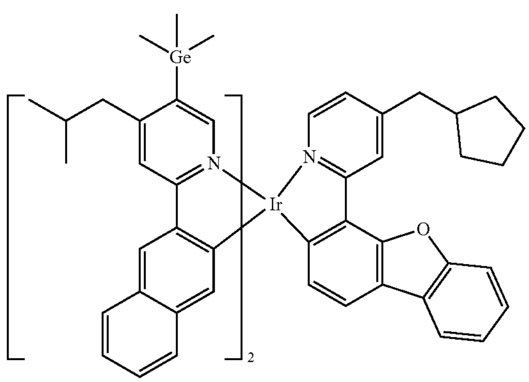
929
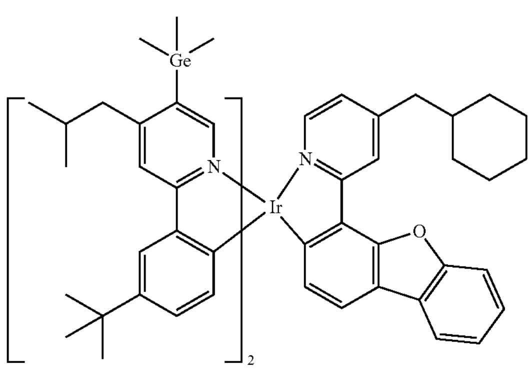
-continued
930
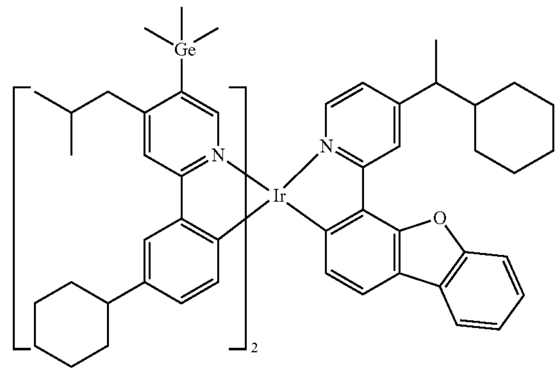
931
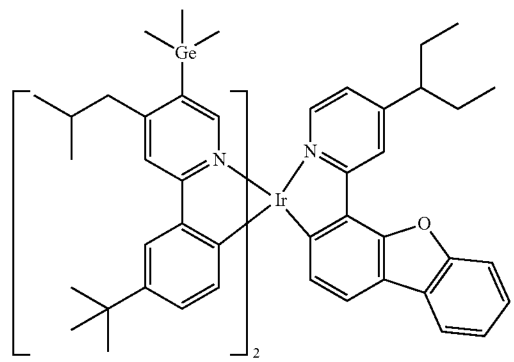
932
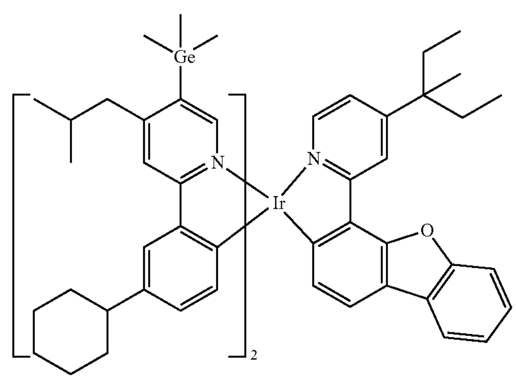
933
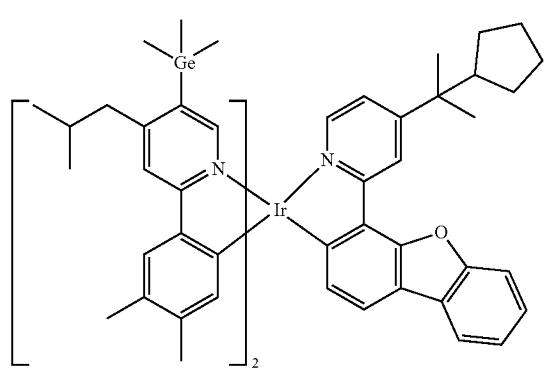

-continued
934
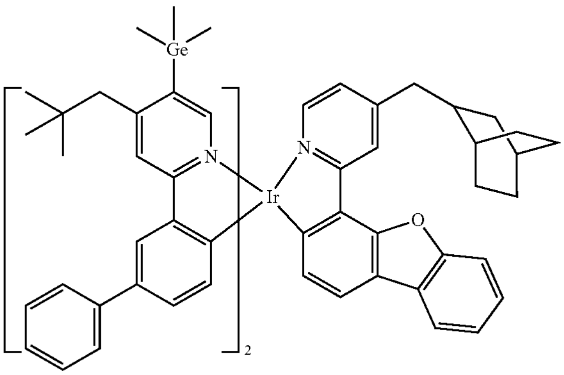
935
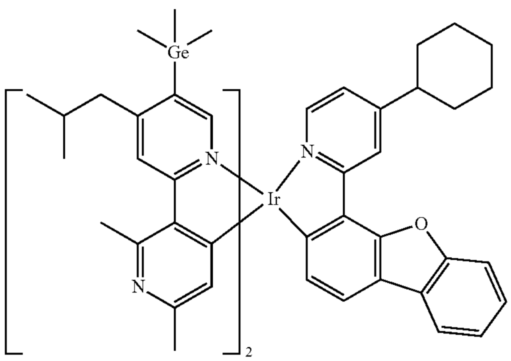
936
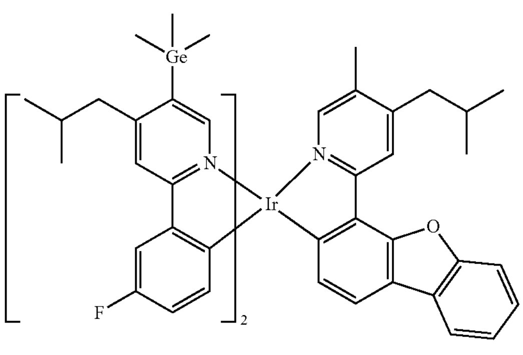
937
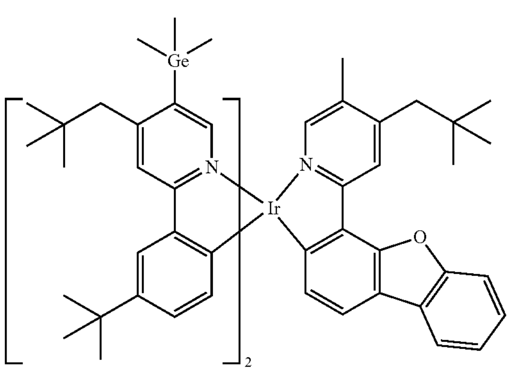
-continued
938
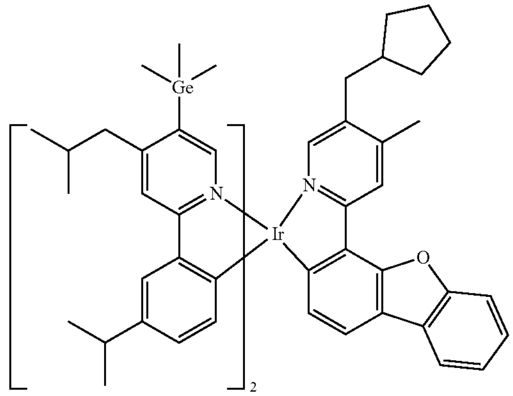
939
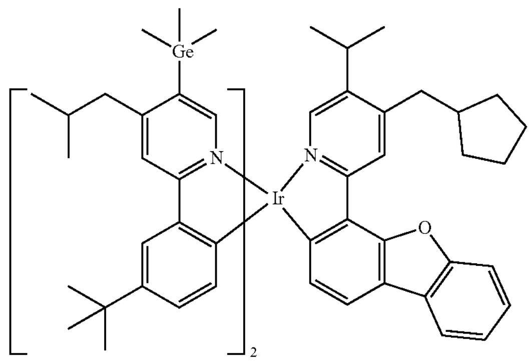
940
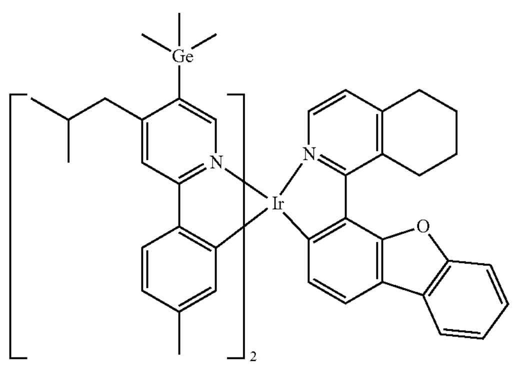
941
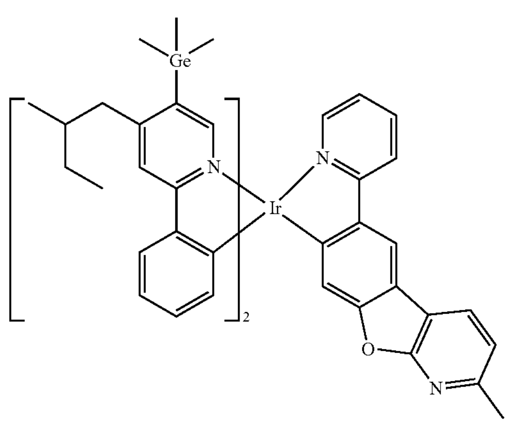

-continued
942
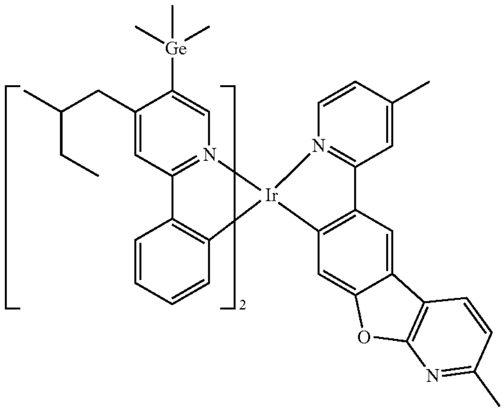
943
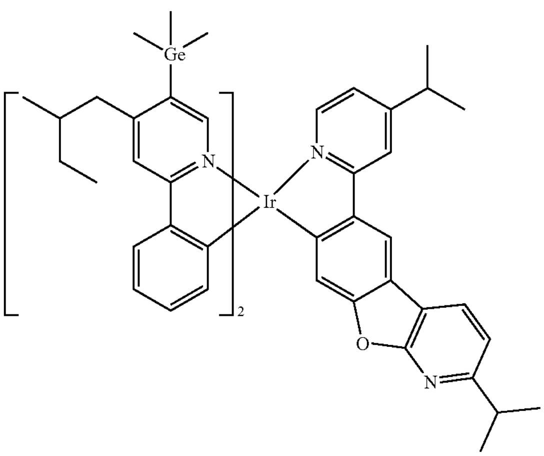
944
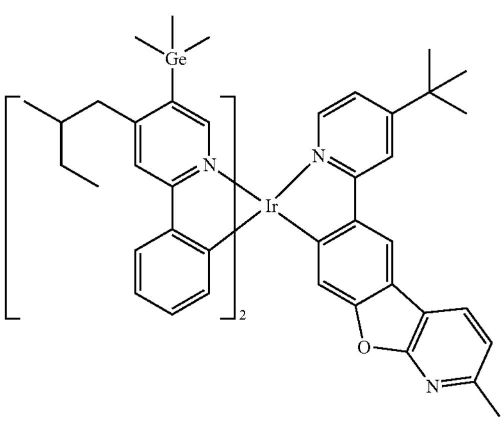
-continued
945
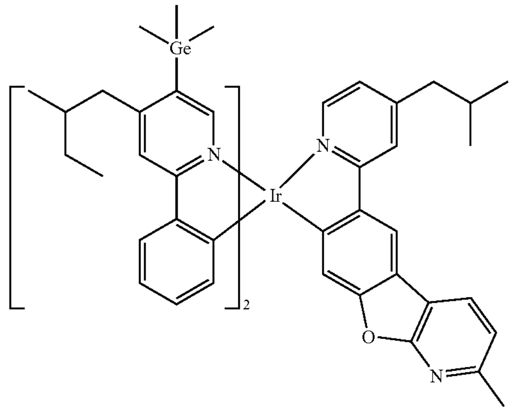
946
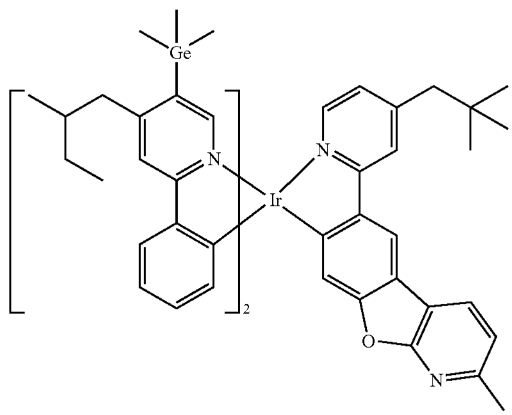
947
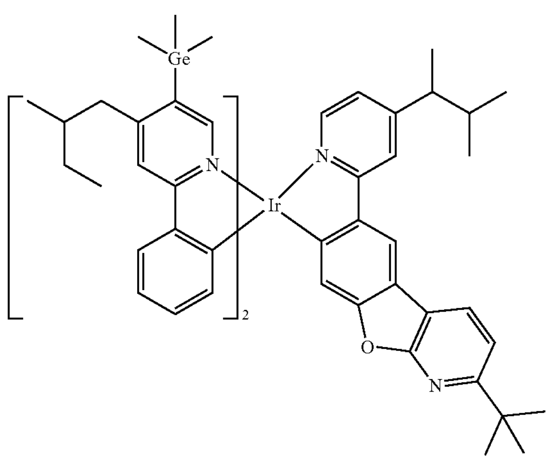

-continued
948
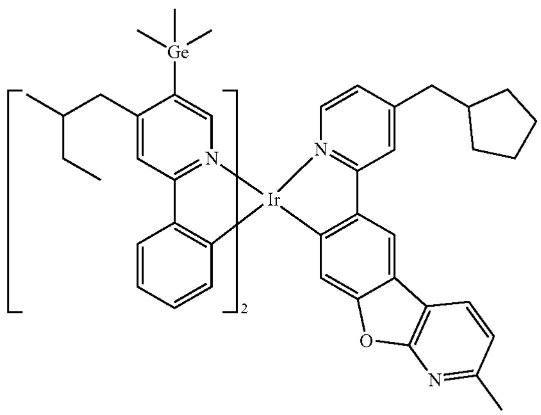
949
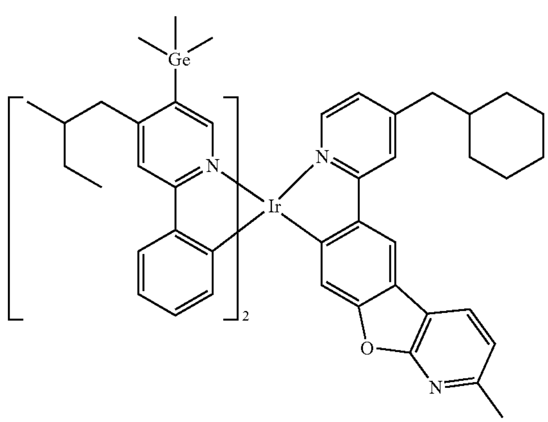
950
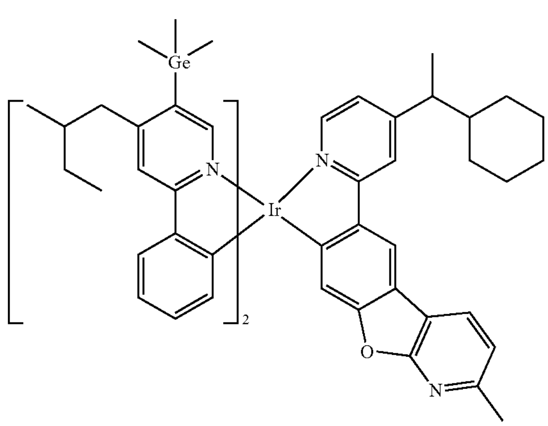
-continued
951
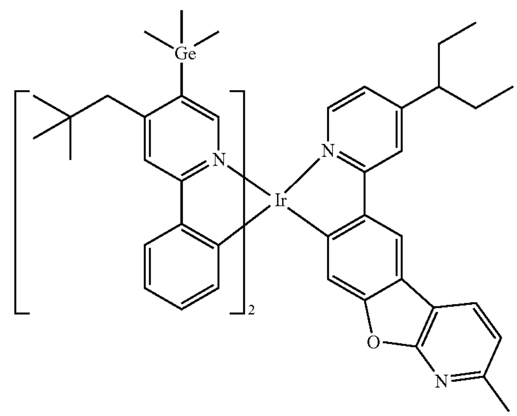
952
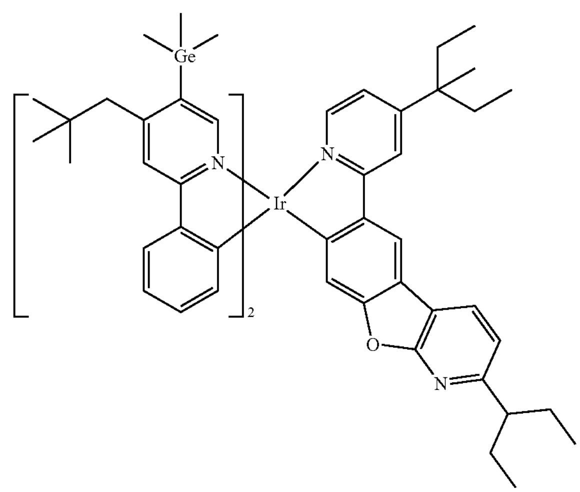
953
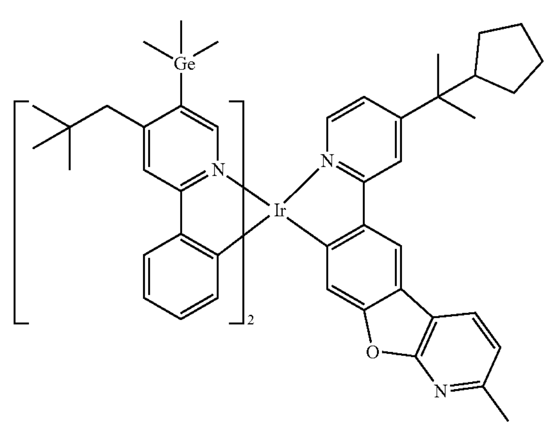

-continued
954
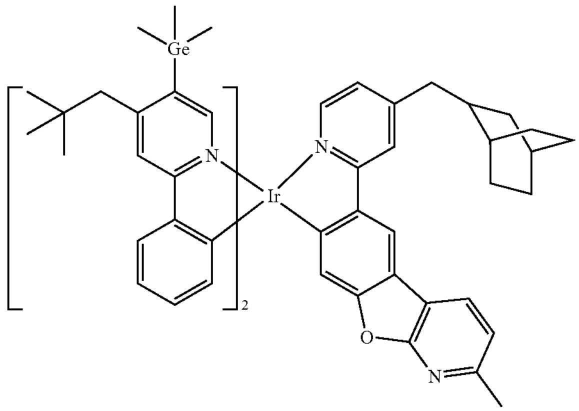
955
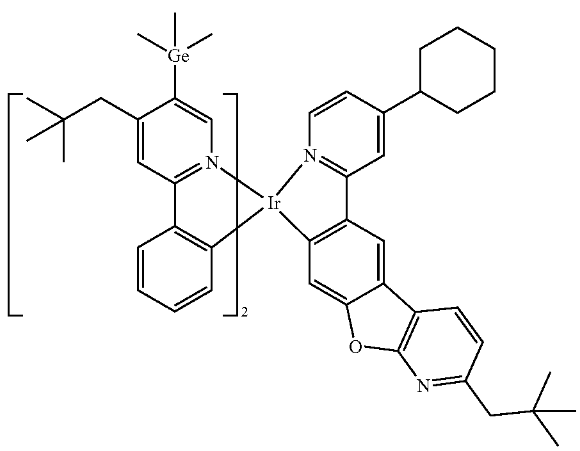
956
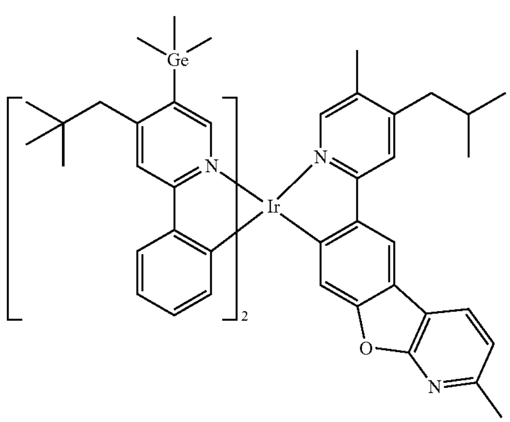
-continued
957
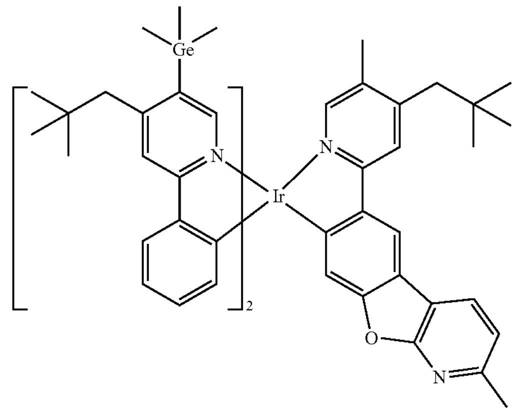
958
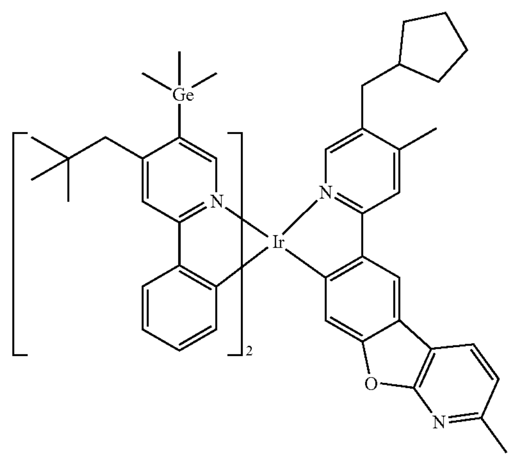
959
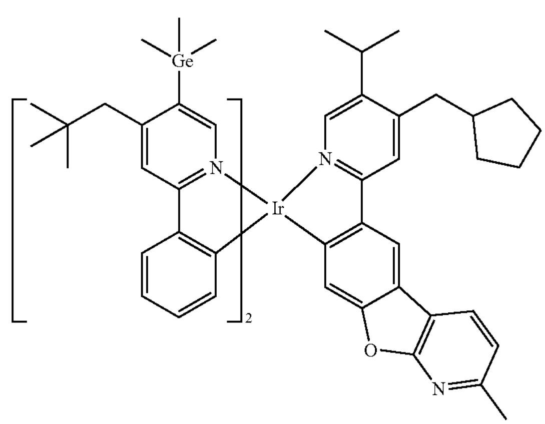

960
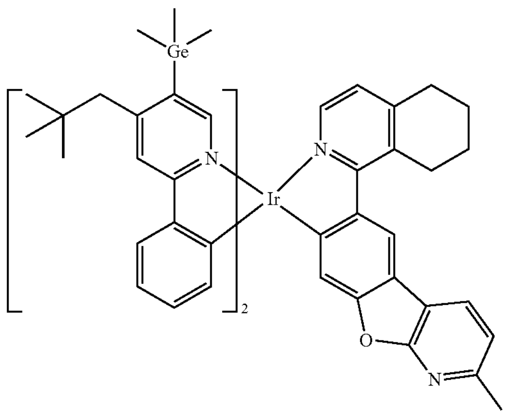
961
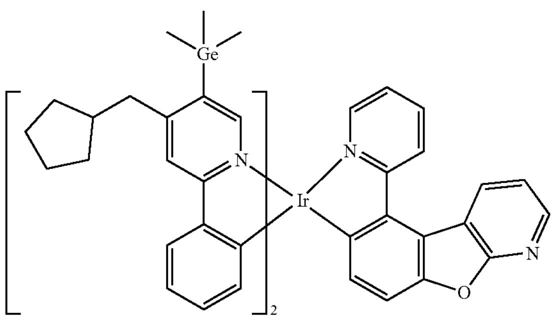
962
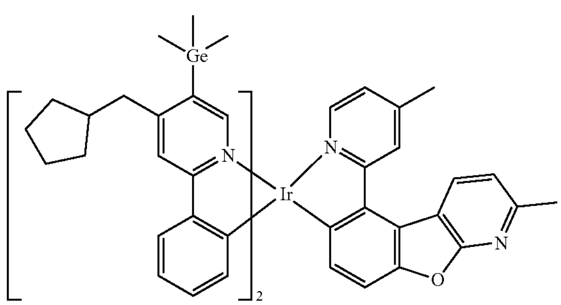
963
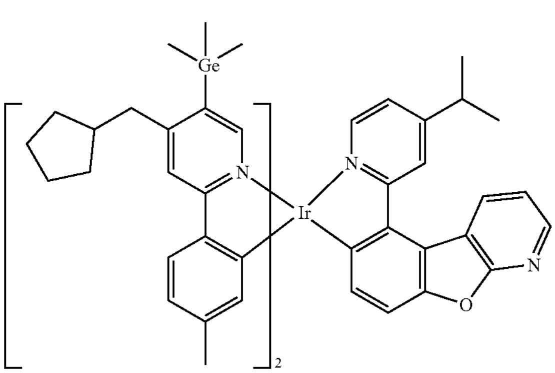
964
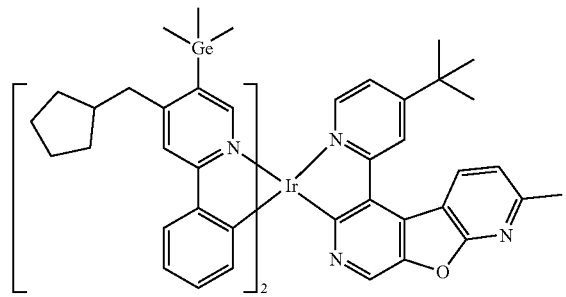
965
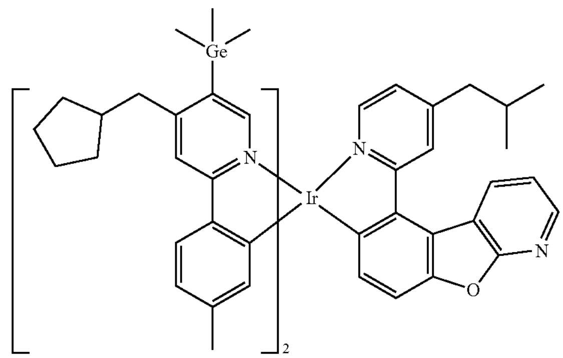
966
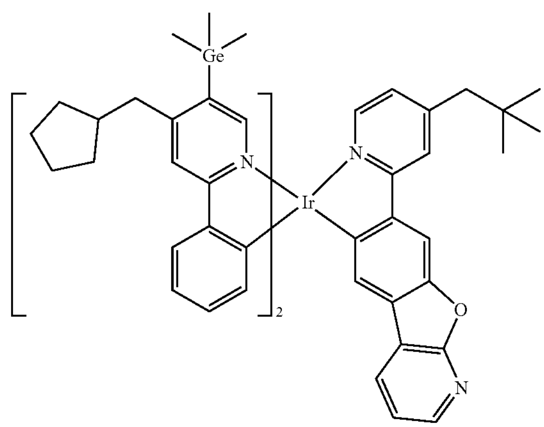
967
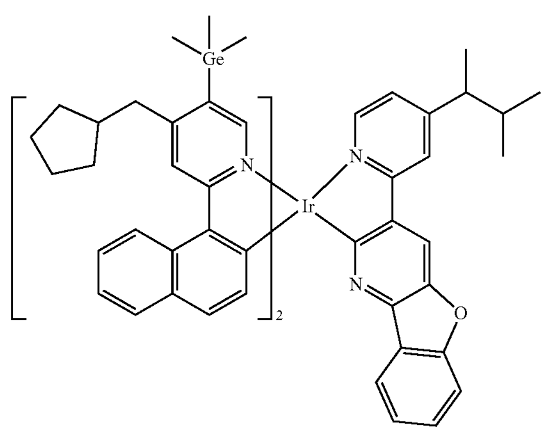

-continued
968
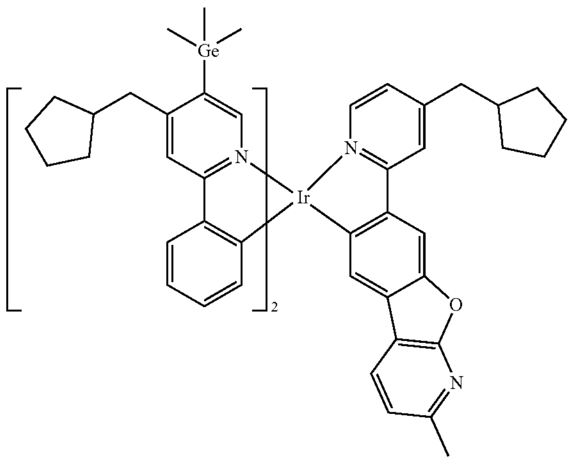
969
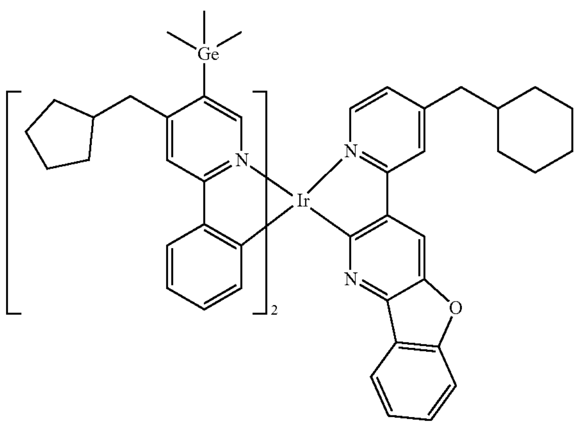
970
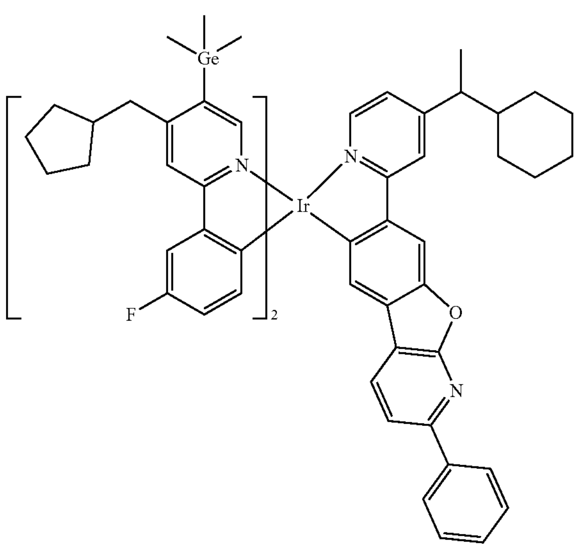
-continued
971
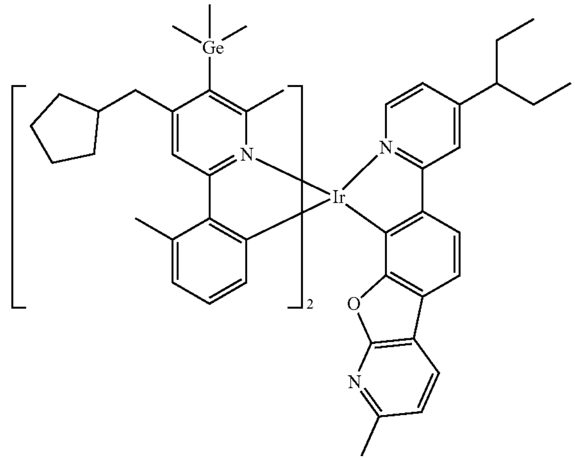
972
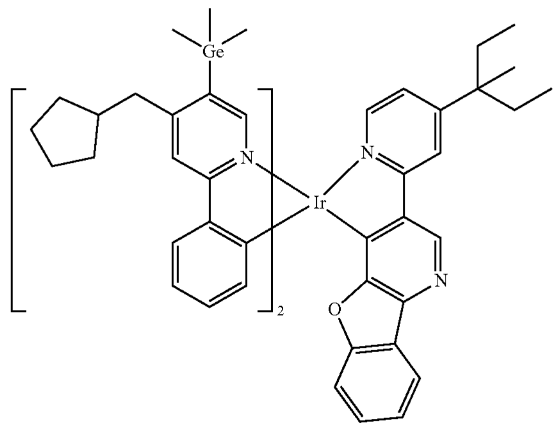
973
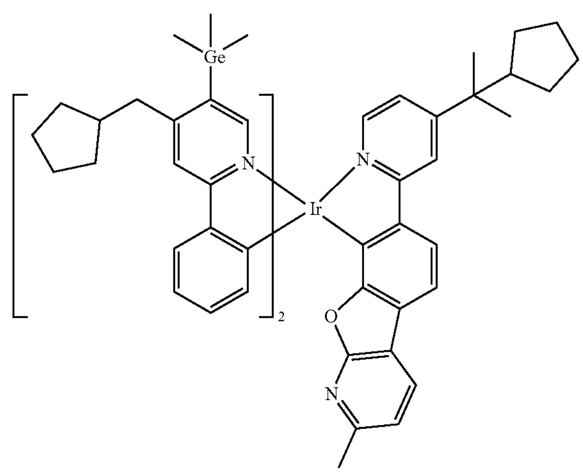

974
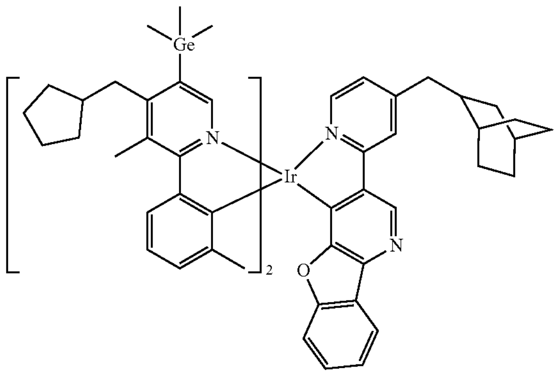
975
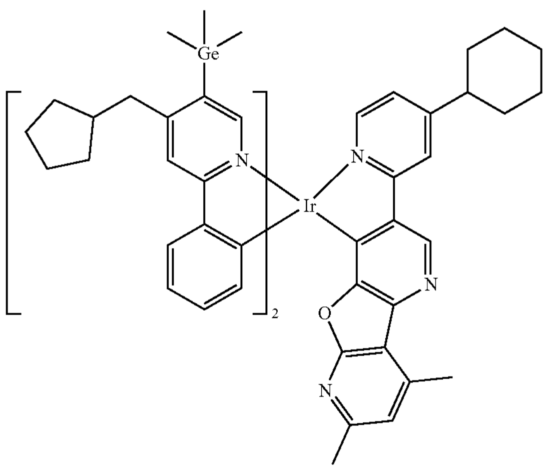
976
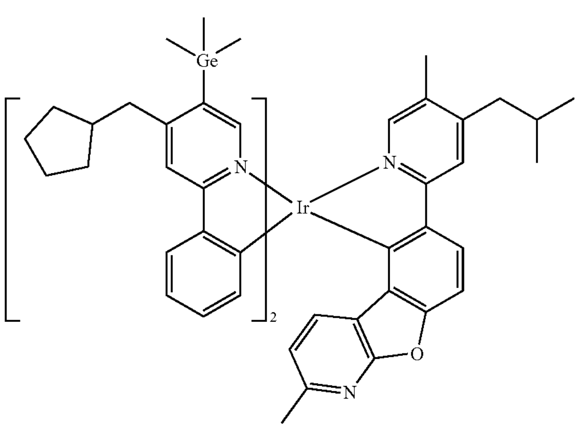
977
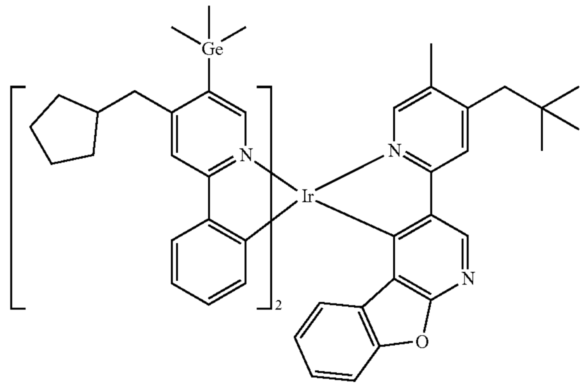
978
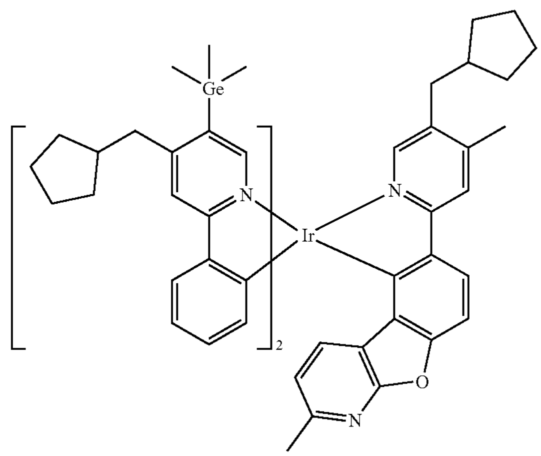
979
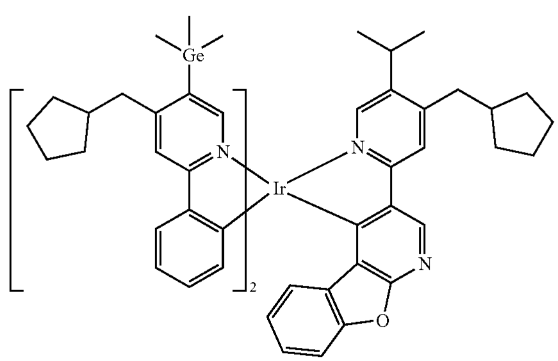

980
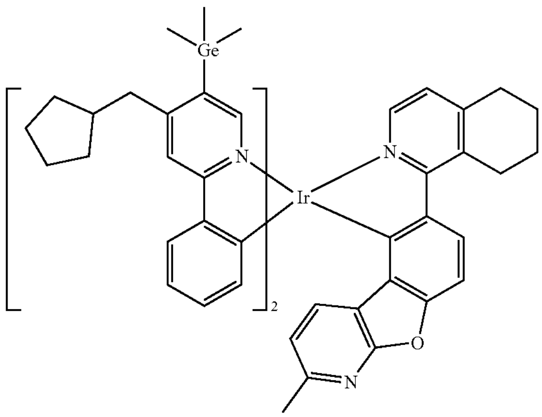
981
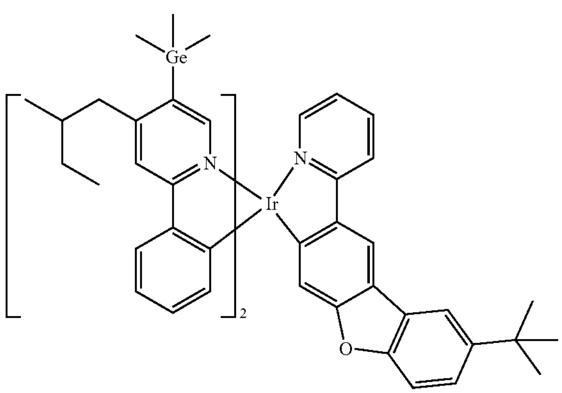
982
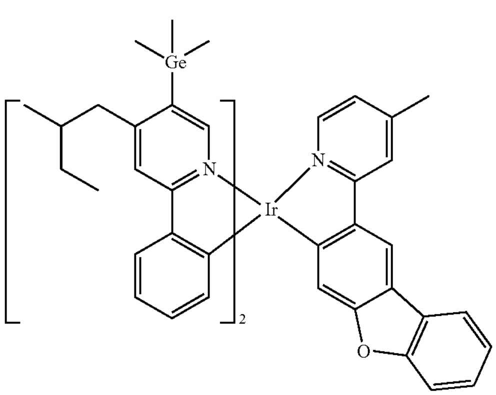
983
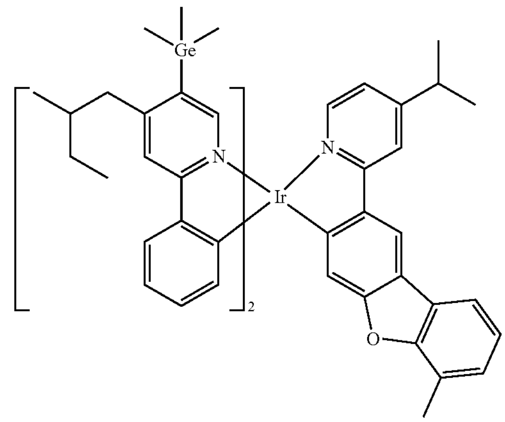
984
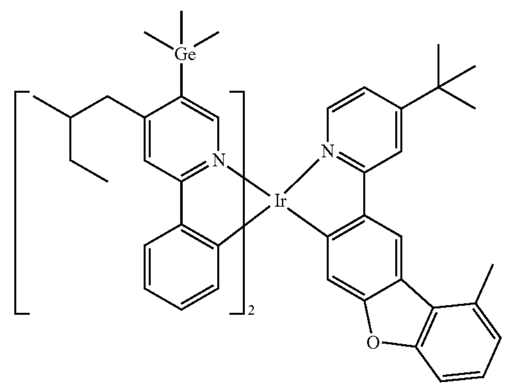
985
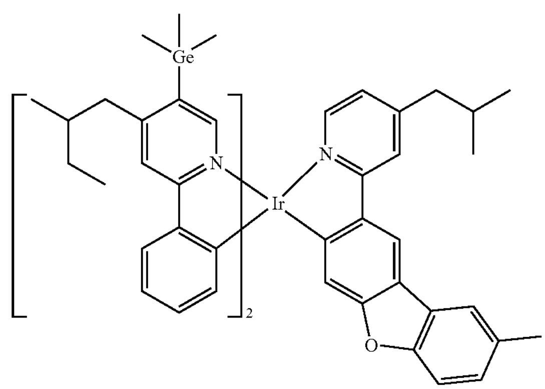
986
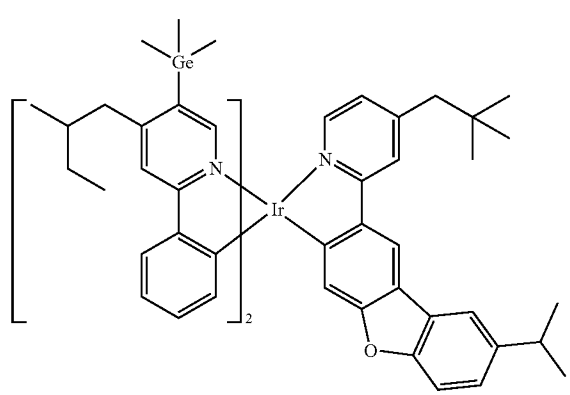

-continued
987
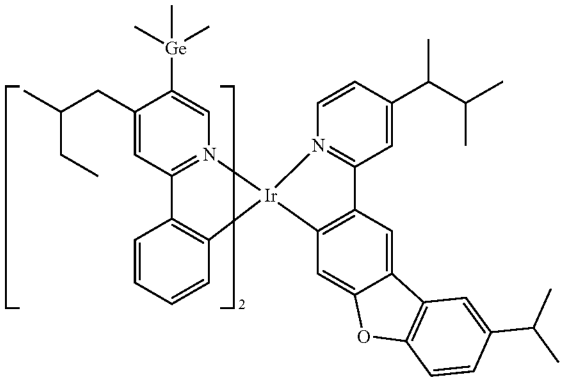
988
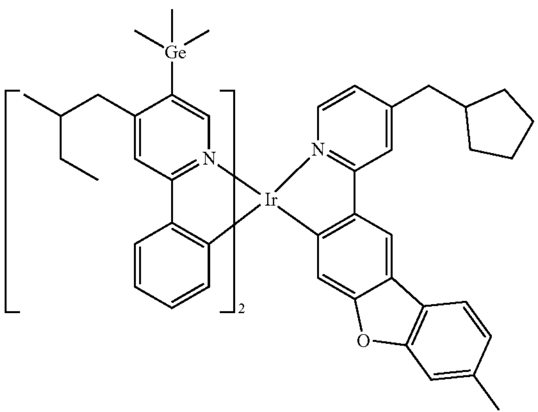
989
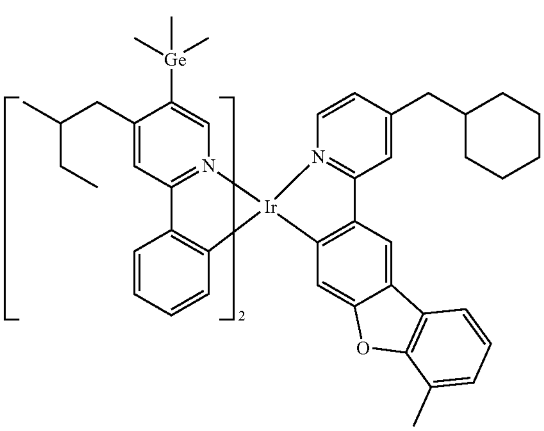
-continued
990
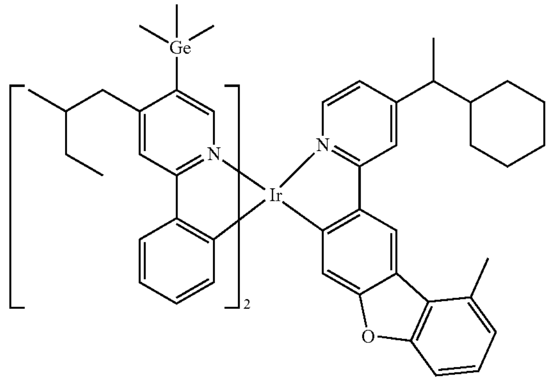
991
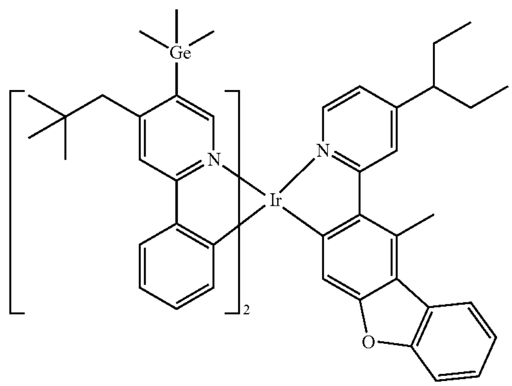
992
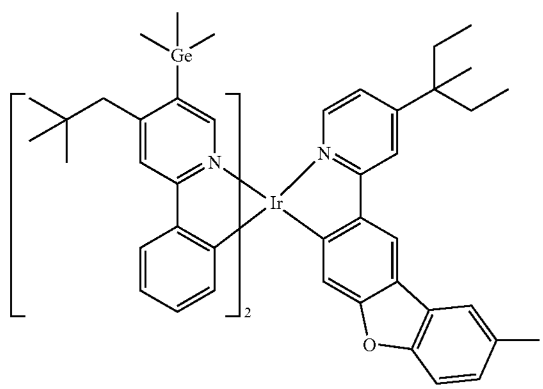
993
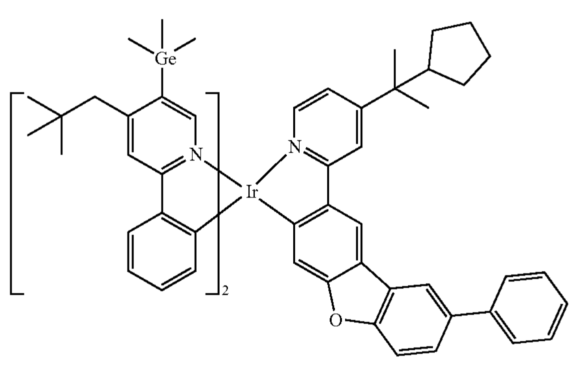

-continued
994
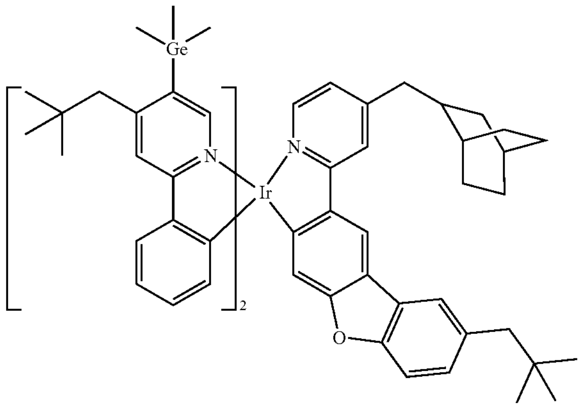
995
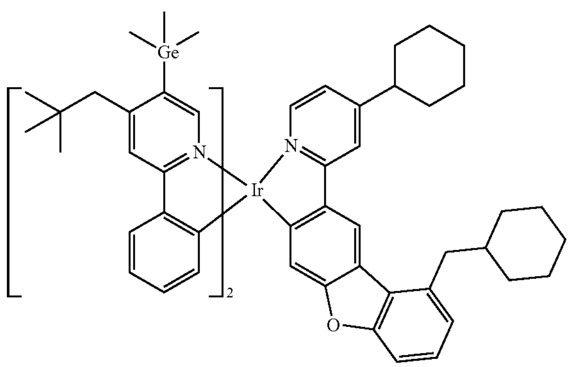
996
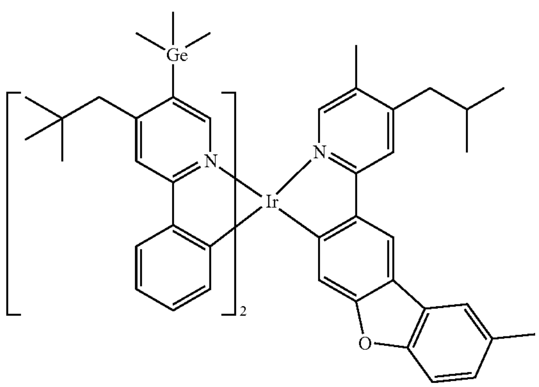
997
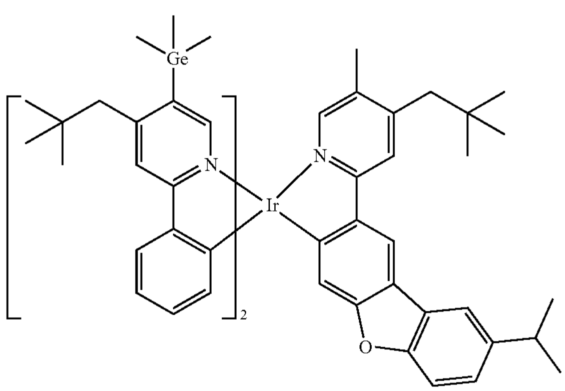
-continued
998
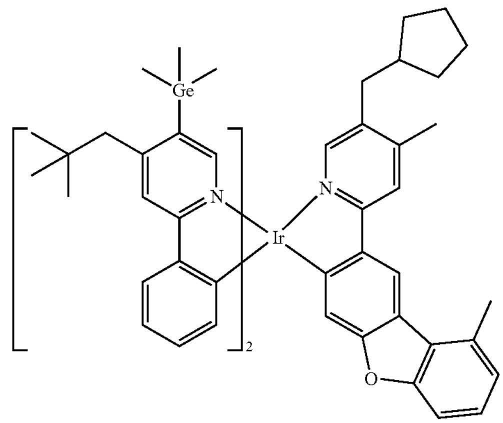
999
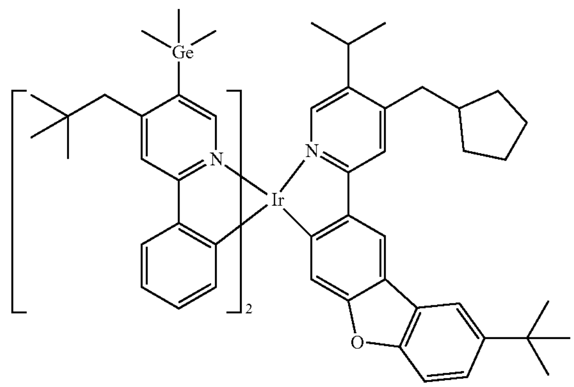
1000
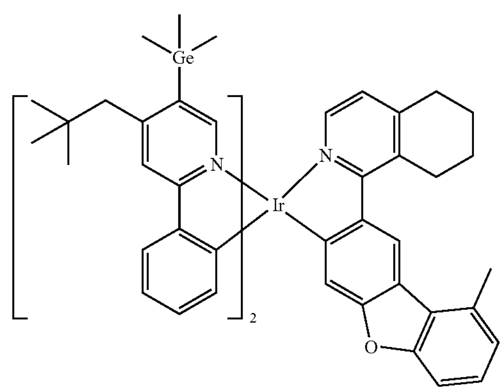
1001
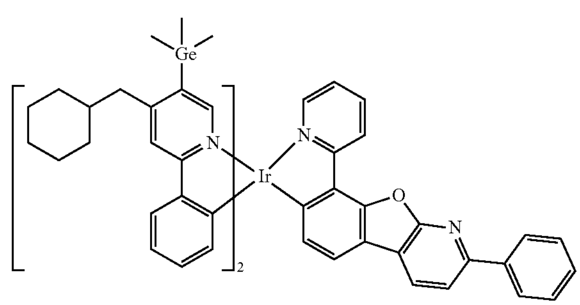

-continued
1002
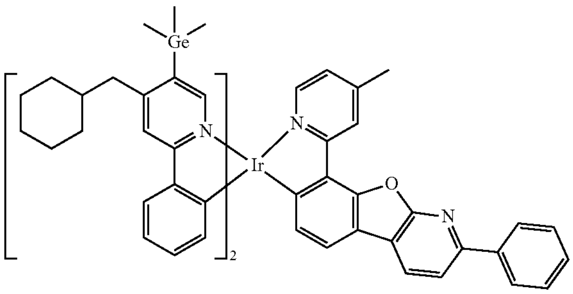
1003
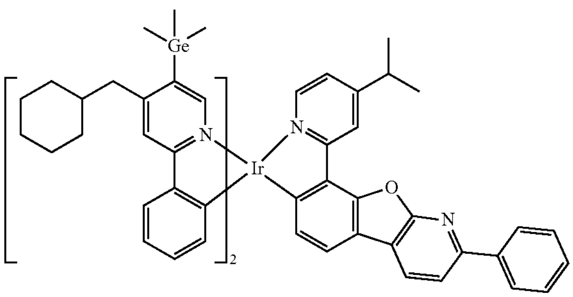
1004
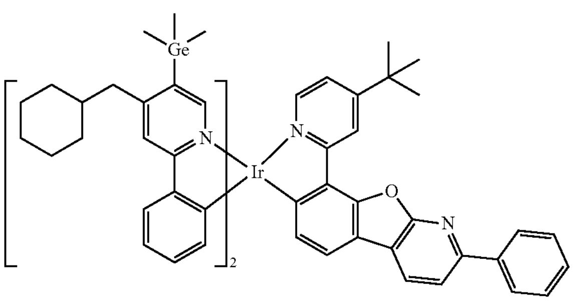
1005
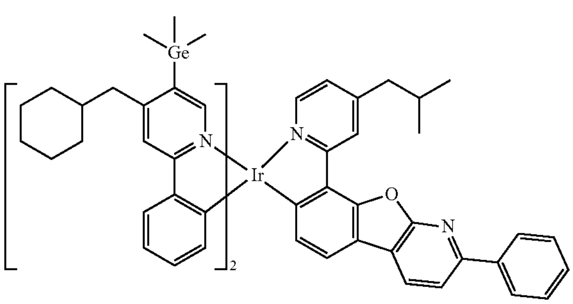
1006
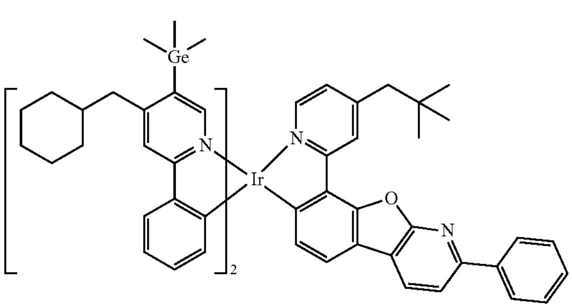
-continued
1007
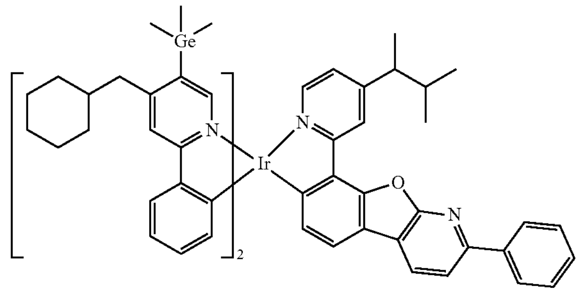
1008
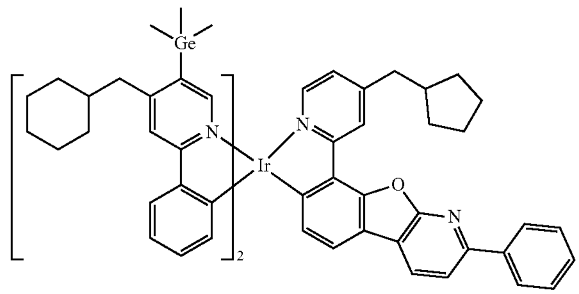
1009
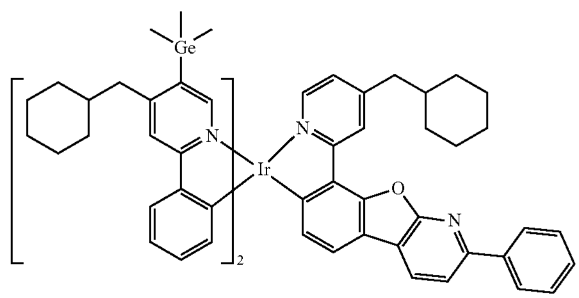
1010
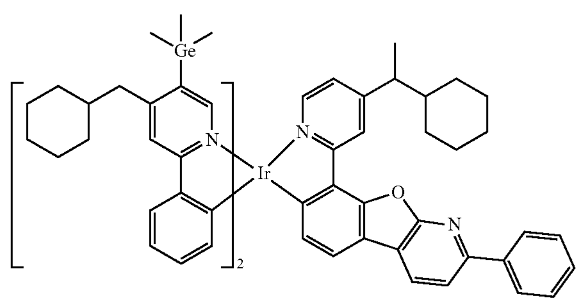
1011
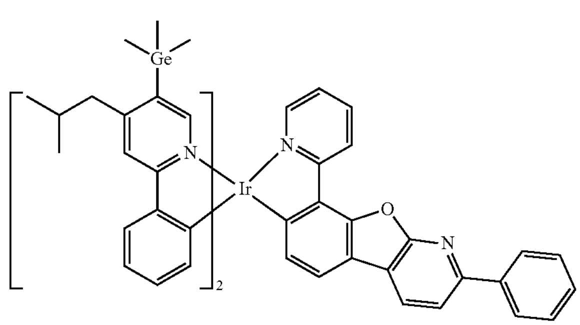

1012
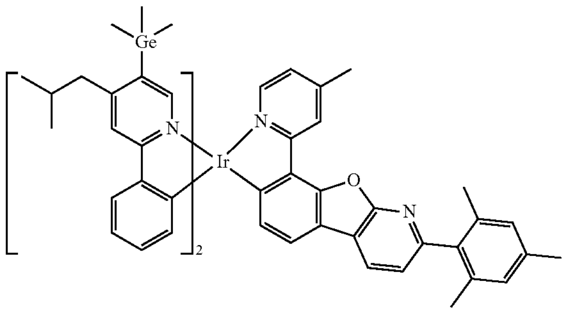
1013
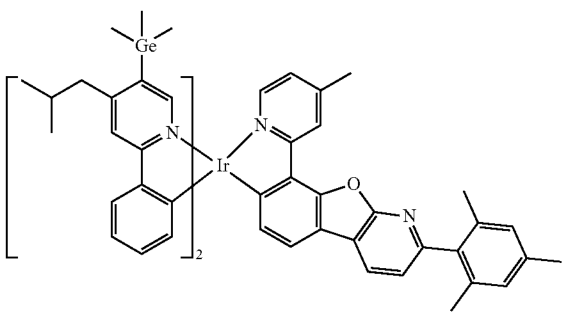
1014
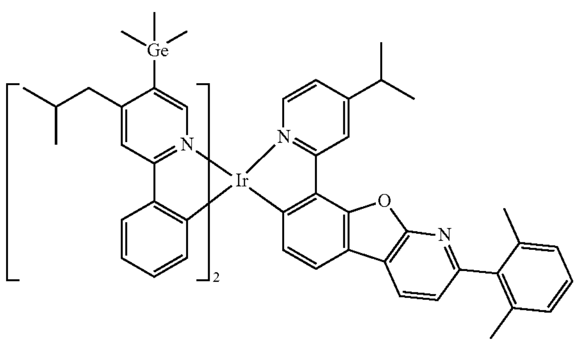
1015
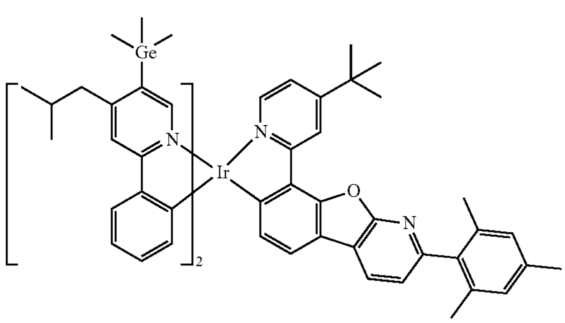
1016
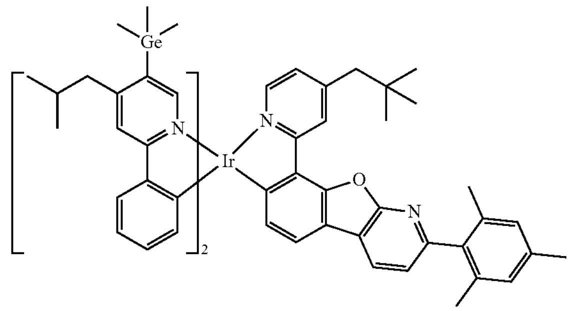
1017
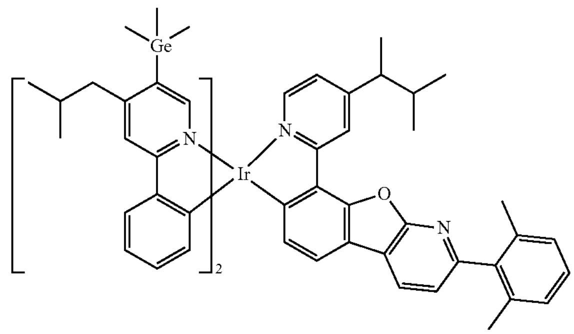
1018
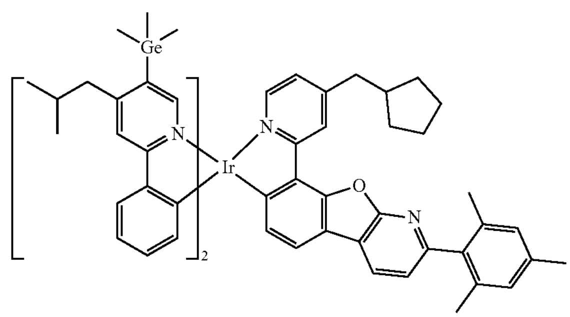
1019
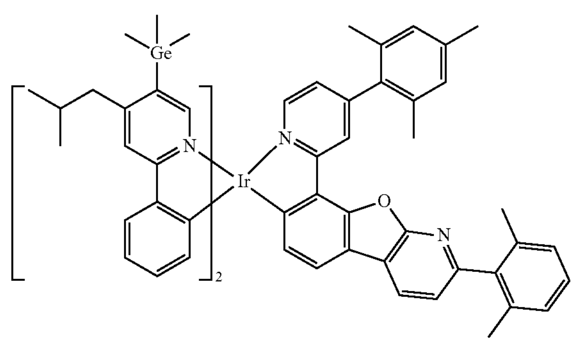

-continued
1020
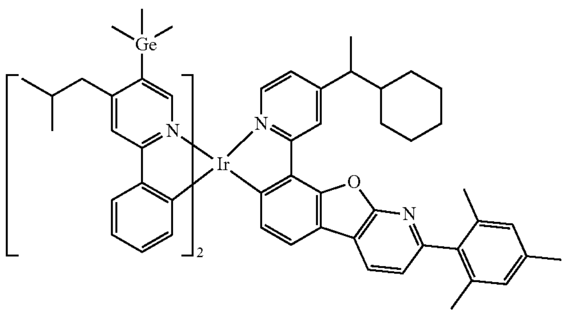
1021
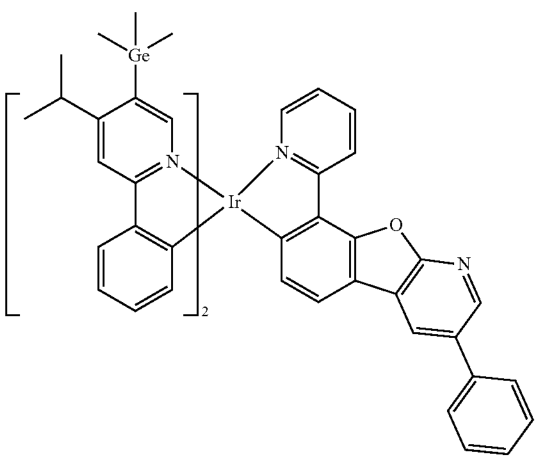
1022
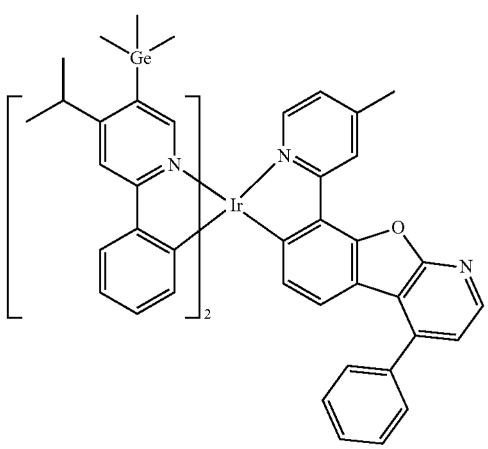
-continued
1023
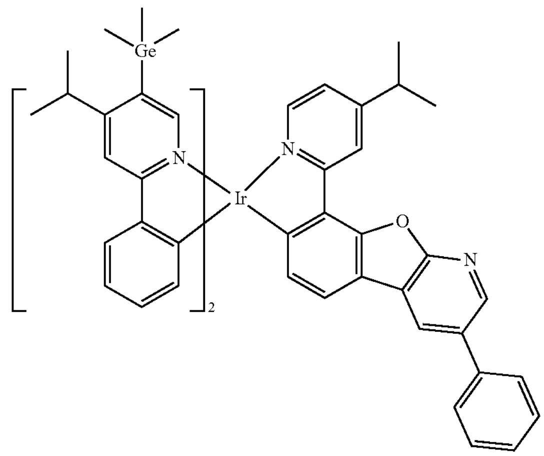
1024
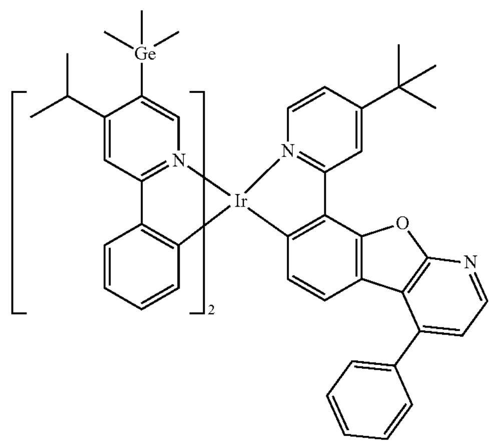
1025
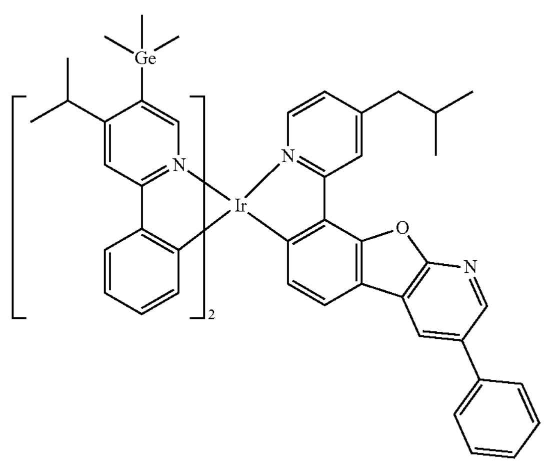

-continued
1026
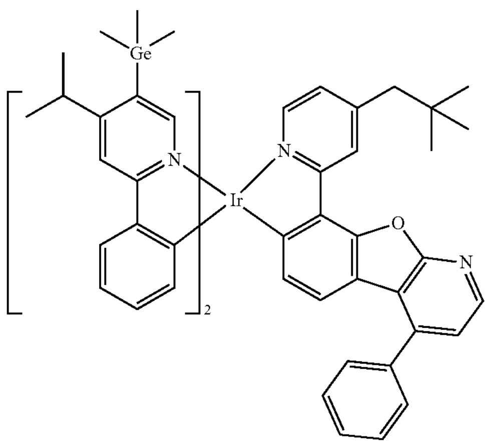
1027
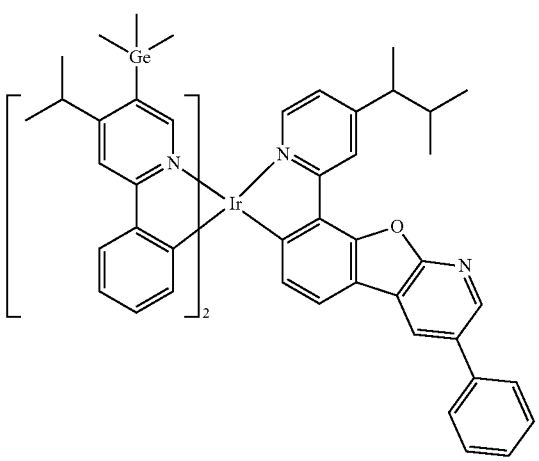
1028
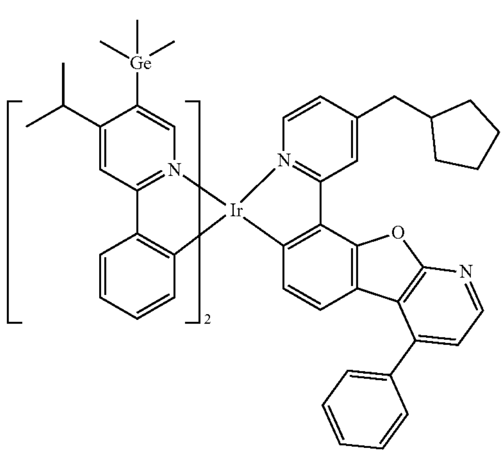
-continued
1029
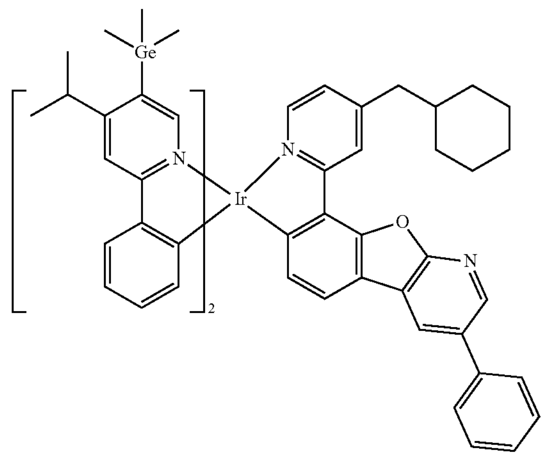
1030
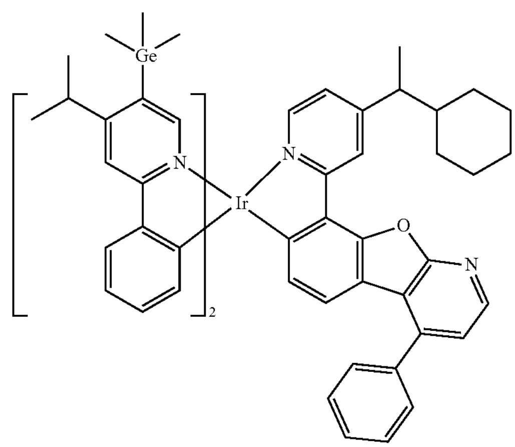
1031
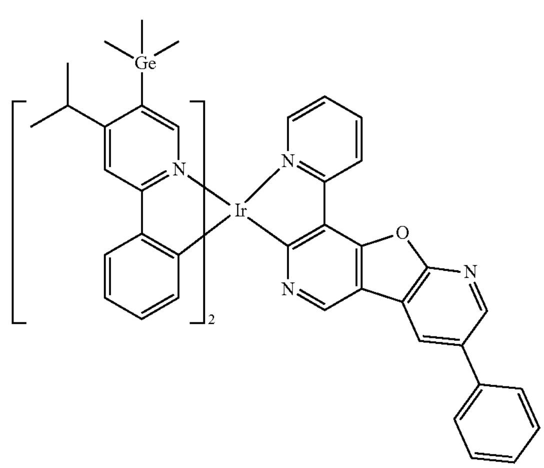

-continued
1032
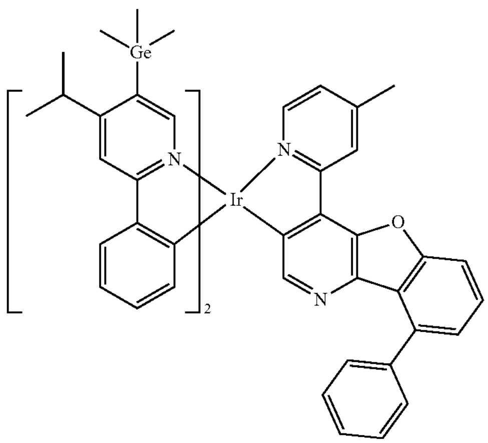
1033
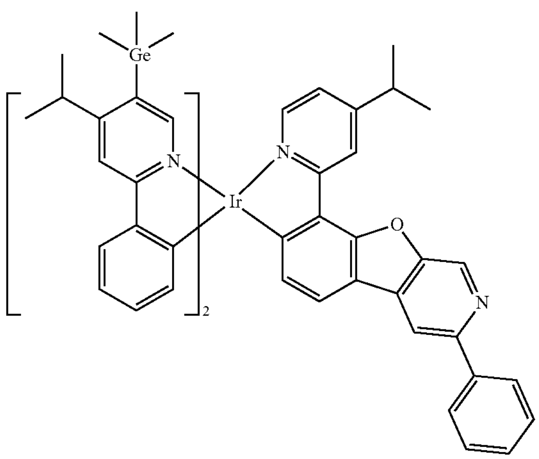
1034
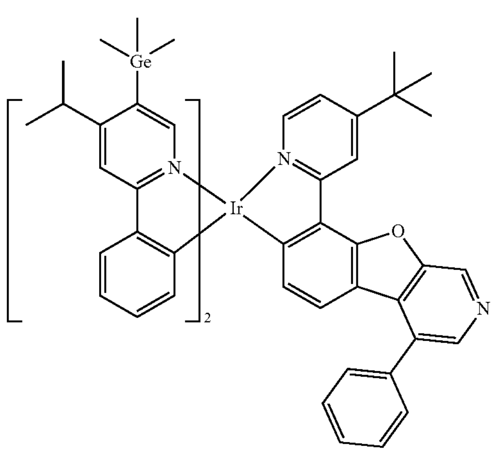
-continued
1035
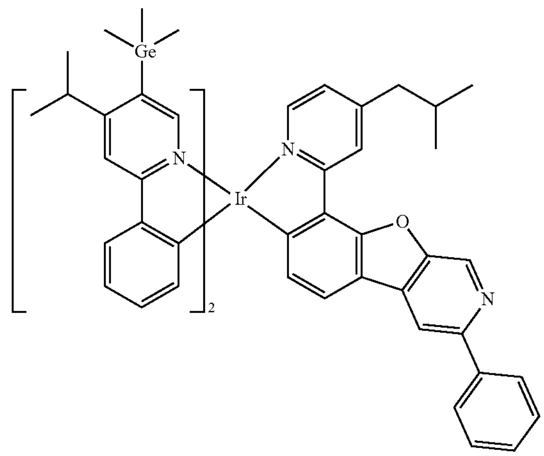
1036
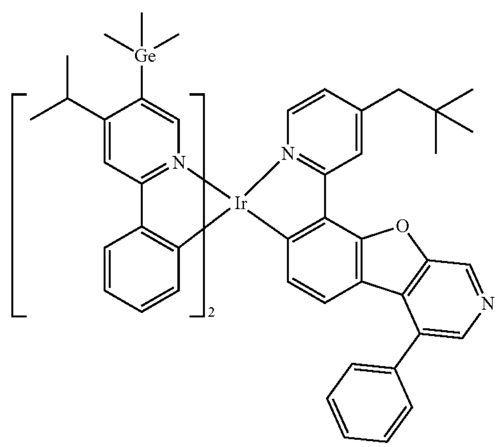
1037
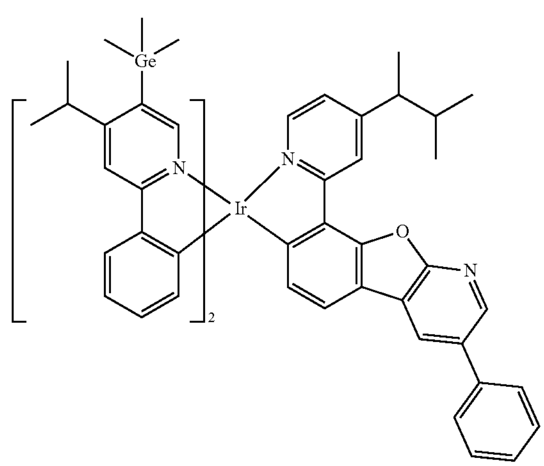

-continued
1038
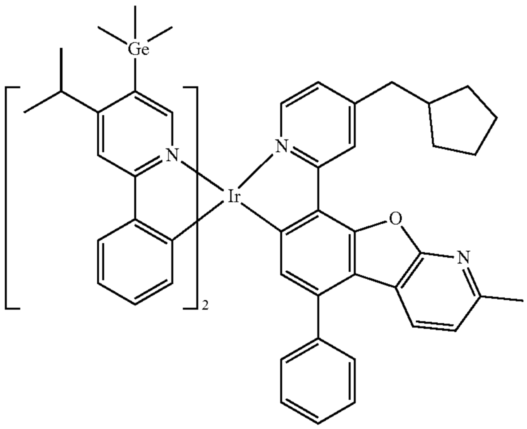
1039
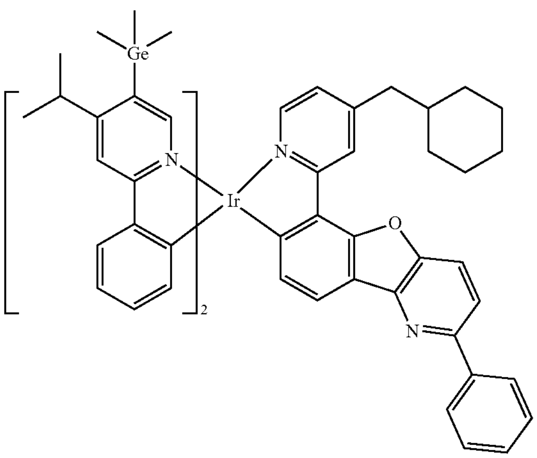
1040
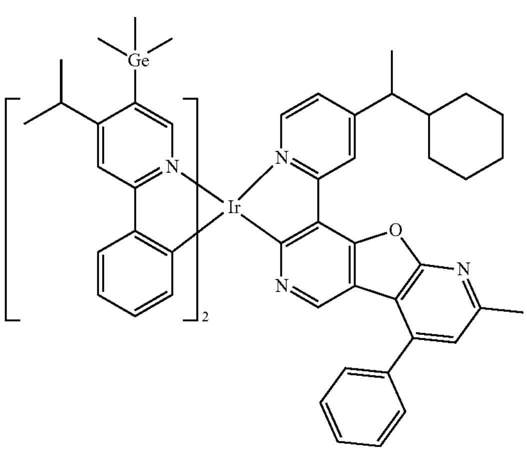
-continued
1041
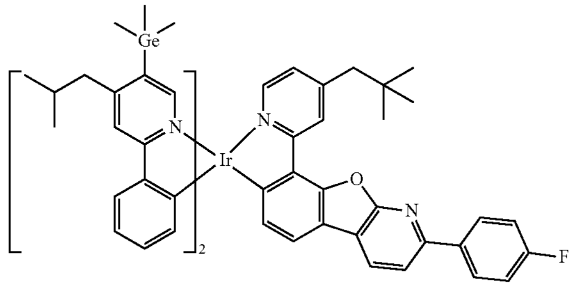
1042
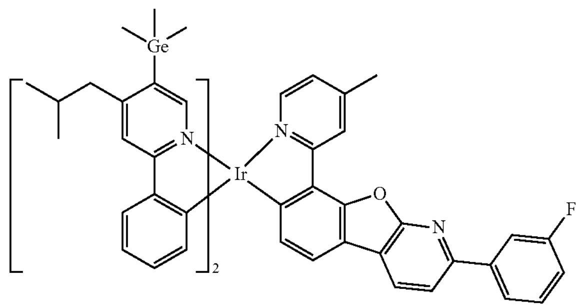
1043
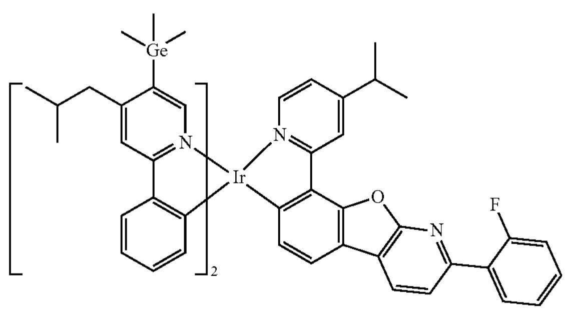
1044
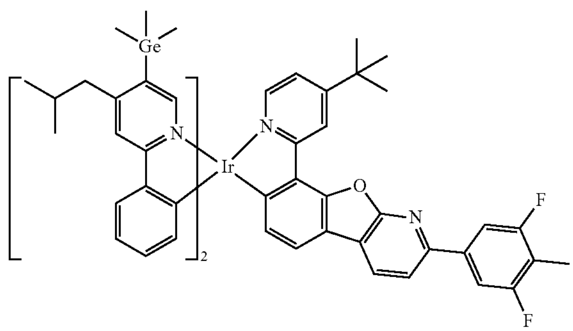

-continued
1045
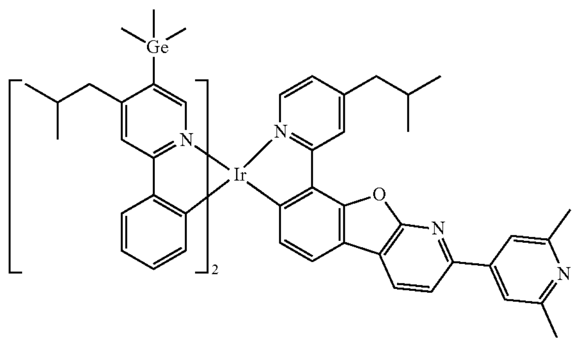
1046
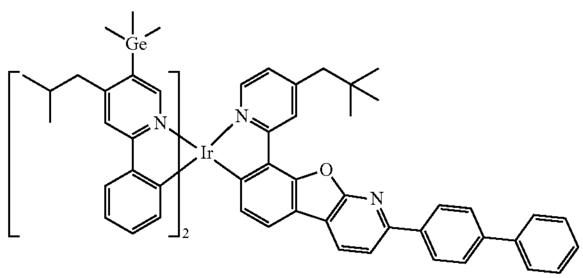
1047
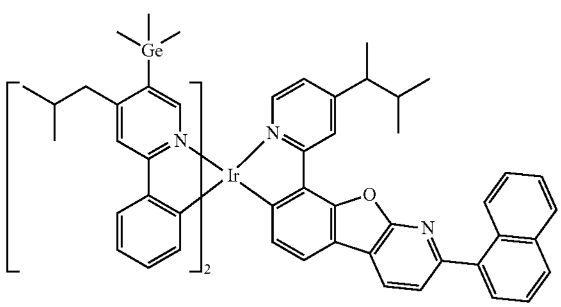
1048
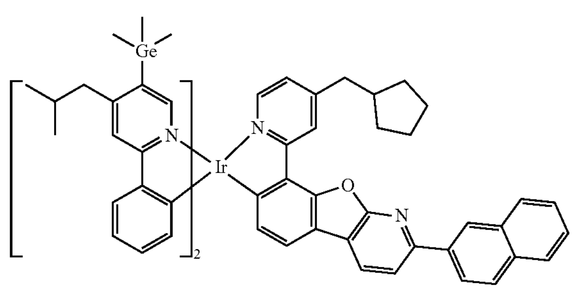
1049
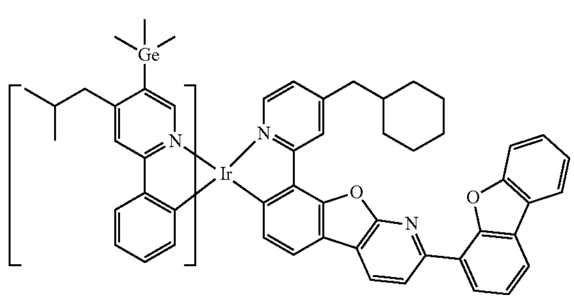
-continued
1050
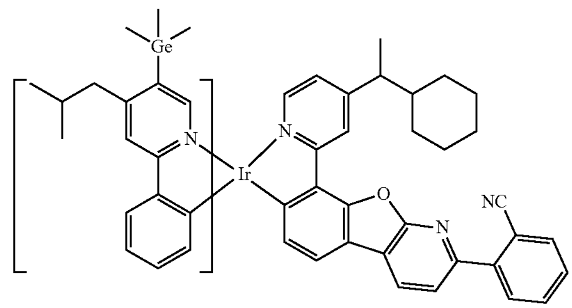
1051
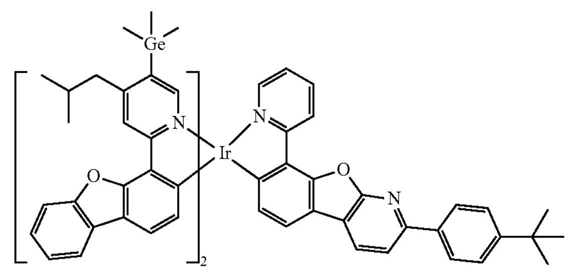
1052
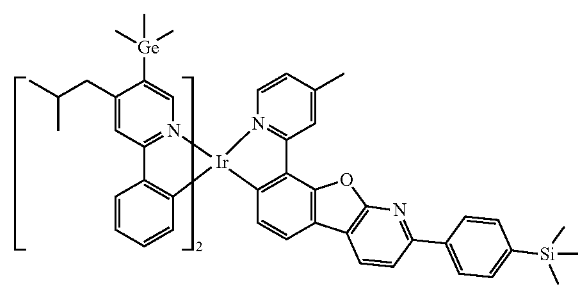
1053
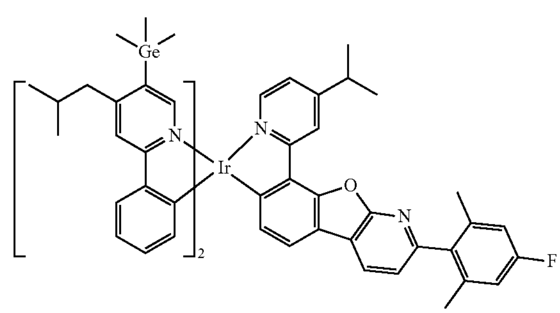
1054
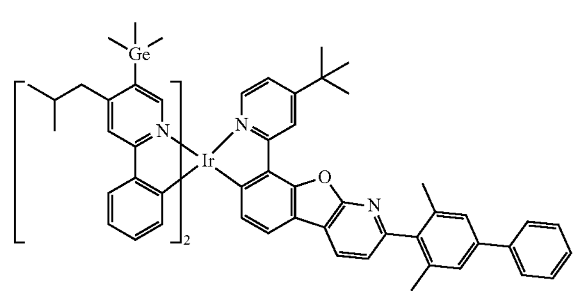

1055
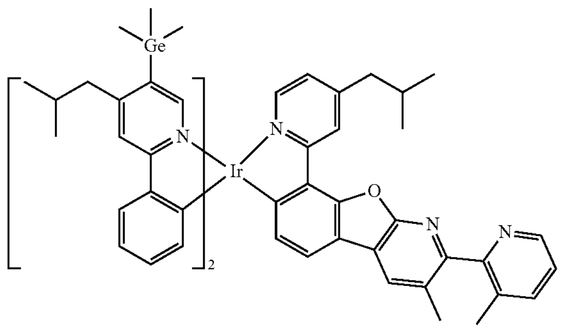
1056
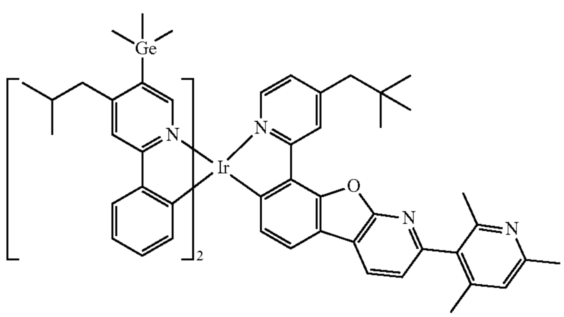
1057
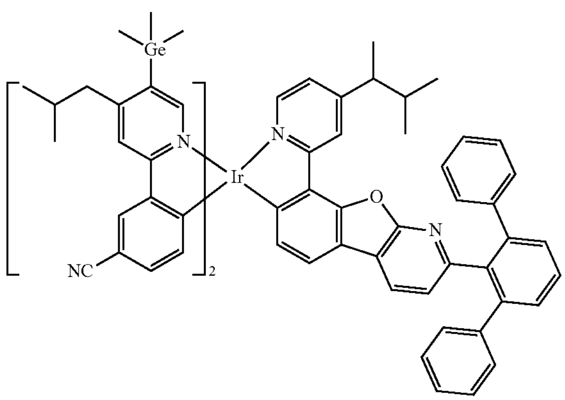
1058
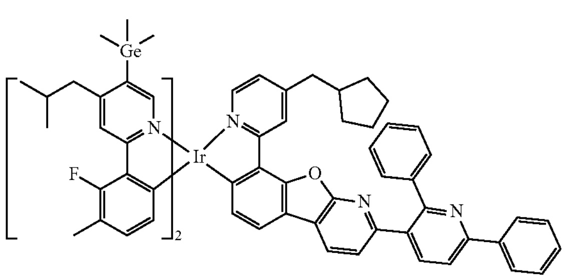
1059
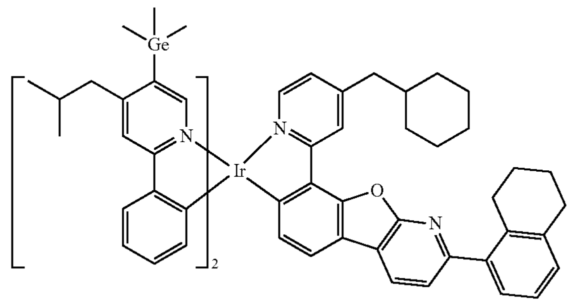
1060
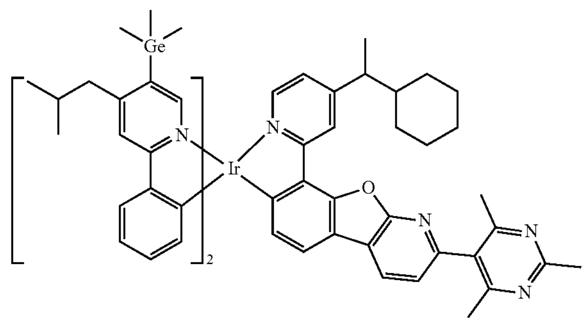
1061
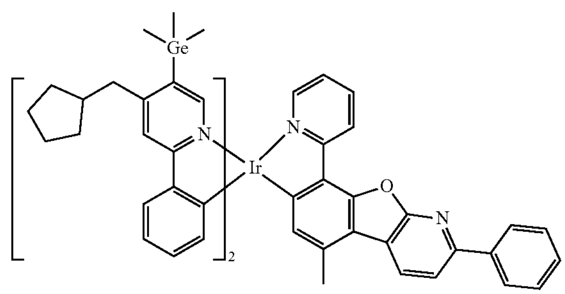
1062
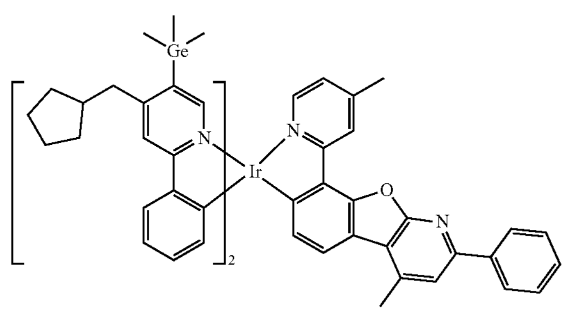
1063
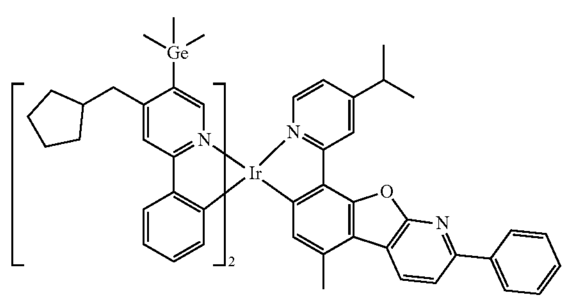

-continued
1064
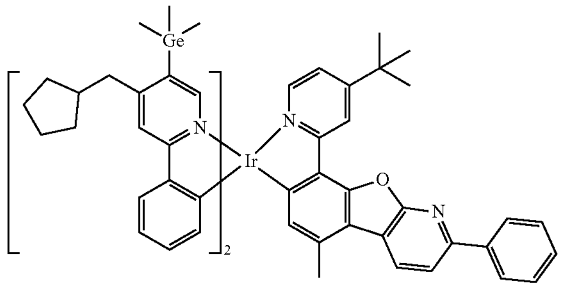
1065
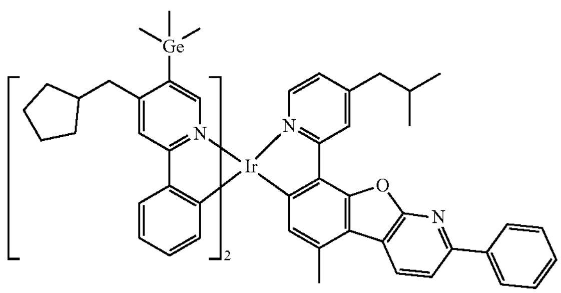
1066
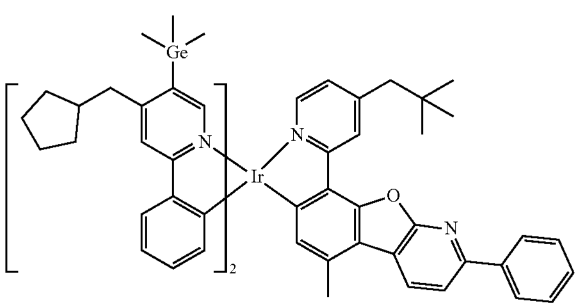
1067
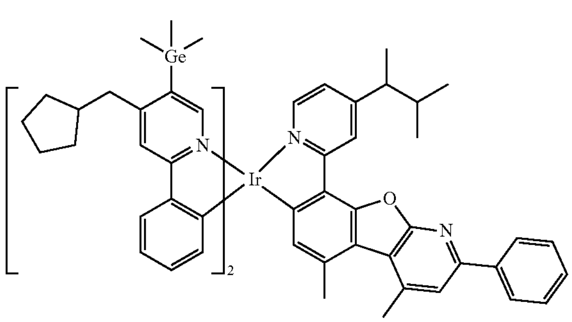
-continued
1068
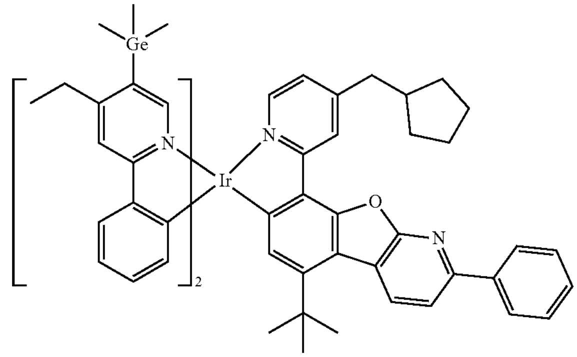
1069
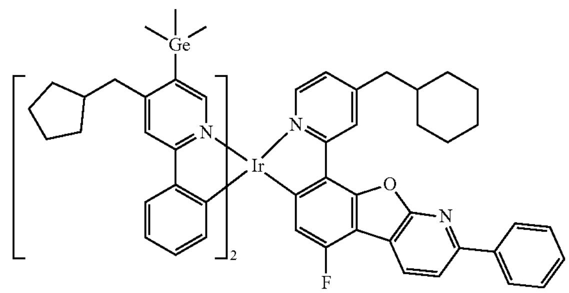
1070
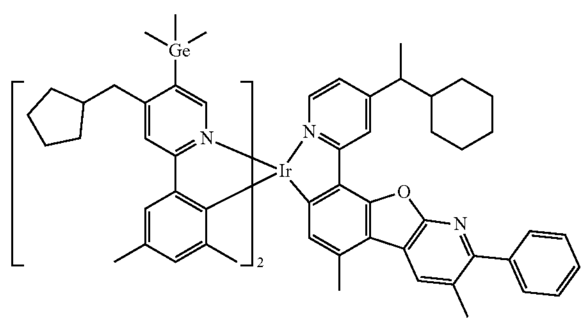
1071
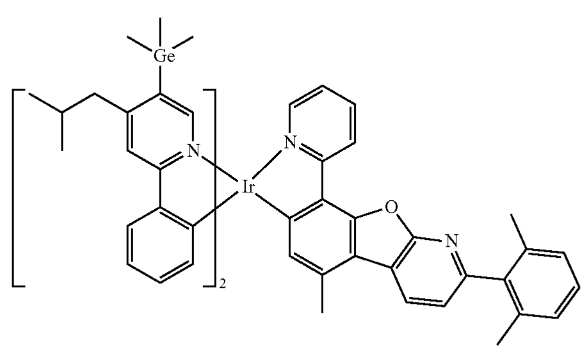

-continued
1072
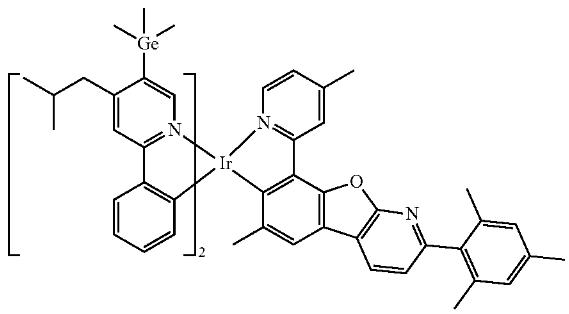
1073
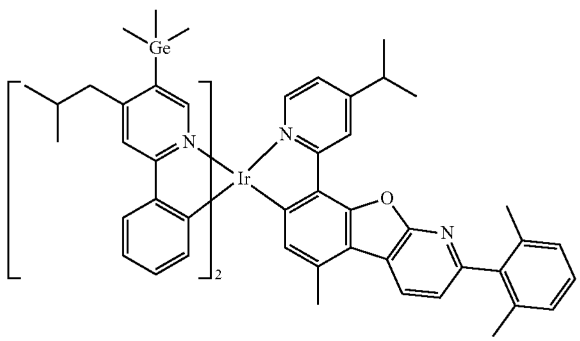
1074
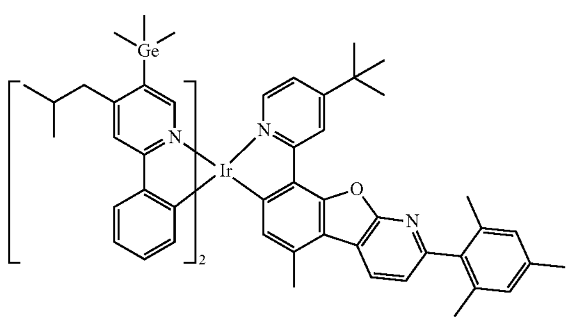
1075
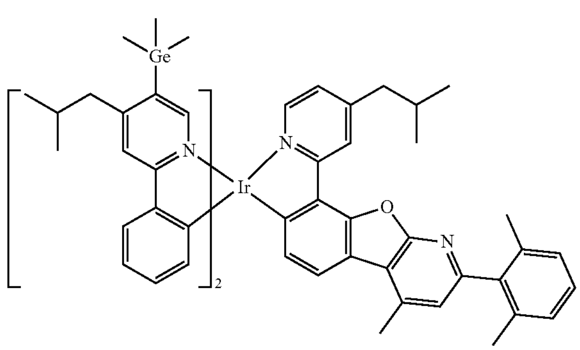
-continued
1076
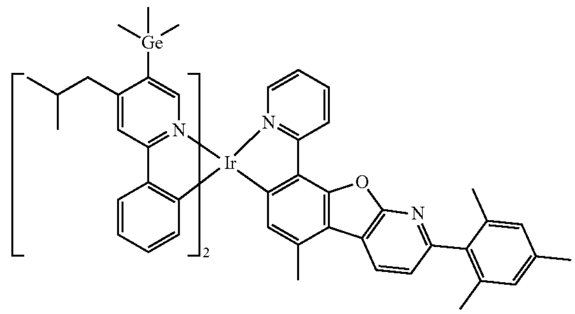
1077
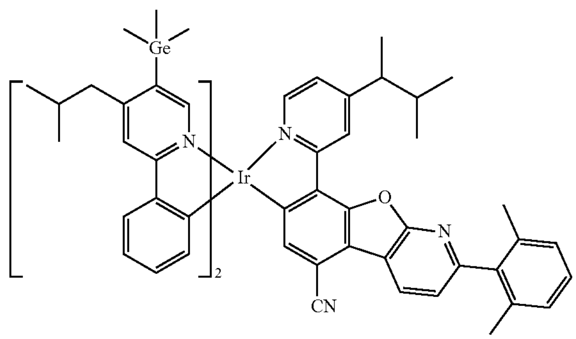
1078
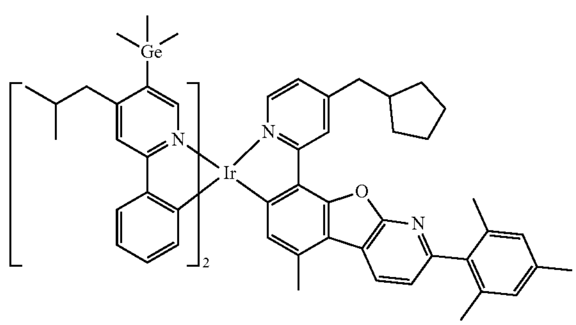
1079
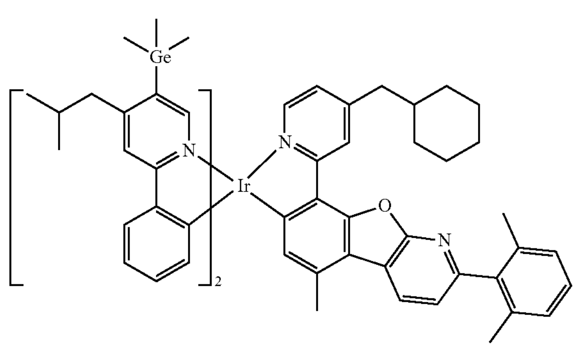

-continued
1080
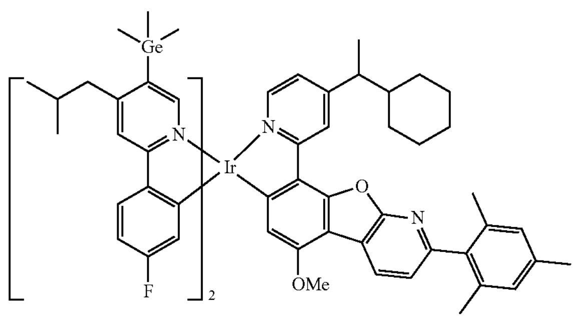
1081
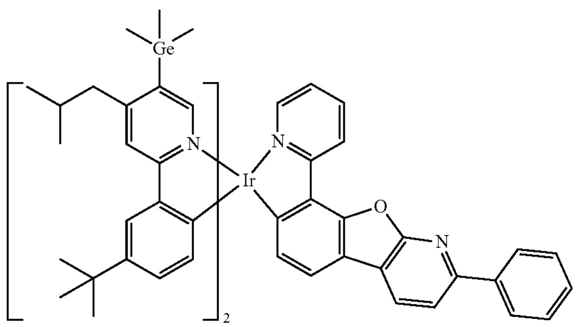
1082
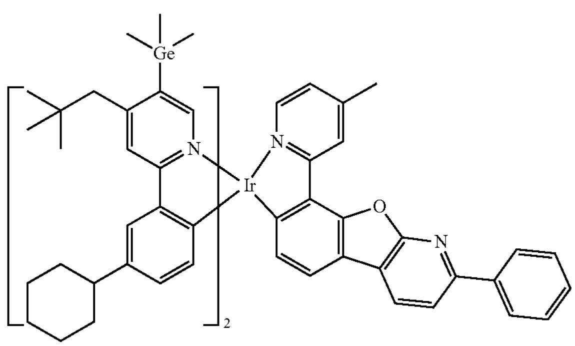
1083
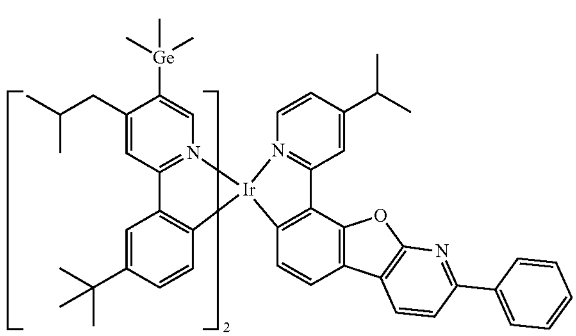
-continued
1084
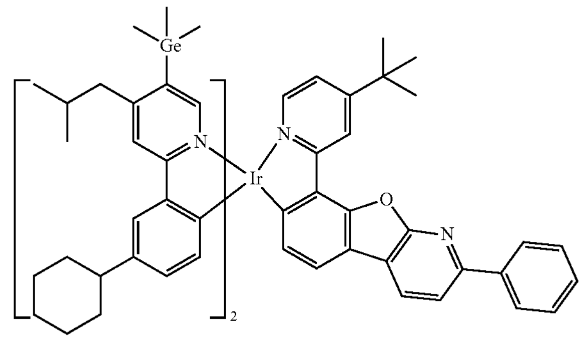
1085
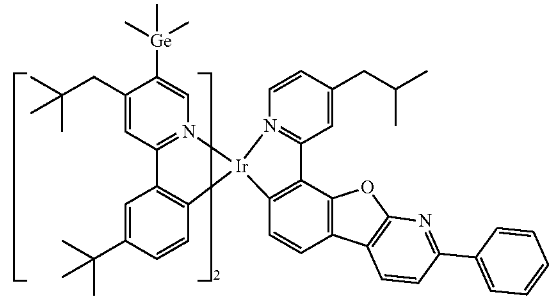
1086
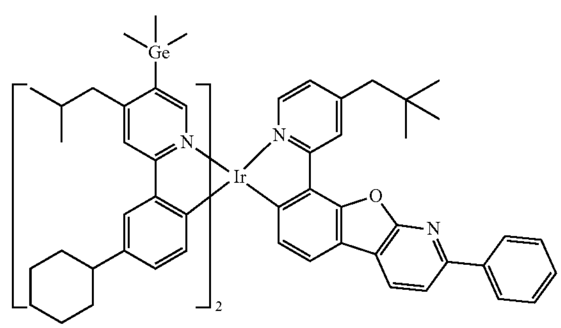
1087
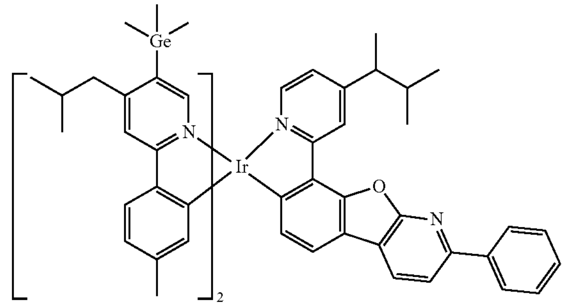

-continued
1088
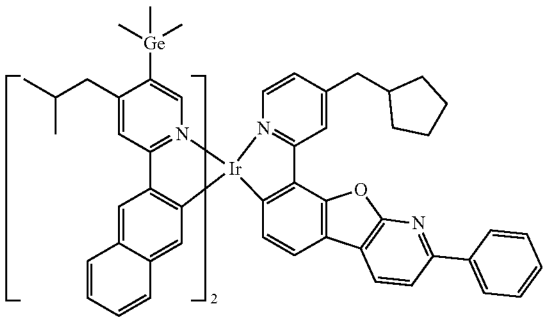
1089
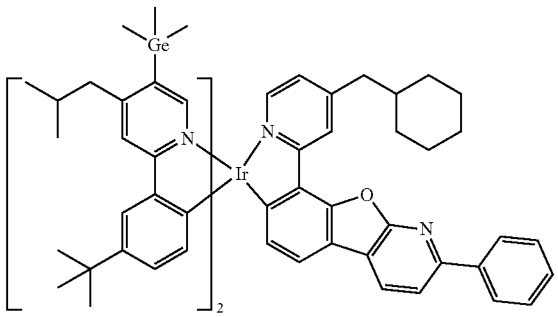
1090
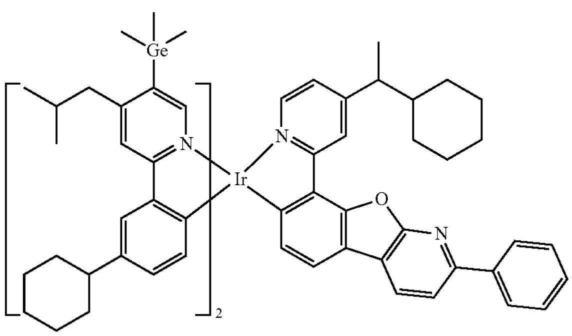
1091
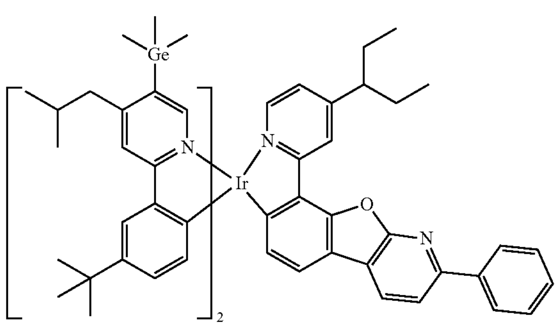
-continued
1092
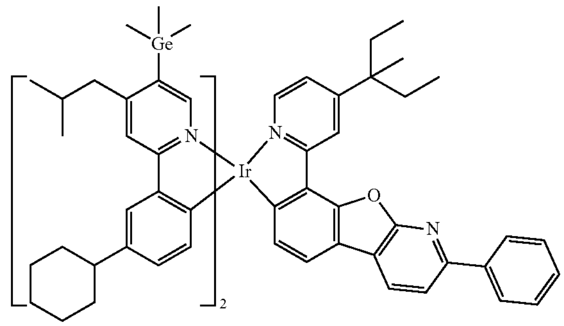
1093
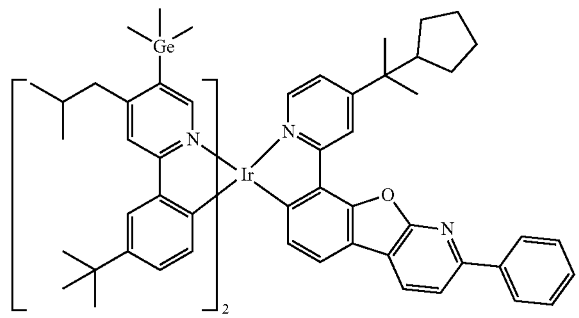
1094
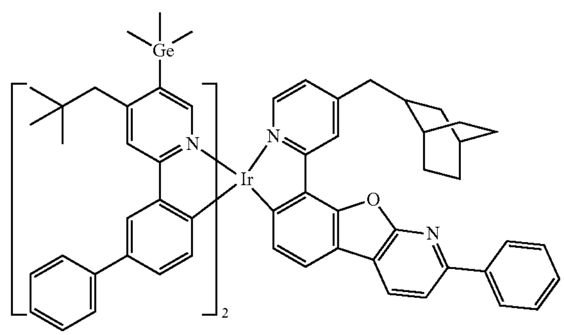
1095
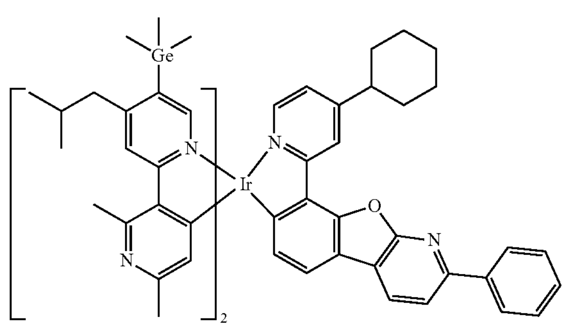

-continued
1096
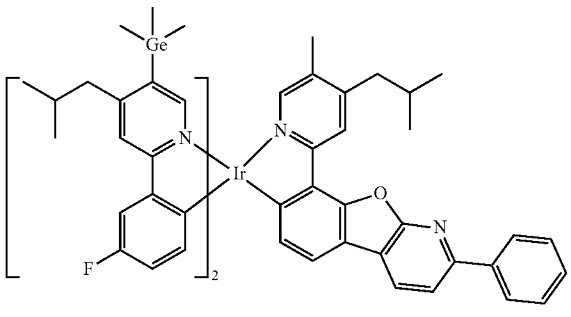
1097
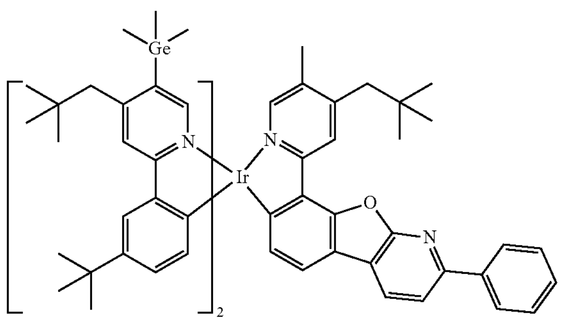
1098
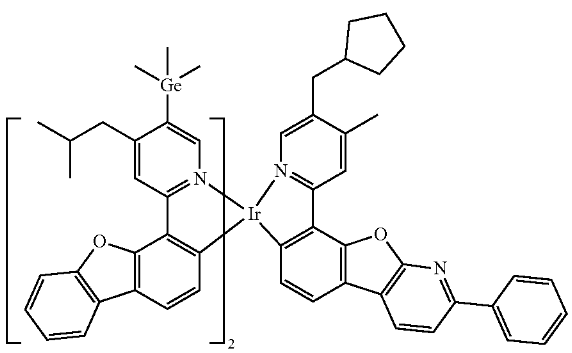
1099
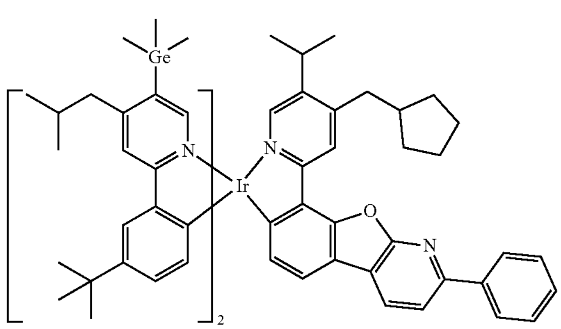
-continued
1100
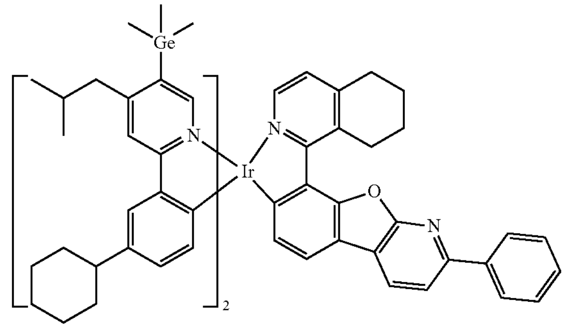
1101
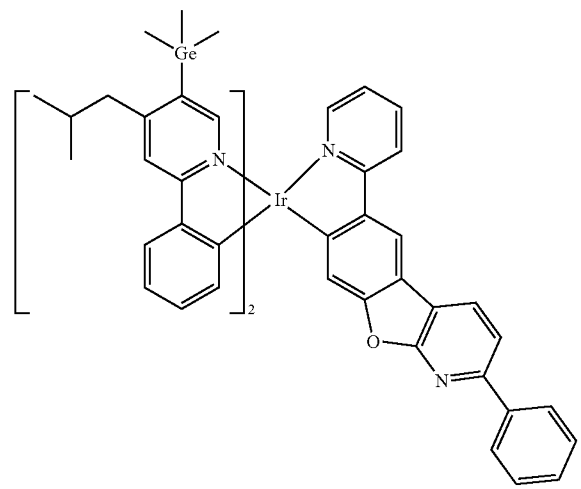
1102
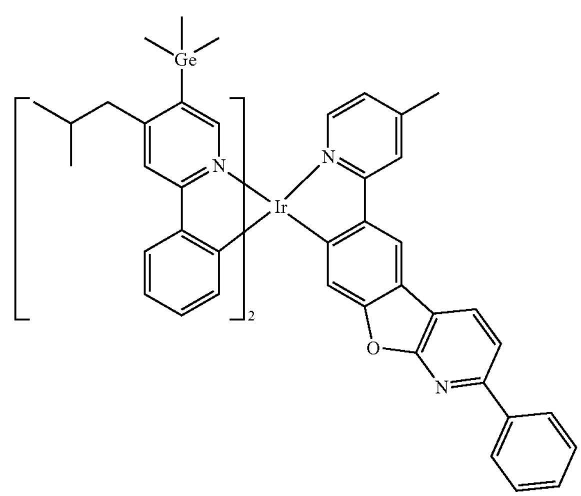

-continued
1103
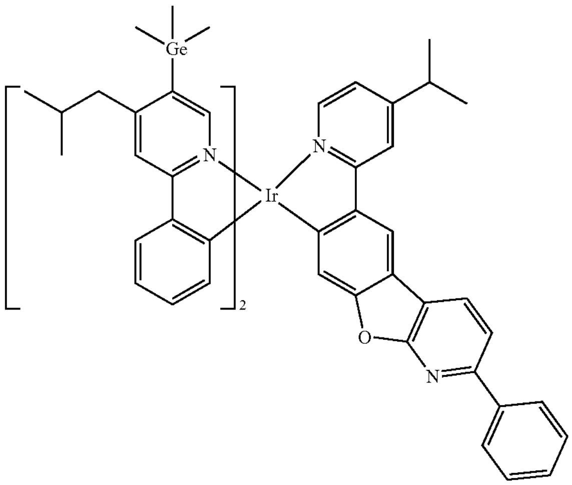
1104
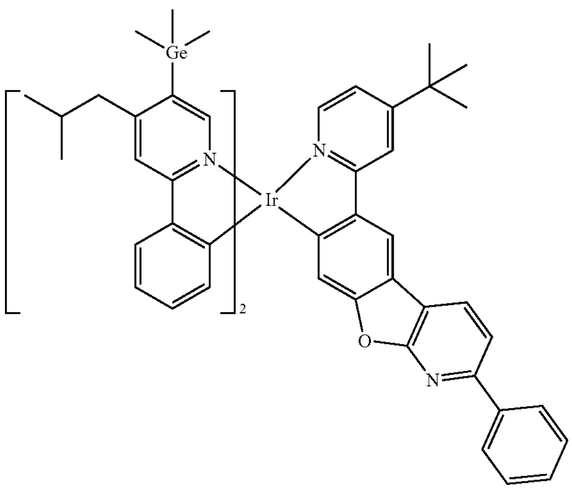
1105
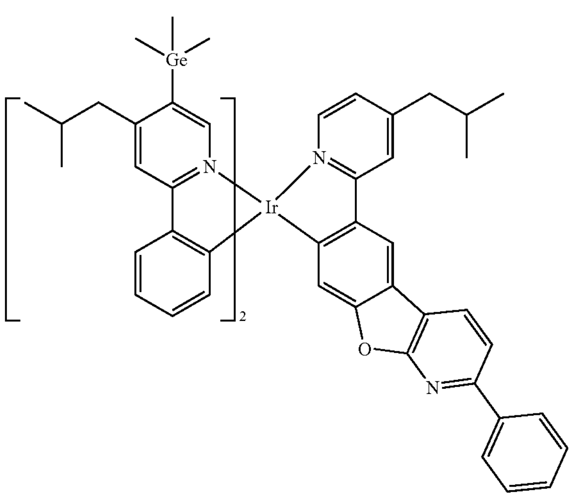
-continued
1106
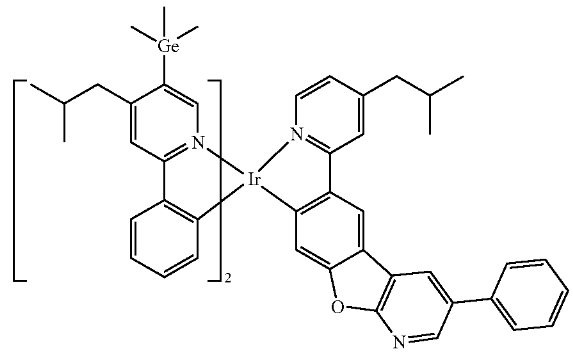
1107
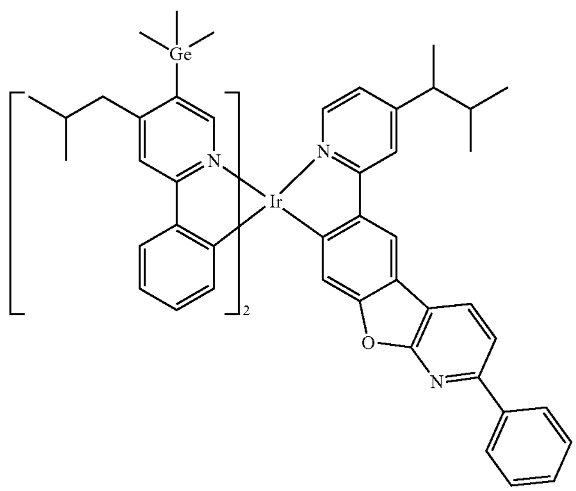
1108
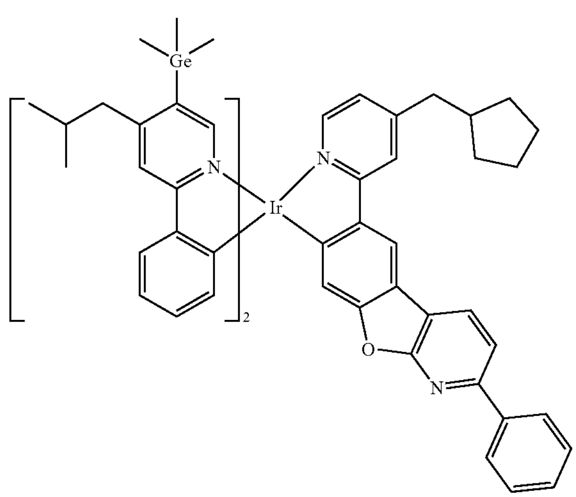

1109
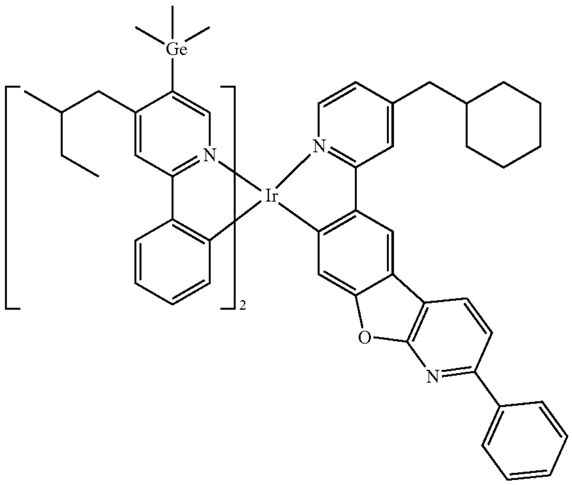
1110
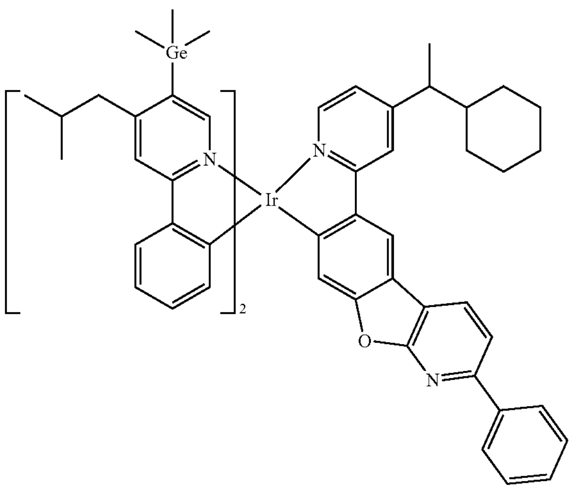
1111
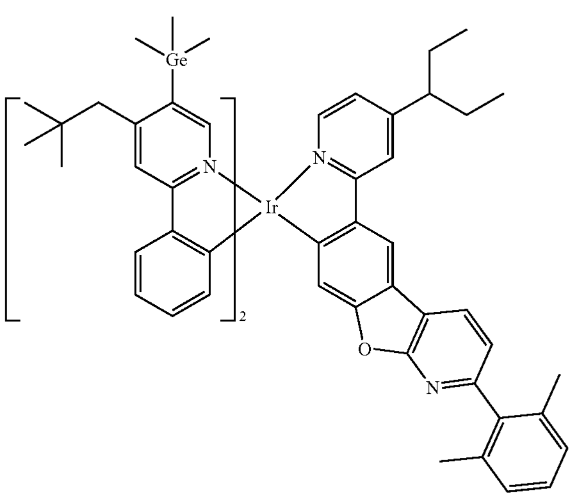
1112
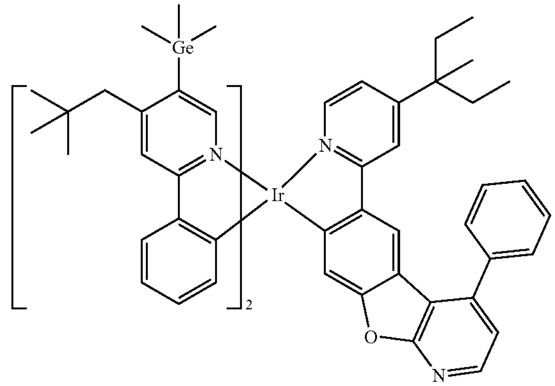
1113
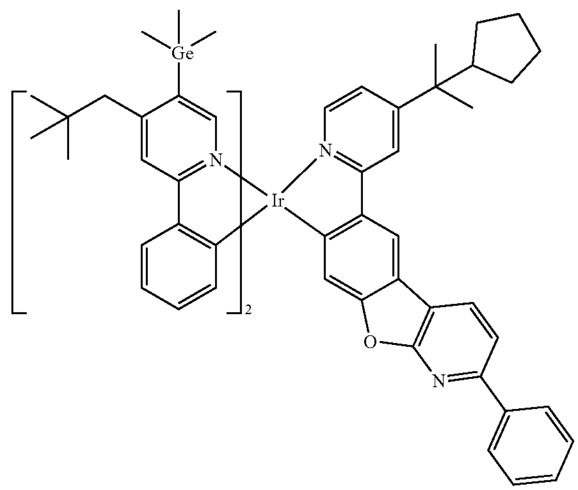
1114
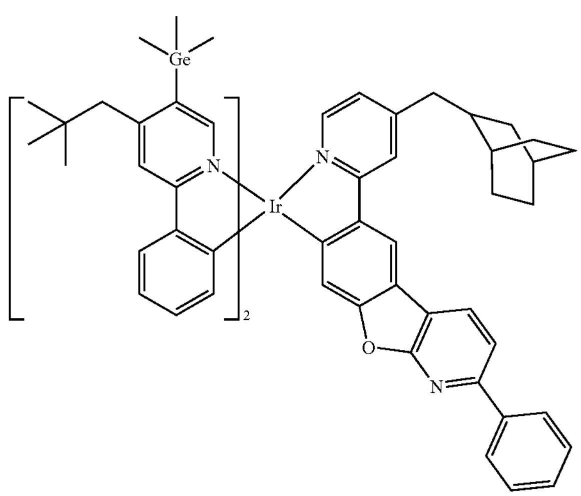

-continued
1115
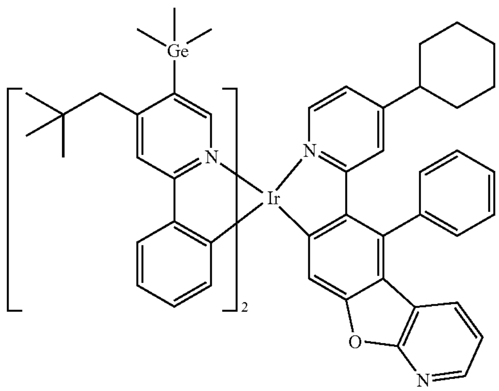
1116
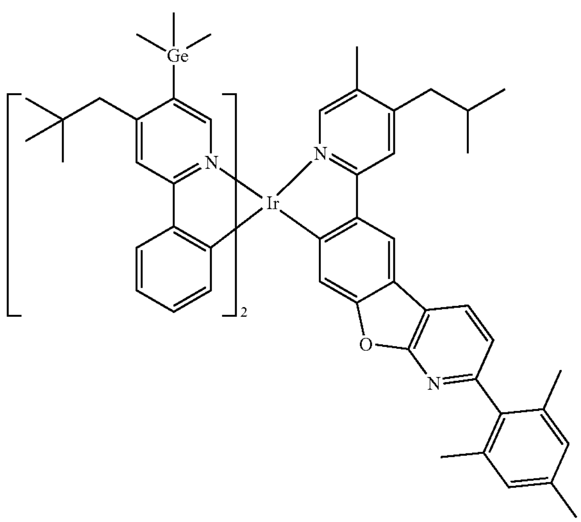
1117
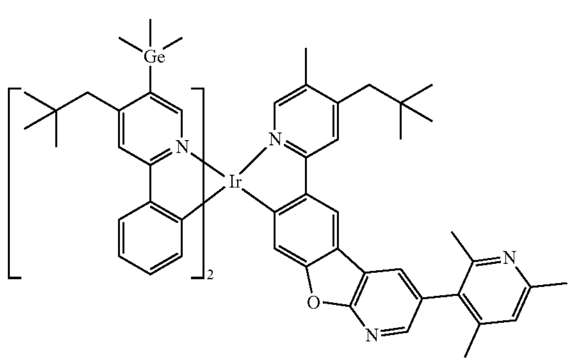
-continued
1118
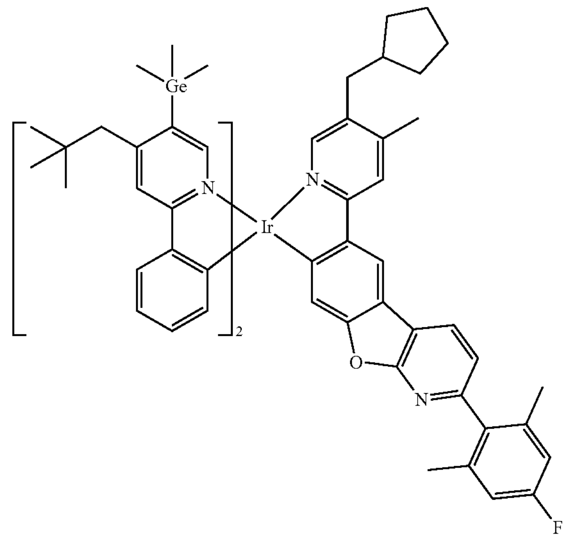
1119
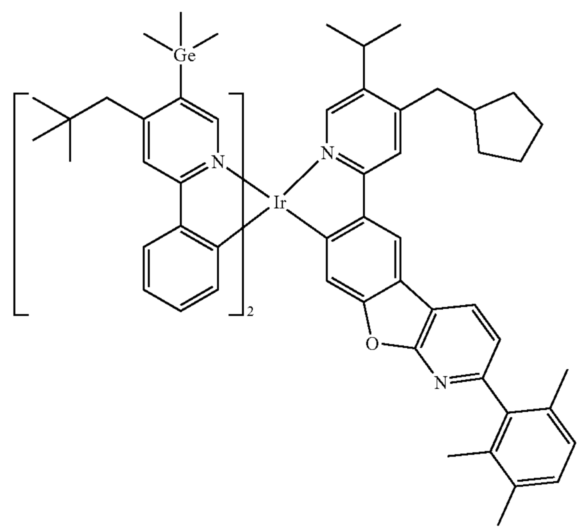
1120
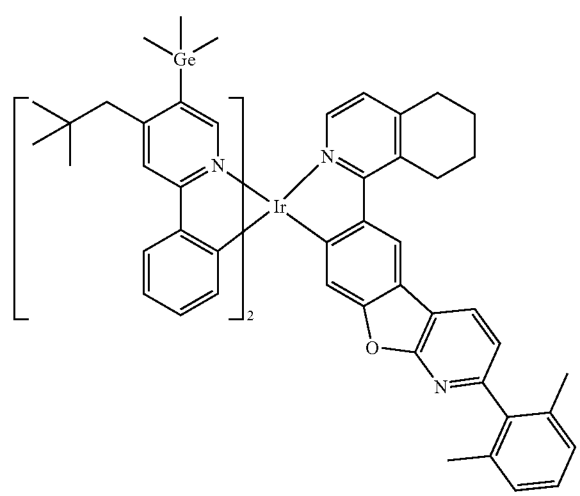

-continued
1121
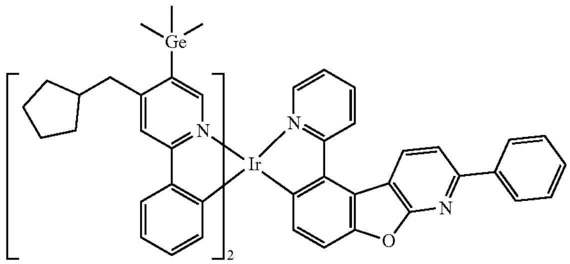
1122
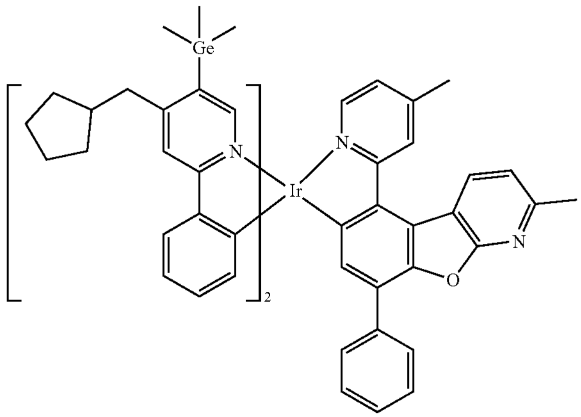
1123
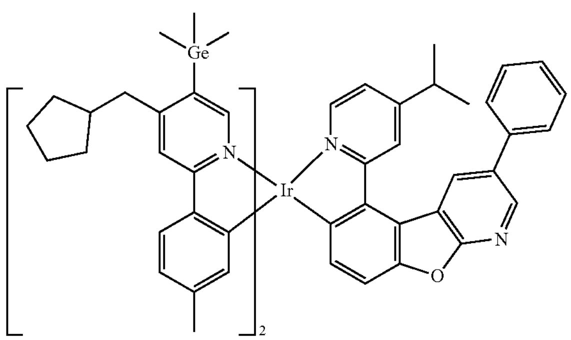
1124
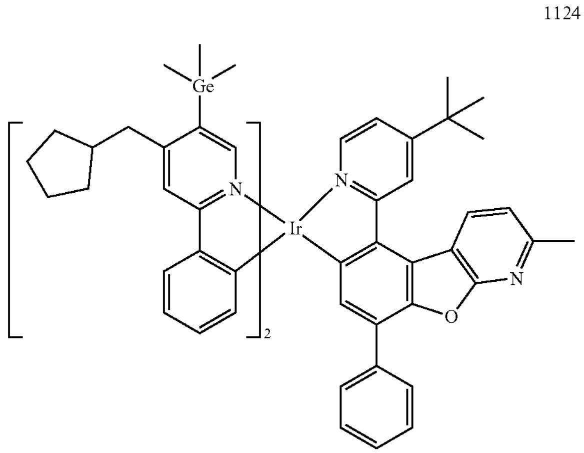
-continued
1125
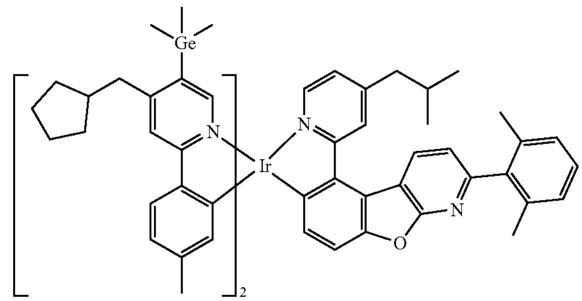
1126
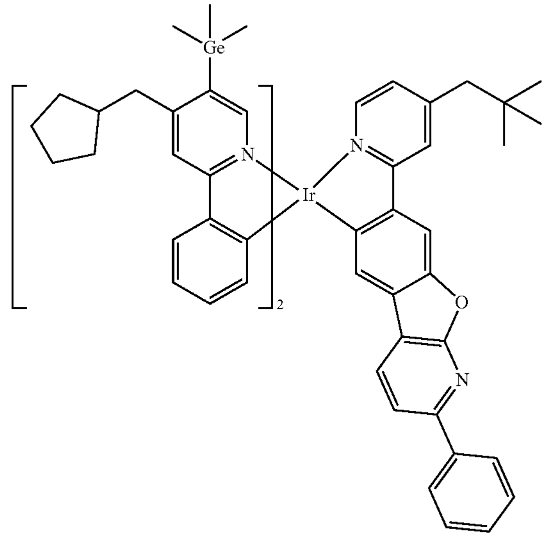
1127
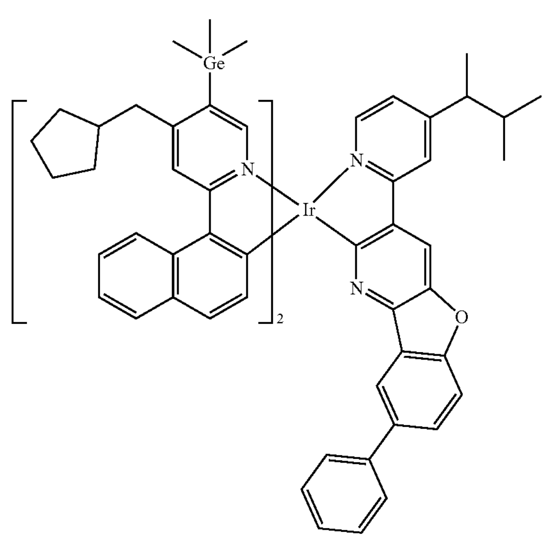

-continued
1128
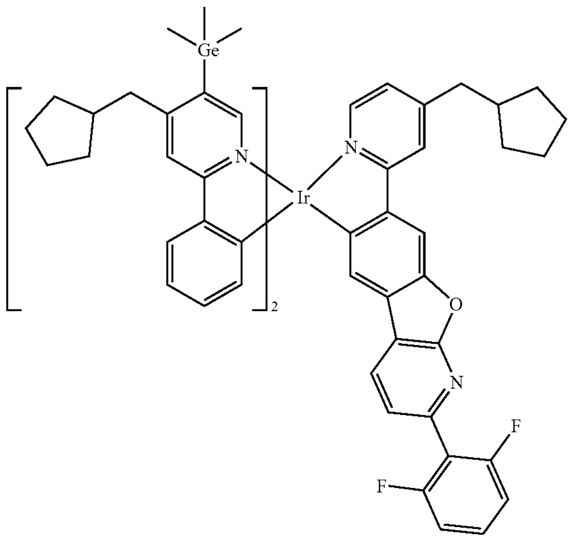
1129
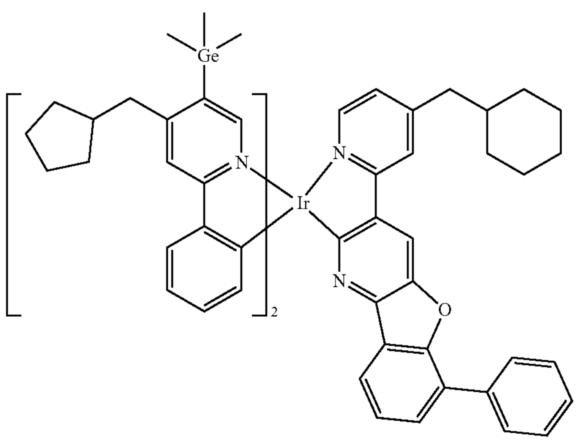
1130
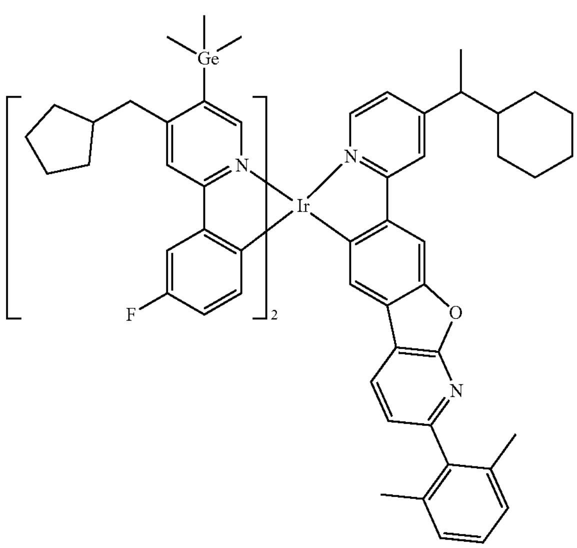
-continued
1131
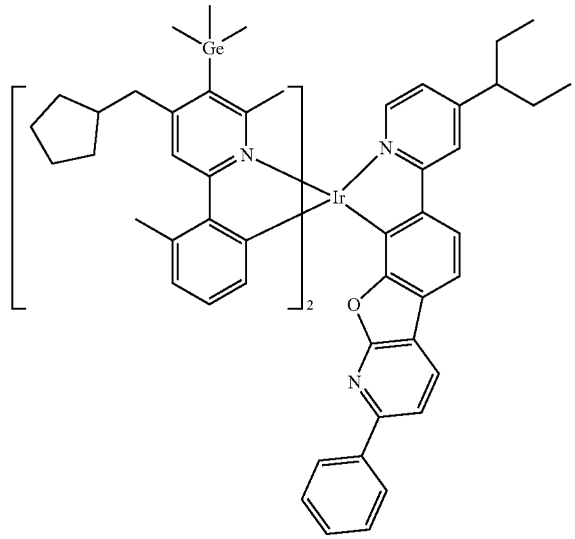
1132
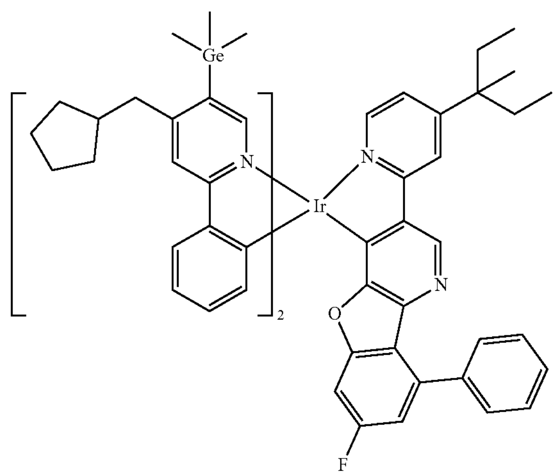
1133
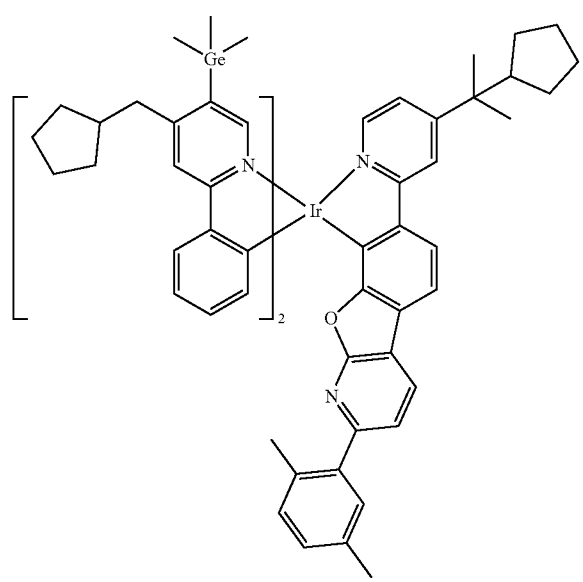

-continued
1134
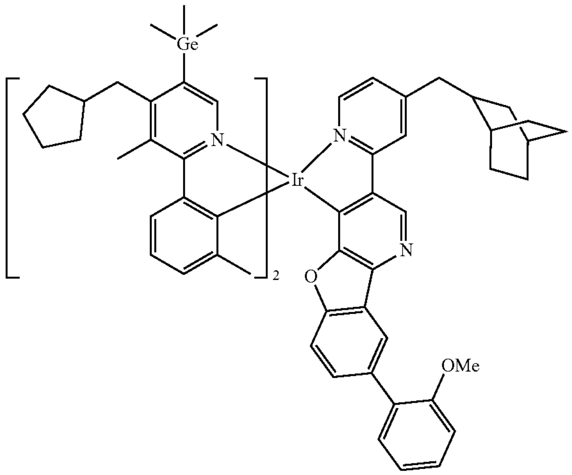
1135
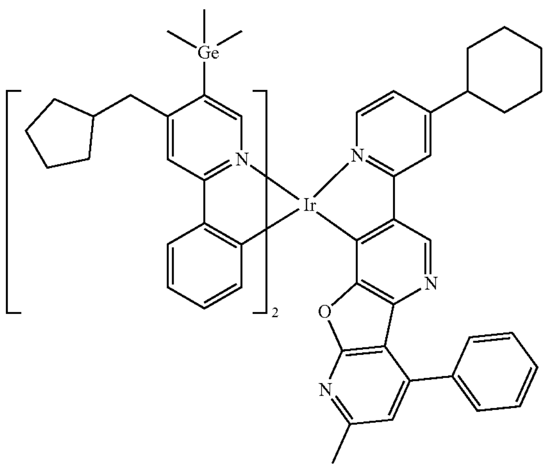
1136
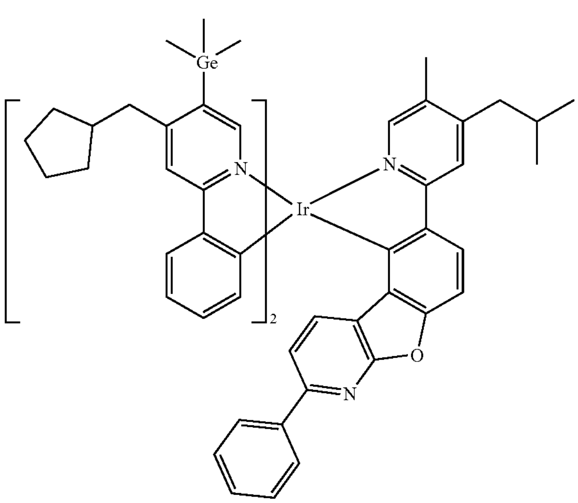
-continued
1137
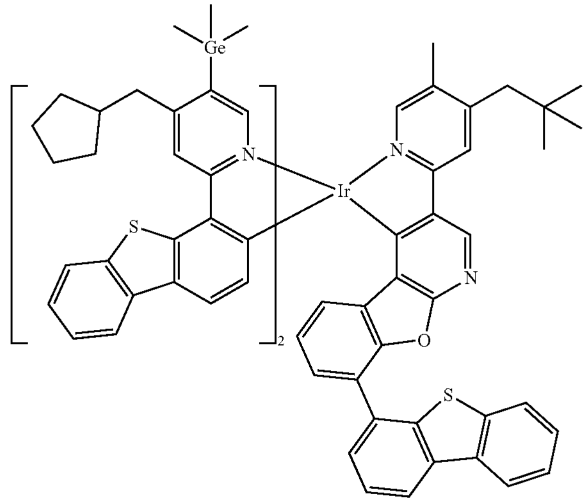
1138
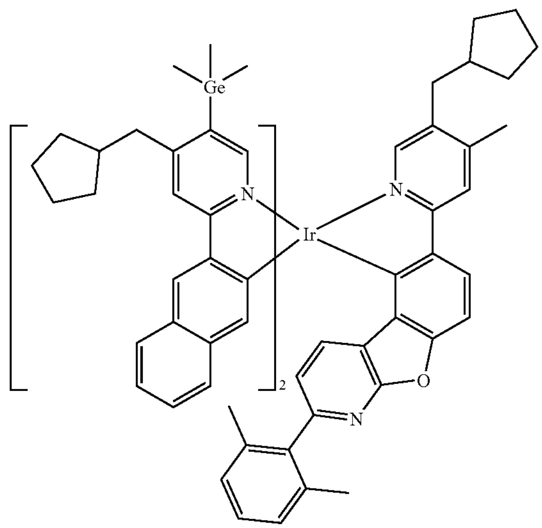
1139
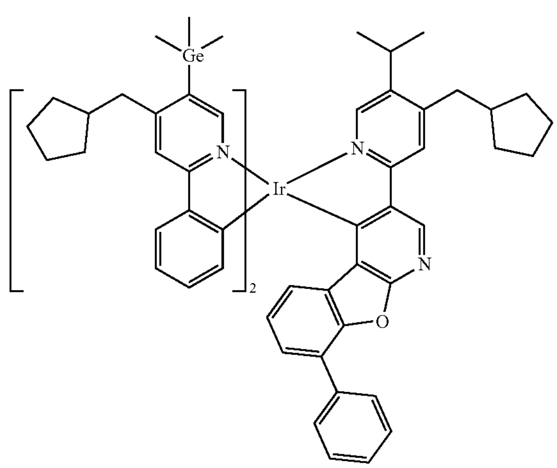

-continued
1140
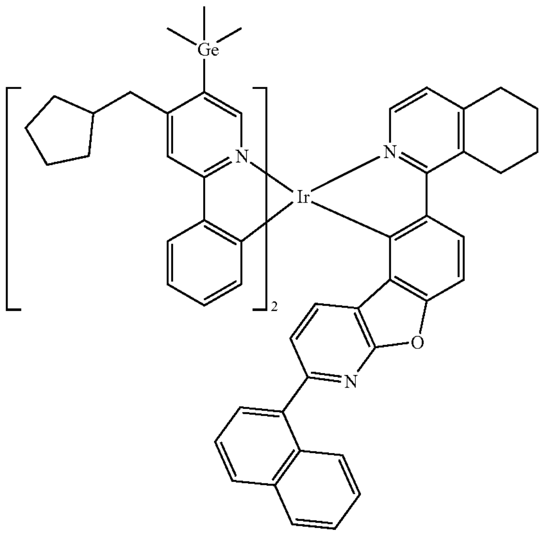
1141
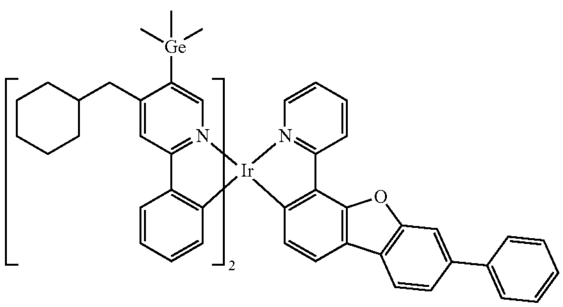
1142
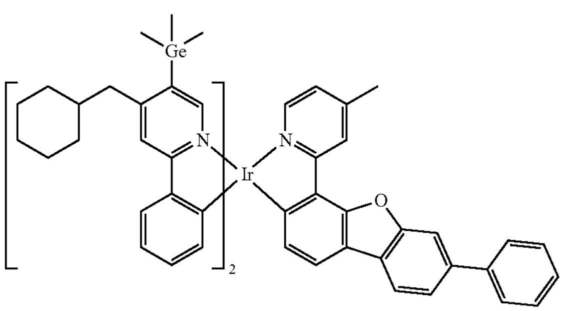
1143
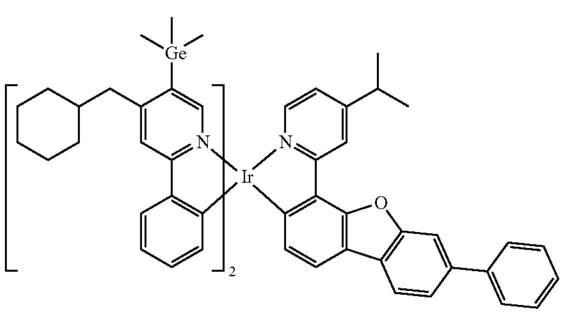
-continued
1144
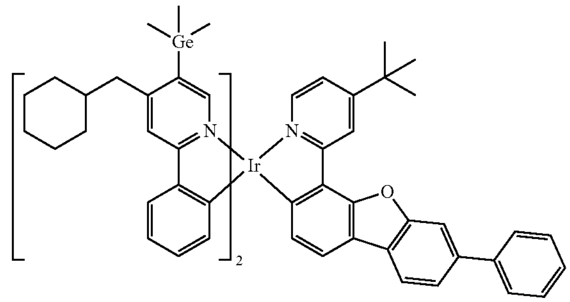
1145
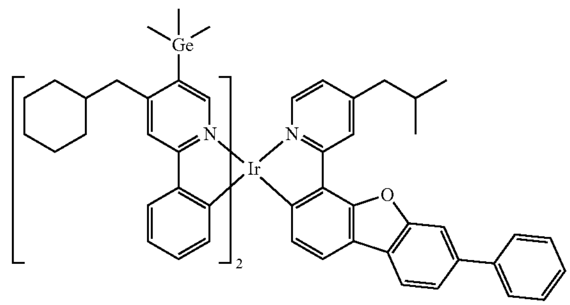
1146
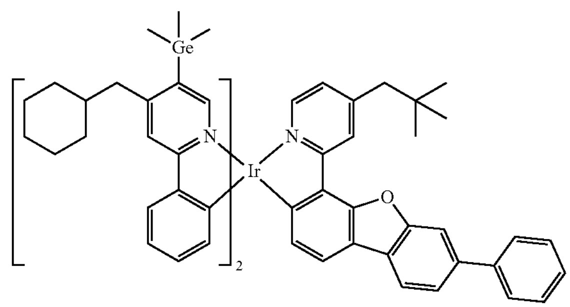
1147
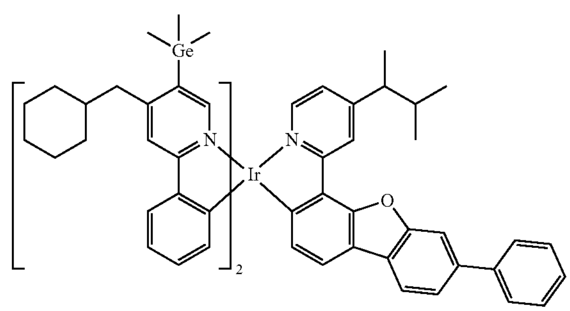
1148
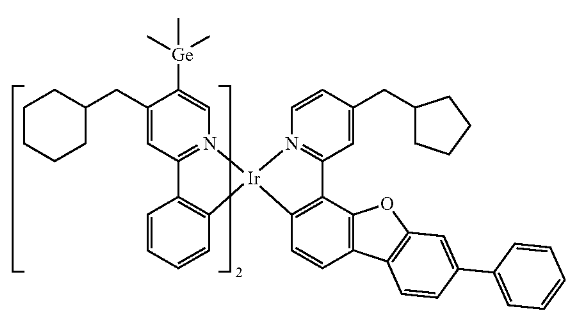

-continued
1149
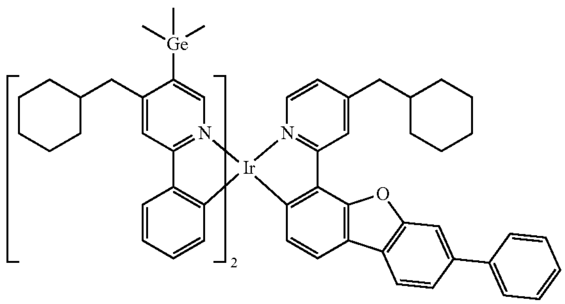
1150
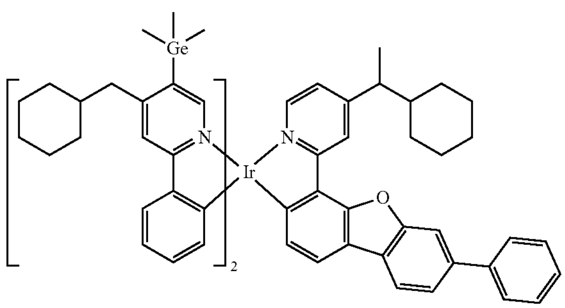
1151
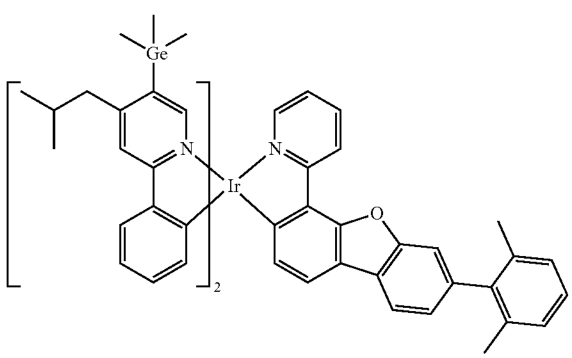
1152
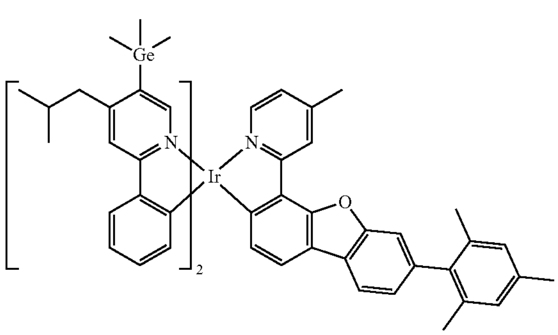
-continued
1153
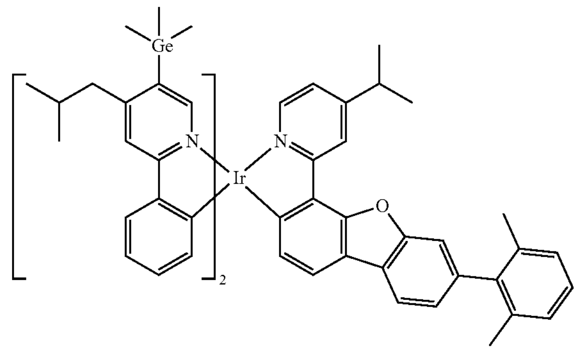
1154
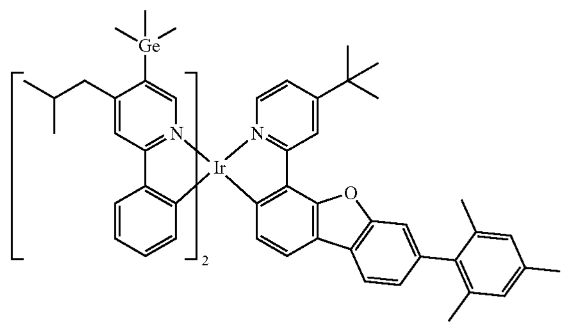
1155
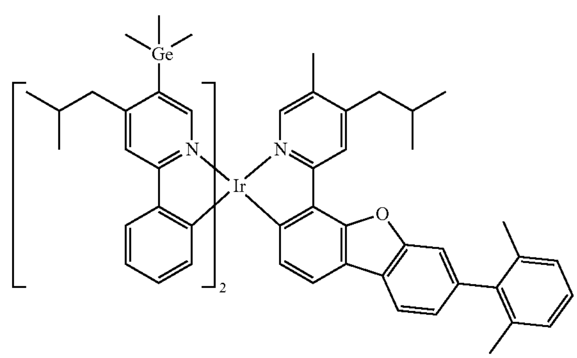
1156
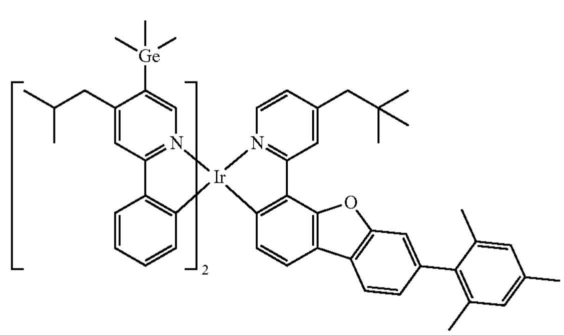

-continued
1157
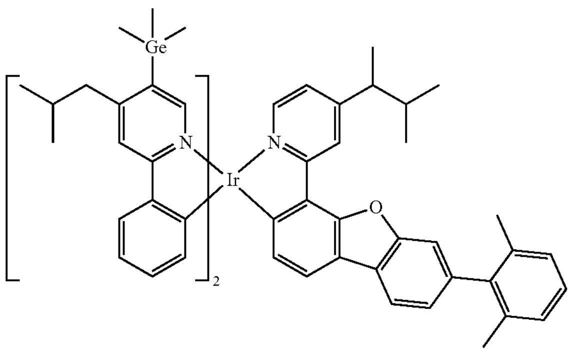
1158
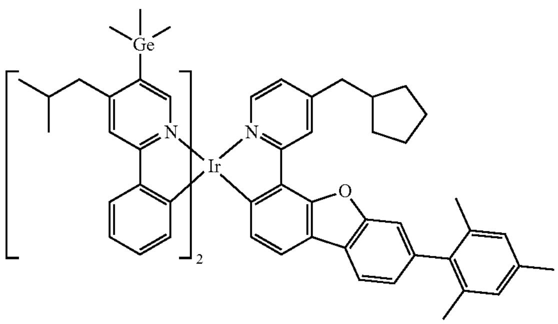
1159
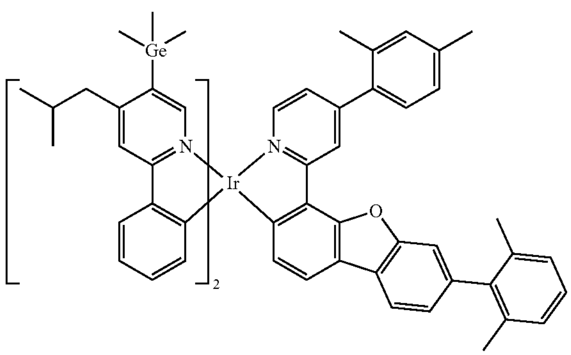
1160
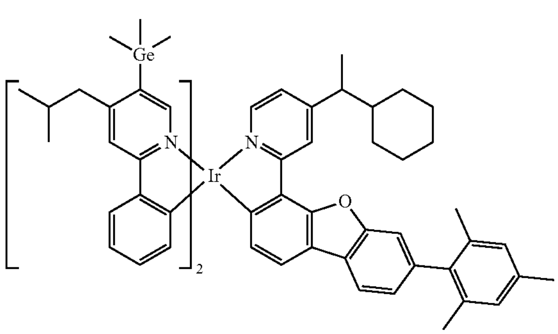
-continued
1161
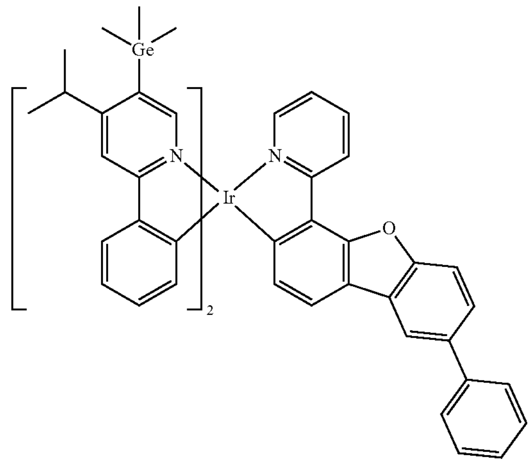
1162
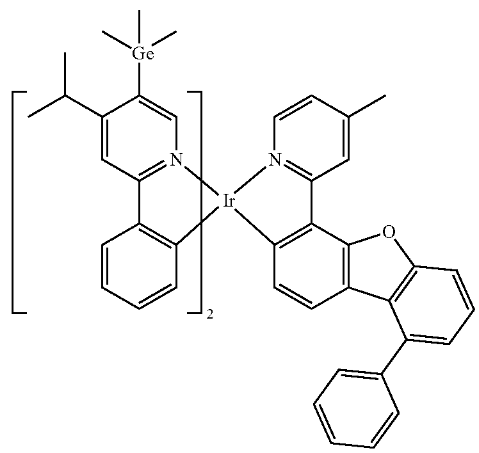
1163
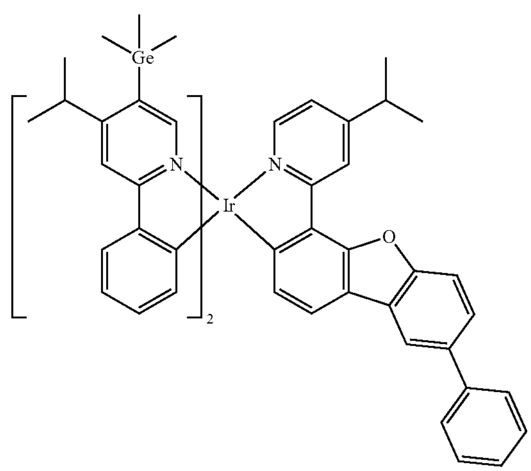

-continued
1164
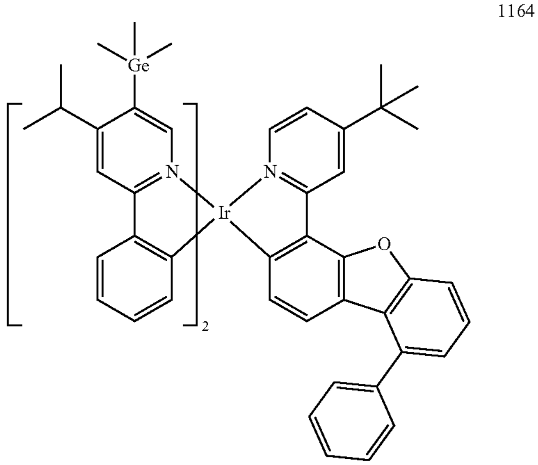
1165
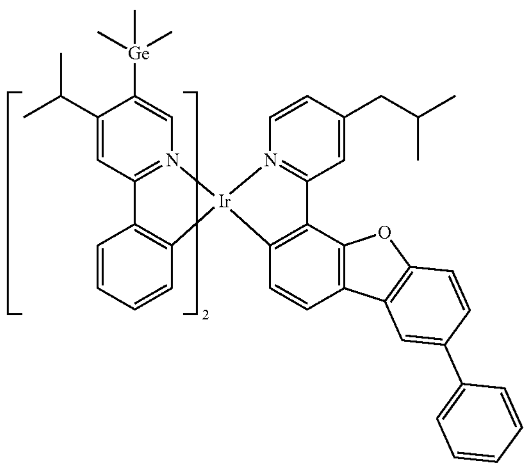
1166
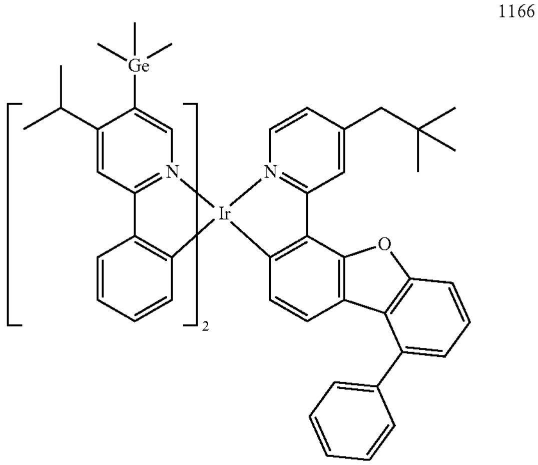
-continued
1167
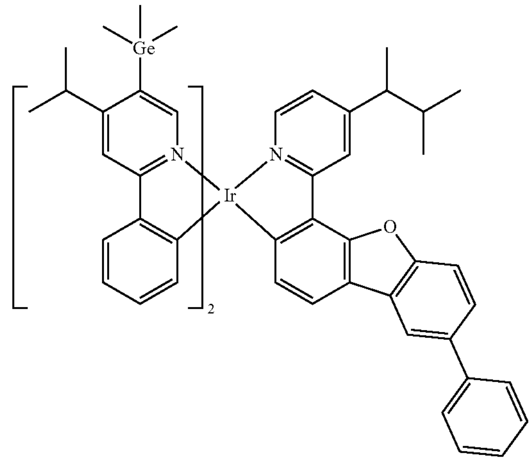
1168
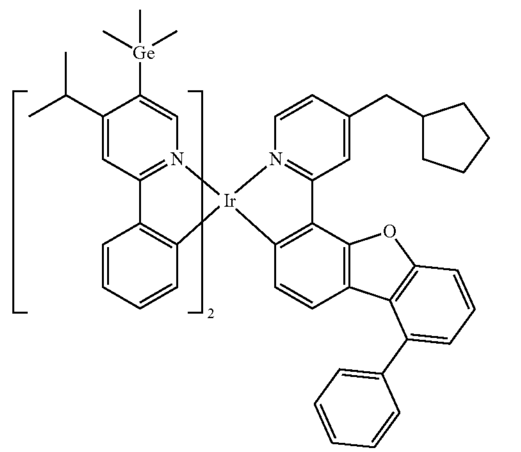
1169
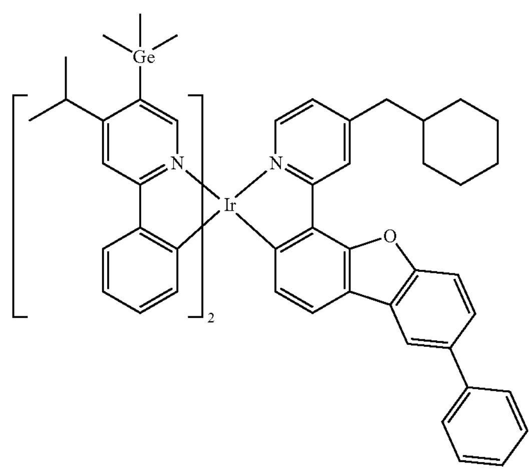

-continued
1170
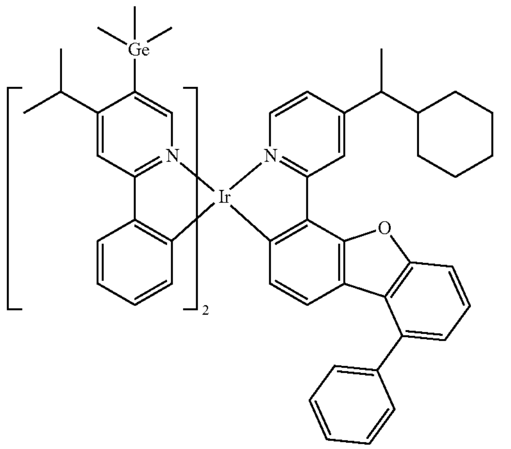
1171
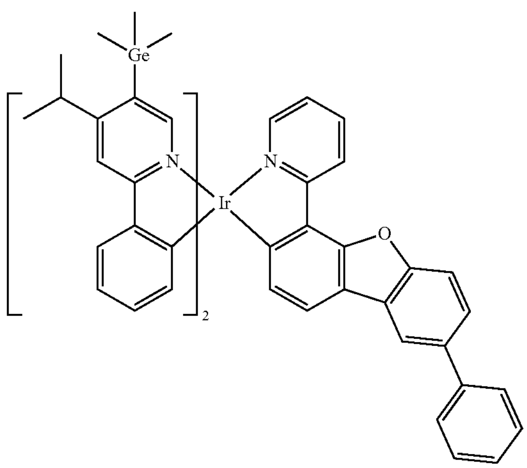
1172
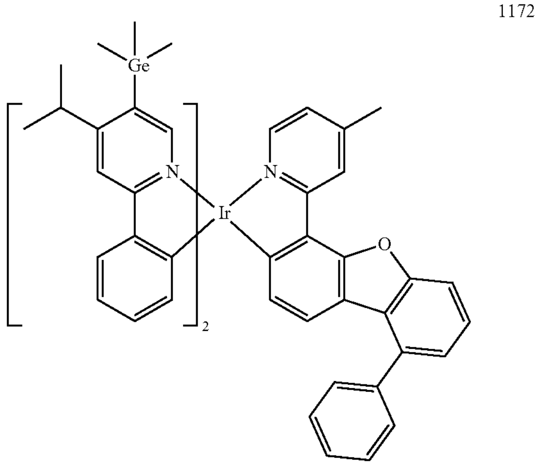
-continued
1173
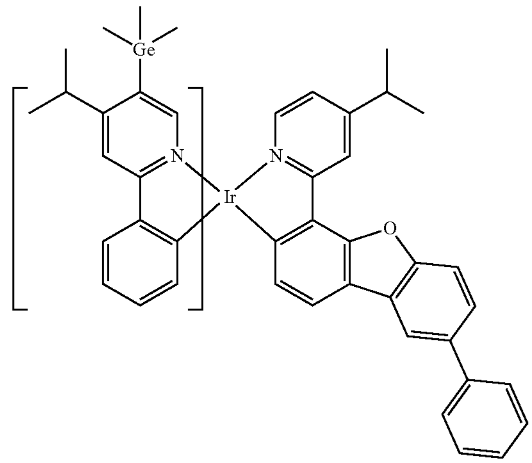
1174
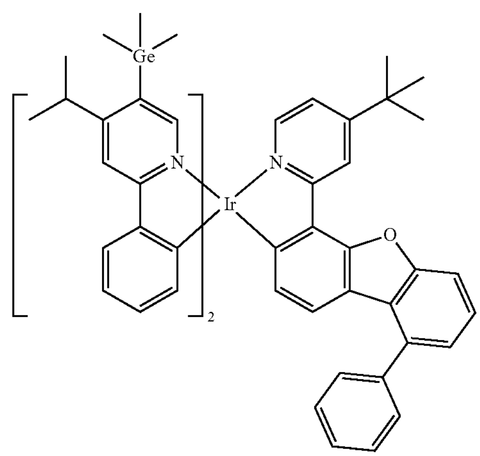
1175
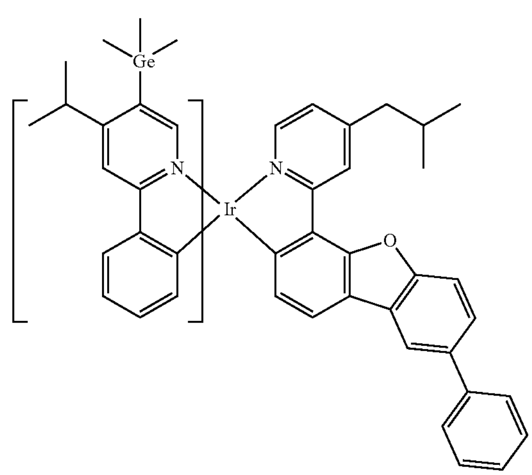

-continued
1176
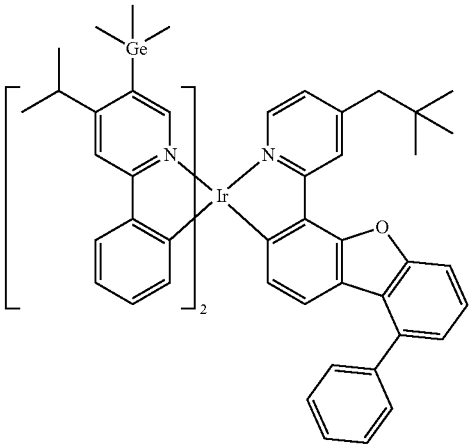
1177
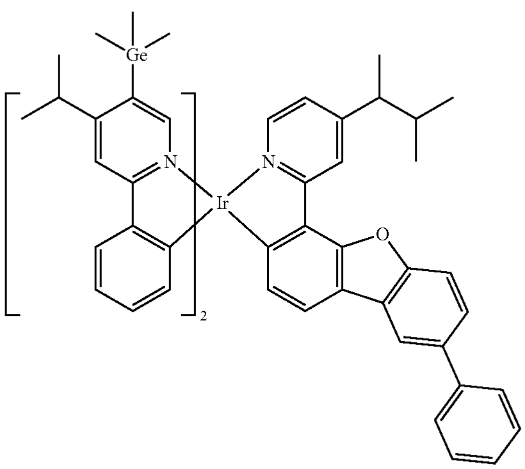
1178
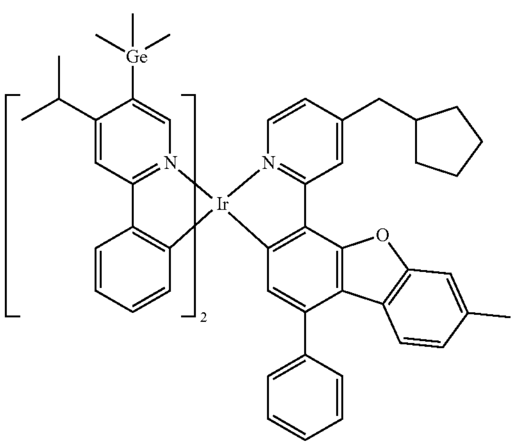
-continued
1179
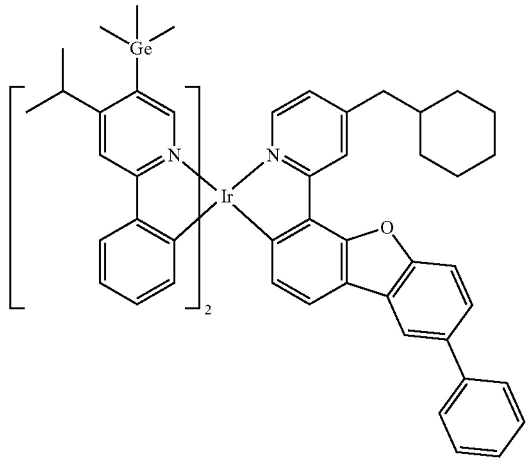
1180
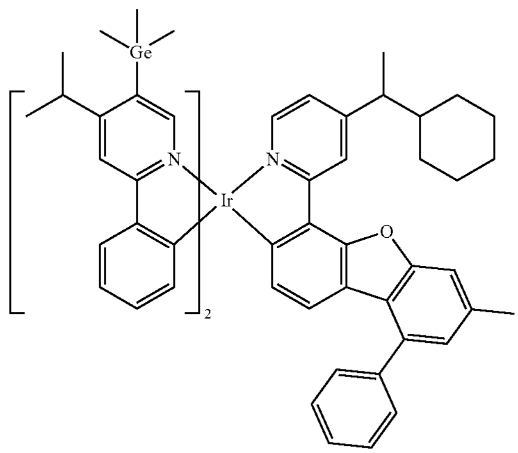
1181
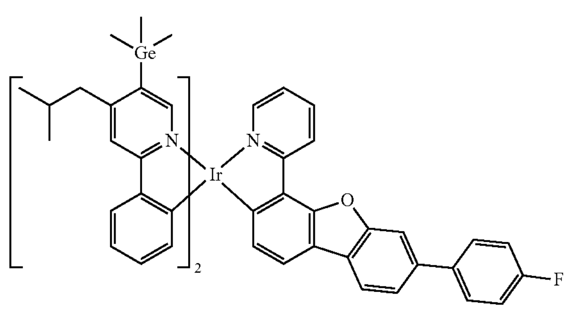
1182
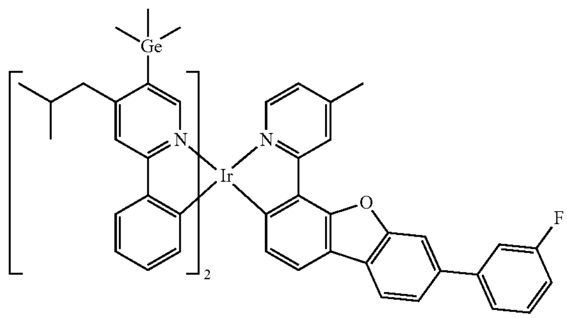

-continued
1183
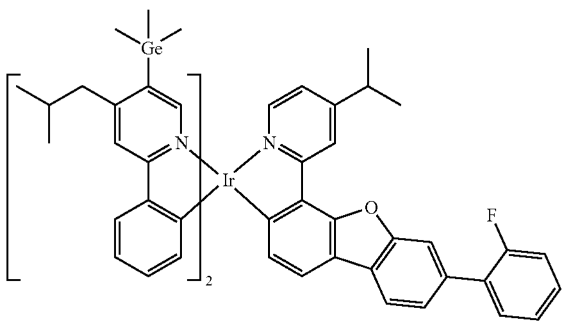
1184
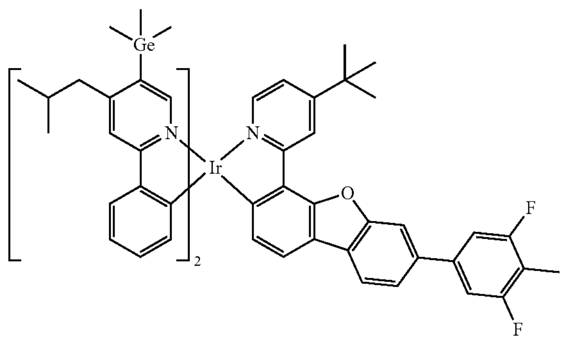
1185
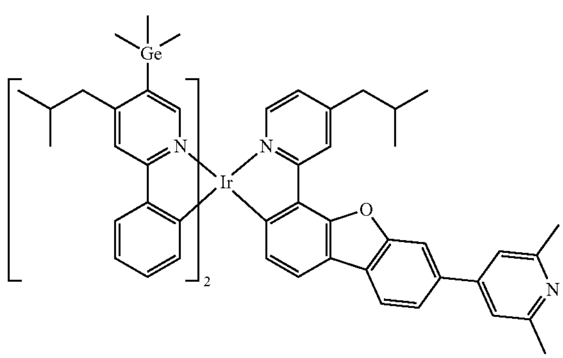
1186
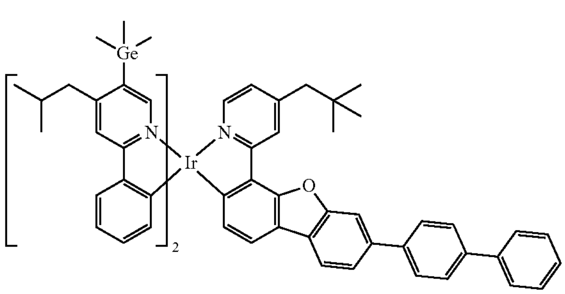
-continued
1187
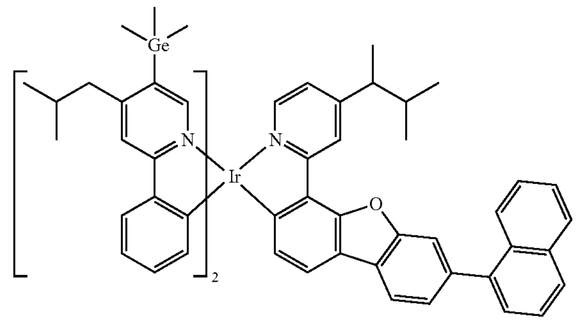
1188
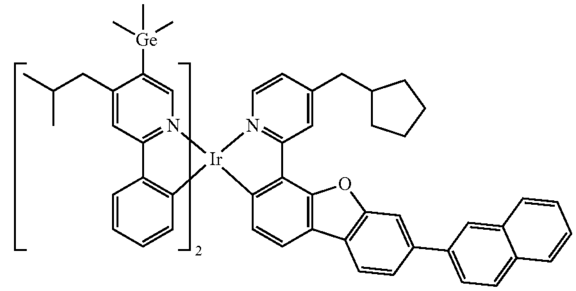
1189
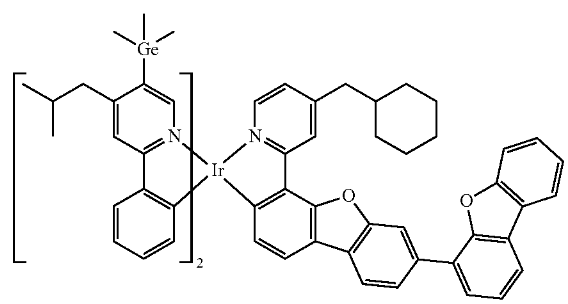
1190
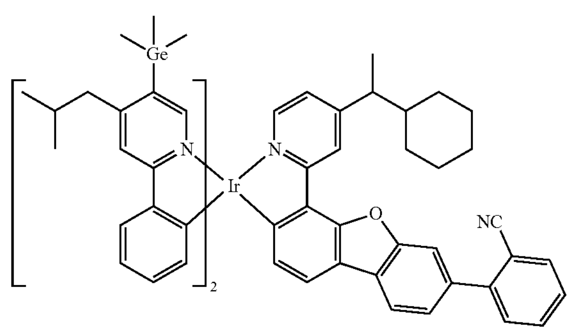
1191
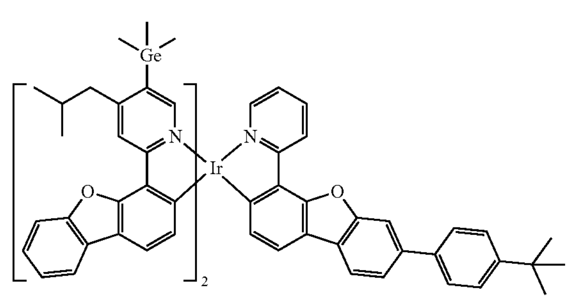

1192
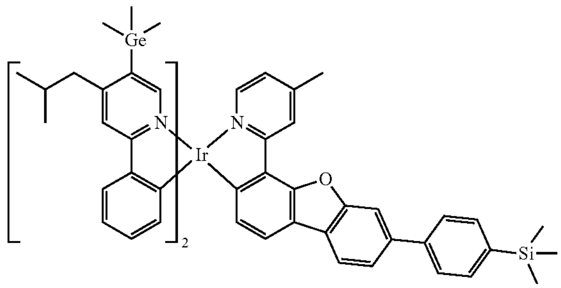
1193
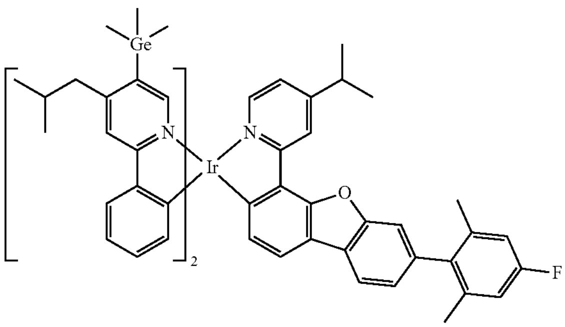
1194
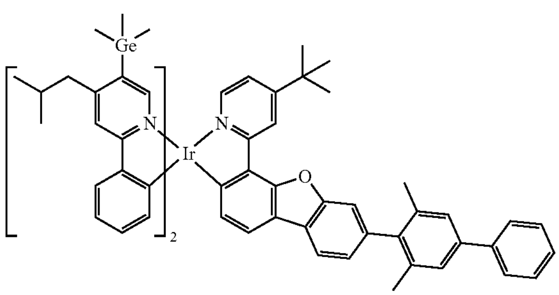
1195
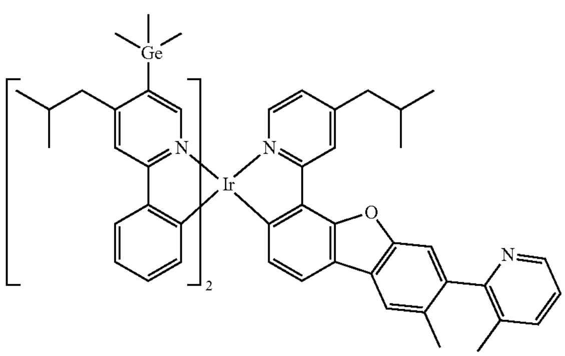
1196
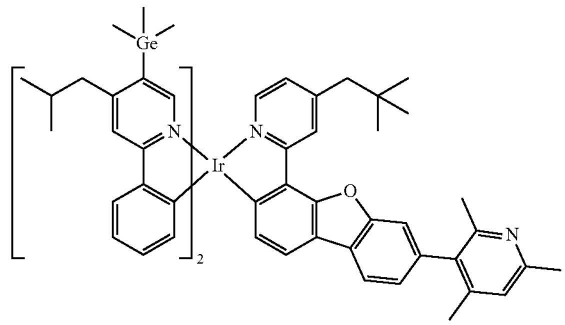
1197
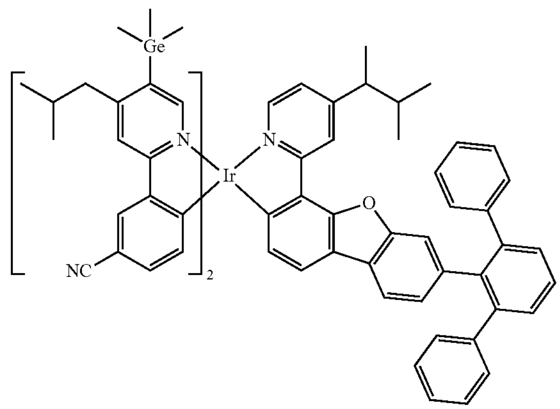
1198
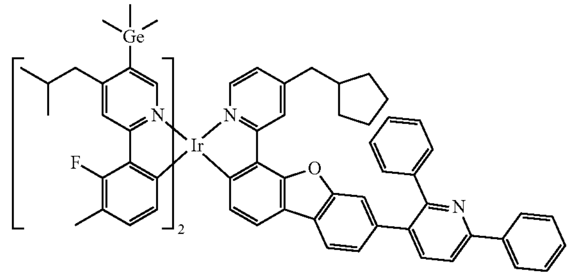
1199
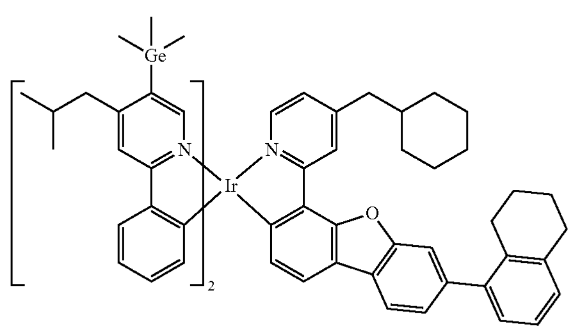

-continued
1200
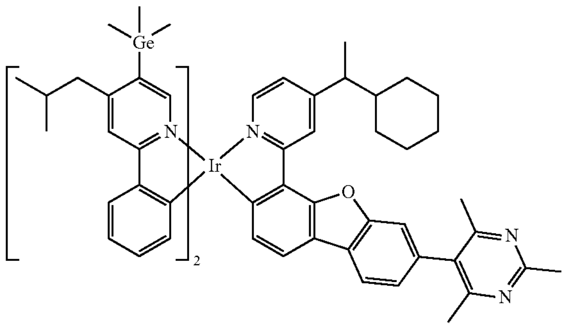
1201
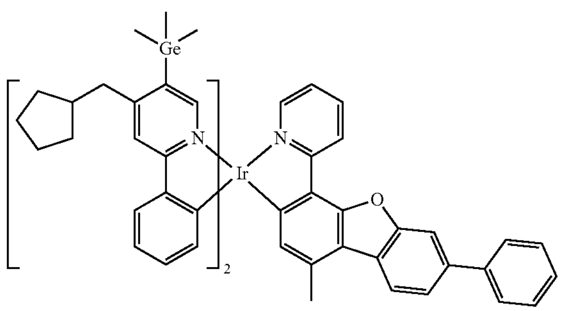
1202
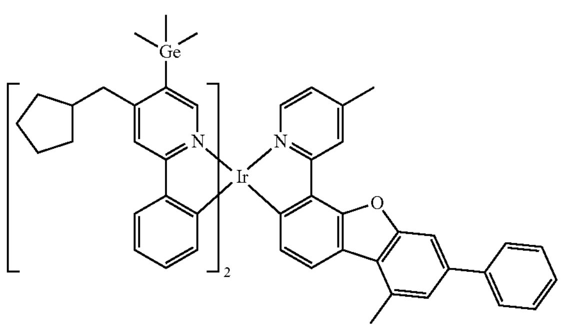
1203
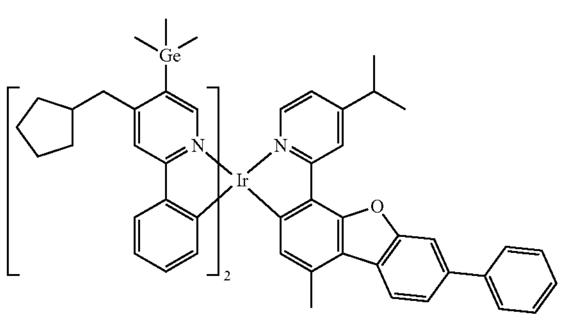
-continued
1204
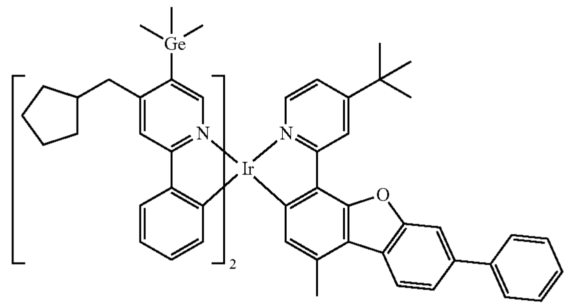
1205
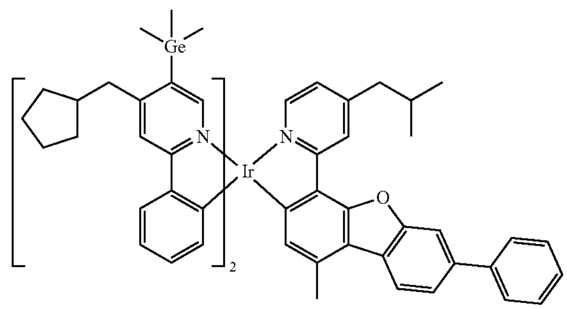
1206
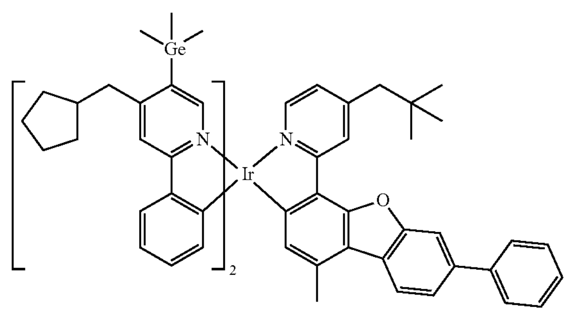
1207
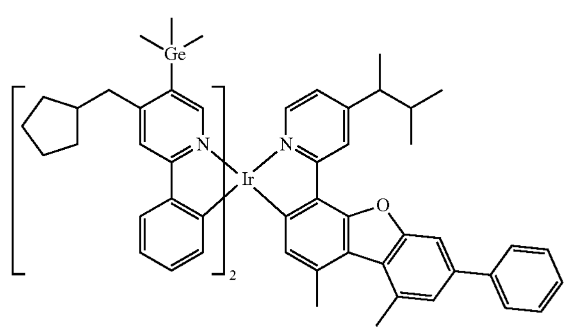

-continued
1208
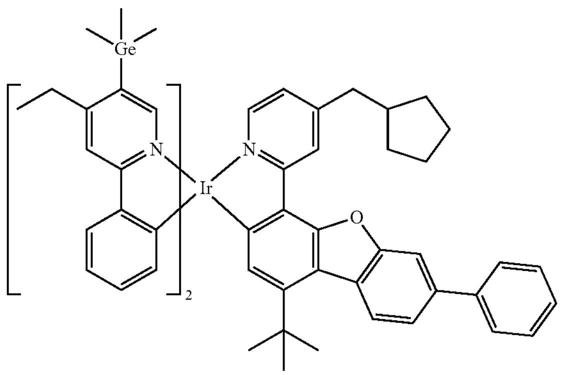
1209
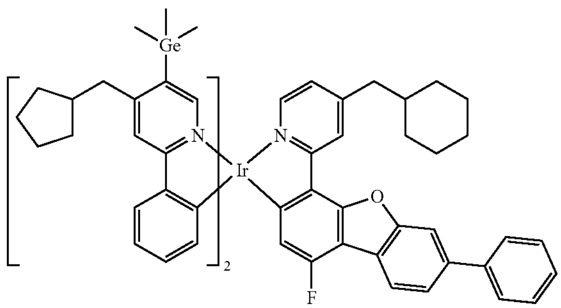
1210
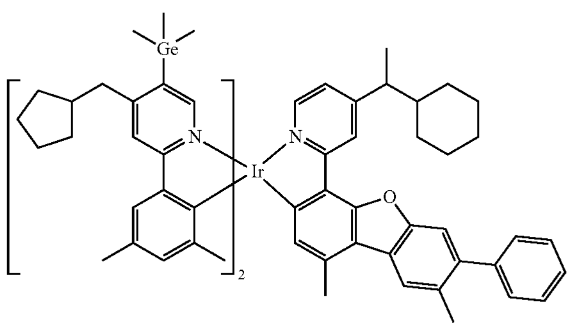
1211
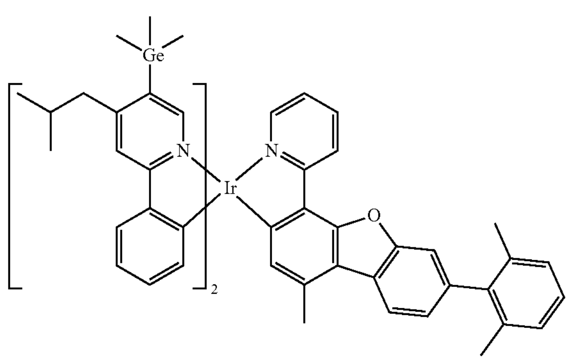
-continued
1212
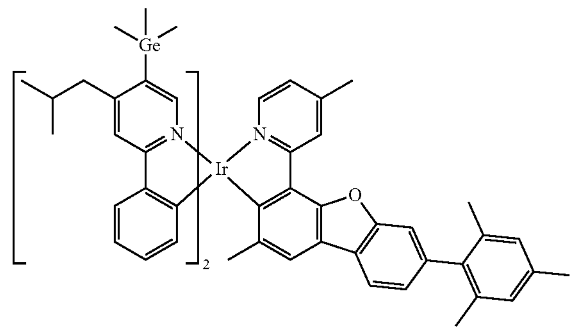
1213
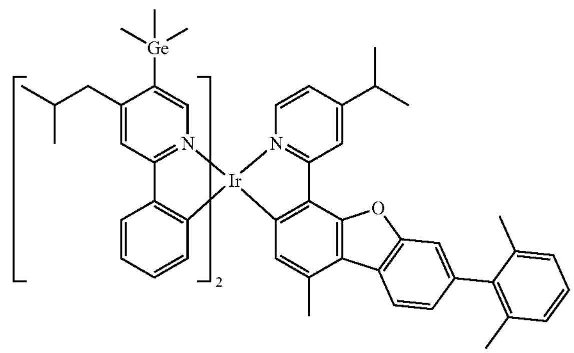
1214
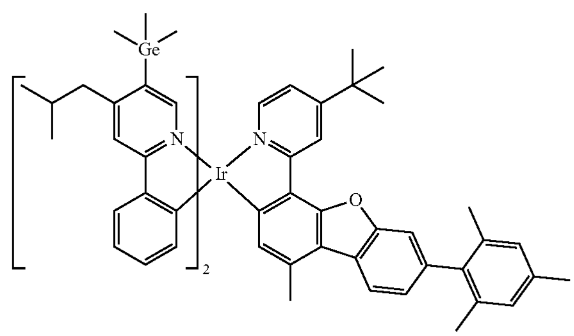
1215
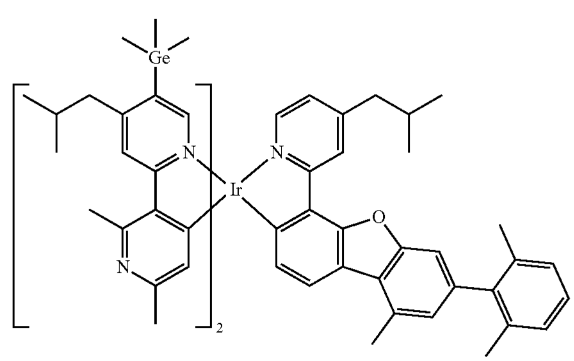

-continued
1216
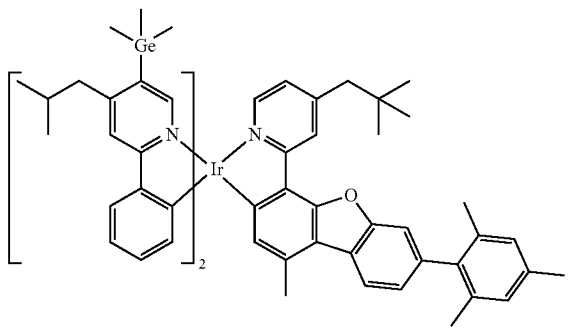
1217
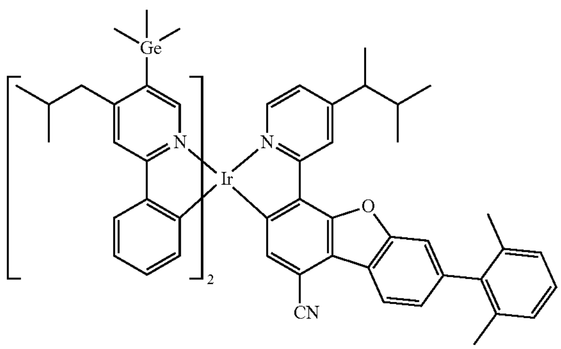
1218
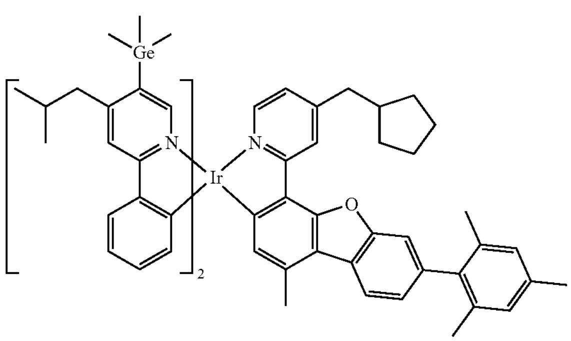
1219
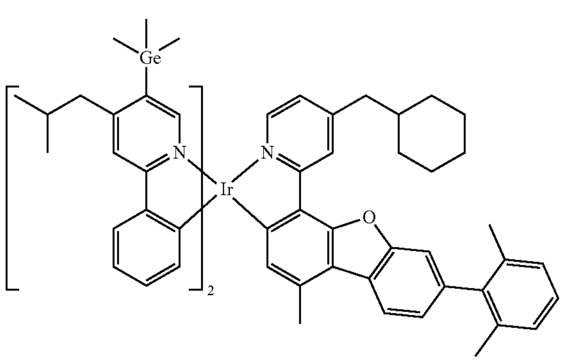
-continued
1220
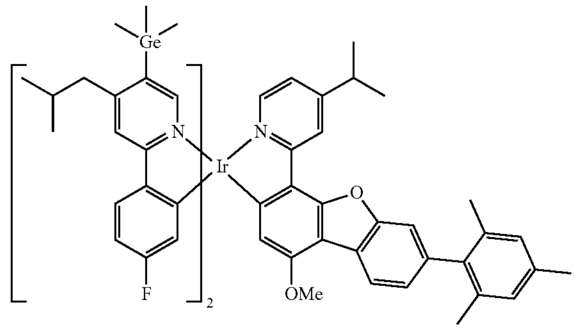
1221
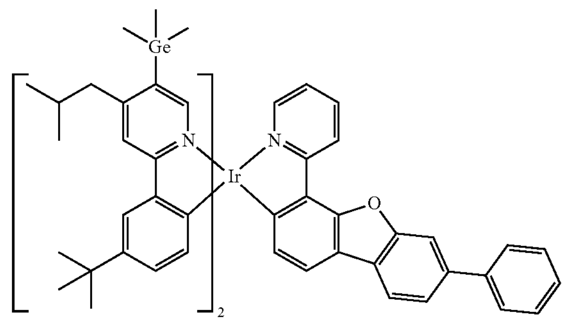
1222
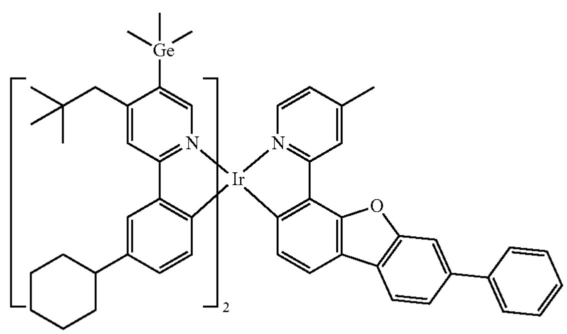
1223
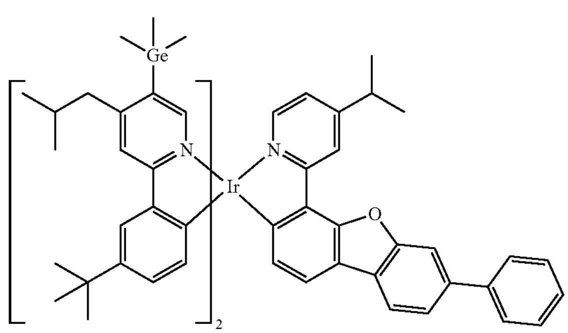

-continued
1224
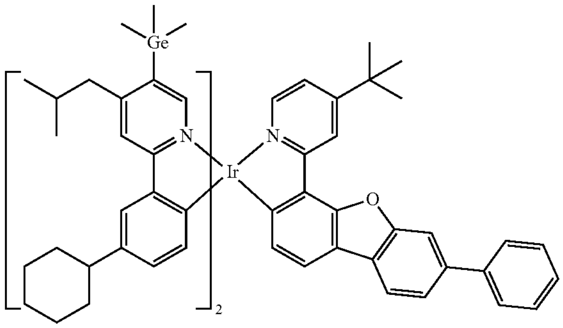
1225
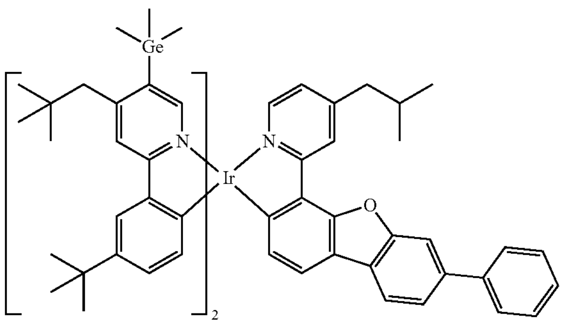
1226
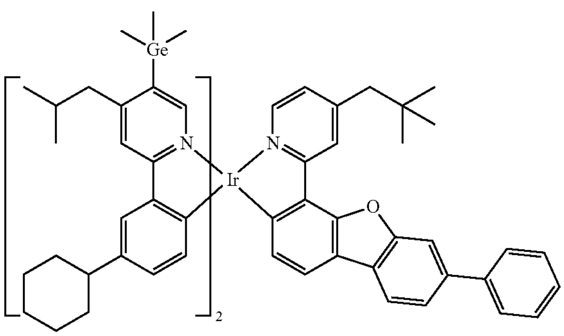
1227
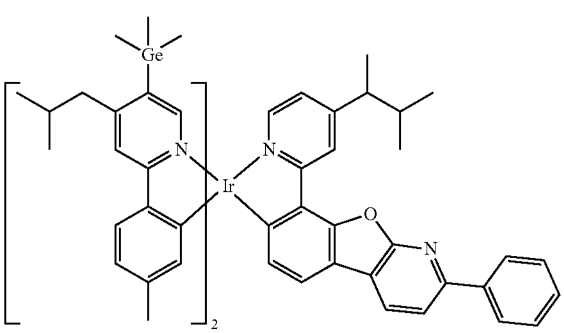
-continued
1228
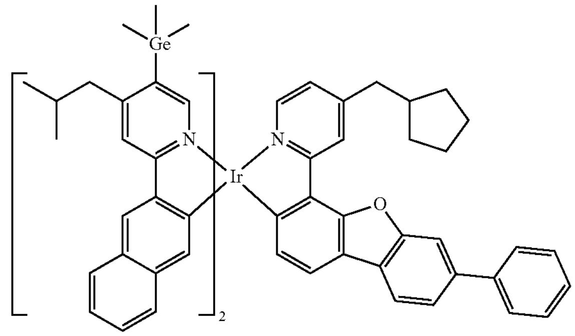
1229
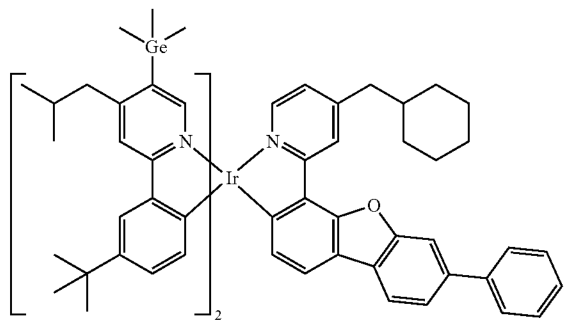
1230
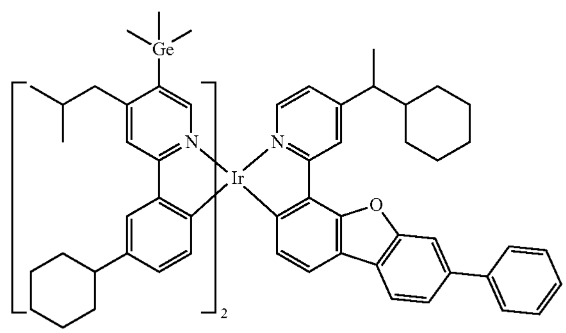
1231
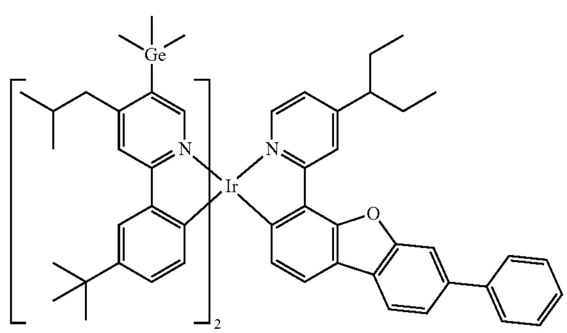

1232
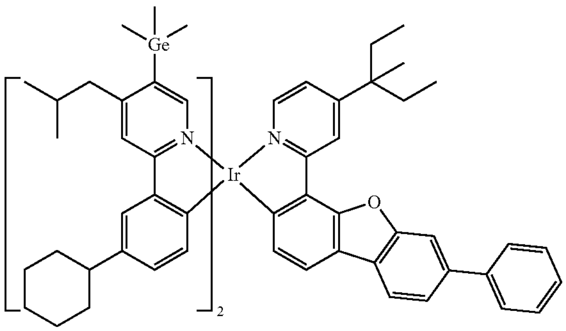
1233
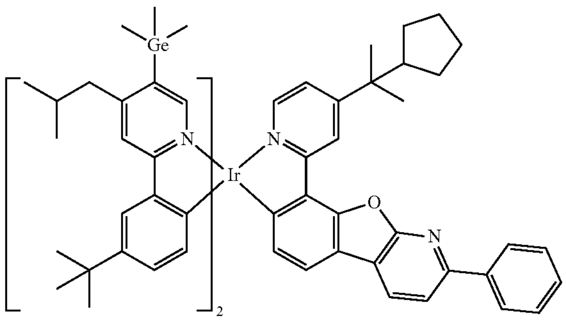
1234
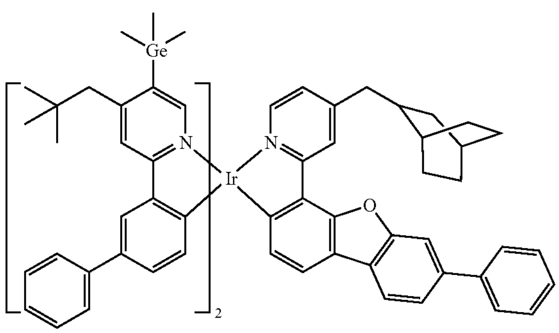
1235
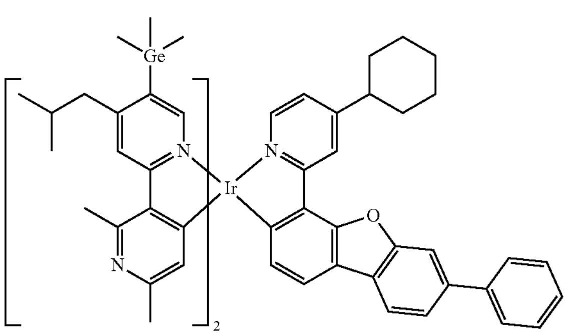
1236
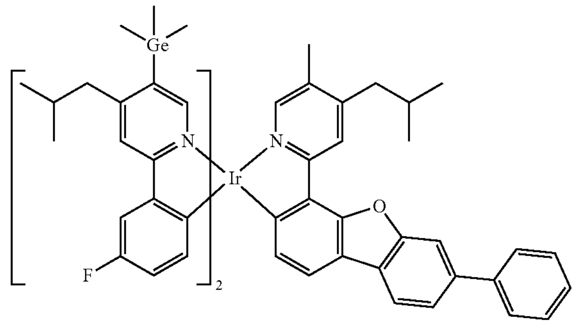
1237
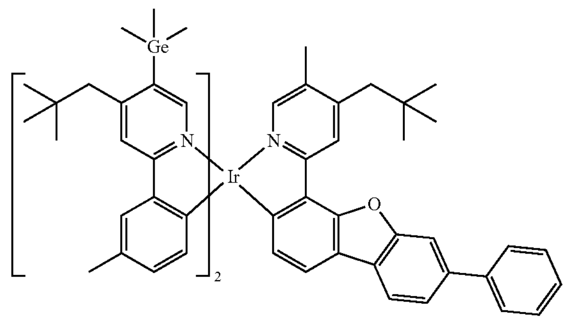
1238
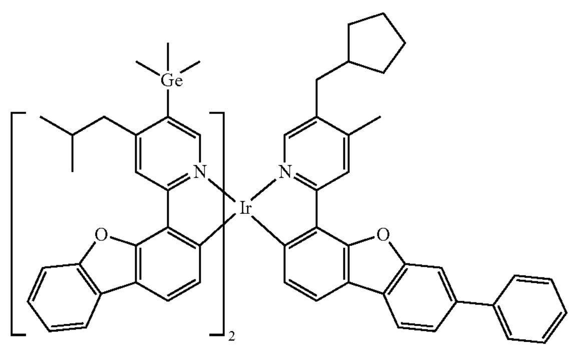
1239
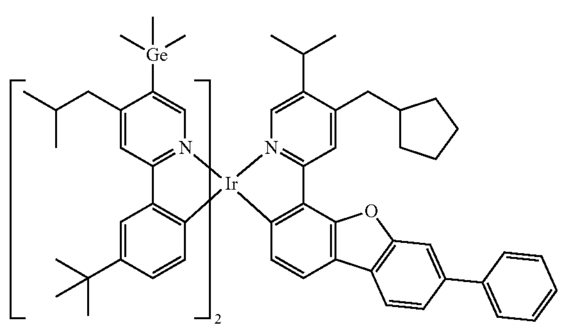

-continued
1240
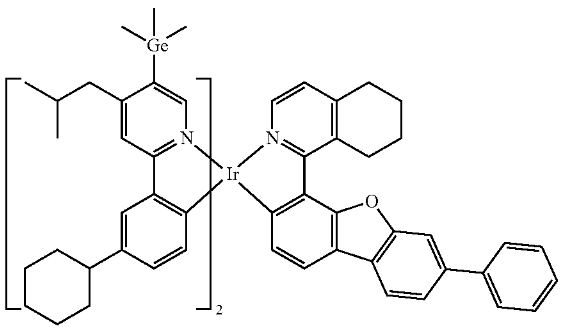
1241
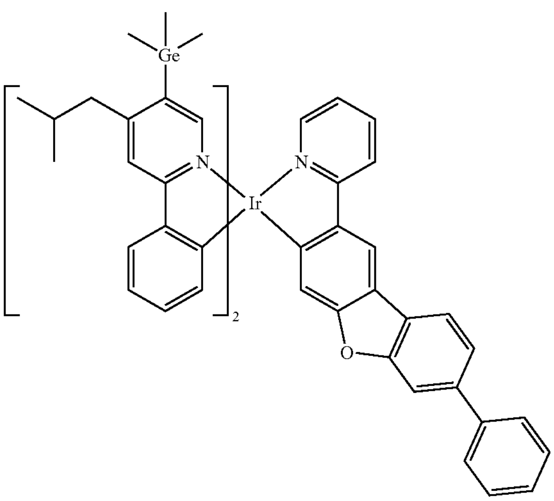
1242
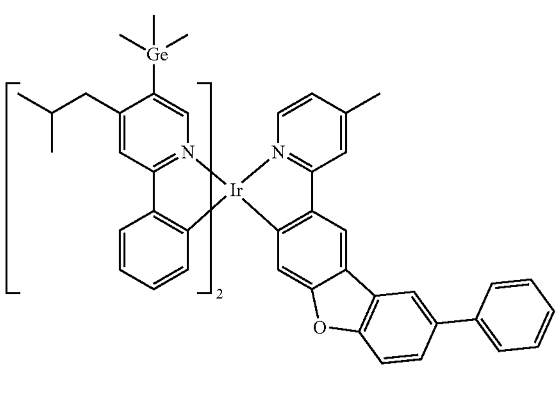
-continued
1243
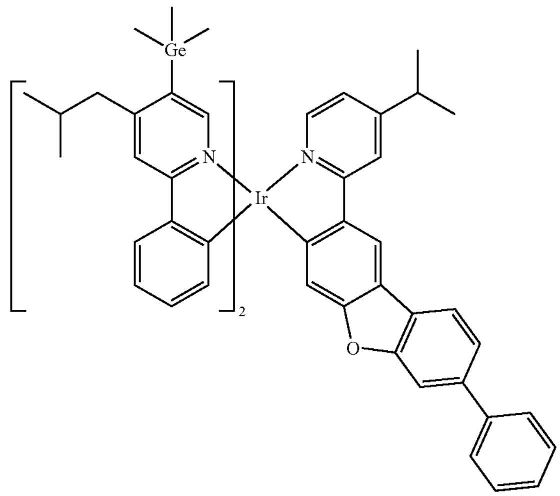
1244
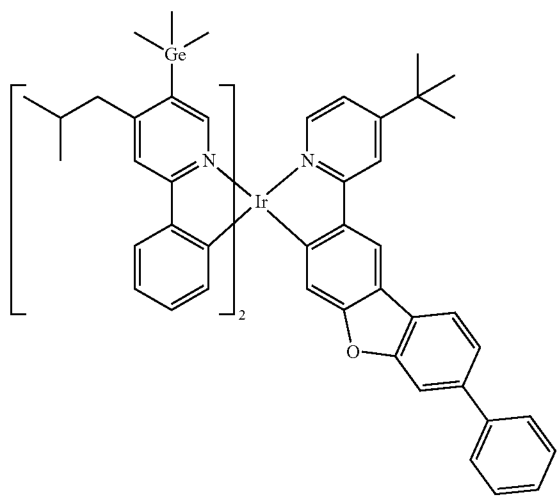
1245
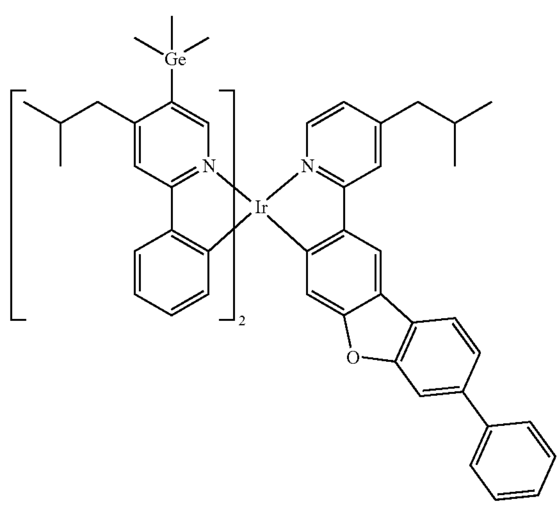

-continued
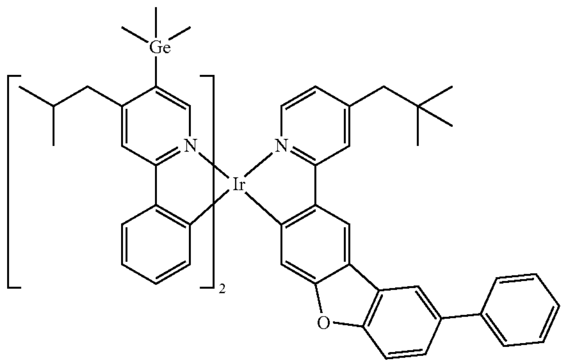
1246
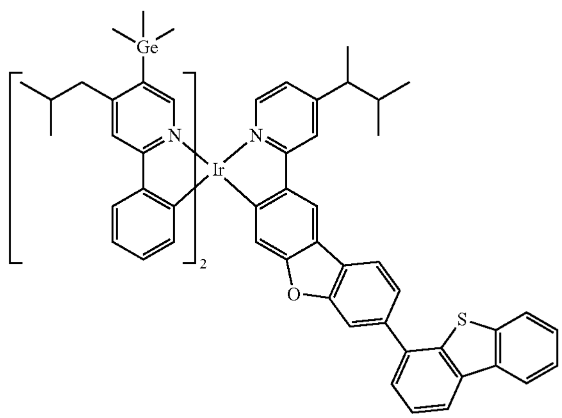
1247
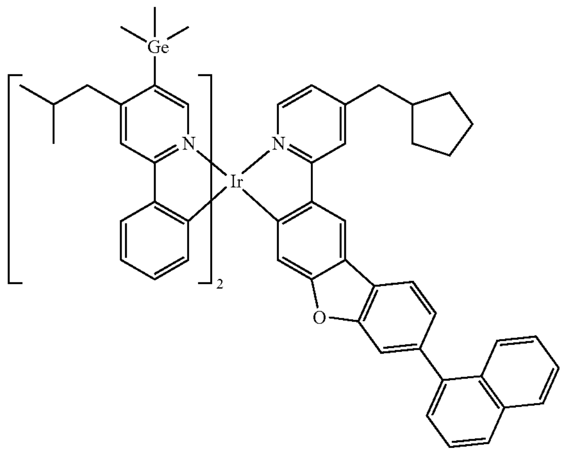
1248
-continued
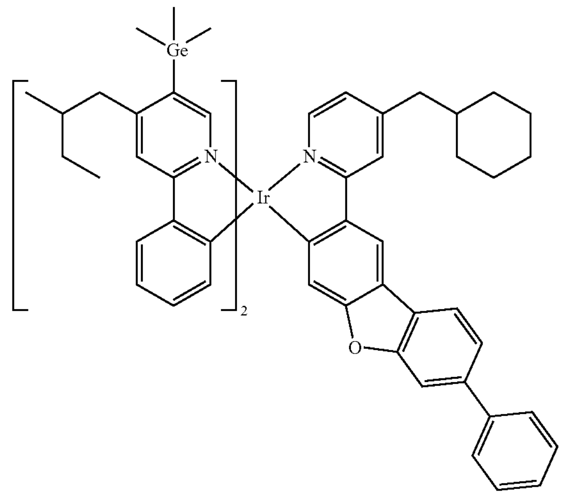
1249
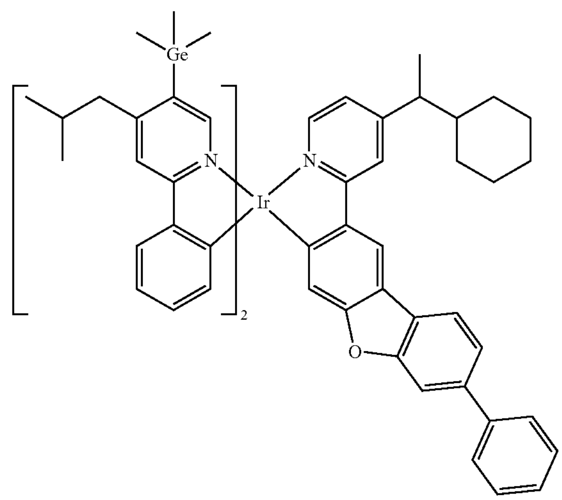
1250
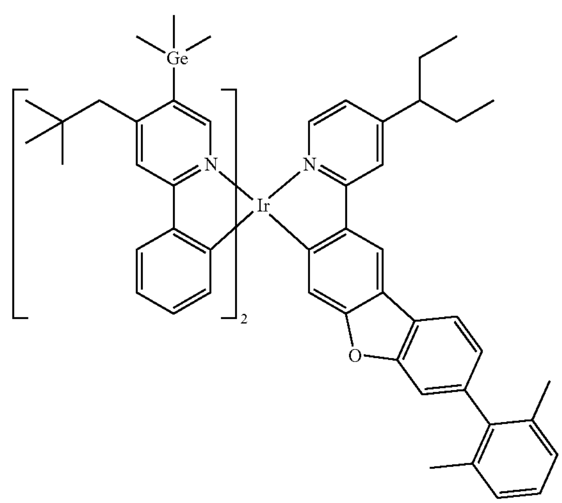
1251

-continued
1252
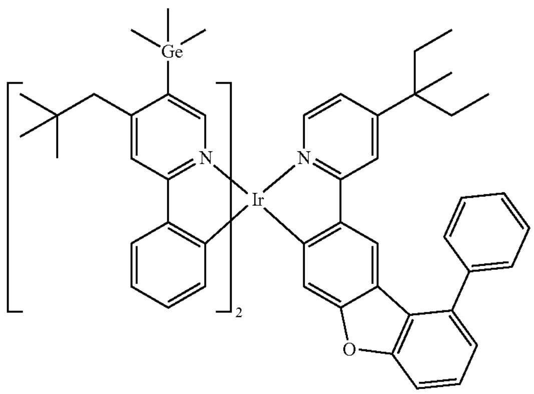
1253
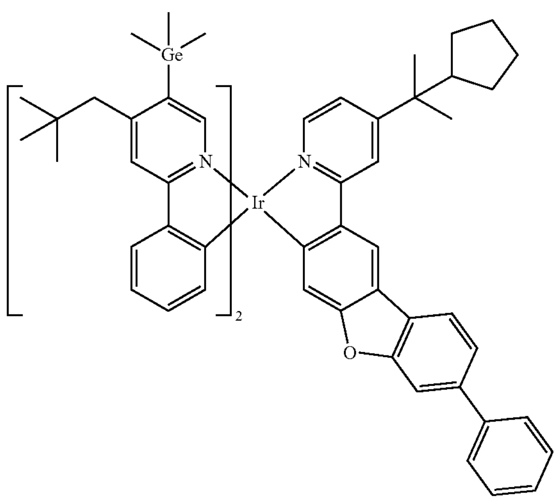
1254
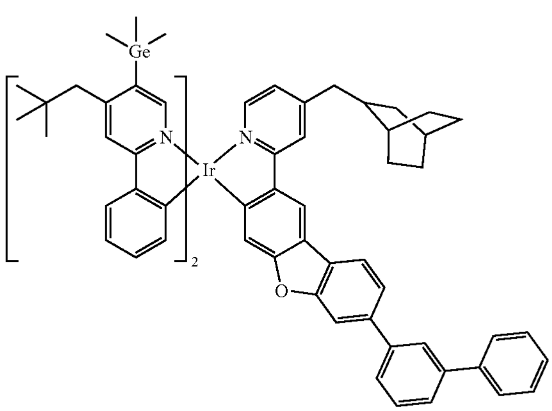
-continued
1255
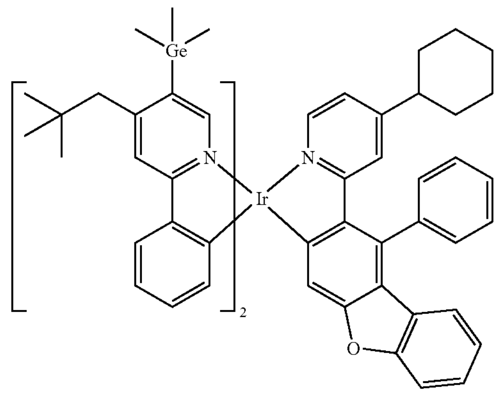
1256
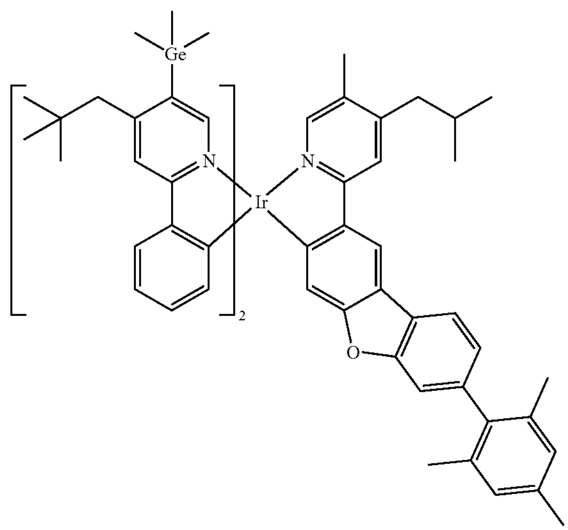
1257
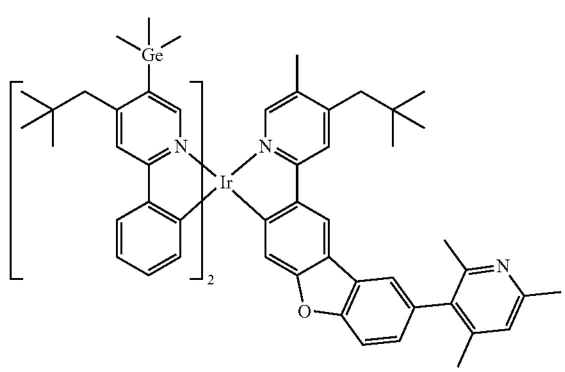

-continued
1258
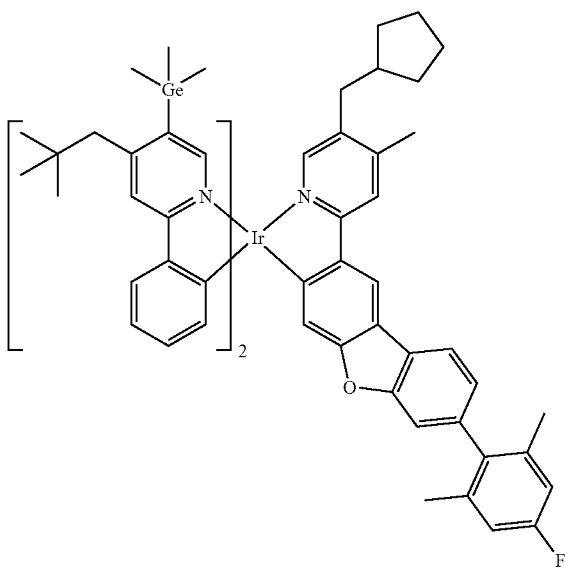
1259
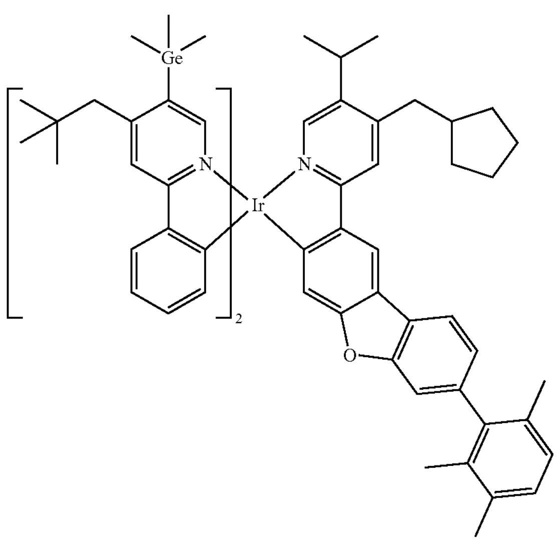
1260
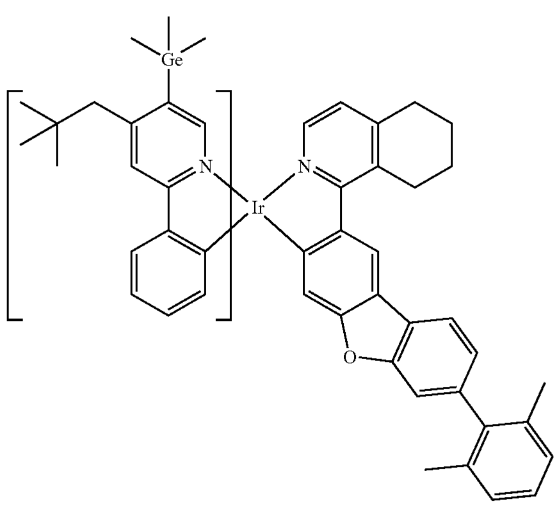
-continued
1261
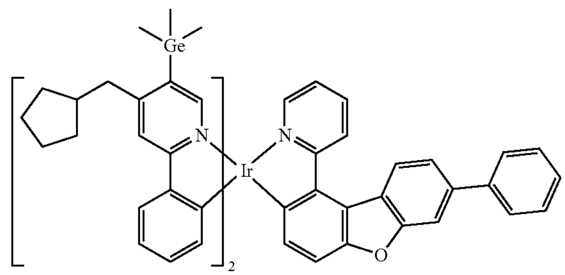
1262
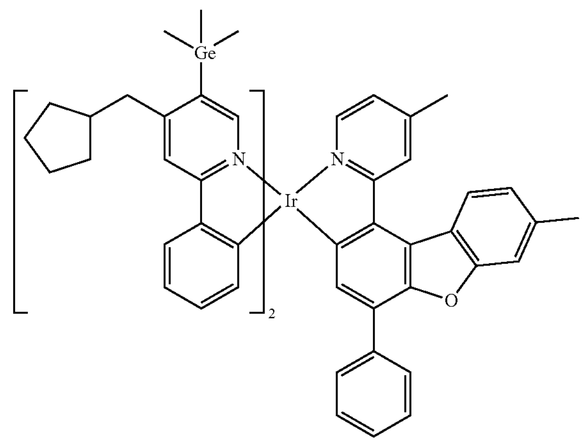
1263
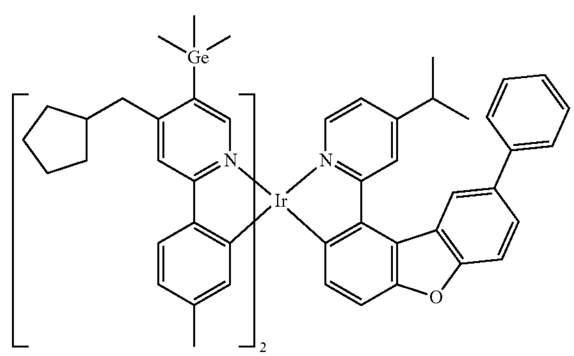
1264
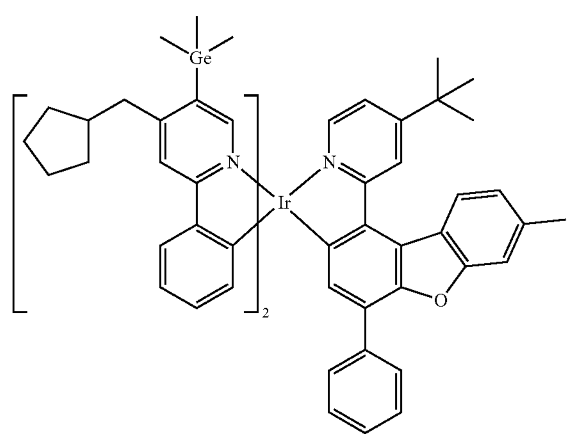

1265
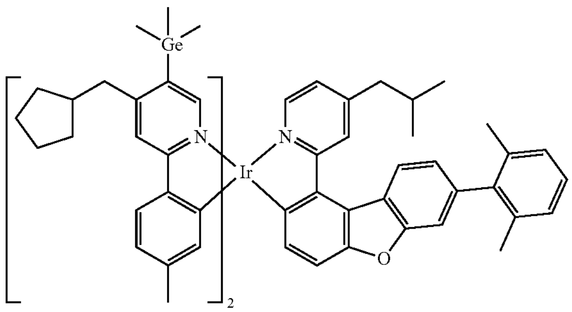
1266
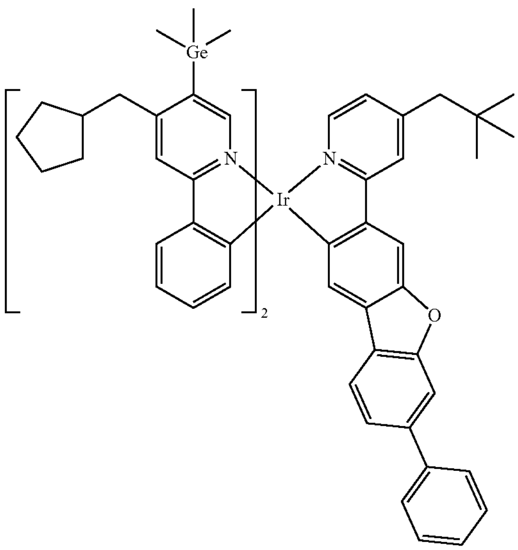
1267
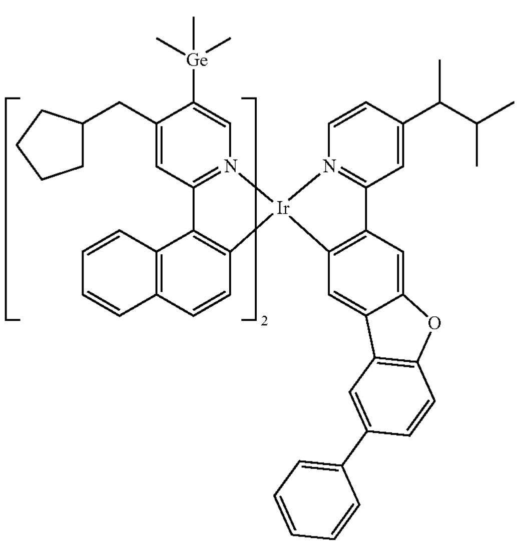
1268
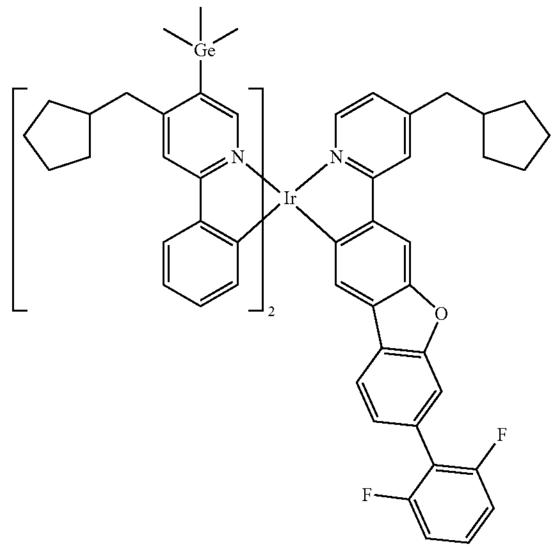
1269
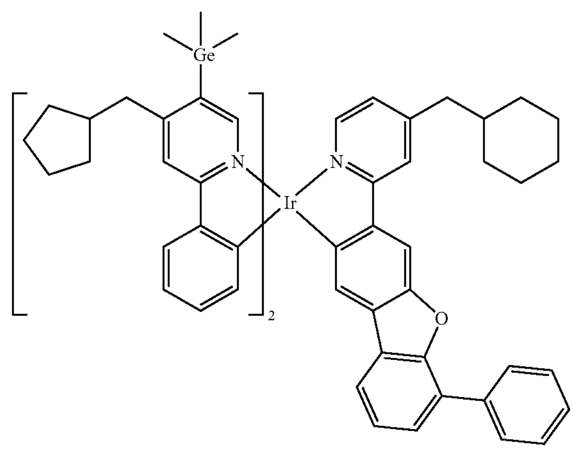
1270
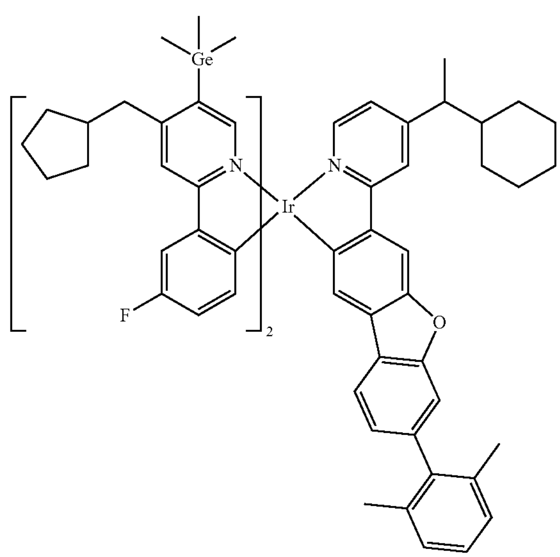

-continued
1271
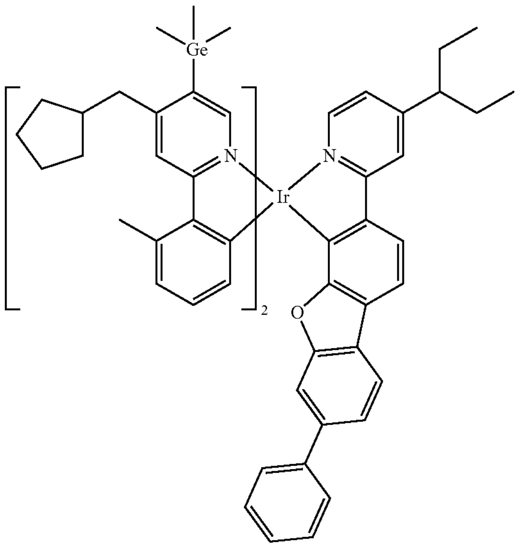
1272
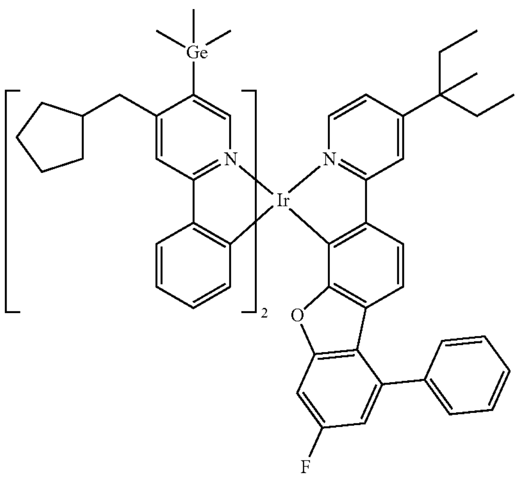
1273
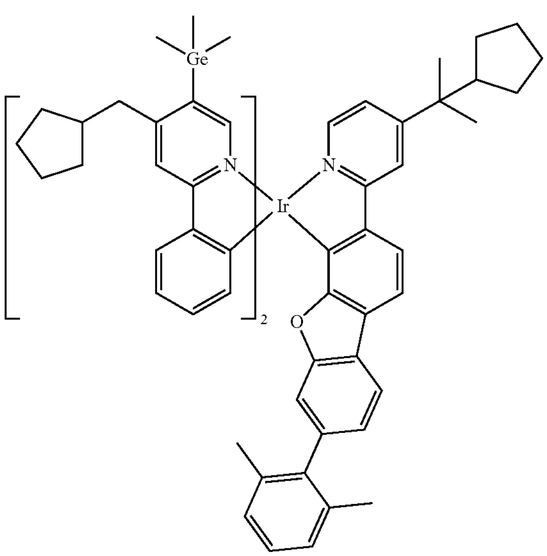
-continued
1274
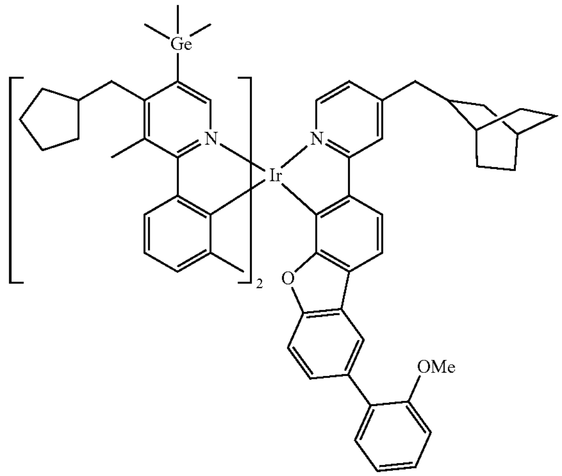
1275
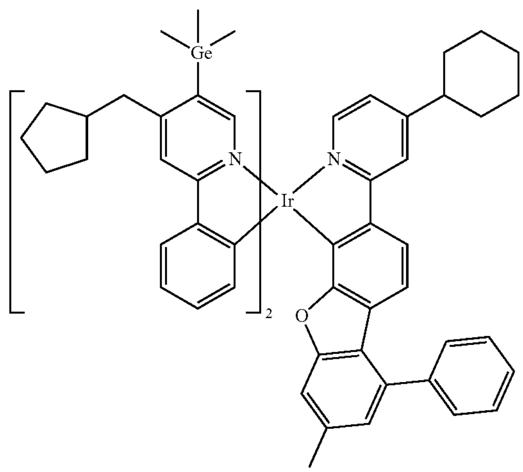
1276
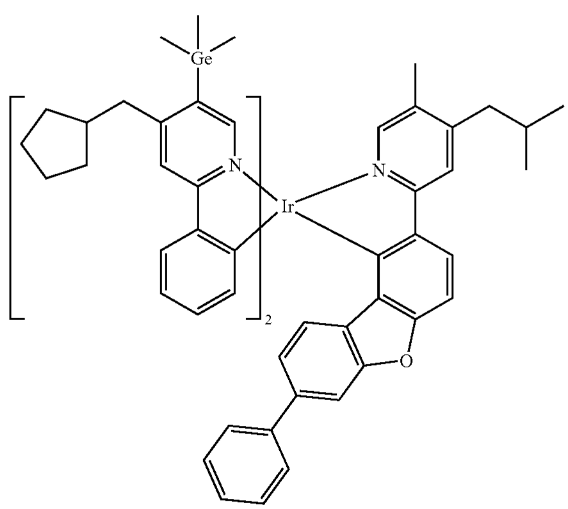

-continued
1277
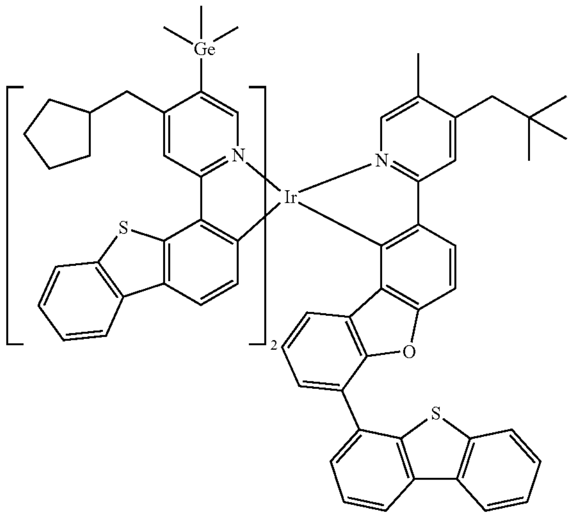
1278
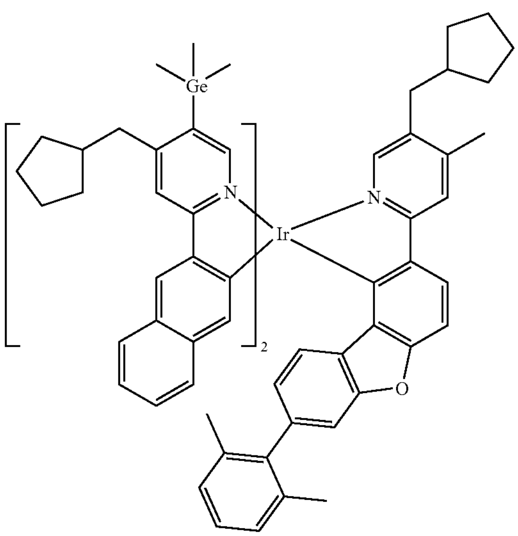
1279
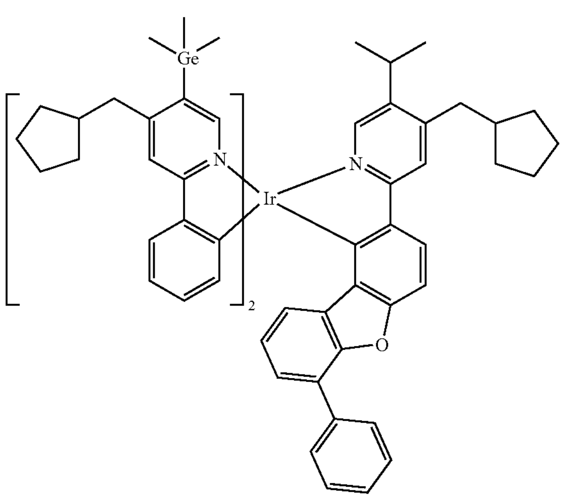
-continued
1280
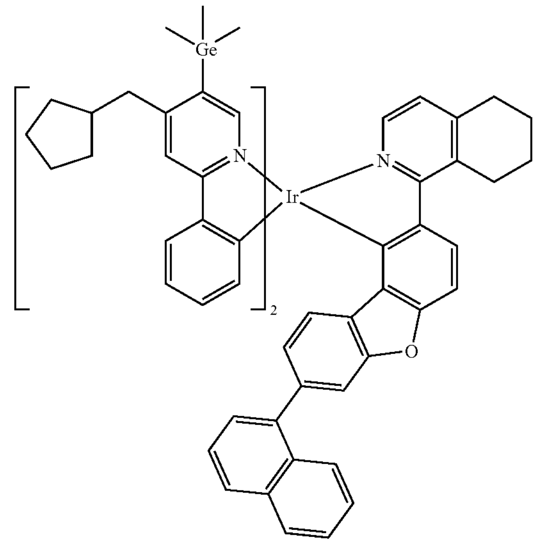
1281
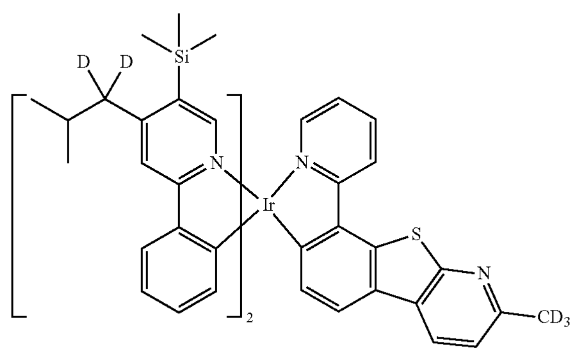
1282
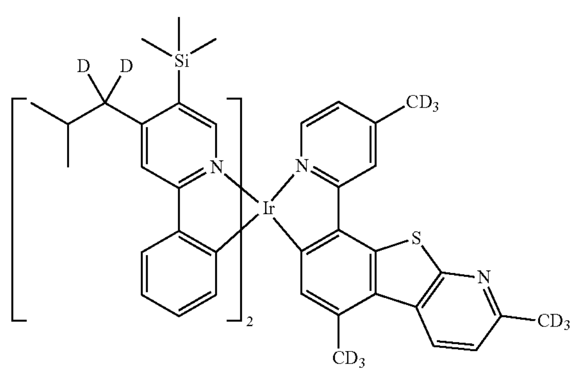

-continued
1283
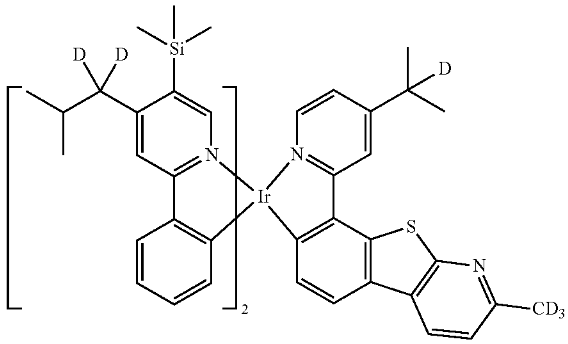
1284
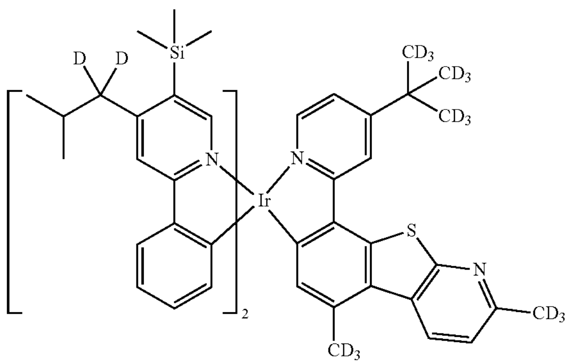
1285
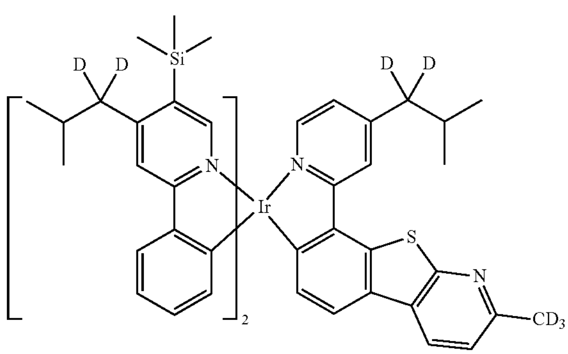
1286
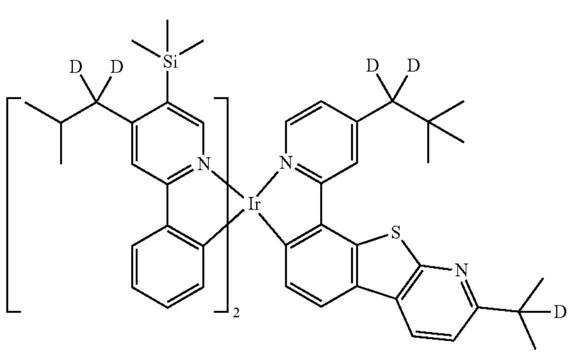
-continued
1287
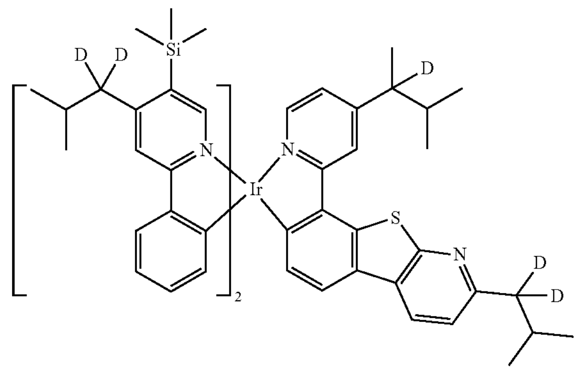
1288
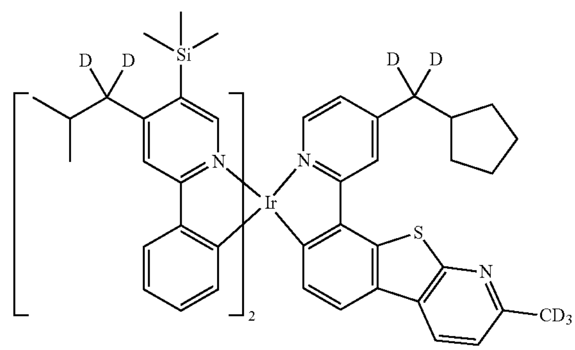
1289
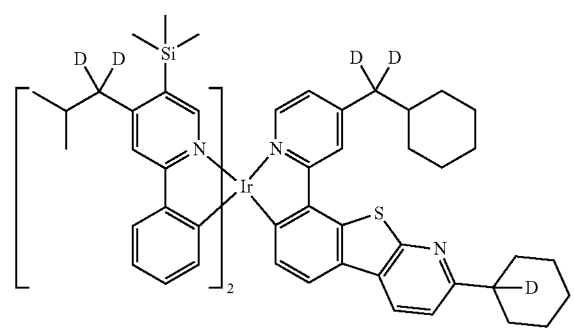
1290
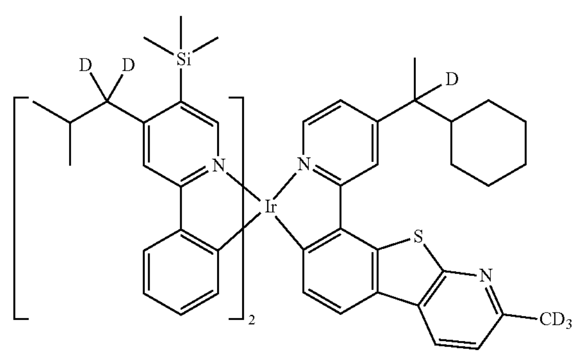

-continued
1291
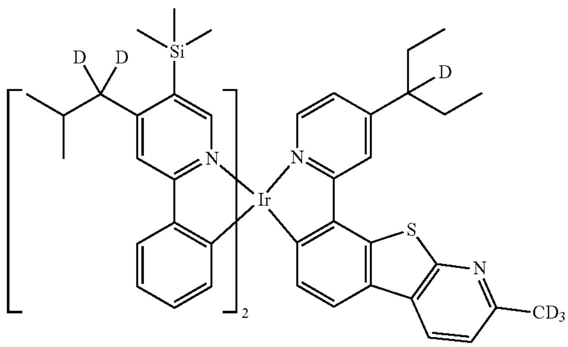
1292
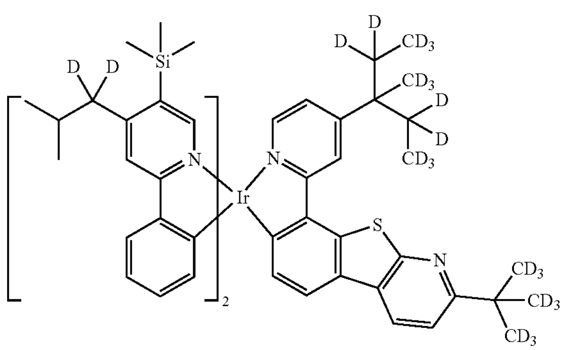
1293
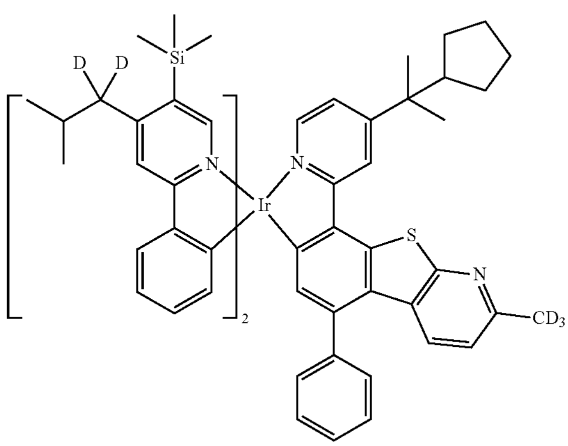
1294
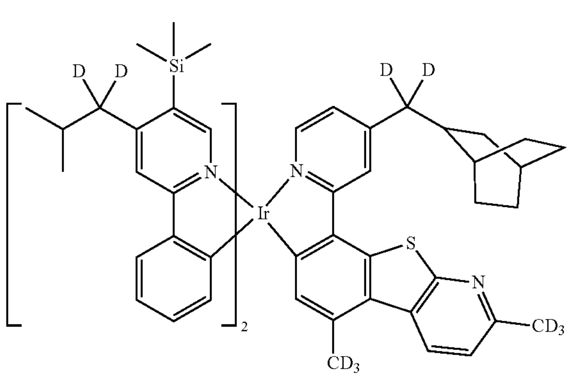
-continued
1295
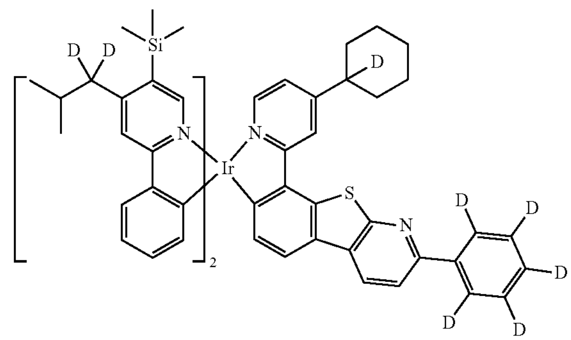
1296
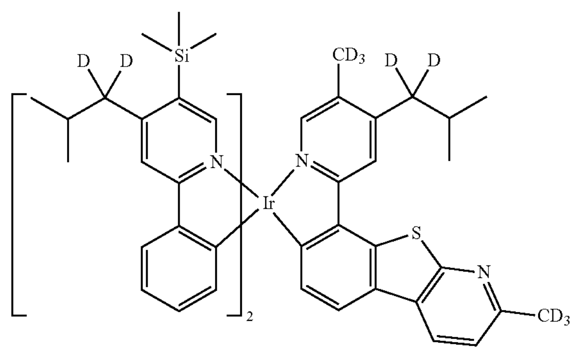
1297
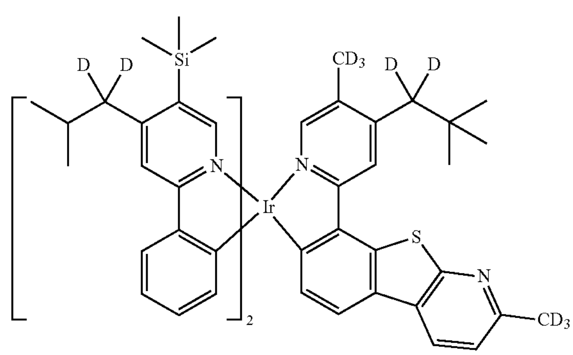
1298
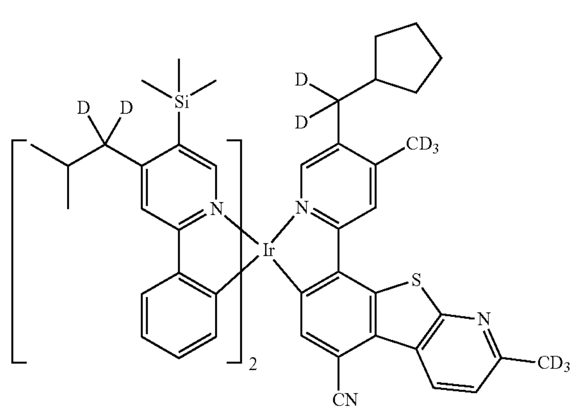

1299
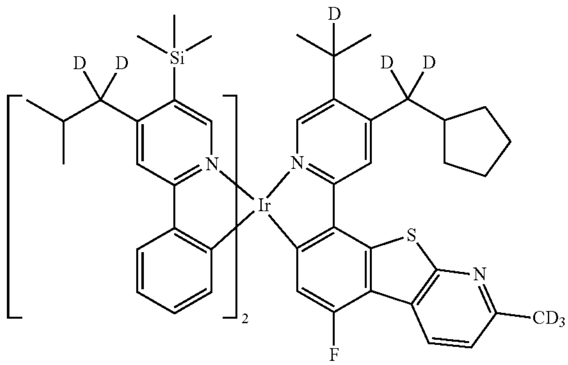
1300
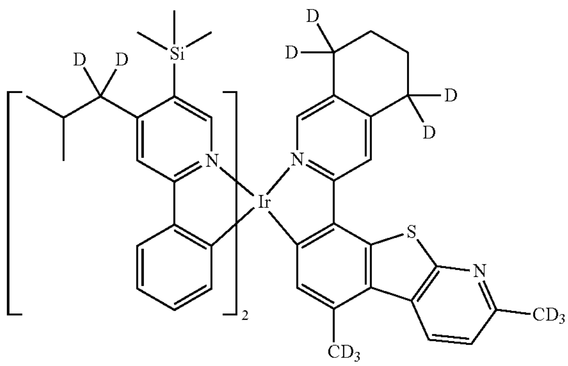
1301
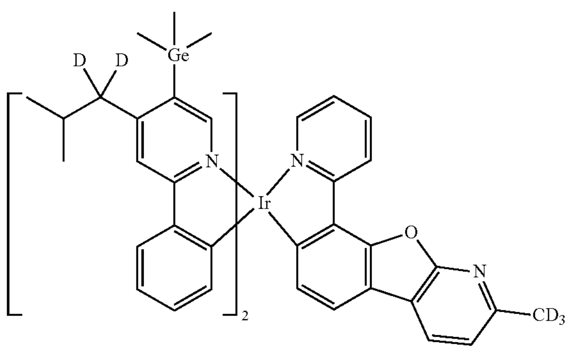
1302
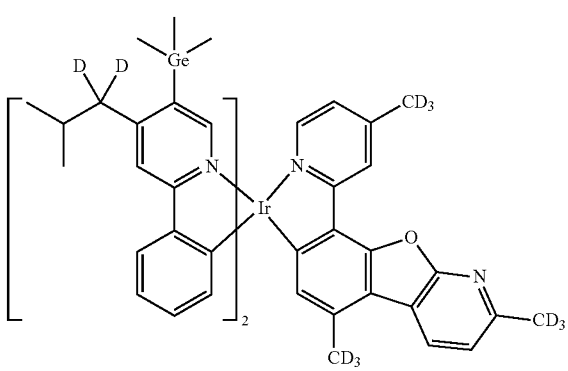
1303
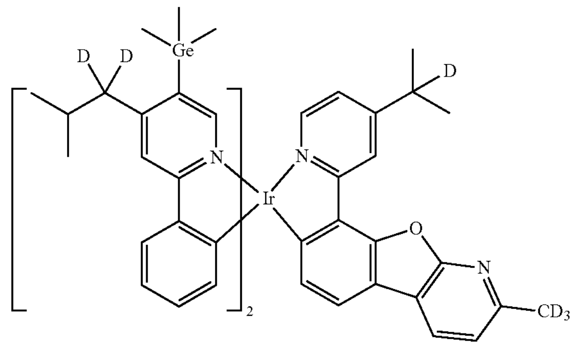
1304
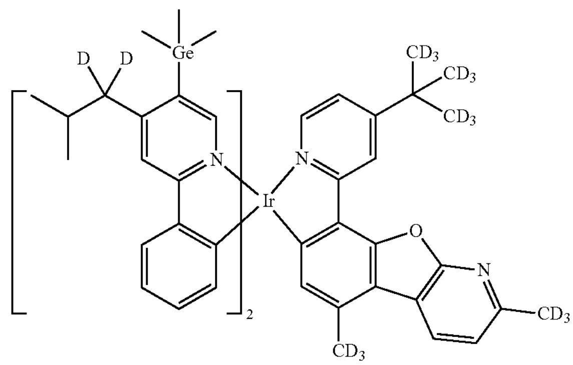
1305
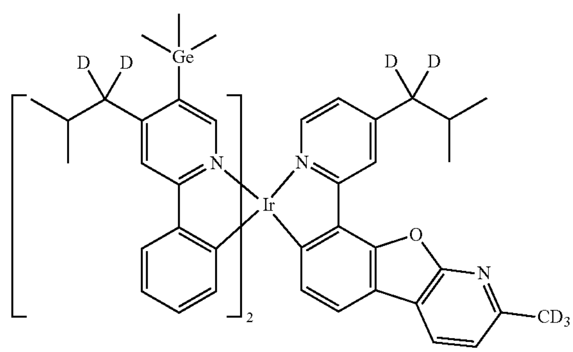
1306
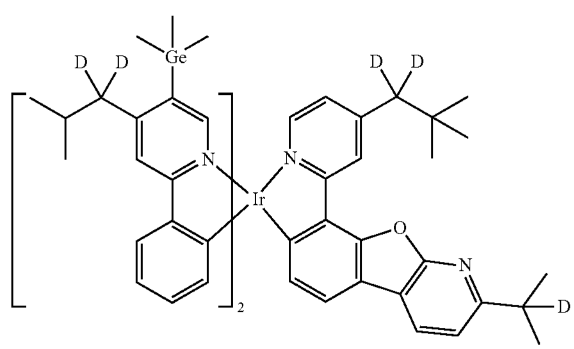

-continued
1307
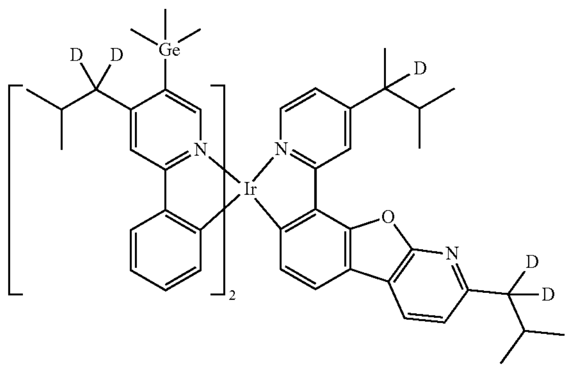
1308
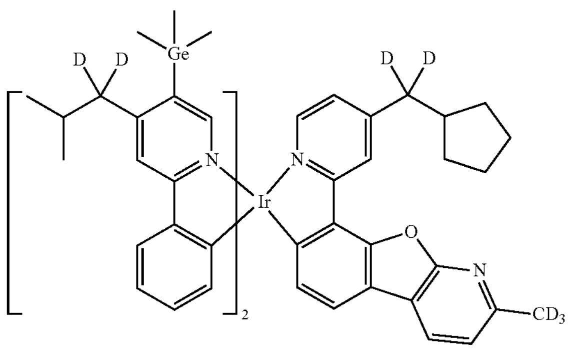
1309
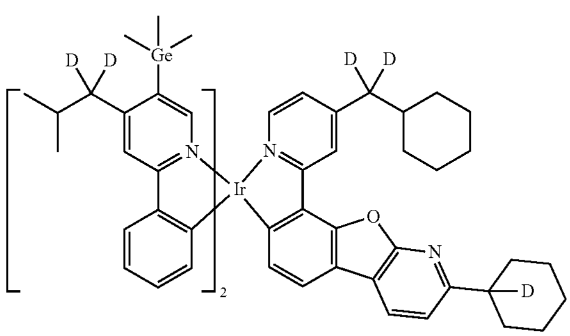
1310
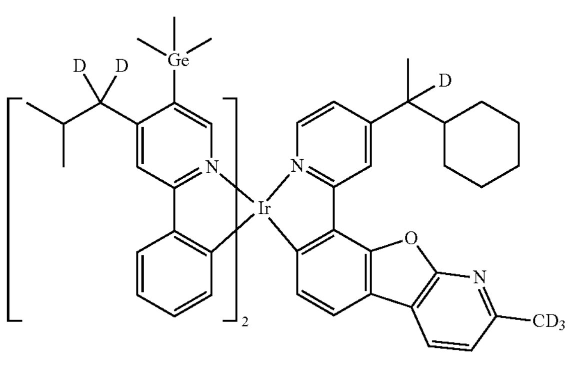
-continued
1311
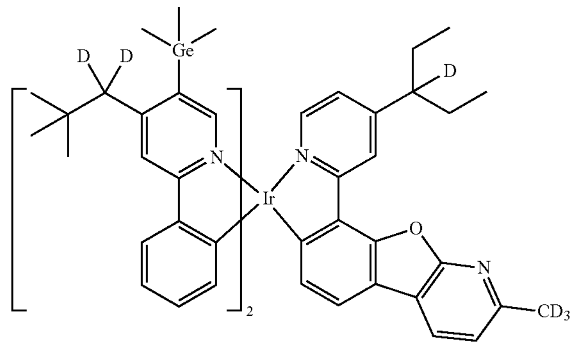
1312
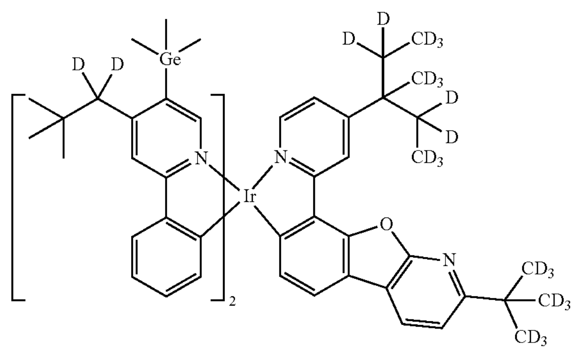
1313
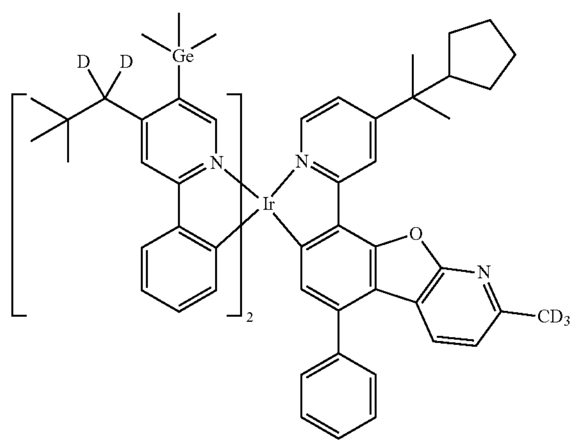
1314
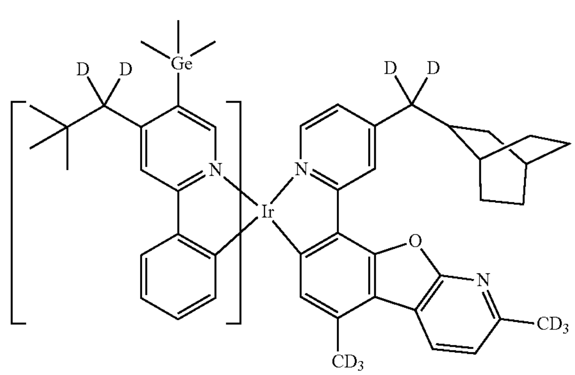

1315
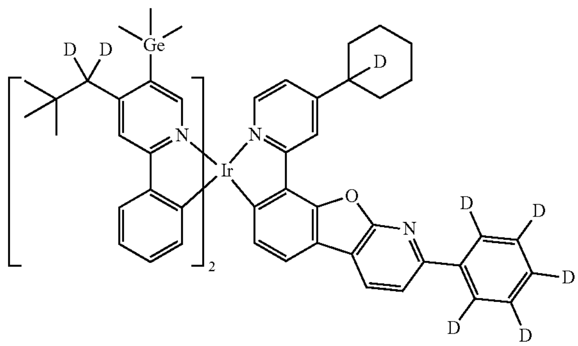
1316
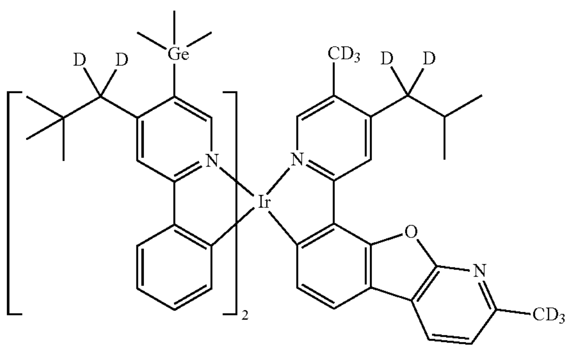
1317
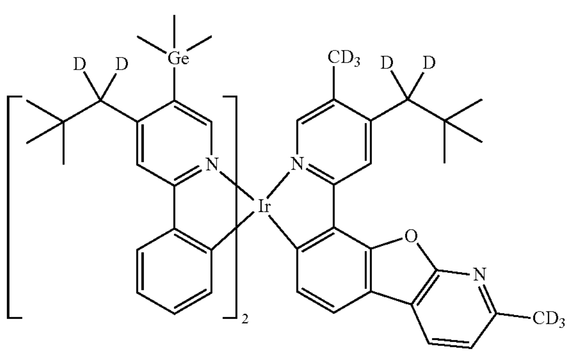
1318
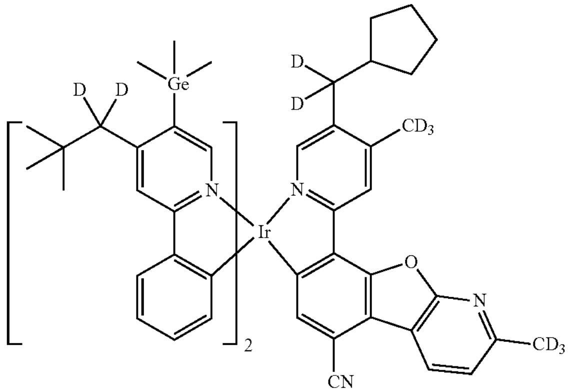
1319
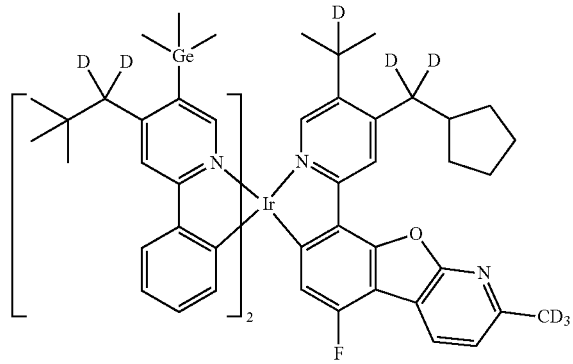
1320
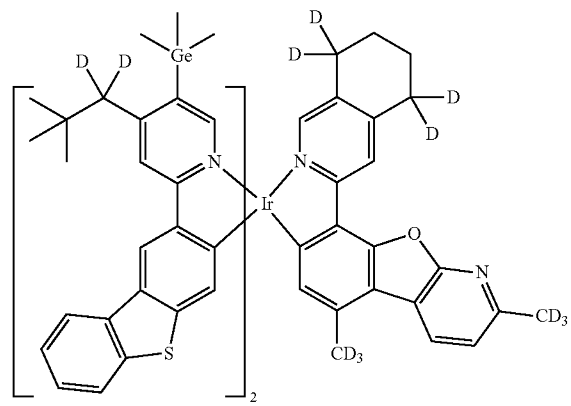
1321
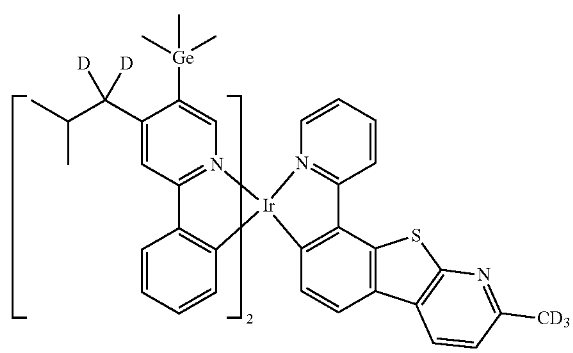
1322
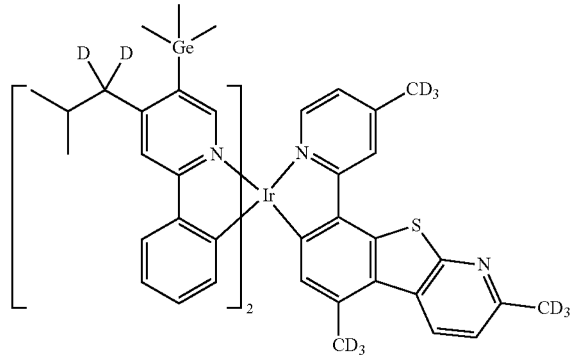

1323
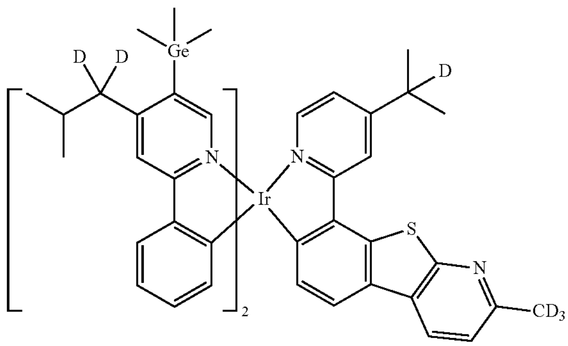
1324
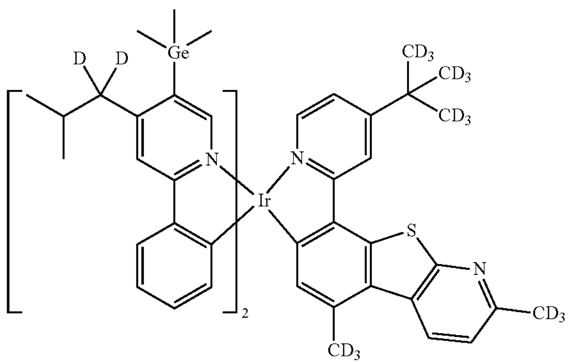
1325
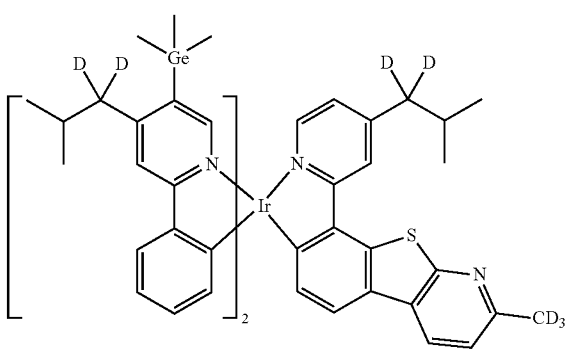
1326
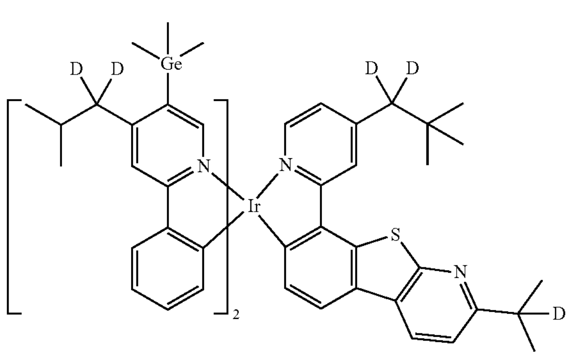
1327
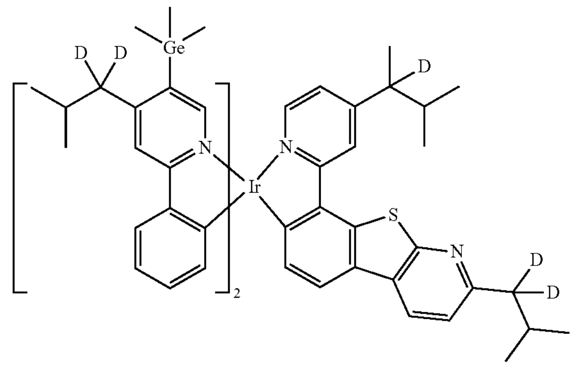
1328
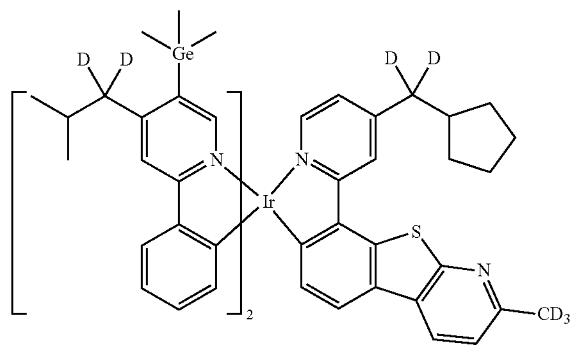
1329
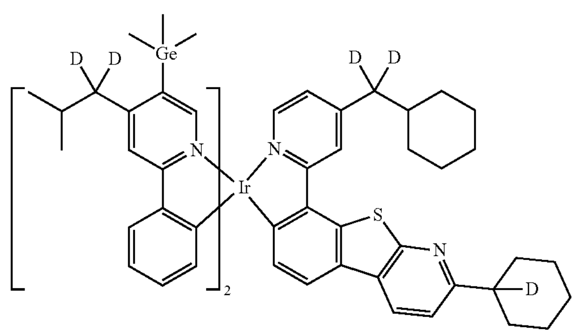
1330
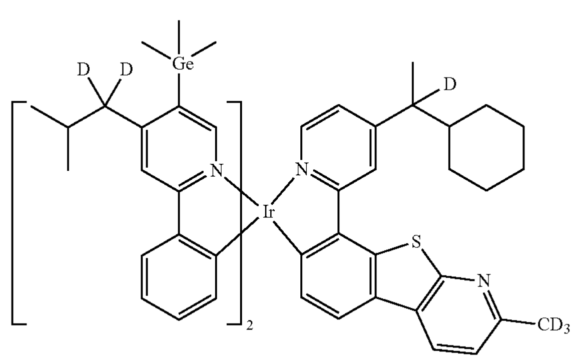

-continued
1331
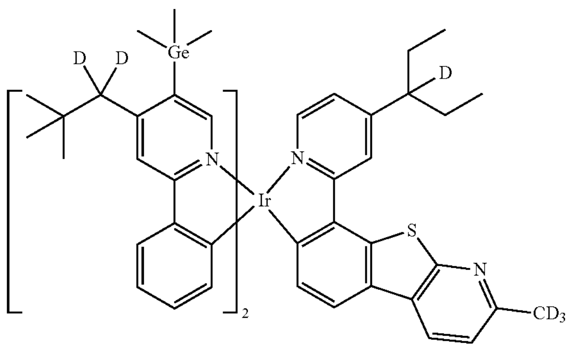
3132
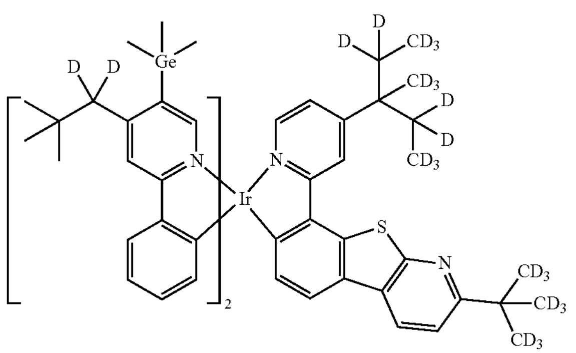
1333
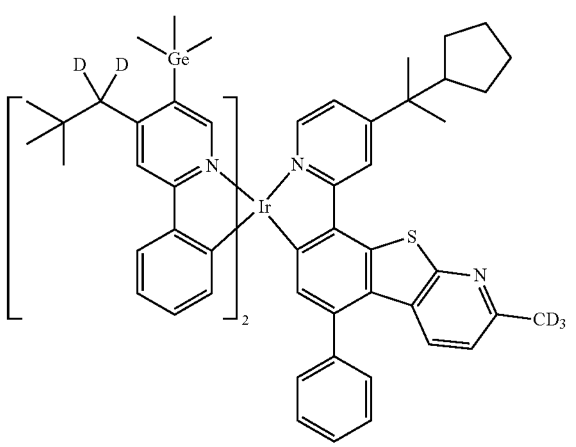
1334
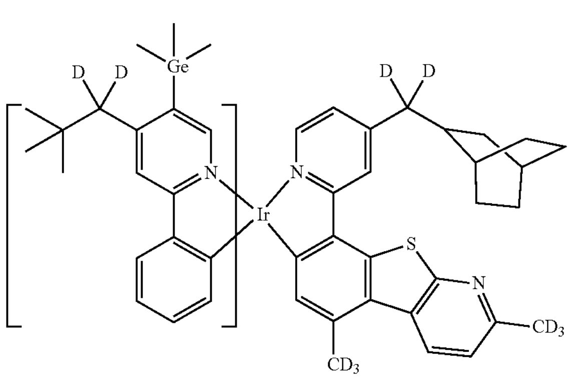
-continued
1335
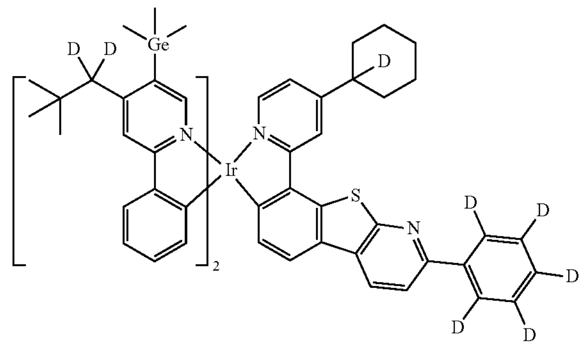
1336
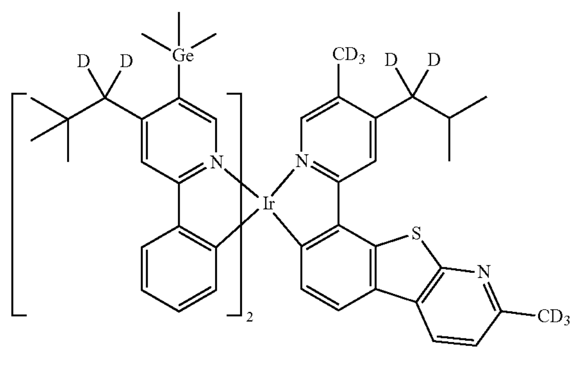
1337
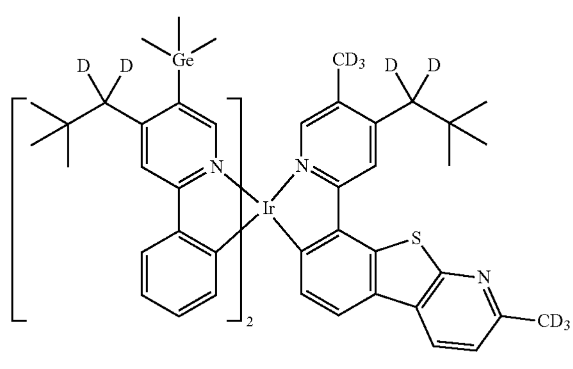
1338
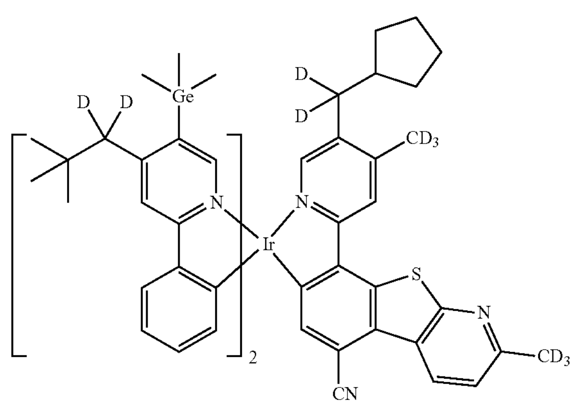

-continued
1339
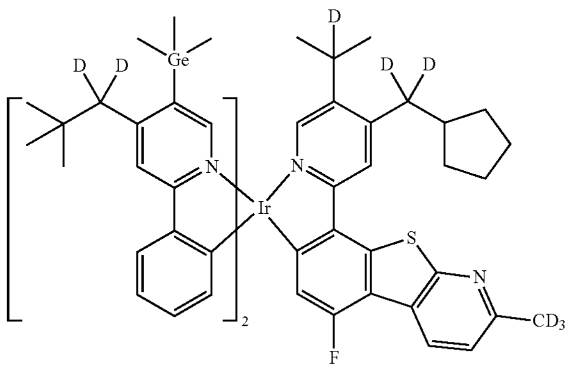
1340
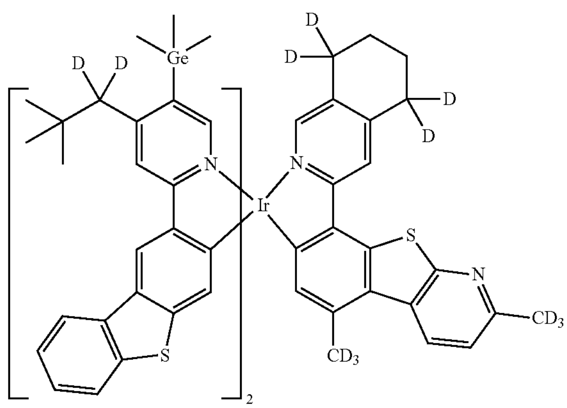
1341
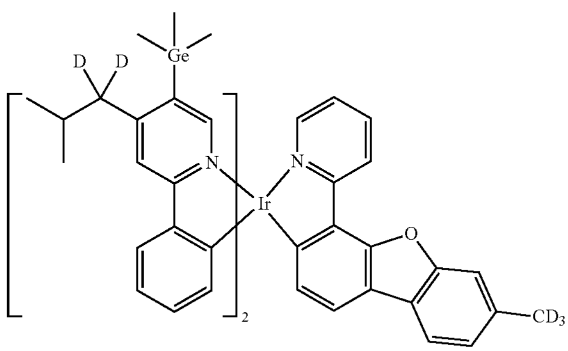
1342
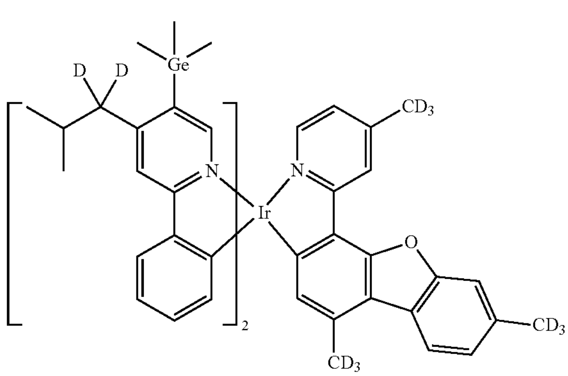
-continued
1343
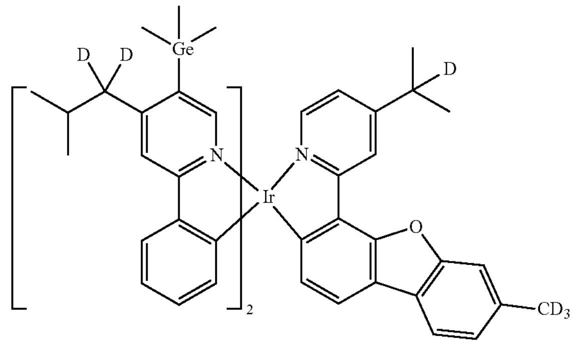
1344
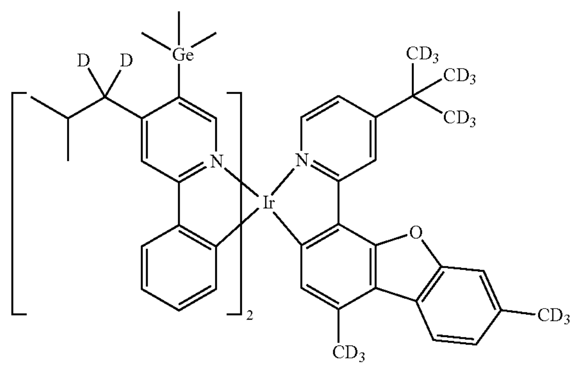
1345
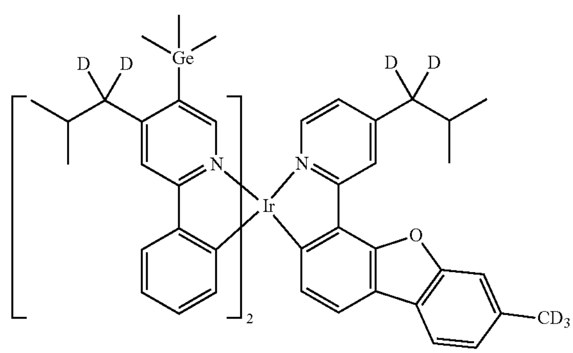
1346
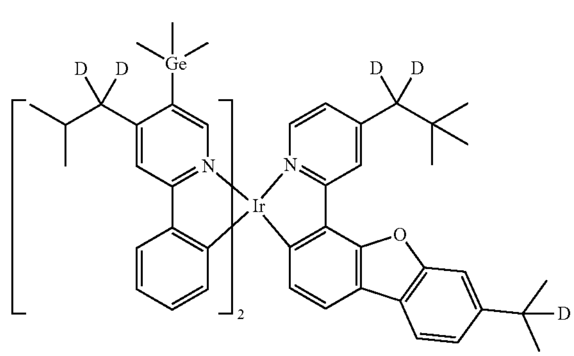

-continued
1347
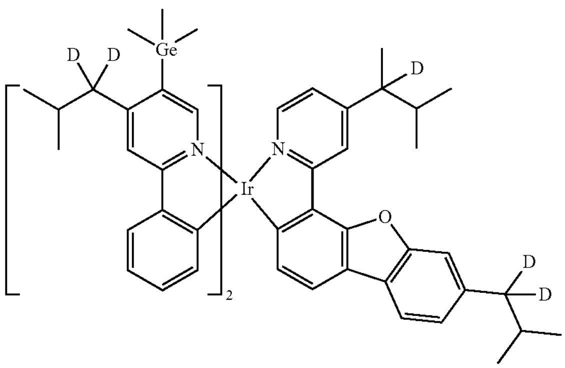
1348
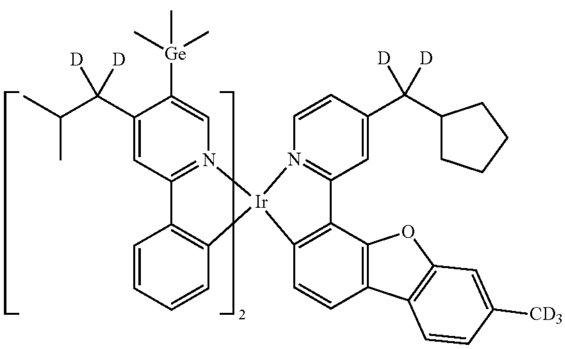
1349
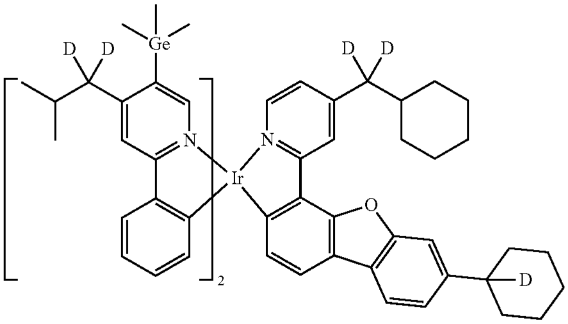
1350
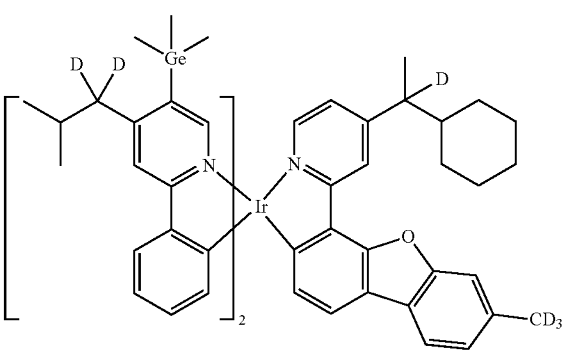
-continued
1351
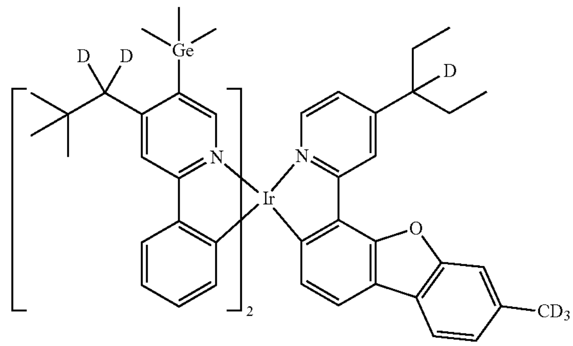
1352
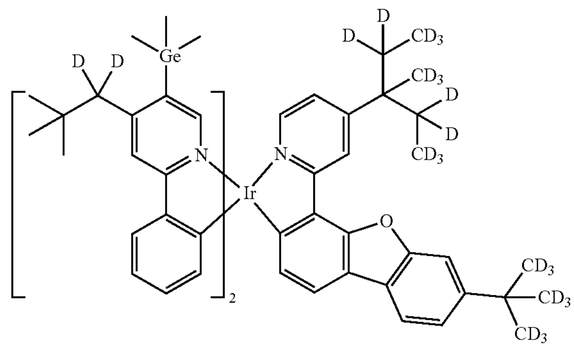
1353
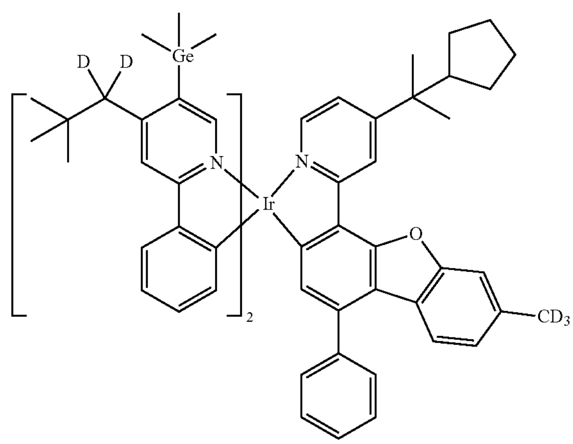
1354
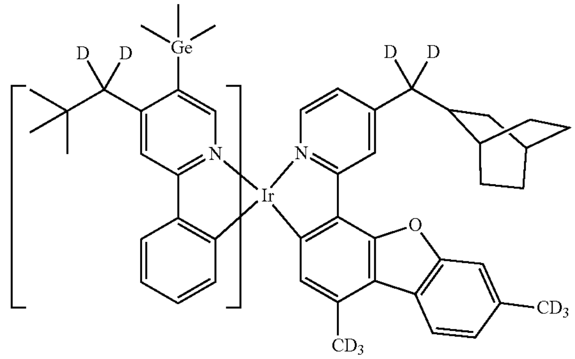

-continued
1355
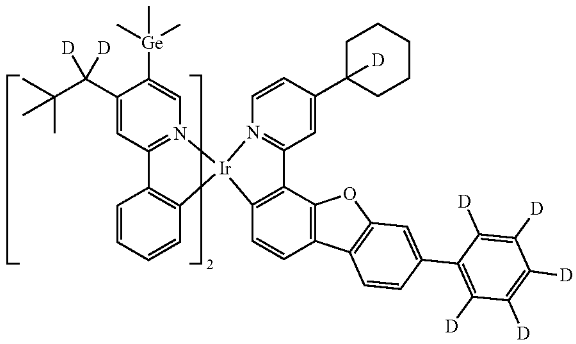
1356
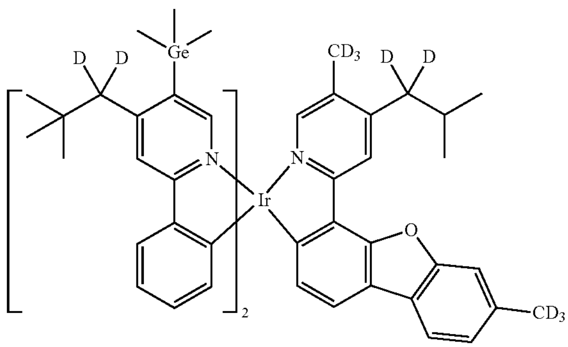
1357
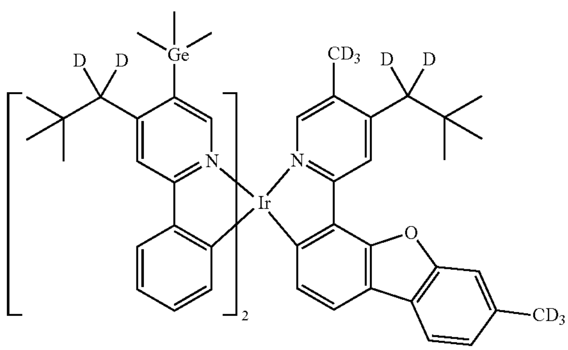
1358
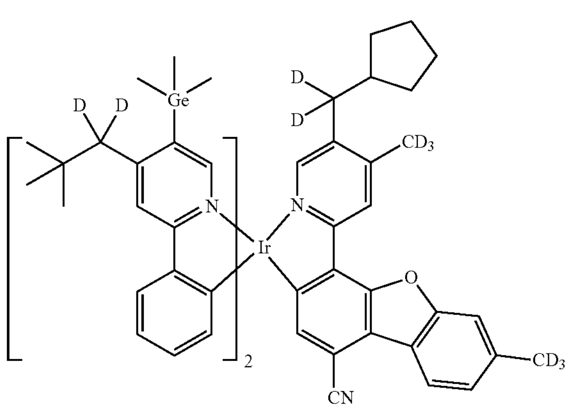
-continued
1359
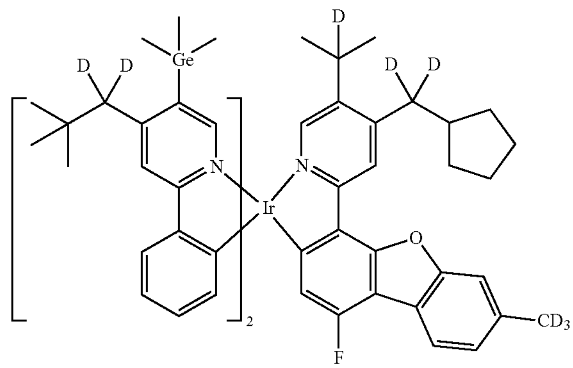
1360
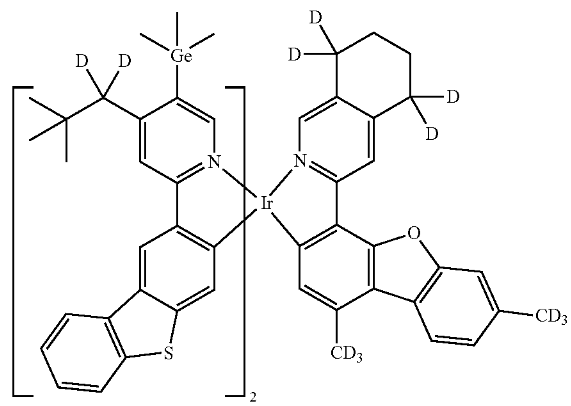
1361
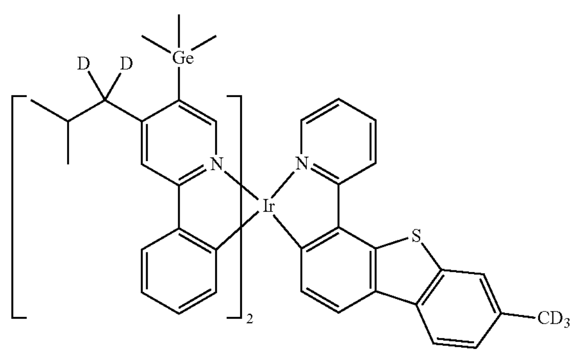
1362
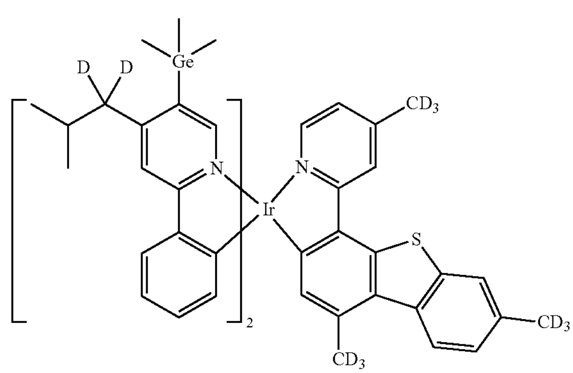

-continued
1363
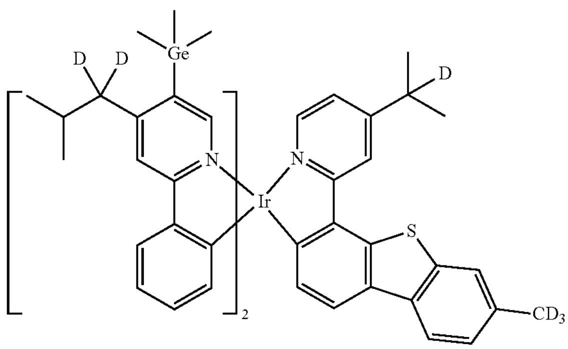
1364
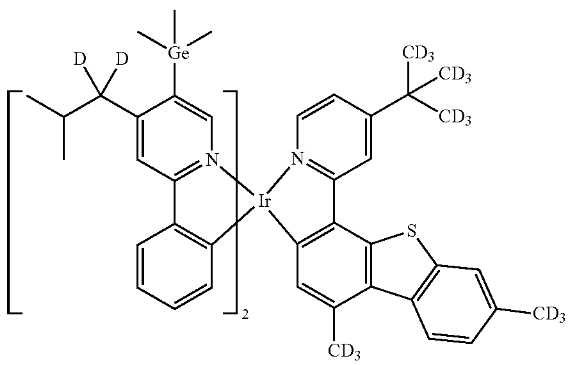
1365
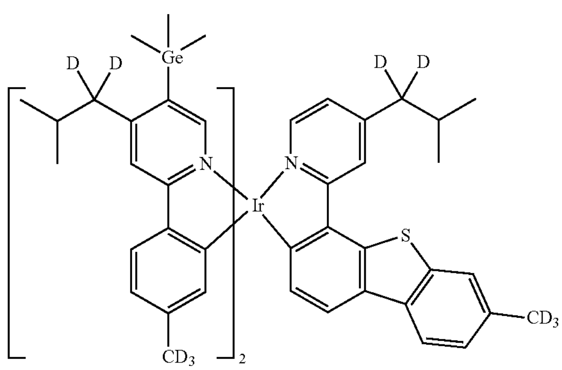
1366
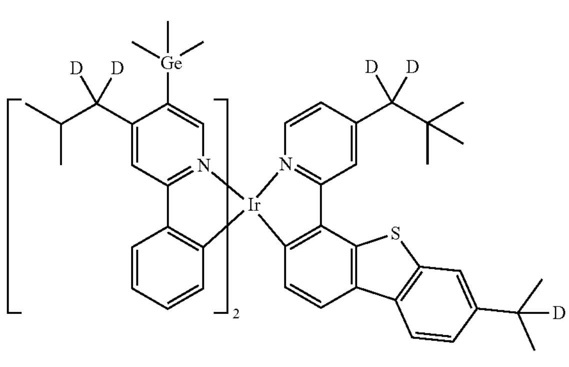
-continued
1367
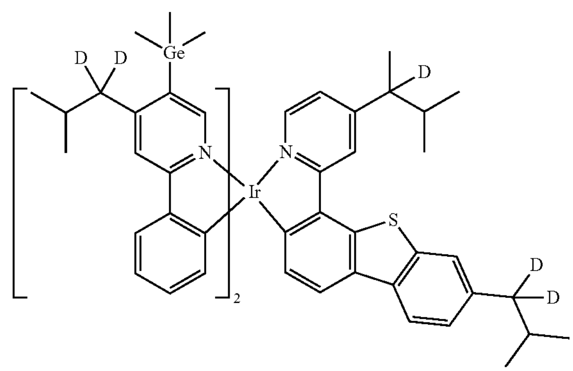
1368
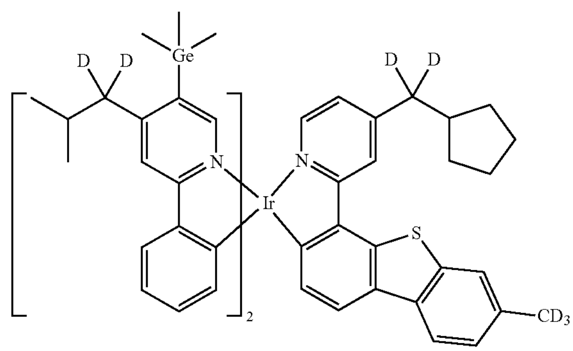
1369
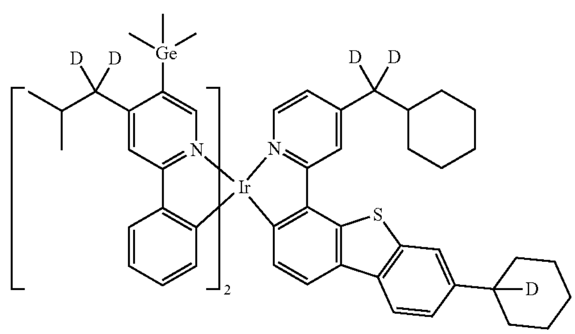
1370
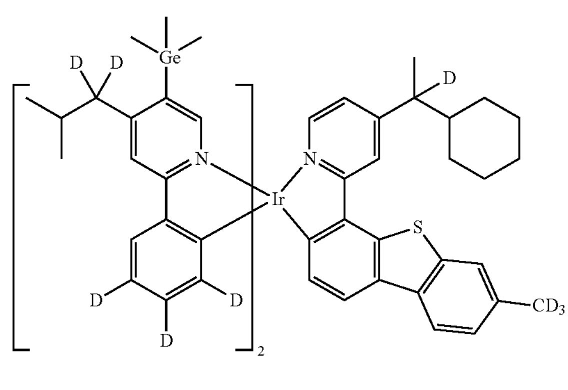

-continued
1371
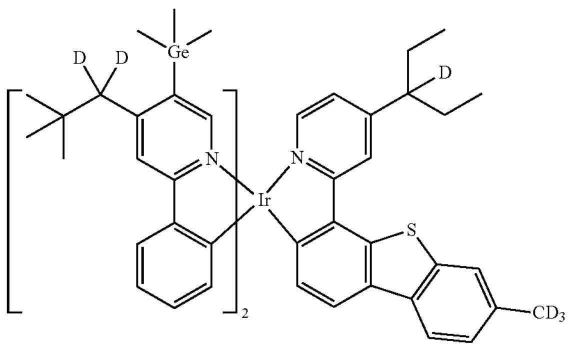
1372
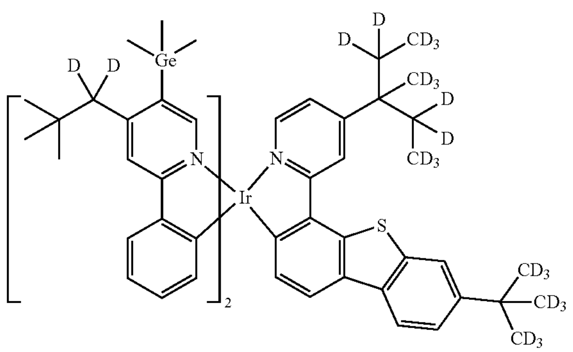
1373
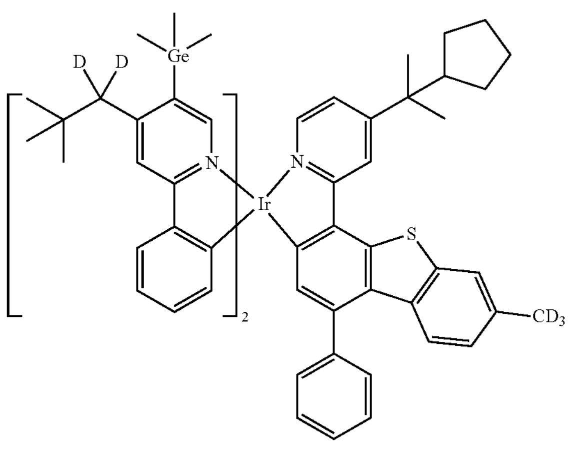
1374
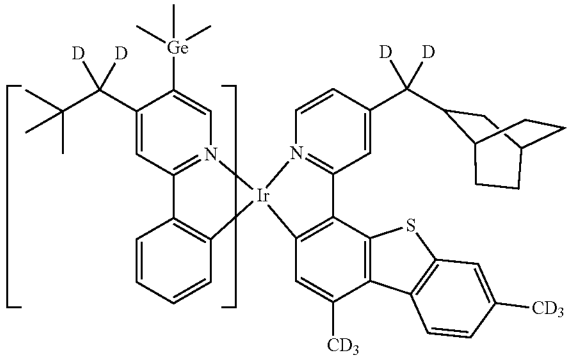
-continued
1375
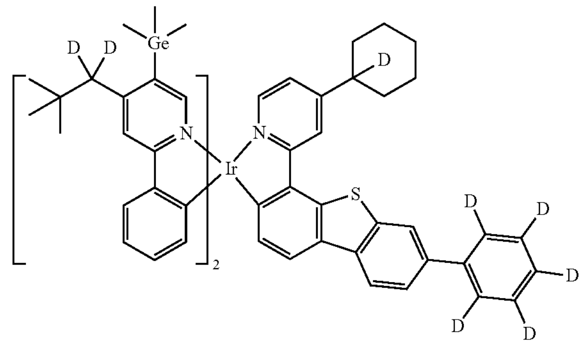
1376
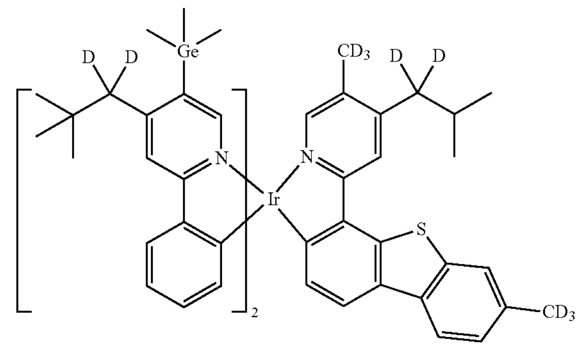
1377
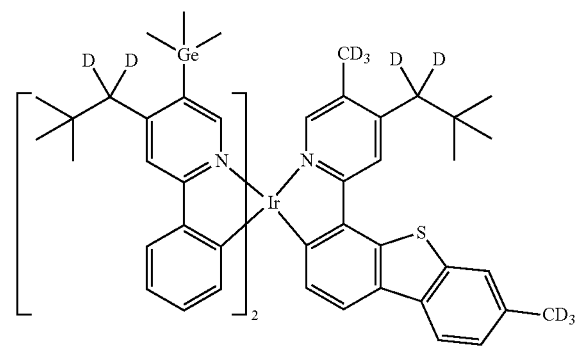
1378
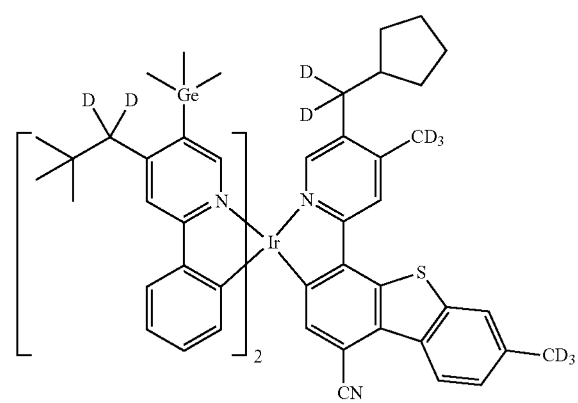

1379
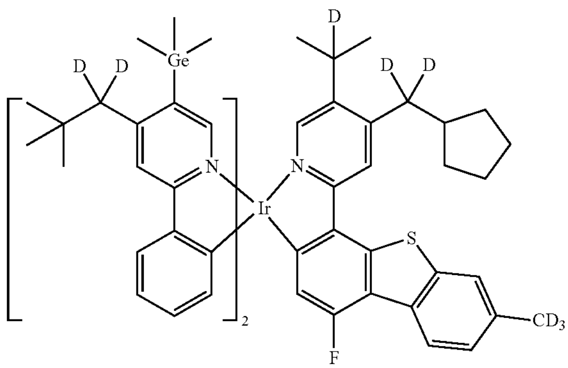
1380
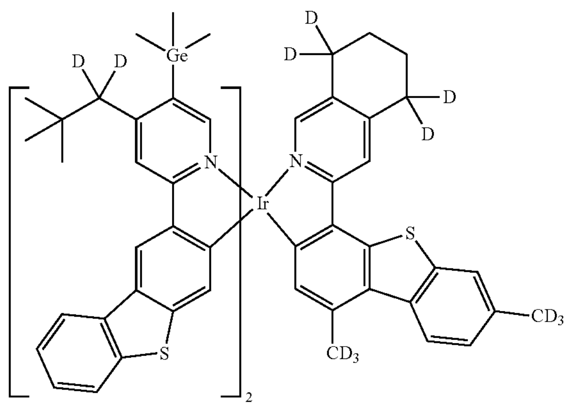
1381
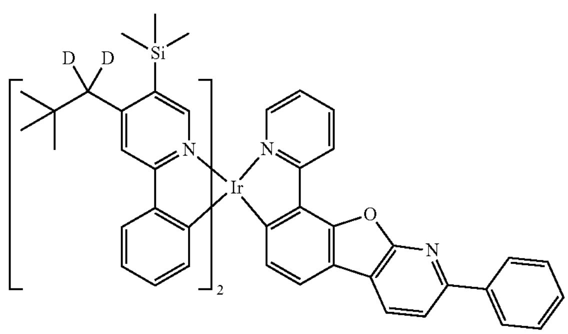
1382
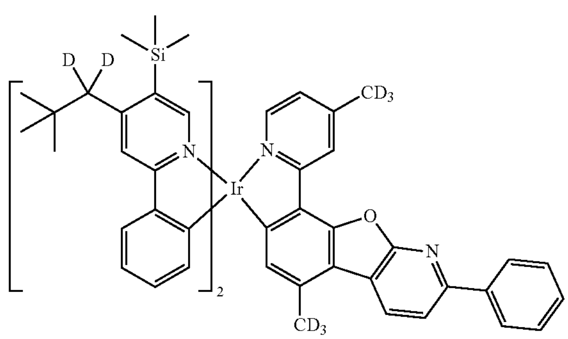
1383
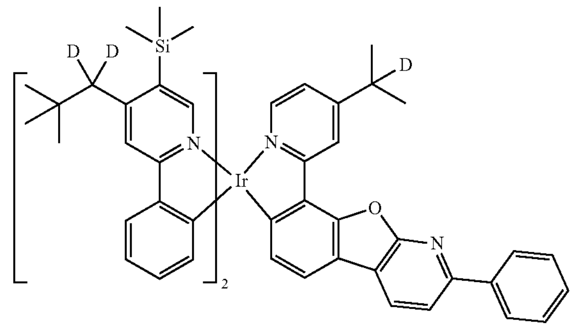
1384
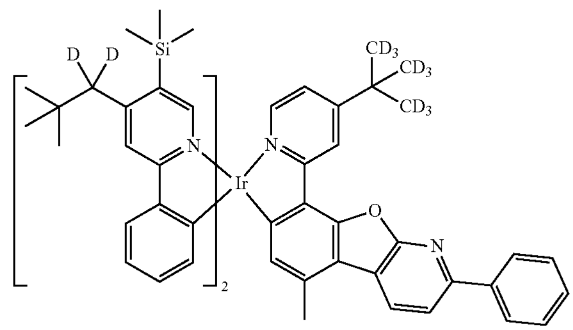
1385
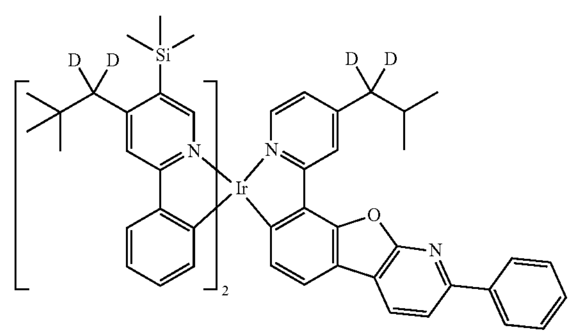
1386
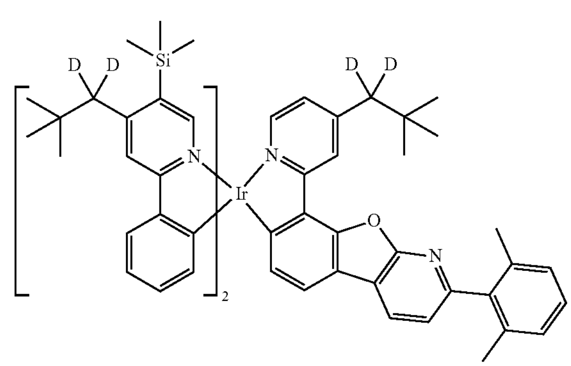

-continued
1387
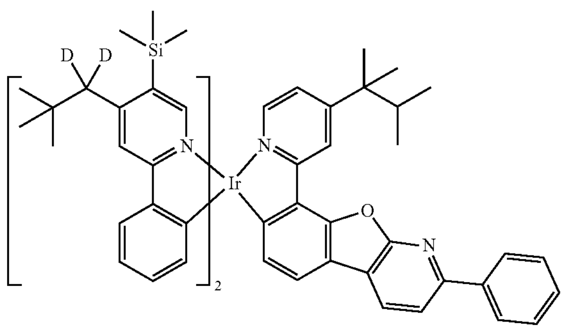
1388
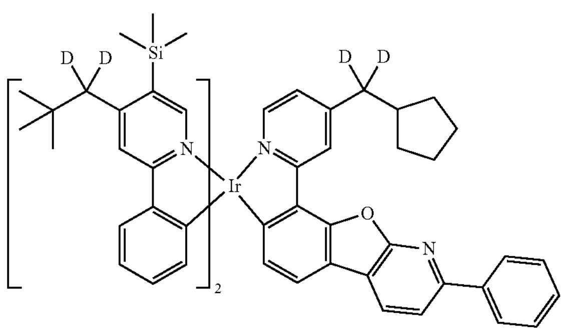
1389
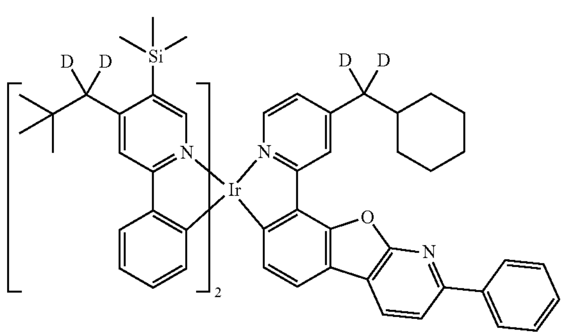
1390
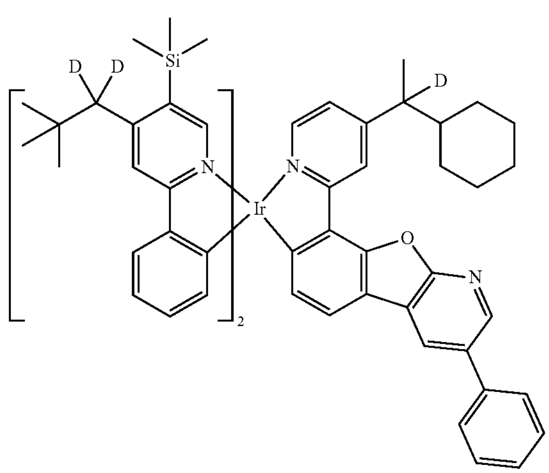
-continued
1391
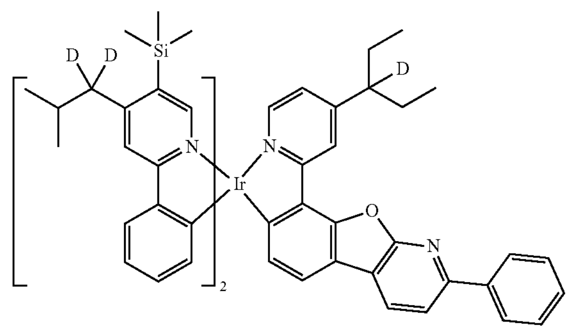
1392
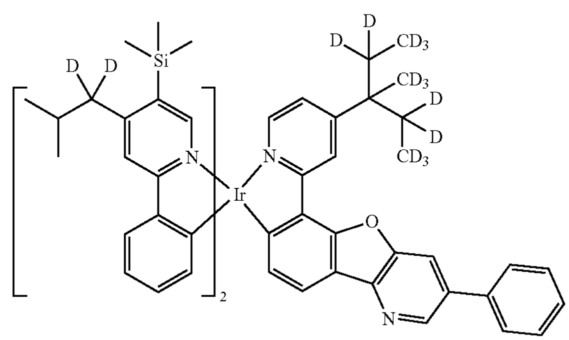
1393
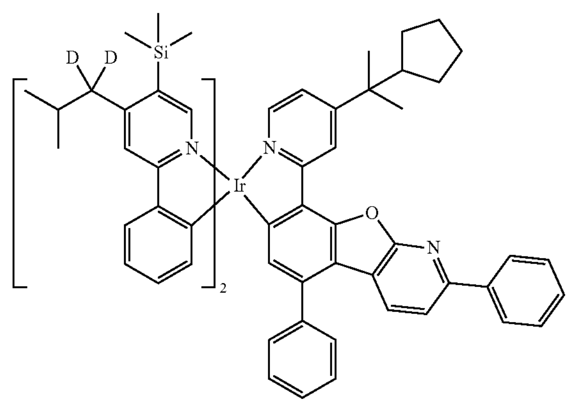
1394
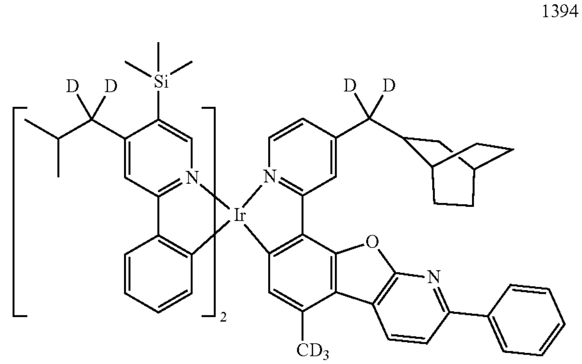

-continued
1395
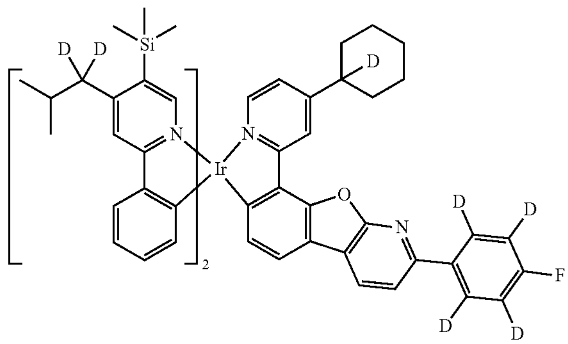
1396
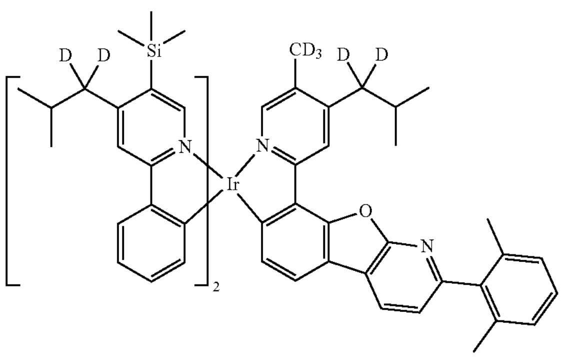
1397
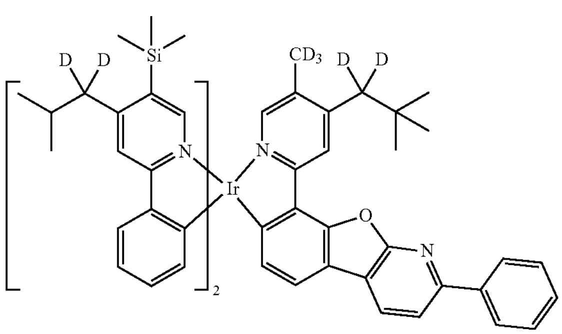
1398
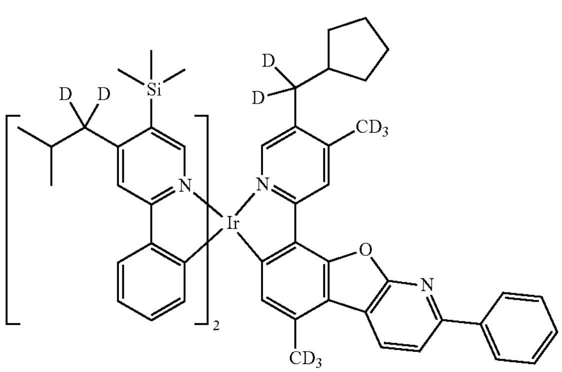
-continued
1399
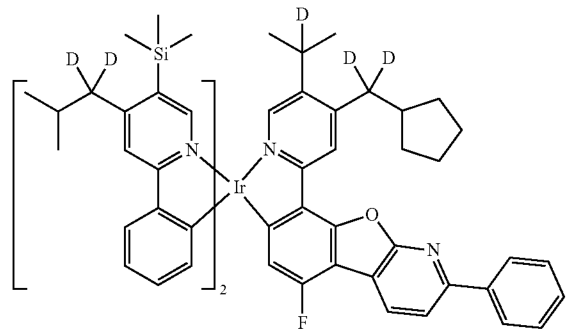
1400
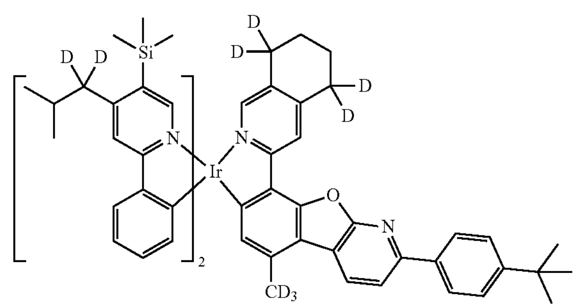
1401
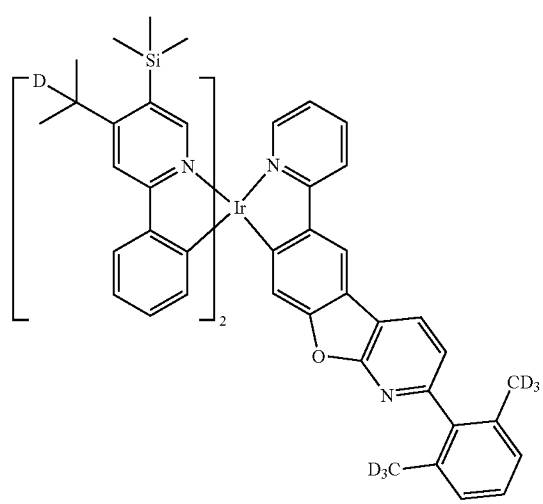

-continued
1402
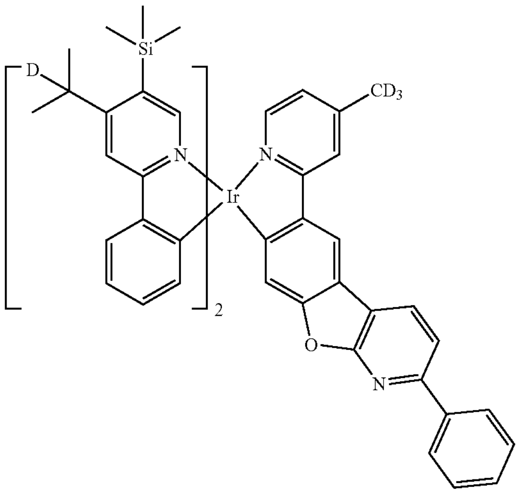
1403
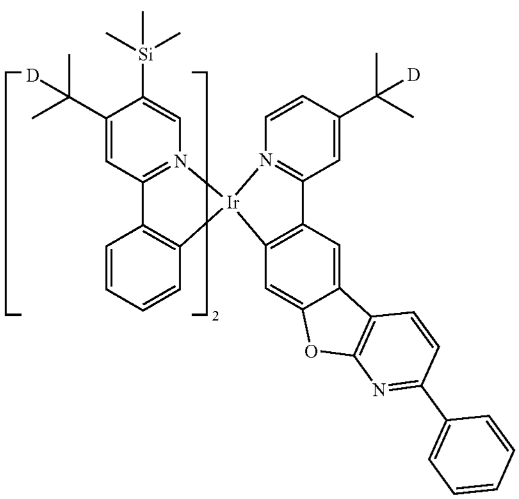
1404
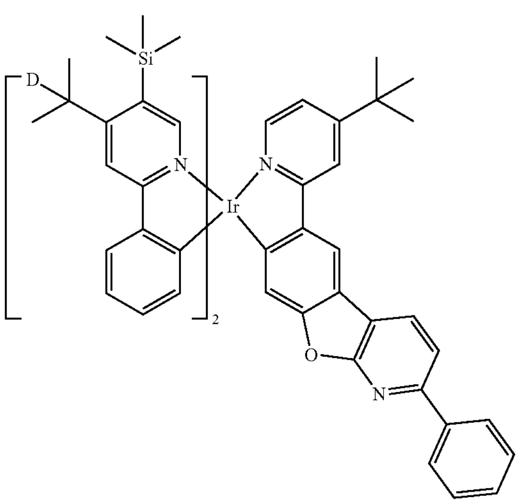
-continued
1405
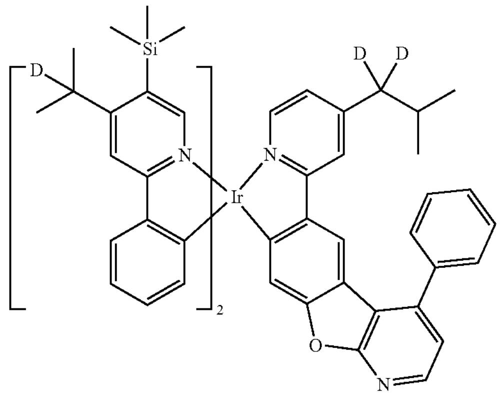
1406
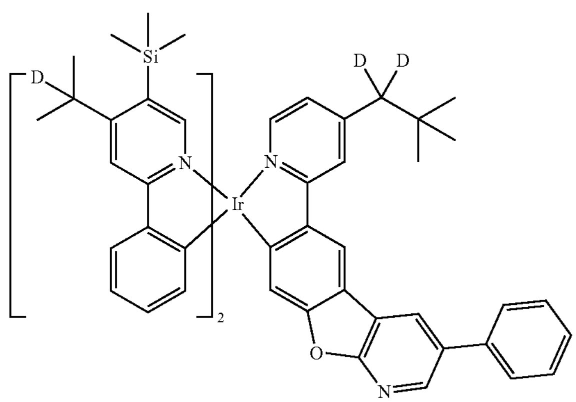
1407
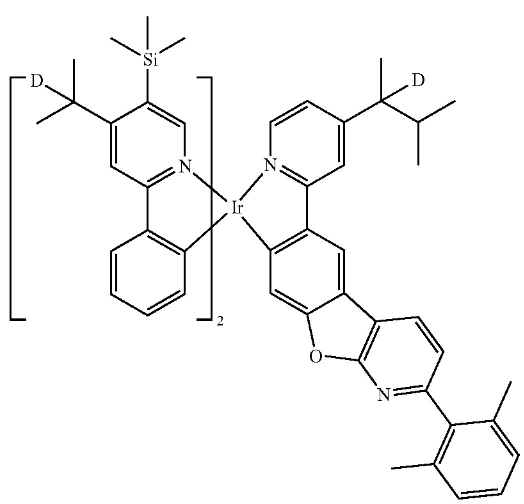

1408
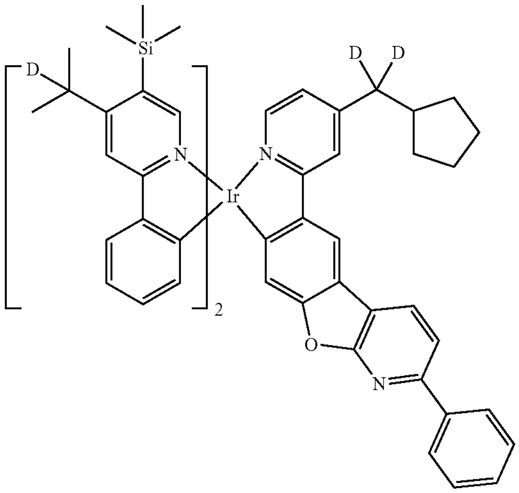
1409
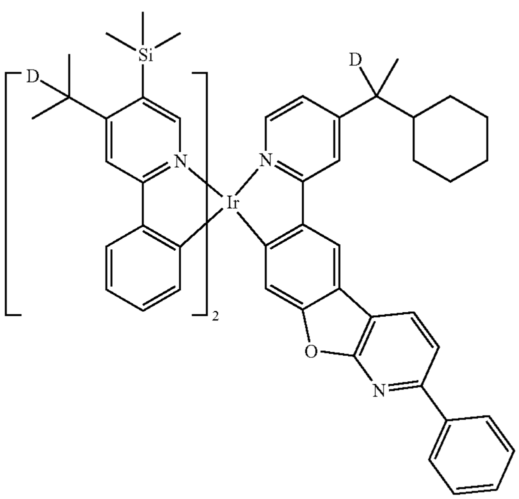
1410
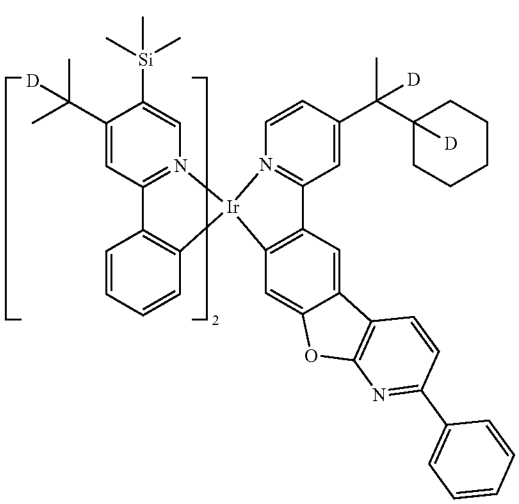
1411
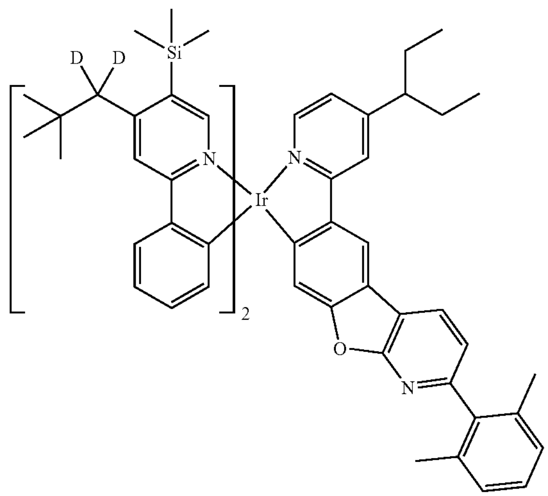
1412
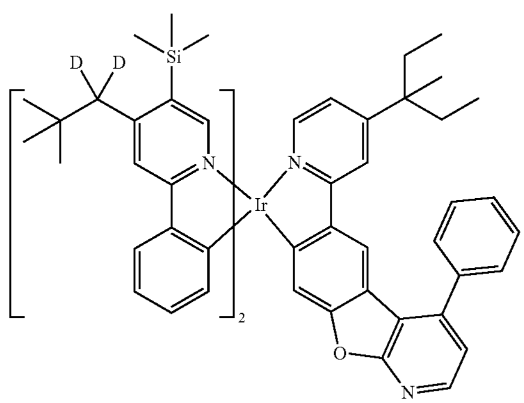
1413
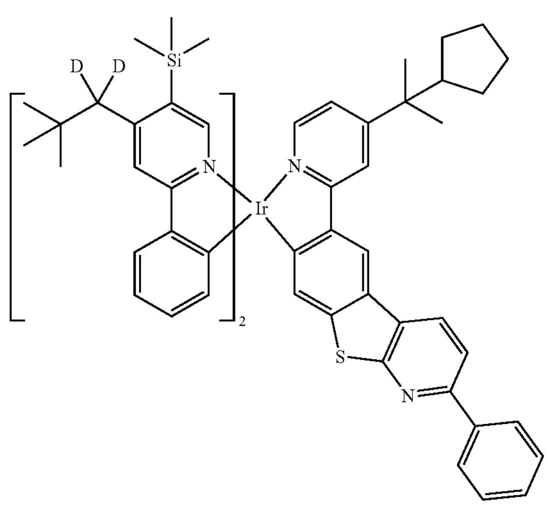

-continued
1414
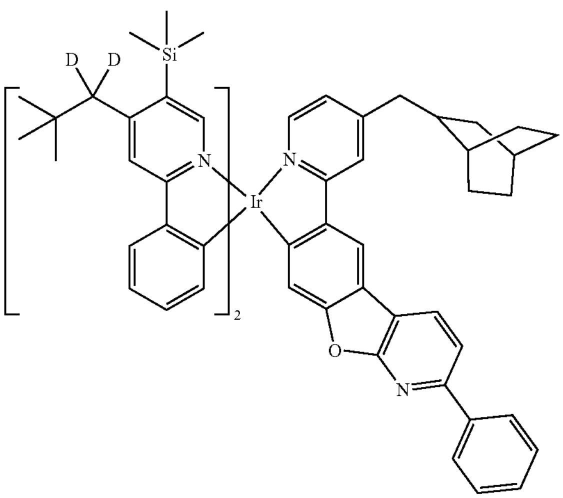
1415
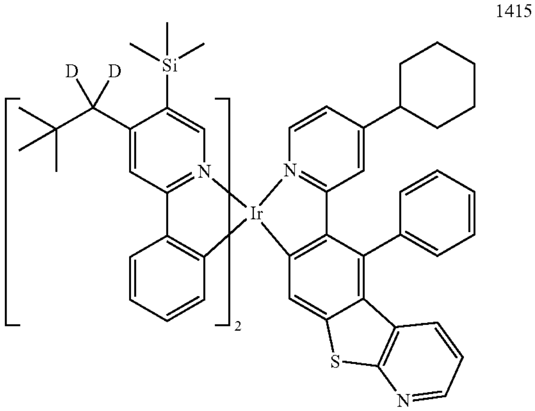
1416
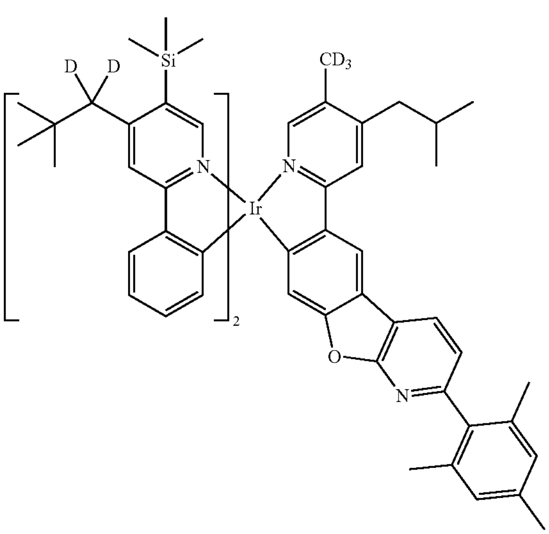
-continued
1417
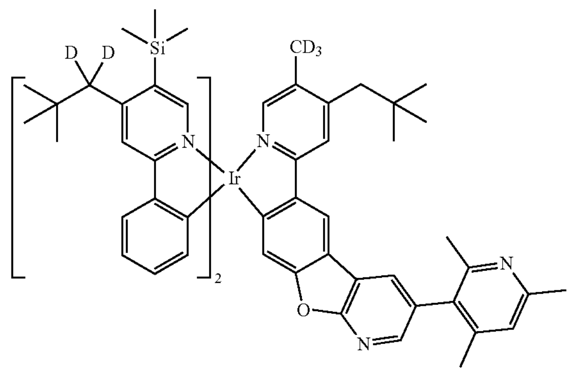
1418
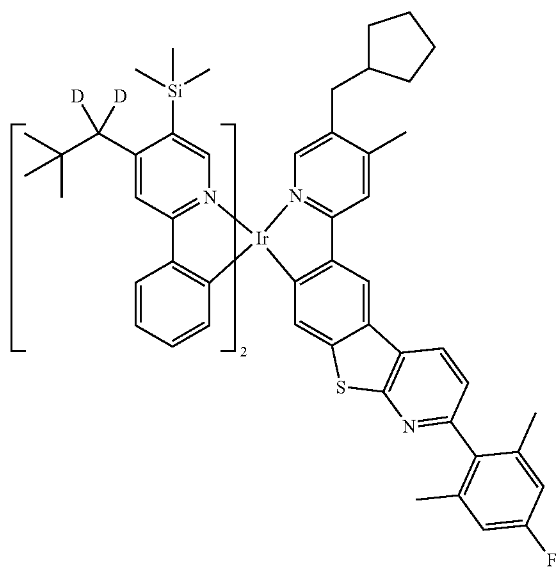
1419
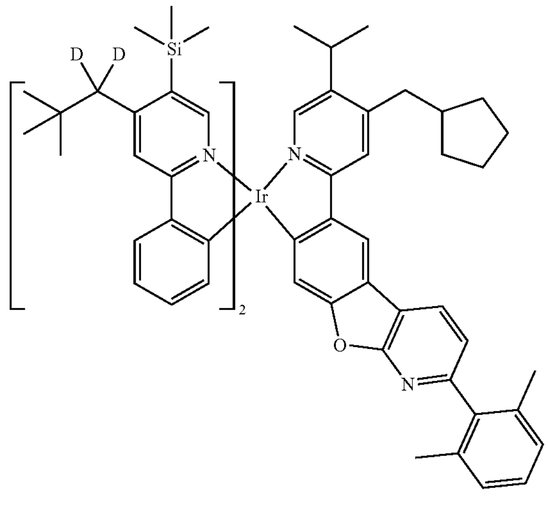

-continued
1420
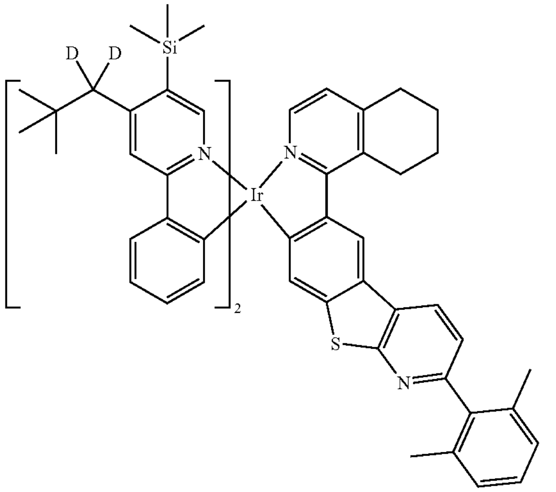
1421
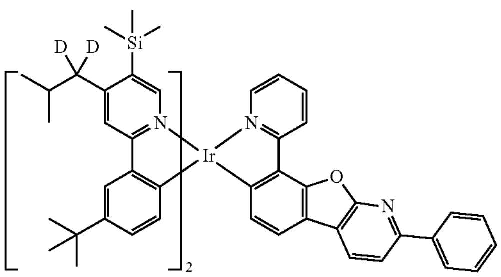
1422
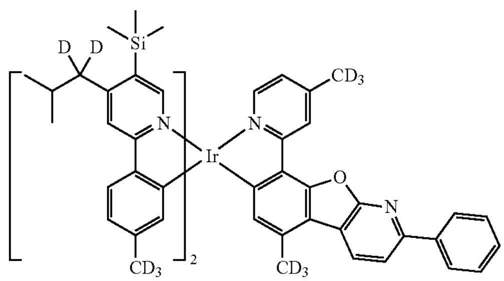
1423
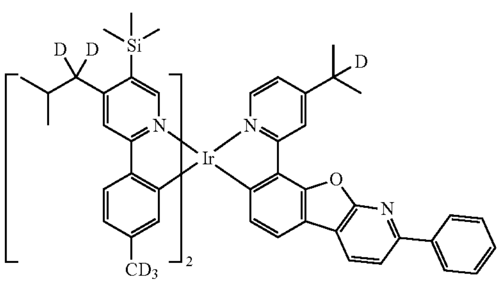
1424
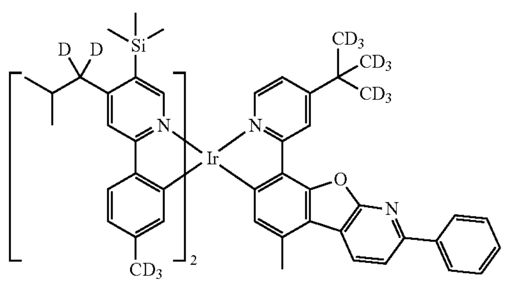
1425
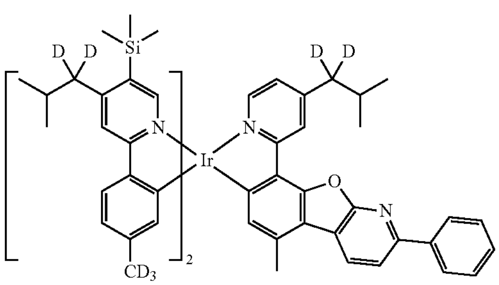
1426
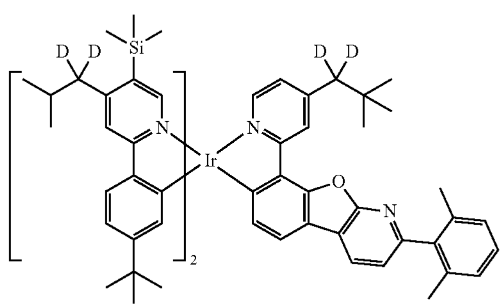

-continued
1427
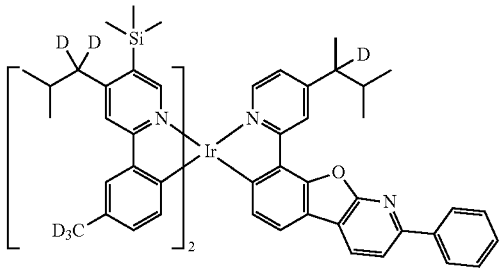
1428
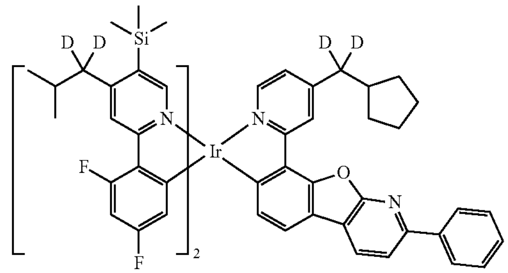
1429
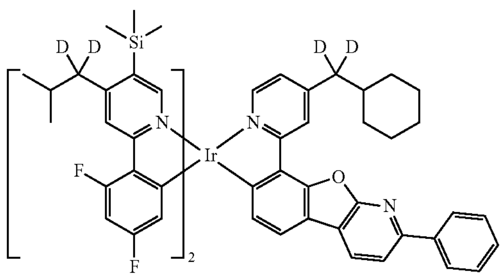
1430
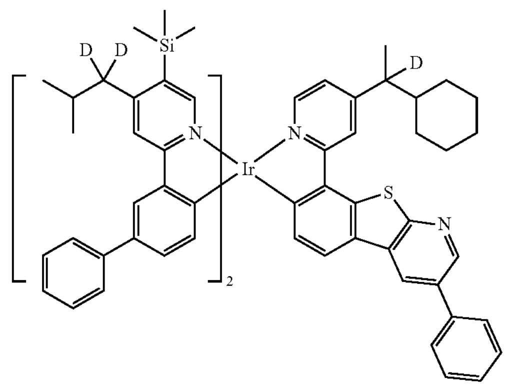
1431
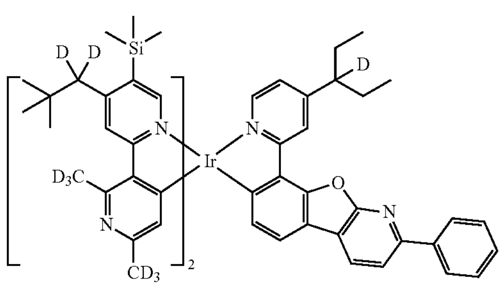
1432
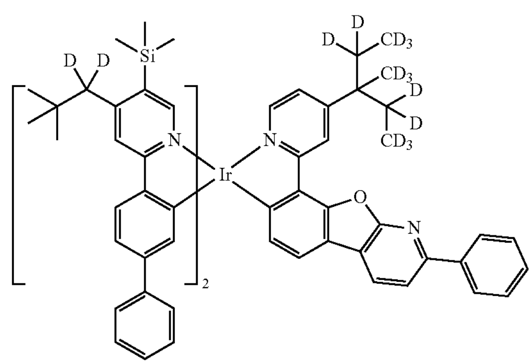
1433
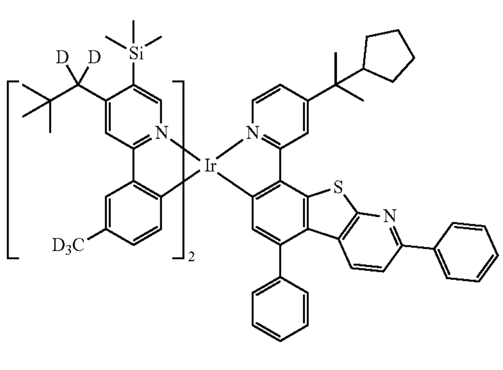
1434
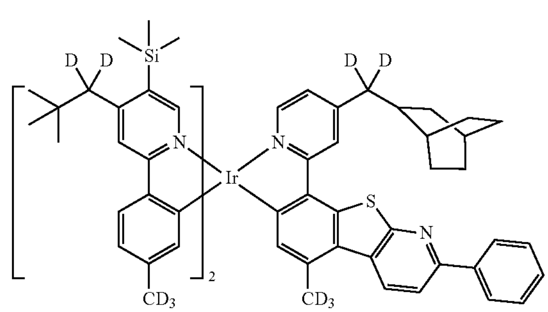

-continued
1435
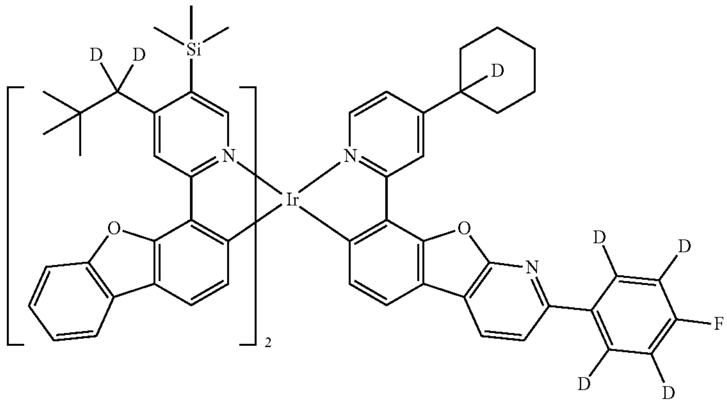
1436
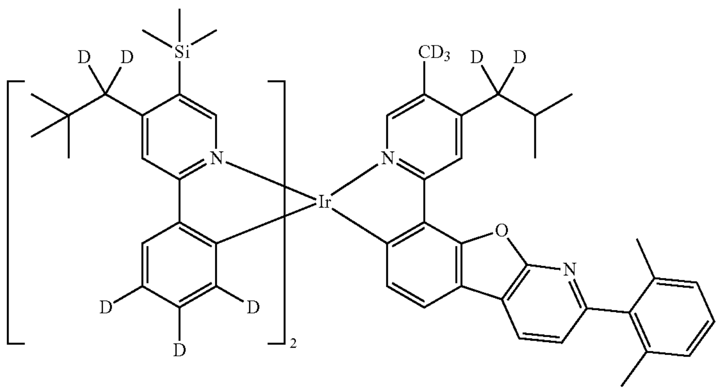
1437
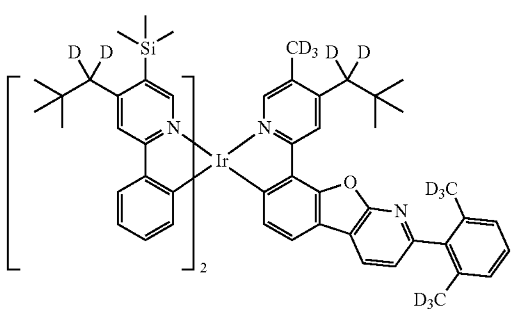
1438
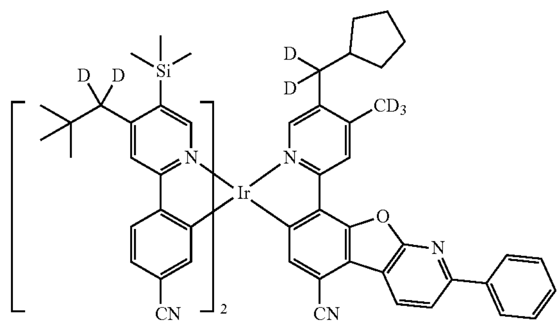
1439
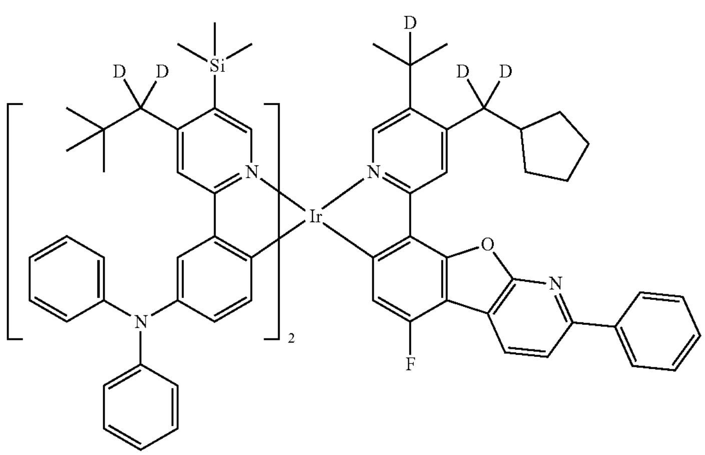

-continued
1440
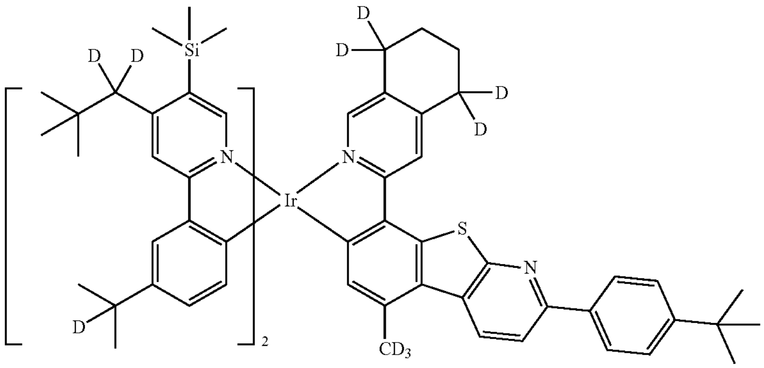
1441
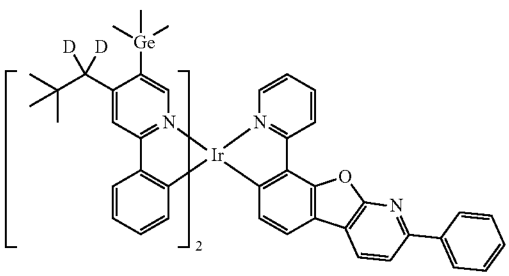
1442
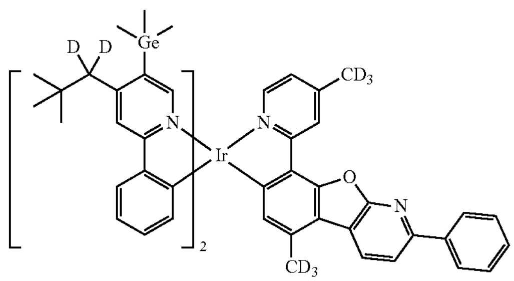
1443
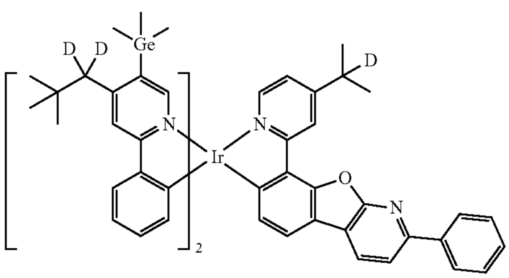
1444
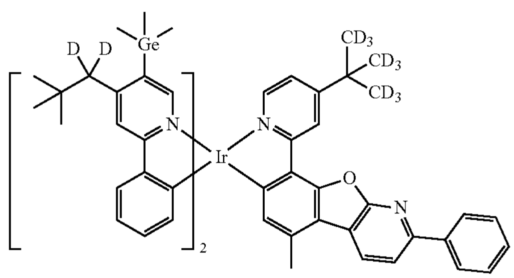
1445
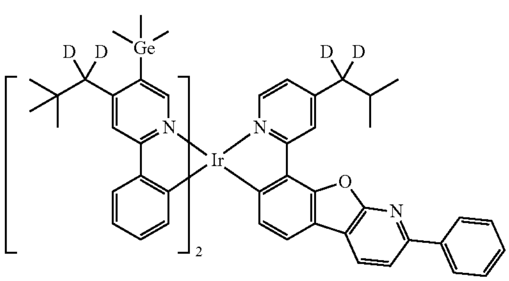
1446
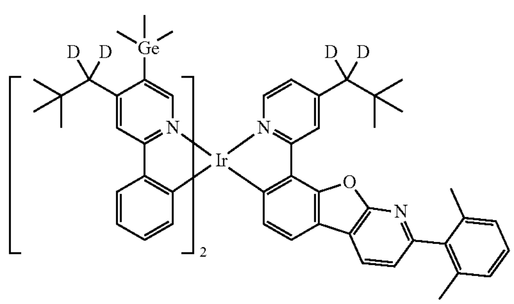
1447
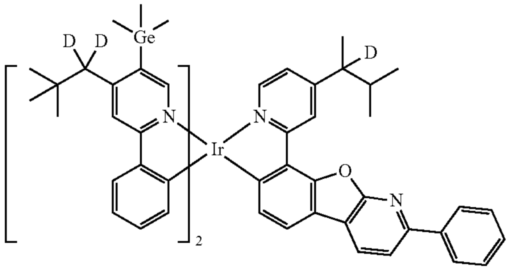
1448
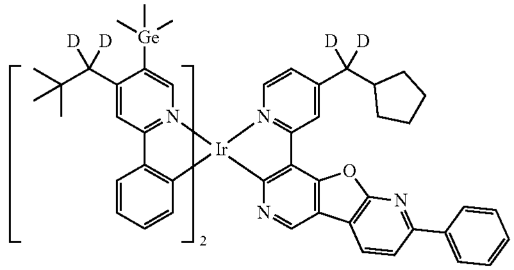

-continued
1449
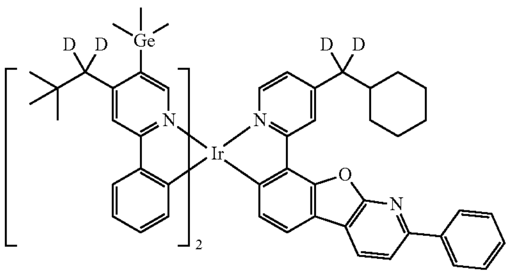
1450
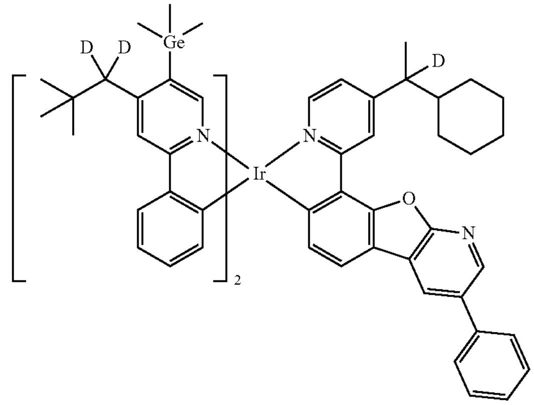
1451
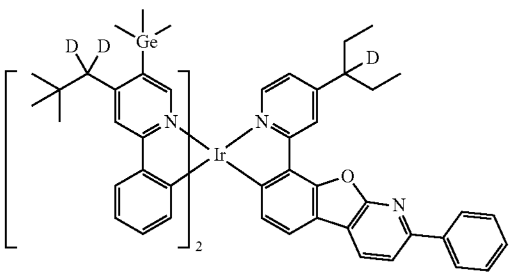
1452
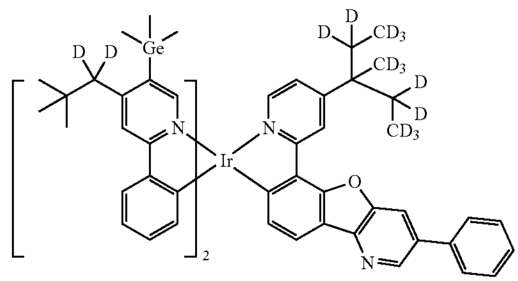
1453
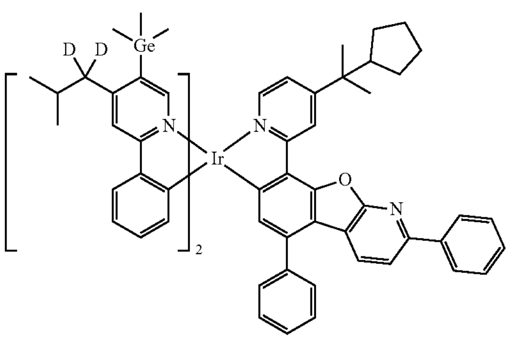
1454
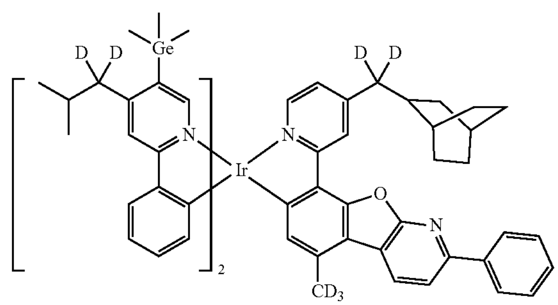
1455
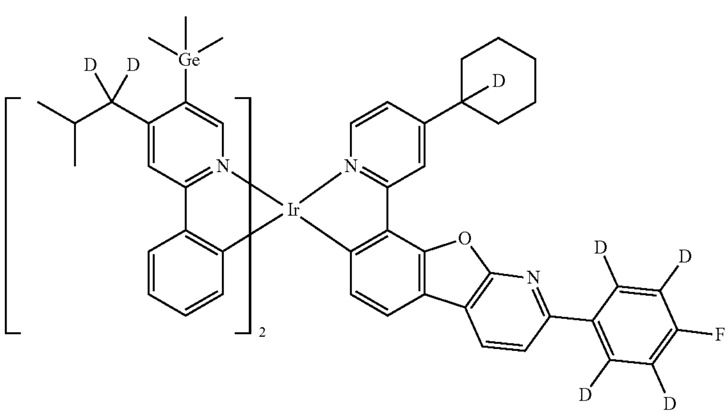

-continued
1456
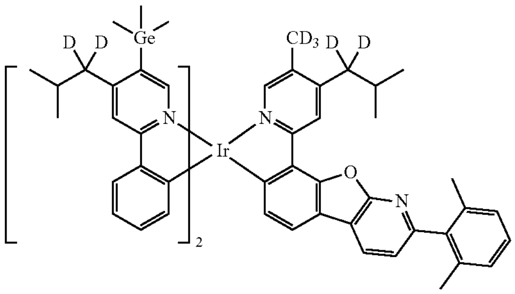
1457
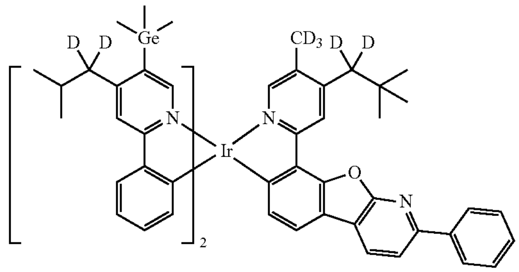
1458
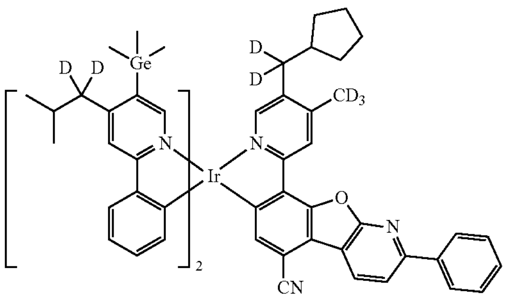
1459
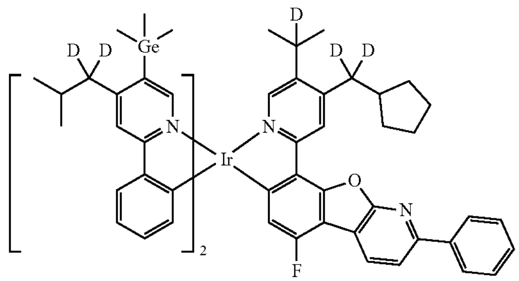
1460
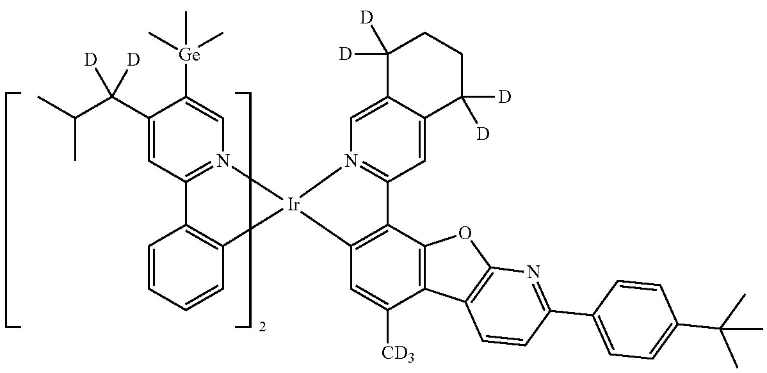
1461
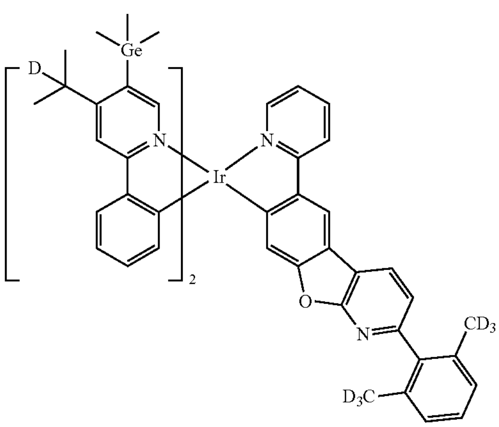
1462
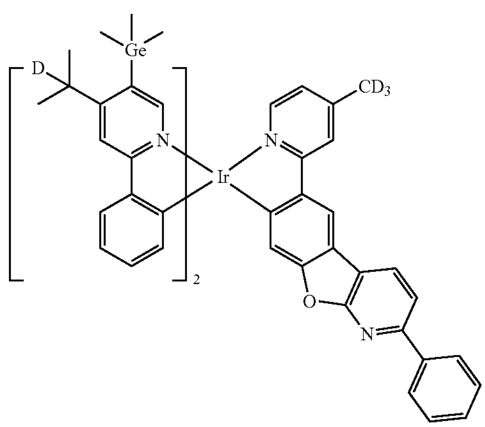

-continued
1463
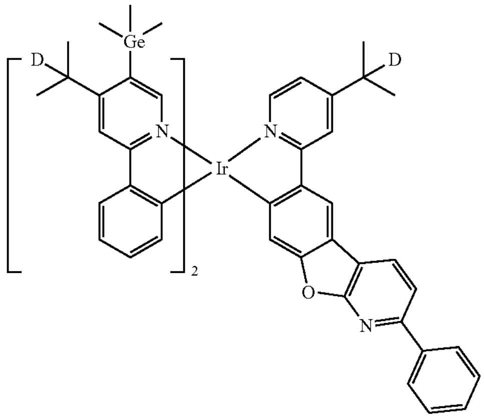
1464
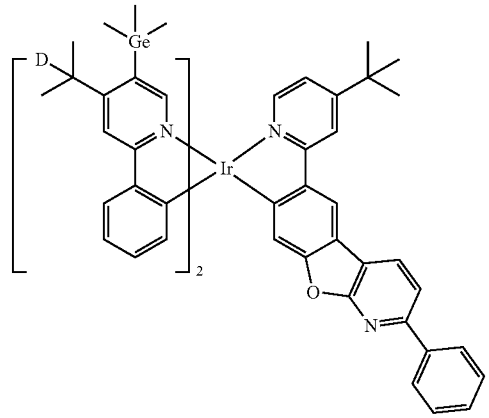
1465
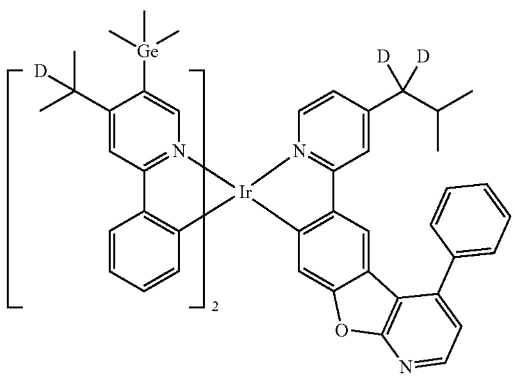
1466
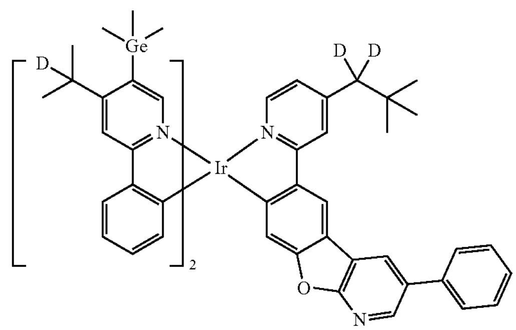
1467
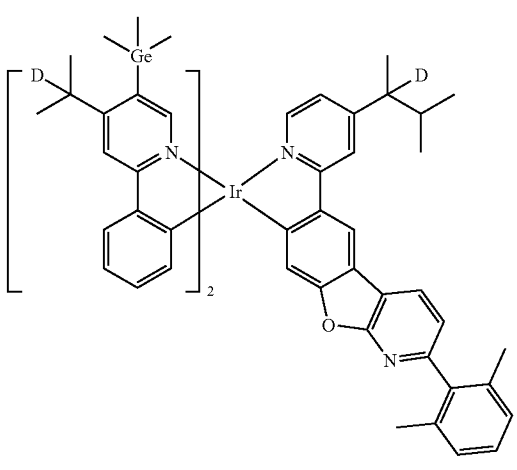
1468
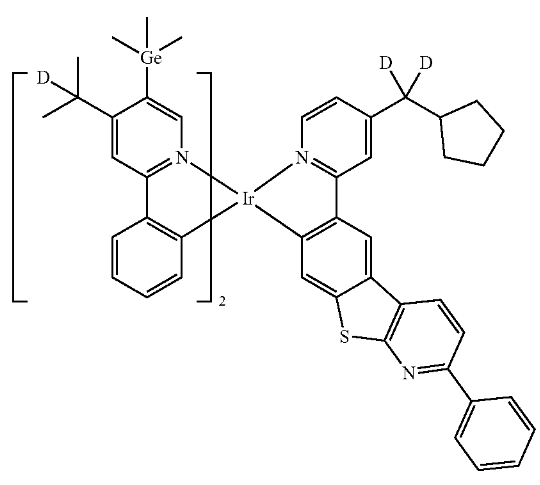

-continued
1469
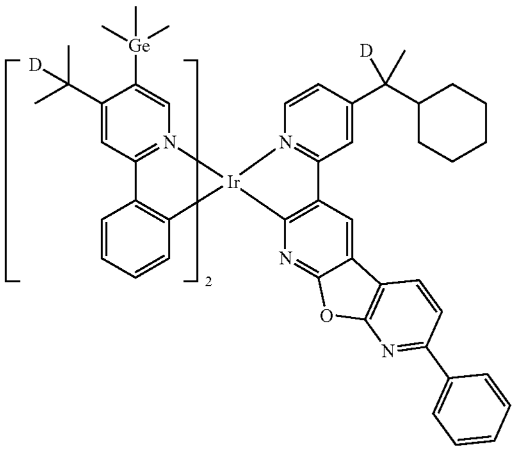
1470
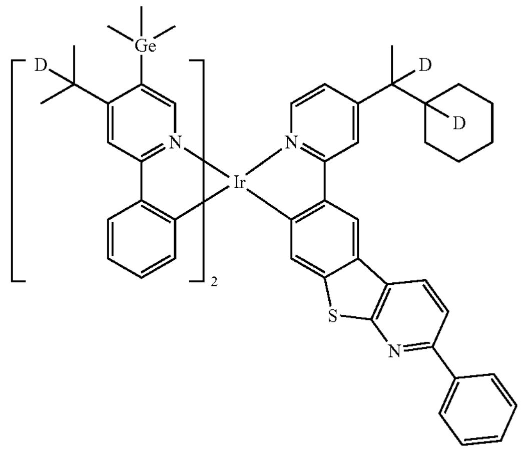
1471
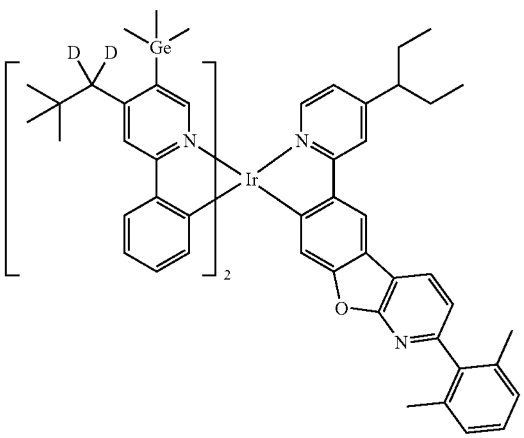
1472
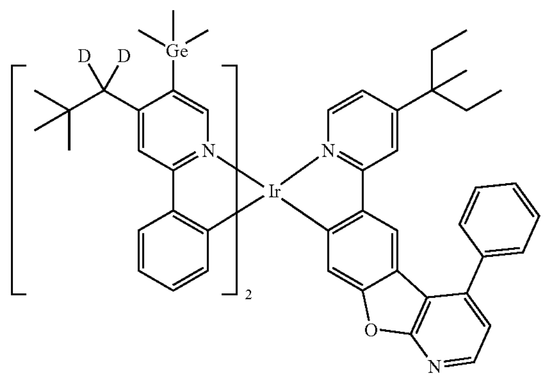
1473
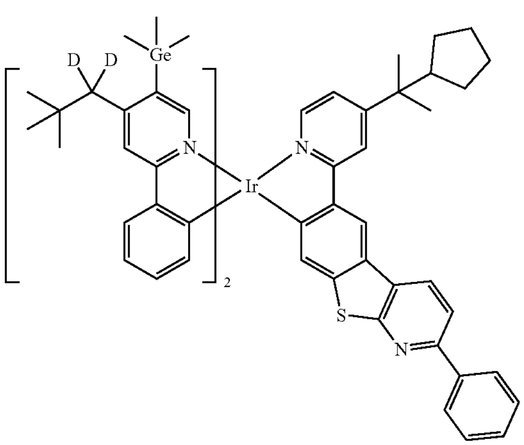
1474
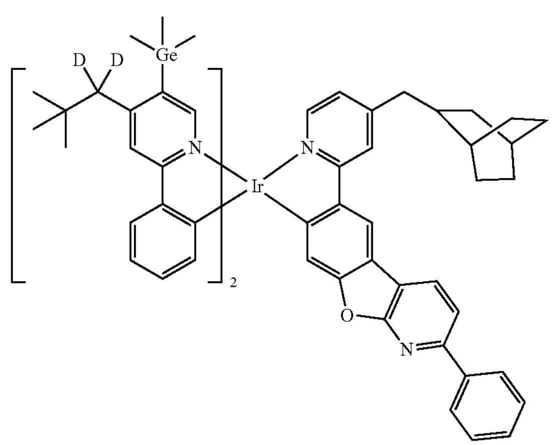

-continued
1475
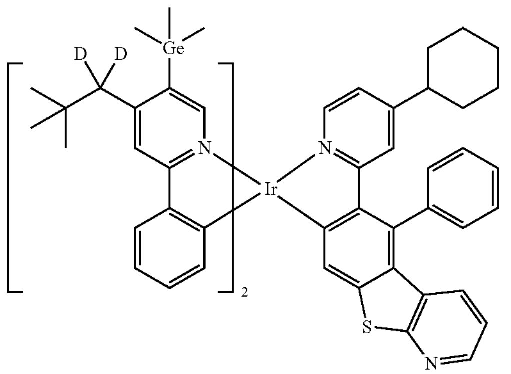
1476
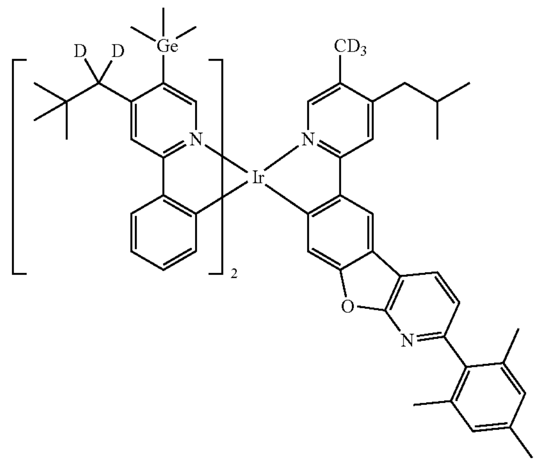
1477
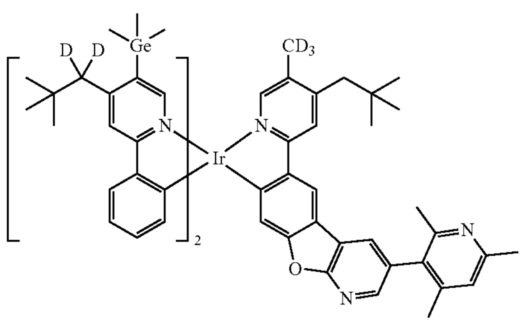
1478
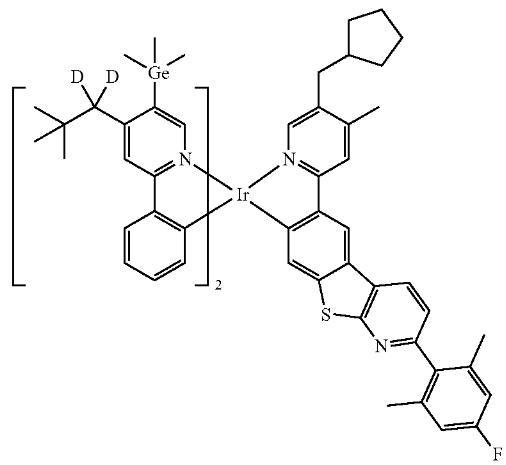
1479
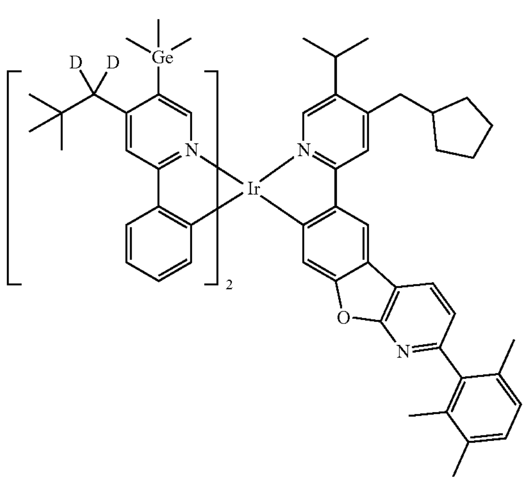
1480
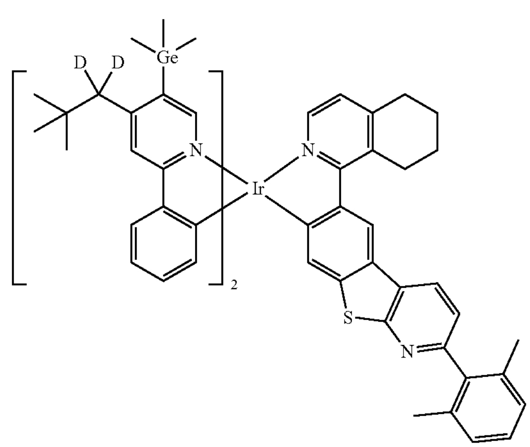

-continued
1481
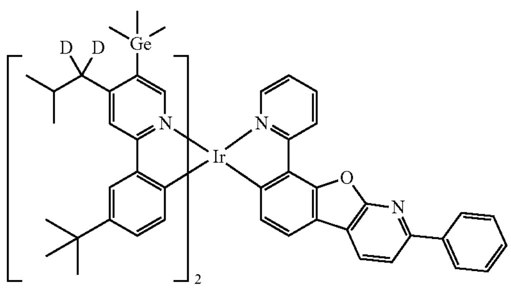
1482
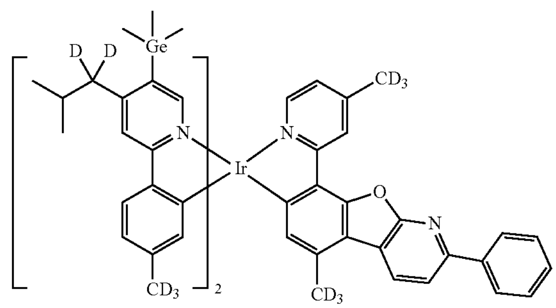
1483
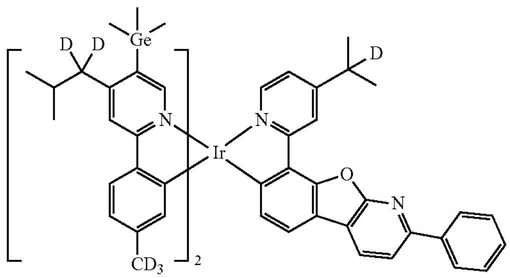
1484
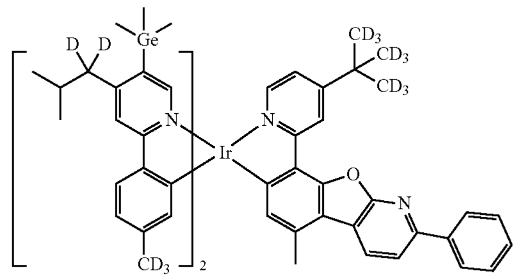
1485
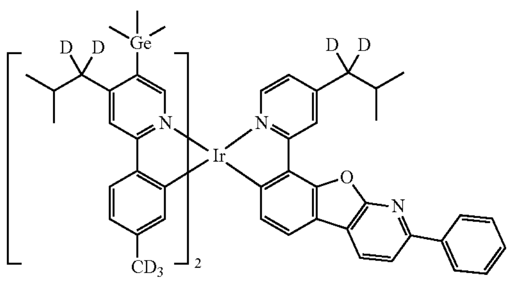
1486
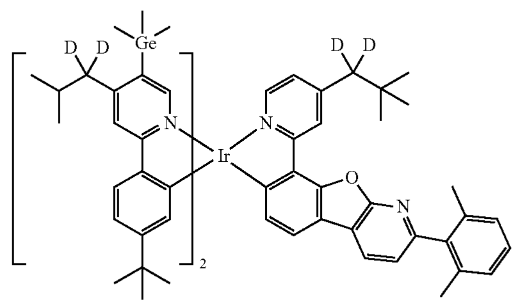
1487
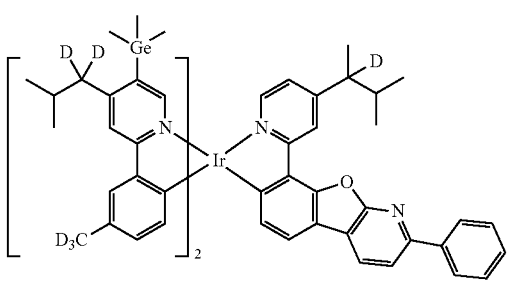
1488
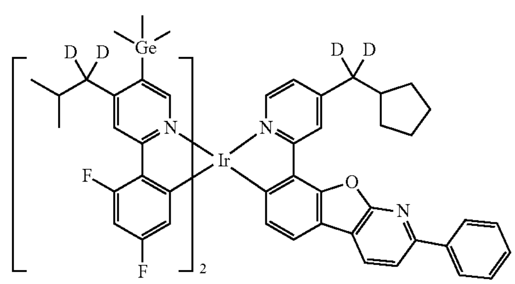
1489
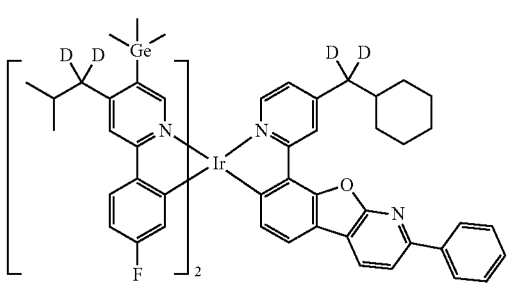
1490
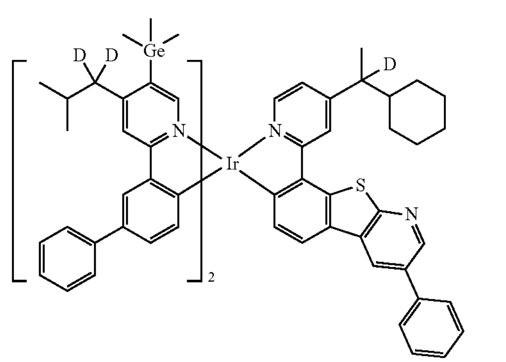

-continued
1491
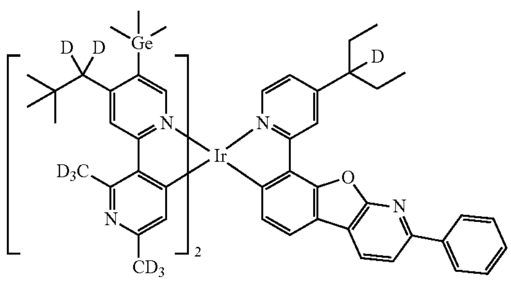
1492
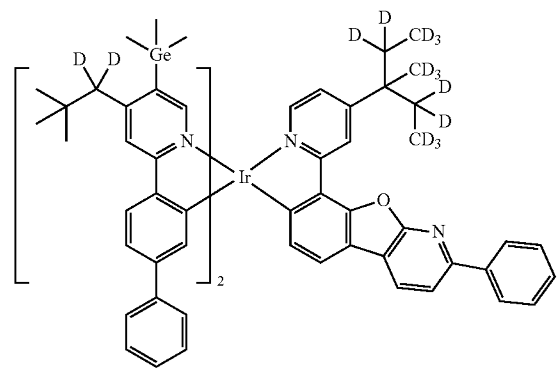
1493
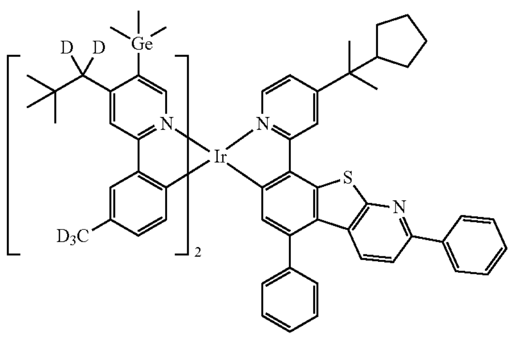
1494
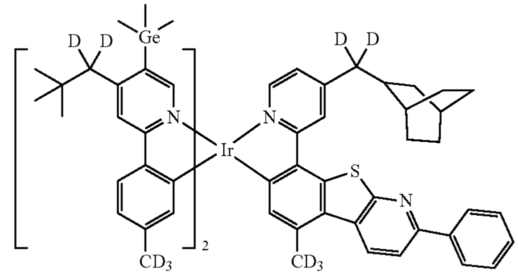
1495
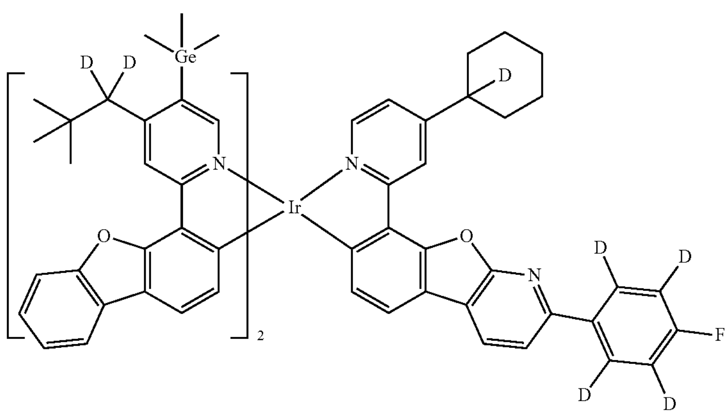
1496
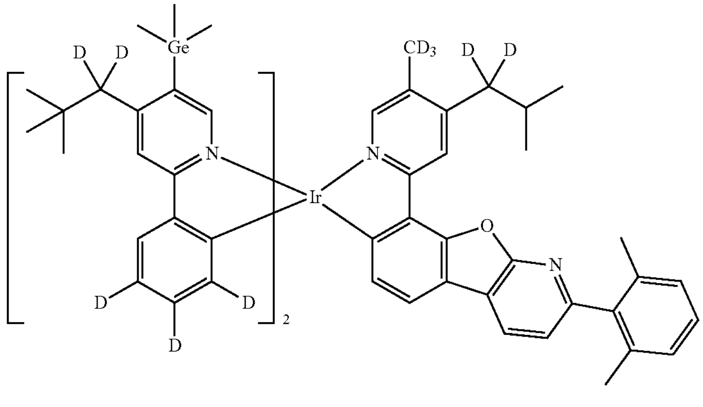

-continued
1497
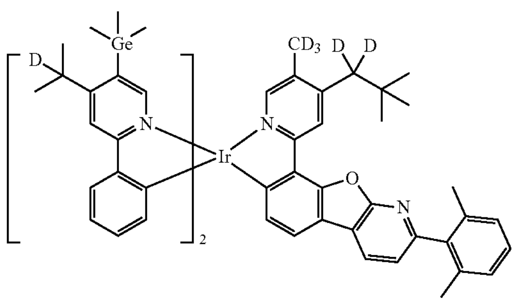
1498
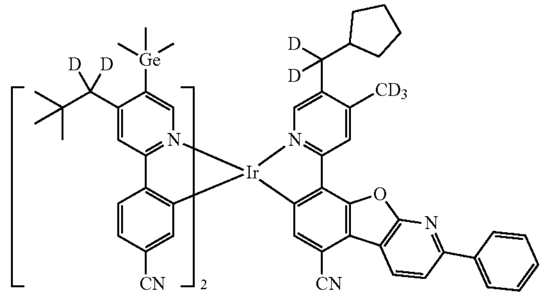
1499
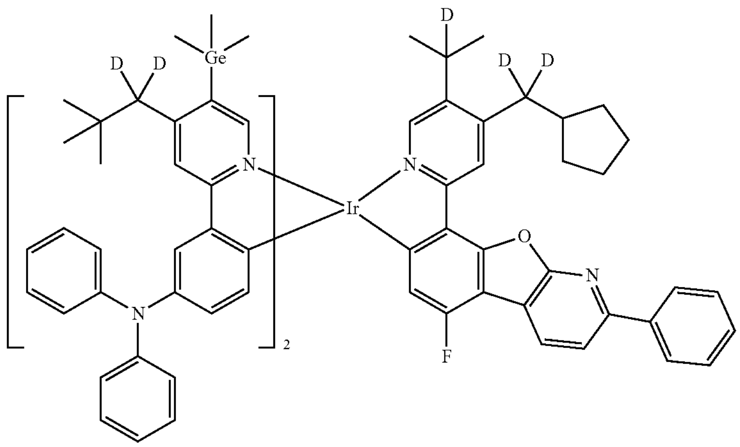
1500
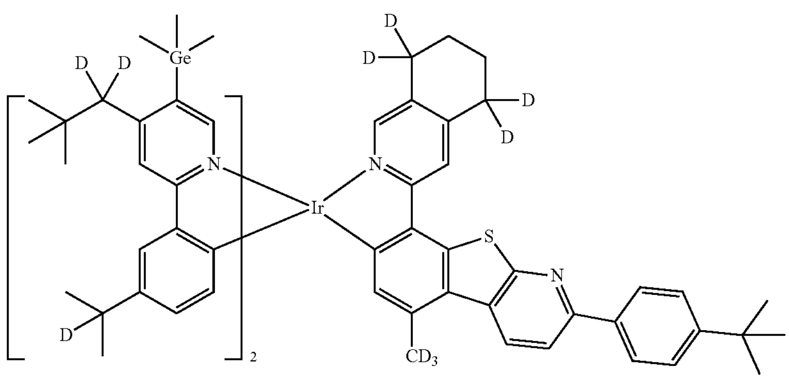
1501
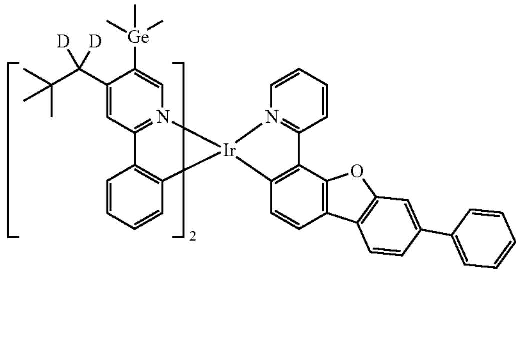
1502
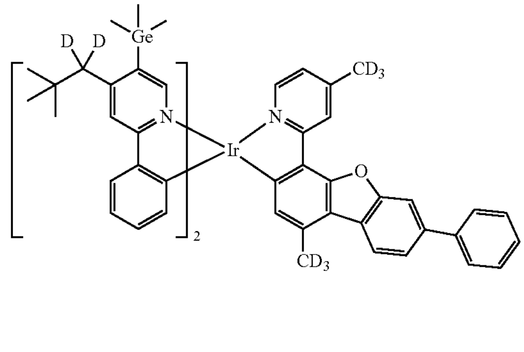

-continued
1503
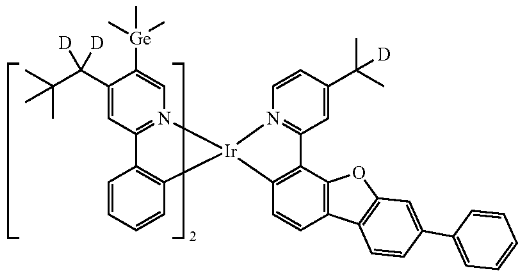
1504
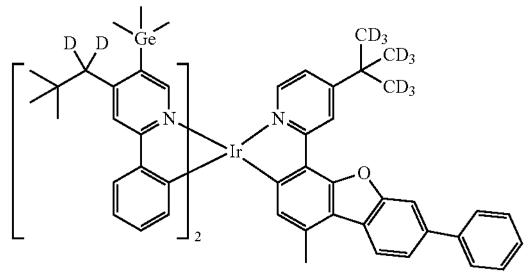
1505
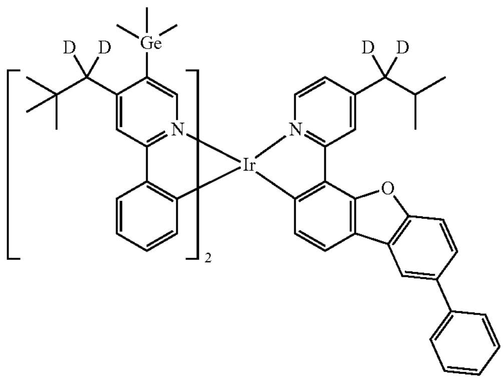
1506
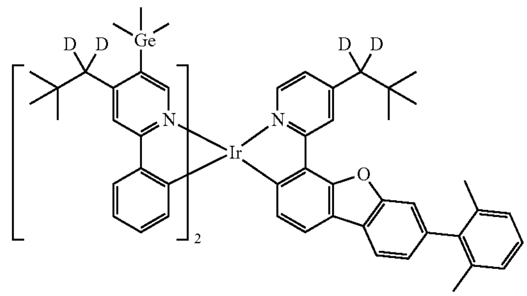
1507
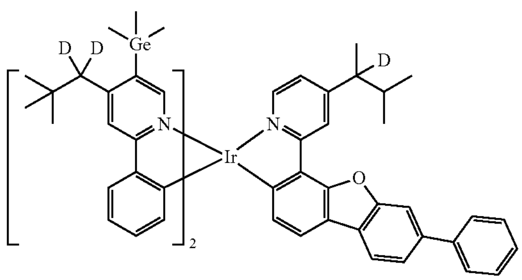
1508
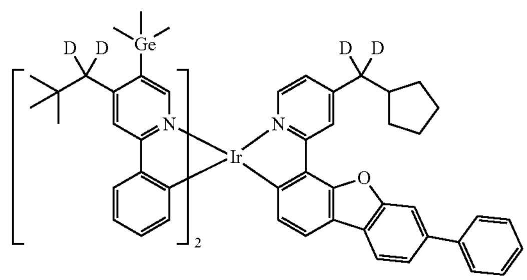
1509
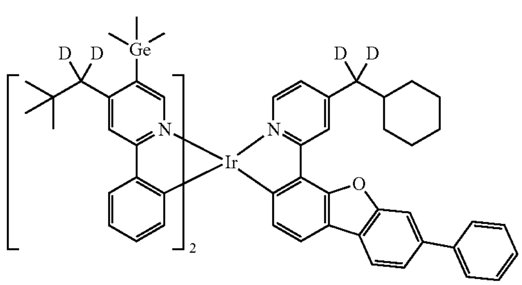
1510
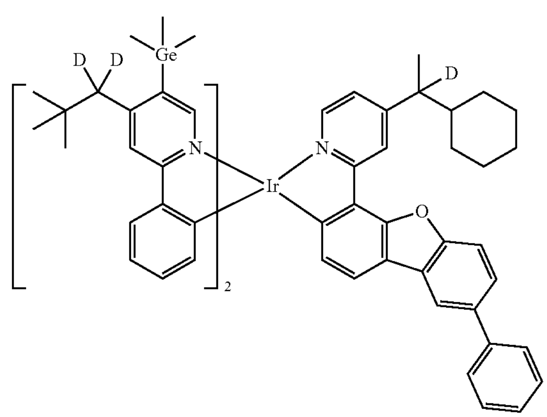

-continued
1511
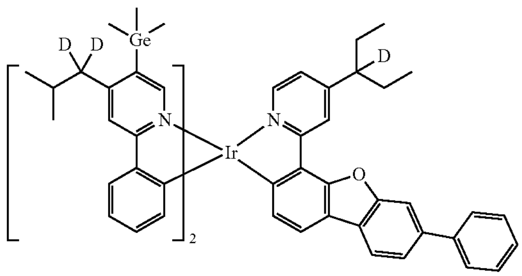
1512
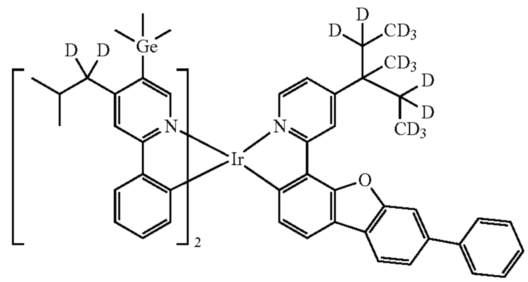
1513
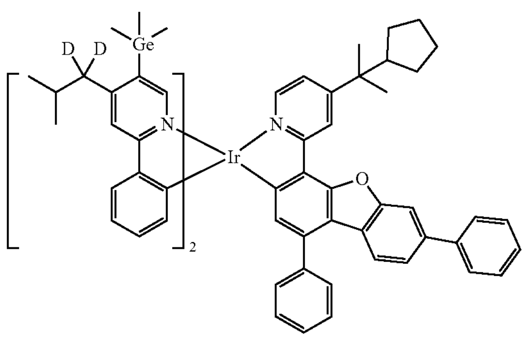
1514
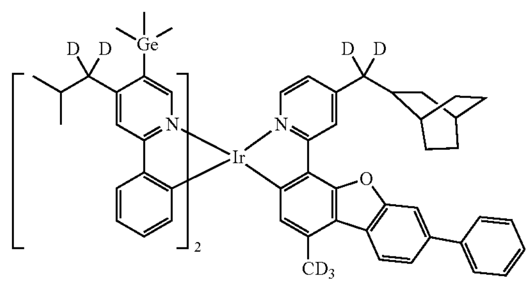
1515
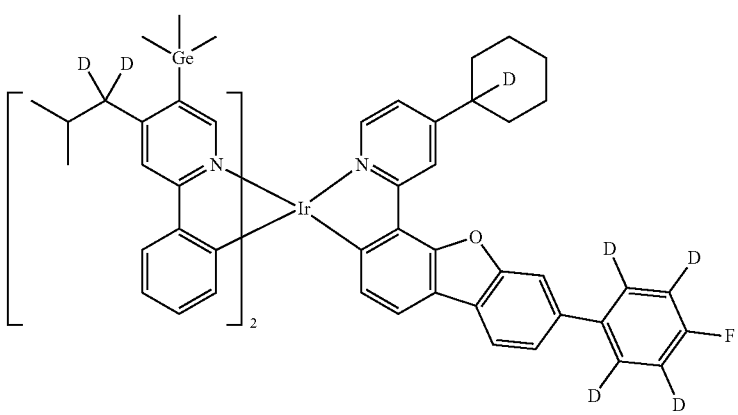
1516
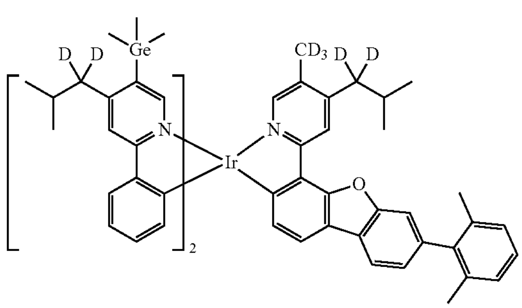
1517
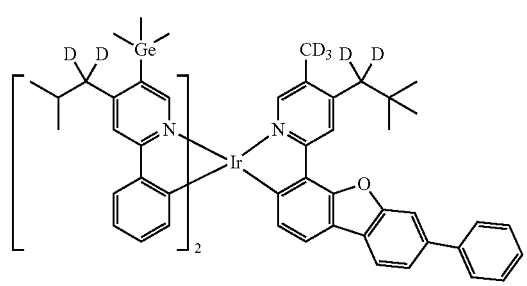

-continued
1518
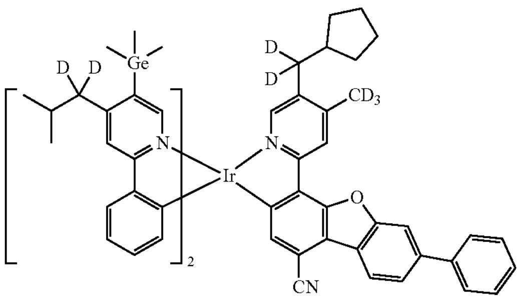
1519
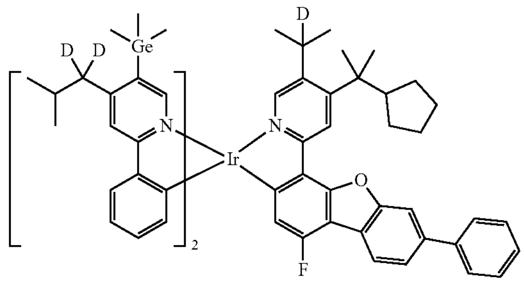
1520
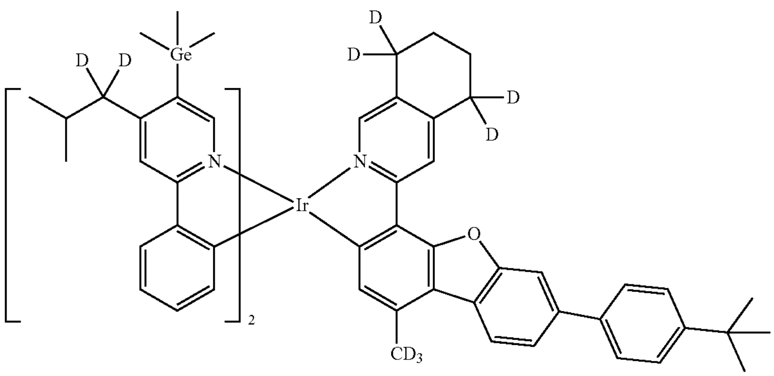
1521
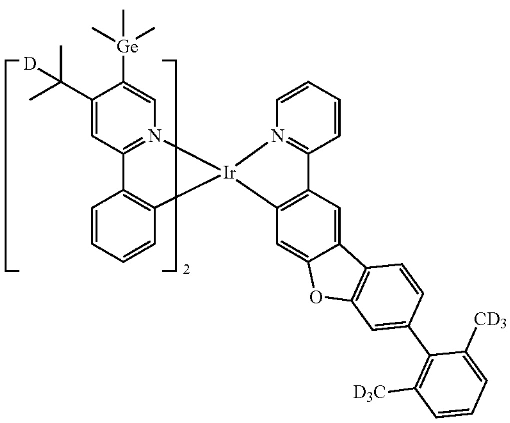
1522
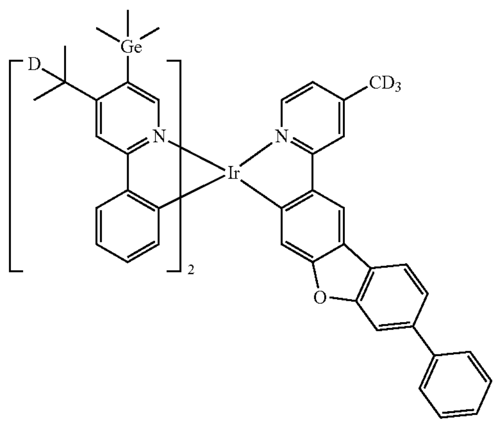
1523
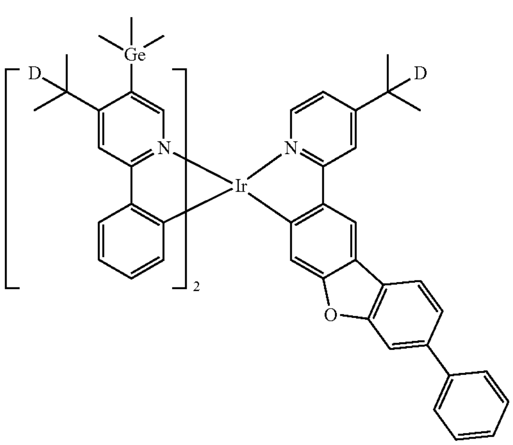
1524
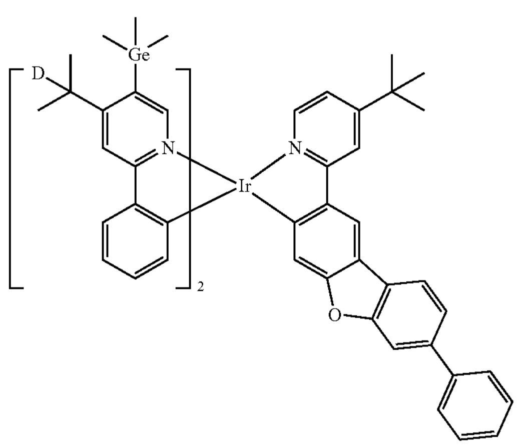

-continued
1525
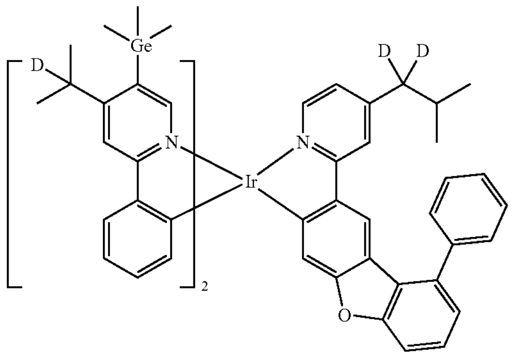
1526
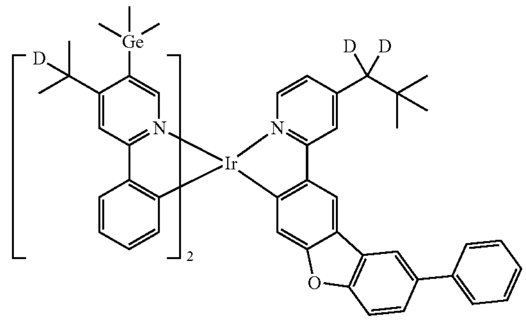
1527
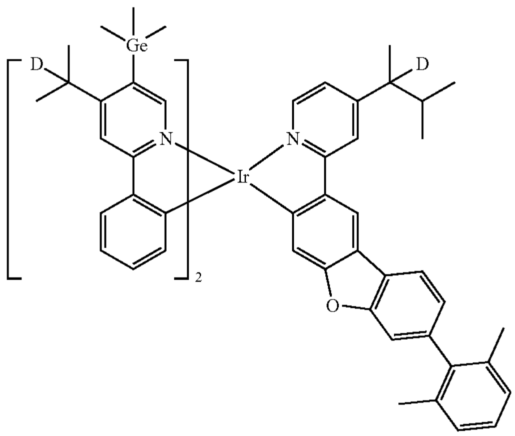
1528
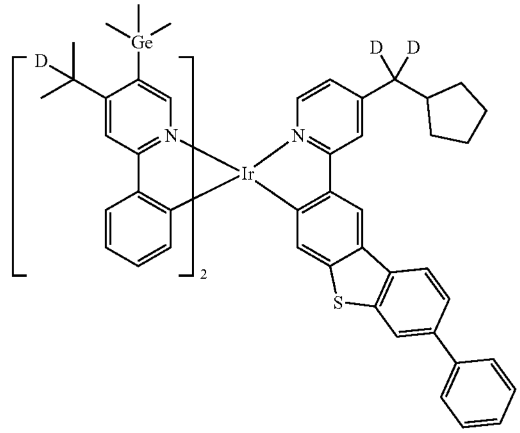
1529
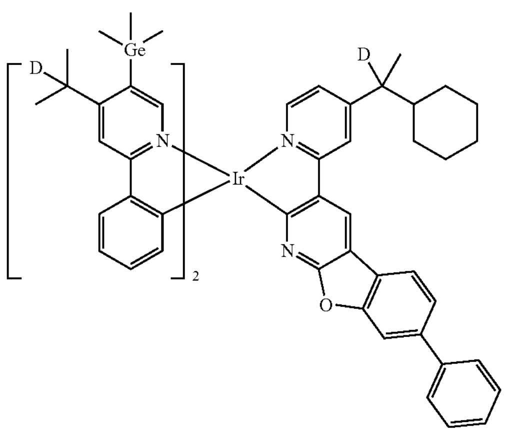
1530
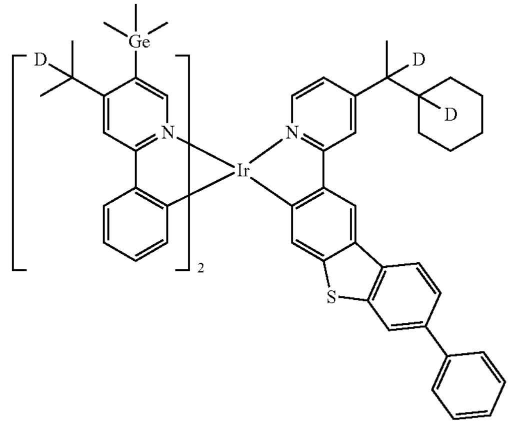
1531
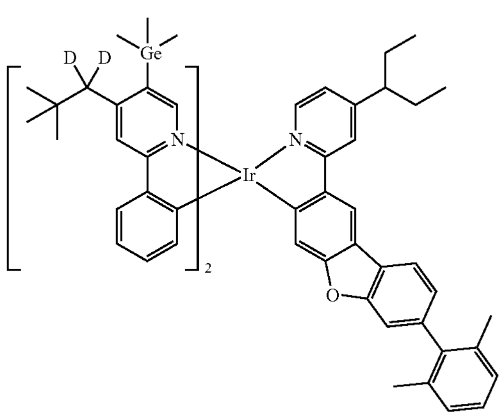
1532
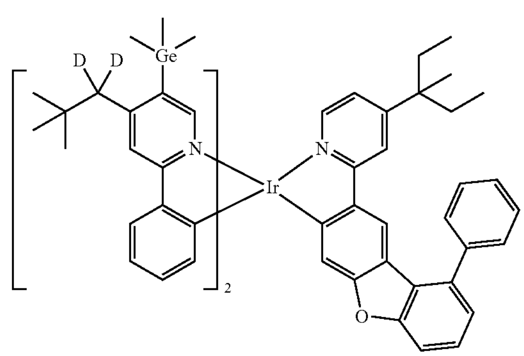

-continued
1533
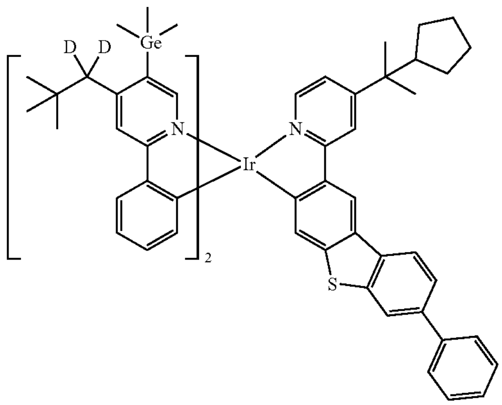
1534
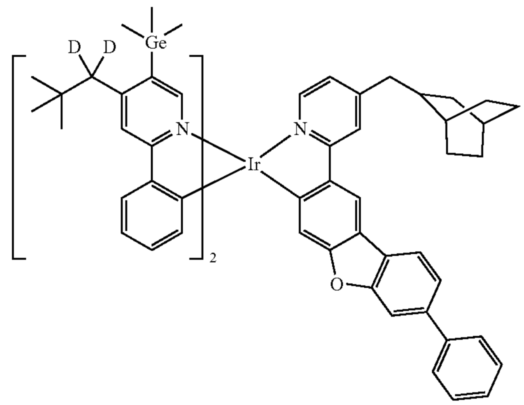
1535
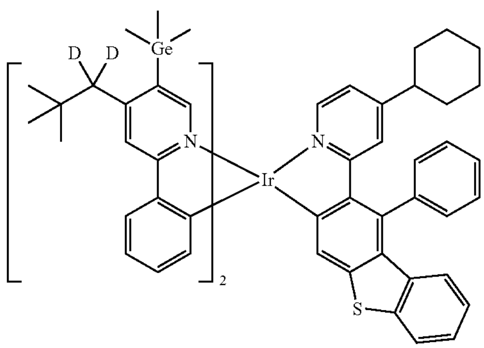
1536
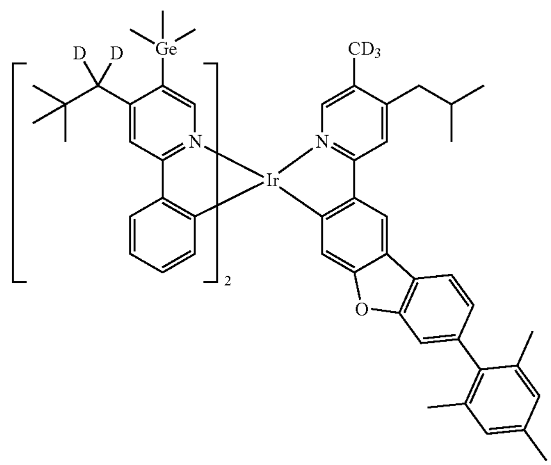
1537
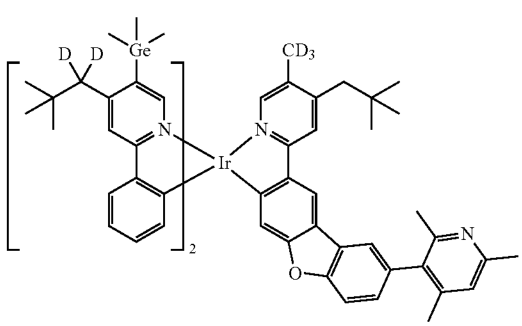
1538
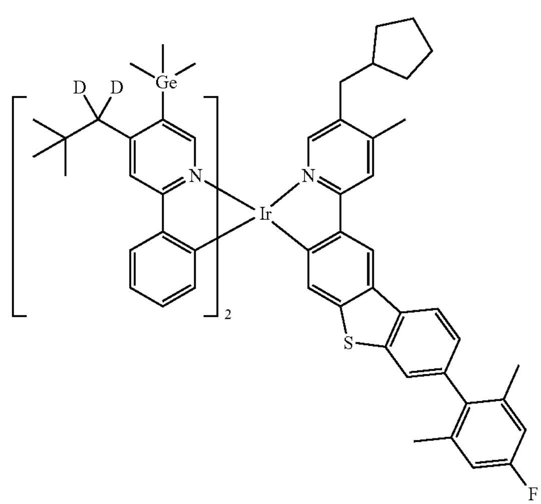

-continued
1539
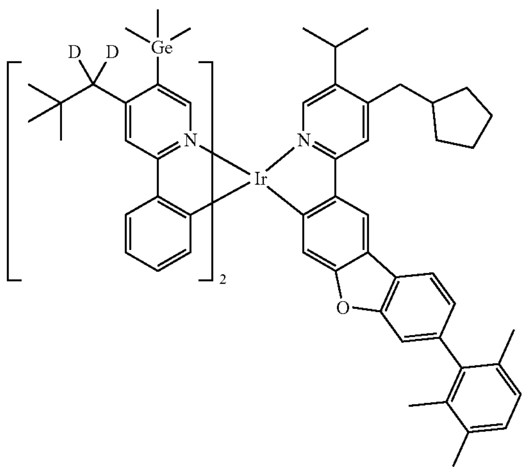
1540
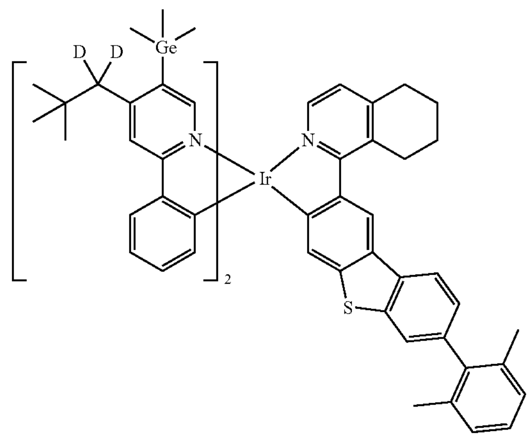
1541
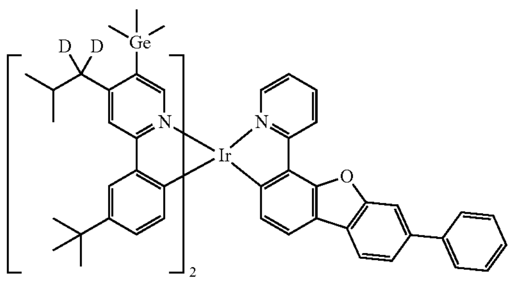
1542
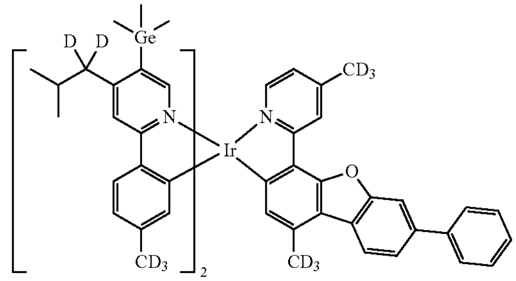
1543
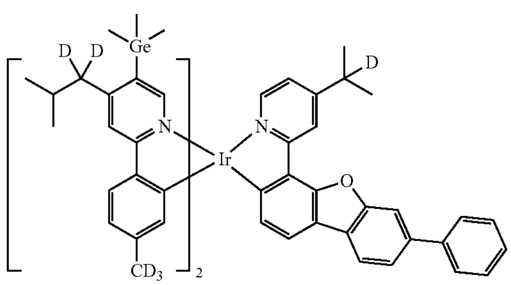
1544
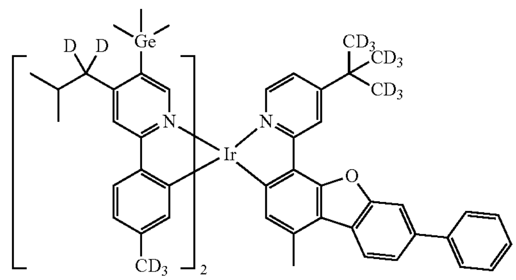
1545
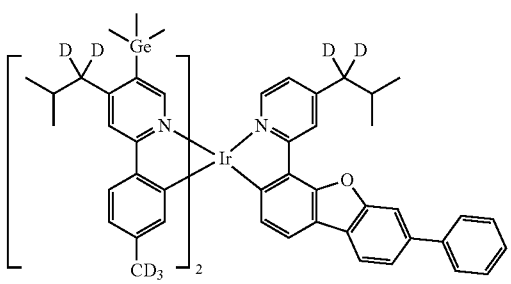
1546
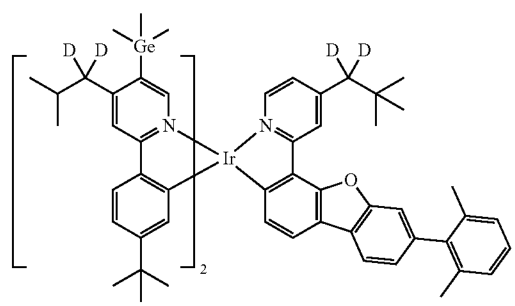
1547
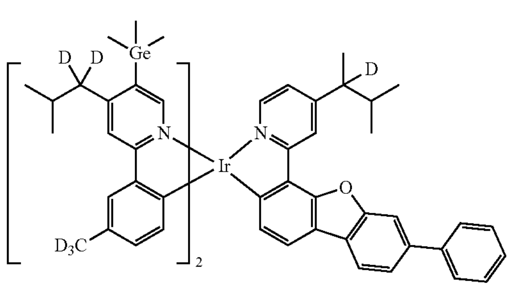
1548
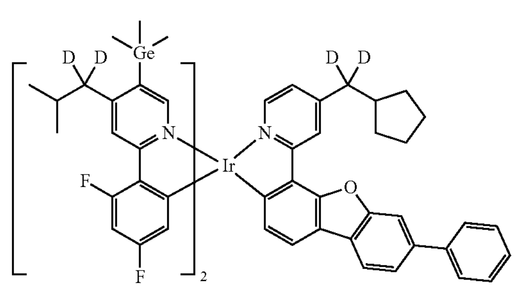

-continued
1549
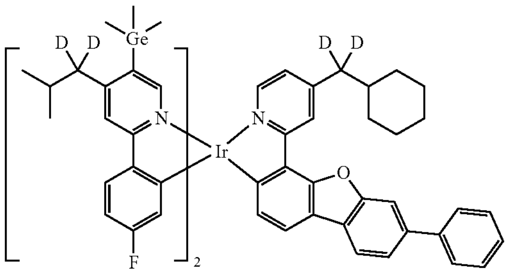
1550
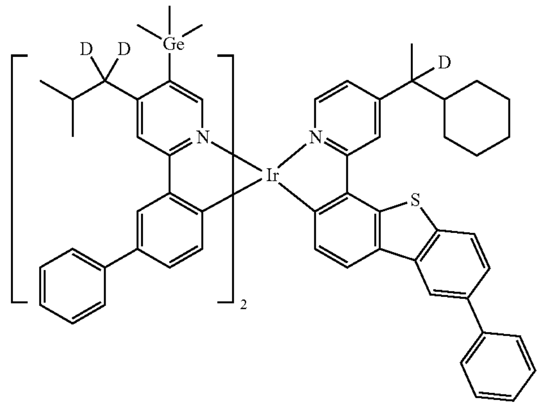
1551
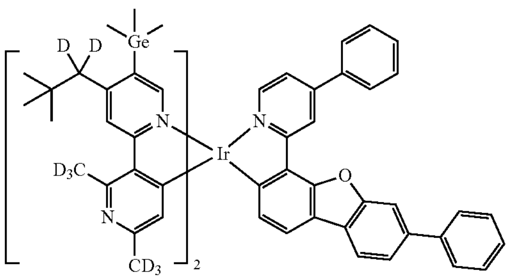
1552
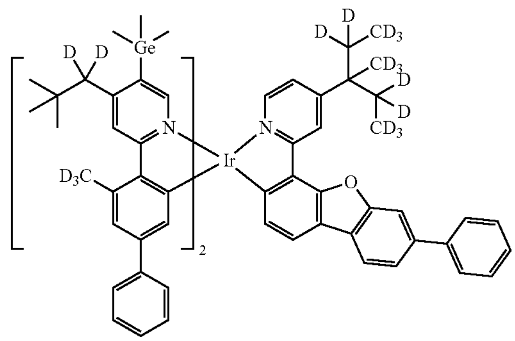
1553
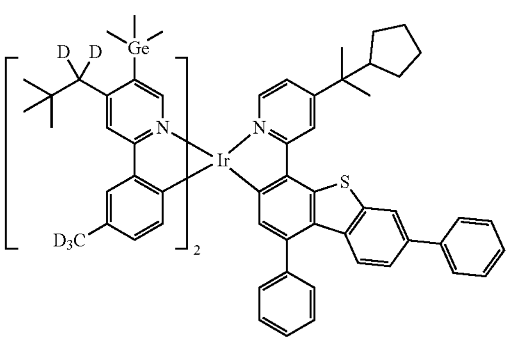
1554
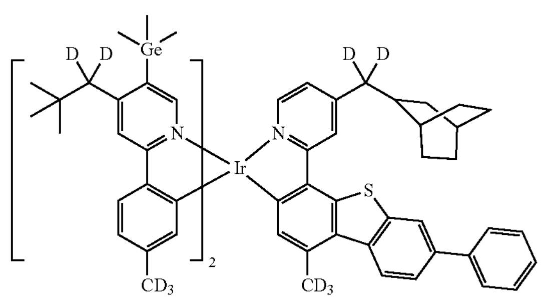
1555
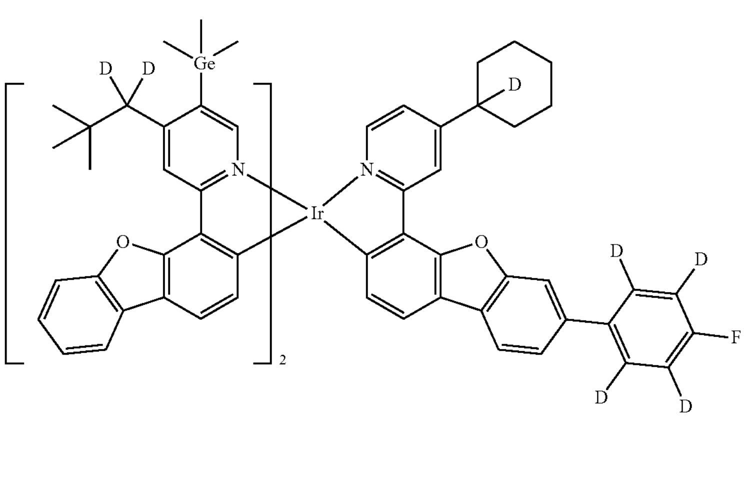

-continued
1556
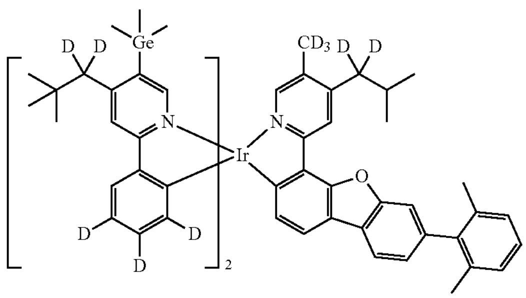
1557
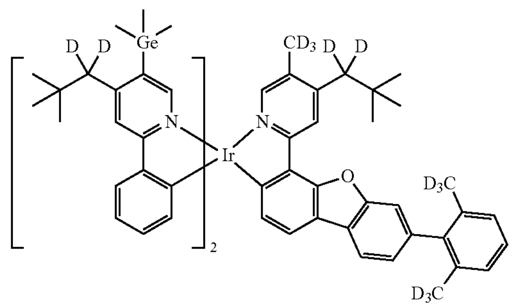
1558
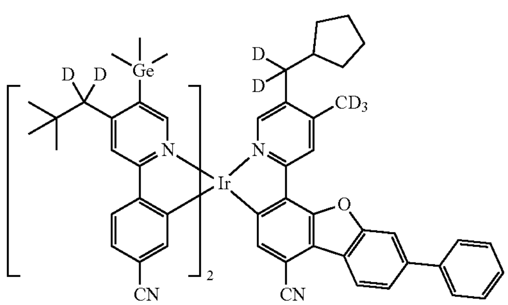
1559
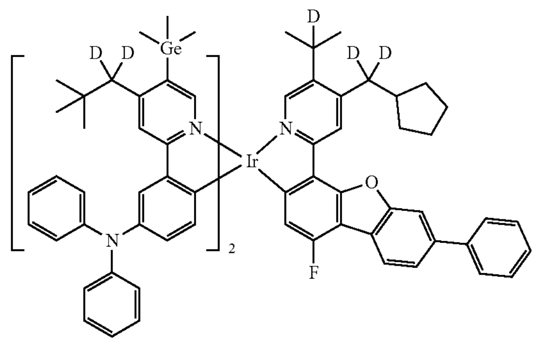
1560
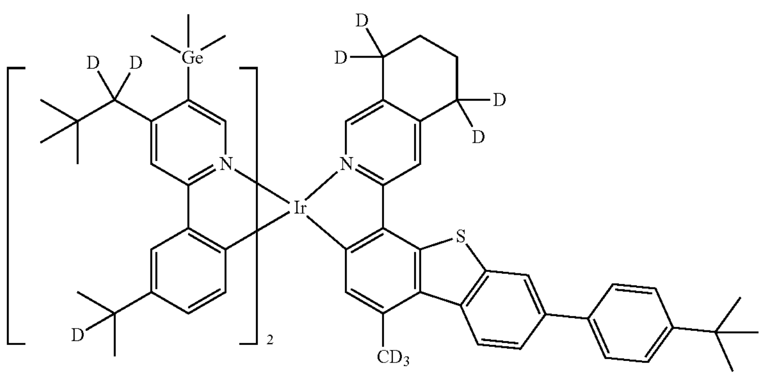
1561
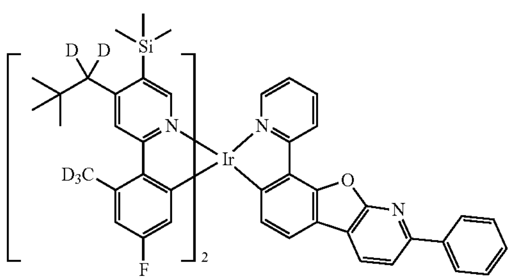
1562
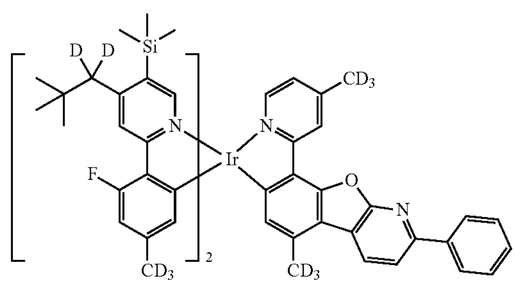
1563
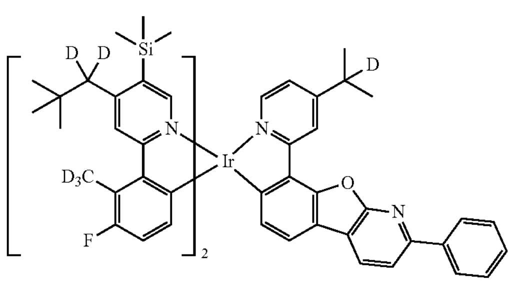
1564
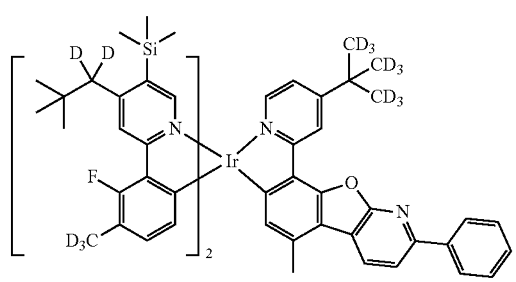

-continued
1565
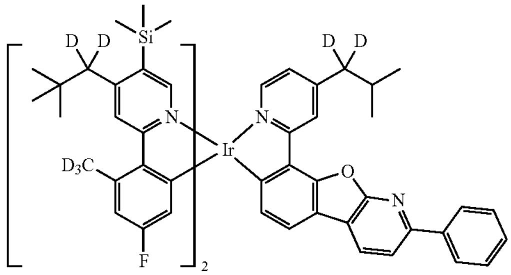
1566
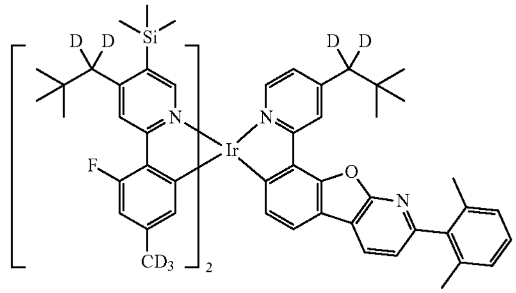
1567
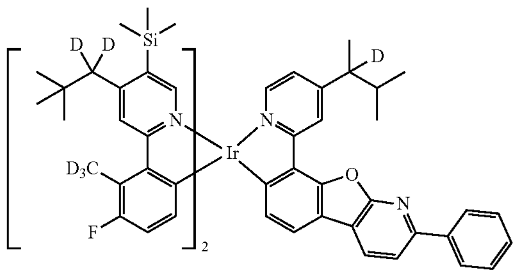
1568
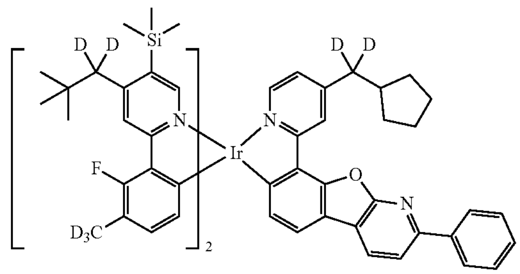
1569
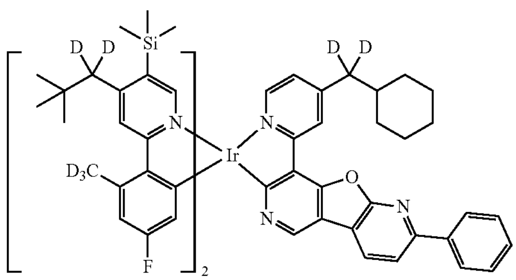
1570
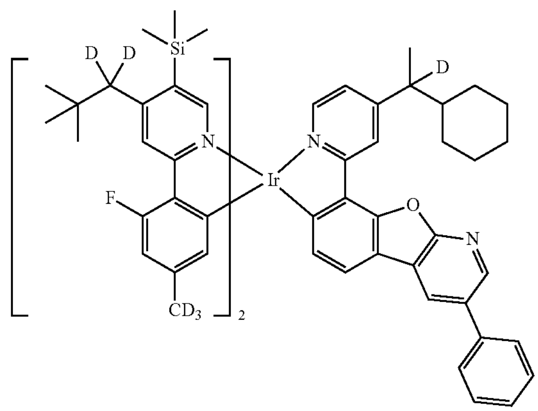
1571
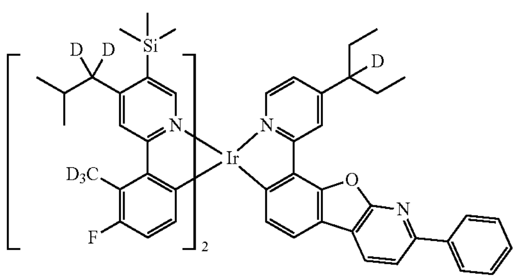
1572
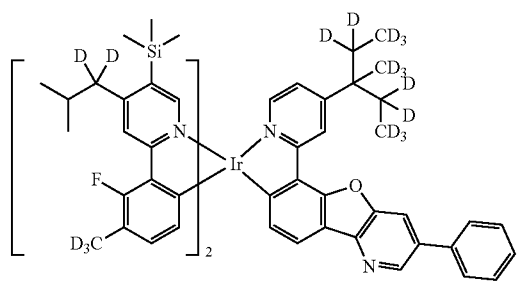
1573
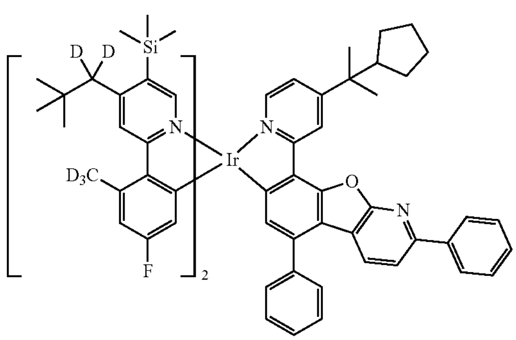
1574
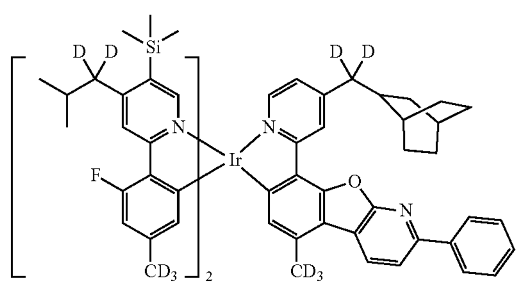

-continued
1575
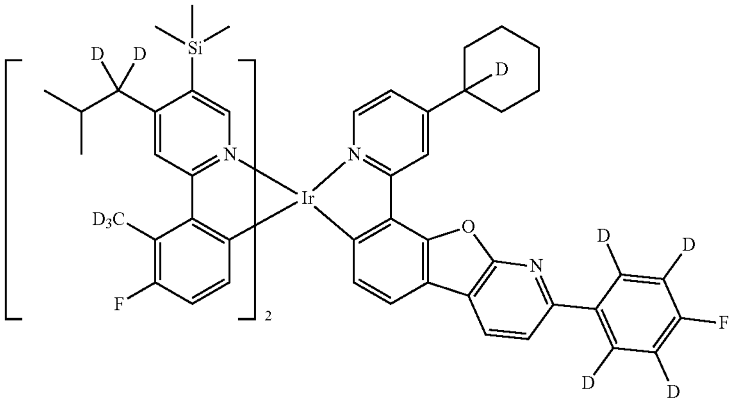
1576
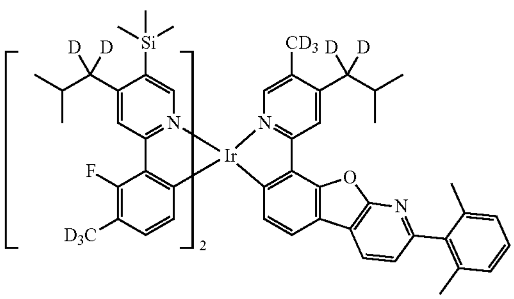
1577
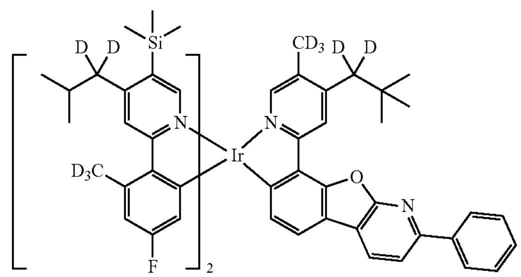
1578
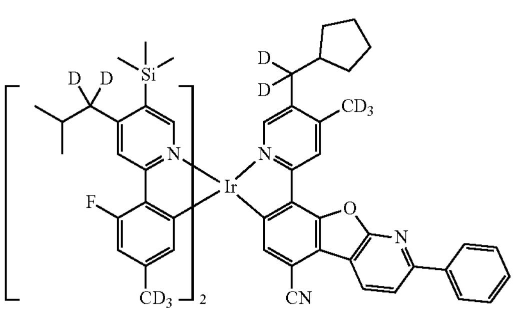
1579
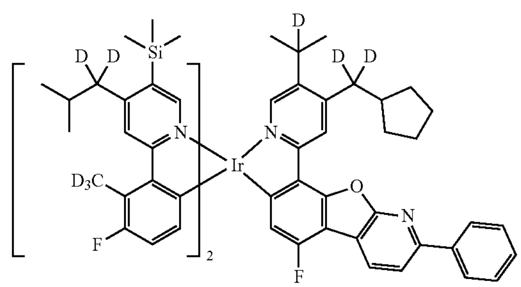
1580
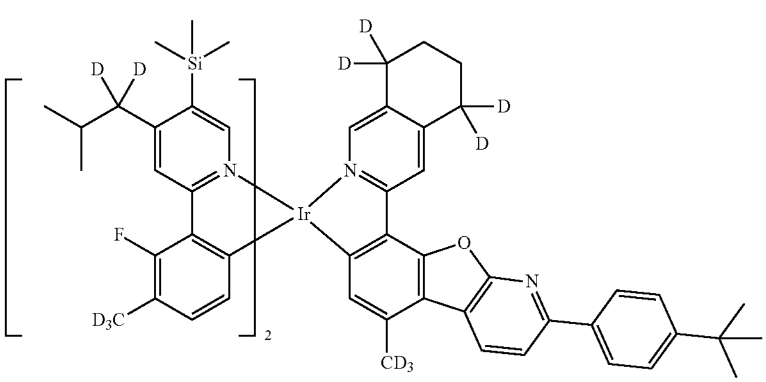

-continued
1581
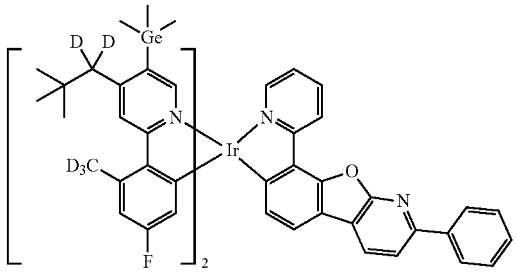
1582
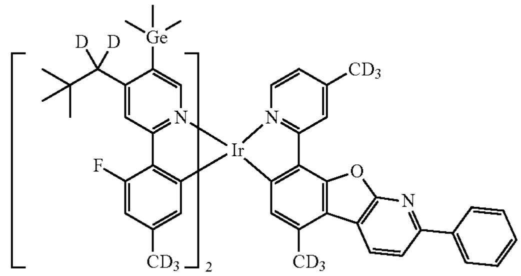
1583
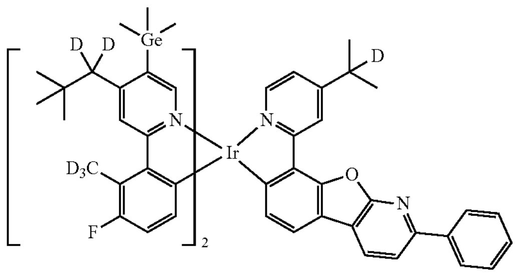
1584
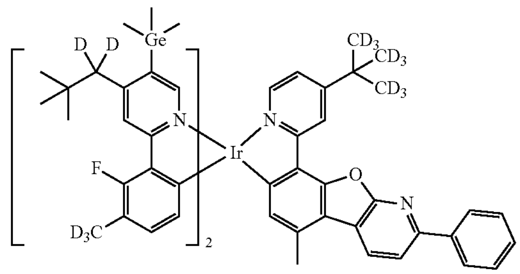
1585
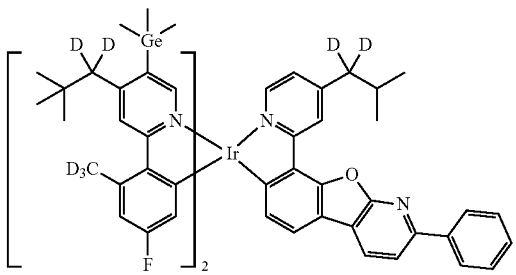
1586
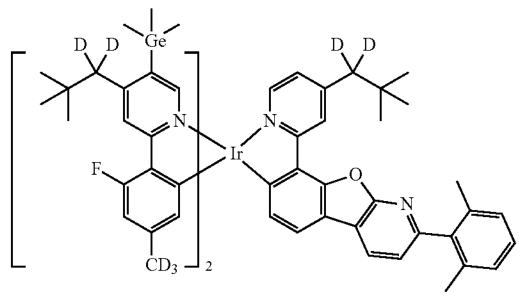
1587
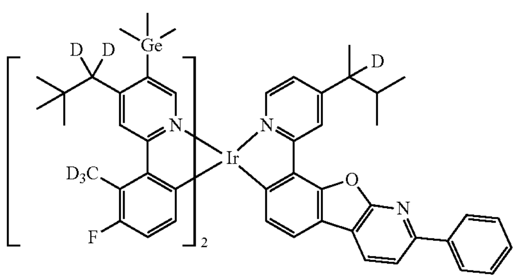
1588
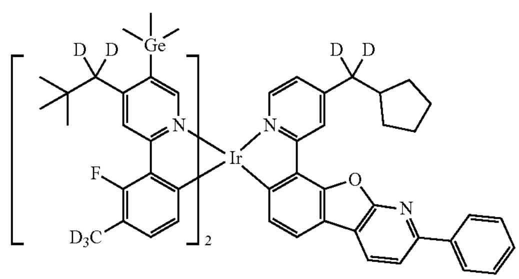
1589
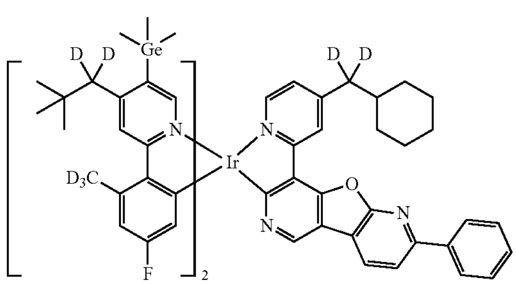
1590
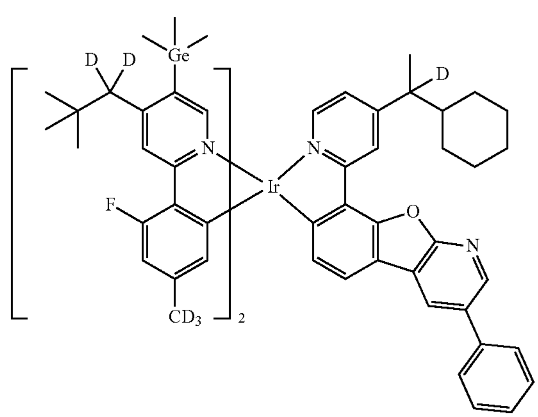

-continued
1591
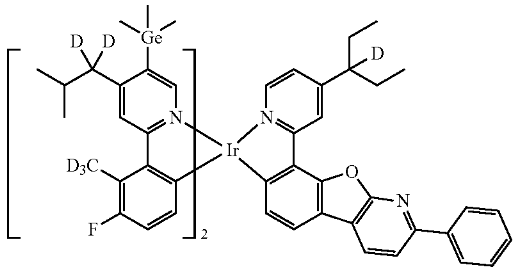
1592
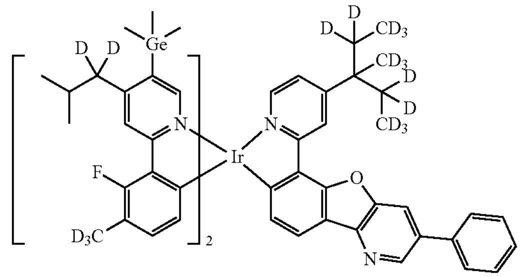
1593
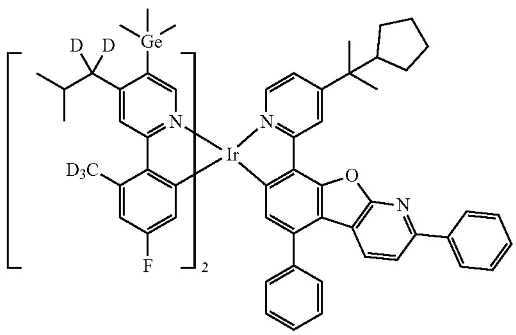
1594
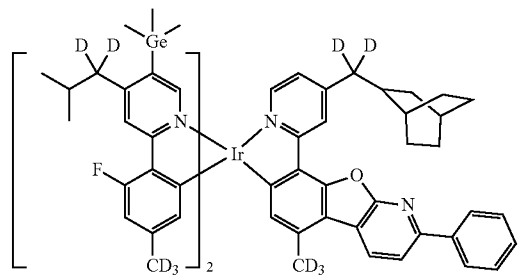
1595
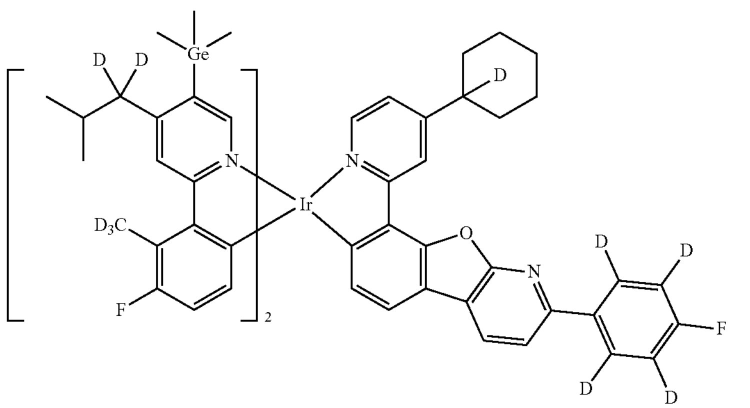
1596
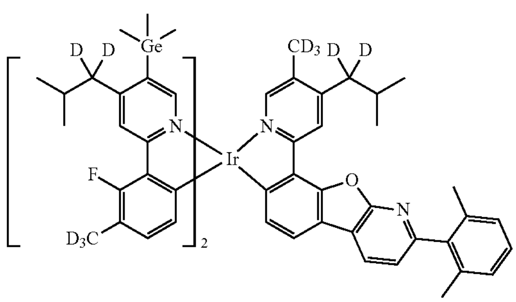
1597
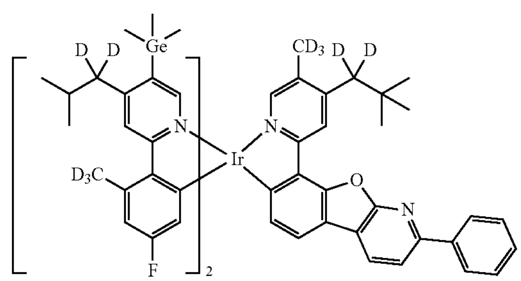
1598
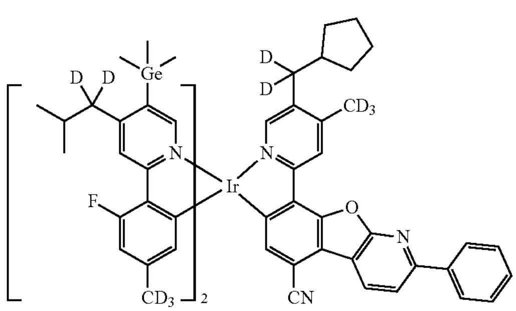
1599
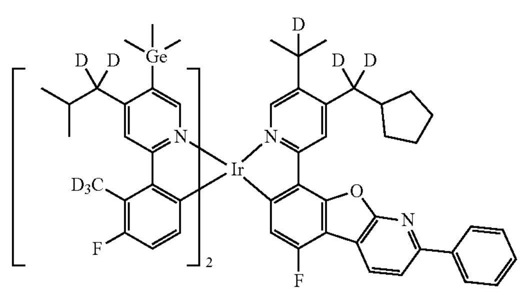

-continued
1600
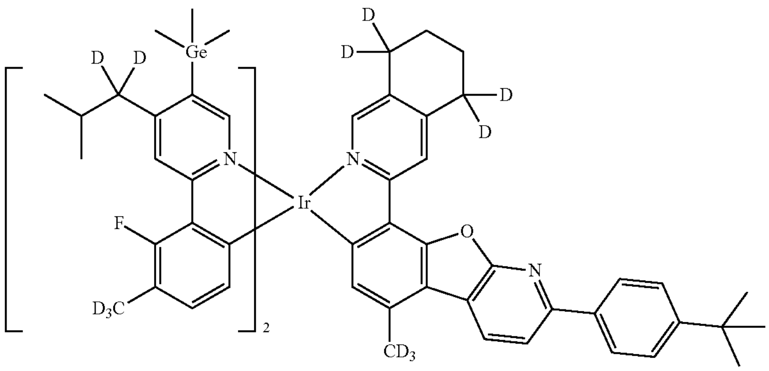
1601
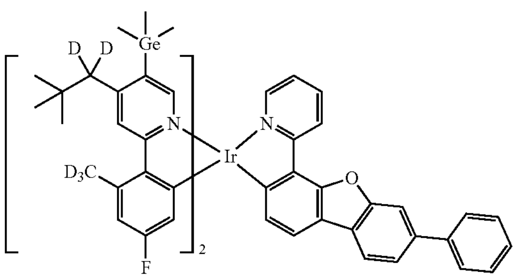
1602
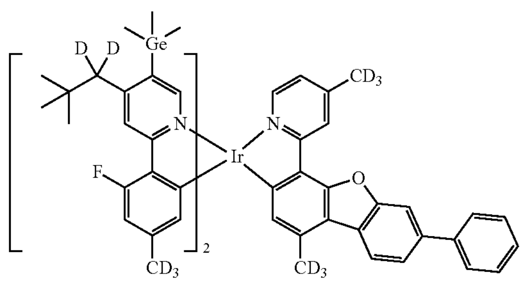
1603
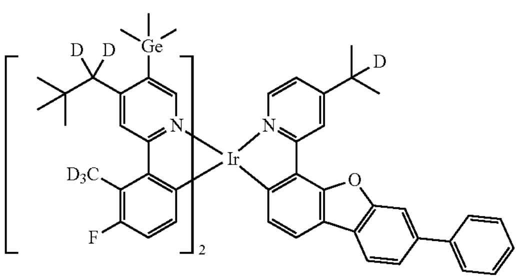
1604
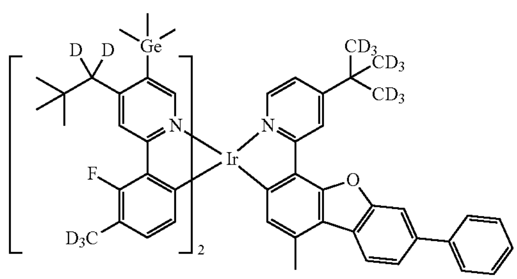
1605
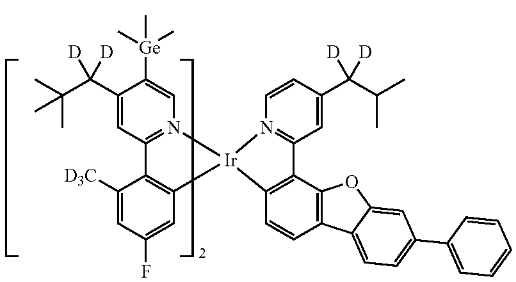
1606
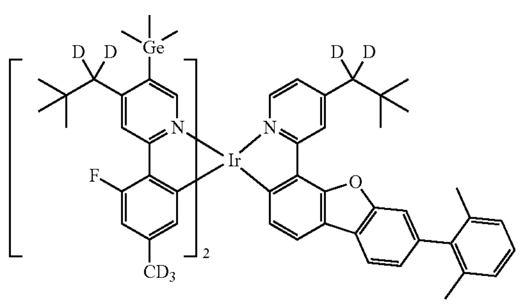
1607
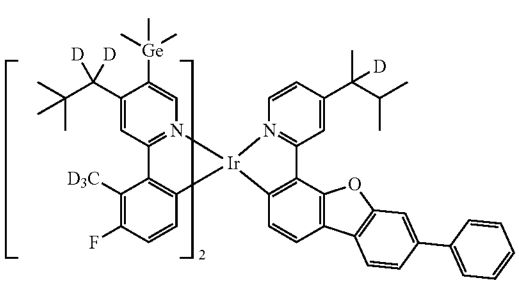
1608
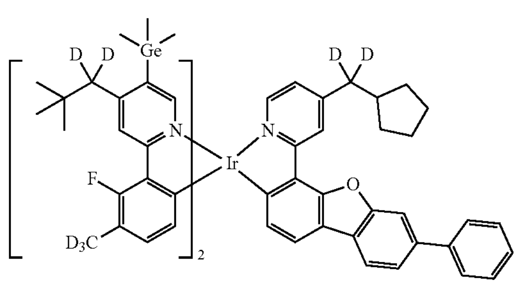

-continued
1609
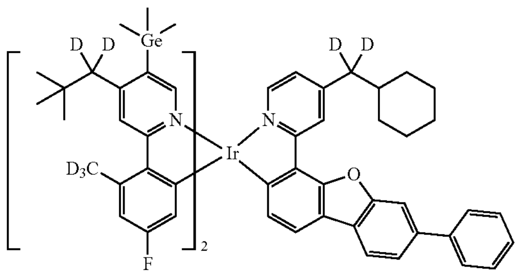
1610
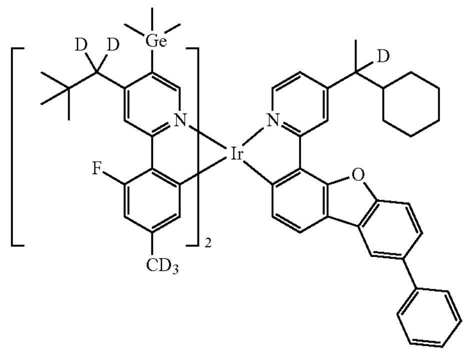
1611
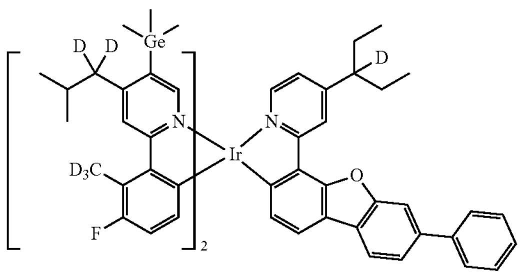
1612
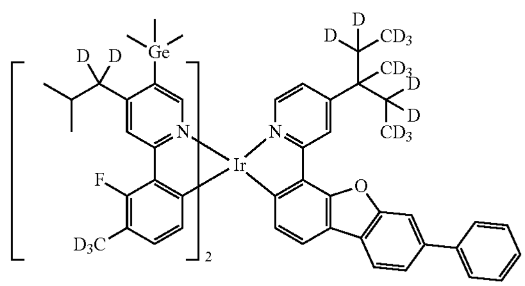
1613
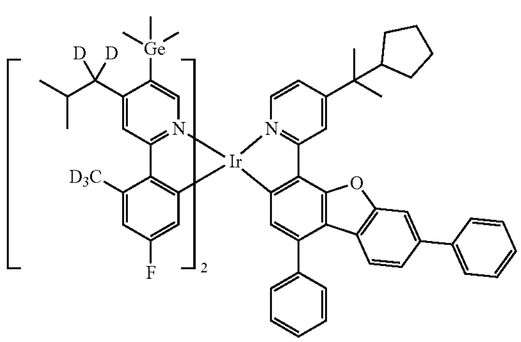
1614
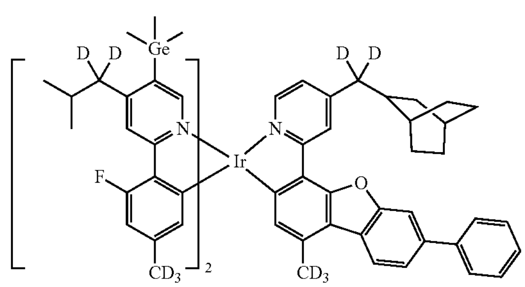
1615
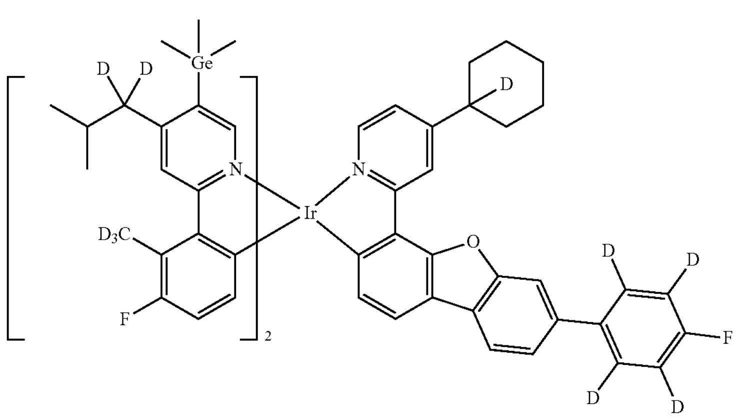

-continued

1616

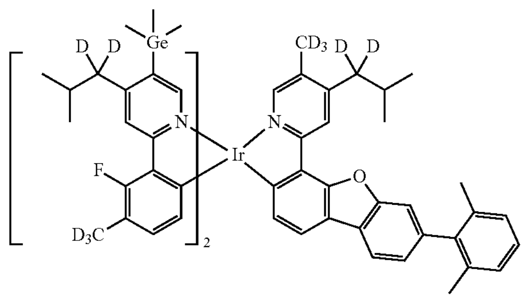

1617

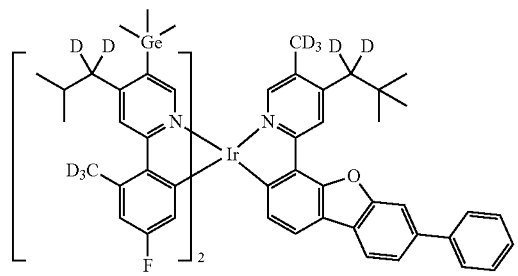

1618

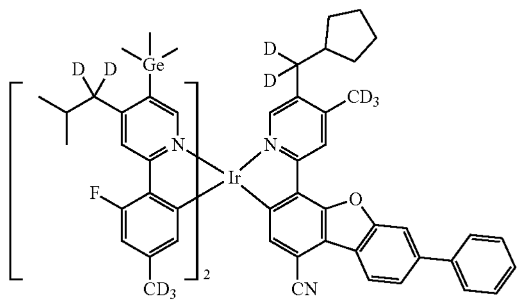

1619

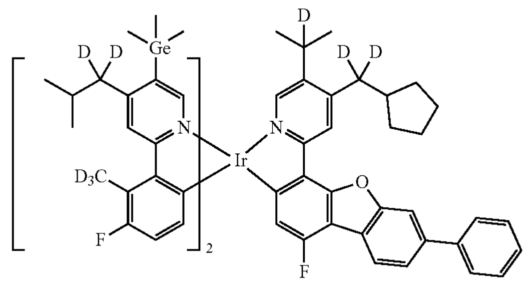

1620

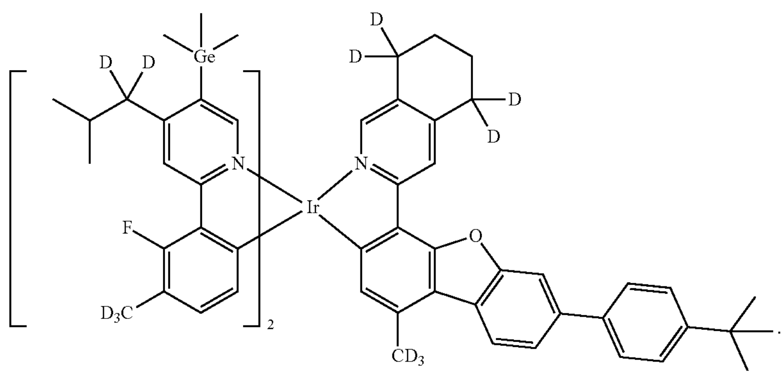

In Compounds 1 to 1620, OMe indicates a methoxy group.

$L_1$ of the organometallic compound represented by Formula 1 may be a ligand represented by Formula 2A, and n1 which indicates the number of $L_1$(s) may be 1 or 2. $L_2$ of the organometallic compound represented by Formula 1 may be a ligand represented by Formula 2B, and n2 which indicates the number of $L_2$(S) may be 1 or 2. Here, $L_1$ and $L_2$ are different from each other. That is, the organometallic compound may be a heteroleptic complex essentially including, as ligands linked to metal M, at least one ligand represented by Formula 2A and at least one ligand represented by Formula 2B.

A group represented by *—$X_1(R_{21})(R_{22})(R_{23})$ in Formula 1 may be linked to the fifth position of a pyridine ring in a ligand represented by Formula 2B (see Formula 2B). Accordingly, the organometallic compound including the ligand represented by Formula 2B may have excellent heat resistance and degradation resistance so that an electronic device, for example, an organic light-emitting device, including the organometallic compound may have high stability and long lifespan in production, storage, and/or operation.

Furthermore, when $X_1$ is Si, at least one of $T_1$ to $T_8$ which are not linked to M and ring CY1 in Formula 2A may be N. Accordingly, an electronic device, for example, an organic light-emitting device, including the organometallic compound represented by Formula 1 may have improved driving voltage and roll-off ratio.

In one or more embodiments, in Formulae 2A and 2B, $R_{21}$ to $R_{23}$, $Z_1$, $Z_2$, and $R_{11}$ to $R_{14}$ do not each include a silicon (Si). Accordingly, an electronic device, for example, an organic light-emitting device, including the organometallic compound represented by Formula 1 may have improved out-coupling characteristics.

In addition, $R_{12}$ in Formula 2B is not hydrogen nor a methyl group. As such, the organometallic compound represented by Formula 1 may emit light that is shifted toward relatively shorter wavelengths, for example, blue light, green light, or greenish blue light, and an electronic device, for example, an organic light-emitting device, including the organometallic compound may have an excellent out-coupling effect, thereby having high luminescence efficiency.

A highest occupied molecular orbital (HOMO) energy level, a lowest unoccupied molecular orbital (LUMO) energy level, a singlet ($S_1$) energy level, and a triplet ($T_1$)

energy level of some compounds of the organometallic compound represented by Formula 1 are evaluated by a density functional theory (DFT) of Gaussian program with molecular structure optimization based on B3LYP, and results are shown in Table 1.

TABLE 1

| Compound No. | HOMO (eV) | LUMO (eV) | $S_1$ (eV) | $T_1$ (eV) |
|---|---|---|---|---|
| 123 | −4.773 | −1.203 | 2.880 | 2.546 |
| 301 | −4.787 | −1.314 | 2.738 | 2.476 |
| 226 | −4.780 | −1.208 | 2.876 | 2.529 |
| 545 | −4.767 | −1.196 | 2.879 | 2.526 |

Referring to Table 1, it is confirmed that the organometallic compound represented by Formula 1 has such electrical characteristics that are suitable for use in an electronic device, for example, for use as a dopant for an organic light-emitting device.

Synthesis methods of the organometallic compound represented by Formula 1 may be recognizable by one of ordinary skill in the art by referring to Synthesis Examples provided below.

Therefore, the organometallic compound represented by Formula 1 may be suitable for use in an organic layer of an organic light-emitting device, for example, for use as a dopant in an emission layer of the organic layer. Another aspect of the present disclosure provides an organic light-emitting device including: a first electrode, a second electrode, and an organic layer disposed between the first electrode and the second electrode and including an emission layer, wherein the organic layer may include at least one organometallic compound represented by Formula 1.

The organic light-emitting device may have, due to the inclusion of an organic layer including the organometallic compound represented by Formula 1, a low driving voltage, high external quantum efficiency, a long lifespan, a low roll-off ratio, and excellent color purity.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, green light or blue light.

The expression "(an organic layer) includes at least one of the organometallic compound" as used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" as used herein refers to a single layer and/or a plurality of layers disposed between the first electrode and the second electrode of an organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include a material(s) with a high work function to facilitate hole injection. The first electrode 11 may be a reflective electrode, a semi-reflective electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, R-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or any combination thereof:

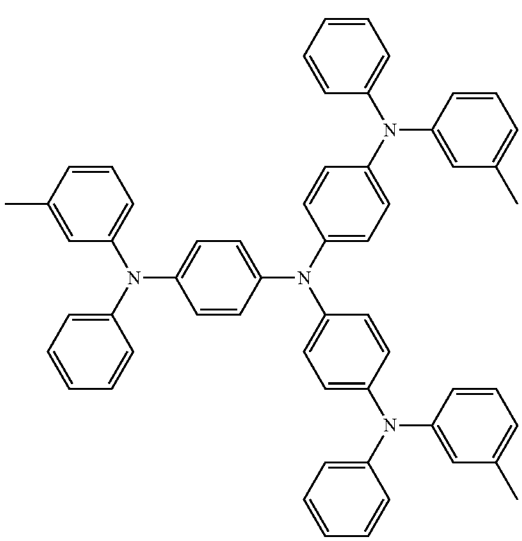

m-MTDATA

-continued

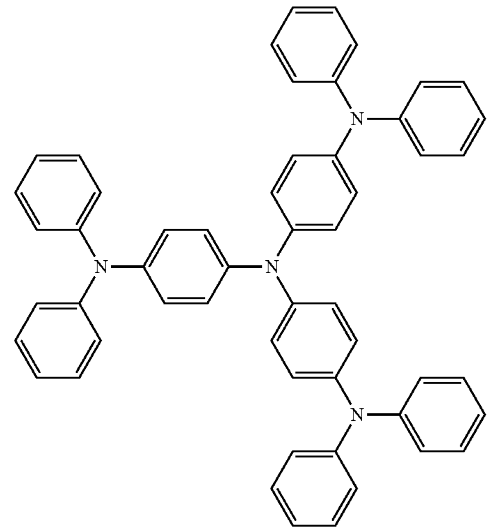

TDATA

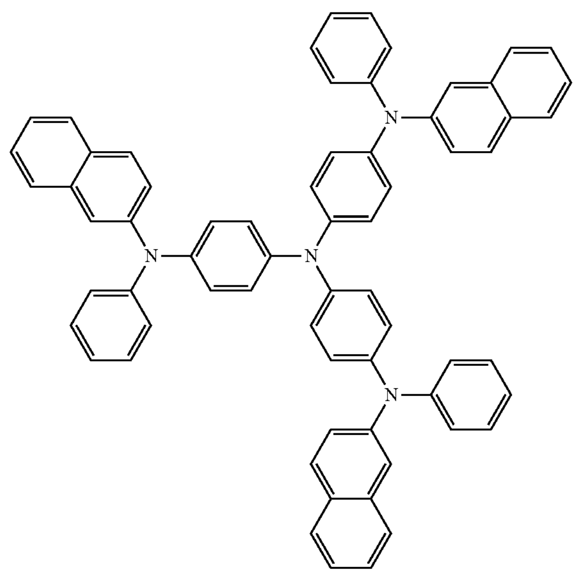

2-TNATA

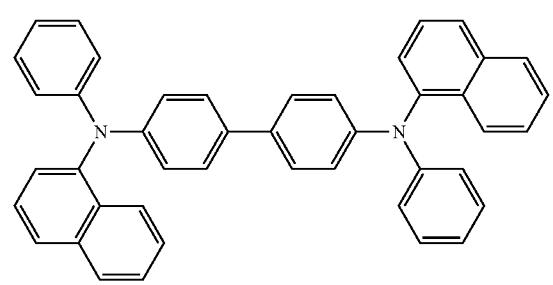

NPB

-continued

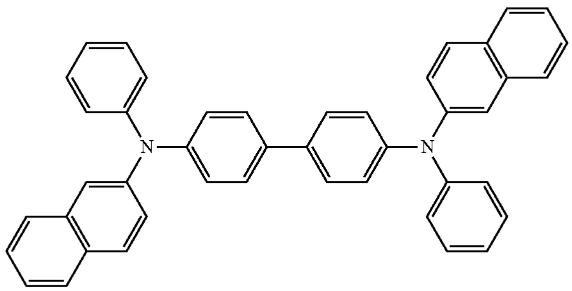

β-NPB

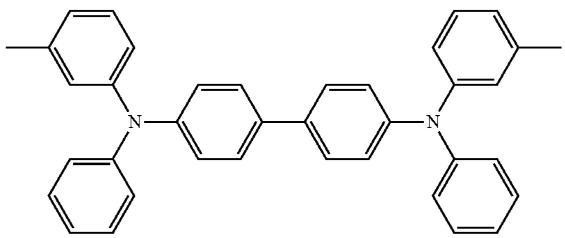

TPD

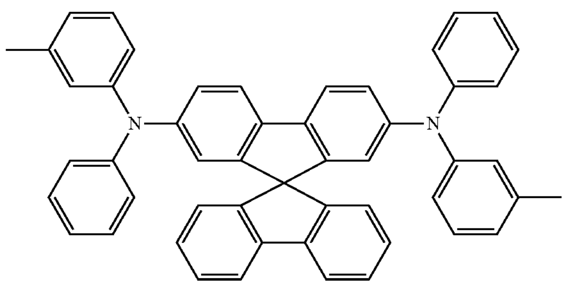

Spiro-TPD

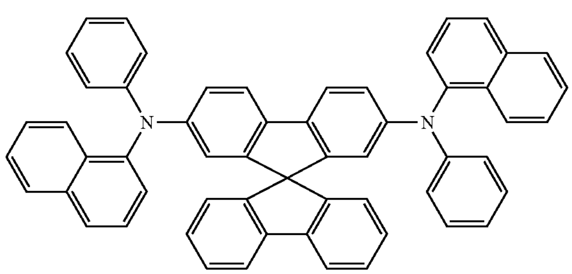

Spiro-NPB

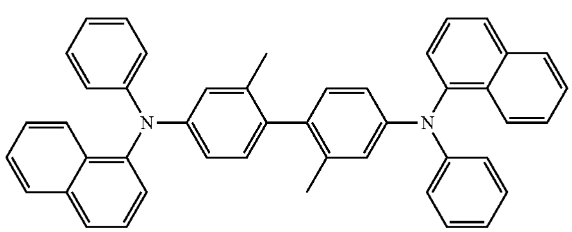

methylated NPB

-continued

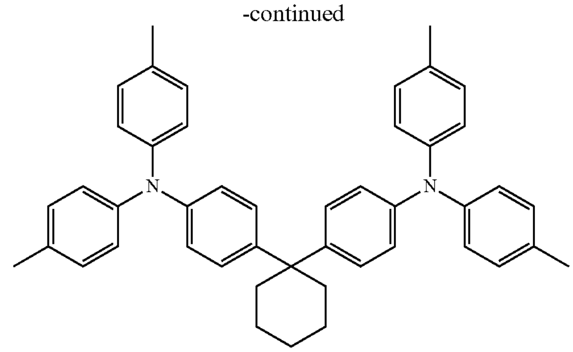

TAPC

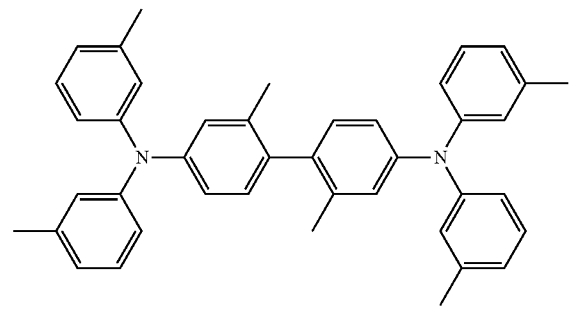

HMTPD

Formula 201

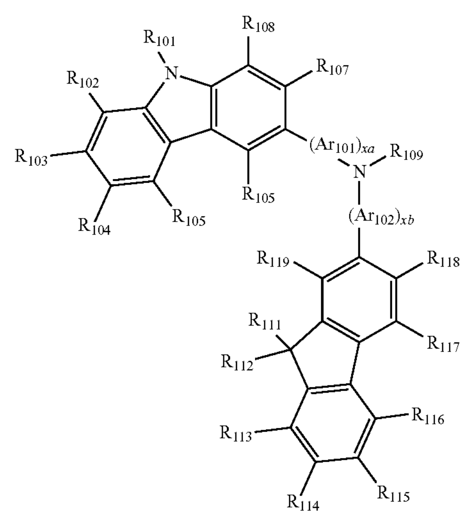

Formula 202

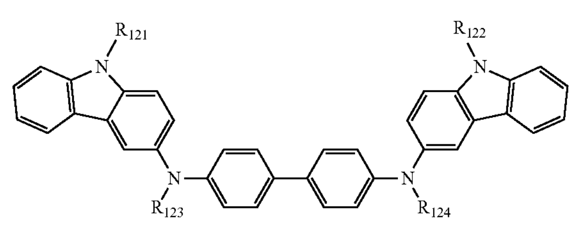

$Ar_{101}$ to $Ar_{102}$ in Formula 201 may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, or a perylenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or may be 0, 1 or 2. For example, xa may be 1 and xb may be 0.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof;

a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof $R_{109}$ in Formula 201 may be:

a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A below:

Formula 201A

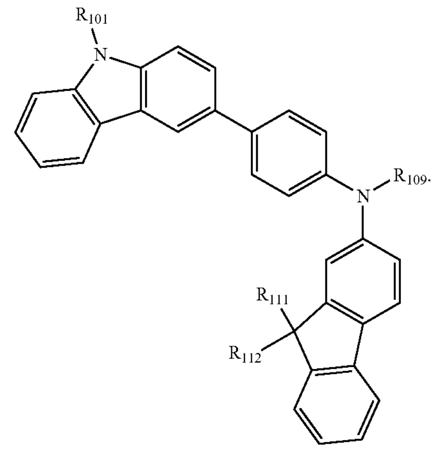

Detailed descriptions of $R_{101}$, $R_{111}$, $R_{112}$, and $R_{109}$ in Formula 201A are the same as described above.

For example, the hole transport region may include at least one of compounds HT1 to HT20 illustrated below:

HT1

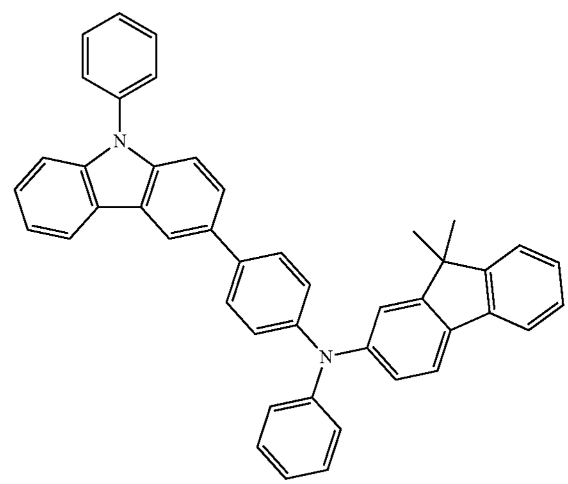

HT2

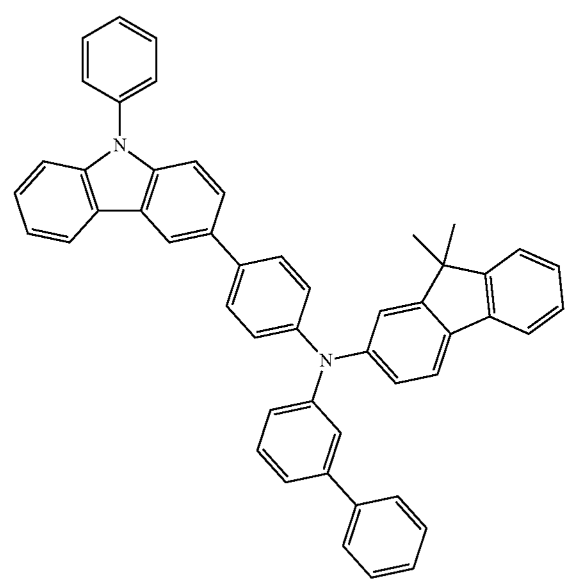

-continued
HT3
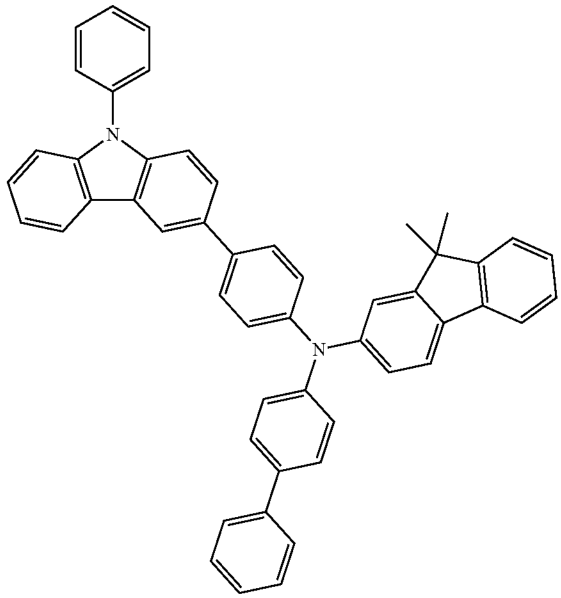
HT4
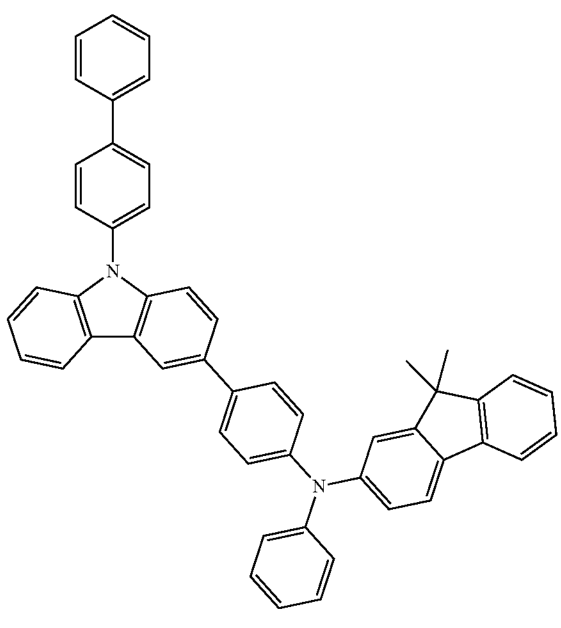
-continued
HT5
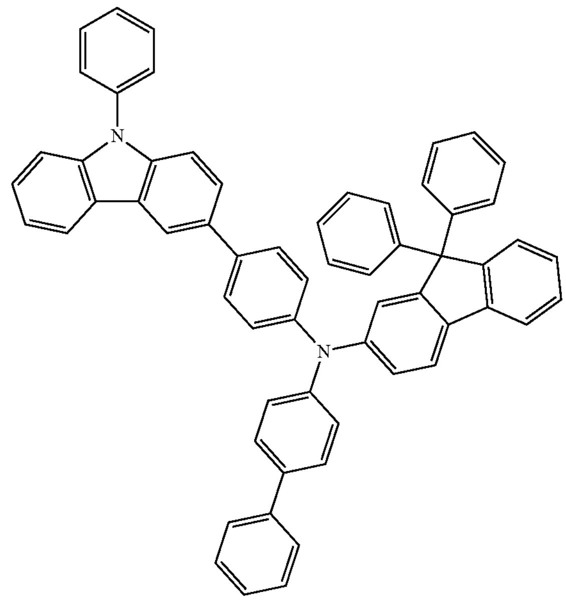
HT6
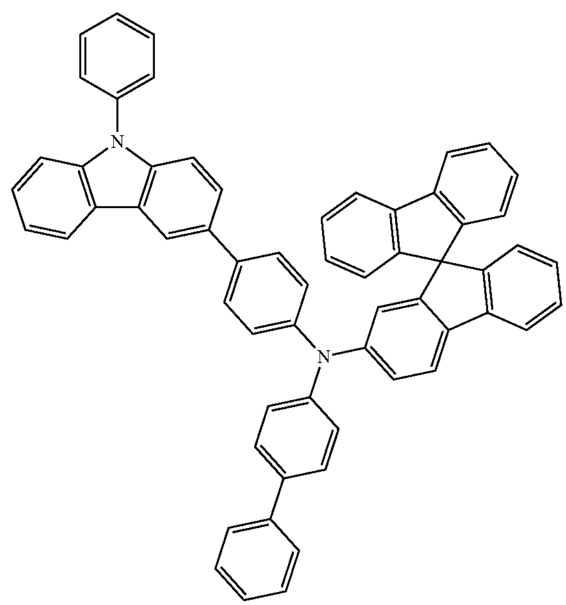

-continued
HT7
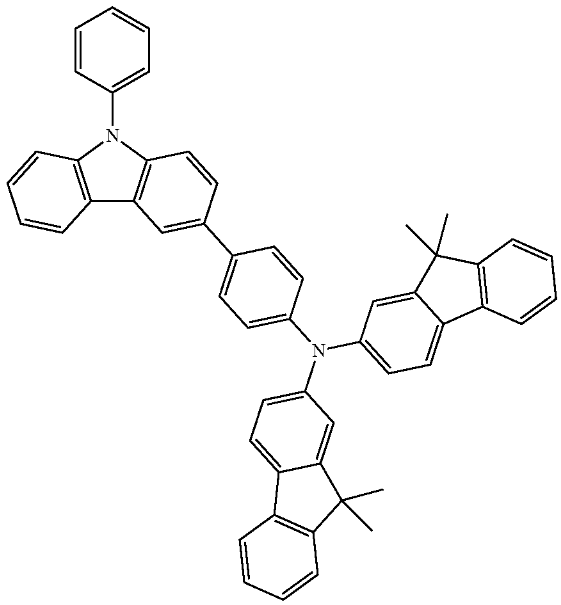
HT8
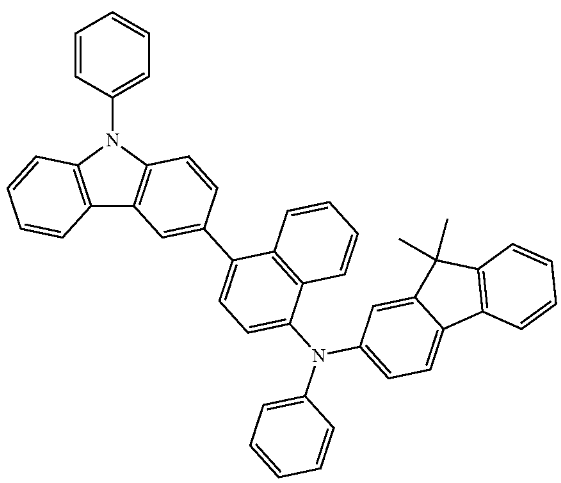
HT9
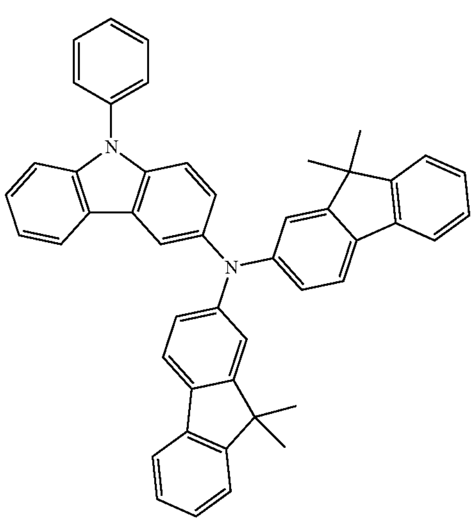
-continued
HT10
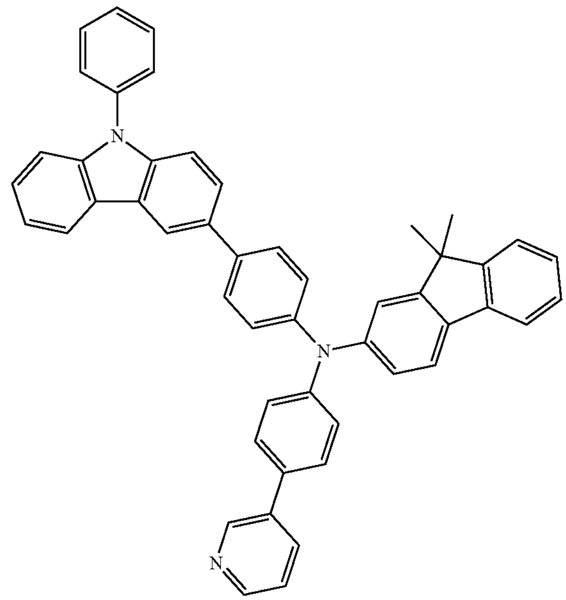
HT11
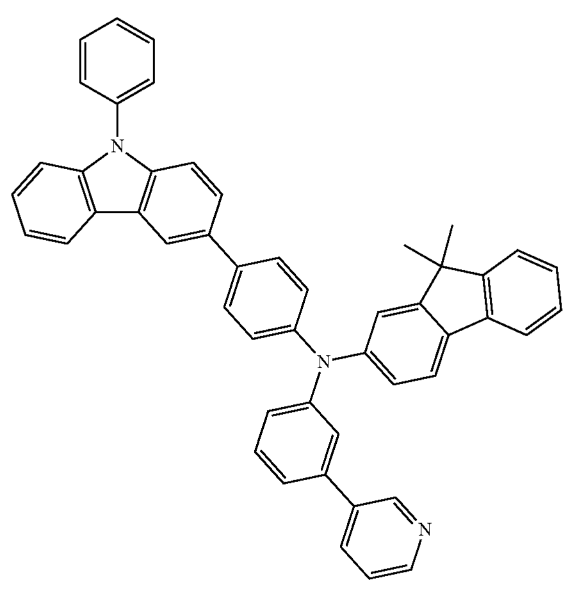

-continued
HT12
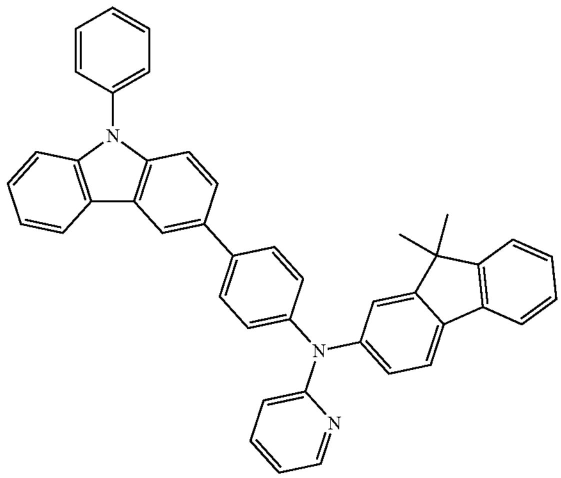
HT13
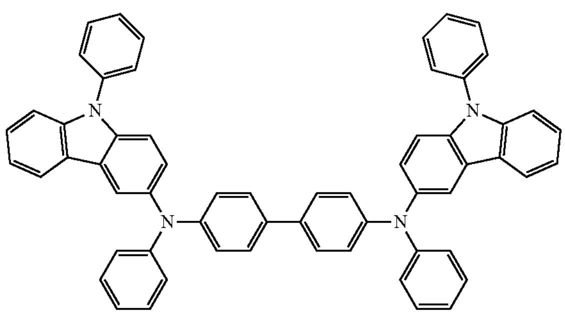
HT14
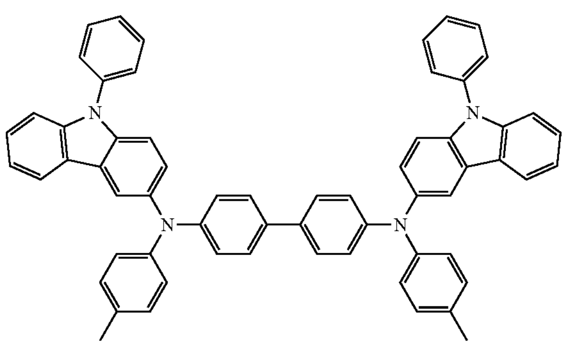
HT15
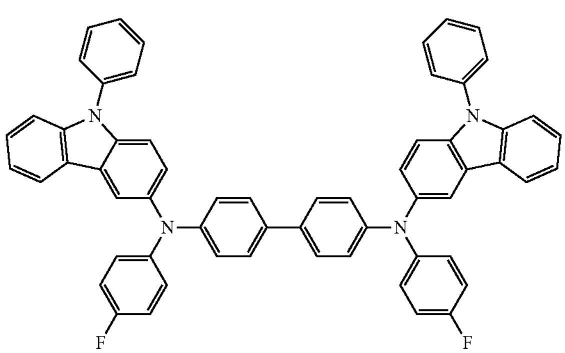
-continued
HT16
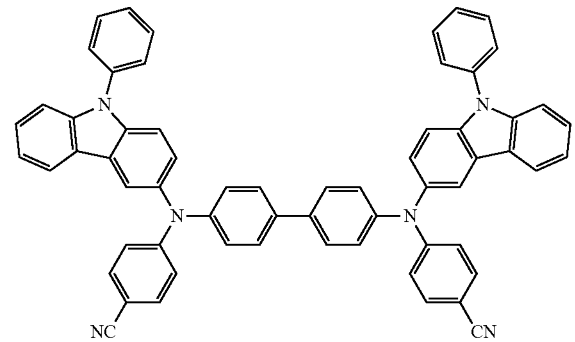
HT17
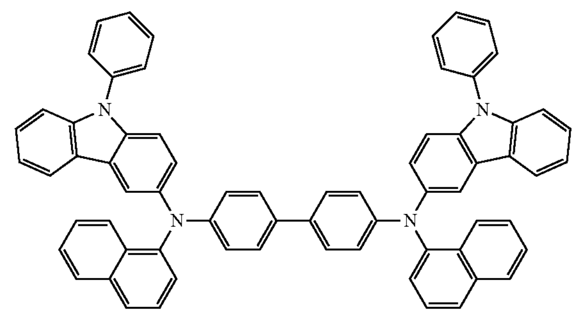
HT18
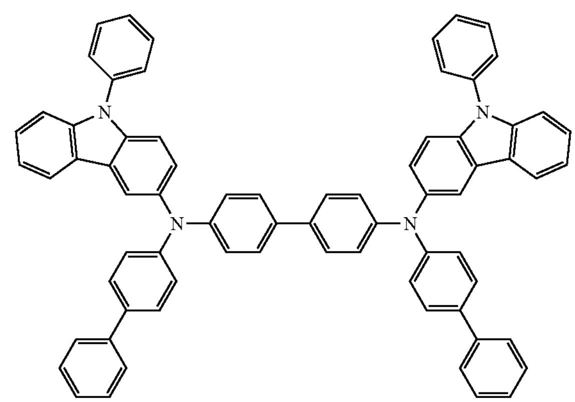
HT19
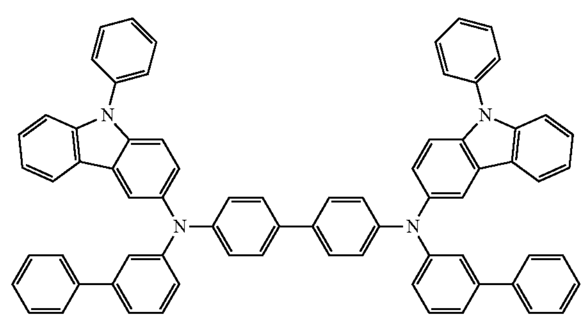

-continued

HT20

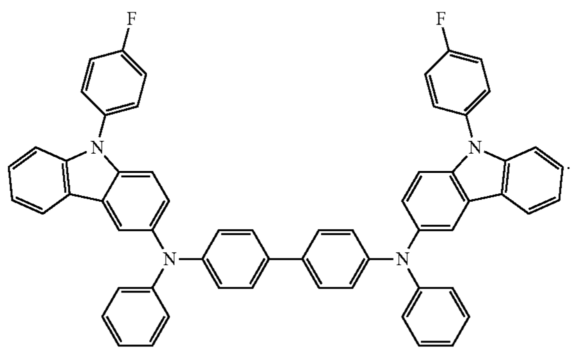

A thickness of the hole transport region may be from about 100 Å to about 10,000 Å, for example, about 100 Å to about 1,000 Å. When the hole transport region includes a hole injection layer, a hole transport layer, an electron blocking layer or combination thereof, a thickness of the hole injection layer may be in a range of about 100 Å to about 10000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof. Non-limiting examples of the p-dopant are a quinone derivative, such as tetracyanoquinonedimethane (TCNQ), 2,3,5,6-tetrafluoro-tetracyano-1,4-benzoquinonedimethane (F4-TCNQ) and F6-TCNNQ; a metal oxide, such as a tungsten oxide or a molybdenum oxide; and a cyano group-containing compound, such as Compound HT-D1 below:

HT-D1

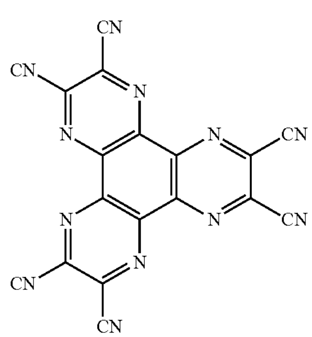

-continued

F4-TCNQ

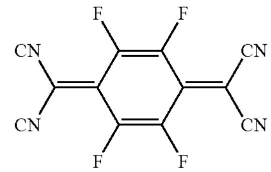

F6-TCNNQ

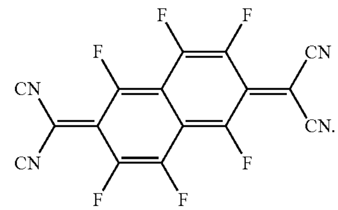

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be materials for the hole transport region described above, materials for a host to be explained later, or any combination thereof. However, the material for the electron blocking layer is not limited thereto. For example, when the hole transport region includes an electron blocking layer, a material for the electron blocking layer may be mCP, which will be explained later.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include a host and a dopant, and the dopant may include the organometallic compound represented by Formula 1.

The host may include TPBi, TBADN, ADN (also referred to as "DNA"), CBP, CDBP, TCP, mCP, Compounds H50, Compound H51, Compound H52, or any combination thereof:

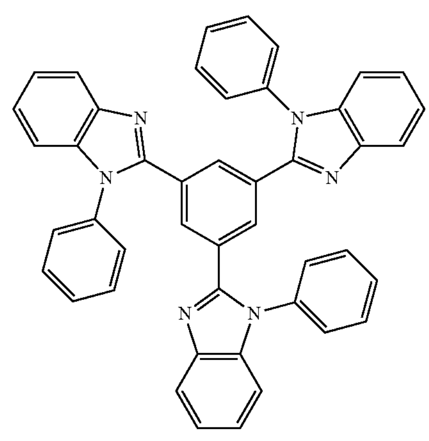

TPBi

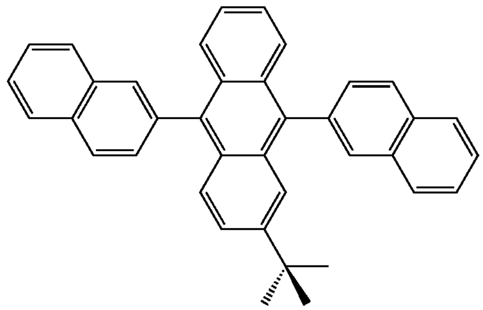

TBADN

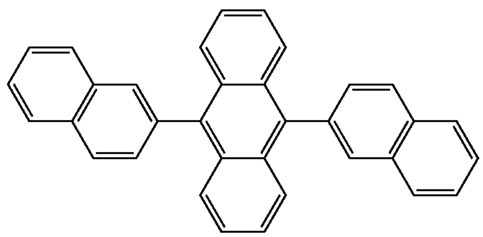

ADN

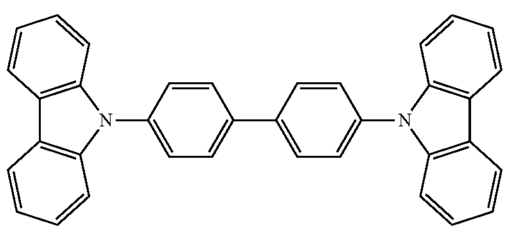

CBP

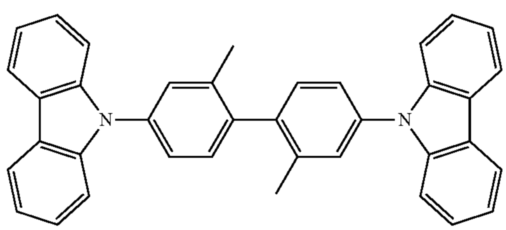

CDBP

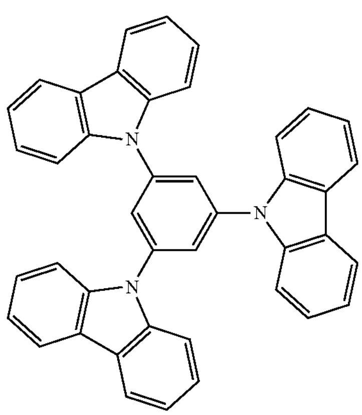

TCP

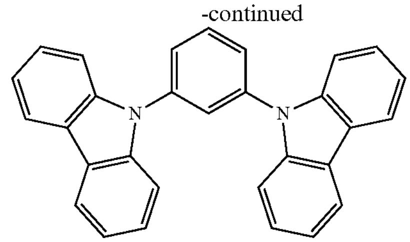

mCP

H50

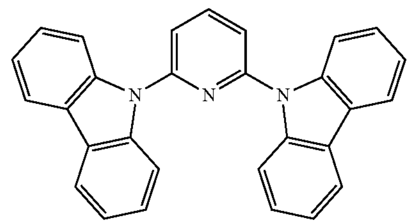

H51

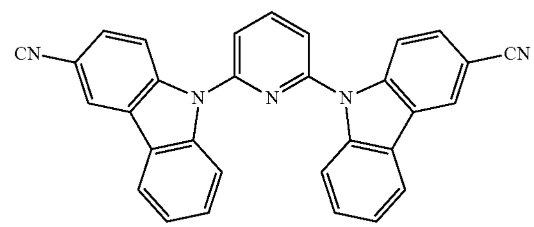

H52

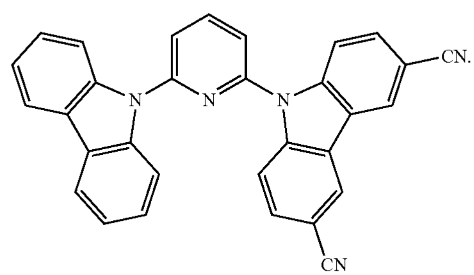

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof:

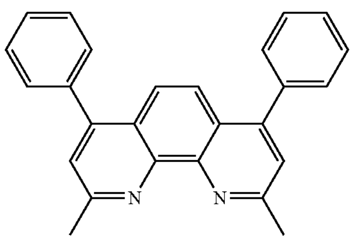
BCP

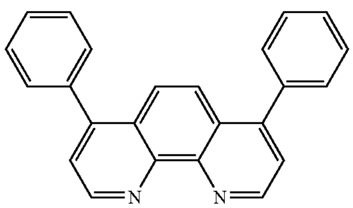
Bphen .

A thickness of the hole blocking layer may be from about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, $Alq_3$, BAlq, TAZ, NTAZ, or any combination thereof:

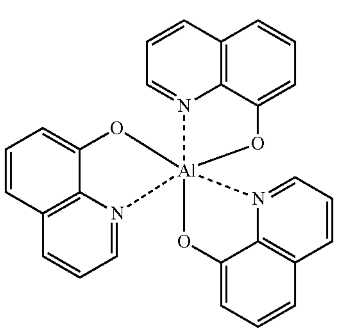
$Alq_3$

-continued

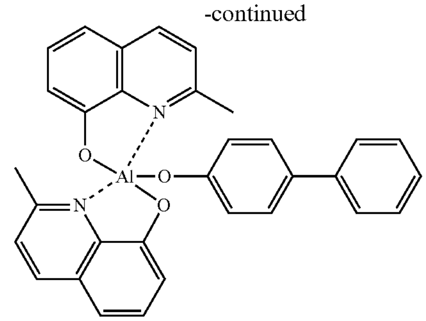
BAlq

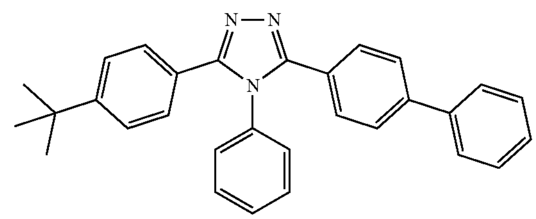
TAZ

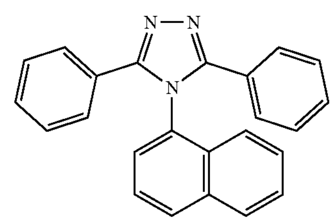
NTAZ .

In one or more embodiments, the electron transport layer may include at least one of ET1 to ET25:

ET1

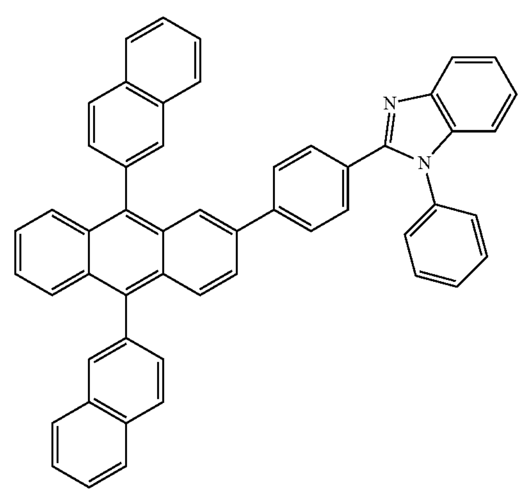

-continued
ET2
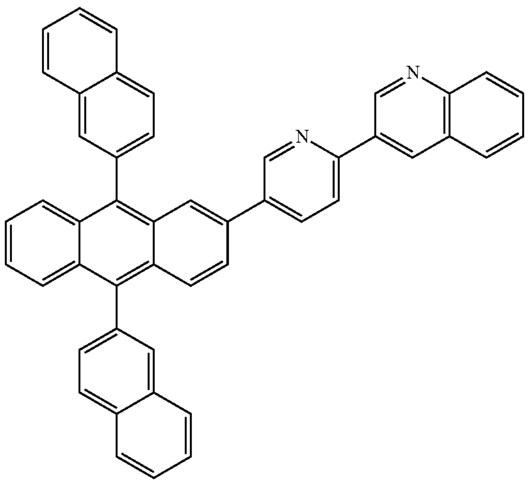
ET3
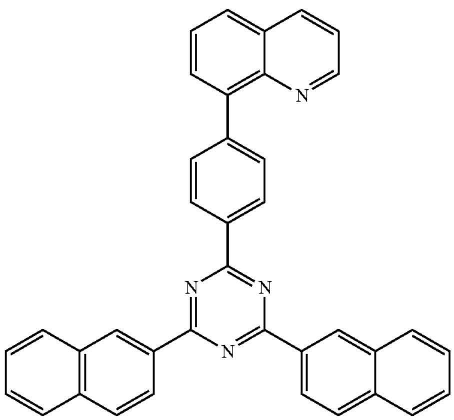
ET4
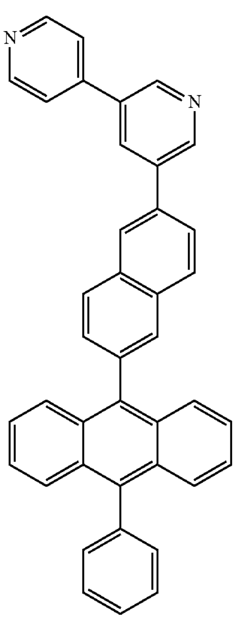
-continued
ET5
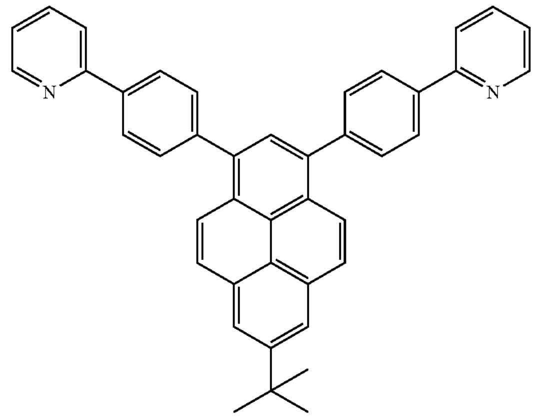
ET6
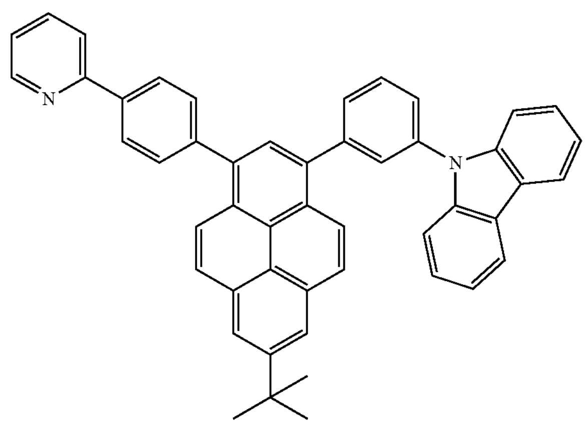
ET7
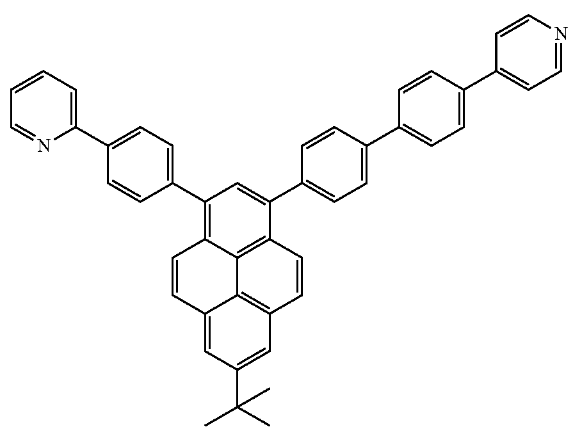

ET8
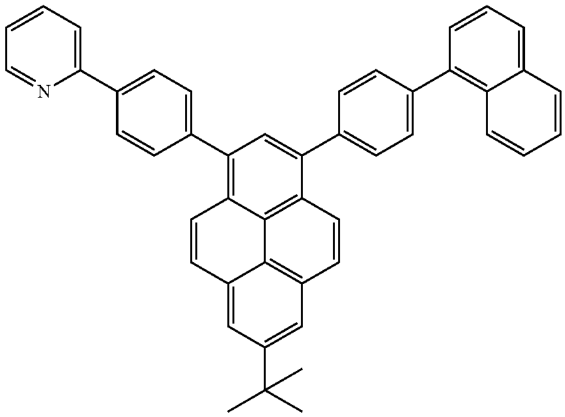
ET9
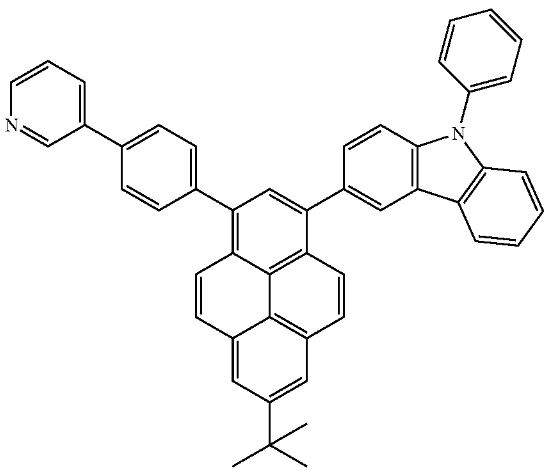
ET10
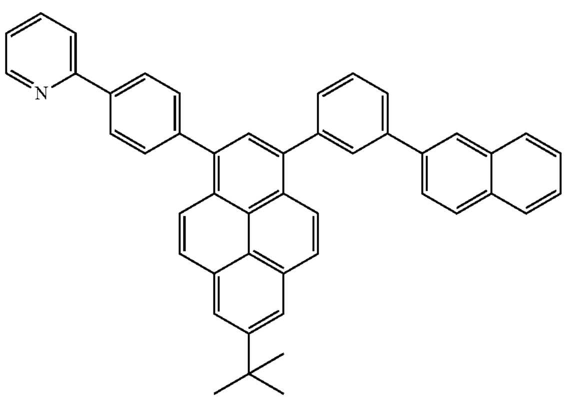
ET11
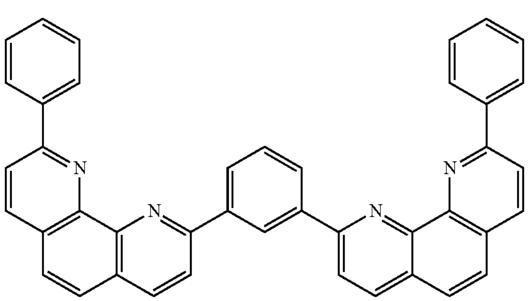
ET12
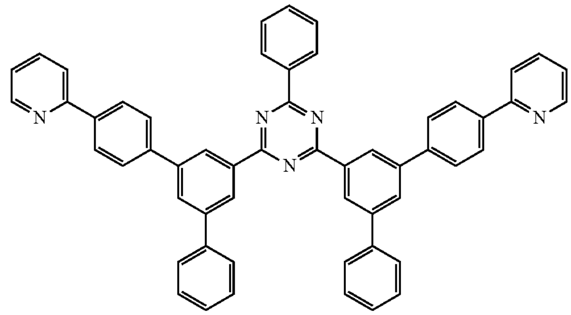
ET13
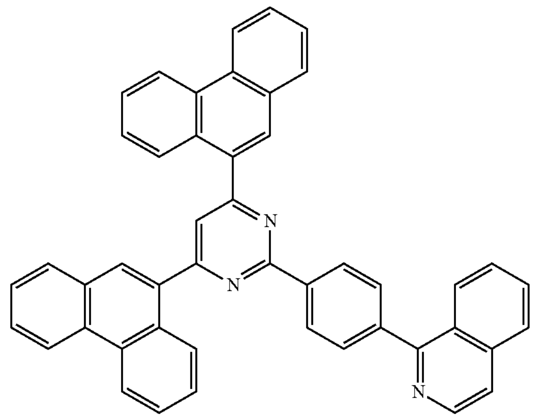
ET14
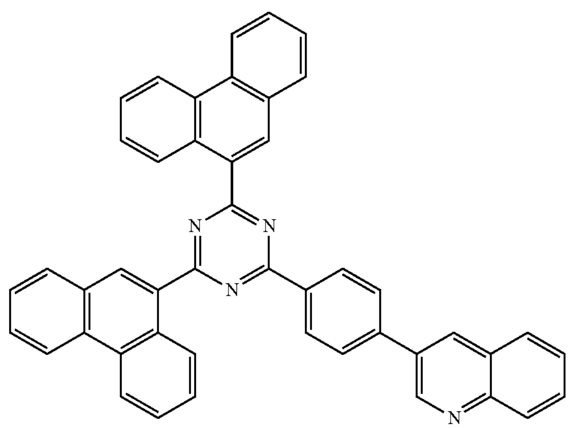
ET15
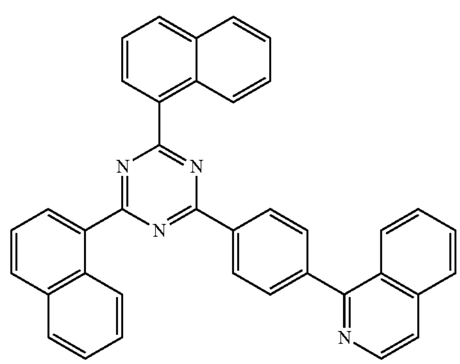

-continued
ET16
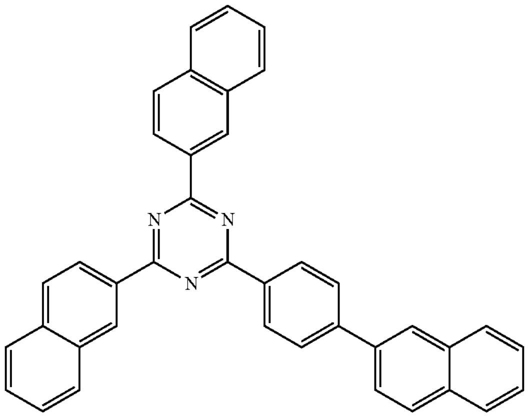
ET17
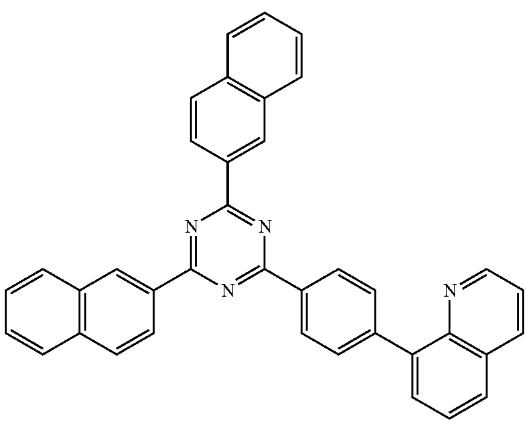
ET18
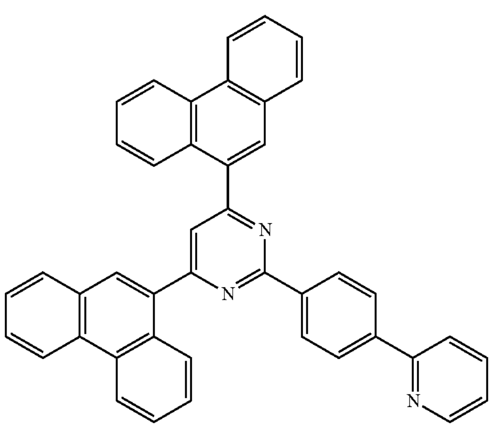
-continued
ET19
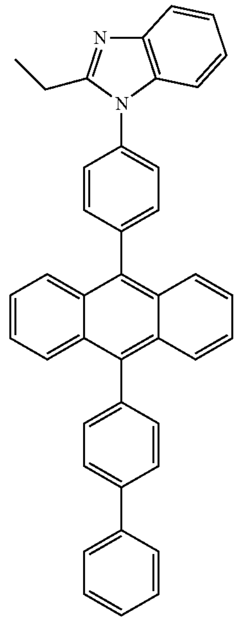
ET20
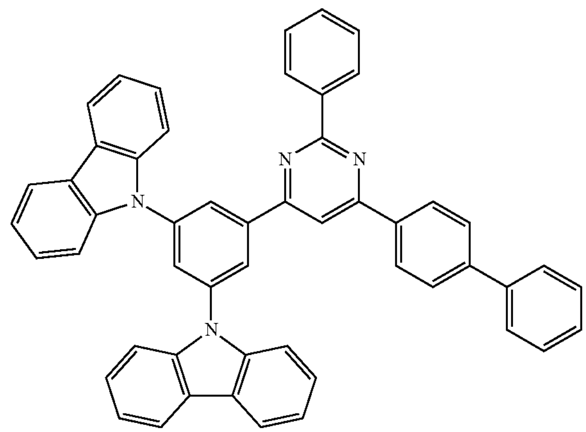
E21
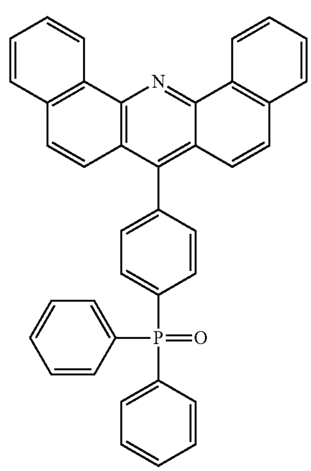

-continued

E22

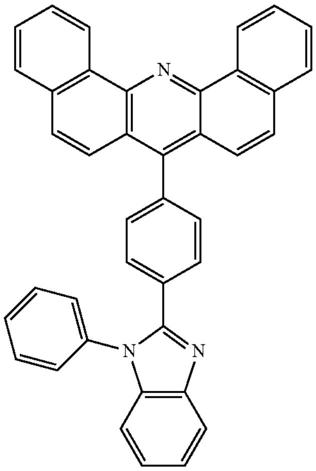

E23

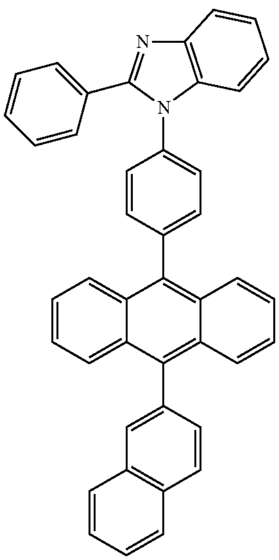

ET24

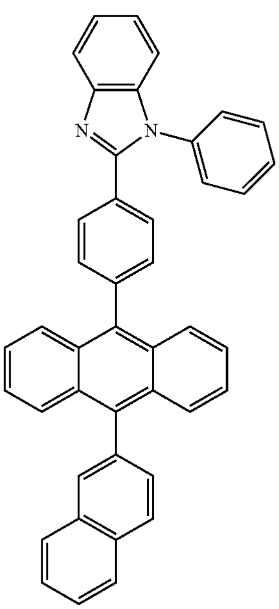

-continued

ET25

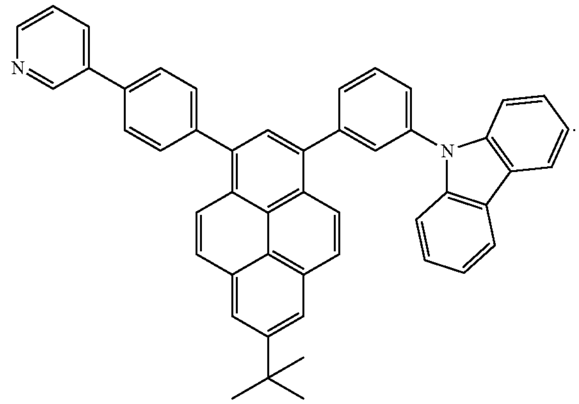

A thickness of the electron transport layer may be from about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ), Compound ET-D2, or combination thereof:

ET-D1

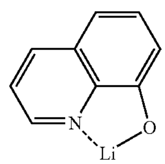

ET-D2

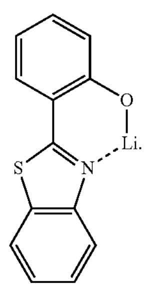

The electron transport region may include an electron injection layer that promotes flow of electrons from the second electrode 19 thereinto.

The electron injection layer may include LiF, NaCl, CsF, $Li_2O$, BaO, or any combination thereof.

A thickness of the electron injection layer may be from about 1 Å to about 100 Å, for example, about 3 Å to about 90 Å. When a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may be a metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described in connection with the FIGURE.

In one or more embodiments, the organic light-emitting device may be included in an electronic apparatus. Accordingly, provided is an electronic apparatus including the organic light-emitting device. The electronic apparatus may include, for example, a display, an illuminator, and a sensor.

Another aspect of the present disclosure provides a diagnostic composition including at least one of the organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Non-limiting examples of the $C_1$-$C_{60}$ alkyl group, the $C_1$-$C_{20}$ alkyl group, and/or the $C_1$-$C_{10}$ alkyl group include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 may be a branched $C_6$ alkyl group, and may be a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group). Non-limiting examples of the $C_1$-$C_{60}$ alkoxy group, the $C_1$-$C_{20}$ alkoxy group, or the $C_1$-$C_{10}$ alkoxy group include a methoxy group, an ethoxy group, a propoxy group, a butoxy group, and a pentoxy group.

The term "$C_2$-$C_{60}$ alkenyl group" as used herein refers to a hydrocarbon group having at least one carbon-carbon double bond in the middle or at the terminus of the $C_2$-$C_{60}$ alkenyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkynyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Non-limiting examples of the $C_3$-$C_{10}$ cycloalkyl group include a cyclopropyl group, a cyclobutyl group, a cyclopentyl group, a cyclohexyl group, a cycloheptyl group, a cyclooctyl group, an adamantyl group, a bicyclo[1.1.1]pentyl group, a bicyclo[2.1.1]hexyl group, a bicyclo[2.2.1]heptyl group(a norbornyl group), and a bicyclo[2.2.2]octyl group.

The term "$C_1$-$C_{10}$ heterocycloalkyl group" as used herein refers to a monovalent saturated monocyclic group having at least one N, O, P, Si, B, Se, Ge, S, or any combination thereof as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Non-limiting examples of the $C_1$-$C_{10}$ heterocycloalkyl group include a silolanyl group, a silinanyl group, a tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, B, Ge, Se, S, or any combination thereof as a ring-forming atom, 2 to 10 carbon atoms, and at least one double bond in its ring. Examples of the $C_2$-$C_{10}$ heterocycloalkenyl group include a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" used herein refers to a $C_6$-$C_{59}$ arylene group substituted with at least one $C_1$-$C_{54}$ alkyl group.

The term "$C_1$-$C_{60}$ heteroaryl group" as used herein refers to a monovalent group having a heterocyclic aromatic system that has at least one N, O, P, Si, B, Se, Ge, S, or any combination thereof as a ring-forming atom, in addition to 1 to 60 carbon atoms. The term "$C_1$-$C_{60}$ heteroarylene group" as used herein refers to a divalent group having a heterocyclic aromatic system that has at least one heteroatom N, O, P, Si, B, Se, Ge, S, or any combination thereof as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" used herein refers to a $C_1$-$C_{59}$ heteroarylene group substituted with at least one $C_1$-$C_{59}$ alkyl group.

The term "$C_6$-$C_{60}$ aryloxy group" used herein indicates —$OA_{102}$ (wherein $A_{102}$ is the $C_6$-$C_{60}$ aryl group), a $C_6$-$C_{60}$ arylthio group used herein indicates —$SA_{103}$ (wherein $A_{103}$ is the $C_6$-$C_{60}$ aryl group), and a $C_1$-$C_{60}$ alkylthio group used herein indicates —$SA_{104}$ (wherein $A_{104}$ is the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The term "$C_5$-$C_{30}$ carbocyclic group (which is unsubstituted or substituted with at least one $R_{10a}$)" may include, for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, cyclopentadiene group, and a fluorene group, each being unsubstituted or substituted with at least one $R_{10a}$.

The term "$C_1$-$C_{30}$ heterocyclic group" as used herein refers to a saturated or unsaturated cyclic group having, as a ring forming atom, at least one N, O, P, Si, Se, Ge, B, S, or any combination thereof other than 1 to 30 carbon atoms. The $C_1$-$C_{30}$ heterocyclic group may be a monocyclic group or a polycyclic group. The "$C_1$-$C_{30}$ heterocyclic group (which is unsubstituted or substituted with at least one $R_{10a}$)" may include, for example, a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each being unsubstituted or substituted with at least one $R_{10a}$.

The term "($C_1$-$C_{20}$ alkyl)'X' group" as used herein refers to a 'X' group substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkylene group substituted with at least one $C_1$-$C_{20}$ alkyl group and the term "($C_1$-$C_{20}$ alkyl)phenyl group" as used herein refers to a phenylene group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to a heterocyclic group having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, and a dibenzothiophene 5,5-dioxide group" in which at least one of the carbon atoms constituting the cyclic groups is substituted with a nitrogen.

A substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Ge(Q_{33})(Q_{34})(Q_{35})$, $—B(Q_{36})(Q_{37})$, $—P(=O)(Q_{38})(Q_{39})$ or $—P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group, a monovalent non-aromatic condensed polycyclic group; or a monovalent non-aromatic condensed heteropolycyclic group.

For example, in the present specification, $Q_1$ to $Q_9$, $Q_{11}$ to $Q_{19}$, $Q_{21}$ to $Q_{29}$, and $Q_{31}$ to $Q_{39}$ may each independently be $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 125)

Synthesis of Compound 125A

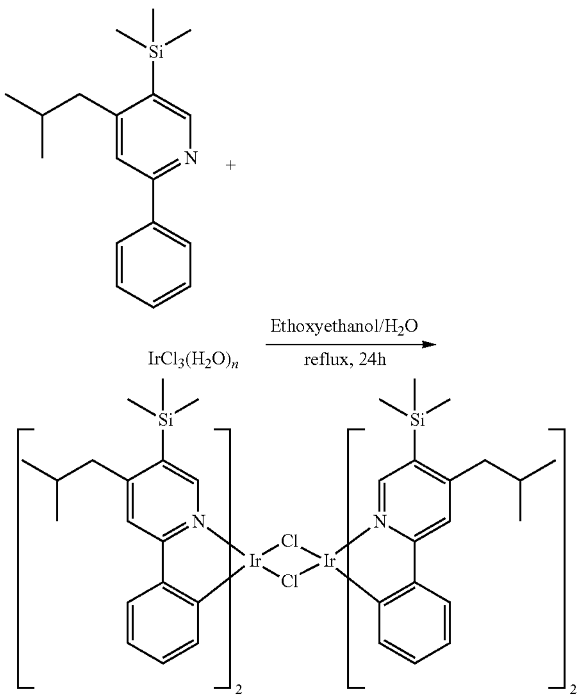

125A 4-isobutyl-2-phenyl-5-(trimethylsilyl)pyridine (8.0 g, 28.4 mmol) and iridium chloride (4.4 g, 12.6 mmol) were mixed with 120 mL of ethoxyethanol and 40 mL of distilled water. The mixed solution was stirred under reflux for 24 hours, and the temperature was lowered to room temperature. A solid produced therefrom was separated by filtration, and then, washed thoroughly with water/methanol/hexane in the stated order. The resulting solid was then dried in a vacuum oven, thereby obtaining 7.5 g of Compound 125A (yield of 75%).

Synthesis of Compound 125B

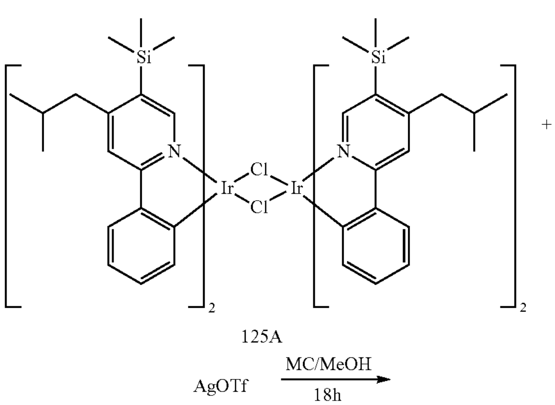

125A

-continued

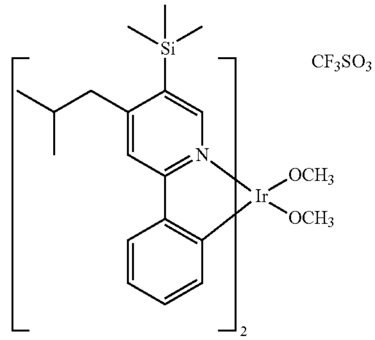

125B

Compound 125A (1.6 g, 1.0 mmol) was mixed with 45 ml of methylene chloride (MC), and a mixture of AgOTf (Silver trifluoromethanesulfonate) (0.5 g, 2.1 mmol) and 15 ml of methanol was added thereto. Afterwards, the mixed solution was stirred at room temperature for 18 hours while blocking the light with aluminum foil. The resulting solution was then filtered through celite to remove a solid produced therefrom, and the solvent was removed from the filtrate under reduced pressure, and a solid (Compound 125B) produced therefrom was used in the next reaction without additional purification.

Synthesis of Compound 125

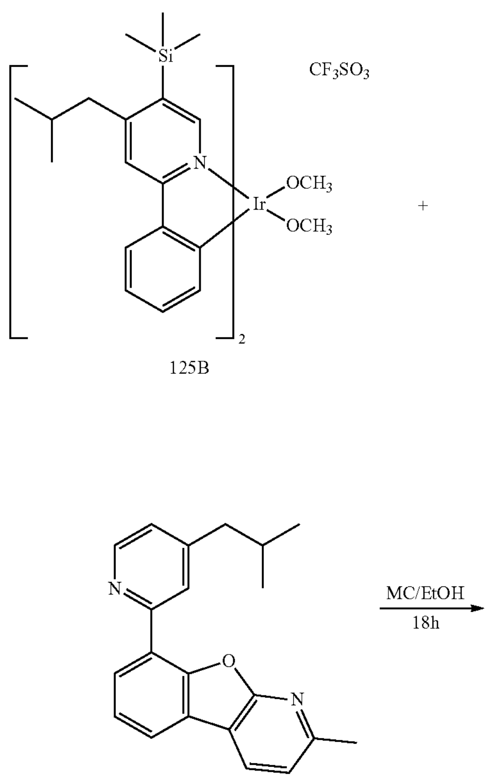

125B

-continued

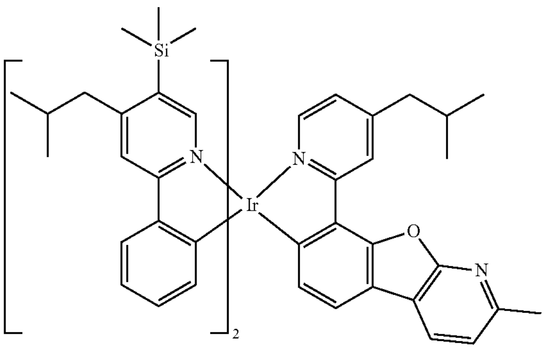

125

Compound 125B (2.0 g, 2.1 mmol) and 8-(4-isobutylpyridin-2-yl)-2-methylbenzofuro[2,3-b]pyridine (0.8 g, 2.4 mmol) were mixed with 40 ml of a mixture of MC and ethanol. The mixed solution was stirred under reflux for 18 hours, and the temperature was lowered down. The resulting solution was filtered, and a solid obtained therefrom was washed thoroughly with ethanol and hexane. The resulting product was subjected to column chromatography under the MC: hexane conditions, thereby obtaining 0.8 g of Compound 125 (yield of 36%). Substances of the compound were identified by the Mass Spectrum and HPLC analysis.

HRMS (MALDI) calcd for $C_{57}H_{67}IrN_4OSi_2$: m/Z 1072.4483 Found: 1072.4490

Synthesis Example 2 (Compound 128)

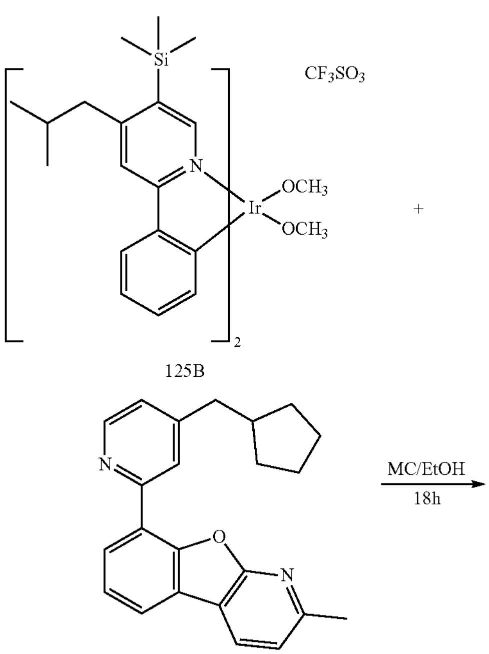

-continued

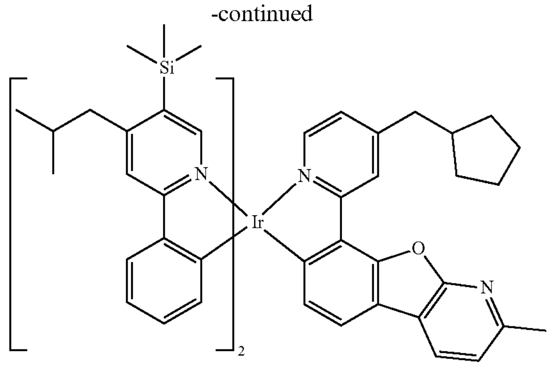

128

0.9 g of Compound 128 (yield of 40%) was obtained in the same manner as in the synthesis of Compound 125 according to Synthesis Example 1, except that 8-(4-(cyclopentylmethyl)pyridin-2-yl)-2-methylbenzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{59}H_{69}IrN_4OSi_2$: m/Z 1098.4639, Found: 1098.4631

Synthesis Example 3 (Compound 163)

Synthesis of Compound 163A

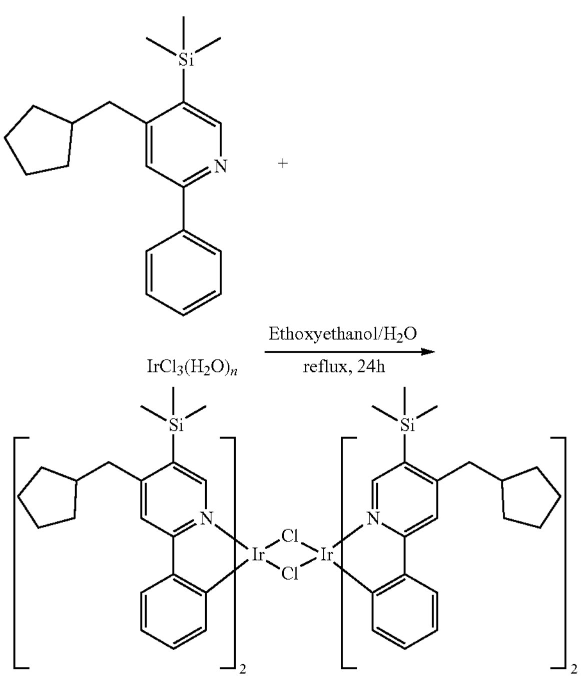

163A 6.5 g of Compound 163A (yield of 65%) was obtained in the same manner as in the synthesis of Compound 125A according to Synthesis Example 1, except that 4-(cyclopentylmethyl)-2-phenyl-5-(trimethylsilyl)pyridine was used instead of 4-isobutyl-2-phenyl-5-(trimethylsilyl)pyridine.

Synthesis of Compound 163B

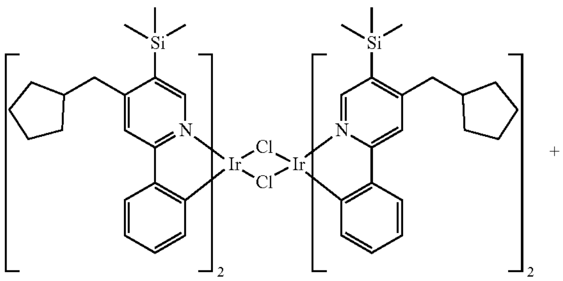

163A

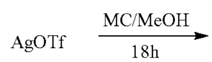

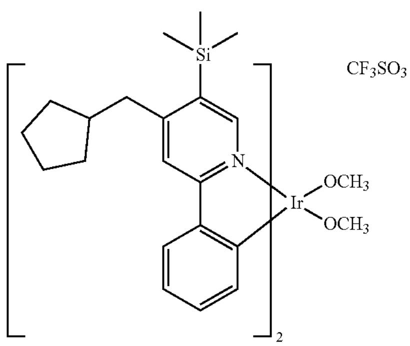

163B

Compound 163B was obtained in the same manner as in the synthesis of Compound 125B according to Synthesis Example 1, except that Compound 163A was used instead of Compound 125 Å. Compound 163B thus obtained was used in the next reaction without additional purification.

Synthesis of Compound 163

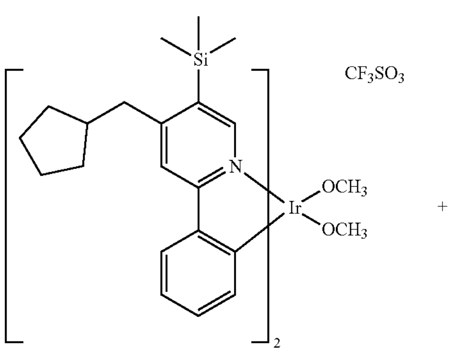

163B

-continued

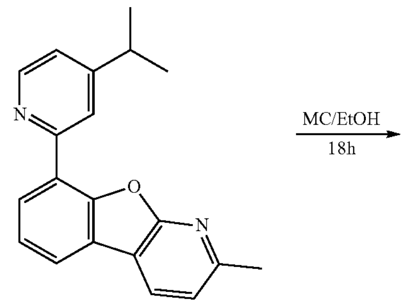

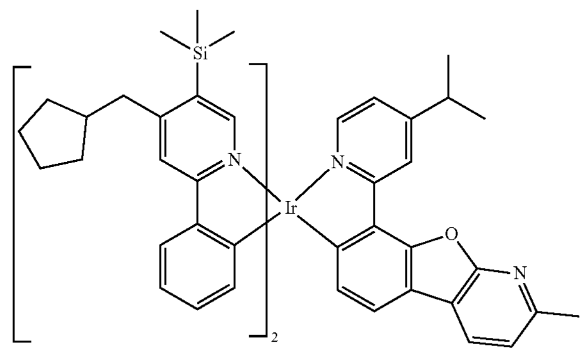

163

0.65 g of Compound 163 (yield of 29%) was obtained in the same manner as in the synthesis of Compound 125 according to Synthesis Example 1, except that Compound 163B was used instead of Compound 125B and 8-(4-isopropylpyridin-2-yl)-2-methylbenzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{60}H_{69}IrN_4OSi_2$: m/Z 1110.4639, Found: 1110.4644.

Synthesis Example 4 (Compound 365)

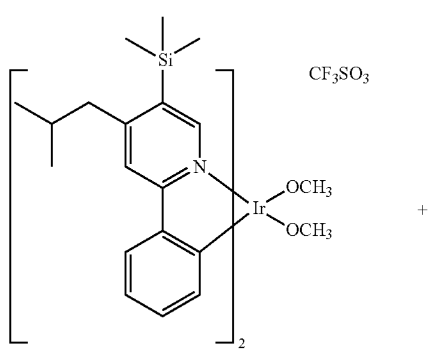

125B

-continued

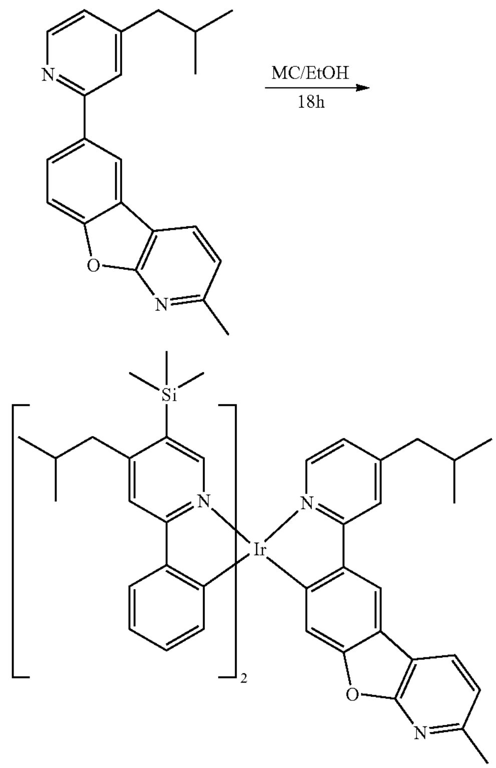

365

0.85 g of Compound 365 (yield of 37%) was obtained in the same manner as in the synthesis of Compound 125 according to Synthesis Example 1, except that 6-(4-isobutylpyridin-2-yl)-2-methylbenzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{57}H_{67}IrN_4OSi_2$: m/Z 1072.4483 Found: 1072.4488.

Synthesis Example 5 (Compound 505)

Synthesis of Compound 505A

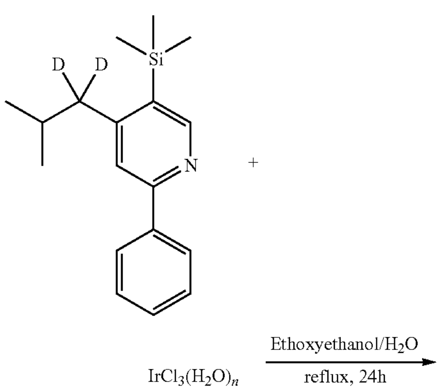

-continued

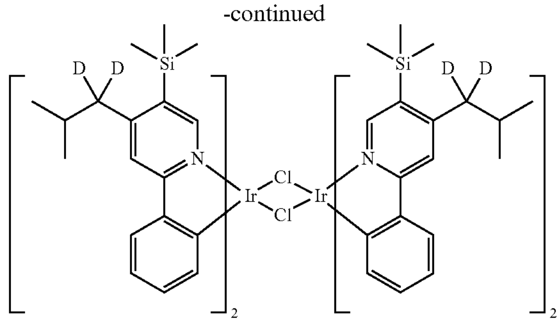

505A 7.1 g of Compound 505A (yield of 71%) was obtained in the same manner as in the synthesis of Compound 125A according to Synthesis Example 1, except that 4-isobutyl-$D_2$-2-phenyl-5-(trimethylsilyl)pyridine was used instead of 4-isobutyl-2-phenyl-5-(trimethylsilyl)pyridine.

Synthesis of Compound 505B

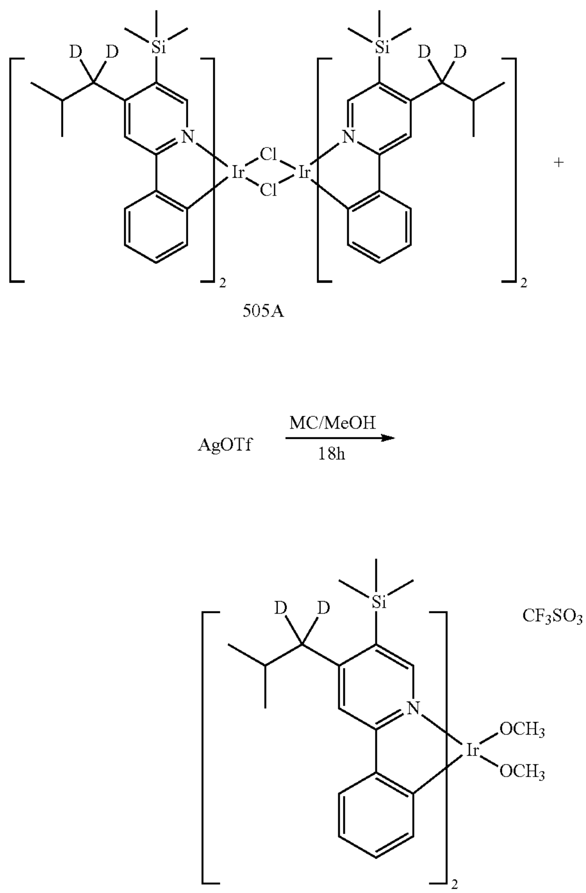

505B

Compound 505B was obtained in the same manner as in the synthesis of Compound 125B according to Synthesis Example 1, except that Compound 505A was used instead of Compound 125A. Compound 505B thus obtained was used in the next reaction without additional purification.

Synthesis of Compound 505

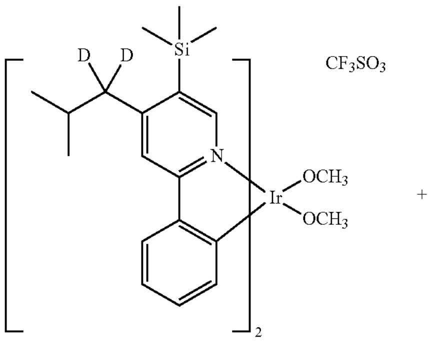

505B

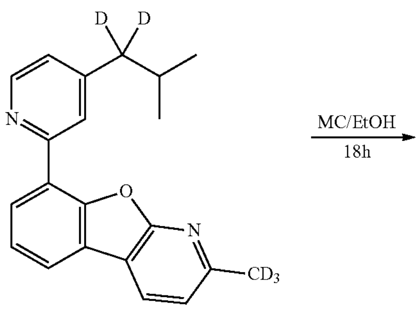

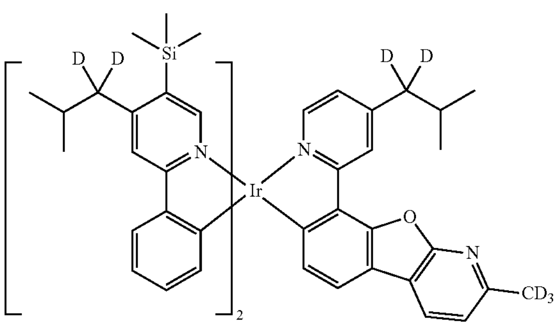

505

0.5 g of Compound 505 (yield of 22%) was obtained in the same manner as in the synthesis of Compound 125 according to Synthesis Example 1, except that Compound 505B was used instead of Compound 125B and 8-(4-isobutylpyridin-2-yl-$D_2$)-2-methyl($D_3$)benzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{57}H_{58}D_9IrN_4OSi_2$: m/Z 1081.5048, Found: 1081.5052.

Synthesis Example 6 (Compound 526)

Synthesis of Compound 526A

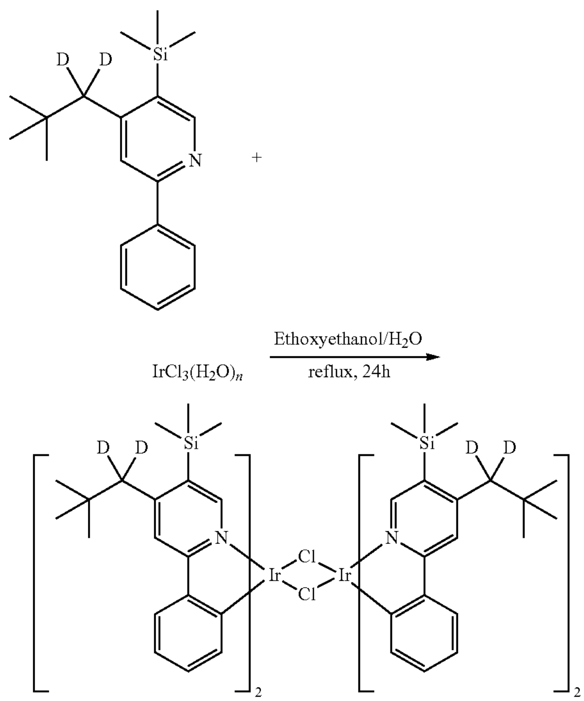

526A 6.6 g of Compound 526A (yield of 66%) was obtained in the same manner as in the synthesis of Compound 125A according to Synthesis Example 1, except that 4-neopentyl($D_2$)-2-phenyl-5-(trimethylsilyl)pyridine was used instead of 4-isobutyl-2-phenyl-5-(trimethylsilyl)pyridine.

Synthesis of Compound 526B

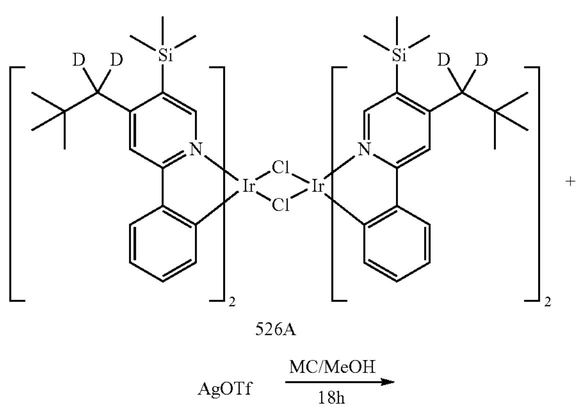

526A

-continued

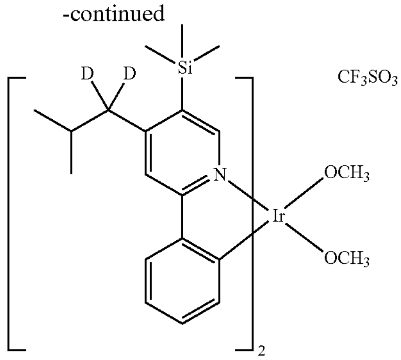

526B

Compound 526B was obtained in the same manner as in the synthesis of Compound 125B according to Synthesis Example 1, except that Compound 526A was used instead of Compound 125A. Compound 526B thus obtained was used in the next reaction without additional purification.

Synthesis of Compound 526

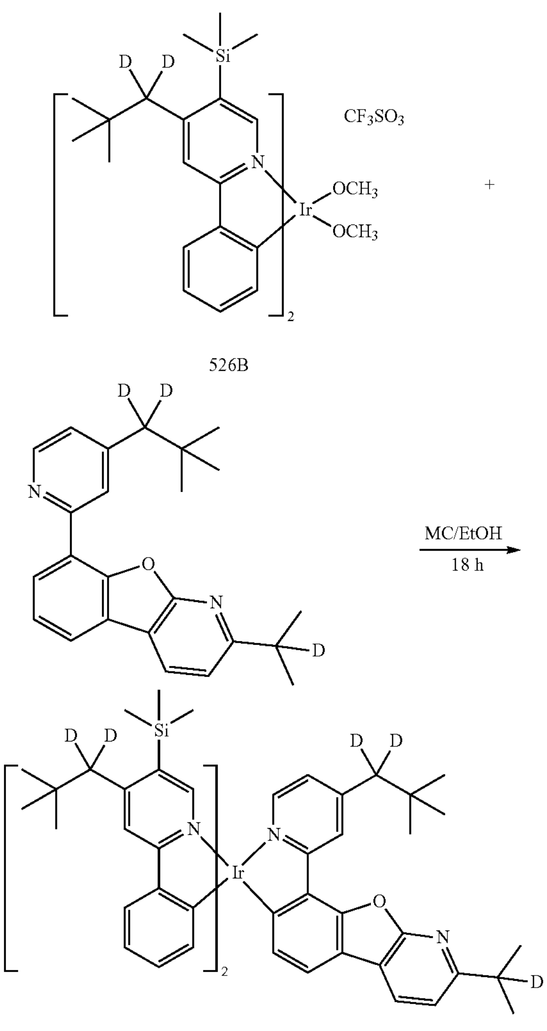

526B

526

1.0 g of Compound 526 (yield of 44%) was obtained in the same manner as in the synthesis of Compound 125 according to Synthesis Example 1, except that Compound 526B was used instead of Compound 125B and 2-isopropyl(D)-8-(4-neopentyl($D_2$)pyridin-2-yl)benzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{62}H_{70}D_7IrN_4OSi_2$: m/Z 1149.5705, Found: 1149.5700.

Synthesis Example 7 (Compound 676)

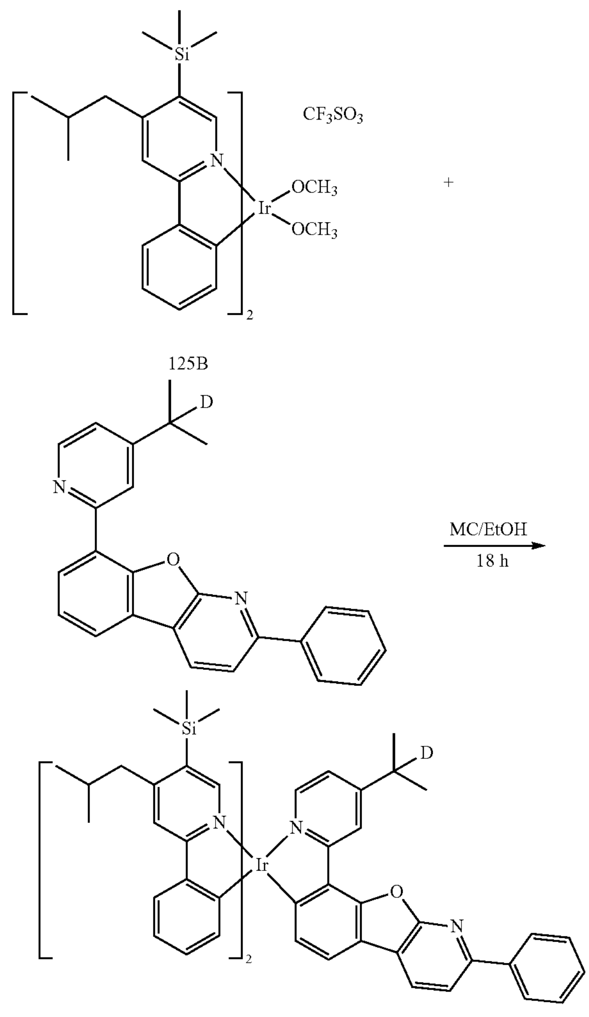

125B

676

0.8 g of Compound 676 (yield of 41%) was obtained in the same manner as in the synthesis of Compound 125 according to Synthesis Example 1, except that 2-phenyl-8-(4-(propan-2-yl-2-d)pyridin-2-yl)benzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{61}H_{66}IrN_4OSi_2$: m/Z 1121.4545, Found: 1121.4549.

Synthesis Example 8 (Compound 806)

Synthesis of Compound 806A

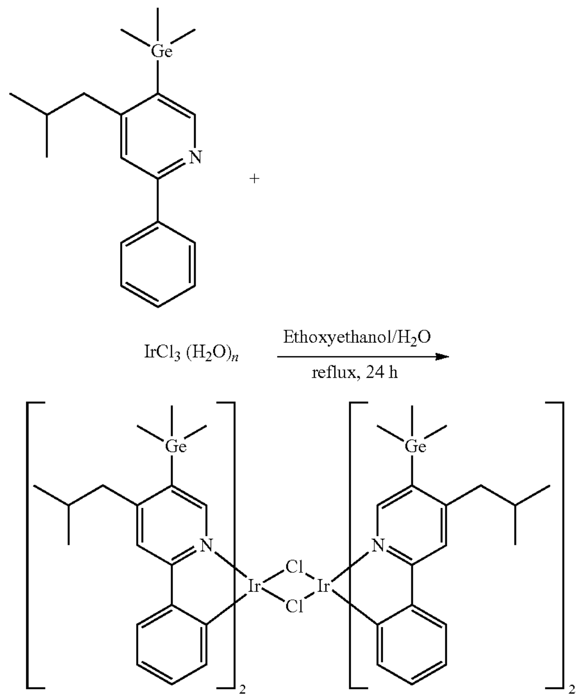

806A 3.7 g of Compound 806A (yield of 74%) was obtained in the same manner as in the synthesis of Compound 125A according to Synthesis Example 1, except that 4-isobutyl-2-phenyl-5-(trimethylgermyl)pyridine was used instead of 4-isobutyl-2-phenyl-5-(trimethylsilyl)pyridine.

Synthesis of Compound 806B

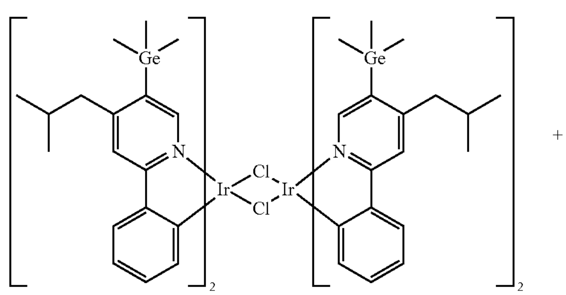

806A

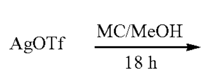

-continued

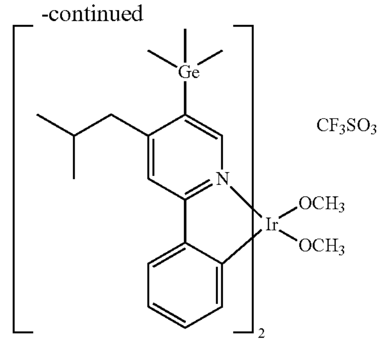

806B

Compound 806B was obtained in the same manner as in the synthesis of Compound 125B according to Synthesis Example 1, except that Compound 806A was used instead of Compound 125A. Compound 806B thus obtained was used in the next reaction without additional purification.

Synthesis of Compound 806

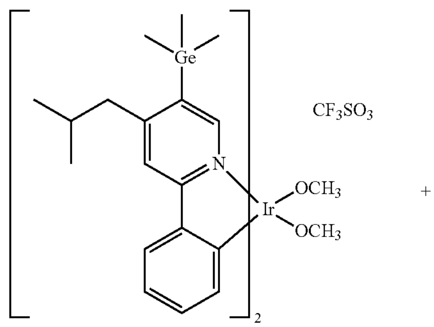

806B

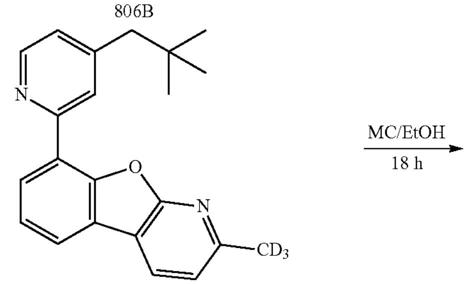

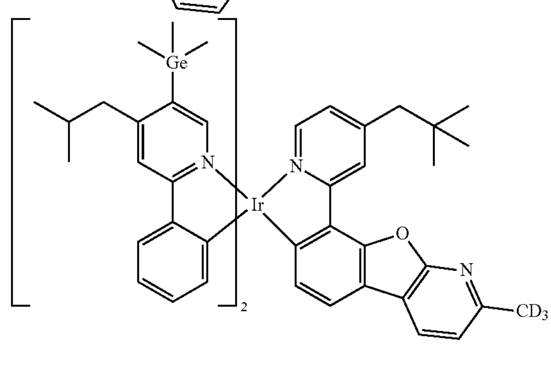

806

0.53 g of Compound 806 (yield of 35%) was obtained in the same manner as in the synthesis of Compound 125 according to Synthesis Example 1, except that Compound 806B was used instead of Compound 125B and 2-methyl ($D_3$)-8-(4-neopentylpyridin-2-yl)benzofuro[2,3-b]pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{58}H_{66}D_3Ge_2IrN_4O$: m/z 1181.3712, Found: 1181.3706.

Synthesis Example 9 (Compound 865)

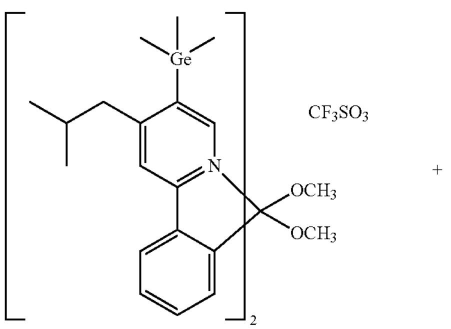

806B

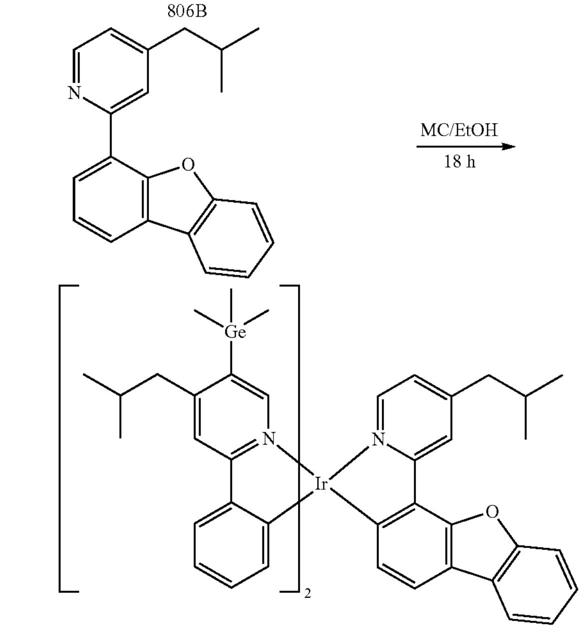

865

0.69 g of Compound 865 (yield of 31%) was obtained in the same manner as in the synthesis of Compound 125 according to Synthesis Example 1, except that Compound 806B was used instead of Compound 125B and 2-(dibenzo[b,d]furan-4-yl)-4-isobutylpyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{57}H_{66}Ge_2IrN_3O$: m/z 1149.3259, Found: 1149.3251.

Synthesis Example 10 (Compound 1365)

Synthesis of Compound 1365A

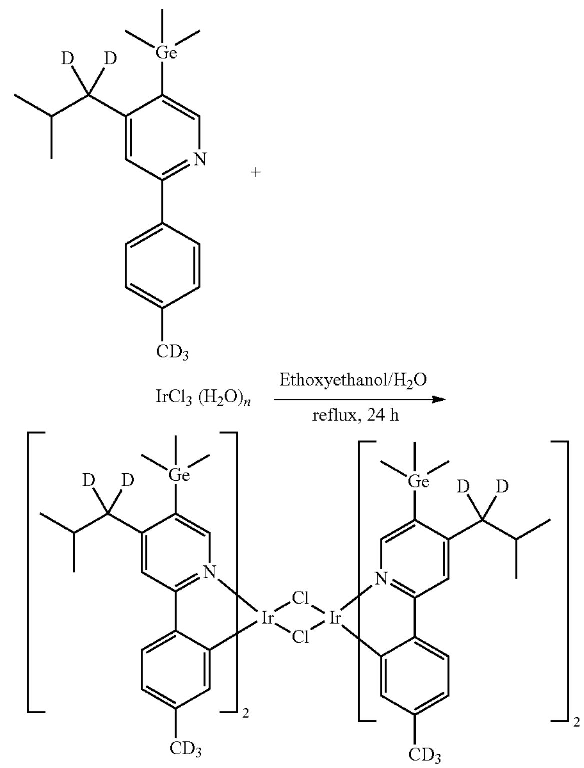

1365A 4.6 g of Compound 1365A (yield of 62%) was obtained in the same manner as in the synthesis of Compound 125A according to Synthesis Example 1, except that 4-isobutyl ($D_2$)-2-(p-tolyl($D_3$))-5-(trimethylgermyl)pyridine was used instead of 4-isobutyl-2-phenyl-5-(trimethylsilyl)pyridine.

Synthesis of Compound 1365B

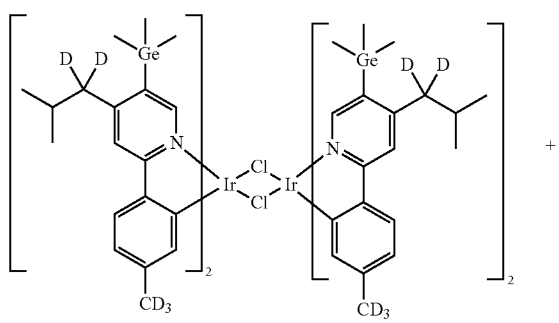

1365A

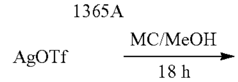

-continued

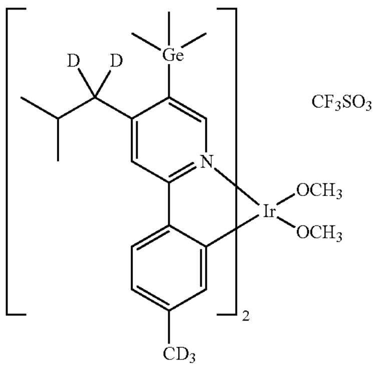

1365B

Compound 1365B was obtained in the same manner as in the synthesis of Compound 125B according to Synthesis Example 1, except that Compound 1365A was used instead of Compound 125A. Compound 1365B thus obtained was used in the next reaction without additional purification.

Synthesis of Compound 1365

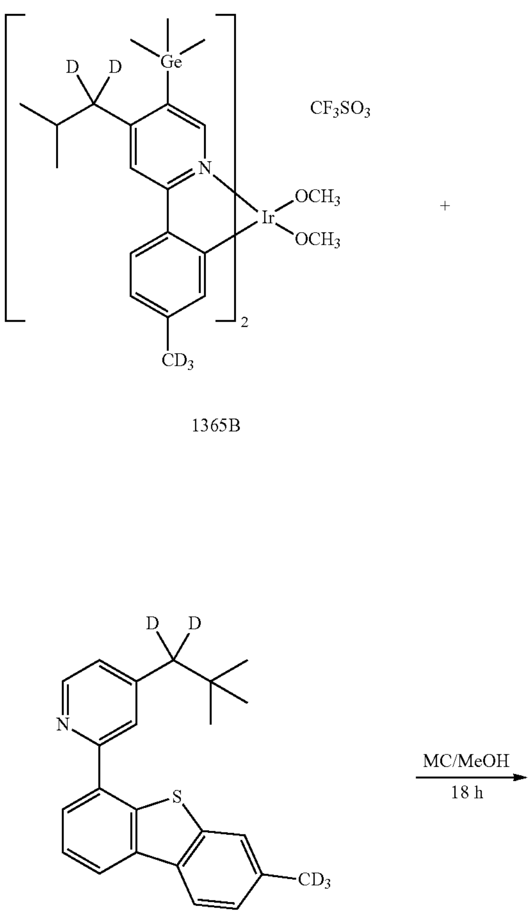

-continued

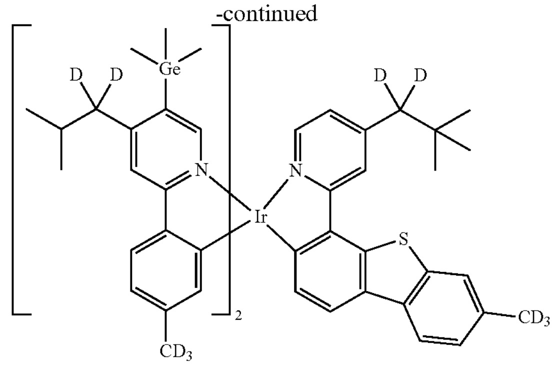

1365

0.43 g of Compound 1365 (yield of 28%) was obtained in the same manner as in the synthesis of Compound 125 according to Synthesis Example 1, except that Compound 1365B was used instead of Compound 125B and 2-(7-methyl($D_3$)dibenzo[b,d]thiophen-4-yl)-4-neopentyl($D_2$) pyridine was used instead of 8-(4-isobutylpyridin-2-yl)-2-methylbenzofuro[2,3-b]pyridine. Substances of the compound were identified by the Mass Spectrum and HPLC analysis.

HRMS (MALDI) calcd for $C_{61}H_{59}D_{15}Ge_2IrN_3O$: m/z 1236.4598, Found: 1236.4591.

Synthesis Example 11 (Compound 1497)

Synthesis of Compound 1497A

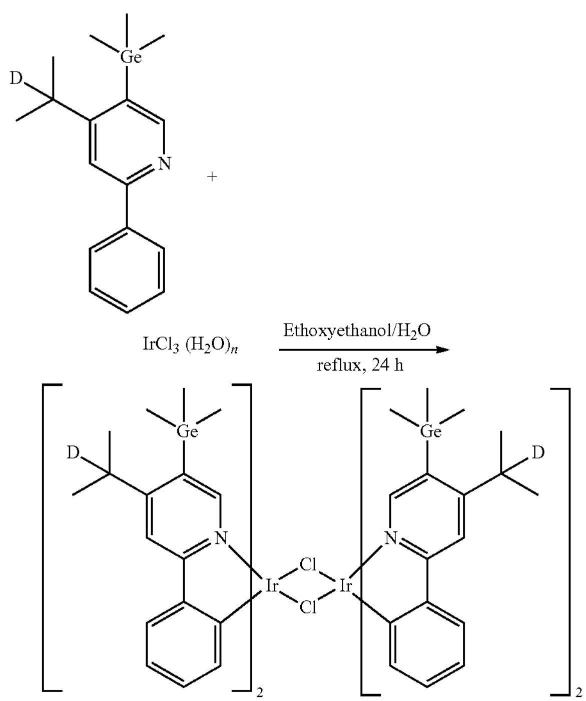

1497A 4.2 g of Compound 1497A (yield of 58%) was obtained in the same manner as in the synthesis of Compound 125A according to Synthesis Example 1, except that 2-phenyl-4-(propan-2-yl-2-d)-5-(trimethylgermyl)pyridine was used instead of 4-isobutyl-2-phenyl-5-(trimethylsilyl)pyridine.

Synthesis of Compound 1497B

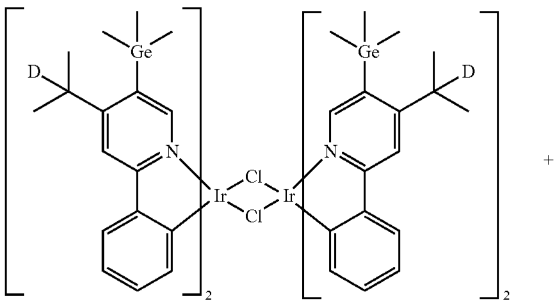

1497A

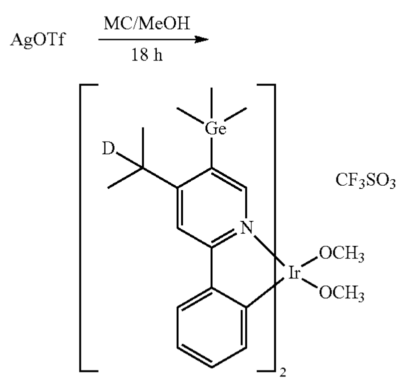

1497B

Compound 1497B was obtained in the same manner as in the synthesis of Compound 125B according to Synthesis Example 1, except that Compound 1497A was used instead of Compound 125A. Compound 1497B thus obtained was used in the next reaction without additional purification.

Synthesis of Compound 1497

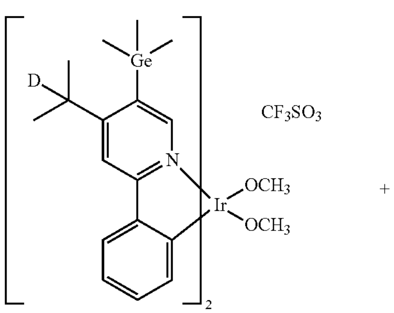

1497B

-continued

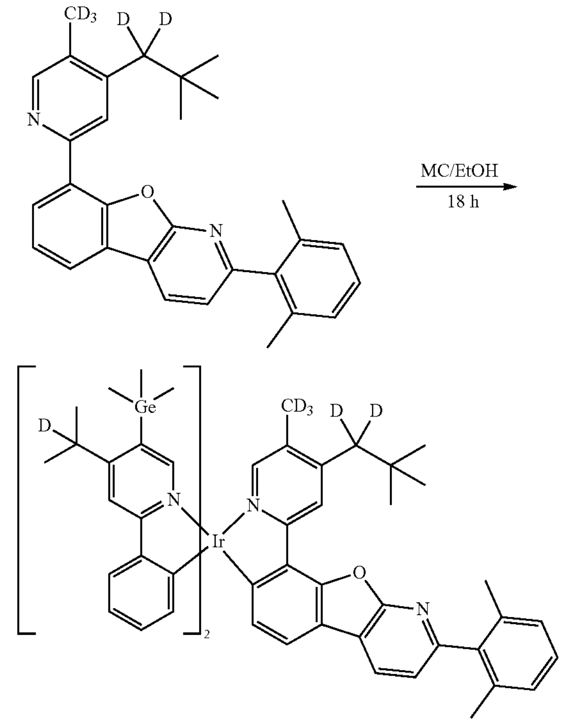

1497

0.53 g of Compound 1497 (yield of 34%) was obtained in the same manner as in the synthesis of Compound 125 according to Synthesis Example 1, except that Compound 1497B was used instead of Compound 125B and 2-(2,6-dimethylphenyl)-8-(4-(2,2-dimethylpropyl-1,1-d2)-5-(methyl-d3)pyridin-2-yl)benzofuro[2,3-b]pyridine was used instead of 8-(4-isobutylpyridin-2-yl)-2-methylbenzofuro[2,3-b]pyridine Substances of the compound were identified by the Mass Spectrum and HPLC analysis.

HRMS (MALDI) calcd for $C_{64}H_{66}D_7Ge_2IrN_4O$: m/z 1261.4277, Found: 1261.4271.

Synthesis Example 12 (Compound 1505)

Synthesis of Compound 1505A

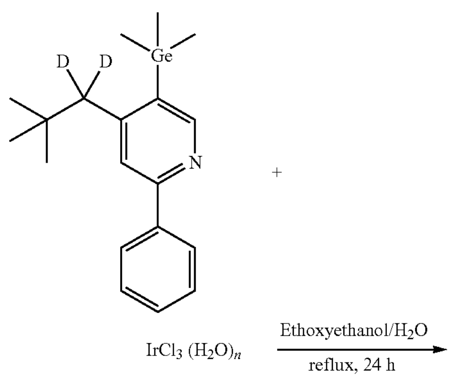

-continued

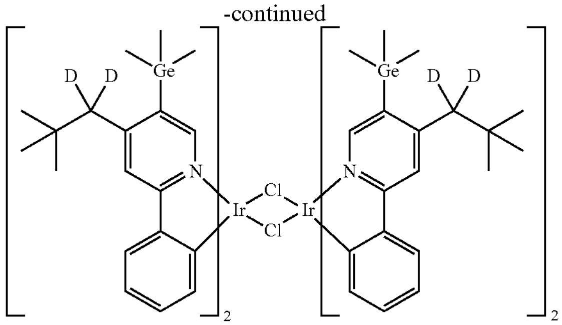

1505A 4.3 g of Compound 1505A (yield of 49%) was obtained in the same manner as in the synthesis of Compound 125A according to Synthesis Example 1, except that 4-(2,2-dimethylpropyl-1,1-d2)-2-phenyl-5-(trimethylgermyl)pyridine was used instead of 4-isobutyl-2-phenyl-5-(trimethylsilyl) pyridine.

Synthesis of Compound 1505B

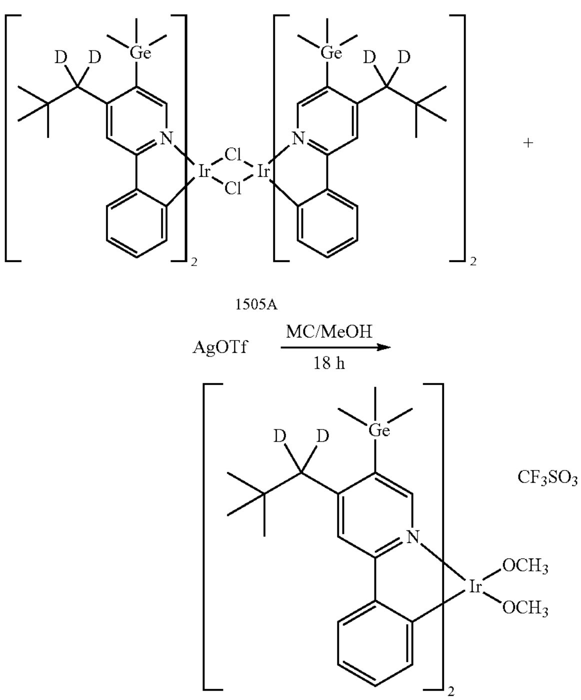

1505A

1505B

Compound 1505B was obtained in the same manner as in the synthesis of Compound 125B according to Synthesis Example 1, except that Compound 1505A was used instead of Compound 125A. Compound 1505B thus obtained was used in the next reaction without additional purification.

Synthesis of Compound 1505

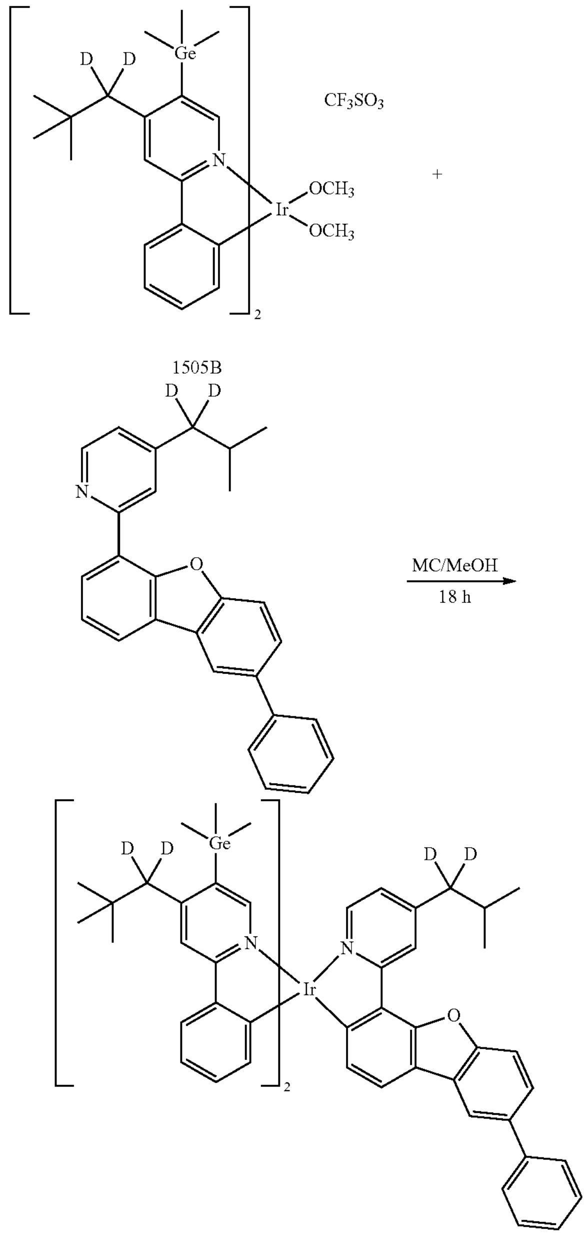

1505B

1505

0.32 g of Compound 1505 (yield of 27%) was obtained in the same manner as in the synthesis of Compound 125 according to Synthesis Example 1, except that Compound 1505B was used instead of Compound 125B and 4-(2-methylpropyl-1,1-d2)-2-(8-phenyldibenzo[b,d]furan-4-yl) pyridine was used instead of 8-(4-isobutylpyridin-2-yl)-2-methylbenzofuro[2,3-b]pyridine Substances of the compound were identified by the Mass Spectrum and HPLC analysis.

HRMS (MALDI) calcd for $C_{65}H_{68}D_6Ge_2IrN_3O$: m/z 1259.4261, Found: 1259.4255.

Example 1

As an anode, a glass substrate on which ITO/Ag/ITO was formed to a thickness of 70 Å/1,000 Å/70 Å was cut to a size of 50 mm×50 mm×0.5 mm, sonicated with isopropyl alcohol and pure water each for 5 minutes, and then, cleaned by exposure to ultraviolet rays and ozone for 30 minutes. Then, the anode was provided to a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred to as NPB) was vacuum-deposited on the hole injection layer to form a hole transport layer having a thickness of 1,350 Å.

Next, CBP (as a host) and Compound 125 (as a dopant) were co-deposited at a weight ratio of 98:2 on the hole transport layer to form an emission layer having a thickness of 400 Å.

Then, BCP was vacuum-deposited on the emission layer to form a hole blocking layer having a thickness of 50 Å, and $Alq_3$ was vacuum-deposited on the hole blocking layer to form an electron transport layer having a thickness of 350 Å. LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing the manufacture of an organic light-emitting device.

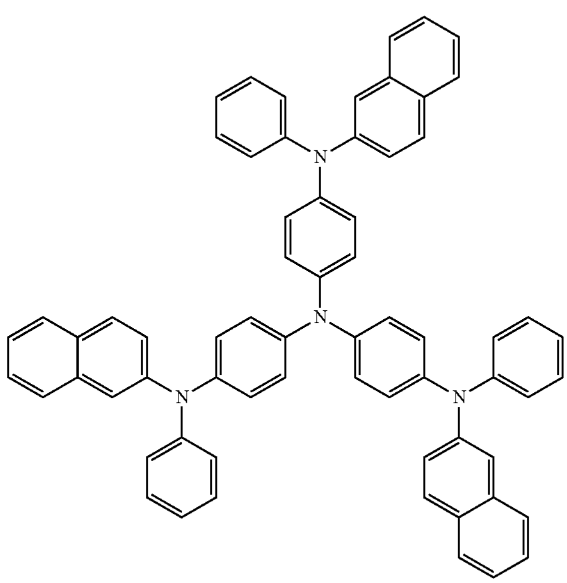

2-TNATA

-continued

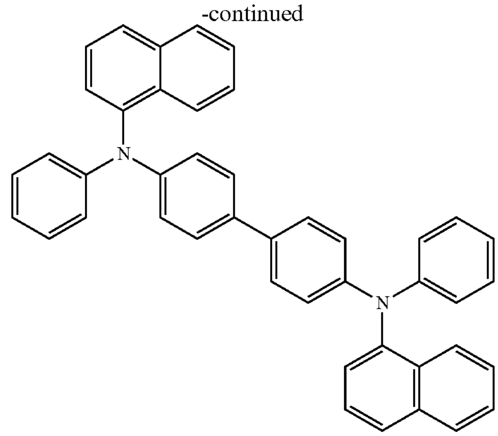

NPB

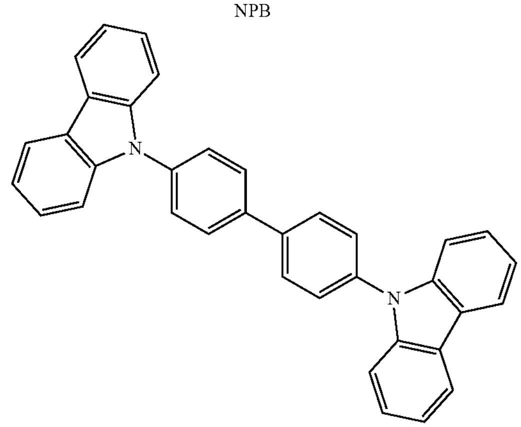

CBP

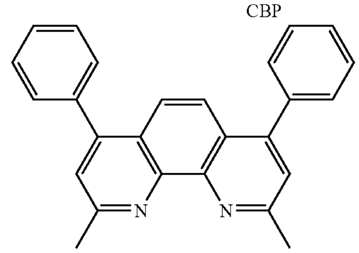

BCP

Examples 2 to 12 and Comparative Examples A and B

Organic light-emitting devices were manufactured in the same manner as in Example 1, except that compounds listed in Table 2 below were each used as a dopant instead of Compound 125 in forming an emission layer.

Evaluation Example 1: Evaluation of Characteristics of Organic Light-Emitting Device The driving voltage, maximum external quantum efficiency (Max EQE) value (%), and lifespan ($LT_{97}$, hr) of the organic light-emitting devices manufactured according to Examples 1 to 12 and Comparative Examples A and B were evaluated, and results thereof are shown in Table 2. Here, as a device used for the evaluation, a current-voltage meter (Keithley 2400) and a luminance meter (Minolta $C_5$-1000A) were used. The lifespan ($LT_{97}$) (at 3,500 nit) obtained by evaluating time (hr) that lapsed when luminance was 97% of initial luminance (100%), and was indicated in a relative value (%).

TABLE 2
| | Compound No. of dopant in emission layer | Driving voltage(V) | Max EQE(%) | $LT_{97}$ (relative value, %) (at 3,500 nit) |
|---|---|---|---|---|
| Example 1 | 125 | 4.43 | 23.3 | 100 |
| Example 2 | 128 | 4.41 | 23.4 | 87 |
| Example 3 | 163 | 4.42 | 24.1 | 93 |
| Example 4 | 365 | 4.16 | 22.3 | 110 |
| Example 5 | 505 | 4.43 | 23.6 | 130 |
| Example 6 | 526 | 4.47 | 25.4 | 150 |
| Example 7 | 676 | 4.33 | 25.8 | 180 |
| Example 8 | 806 | 4.45 | 23.2 | 120 |
| Example 9 | 865 | 4.10 | 23.0 | 100 |
| Example 10 | 1365 | 4.38 | 22.5 | 110 |
| Example 11 | 1497 | 4.35 | 25.1 | 165 |
| Example 12 | 1505 | 4.48 | 22.8 | 170 |
| Comparative Example A | A | 4.35 | 19.8 | 27 |
| Comparative Example B | B | 4.23 | 20.5 | 43 |
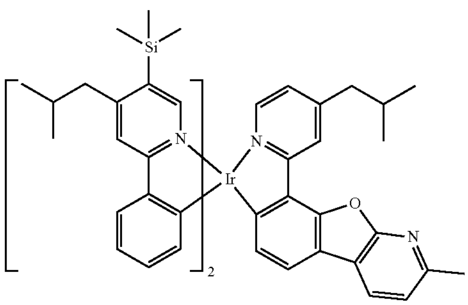
125
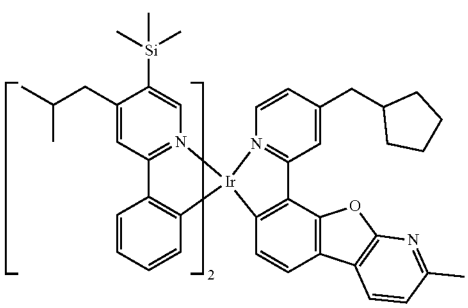
128
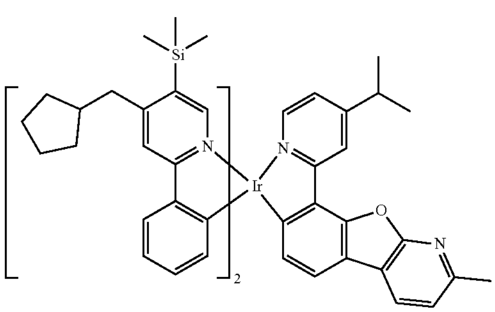
163

TABLE 2-continued
| Compound No. of dopant in emission layer | Driving voltage(V) | Max EQE(%) | $LT_{97}$ (relative value, %) (at 3,500 nit) |
|---|---|---|---|
| 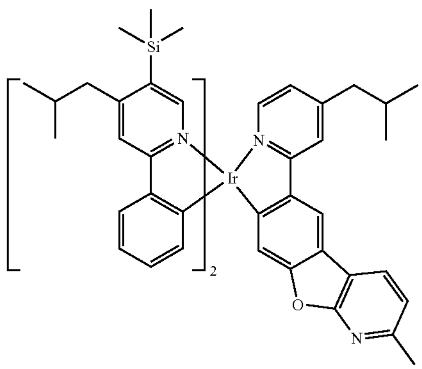 365 | | | |
| 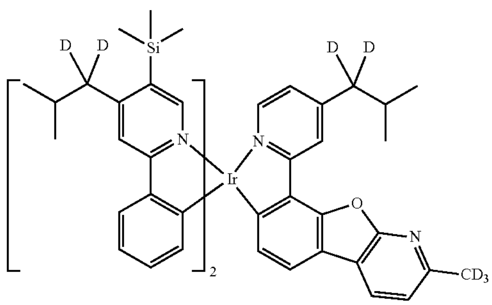 505 | | | |
| 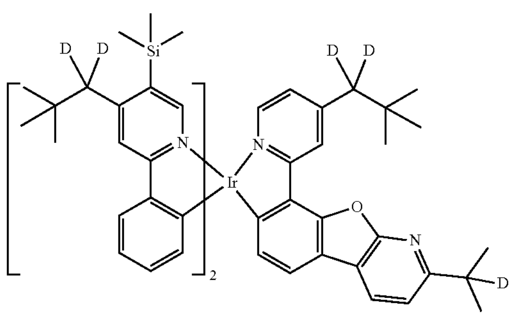 526 | | | |
| 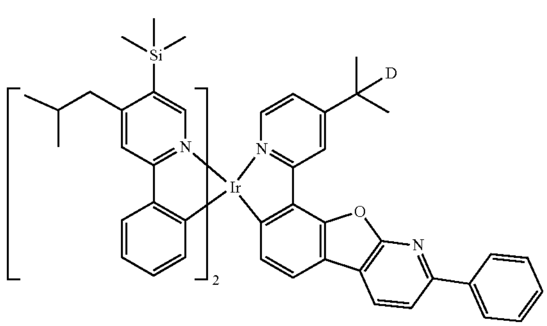 676 | | | |

TABLE 2-continued
| Compound No. of dopant in emission layer | Driving voltage(V) | Max EQE(%) | $LT_{97}$ (relative value, %) (at 3,500 nit) |
|---|---|---|---|
| 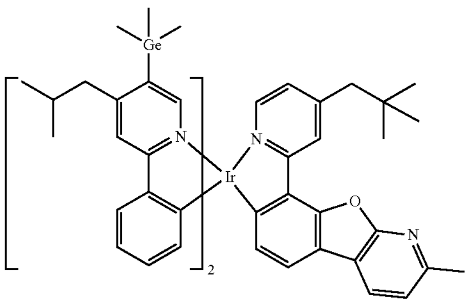 806 | | | |
| 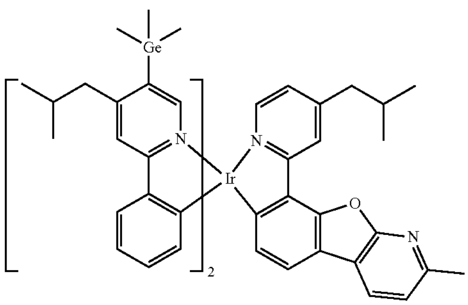 865 | | | |
| 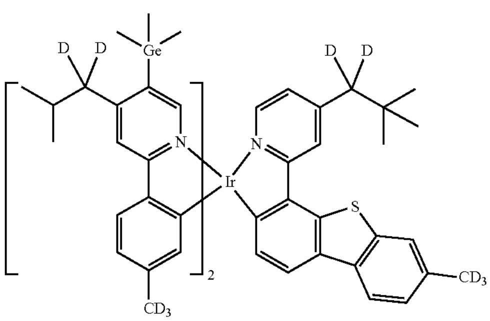 1365 | | | |
| 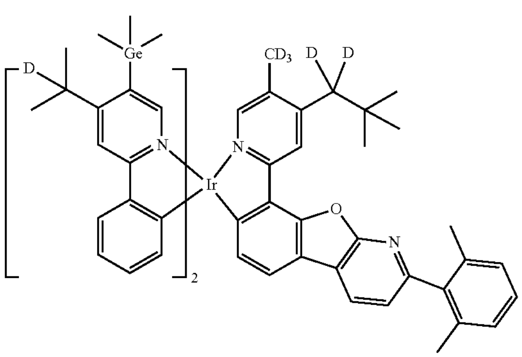 1497 | | | |

TABLE 2-continued

| Compound No. of dopant in emission layer | Driving voltage(V) | Max EQE(%) | $LT_{97}$ (relative value, %) (at 3,500 nit) |
| --- | --- | --- | --- |

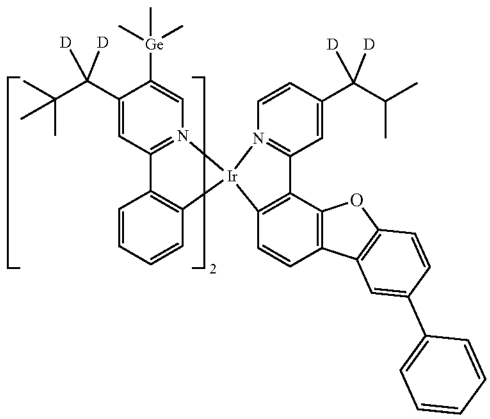

1505

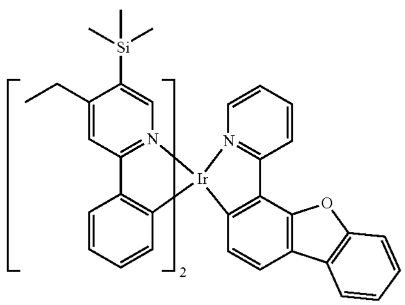

A

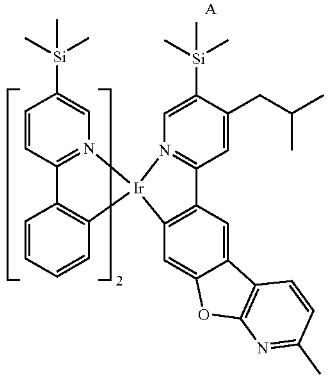

B

Referring to Table 2, it was confirmed that the organic light-emitting device manufactured according to Examples 1 to 12 had a comparable value of driving voltage and improved external quantum efficiency and longer lifespan characteristics, as compared with the organic light-emitting device manufactured according to Comparative Examples A and B.

According to the one or more embodiments, the organometallic compound has excellent electronic characteristics and heat resistance, and thus, an electronic device, for example, an organic light-emitting device, including the organometallic compound may have good driving voltage, good external quantum efficiency, and good lifespan characteristics. In addition, since the organometallic compound has excellent phosphorescence characteristics, a diagnostic composition including the organometallic compound may be provided with a high diagnosis efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2} \quad \text{Formula 1}$$

wherein, in Formula 1,

M is a transition metal, $L_1$ is a ligand represented by Formula 2A, $L_2$ is a ligand represented by Formula 2B, n1 and n2 are each independently 1 or 2, wherein, when n1 is 2, two $L_1$(s) are identical to or different from each other and when n2 is 2, two $L_2$(s) are identical to or different from each other, the sum of n1 and n2 is 2 or 3, and $L_1$ and $L_2$ are different from each other:

Formula 2A

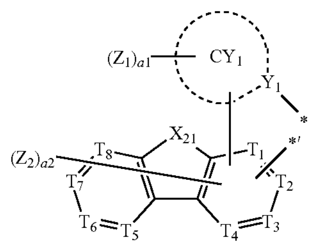

Formula 2B

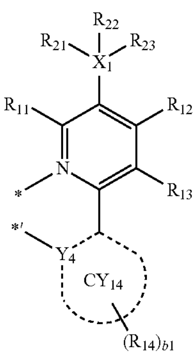

wherein, in Formulae 2A and 2B, $Y_1$ and $Y_4$ are each independently C or N, $X_1$ is Ge, $X_{21}$ is O, S, S(=O), N($Z_{29}$), C($Z_{29}$)($Z_{30}$), or Si($Z_{29}$)($Z_{30}$), $T_1$ to $T_4$ are each independently C, N, carbon linked to ring $CY_1$, or carbon linked to M in Formula 1, wherein one of $T_1$ to $T_4$ is carbon linked to M in Formula 1, and one of the remaining $T_1$ to $T_4$ that are not linked to M in Formula 1 is carbon linked to ring $CY_1$, $T_5$ to $T_8$ are each independently C or N, ring $CY_1$ and ring $CY_{14}$ are each independently a $C_5$-$C_{30}$ carbocyclic group or a $C_1$-$C_{30}$ heterocyclic group, $R_{21}$ to $R_{23}$ are each independently a $C_1$-$C_{60}$ alkyl group or a $C_6$-$C_{60}$ aryl group, each unsubstituted or substituted with deuterium, —F, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_3$-$C_{10}$ cycloalkyl group, a phenyl group or any combination thereof, $Z_1$, $Z_2$, and $R_{11}$ to $R_{14}$ are each independently hydrogen, deuterium, —F, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Qu)($Q_2$), —Ge($Q_3$)($Q_4$)($Q_5$), —B($Q_6$)($Q_7$), —P(=O)($Q_8$)($Q_9$), or —P($Q_8$)($Q_9$), wherein $R_{12}$ is neither hydrogen nor a methyl group, a1 and b1 are each independently an integer from 0 to 20, wherein, when a1 is 2 or more, two or more $Z_1$(s) are identical to or different from each other, and when b1 is 2 or more, two or more $R_{14}$(s) are identical to or different from each other, a2 is an integer from 0 to 6, wherein, when a2 is 2 or more, two or more $Z_2$(s) are identical to or different from each other, two or more of $R_{21}$ to $R_{23}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_1$(s) are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $Z_2$(s) are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_{14}$(s) are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $Z_1$, $Z_2$ and $R_{11}$ to $R_{14}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as defined in connection with $R_{14}$, and *' in Formulae 2A and 2B each indicate a binding site to M in Formula 1, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof;

$Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group, a monovalent non-aromatic condensed polycyclic group; or a monovalent non-aromatic condensed heteropolycyclic group.

2. The organometallic compound of claim 1, wherein M in Formula 1 is Ir, and the sum of n1 and n2 is 3, or M in Formula 1 is Pt, and the sum of n1 and n2 is 2.

3. The organometallic compound of claim 1, wherein $X_{21}$ in Formula 2A is O or S.

4. The organometallic compound of claim 1, wherein $Z_1$ in Formula 2A is:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, or any combination thereof; or a $C_3$-$C_{10}$ cycloalkyl group or a $C_1$-$C_{10}$ heterocycloalkyl group, unsubstituted or substituted with deuterium, —F, a cyano group, a $C_1$-$C_{20}$ alkyl group, a deuterated $C_1$-$C_{20}$ alkyl group, or any combination thereof.

5. The organometallic compound of claim 1, wherein a number of carbons included in $R_{12}$ of Formula 2B is at least two.

6. The organometallic compound of claim 1, wherein the organometallic compound represented by Formula 1 satisfies at least one of Condition (1) to Condition (3) below:

Condition (1)

In Formula 2A, $Z_1$ is not hydrogen, and a1 is an integer of 1 to 20,

Condition (2)

In Formula 2B, $R_{14}$ is not hydrogen, and b1 is an integer of 1 to 20,

Condition (3)

In Formula 2A, $Z_2$ is not hydrogen, and a2 is an integer of 1 to 6.

7. The organometallic compound of claim 1, wherein the organometallic compound represented by Formula 1 comprises at least one deuterium, at least one fluoro group (—F), at least one cyano group (—CN), or any combination thereof.

8. The organometallic compound of claim 1, wherein $Z_2$ in Formula 2A is not hydrogen, a2 is an integer from 1 to 3, and at least one of $Z_2$(s) in number of a2 is a substituted or unsubstituted $C_1$-$C_{60}$ alkyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

9. The organometallic compound of claim 1, wherein a group represented by

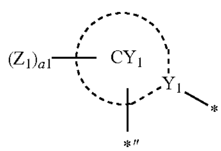

in Formula 2A is represented by one of Formulae Cy1-1 to CY1-28:

CY1-1

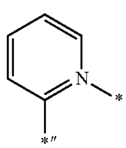

CY1-2

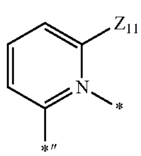

CY1-3

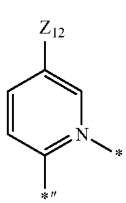

CY1-4

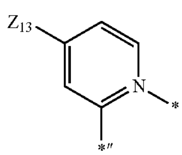

CY1-5

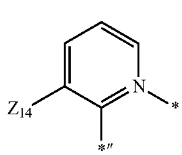

-continued

CY1-6

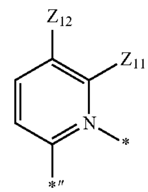

CY1-7

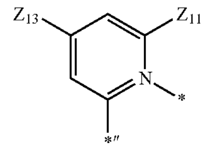

CY1-8

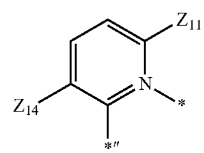

CY1-9

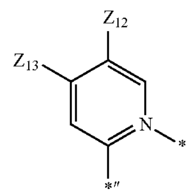

CY1-10

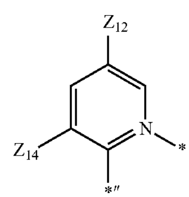

CY1-11

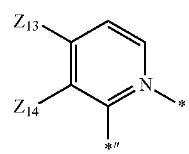

CY1-12

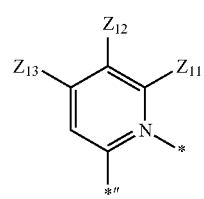

CY1-13

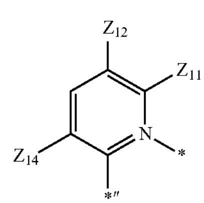

CY1-14

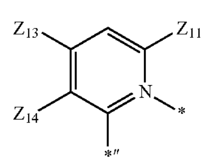

-continued
CY1-15
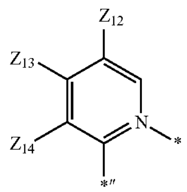
CY1-16
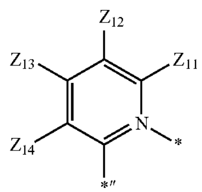
CY1-17
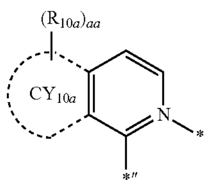
CY1-18
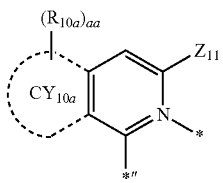
CY1-19
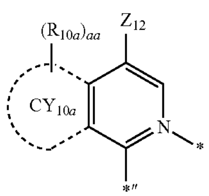
CY1-20
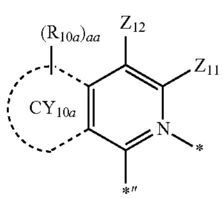
CY1-21
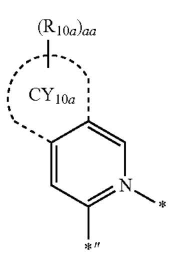
-continued
CY1-22
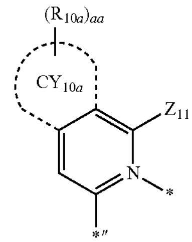
CY1-23
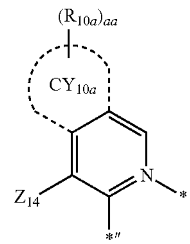
CY1-24
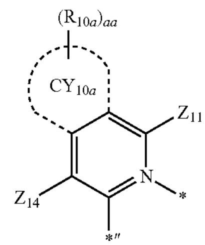
CY1-25
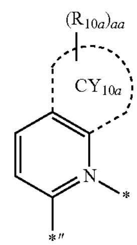
CY1-26
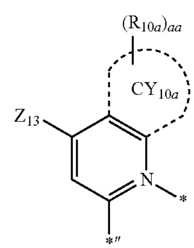
CY1-27
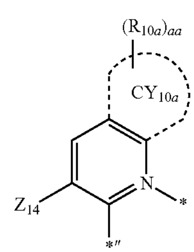

-continued

CY1-28

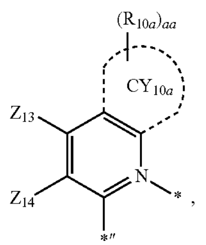

wherein, in Formulae CY1-1 to CY1-28, $Z_{11}$ to $Z_{14}$ are each independently the same as defined in connection with $Z_1$ in claim 1, wherein each of $Z_{11}$ to $Z_{14}$ are not hydrogen, ring $CY_{10a}$ is a $C_5$-$C_{30}$ carbocyclic group or a $C_1$-$C_{30}$ heterocyclic group, $R_{10a}$ is the same as described in claim 1, aa is an integer from 0 to 10, and

* indicates a binding site to M in Formula 1, and *" indicates a binding site to one of $T_1$ to $T_4$ in Formula 2A.

10. The organometallic compound of claim 9, wherein a group represented by

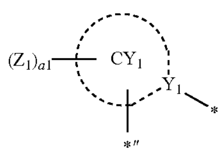

in Formula 2A is represented by one of Formulae CY1-4, CY1-7, CY1-9, CY1-11, CY1-12, and CY1-14 to CY1-24.

11. The organometallic compound of claim 1, wherein a group represented by

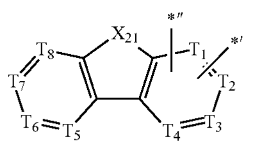

in Formula 2A is represented by one of Formulae CY2-1 to CY2-6:

CY2-1

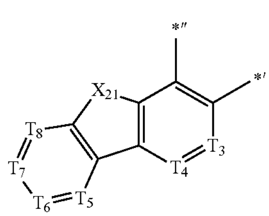

-continued

CY2-2

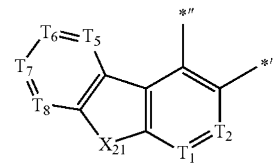

CY2-3

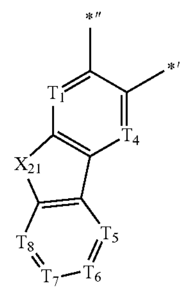

CY2-4

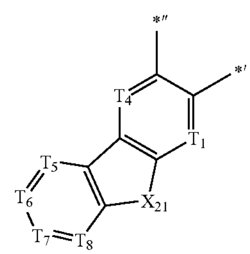

CY2-5

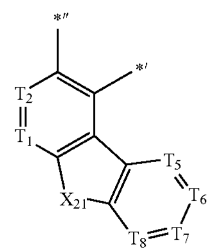

CY2-6

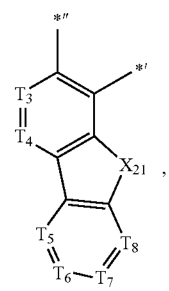

wherein, in Formulae CY2-1 to CY2-6, $T_1$ to $T_8$ are each independently C or N, $X_{21}$ is the same as described in claim 1,

*" indicates a binding site to ring $CY_1$ in Formula 2A, and

*' indicates a binding site to M in Formula 1.

12. The organometallic compound of claim 11, wherein a) each of $T_1$ to $T_8$ in Formulae CY2-1 to CY2-6 is C, b) at least one of $T_3$ to $T_8$ in Formulae CY2-1 and CY2-6 is N, c) at least one of $T_1$, $T_2$, and $T_5$ to $T_8$ in Formulae CY2-2 and CY2-5 is N, d) at least one of $T_1$ and $T_4$ to $T_8$ in Formulae CY2-3 and CY2-4 is N.

13. The organometallic compound of claim 11, wherein

1) $T_1$ to $T_8$ in Formulae CY2-1 to CY2-6 are C;

2) One of $T_3$ to $T_8$ in Formula CY2-1 is N, and the remaining $T_3$ to $T_8$ that are not N in Formula CY2-1 are C;

3) $T_3$ and $T_8$ in Formula CY2-1 are N, and $T_4$ to $T_7$ in Formula CY2-1 are C;

4) $T_6$ and $T_8$ in Formula CY2-1 are N, and $T_3$ to $T_5$ and $T_7$ in Formula CY2-1 are C;

5) One of $T_1$, $T_2$ and $T_8$ in Formula CY2-2 is N, and the remaining $T_1$, $T_2$ and $T_5$ to $T_8$ that are not N in Formula CY2-2 are C;

6) $T_1$ and $T_8$ in Formula CY2-2 are N, and $T_2$ and $T_5$ to $T_7$ in Formula CY2-2 are C;

7) $T_2$ and $T_8$ in Formula CY2-2 are N, and $T_1$ and $T_5$ to $T_7$ in Formula CY2-2 are C;

8) One of $T_1$, $T_4$ and $T_8$ in Formulae CY2-3 and CY2-4 is N, and the remaining $T_1$, $T_4$ and $T_5$ to $T_8$ that are not N in Formulae CY2-3 and CY2-4 are C;

9) $T_1$ and $T_8$ in Formulae CY2-3 and CY2-4 are N, and $T_4$ and $T_5$ to $T_7$ in Formulae CY2-3 and CY2-4 are C;

10) $T_4$ and $T_8$ in Formulae CY2-3 and CY2-4 are N, and $T_1$ and $T_5$ to $T_7$ in Formulae CY2-3 and CY2-4 are C;

11) One of $T_1$ and $T_8$ in Formula CY2-5 is N, and the remaining $T_1$, $T_2$ and $T_5$ to $T_8$ that are not N in Formula CY2-5 are C;

12) $T_1$ and $T_8$ in Formula CY2-5 are N, and $T_2$ and $T_5$ to $T_7$ in Formula CY2-5 are C;

13) One of $T_4$ and $T_8$ in Formula CY2-6 is N, and the remaining $T_3$ to $T_8$ that are not N in Formula CY2-6 are C; or 14) $T_4$ and $T_8$ in Formula CY2-6 are N, and $T_3$ and $T_5$ to $T_7$ in Formula CY2-6 are C.

14. The organometallic compound of claim 1, wherein a group represented by

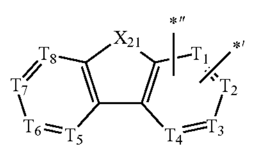

in Formula 2A is represented by one of Formulae CY2-1001 to CY2-1141, CY2-2001 to CY2-2092, CY2-3001 to CY2-3092, CY2-4001 to CY2-4092, CY2-5001 to CY2-5065 and CY2-6001 to CY2-6065:

CY2-1001

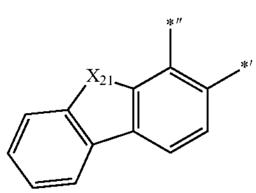

CY2-1002

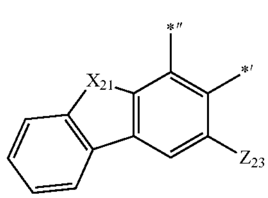

-continued

CY2-1003

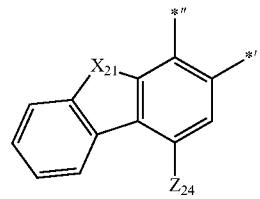

CY2-1004

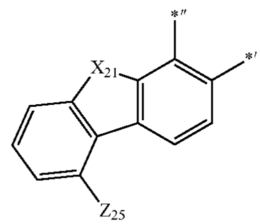

CY2-1005

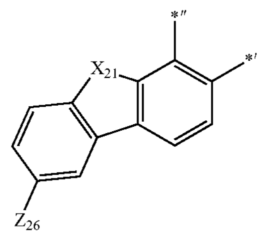

CY2-1006

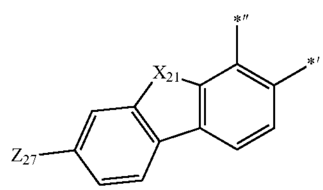

CY2-1007

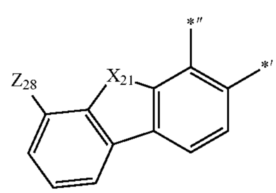

CY2-1008

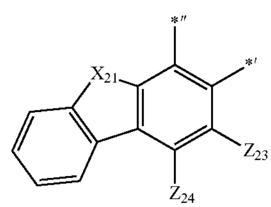

CY2-1009

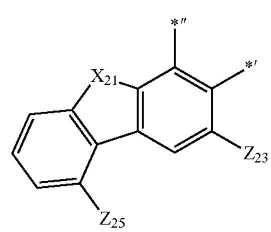

-continued
CY2-1010
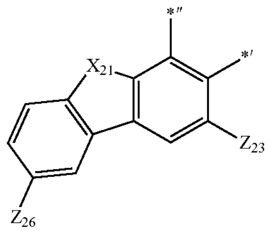
CY2-1011
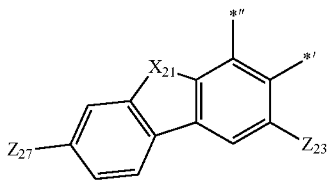
CY2-1012
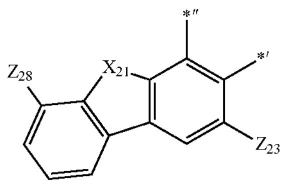
CY2-1013
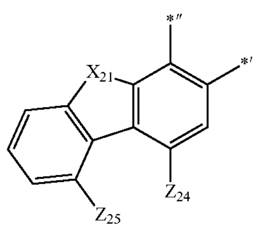
CY2-1014
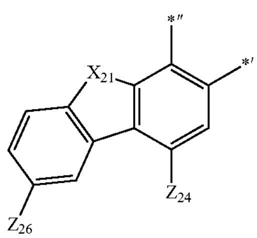
CY2-1015
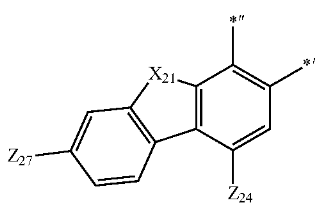
CY2-1016
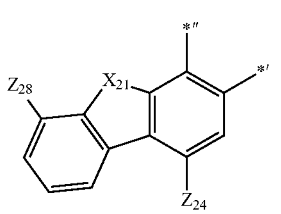
-continued
CY2-1017
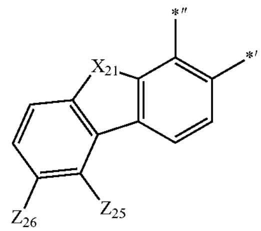
CY2-1018
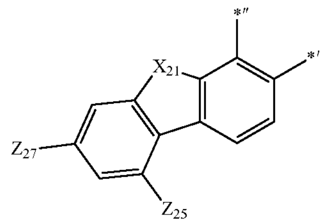
CY2-1019
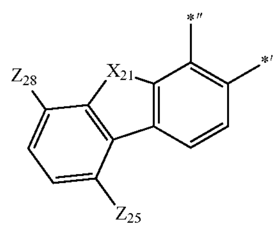
CY2-1020
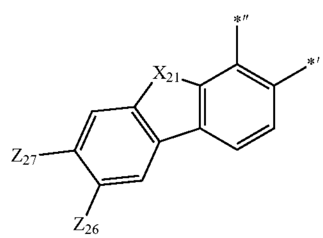
CY2-1021
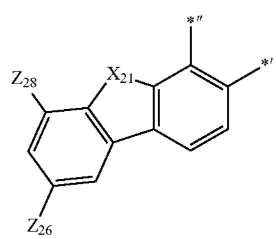
CY2-1022
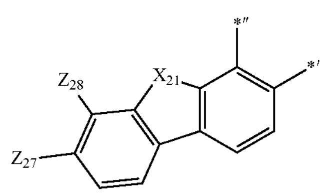
CY2-1023
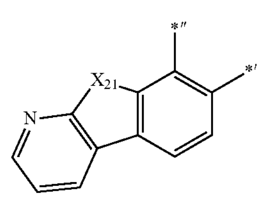

-continued
CY2-1024
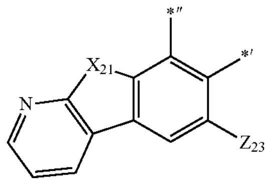
CY2-1025
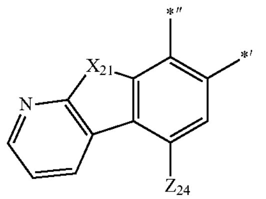
CY2-1026
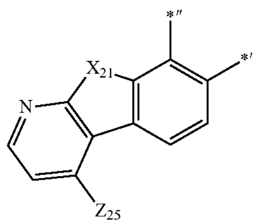
CY2-1027
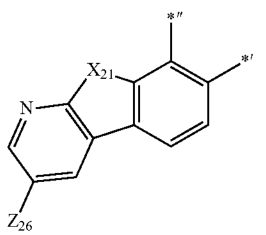
CY2-1028
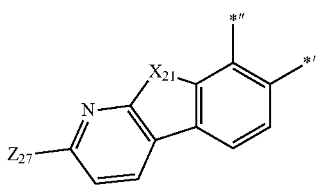
CY2-1029
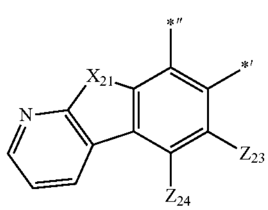
CY2-1030
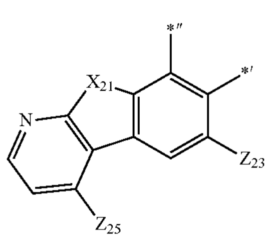
-continued
CY2-1031
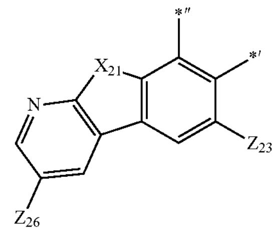
CY2-1032
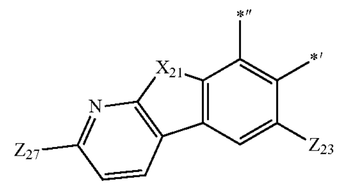
CY2-1033
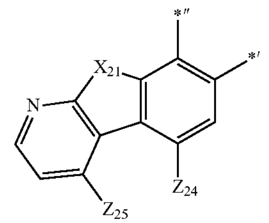
CY2-1034
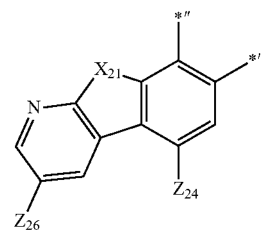
CY2-1035
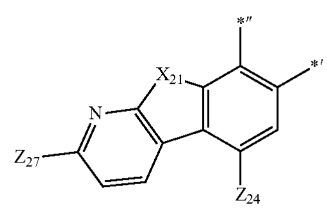
CY2-1036
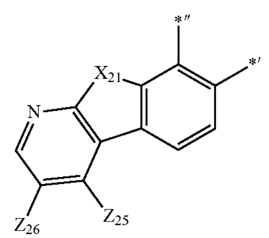
CY2-1037
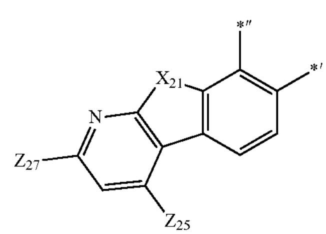

-continued
CY2-1038
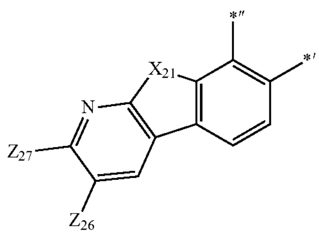
CY2-1039
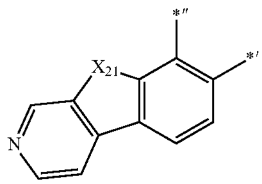
CY2-1040
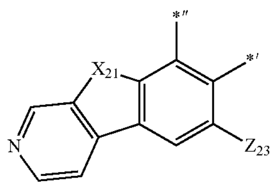
CY2-1041
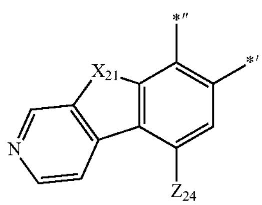
CY2-1042
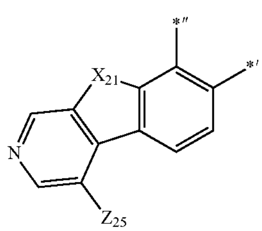
CY2-1043
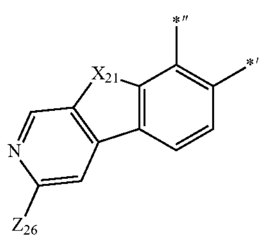
CY2-1044
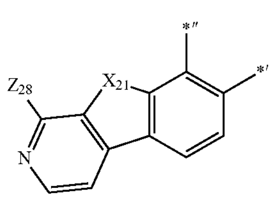
-continued
CY2-1045
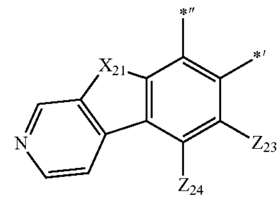
CY2-1046
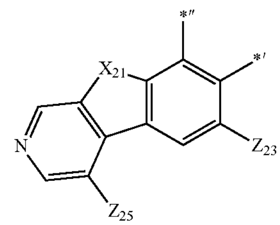
CY2-1047
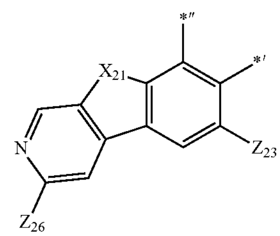
CY2-1048
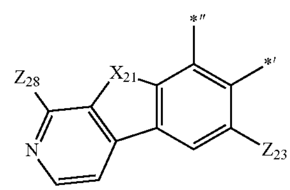
CY2-1049
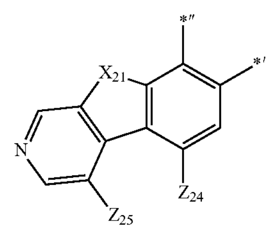
CY2-1050
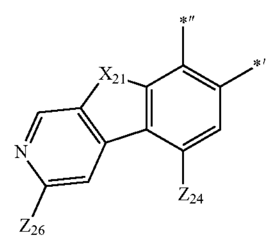
CY2-1051
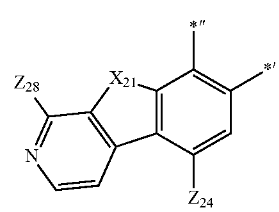

-continued
CY2-1052
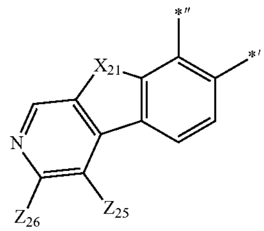
CY2-1053
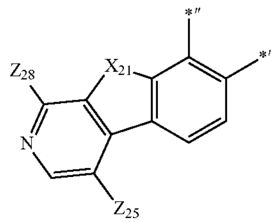
CY2-1054
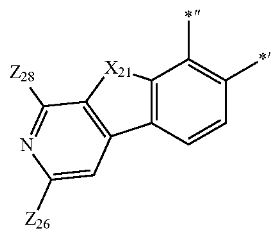
CY2-1055
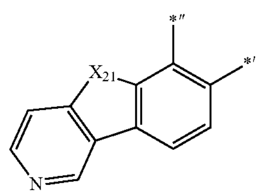
CY2-1056
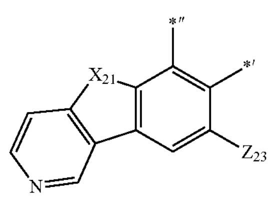
CY2-1057
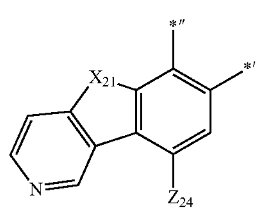
CY2-1058
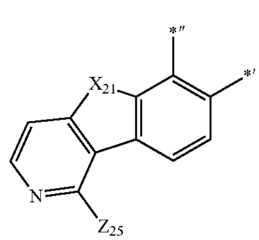
-continued
CY2-1059
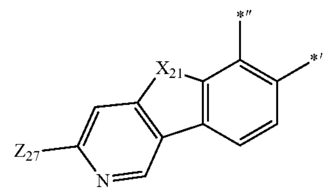
CY2-1060
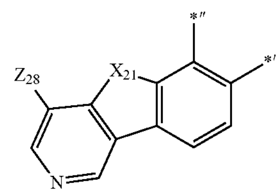
CY2-1061
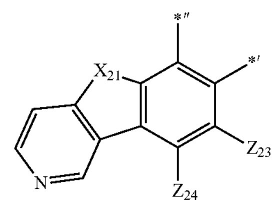
CY2-1062
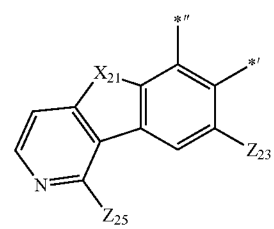
CY2-1063
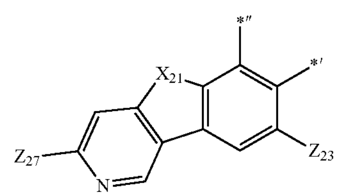
CY2-1064
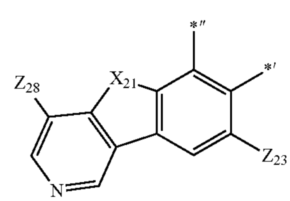
CY2-1065
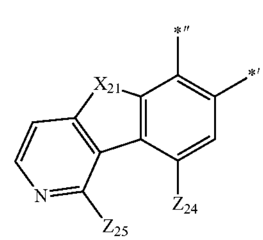

-continued
CY2-1066
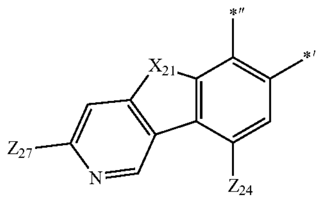
CY2-1067
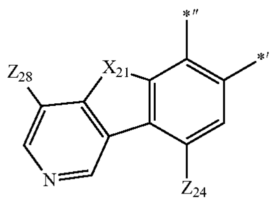
CY2-1068
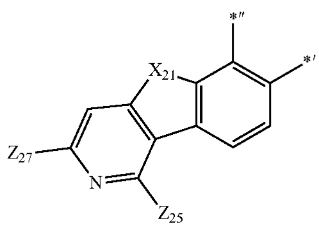
CY2-1069
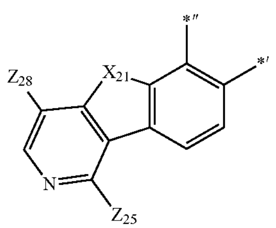
CY2-1070
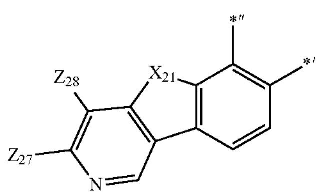
CY2-1071
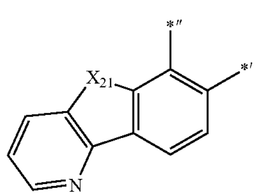
CY2-1072
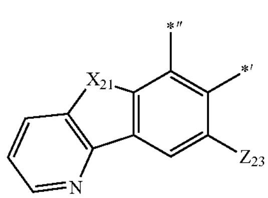
-continued
CY2-1073
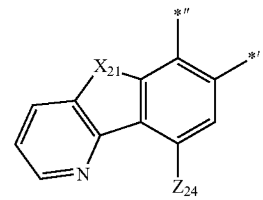
CY2-1074
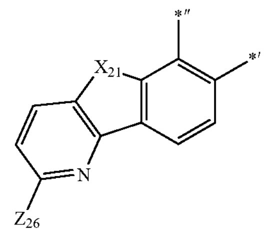
CY2-1075
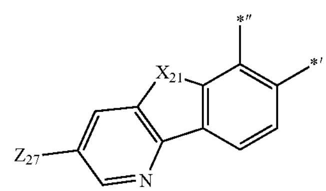
CY2-1076
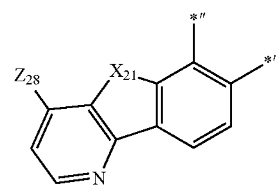
CY2-1077
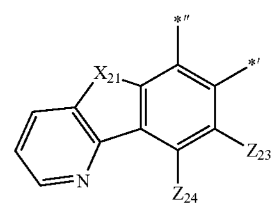
CY2-1078
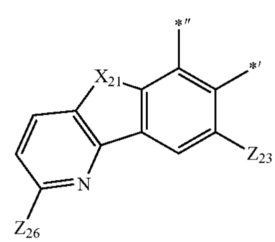
CY2-1079
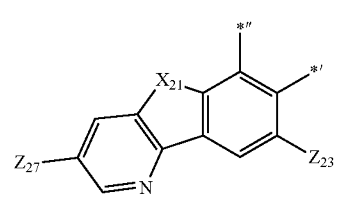

-continued
CY2-1080
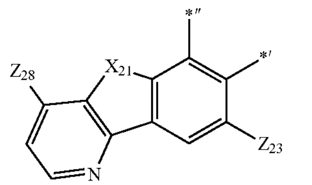
CY2-1081
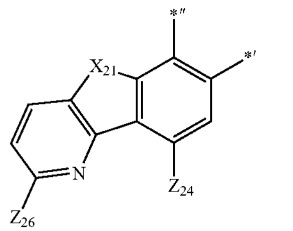
CY2-1082
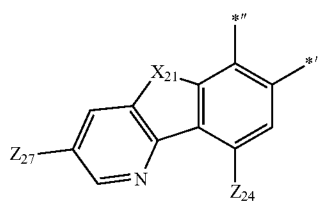
CY2-1083
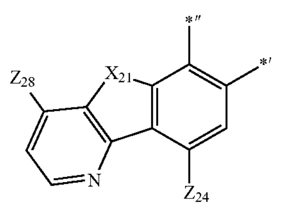
CY2-1084
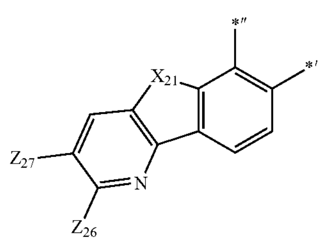
CY2-1085
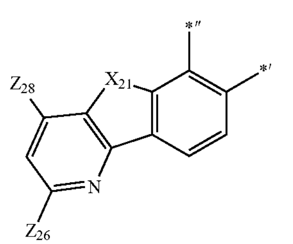
CY2-1086
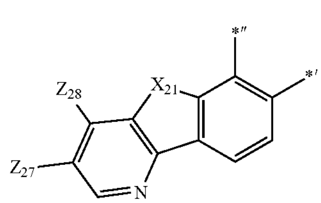
-continued
CY2-1087
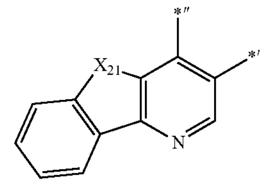
CY2-1088
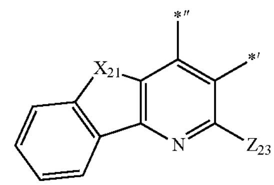
CY2-1089
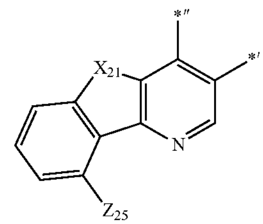
CY2-1090
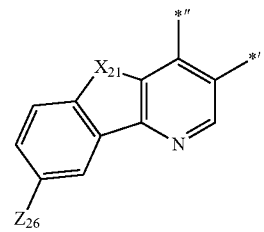
CY2-1091
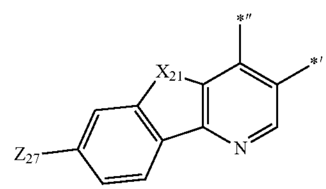
CY2-1092
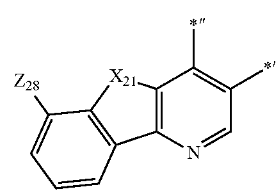
CY2-1093
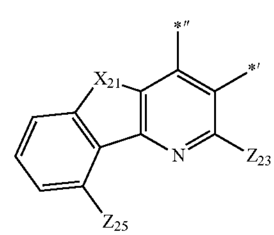

-continued
CY2-1094
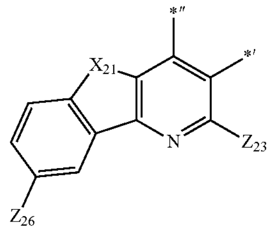
CY2-1095
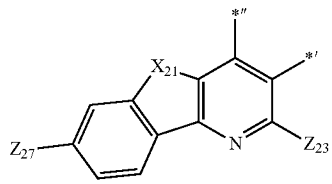
CY2-1096
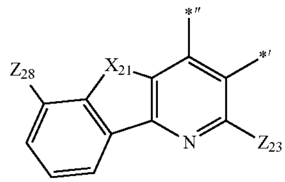
CY2-1097
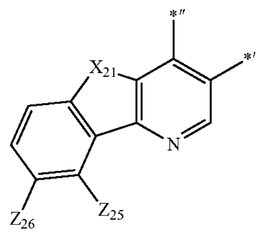
CY2-1098
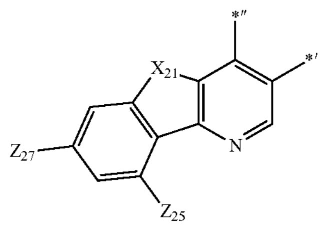
CY2-1099
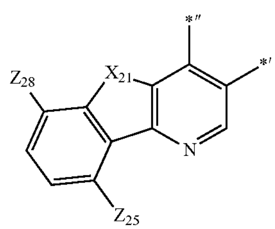
CY2-1100
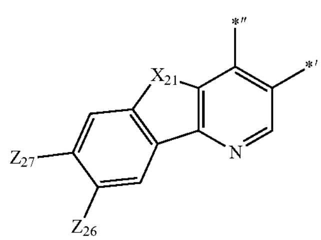
-continued
CY2-1101
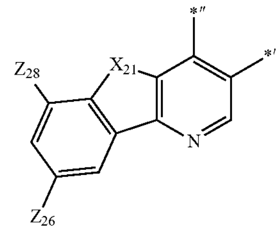
CY2-1102
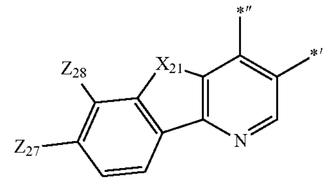
CY2-1103
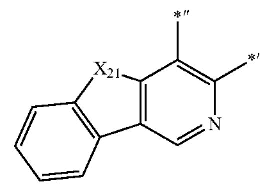
CY2-1104
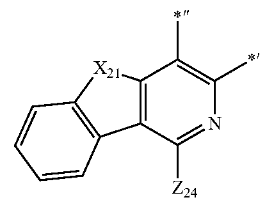
CY2-1105
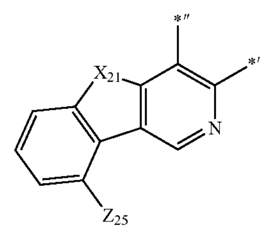
CY2-1106
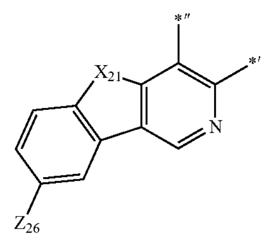
CY2-1107
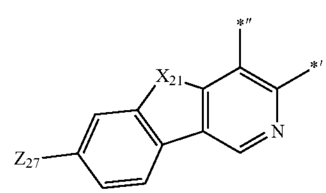

-continued
CY2-1108
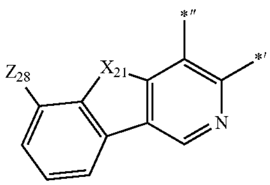
CY2-1109
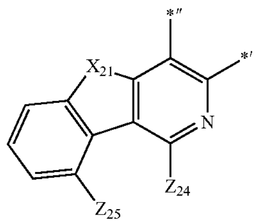
CY2-1110
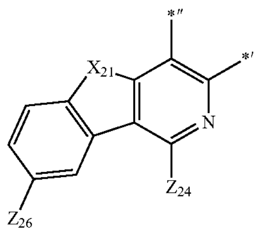
CY2-1111
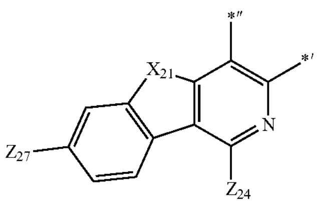
CY2-1112
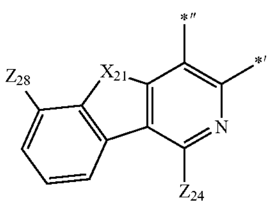
CY2-1113
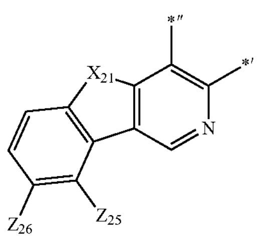
CY2-1114
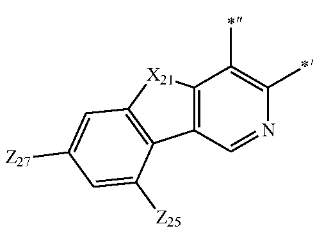
-continued
CY2-1115
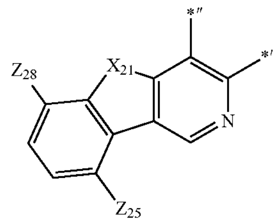
CY2-1116
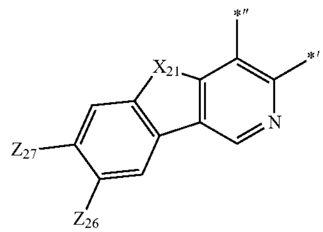
CY2-1117
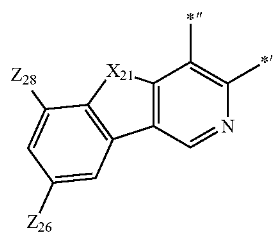
CY2-1118
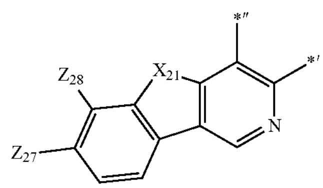
CY2-1119
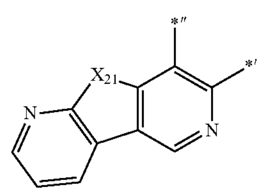
CY2-1120
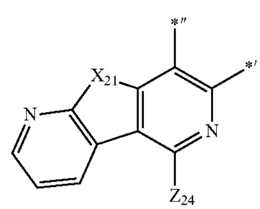
CY2-1121
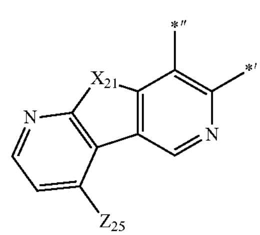

CY2-1122
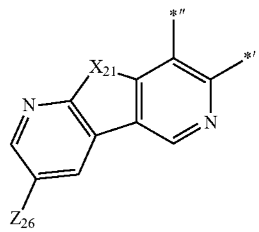
CY2-1123
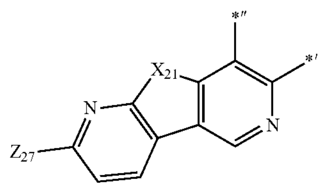
CY2-1124
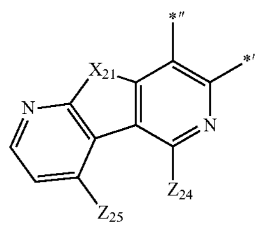
CY2-1125
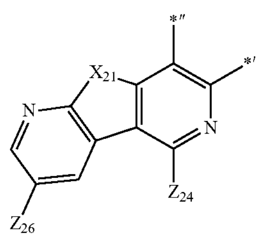
CY2-1126
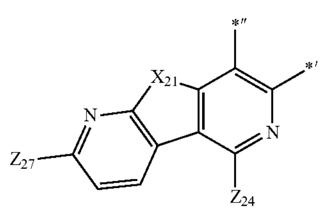
CY2-1127
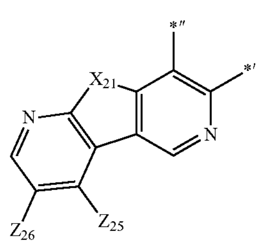
CY2-1128
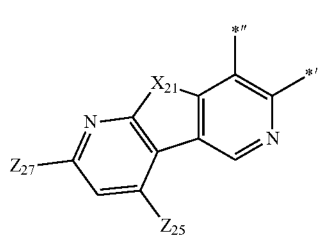
CY2-1129
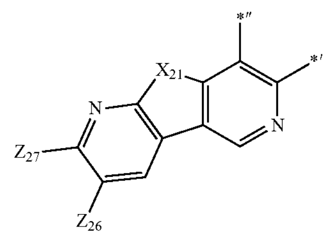
CY2-1130
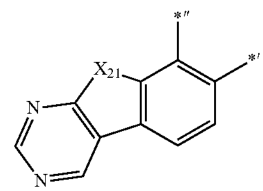
CY2-1131
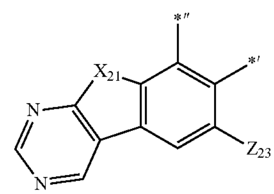
CY2-1132
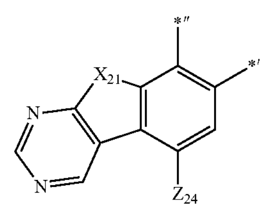
CY2-1133
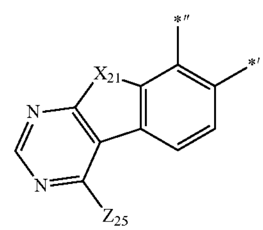
CY2-1134
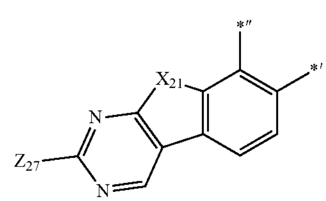
CY2-1135
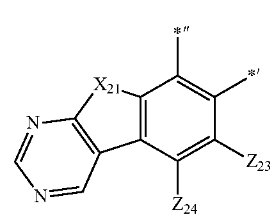

-continued
CY2-1136
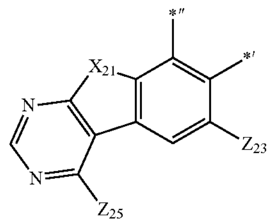
CY2-1137
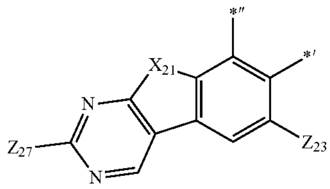
CY2-1138
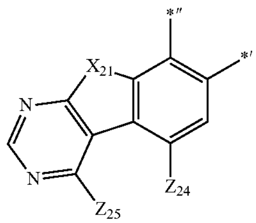
CY2-1139
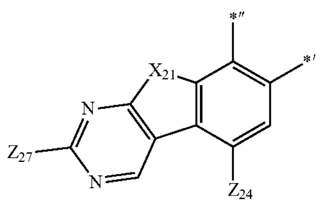
CY2-1140
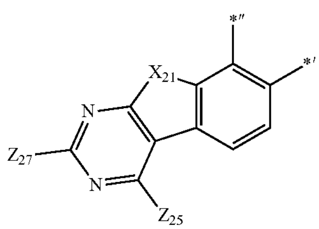
CY2-1141
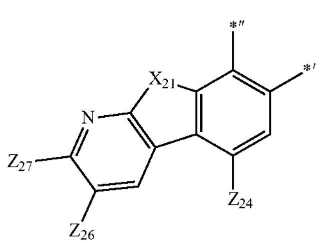
CY2-2001
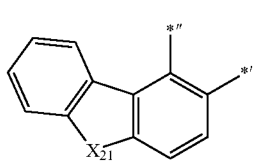
-continued
CY2-2002
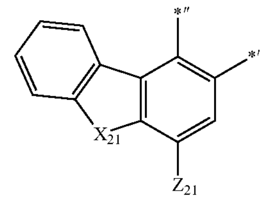
CY2-2003
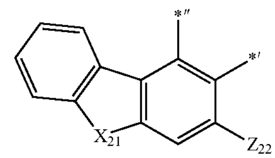
CY2-2004
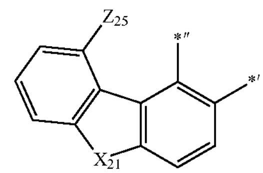
CY2-2005
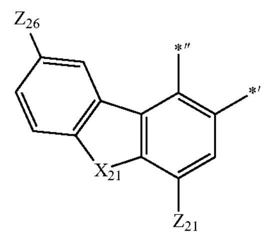
CY2-2006
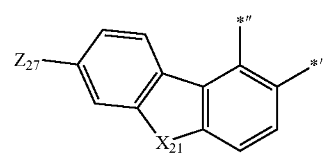
CY2-2007
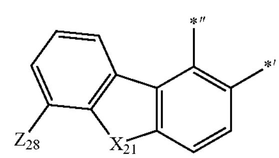
CY2-2008
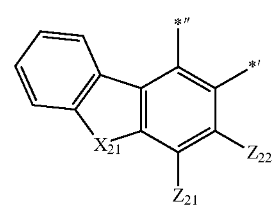
CY2-2009
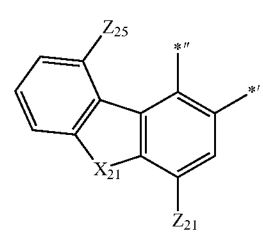

-continued
CY2-2010
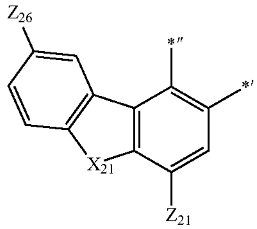
CY2-2011
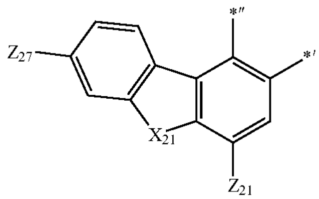
CY2-2012
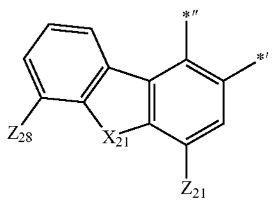
CY2-2013
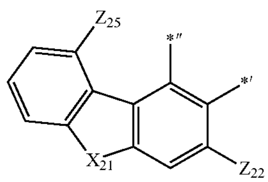
CY2-2014
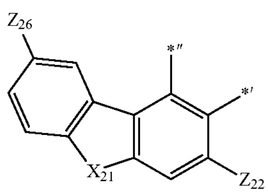
CY2-2015
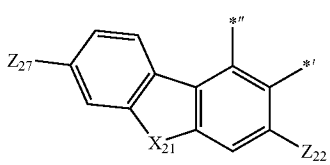
CY2-2016
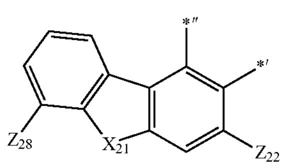
CY2-2017
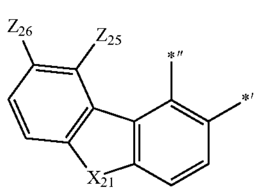
-continued
CY2-2018
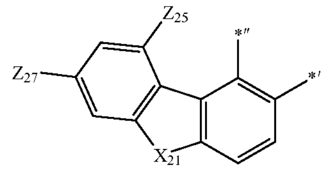
CY2-2019
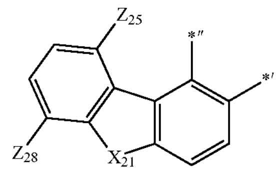
CY2-2020
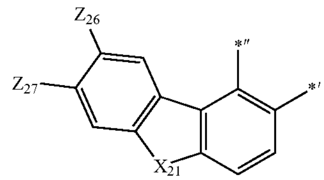
CY2-2021
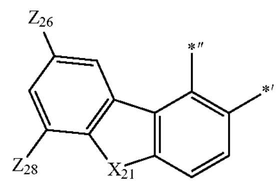
CY2-2022
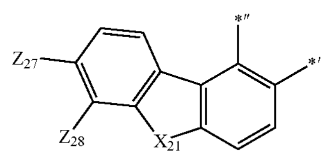
CY2-2023
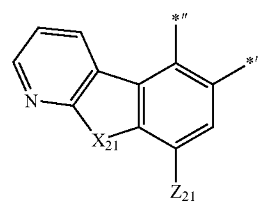
CY2-2024
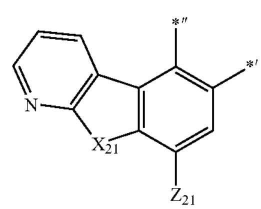
CY2-2025
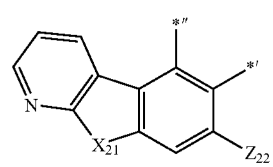

-continued
CY2-2026
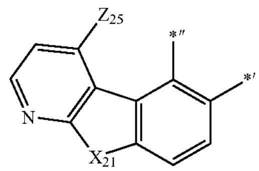
CY2-2027
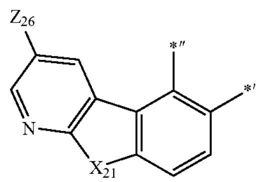
CY2-2028
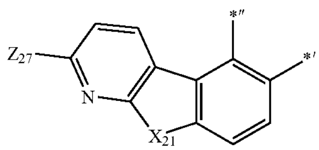
CY2-2029
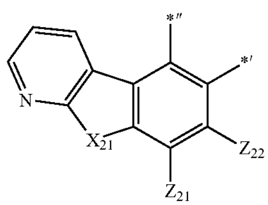
CY2-2030
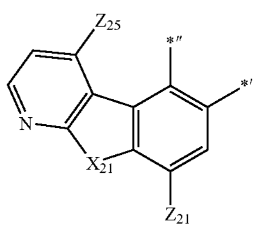
CY2-2031
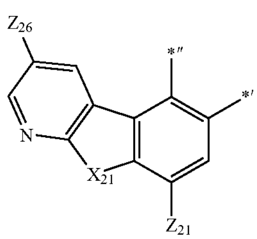
CY2-2032
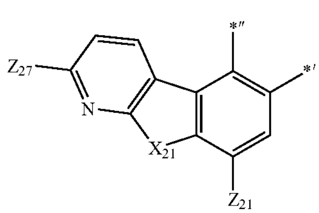
CY2-2033
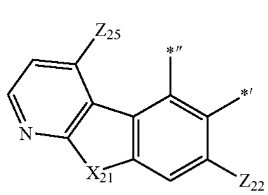
-continued
CY2-2034
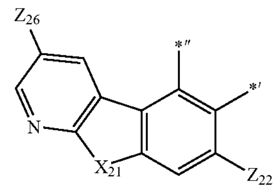
CY2-2035
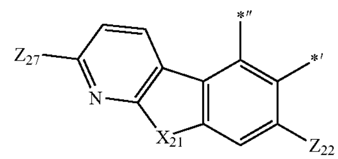
CY2-2036
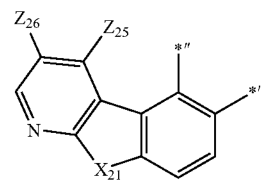
CY2-2037
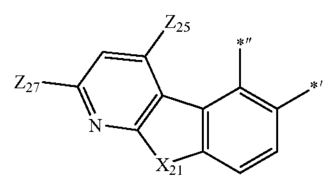
CY2-2038
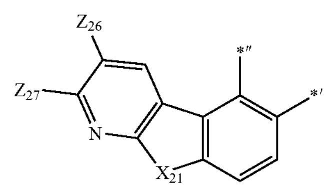
CY2-2039
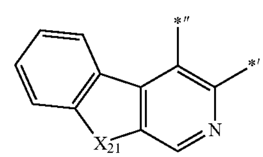
CY2-2040
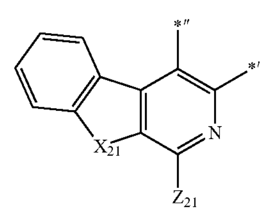
CY2-2041
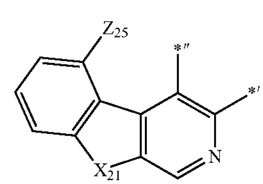

-continued
CY2-2042
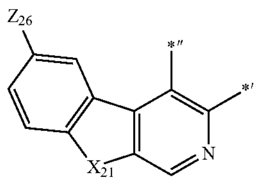
CY2-2043
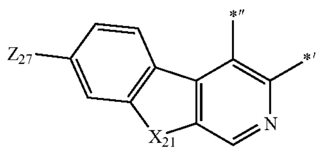
CY2-2044
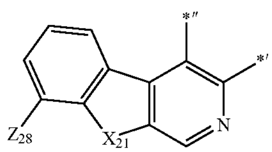
CY2-2045
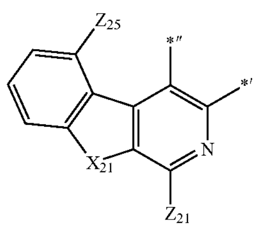
CY2-2046
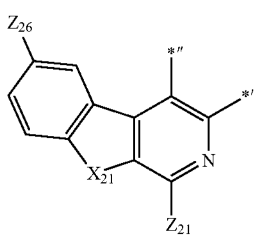
CY2-2047
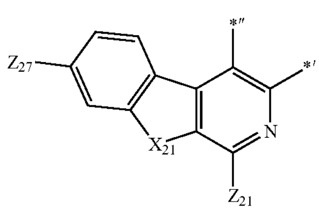
CY2-2048
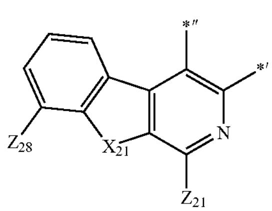
CY2-2049
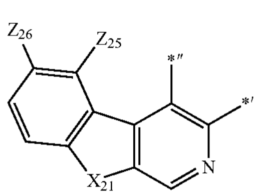
-continued
CY2-2050
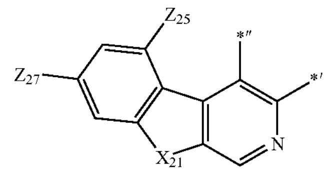
CY2-2051
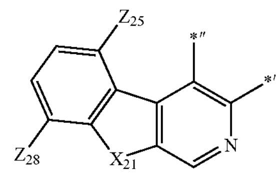
CY2-2052
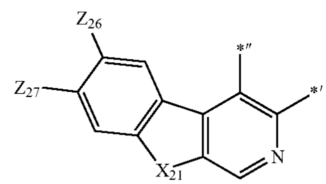
CY2-2053
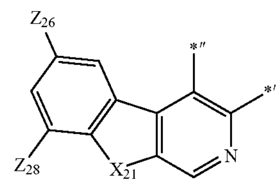
CY2-2054
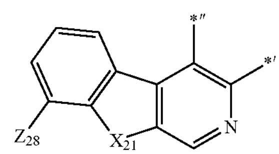
CY2-2055
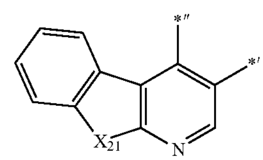
CY2-2056
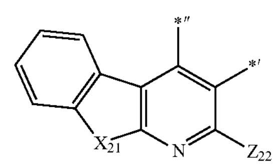
CY2-2057
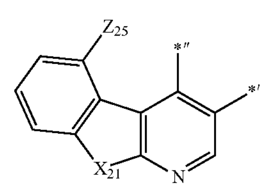
CY2-2058
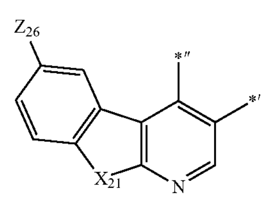

-continued
CY2-2059
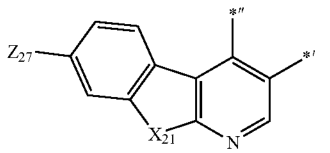
CY2-2060
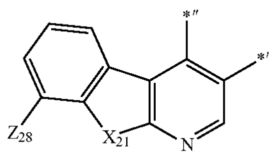
CY2-2061
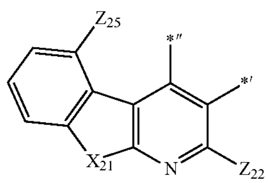
CY2-2062
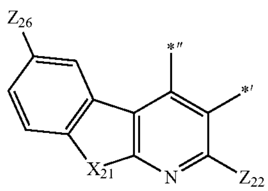
CY2-2063
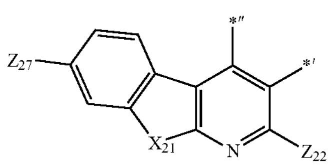
CY2-2064
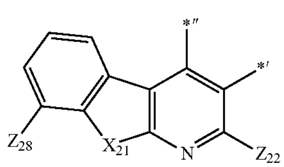
CY2-2065
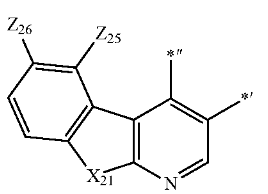
CY2-2066
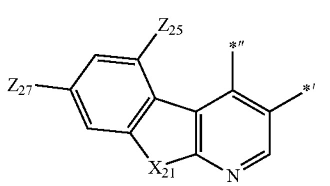
CY2-2067
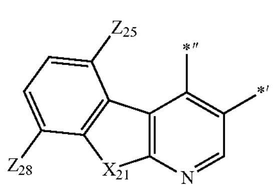
-continued
CY2-2068
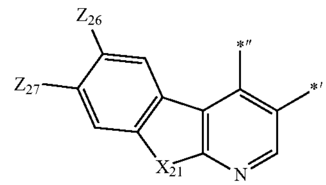
CY2-2069
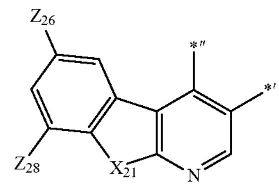
CY2-2070
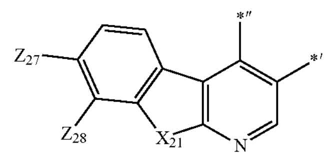
CY2-2071
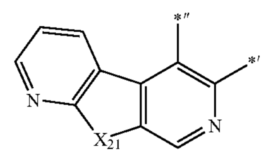
CY2-2072
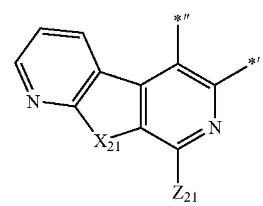
CY2-2073
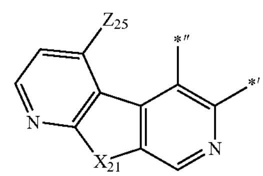
CY2-2074
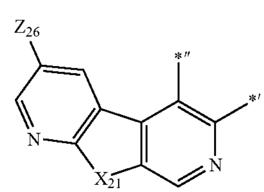
CY2-2075
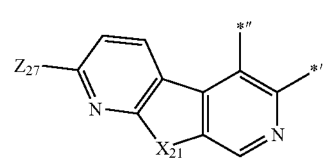

-continued
CY2-2076
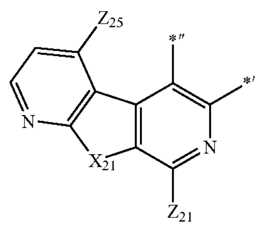
CY2-2077
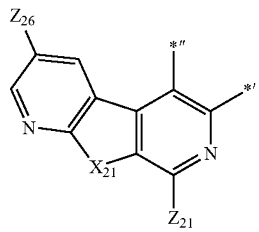
CY2-2078
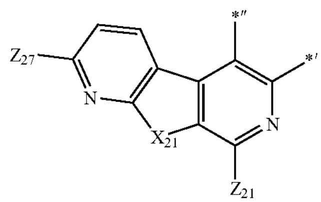
CY2-2079
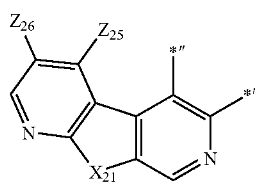
CY2-2080
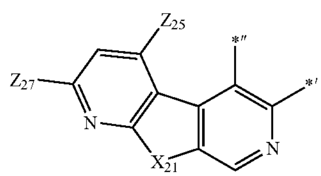
CY2-2081
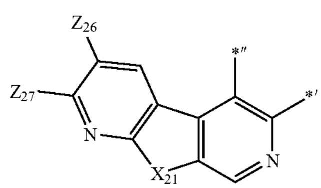
CY2-2082
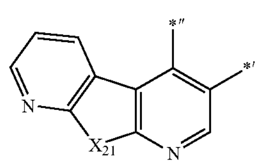
CY2-2083
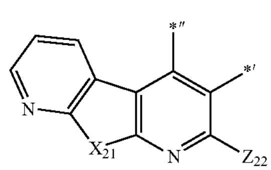
-continued
CY2-2084
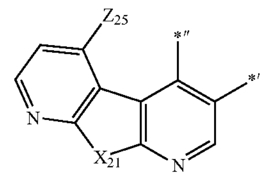
CY2-2085
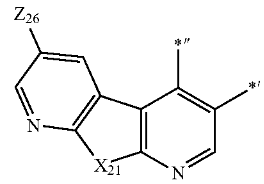
CY2-2086
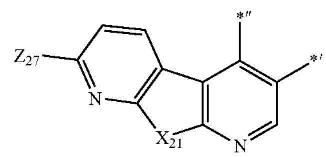
CY2-2087
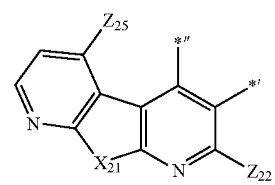
CY2-2088
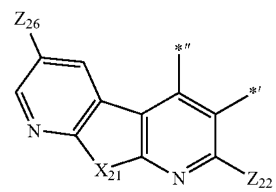
CY2-2089
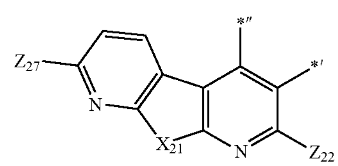
CY2-2090
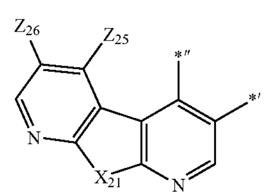
CY2-2091
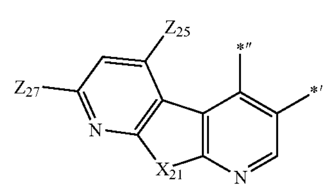

-continued
CY2-2092
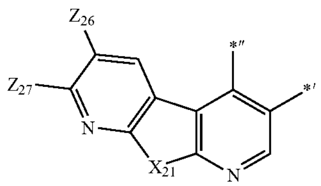
CY2-3001
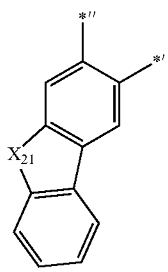
CY2-3002
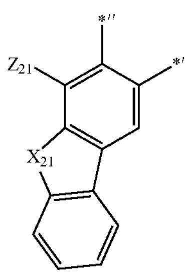
CY2-3003
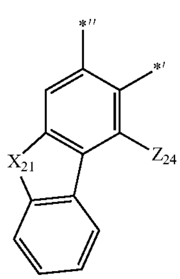
CY2-3004
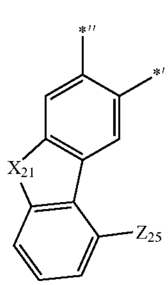
-continued
CY2-3005
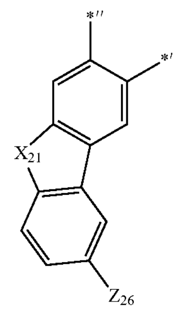
CY2-3006
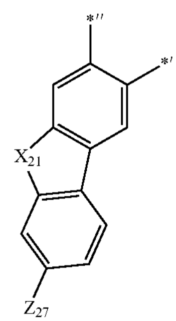
CY2-3007
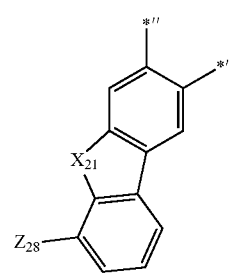
CY2-3008
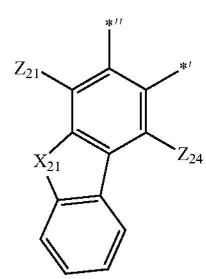
CY2-3009
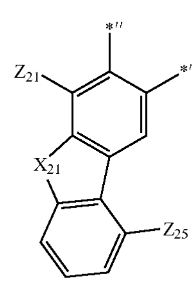

-continued
CY2-3010
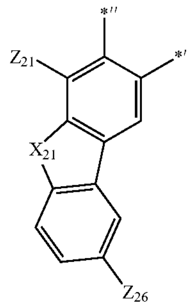
CY2-3011
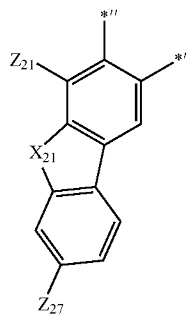
CY2-3012
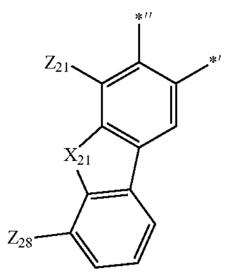
CY2-3013
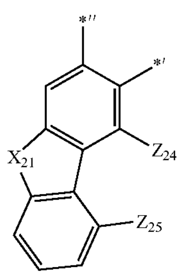
CY2-3014
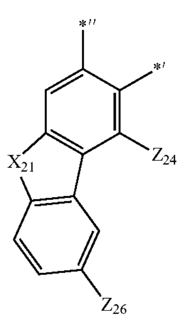
-continued
CY2-3015
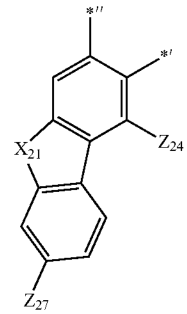
CY2-3016
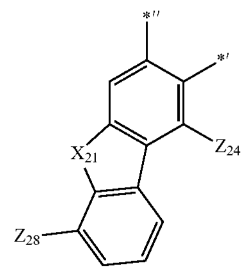
CY2-3017
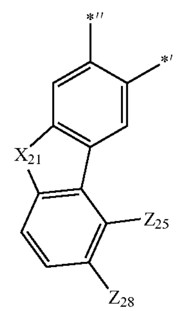
CY2-3018
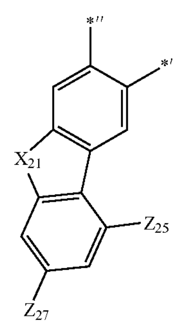
CY2-3019
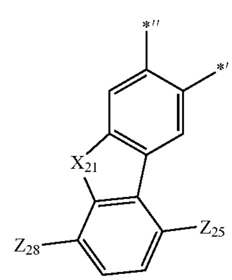

-continued
CY2-3020
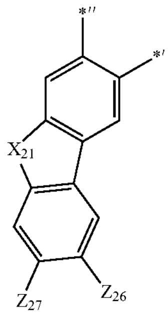
CY2-3021
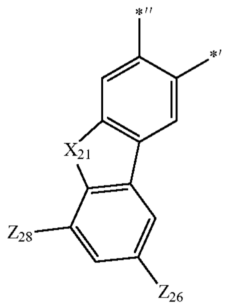
CY2-3022
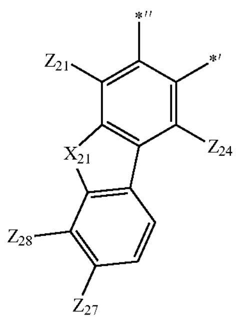
CY2-3023
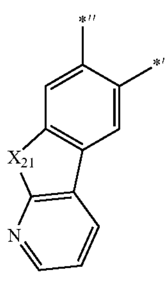
CY2-3024
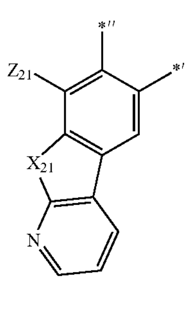
-continued
CY2-3025
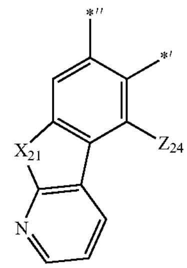
CY2-3026
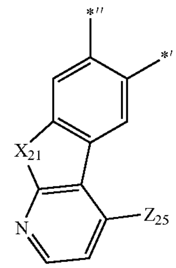
CY2-3027
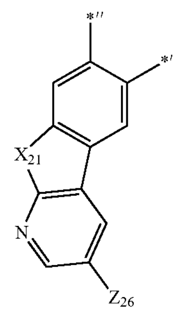
CY2-3028
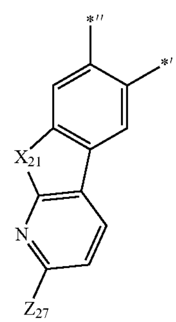
CY2-3029
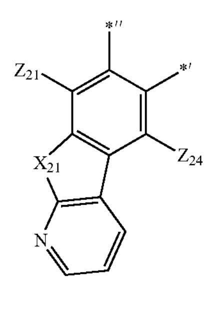

-continued
CY2-3030
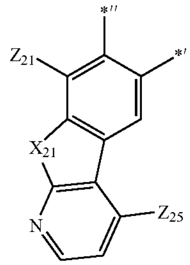
CY2-3031
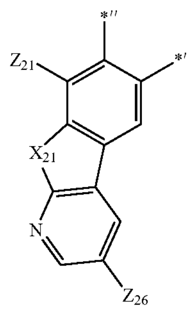
CY2-3032
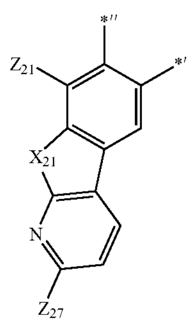
CY2-3033
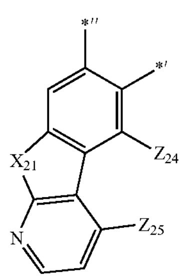
CY2-3034
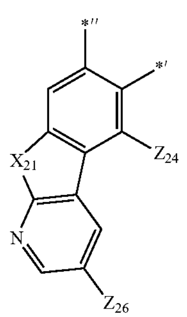
-continued
CY2-3035
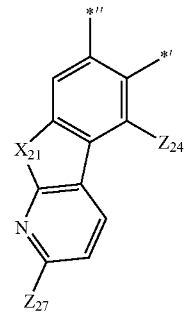
CY2-3036
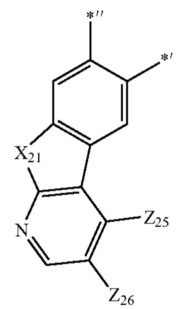
CY2-3037
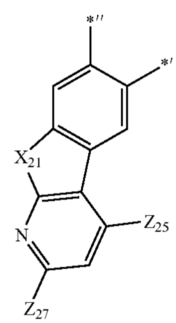
CY2-3038
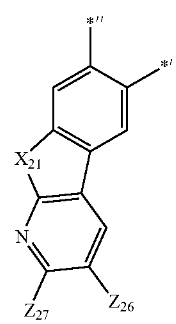
CY2-3039
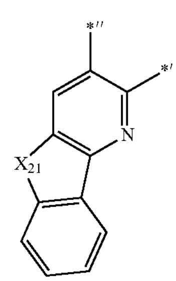

-continued
CY2-3040
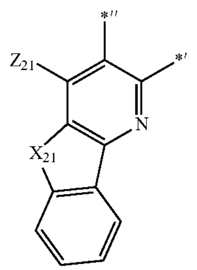
CY2-3041
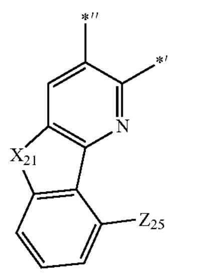
CY2-3042
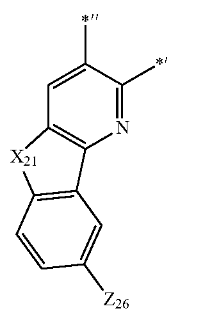
CY2-3043
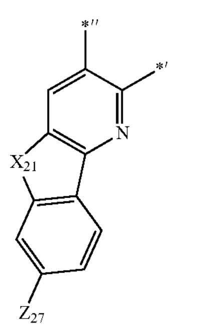
CY2-3044
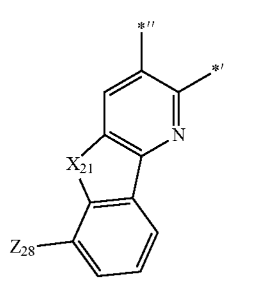
-continued
CY2-3045
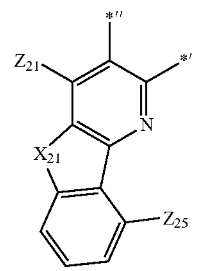
CY2-3046
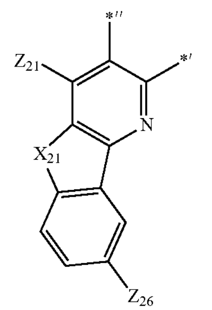
CY2-3047
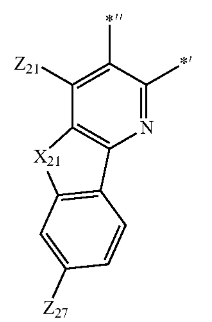
CY2-3048
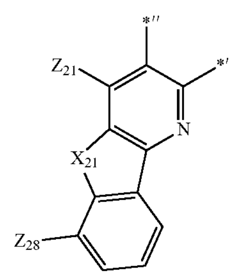
CY2-3049
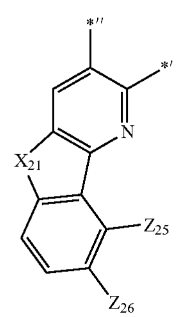

-continued
CY2-3050
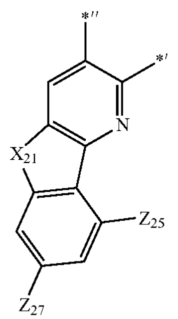
CY2-3051
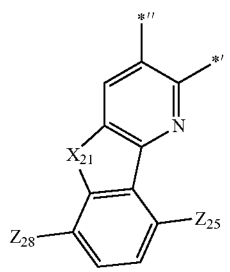
CY2-3052
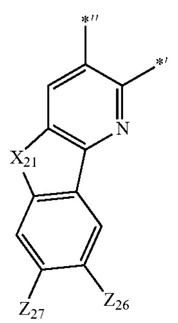
CY2-3053
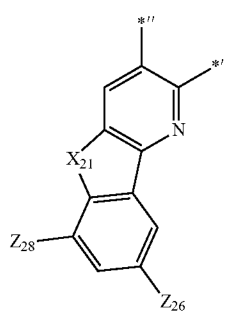
CY2-3054
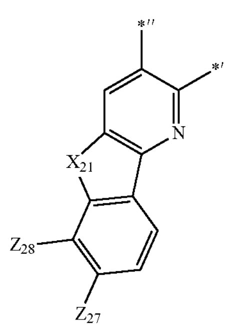
-continued
CY2-3055
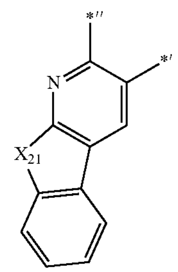
CY2-3056
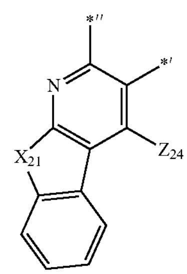
CY2-3057
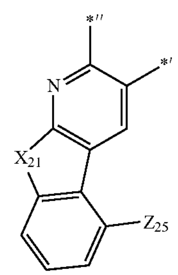
CY2-3058
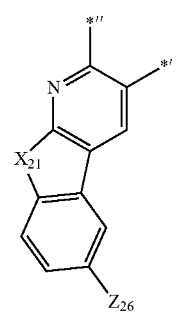
CY2-3059
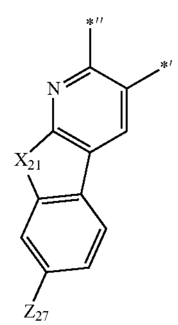

-continued
CY2-3060
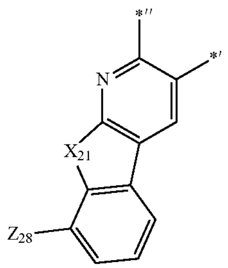
CY2-3061
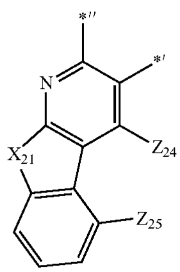
CY2-3062
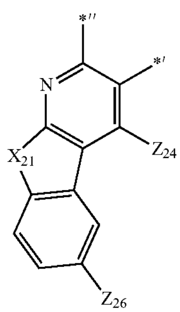
CY2-3063
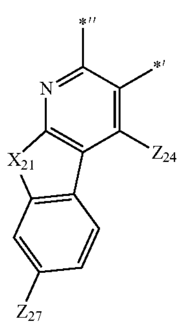
CY2-3064
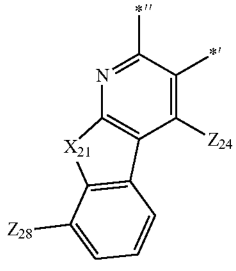
-continued
CY2-3065
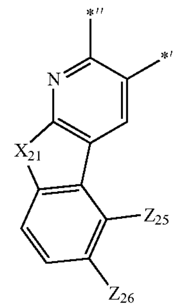
CY2-3066
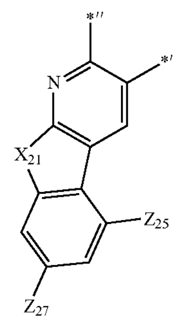
CY2-3067
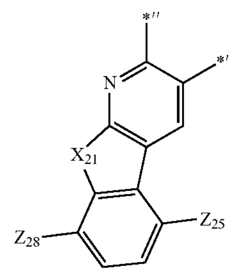
CY2-3068
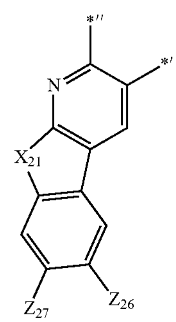
CY2-3069
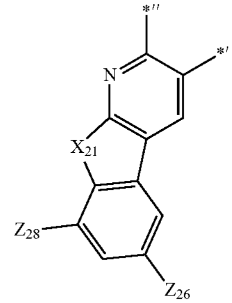

CY2-3070
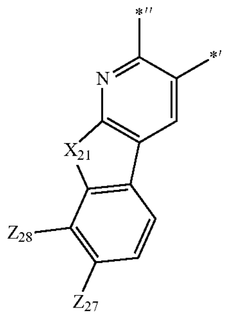
CY2-3071
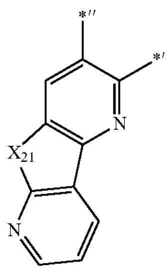
CY2-3072
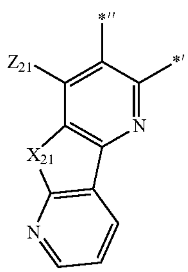
CY2-3073
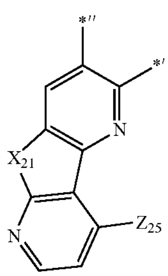
CY2-3074
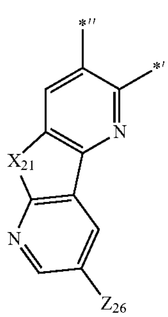
CY2-3075
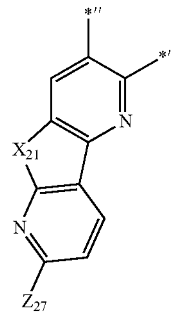
CY2-3076
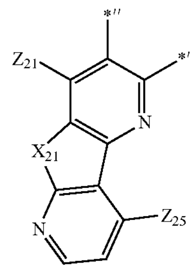
CY2-3077
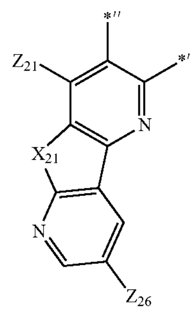
CY2-3078
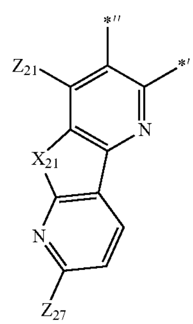
CY2-3079
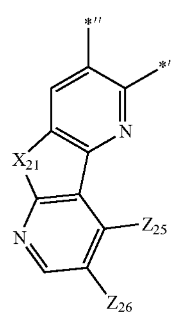

-continued
CY2-3080
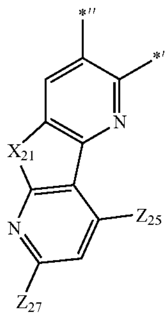
CY2-3081
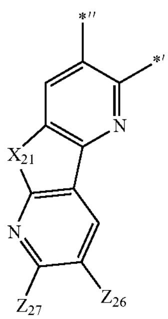
CY2-3082
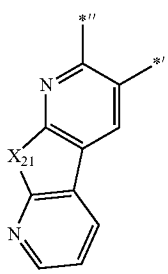
CY2-3083
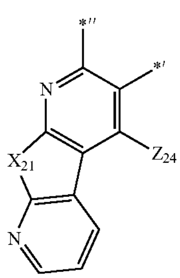
CY2-3084
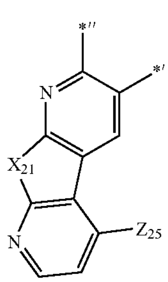
-continued
CY2-3085
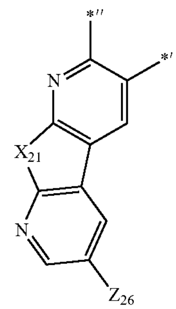
CY2-3086
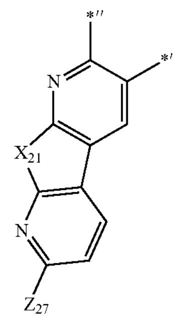
CY2-3087
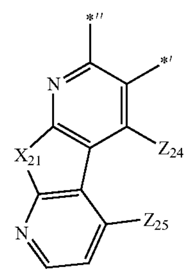
CY2-3088
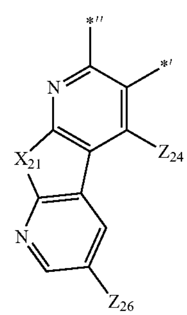
CY2-3089
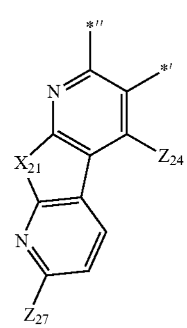

-continued
CY2-3090
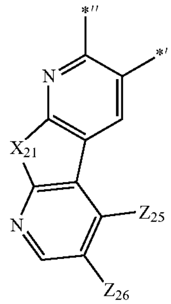
CY2-3091
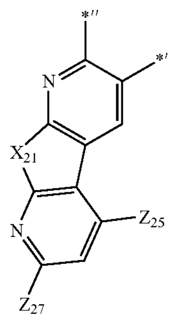
CY2-3092
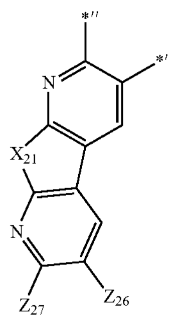
CY2-4001
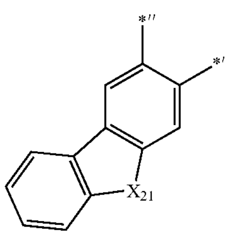
CY2-4002
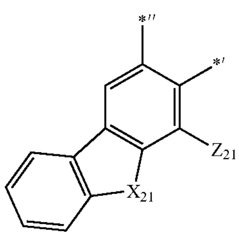
CY2-4003
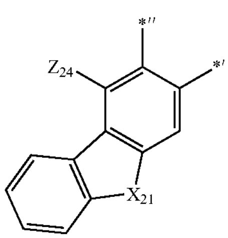
-continued
CY2-4004
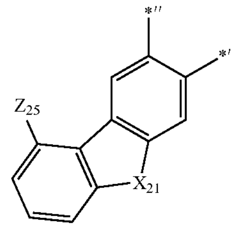
CY2-4005
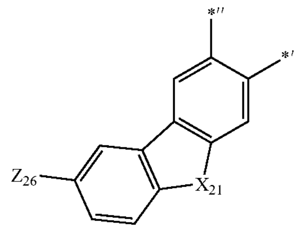
CY2-4006
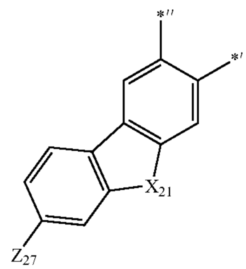
CY2-4007
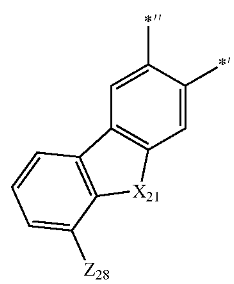
CY2-4008
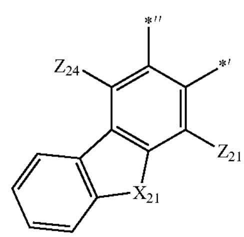
CY2-4009
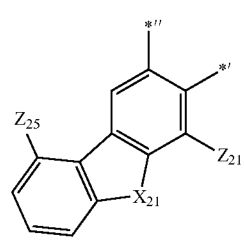

-continued
CY2-4010
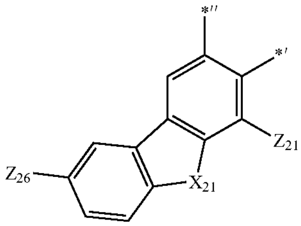
CY2-4011
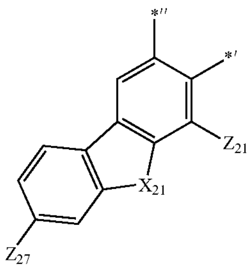
CY2-4012
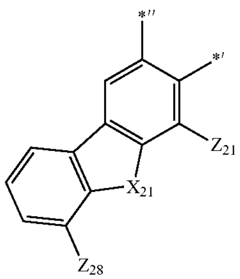
CY2-4013
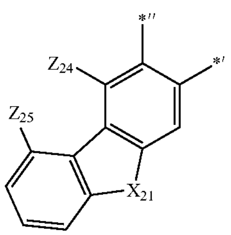
CY2-4014
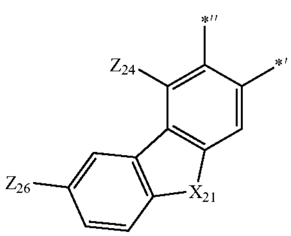
CY2-4015
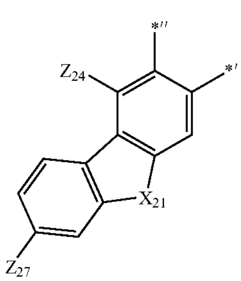
-continued
CY2-4016
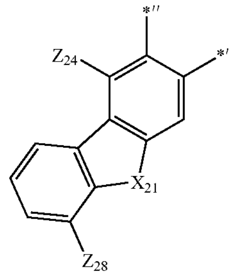
CY2-4017
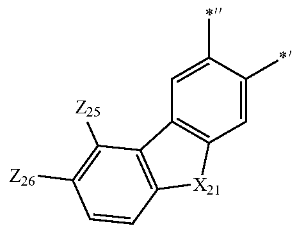
CY2-4018
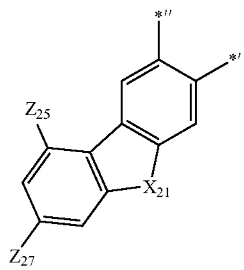
CY2-4019
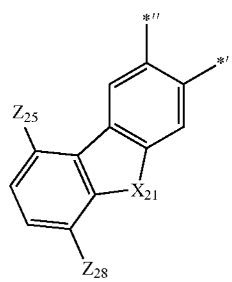
CY2-4020
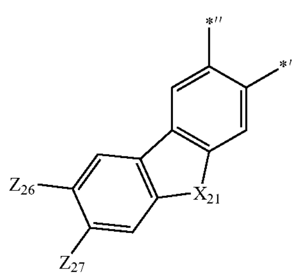
CY2-4021
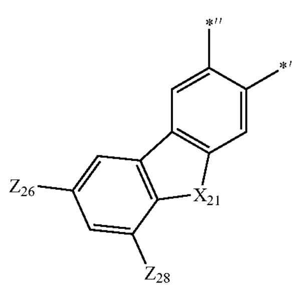

CY2-4022
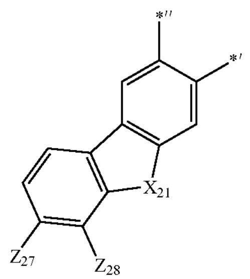
CY2-4023
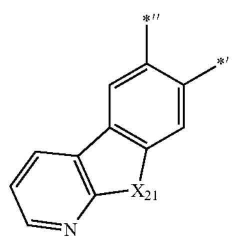
CY2-4024
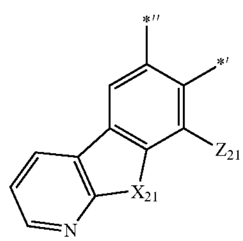
CY2-4025
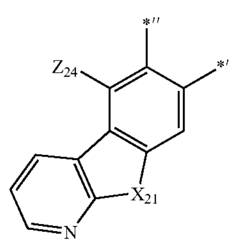
CY2-4026
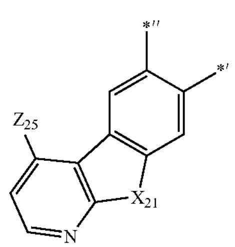
CY2-4027
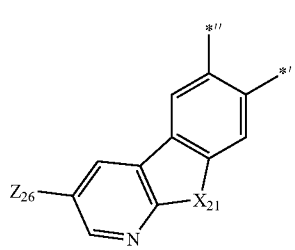
CY2-4028
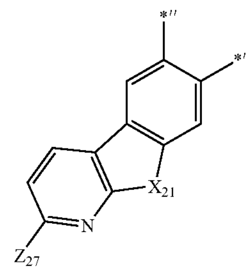
CY2-4029
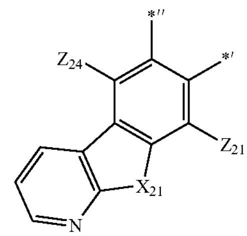
CY2-4030
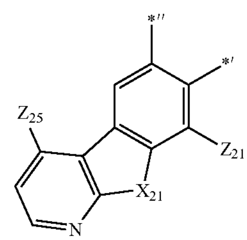
CY2-4031
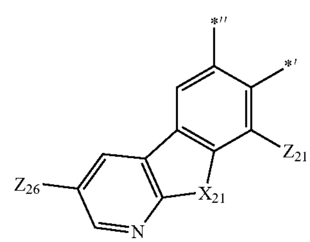
CY2-4032
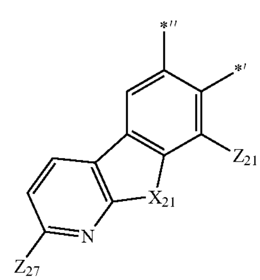
CY2-4033
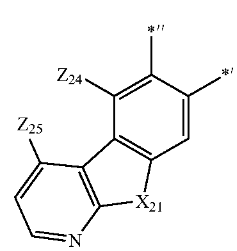

-continued
CY2-4034
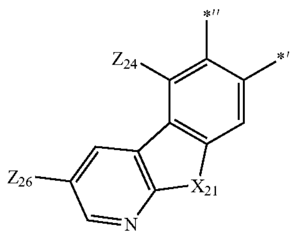
CY2-4035
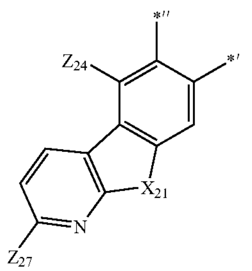
CY2-4036
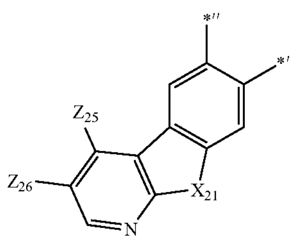
CY2-4037
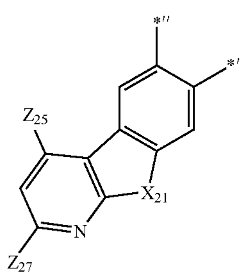
CY2-4038
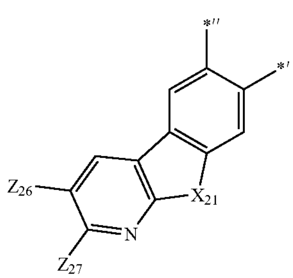
CY2-4039
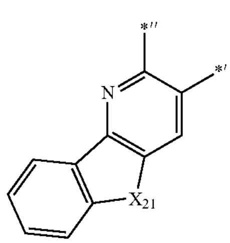
-continued
CY2-4040
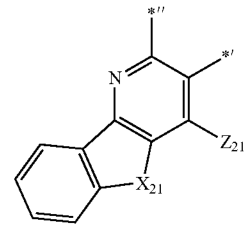
CY2-4041
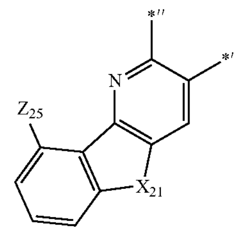
CY2-4042
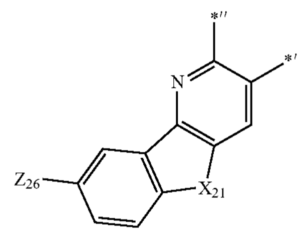
CY2-4043
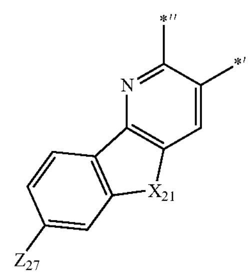
CY2-4044
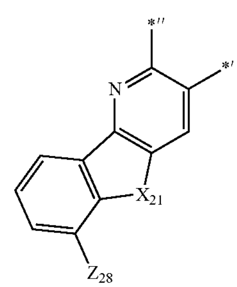
CY2-4045
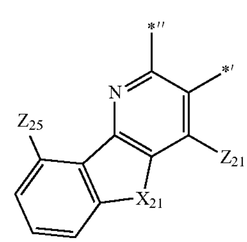

CY2-4046
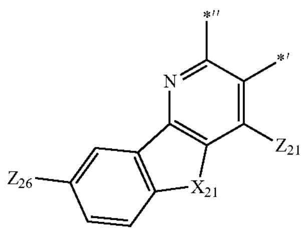
CY2-4047
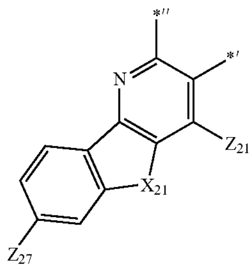
CY2-4048
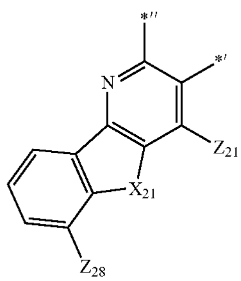
CY2-4049
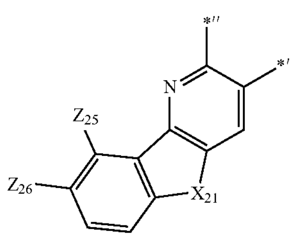
CY2-4050
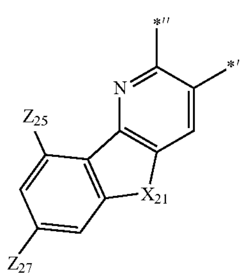
CY2-4051
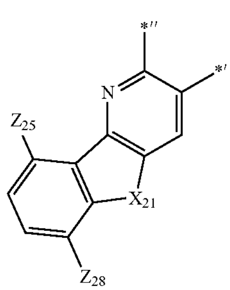
CY2-4052
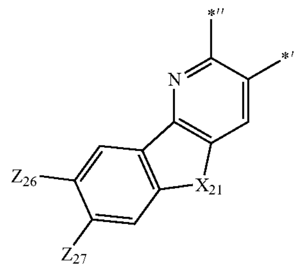
CY2-4053
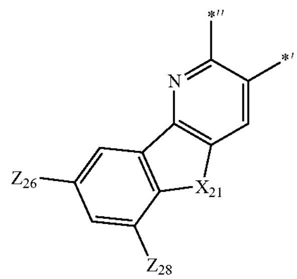
CY2-4054
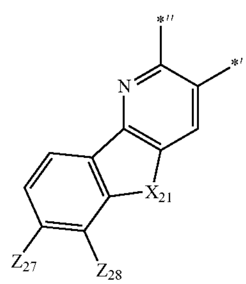
CY2-4055
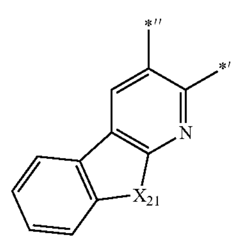
CY2-4056
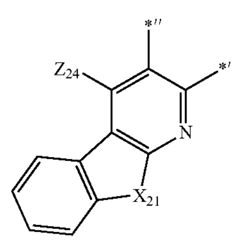
CY2-4057
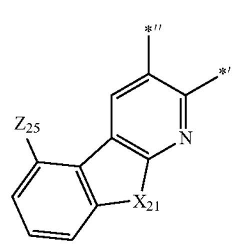

CY2-4058
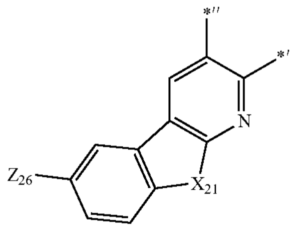
CY2-4059
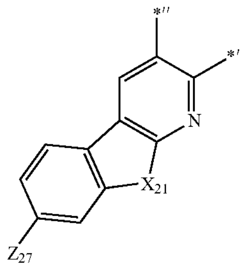
CY2-4060
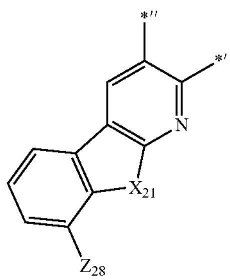
CY2-4061
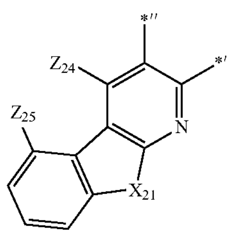
CY2-4062
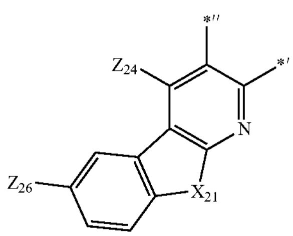
CY2-4063
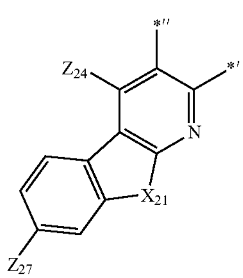
CY2-4064
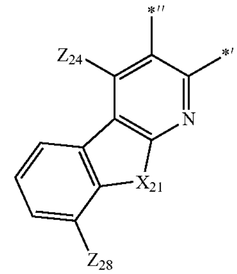
CY2-4065
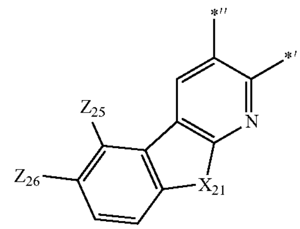
CY2-4066
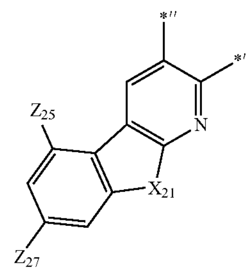
CY2-4067
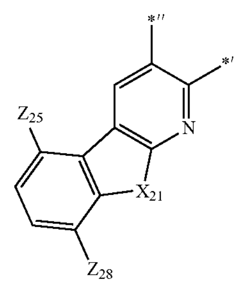
CY2-4068
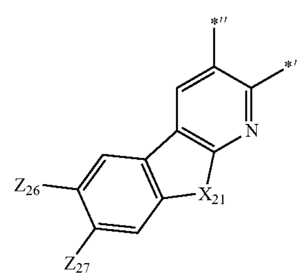
CY2-4069
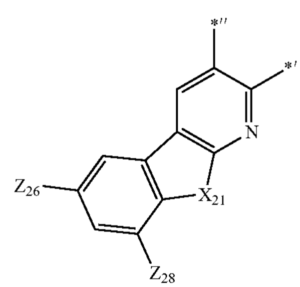

-continued
CY2-4070
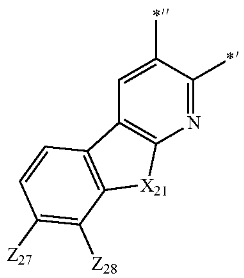
CY2-4071
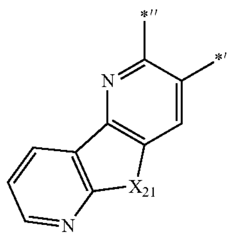
CY2-4072
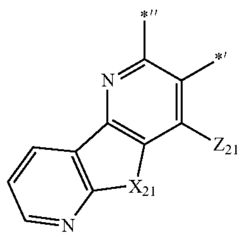
CY2-4073
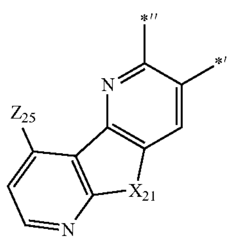
CY2-4074
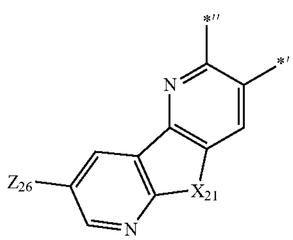
CY2-4075
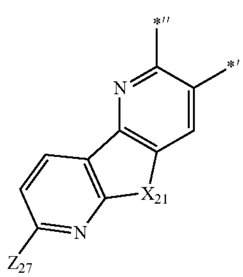
-continued
CY2-4076
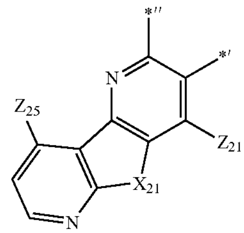
CY2-4077
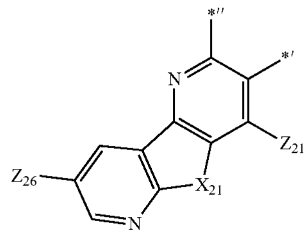
CY2-4078
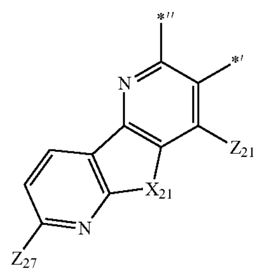
CY2-4079
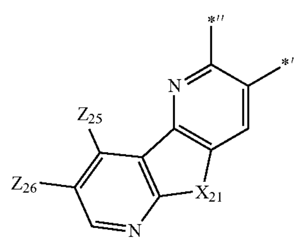
CY2-4080
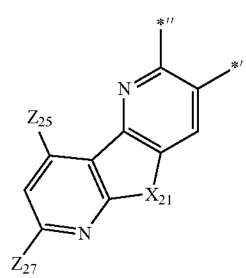
CY2-4081
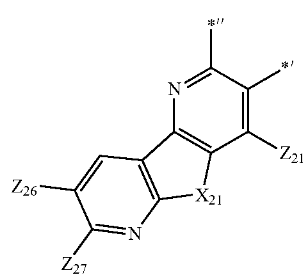

CY2-4082
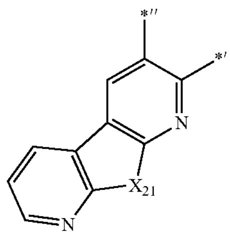
CY2-4083
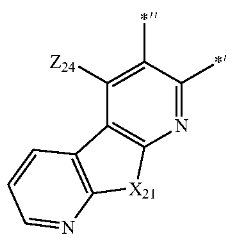
CY2-4084
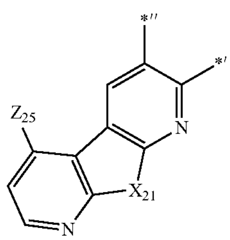
CY2-4085
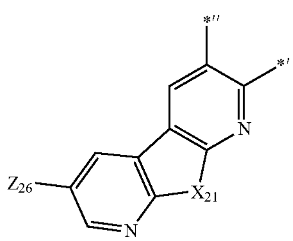
CY2-4086
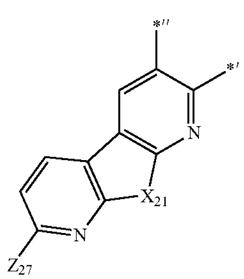
CY2-4087
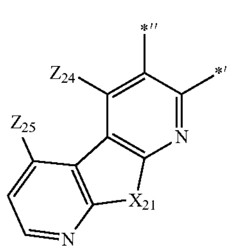
CY2-4088
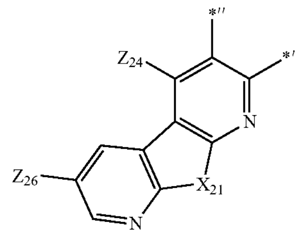
CY2-4089
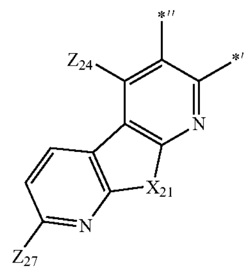
CY2-4090
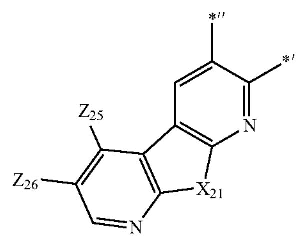
CY2-4091
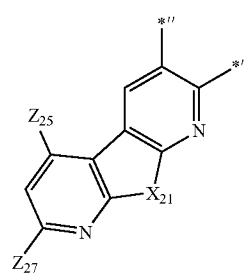
CY2-4092
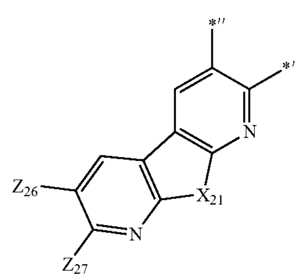
CY2-5001
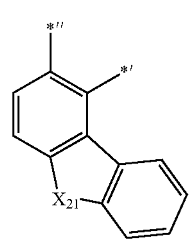

-continued
CY2-5002
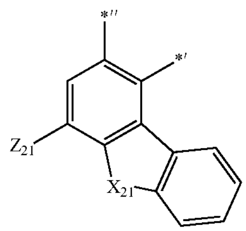
CY2-5003
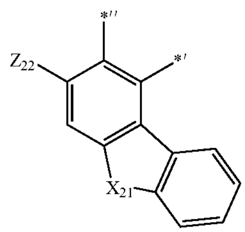
CY2-5004
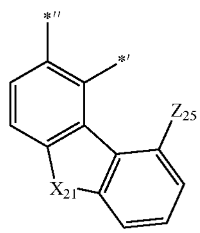
CY2-5005
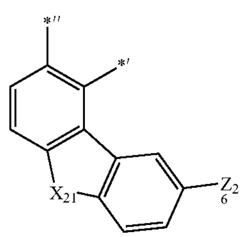
CY2-5006
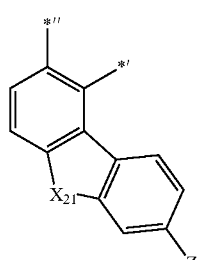
CY2-5007
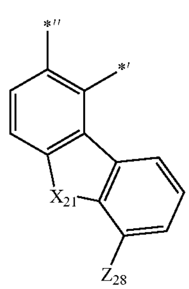
-continued
CY2-5008
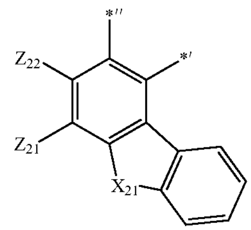
CY2-5009
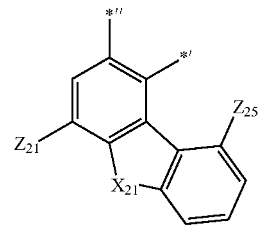
CY2-5010
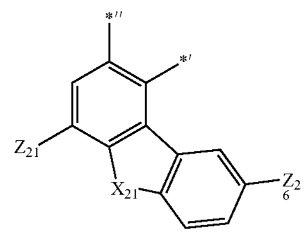
CY2-5011
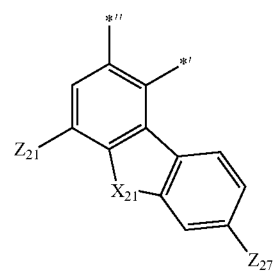
CY2-5012
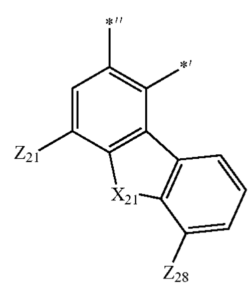
CY2-5013
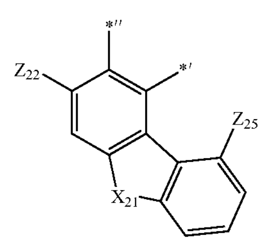

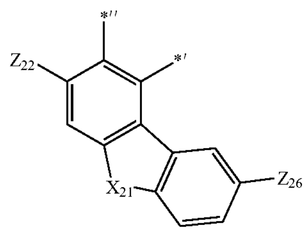
CY2-5014
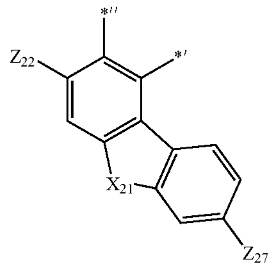
CY2-5015
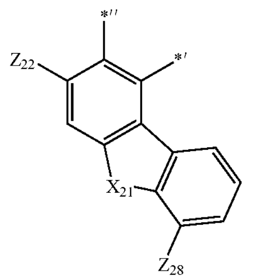
CY2-5016
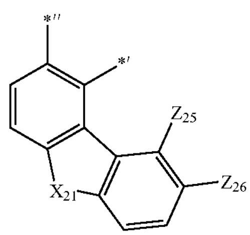
CY2-5017
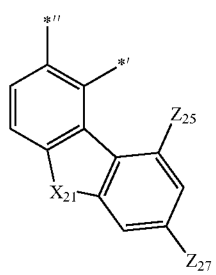
CY2-5018
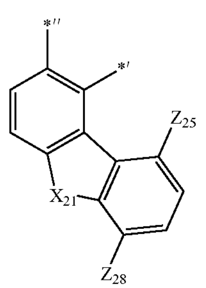
CY2-5019
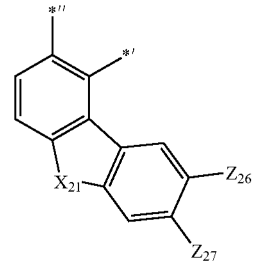
CY2-5020
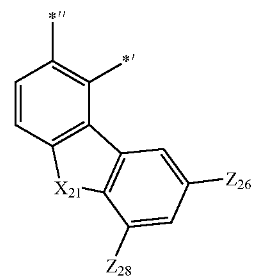
CY2-5021
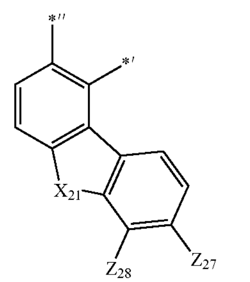
CY2-5022
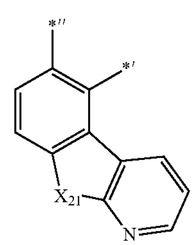
CY2-5023
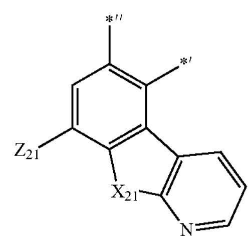
CY2-5024
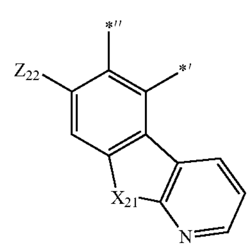
CY2-5025

-continued
CY2-5026
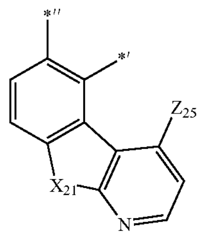
CY2-5027
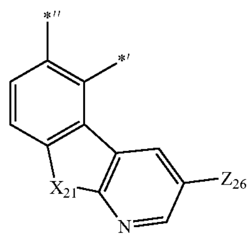
CY2-5028
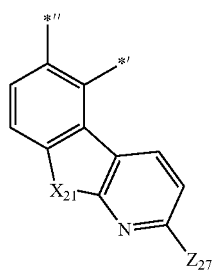
CY2-5029
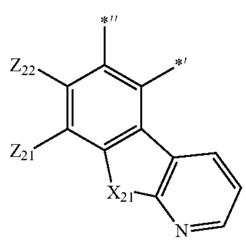
CY2-5030
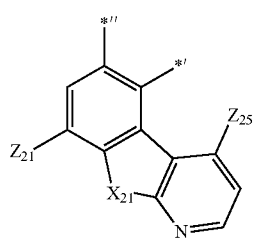
CY2-5031
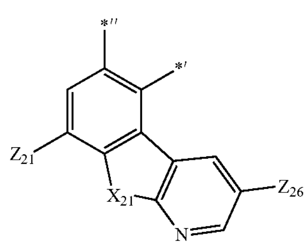
-continued
CY2-5032
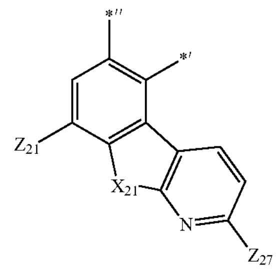
CY2-5033
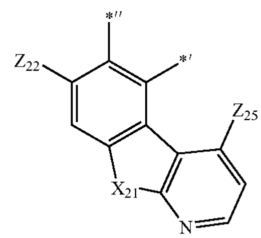
CY2-5034
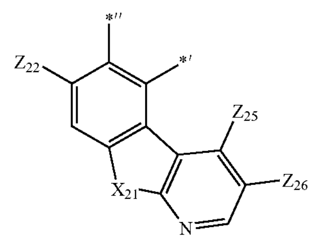
CY2-5035
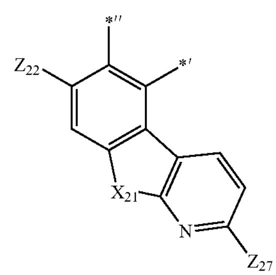
CY2-5036
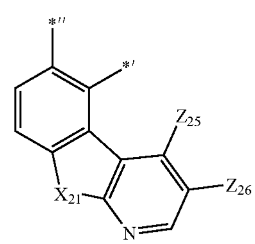
CY2-5037
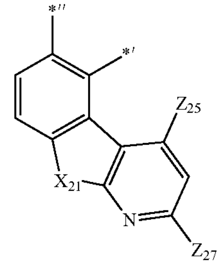

CY2-5038
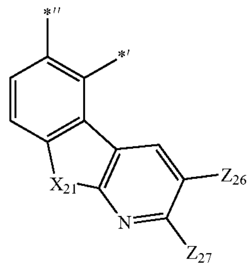
CY2-5039
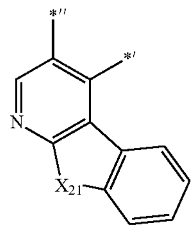
CY2-5040
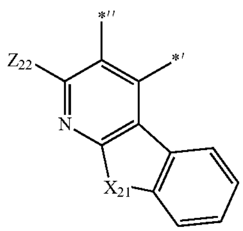
CY2-5041
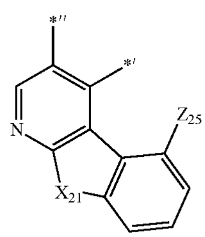
CY2-5042
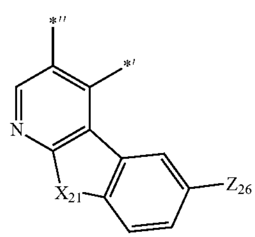
CY2-5043
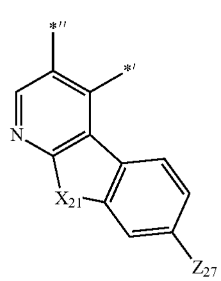
CY2-5044
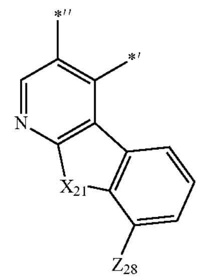
CY2-5045
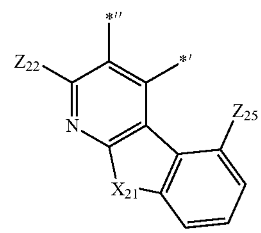
CY2-5046
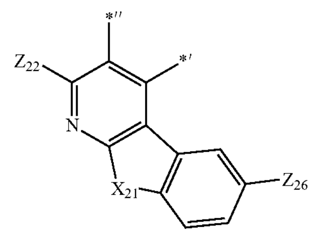
CY2-5047
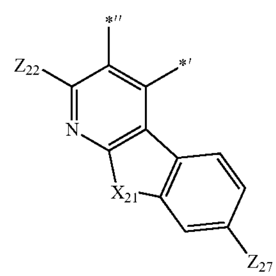
CY2-5048
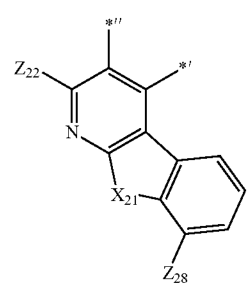
CY2-5049
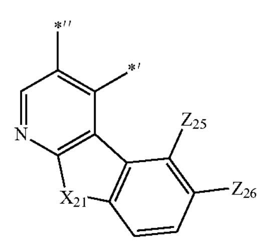

-continued
CY2-5050
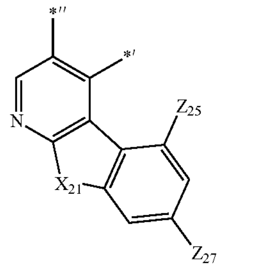
CY2-5051
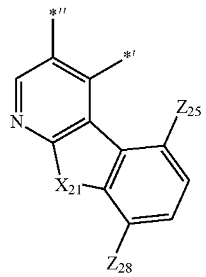
CY2-5052
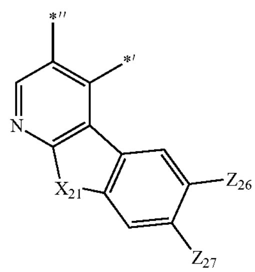
CY2-5053
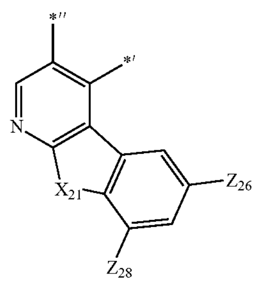
CY2-5054
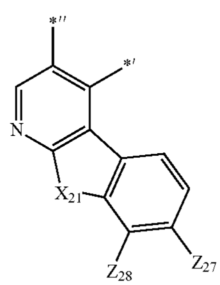
CY2-5055
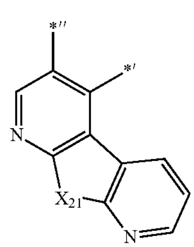
-continued
CY2-5056
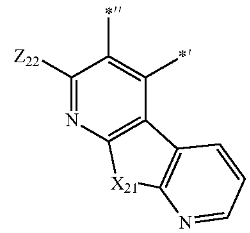
CY2-5057
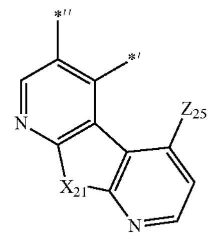
CY2-5058
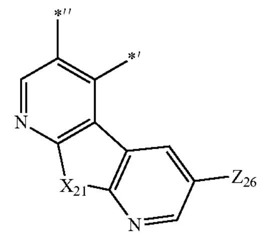
CY2-5059
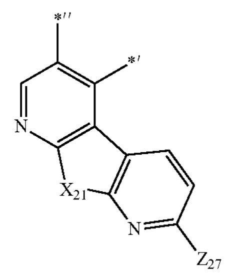
CY2-5060
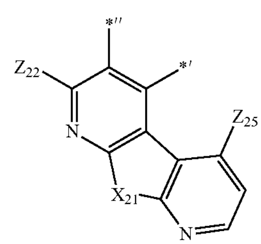
CY2-5061
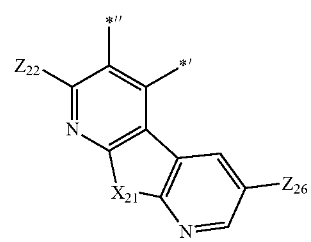

-continued
CY2-5062
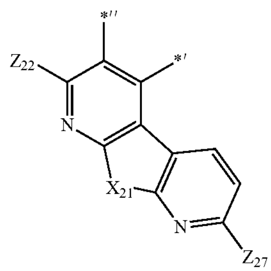
CY2-5063
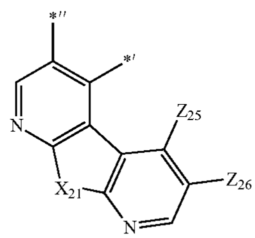
CY2-5064
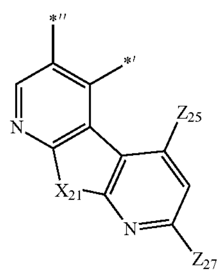
CY2-5065
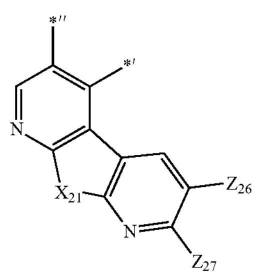
CY2-6001
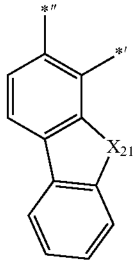
-continued
CY2-6002
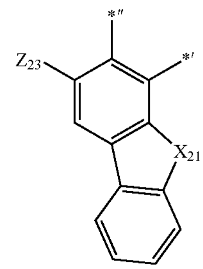
CY2-6003
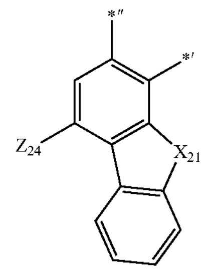
CY2-6004
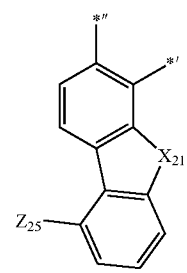
CY2-6005
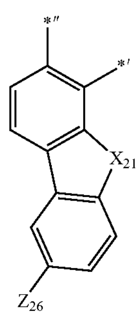
CY2-6006
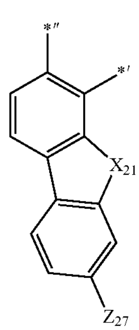

-continued
CY2-6007
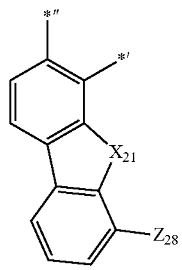
CY2-6008
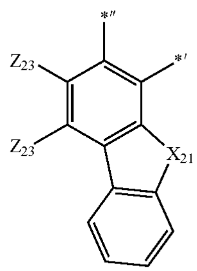
CY2-6009
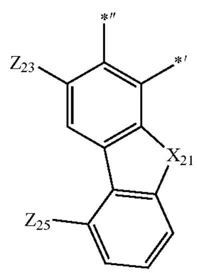
CY2-6010
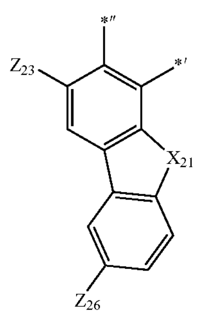
CY2-6011
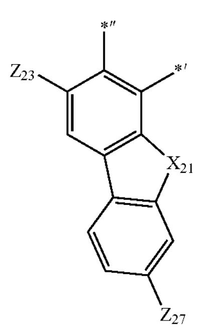
-continued
CY2-6012
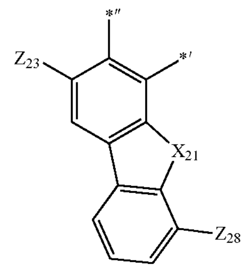
CY2-6013
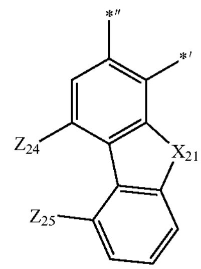
CY2-6014
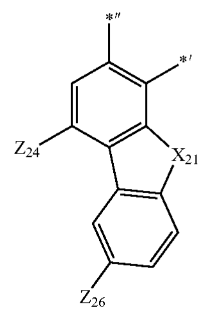
CY2-6015
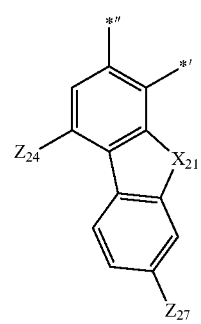
CY2-6016
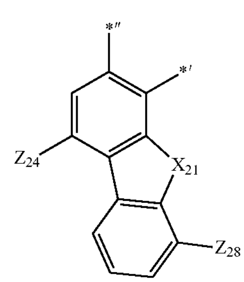

-continued
CY2-6017
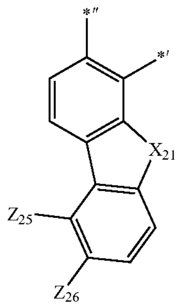
CY2-6018
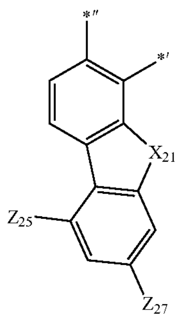
CY2-6019
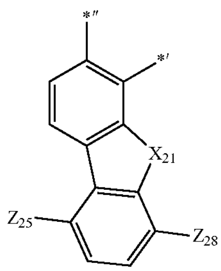
CY2-6020
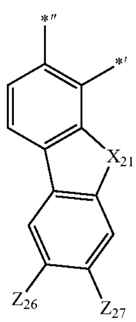
CY2-6021
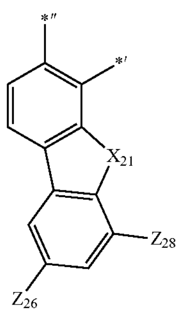
-continued
CY2-6022
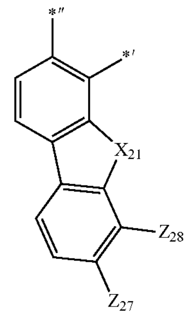
CY2-6023
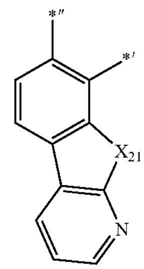
CY2-6024
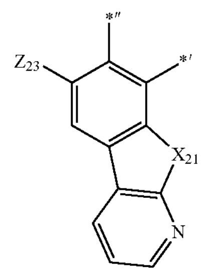
CY2-6025
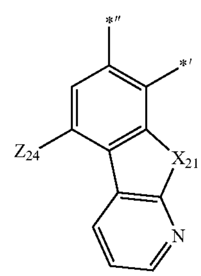
CY2-6026
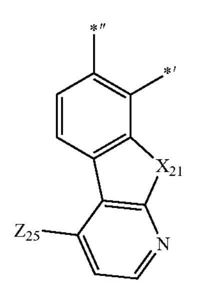

CY2-6027
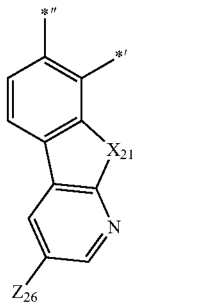
CY2-6028
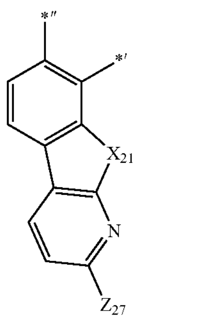
CY2-6029
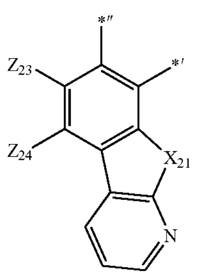
CY2-6030
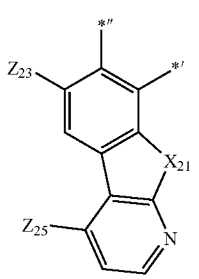
CY2-6031
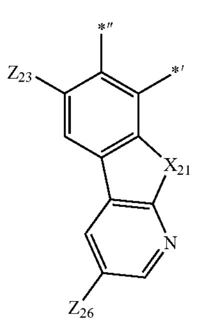
CY2-6032
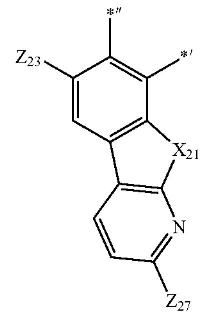
CY2-6033
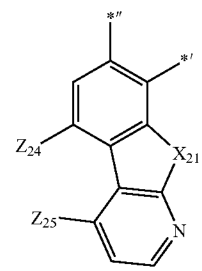
CY2-6034
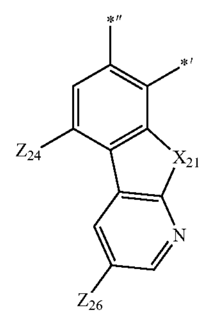
CY2-6035
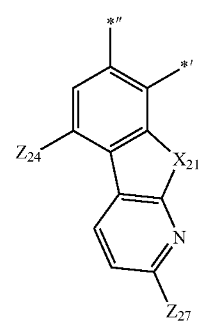
CY2-6036
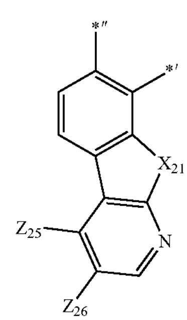

CY2-6037
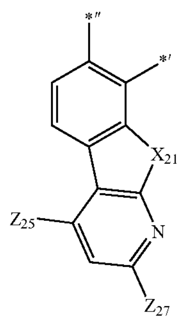
CY2-6038
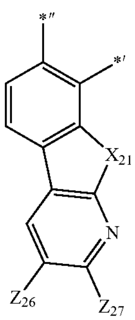
CY2-6039
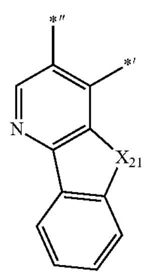
CY2-6040
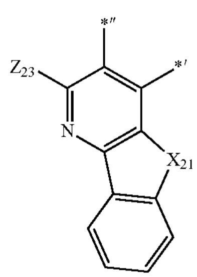
CY2-6041
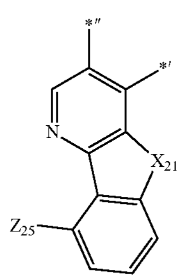
CY2-6042
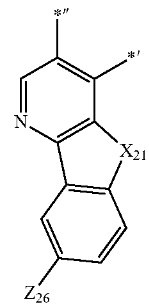
CY2-6043
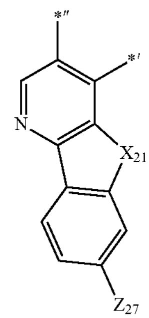
CY2-6044
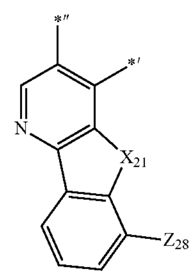
CY2-6045
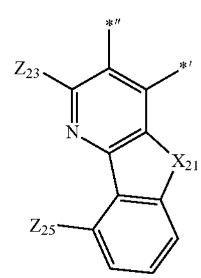
CY2-6046
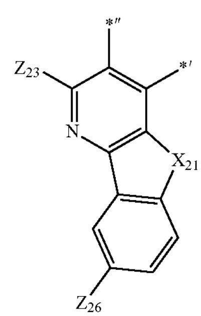

-continued
CY2-6047
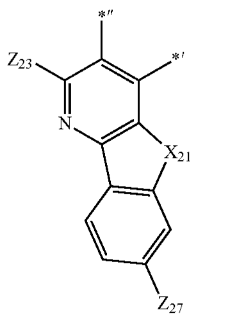
CY2-6048
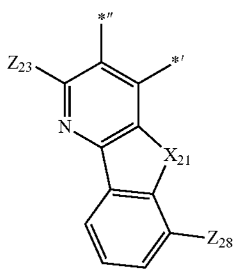
CY2-6049
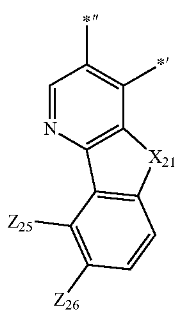
CY2-6050
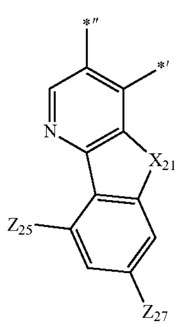
CY2-6051
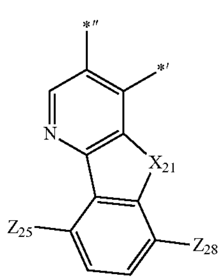
-continued
CY2-6052
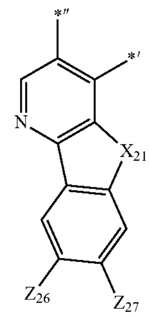
CY2-6053
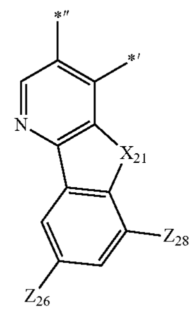
CY2-6054
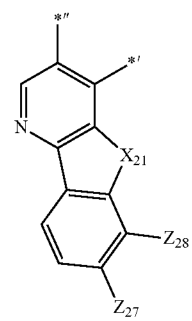
CY2-6055
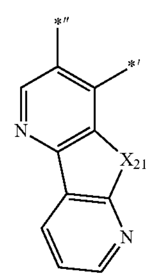
CY2-6056
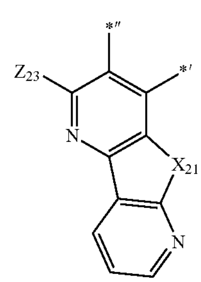

CY2-6057
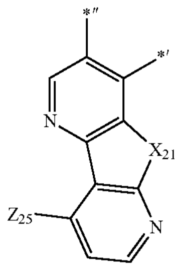
CY2-6058
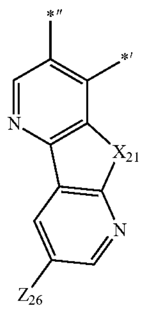
CY2-6059
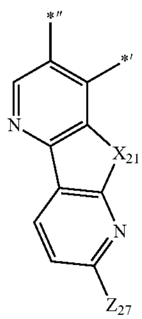
CY2-6060
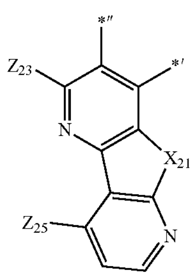
CY2-6061
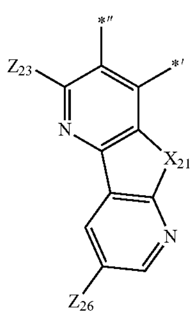
CY2-6062
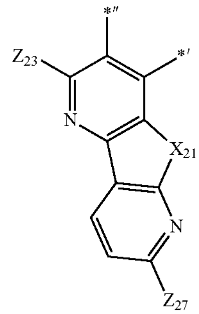
CY2-6063
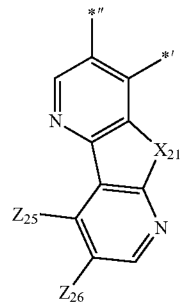
CY2-6064
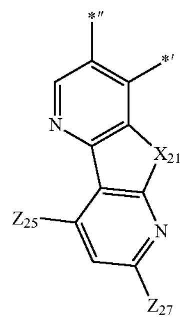
CY2-6065
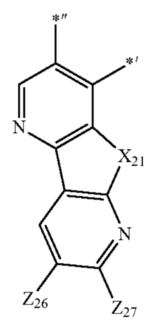
wherein, in Formulae CY2-1001 to CY2-1141, CY2-2001 to CY2-2092, CY2-3001 to CY2-3092, CY2-4001 to CY2-4092, CY2-5001 to CY2-5065 and CY2-6001 to CY2-6065,
$X_{21}$ is the same as described in claim 1,
$Z_{21}$ to $Z_{28}$ are each independently the same as defined in connection with $Z_2$ in claim 1, wherein each of $Z_{21}$ to $Z_{28}$ are not hydrogen,
*" indicates a binding site to ring $CY_1$ in Formula 2A, and
*' indicates a binding site to M in Formula 1.

15. The organometallic compound of claim 1, wherein a group represented by
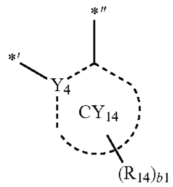
in Formula 2B is represented by one of Formulae CY14(1) to CY14(63):
CY14(1)
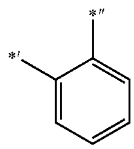
CY14(2)
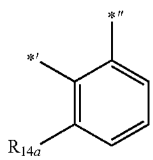
CY14(3)
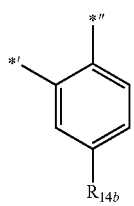
CY14(4)
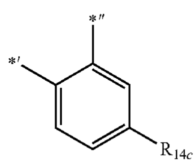
CY14(5)
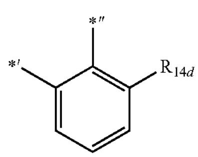
CY14(6)
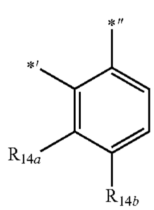
CY14(7)
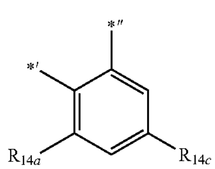
-continued
CY14(8)
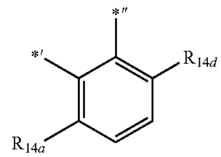
CY14(9)
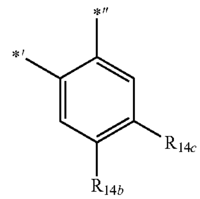
CY14(10)
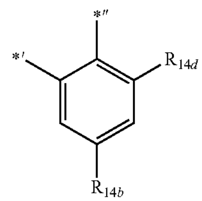
CY14(11)
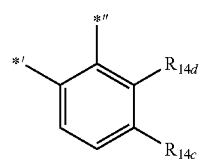
CY14(12)
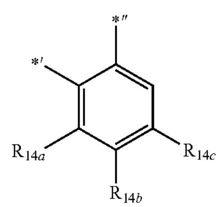
CY14(13)
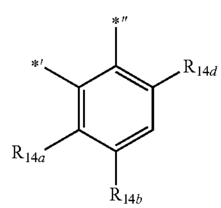
CY14(14)
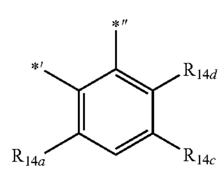
CY14(15)
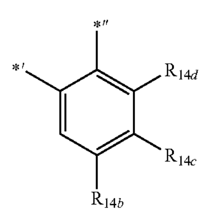

-continued
CY14(16)
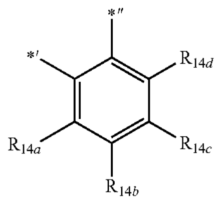
CY14(17)
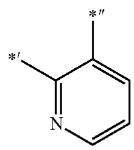
CY14(18)
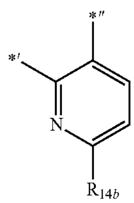
CY14(19)
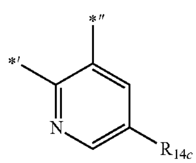
CY14(20)
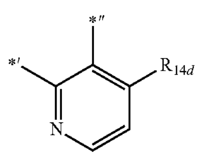
CY14(21)
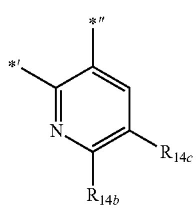
CY14(22)
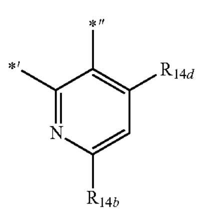
CY14(23)
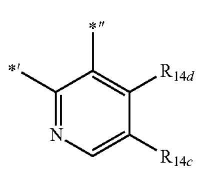
-continued
CY14(24)
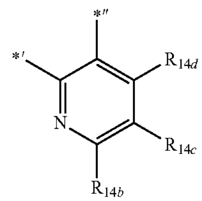
CY14(25)
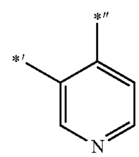
CY14(26)
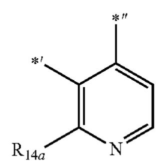
CY14(27)
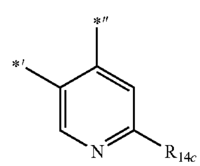
CY14(28)
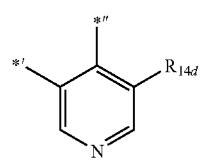
CY14(29)
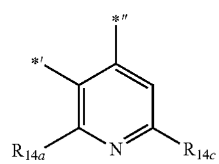
CY14(30)
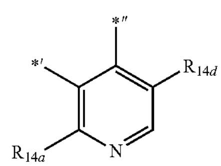
CY14(31)
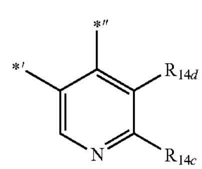
CY14(32)
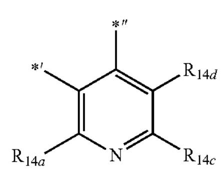

-continued
CY14(33)
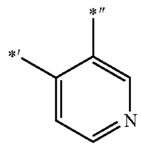
CY14(34)
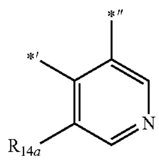
CY14(35)
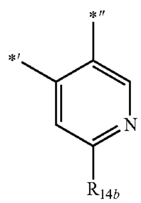
CY14(36)
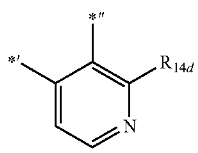
CY14(37)
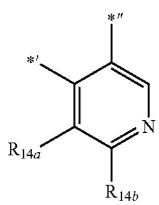
CY14(38)
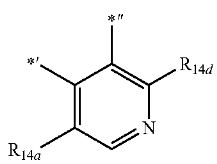
CY14(39)
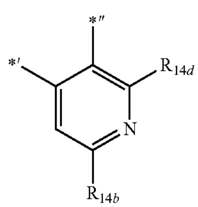
CY14(40)
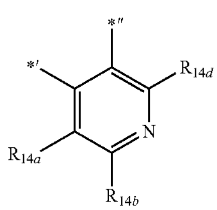
CY14(41)
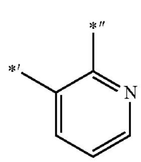
-continued
CY14(42)
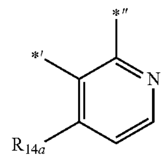
CY14(43)
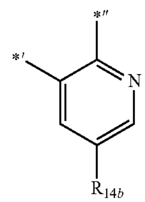
CY14(44)
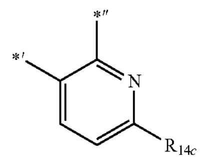
CY14(45)
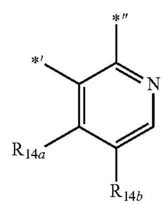
CY14(46)
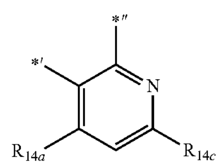
CY14(47)
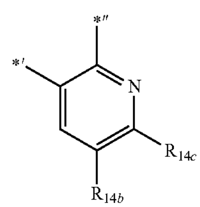
CY14(48)
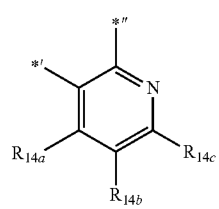
CY14(49)
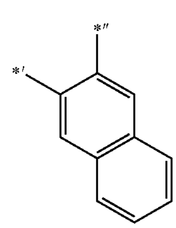

CY14(50)
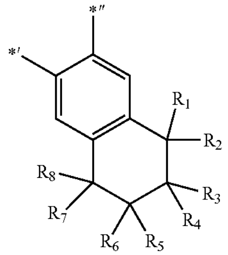
CY14(51)
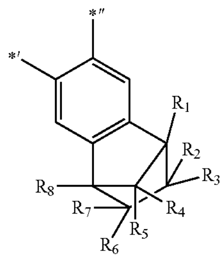
CY14(52)
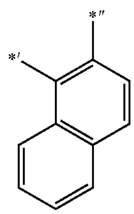
CY14(53)
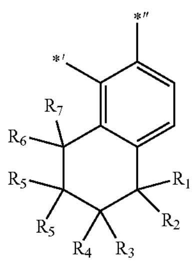
CY14(54)
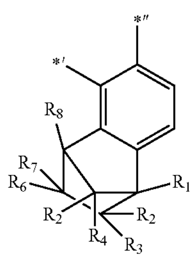
CY14(55)
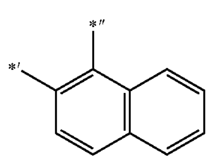
CY14(56)
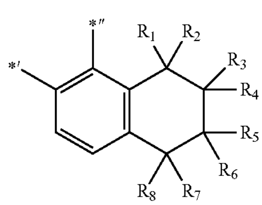
CY14(57)
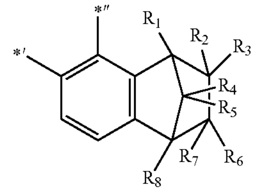
CY14(58)
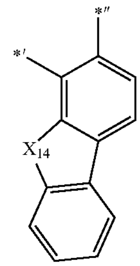
CY14(59)
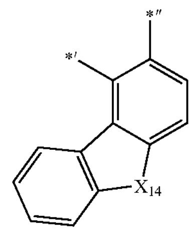
CY14(60)
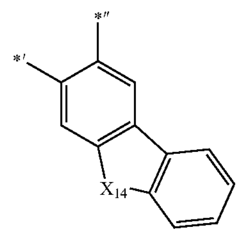
CY14(61)
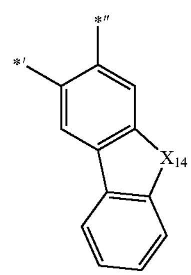
CY14(62)
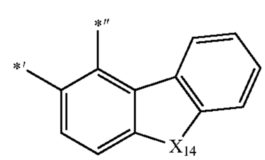

-continued

CY14(63)

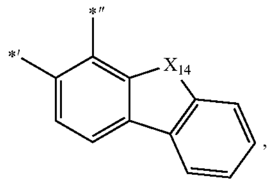

wherein, in Formulae CY14(1) to CY14(63), $R_{14a}$ to $R_{14d}$ are each independently the same as defined in connection with $R_{14}$ in claim 1, wherein each of $R_{14a}$ to $R_{14d}$ are not hydrogen, $X_{14}$ is $C(R_1)(R_2)$, $N(R_1)$, O, S, or $Si(R_1)(R_2)$, $R_1$ to $R_8$ are each the same as defined in connection with $R_{14}$ in claim 1,

*" indicates a binding site to a carbon atom of a neighboring pyridine ring in Formula 2B, and

*' indicates a binding site to M in Formula 1.

16. An organic light-emitting device comprising:

a first electrode, a second electrode; and an organic layer disposed between the first electrode and the second electrode and comprising an emission layer, wherein the organic layer comprises at least one organometallic compound of claim 1.

17. The organic light-emitting device of claim 16, wherein the first electrode is an anode, the second electrode is a cathode, and the organic layer further comprises a hole transport region disposed between the first electrode and the emission layer and an electron transport region disposed between the emission layer and the second electrode, wherein the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

18. The organic light-emitting device of claim 16, wherein the emission layer comprises the at least one organometallic compound.

19. The organic light-emitting device of claim 18, wherein the emission layer further comprises a host, and an amount of the host is greater than that of the organometallic compound.

20. An electronic apparatus comprising the organic light-emitting device of claim 16.

* * * * *